US012753192B2

(12) United States Patent
Dück

(10) Patent No.: US 12,753,192 B2
(45) Date of Patent: Oct. 6, 2026

(54) ORGANIC MOLECULES FOR OPTOELECTRONIC DEVICES

(71) Applicant: Samsung Display Co., Ltd., Yongin-si (KR)

(72) Inventor: Sebastian Dück, Heidelberg (DE)

(73) Assignee: Samsung Display Co., Ltd., Yongin-si (KR)

( * ) Notice: Subject to any disclaimer, the term of this patent is extended or adjusted under 35 U.S.C. 154(b) by 757 days.

(21) Appl. No.: 18/031,608

(22) PCT Filed: Oct. 14, 2021

(86) PCT No.: PCT/EP2021/078477
§ 371 (c)(1),
(2) Date: Apr. 12, 2023

(87) PCT Pub. No.: WO2022/079182
PCT Pub. Date: Apr. 21, 2022

(65) Prior Publication Data

US 2023/0389424 A1 Nov. 30, 2023

(30) Foreign Application Priority Data

Oct. 15, 2020 (EP) ..................................... 20202100

(51) Int. Cl.
*C07F 5/02* (2006.01)
*C09K 11/06* (2006.01)
(Continued)

(52) U.S. Cl.
CPC .............. *C07F 5/027* (2013.01); *C09K 11/06* (2013.01); *H10K 85/658* (2023.02);
(Continued)

(58) Field of Classification Search
CPC ...... C07F 5/027; H10K 85/658; H10K 85/657
See application file for complete search history.

(56) References Cited

U.S. PATENT DOCUMENTS

2020/0290941 A1 9/2020 Wang et al.
2023/0303595 A1* 9/2023 Koch ...................... C07F 5/027

FOREIGN PATENT DOCUMENTS

CN 108342192 A 7/2018
CN 110204565 A 9/2019
(Continued)

OTHER PUBLICATIONS

International Search Report for corresponding Application No. PCT/EP2021/078477 dated Jan. 31, 2022, 2pp.
(Continued)

*Primary Examiner* — Jenna N Chandhok
(74) *Attorney, Agent, or Firm* — Womble Bond Dickinson (US) LLP

(57) ABSTRACT

The invention pertains to an organic molecule with a first chemical moiety with a structure of Formula I:

Formula I

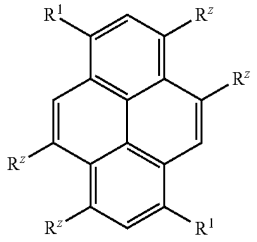

and two second chemical moieties with a structure of Formula II:

(Continued)

Formula II

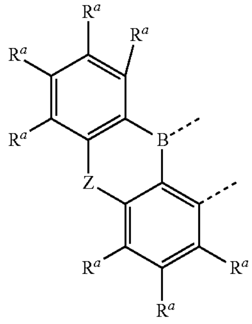

wherein $R^z$ is the binding site of a single bond linking the first chemical moiety to the second chemical moiety;

$R^1$ is at each occurrence independently selected from the group consisting of the binding site of a single bond linking the first chemical moiety to the second chemical moiety, hydrogen, deuterium, OPh (Ph=phenyl), SPh, $CF_3$, CN, F, $Si(C_1\text{-}C_5\text{-alkyl})_3$, $Si(Ph)_3$, $C_1$-$C_5$-alkyl, $C_1$-$C_5$-alkoxy, $C_1$-$C_5$-thioalkoxy, $C_2$-$C_5$-alkenyl, $C_2$-$C_5$-alkynyl, $C_6$-$C_{18}$-aryl, $C_3$-$C_{17}$-heteroaryl, $N(C_6\text{-}C_{18}\text{-aryl})_2$, $N(C_3\text{-}C_{17}\text{-heteroaryl})_2$; $N(C_3\text{-}C_{17}\text{-heteroaryl})(C_6\text{-}C_{18}\text{-aryl})$;

the dashed lines "" represent the binding sites of the first chemical moiety to the second chemical moiety; and Z is at each occurrence independently selected from the group consisting of a direct bond, $CR^5R^6$, $C{=}CR^5R^6$, C=O, $C{=}NR^5$, $NR^5$, O, $SiR^5R^6$, S, S(O) and $S(O)_2$.

18 Claims, 1 Drawing Sheet

(51) Int. Cl.
*H10K 50/12* (2023.01)
*H10K 85/60* (2023.01)
*H10K 101/20* (2023.01)

(52) U.S. Cl.
CPC ...... *C09K 2211/1018* (2013.01); *H10K 50/12* (2023.02); *H10K 2101/20* (2023.02)

(56) References Cited

FOREIGN PATENT DOCUMENTS

| | | | |
|---|---|---|---|
| CN | 111269250 | A | 6/2020 |
| EP | 3 418 278 | A1 | 12/2018 |
| KR | 10-2019-0078541 | A | 7/2019 |

OTHER PUBLICATIONS

Chinese Office Action for CN Application No. 202180070069.X, dated Apr. 30, 2025, 6 pages.

Zhang, X., "Semiconductor Quantum Dots: Water Solublization, Functionalization, and Ratiometric Sensing Of O2," University of Illinois at Chicago of graduation thesis, Dec. 31, 2014, 125 pages.

* cited by examiner

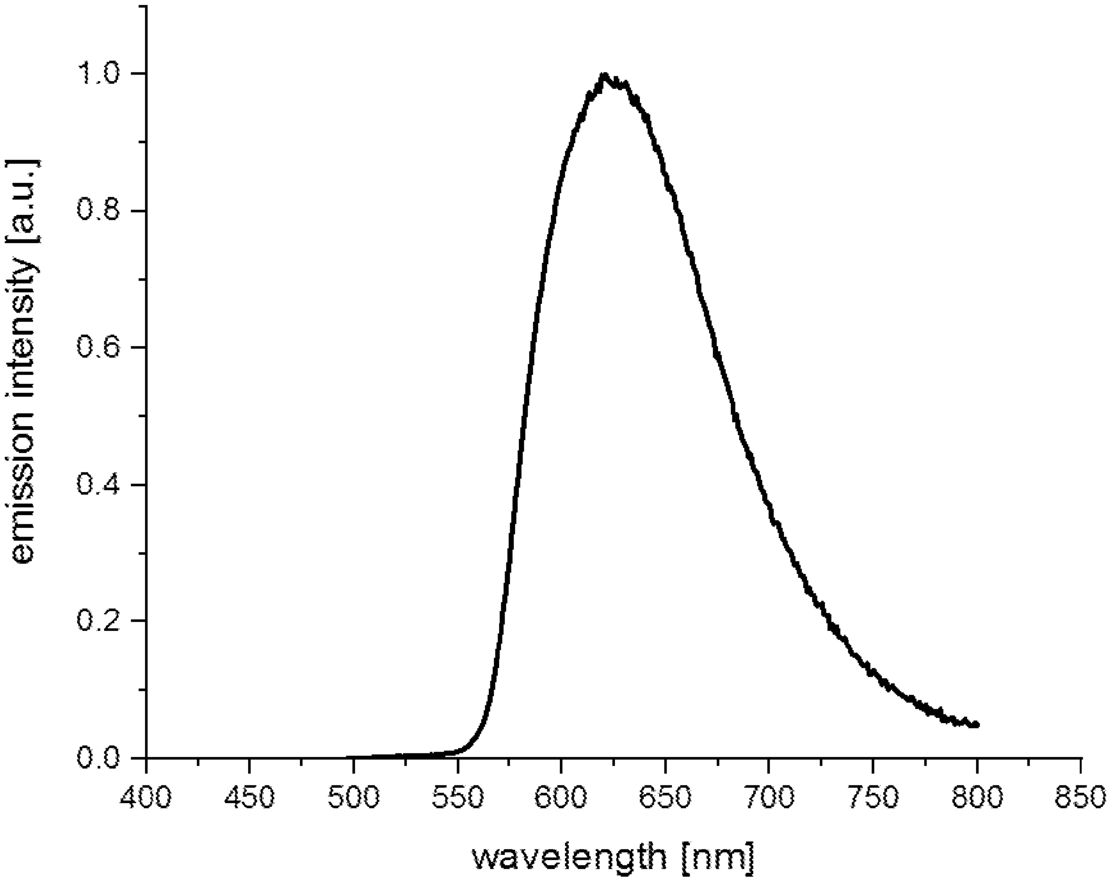
emission intensity [a.u.]
0.0
0.2
0.4
0.6
0.8
1.0
400
450
500
550
600
650
700
750
800
850
wavelength [nm]

ORGANIC MOLECULES FOR OPTOELECTRONIC DEVICES

CROSS-REFERENCE TO RELATED APPLICATIONS

This application is a U.S. National Phase Patent Application of International Patent Application Number PCT/EP2021/078477, filed on Oct. 14, 2021, which claims priority to European Patent Application Number 20202100.2, filed on Oct. 15, 2020, the entire content of all of which is incorporated herein by reference.

BACKGROUND

1. Field

The invention relates to light-emitting organic molecules and their use in organic light-emitting diodes (OLEDs) and in other optoelectronic devices.

2. Description

The object of the present invention is to provide molecules which are suitable for use in optoelectronic devices.

This object is achieved by the invention which provides a new class of organic molecules.

According to the invention, the organic molecules are purely organic molecules, i.e., they do not contain any metal ions in contrast to metal complexes known for the use in optoelectronic devices. The organic molecules of the invention, however, include metalloids, in particular B, Si, Sn, Se, and/or Ge.

According to the present invention, the organic molecules exhibit emission maxima in the yellow, orange, or red spectral range. The organic molecules exhibit in particular emission maxima between 570 nm and 800 nm, preferably between 580 nm and 700 nm, more preferably between 590 nm and 690 nm, even more preferably between 610 nm and 665 nm, and even more preferably between 620 nm and 640 nm.

The photoluminescence quantum yields of the organic molecules according to the invention are, in particular, 50% or more. The use of the molecules according to the invention in an optoelectronic device, for example an organic light-emitting diode (OLED), leads to higher efficiencies or higher color purity, expressed by the full width at half maximum (FWHM) of an emission spectrum, of the device. Corresponding OLEDs have a higher stability than OLEDs with known emitter materials and comparable color.

The organic molecules of the invention include or consist of:

a first chemical moiety including or consisting of a structure of Formula I:

Formula I

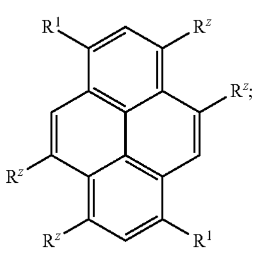

and exactly two second chemical moieties (i.e., not more than two) independently including or consisting of a structure of Formula II:

Formula II

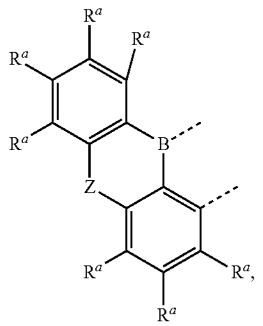

wherein $R^Z$ is at each occurrence the binding site of a single bond linking the first chemical moiety to the second chemical moiety;

$R^1$ is at each occurrence independently from one another selected from the group consisting of hydrogen; deuterium; OPh (Ph=phenyl); SPh; $CF_3$; CN; F; $Si(C_1$-$C_5$-alkyl$)_3$; $Si(Ph)_3$;

$C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6$-$C_{18}$-aryl$)_2$;

$N(C_3$-$C_{17}$-heteroaryl$)_2$;

$N(C_3$-$C_{17}$-heteroaryl$)(C_6$-$C_{18}$-aryl$)$.

The dashed line "" in Formula II each represents a binding sites of the first chemical moiety to the second chemical moiety; at each dashed line, the structure shown in Formula II is bonded to the structure shown in Formula I via a single bond.

Z is selected from the group consisting of a direct bond, $CR^5R^6$, $C{=}CR^5R^6$, $C{=}O$, $C{=}NR^5$, $NR^5$, O, $SiR^5R^6$, S, S(O) and $S(O)_2$;

$R^a$ is at each occurrence independently selected from the group consisting of:

hydrogen;
deuterium;
$N(R^3)_2$;
$OR^3$;
$SR^3$;
$Si(R^3)_3$;
$B(OR^3)_2$;
$OSO_2R^3$;
$CF_3$;
CN;
halogen;
$C_1$-$C_{40}$-alkyl,
which is optionally substituted with one or more substituents $R^3$ and
wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;
$C_1$-$C_{40}$-alkoxy,
which is optionally substituted with one or more substituents $R^3$ and
wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;
$C_1$-$C_{40}$-thioalkoxy,
which is optionally substituted with one or more substituents $R^3$ and
wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;
$C_2$-$C_{40}$-alkenyl,
which is optionally substituted with one or more substituents $R^3$ and
wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;
$C_2$-$C_{40}$-alkynyl,
which is optionally substituted with one or more substituents $R^3$ and
wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;
$C_6$-$C_{60}$-aryl,
which is optionally substituted with one or more substituents $R^3$; and
$C_3$-$C_{57}$-heteroaryl,
which is optionally substituted with one or more substituents $R^3$;
$R^3$, $R^5$, $R^6$ are at each occurrence independently selected from the group consisting of:
hydrogen;
deuterium;
$N(R^4)_2$;
$OR^4$;
$SR^4$;
$Si(R^4)_3$;
$B(OR^4)_2$;
$OSO_2R^4$;
$CF_3$;
CN;
halogen;
$C_1$-$C_{40}$-alkyl,
which is optionally substituted with one or more substituents $R^4$ and
wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;
$C_1$-$C_{40}$-alkoxy,
which is optionally substituted with one or more substituents $R^4$ and
wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;
$C_1$-$C_{40}$-thioalkoxy,
which is optionally substituted with one or more substituents $R^4$ and
wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;
$C_2$-$C_{40}$-alkenyl,
which is optionally substituted with one or more substituents $R^4$ and
wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;
$C_2$-$C_{40}$-alkynyl,
which is optionally substituted with one or more substituents $R^4$ and
wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;
$C_6$-$C_{60}$-aryl,
which is optionally substituted with one or more substituents $R^4$; and
$C_3$-$C_{57}$-heteroaryl,
which is optionally substituted with one or more substituents $R^4$;
$R^4$ is at each occurrence independently from one another selected from the group consisting of:
hydrogen; deuterium; halogen; OPh; SPh; $CF_3$; CN; $Si(C_1$-$C_5$-alkyl$)_3$; $Si(Ph)_3$;
$C_1$-$C_5$-alkyl,
wherein optionally one or more hydrogen atoms are independently substituted by deuterium, halogen, CN, or $CF_3$;
$C_1$-$C_5$-alkoxy,
wherein optionally one or more hydrogen atoms are independently substituted by deuterium, halogen, CN, or $CF_3$;
$C_1$-$C_5$-thioalkoxy,
wherein optionally one or more hydrogen atoms are independently substituted by deuterium, halogen, CN, or $CF_3$;
$C_2$-$C_5$-alkenyl,
wherein optionally one or more hydrogen atoms are independently substituted by deuterium, halogen, CN, or $CF_3$;
$C_2$-$C_5$-alkynyl,
wherein optionally one or more hydrogen atoms are independently substituted by deuterium, halogen, CN, or $CF_3$;
$C_6$-$C_{18}$-aryl,
which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$;

$N(C_3$-$C_{17}$-heteroaryl$)_2$; and $N(C_3$-$C_{17}$-heteroaryl$)(C_6$-$C_{18}$-aryl);

wherein any of the groups $R^a$ positioned adjacent to each other are optionally bonded to each other and form an aryl or a heteroaryl ring, an aryl or a heteroaryl ring, which is optionally substituted with one or more $C_6$-$C_{18}$-aryl substituents, $C_1$-$C_5$-alkyl substituents, deuterium, halogen, CN or $CF_3$; and wherein the substituent $R^5$ independently from each other optionally form a mono- or polycyclic, aliphatic, aromatic and/or benzo-fused ring system with one or more other substituents from the group of $R^6$, and/or $R^a$.

Specific examples are listed below:

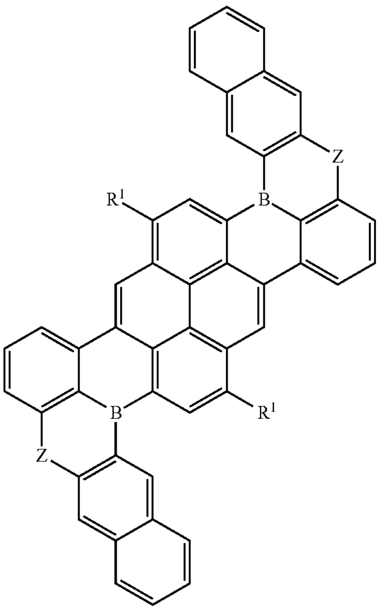

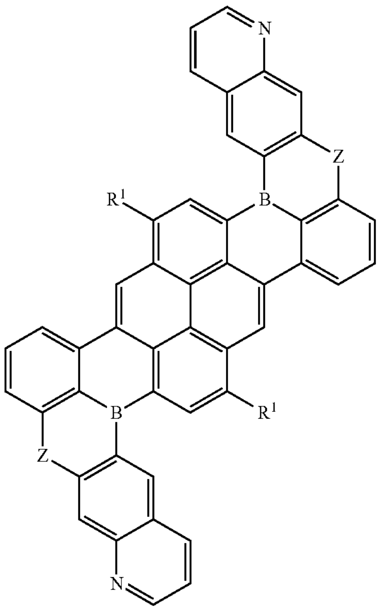

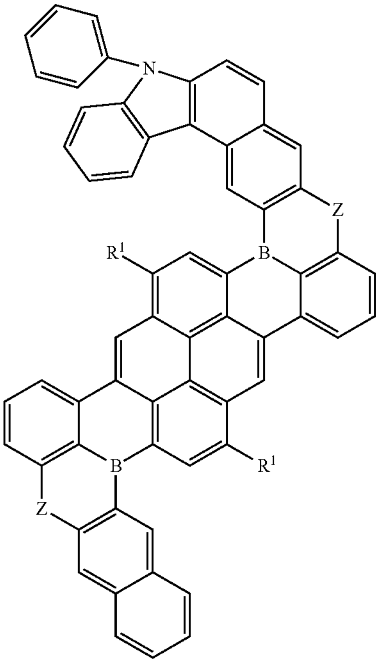

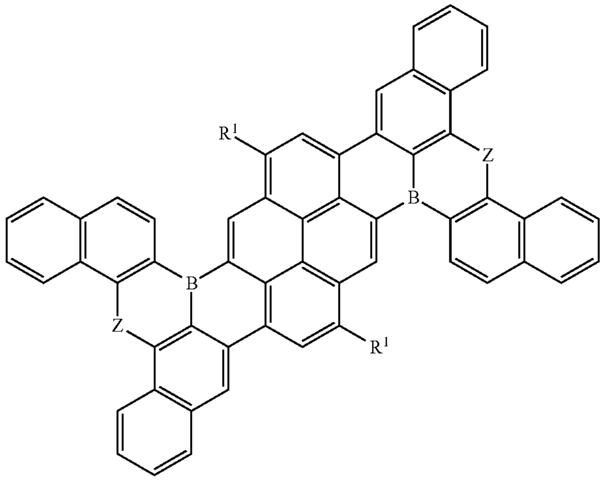

-continued
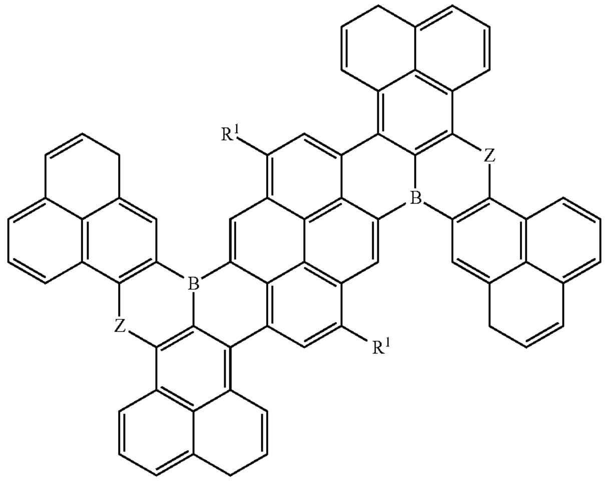
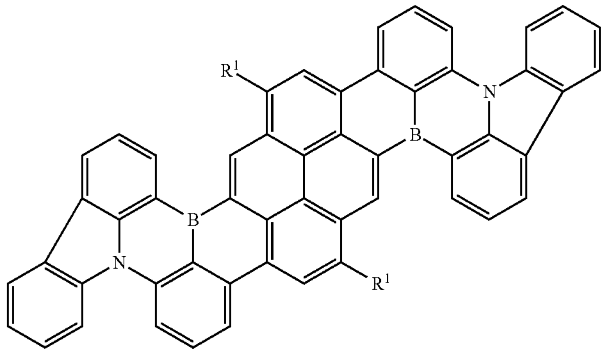
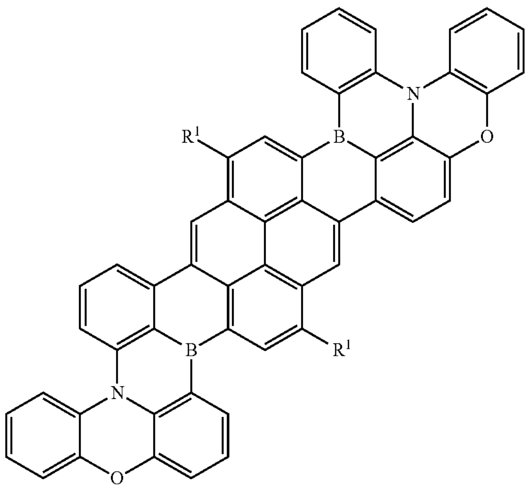
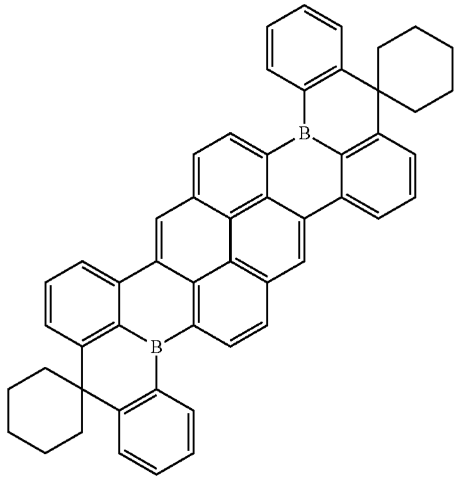
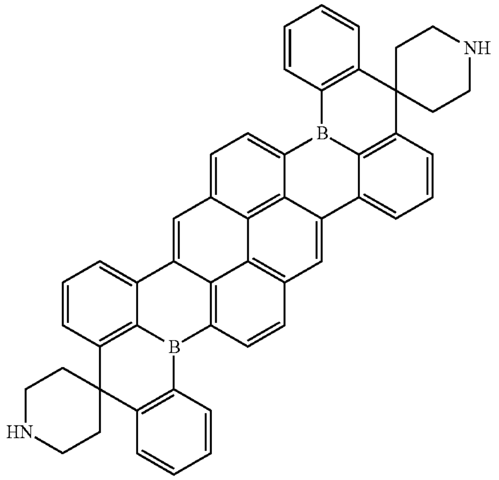

-continued

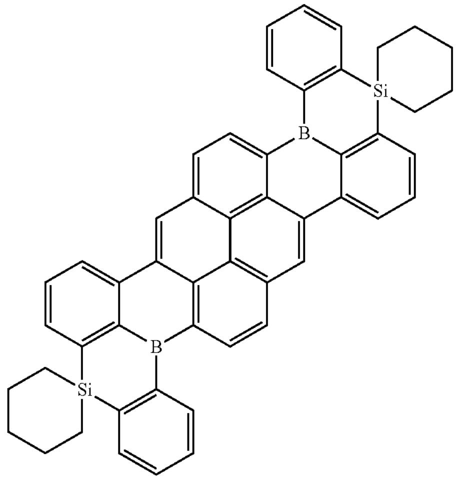

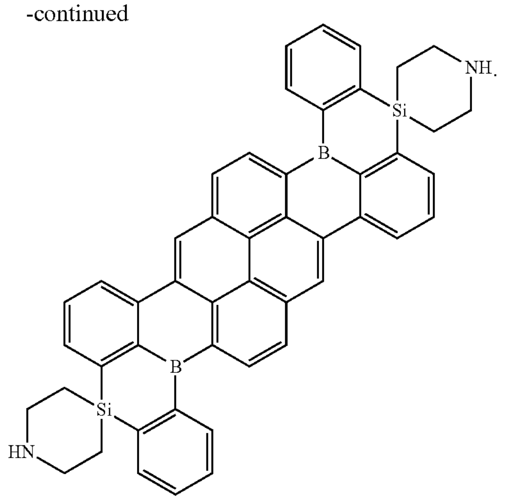

$R^z$ is at each occurrence the binding site of a single bond linking the first chemical moiety to the second chemical moiety, two $R^z$ positioned adjacent to each other are bonded to the structure shown as Formula II at the positions marked by the dotted lines. This is exemplified by the following structures of organic molecules:

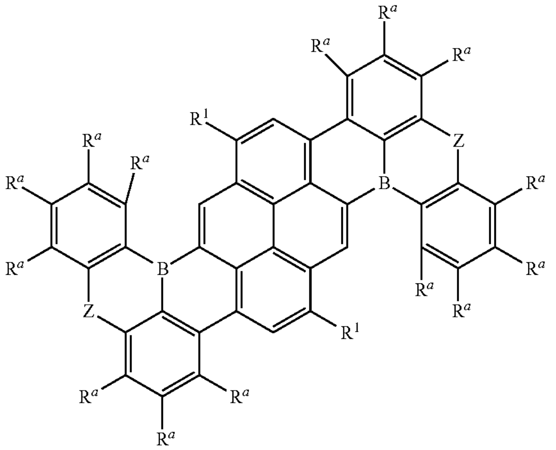

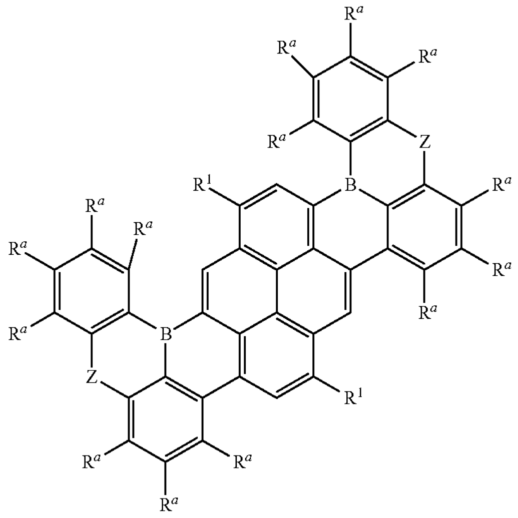

-continued

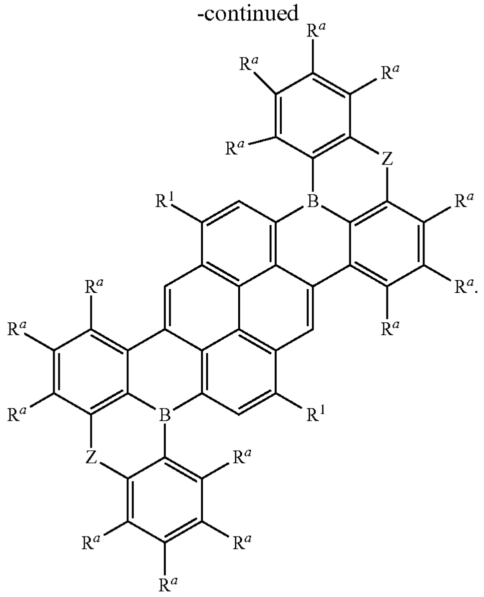

In one embodiment of the invention, $R^a$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, F and Ph, pyridinyl, which is optionally substituted with one or more substituents independently from each other selected from the group consisting of Me, $^i$Pr, $^t$Bu, CN, $CF_3$, F and Ph, carbazolyl, which is optionally substituted with one or more substituents independently from each other selected from the group consisting of Me, $^i$Pr, $^t$Bu, CN, $CF_3$, F and Ph, triazinyl, which is optionally substituted with one or more substituents independently from each other selected from the group consisting of Me, $^i$Pr, $^t$Bu, CN, $CF_3$, F and Ph, and $N(Ph)_2$, wherein adjacent groups $R^a$ optionally are bonded to each other and form an aryl or a heteroaryl ring, which is optionally substituted with one or more substituents that are selected from the group consisting of $C_1$-$C_5$-alkyl substituents, deuterium, halogen, CN and $CF_3$.

In one embodiment of the invention, $R^a$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$, wherein adjacent groups $R^a$ optionally are bonded to each other and form an aryl or heteroaryl ring, which is optionally substituted with one or more $C_1$-$C_5$-alkyl substituents, deuterium, halogen, CN or $CF_3$.

In one embodiment of the invention, $R^a$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, $R^a$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph, wherein adjacent groups $R^a$ optionally are bonded to each other and form an aryl or heteroaryl ring, which is optionally substituted with one or more $C_1$-$C_5$-alkyl substituents, deuterium, halogen, CN or $CF_3$.

In a further embodiment of the invention, $R^a$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph;

and $N(Ph)_2$.

In one embodiment of the invention, $R^a$ is independently selected from the group consisting of:

hydrogen, Me, $^i$Pr, $^t$Bu,

Ph, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph;

and $N(Ph)_2$;

wherein adjacent groups $R^a$ optionally are bonded to each other and form an aryl or a heteroaryl ring, which is optionally substituted with one or more $C_1$-$C_5$-alkyl substituents, deuterium, halogen, CN or $CF_3$.

In a certain embodiment of the invention, $R^a$ is independently selected from the group consisting of:

hydrogen, Me, $^i$Pr, $^t$Bu,

Ph, which is optionally substituted with one or more substituents independently from each other selected from the group consisting of Me, $^i$Pr, $^t$Bu, CN, $CF_3$, and Ph;

and $N(Ph)_2$;

wherein adjacent groups $R^a$ optionally are bonded to each other and form an aryl ring, which is optionally substituted with one or more $C_1$-$C_5$-alkyl substituents, deuterium, halogen, CN or $CF_3$.

In a certain embodiment of the invention, $R^a$ is independently selected from the group consisting of:

hydrogen,

Me, $^i$Pr, $^t$Bu,

Ph, which is optionally substituted with one or more substituents independently from each other selected from the group consisting of Me, $^i$Pr, $^t$Bu;

wherein adjacent groups $R^a$ optionally are bonded to each other and form an aryl ring, which is optionally substituted with one or more Me, $^i$Pr, or $^t$Bu;

and $N(Ph)_2$.

In a certain embodiment of the invention, $R^a$ is independently selected from the group consisting of:

hydrogen,

Me, $^i$Pr, $^t$Bu,

Ph, which is optionally substituted with one or more substituents independently from each other selected from the group consisting of Me, $^i$Pr, $^t$Bu, CN, $CF_3$, and Ph, and $N(Ph)_2$.

In a certain embodiment of the invention, $R^a$ is independently selected from the group consisting of:

hydrogen,

Me, $^i$Pr, $^t$Bu, and $N(Ph)_2$, wherein adjacent groups $R^a$ optionally are bonded to each other and form an aryl ring, which is optionally substituted with one or more Me, $^i$Pr, or $^t$Bu.

In a certain embodiment of the invention, $R^a$ is independently selected from the group consisting of:

hydrogen,

Me, $^i$Pr, $^t$Bu,

Ph, which is optionally substituted with one or more substituents independently from each other selected from the group consisting of Me, $^i$Pr, $^t$Bu, CN, $CF_3$, and Ph, and $N(Ph)_2$.

In a certain embodiment of the invention, $R^a$ is independently selected from the group consisting of:

hydrogen,

Me, $^i$Pr, $^t$Bu,

Ph, which is optionally substituted with one or more substituents independently from each other selected from the group consisting of Me, $^i$Pr, $^t$Bu;

and $N(Ph)_2$.

In one embodiment, $R^1$ is at each occurrence independently from one another selected from the group consisting of:

hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In one embodiment, $R^1$ is selected from the group consisting of:

Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, $R^1$ is selected from the group consisting of:

Hydrogen, $^i$Pr, and

Ph, which is optionally substituted with one or more Ph substituents.

In another embodiment, $R^1$ is selected from the group consisting of:

$^i$Pr, and

Ph, which is optionally substituted with one or more Ph substituents.

In one embodiment, Z is selected from the group consisting of a direct bond, $CR^5R^6$, $NR^5$, and O.

In a preferred embodiment, Z is selected from the group consisting of a direct bond, $NR^5$, and O.

In a more preferred embodiment, Z is selected from the group consisting of a direct bond, and $NR^5$.

In a certain embodiment, Z is $NR^5$.

In a preferred embodiment, Z is selected from the group consisting of a direct bond, O, and NPh, wherein the phenyl (Ph) is optionally substituted with one or more substituents independently from each other selected from the group consisting of Me, $^i$Pr, $^t$Bu, CN, $CF_3$, F and Ph.

In a certain embodiment, Z is NPh, wherein the Ph is optionally substituted with one or more substituents independently from each other selected from the group consisting of Me, $^i$Pr, $^t$Bu, CN, $CF_3$, F and Ph.

In one embodiment, $R^3$ is at each occurrence independently from one another selected from the group consisting of:

hydrogen, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In one embodiment, $R^3$ is selected from the group consisting of:

hydrogen, Me, $^i$Pr, $^t$Bu, and

Ph, which is optionally substituted with one or more substituents independently from each other selected from the group consisting of Me, $^i$Pr, $^t$Bu, and Ph.

In one embodiment of the invention, $R^5$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$, In one embodiment of the invention, $R^5$ is independently selected from the group consisting of:

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph.

In one embodiment of the invention, $R^5$ is independently selected from the group consisting of:

Me, $^{i}Pr$, $^{t}Bu$, CN, $CF_3$,

Ph, which is optionally substituted with one or more substituents independently from each other selected from the group consisting of Me, $^{i}Pr$, $^{t}Bu$, CN, $CF_3$, and Ph.

In a preferred embodiment of the invention, $R^5$ is at each occurrence independently selected from the group consisting of:

Ph, which is optionally substituted with one or more substituents independently from each other selected from the group consisting of Me, $^{i}Pr$, $^{t}Bu$, CN, $CF_3$, and Ph.

In a more preferred embodiment of the invention, $R^5$ is at each occurrence independently selected from the group consisting of:

Ph, which is optionally substituted with one or more substituents independently from each other selected from the group consisting of Me, $^{i}Pr$, $^{t}Bu$, and Ph.

In a certain embodiment of the invention, $R^5$ is at each occurrence Ph.

In one embodiment of the invention, the second chemical moiety includes or consists of a structure of Formula IIa:

Formula IIa

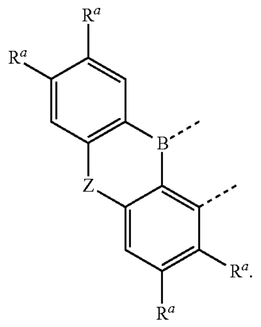

In one embodiment, the second chemical moiety consists of a structure of Formula IIa, wherein Z is selected from the group consisting of a direct bond, $CR^5R^6$, $NR^5$, and O.

In a preferred embodiment, the second chemical moiety consists of a structure of Formula IIa, wherein Z is selected from the group consisting of a direct bond, $NR^5$, and O.

In a more preferred embodiment, the second chemical moiety consists of a structure of Formula IIa, wherein Z is selected from the group consisting of a direct bond, and $NR^5$.

In a certain embodiment, the second chemical moiety consists of a structure of Formula IIa, wherein Z is $NR^5$.

In one embodiment of the invention, the second chemical moiety includes or consists of a structure of Formula IIb-I, and Formula IIb-II:

Formula IIb-I

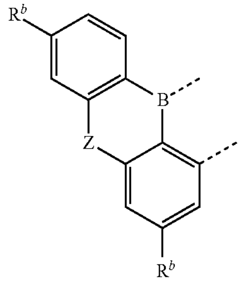

-continued

Formula IIb-II

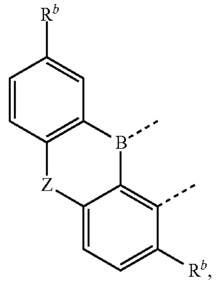

wherein $R^b$ is at each occurrence independently selected from the group consisting of:

hydrogen, deuterium, $N(R^3)_2$, $OR^3$, $SR^3$, $Si(R^3)_3$, $B(OR^3)_2$, $OSO_2R^3$, $CF_3$, CN, halogen, $C_1$-$C_{40}$-alkyl, which is optionally substituted with one or more substituents $R^3$ and wherein one or more non-adjacent $CH_2$-groups are optionally substituted by $R^3C{=}CR^3$, $C{\equiv}C$, $Si(R^3)_2$, $Ge(R^3)_2$, $Sn(R^3)_2$, C=O, C=S, C=Se, $C{=}NR^3$, $P({=}O)(R^3)$, So, $SO_2$, $NR^3$, O, S or $CONR^3$;

$C_1$-$C_{40}$-alkoxy, which is optionally substituted with one or more substituents $R^3$ and wherein one or more non-adjacent $CH_2$-groups are optionally substituted by $R^3C{=}CR^3$, $C{\equiv}C$, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;

$C_1$-$C_{40}$-thioalkoxy, which is optionally substituted with one or more substituents $R^3$ and wherein one or more non-adjacent $CH_2$-groups are optionally substituted by $R^3C{=}CR^3$, $C{\equiv}C$, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;

$C_2$-$C_{40}$-alkenyl, which is optionally substituted with one or more substituents $R^3$ and wherein one or more non-adjacent $CH_2$-groups are optionally substituted by $R^3C{=}CR^3$, $C{\equiv}C$, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;

$C_2$-$C_{40}$-alkynyl, which is optionally substituted with one or more substituents $R^3$ and wherein one or more non-adjacent $CH_2$-groups are optionally substituted by $R^3C{=}CR^3$, $C{\equiv}C$, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;

$C_6$-$C_{60}$-aryl, which is optionally substituted with one or more substituents $R^3$; and $C_3$-$C_{57}$-heteroaryl, which is optionally substituted with one or more substituents $R^3$.

In a further embodiment of the invention, $R^b$ is at each occurrence independently from one another selected from the group consisting of: hydrogen, Me, $^{i}Pr$, $^{t}Bu$, CN, $CF_3$, Ph, which is optionally substituted with one or more substituents independently from each other selected from the group consisting of Me, $^{i}Pr$, $^{t}Bu$, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the invention, $R^b$ is at each occurrence independently from one another selected from the group consisting of: Hydrogen, Me, $^{i}$Pr, $^{t}$Bu, CN, $CF_3$, Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In a preferred embodiment of the invention, $R^b$ is at each occurrence independently from one another selected from the group consisting of: Hydrogen, Me, $^{i}$Pr, $^{t}$Bu, CN, $CF_3$, Ph, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the invention, $R^b$ is at each occurrence independently from one another selected from the group consisting of: Hydrogen, Me, $^{i}$Pr, $^{t}$Bu, CN, $CF_3$, Ph, which is optionally substituted with one or more substituents independently from each other selected from the group consisting of Me, $^{i}$Pr, $^{t}$Bu, CN, $CF_3$, and Ph.

In another embodiment of the invention, $R^b$ is at each occurrence independently from one another selected from the group consisting of: Me, $^{i}$Pr, $^{t}$Bu, CN, $CF_3$, Ph, which is optionally substituted with one or more substituents independently from each other selected from the group consisting of Me, $^{i}$Pr, $^{t}$Bu, CN, $CF_3$, and Ph, and $N(Ph)_2$.

In another embodiment of the invention, $R^b$ is at each occurrence independently from one another selected from the group consisting of: hydrogen, Me, $^{i}$Pr, $^{t}$Bu, Ph, which is optionally substituted with one or more substituents independently from each other selected from the group consisting of Me, $^{i}$Pr, $^{t}$Bu, and Ph, and $N(Ph)_2$.

In another embodiment of the invention, $R^b$ is at each occurrence independently from one another selected from the group consisting of: hydrogen, Me, $^{i}$Pr, $^{t}$Bu, and $N(Ph)_2$.

In another embodiment of the invention, $R^b$ is at each occurrence independently from one another selected from the group consisting of: hydrogen, Ph, which is optionally substituted with one or more substituents independently from each other selected from the group consisting of Me, $^{i}$Pr, $^{t}$Bu, and Ph, and $N(Ph)_2$.

In another embodiment of the invention, $R^b$ is at each occurrence independently from one another selected from the group consisting of: Me, $^{i}$Pr, $^{t}$Bu, Ph, which is optionally substituted with one or more substituents independently from each other selected from the group consisting of Me, $^{i}$Pr, $^{t}$Bu, and Ph, and $N(Ph)_2$.

In another embodiment of the invention, $R^b$ is at each occurrence independently from one another selected from the group consisting of: Me, $^{i}$Pr, $^{t}$Bu, and $N(Ph)_2$.

In another embodiment of the invention, $R^b$ is at each occurrence independently from one another selected from the group consisting of:

Ph, which is optionally substituted with one or more substituents independently from each other selected from the group consisting of Me, $^{i}$Pr, $^{t}$Bu, and Ph, and $N(Ph)_2$.

In one embodiment, the second chemical moiety consists of a structure of Formula IIb-I, and Formula IIb-II, wherein Z is selected from the group consisting of a direct bond, $CR^5R^6$, $NR^5$, and O.

In a preferred embodiment, the second chemical moiety consists of a structure of Formula IIb-I, and Formula IIb-II, wherein Z is selected from the group consisting of a direct bond, $NR^5$, and O.

In a more preferred embodiment, the second chemical moiety consists of a structure of Formula IIb-I, and Formula IIb-II, wherein Z is selected from the group consisting of a direct bond, and $NR^5$.

In a certain embodiment, the second chemical moiety consists of a structure of Formula IIb-I, and Formula IIb-II, wherein Z is $NR^5$.

In a preferred embodiment of the invention, the second chemical moiety includes or consists of a structure of Formula IIb-I:

Formula IIb-I

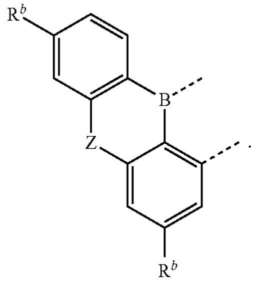

In one embodiment, the second chemical moiety consists of a structure of Formula IIb-I, wherein Z is selected from the group consisting of a direct bond, $CR^5R^6$, $NR^5$, and O.

In a preferred embodiment, the second chemical moiety consists of a structure of Formula IIb-I, wherein Z is selected from the group consisting of a direct bond, $NR^5$, and O.

In a more preferred embodiment, the second chemical moiety consists of a structure of Formula IIb-I, wherein Z is selected from the group consisting of a direct bond, and $NR^5$.

In a certain embodiment, the second chemical moiety consists of a structure of Formula IIb-I, wherein Z is $NR^5$.

In one embodiment of the invention, the second chemical moiety includes or consists of a structure of Formula IIc-I, Formula IIc-II, Formula IIc-III, and Formula IIc-IV:

Formula IIc-I

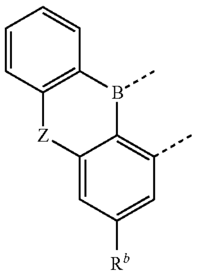

Formula IIc-II

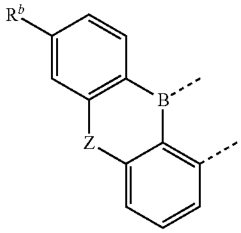

Formula IIc-III

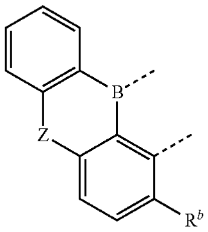

Formula IIc-IV

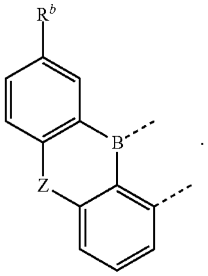

In one embodiment, the second chemical moiety consists of a structure of Formula IIc-I, Formula IIc-II, Formula IIc-III, and Formula IIc-IV, wherein Z is selected from the group consisting of a direct bond, $CR^5R^6$, $NR^5$, and O.

In a preferred embodiment, the second chemical moiety consists of a structure of Formula IIc-I, Formula IIc-II, Formula IIc-III, and Formula IIc-IV, wherein Z is selected from the group consisting of a direct bond, $NR^5$, and O.

In a more preferred embodiment, the second chemical moiety consists of a structure of Formula IIc-I, Formula IIc-II, Formula IIc-III, and Formula IIc-IV, wherein Z is selected from the group consisting of a direct bond, and $NR^5$.

In a certain embodiment, the second chemical moiety consists of a structure of Formula IIc-I, Formula IIc-II, Formula IIc-III, and Formula IIc-IV, wherein Z is $NR^5$.

In a preferred embodiment of the invention, the second chemical moiety includes or consists of a structure of Formula IIc-I:

Formula IIc-I

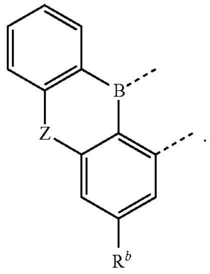

In one embodiment, the second chemical moiety consists of a structure of Formula IIc-I, wherein Z is selected from the group consisting of a direct bond, $CR^5R^6$, $NR^5$, and O.

In a preferred embodiment, the second chemical moiety consists of a structure of Formula IIc-I, wherein Z is selected from the group consisting of a direct bond, $NR^5$, and O.

In a more preferred embodiment, the second chemical moiety consists of a structure of Formula IIc-I, wherein Z is selected from the group consisting of a direct bond, and $NR^5$.

In a certain embodiment, the second chemical moiety consists of a structure of Formula IIc-I, wherein Z is $NR^5$.

Below, examples of the second chemical moiety are shown:

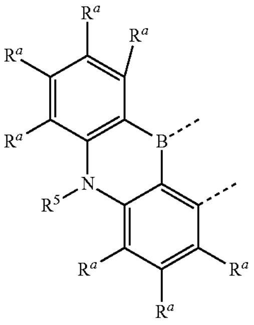

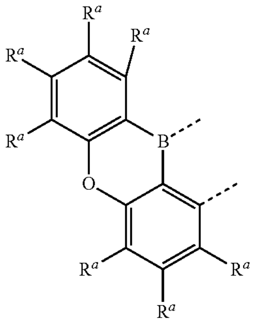

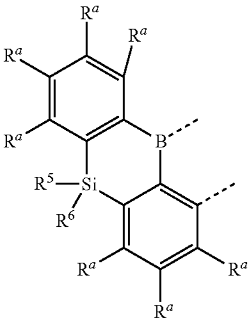

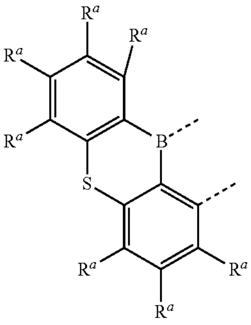

-continued
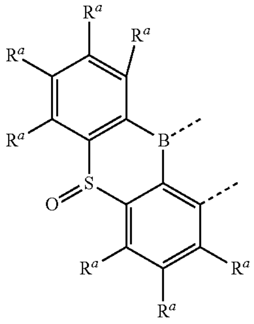
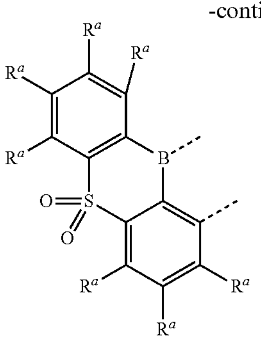
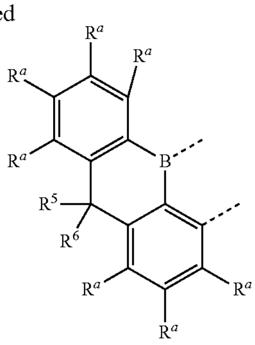
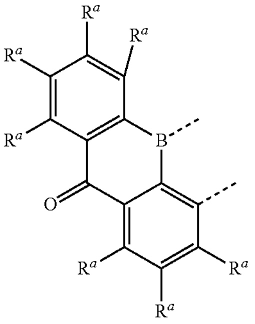
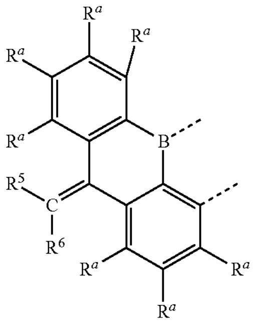
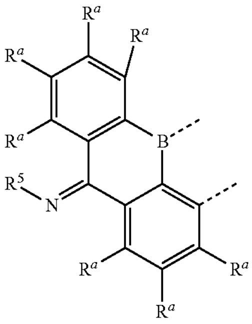
In one embodiment of the invention, the organic molecules include or consist of a structure of Formula Ia, Formula Ib, or Formula Ic:
Formula Ia
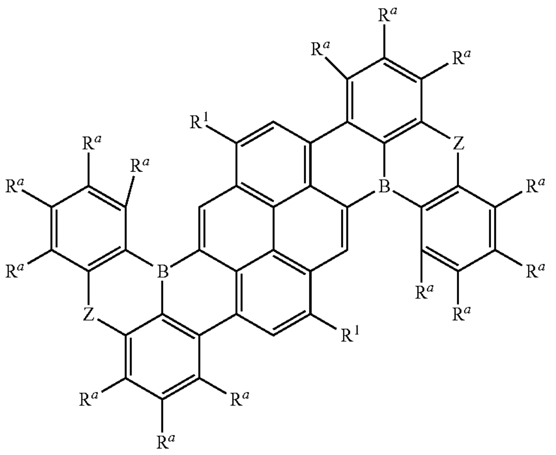
-continued
Formula Ib
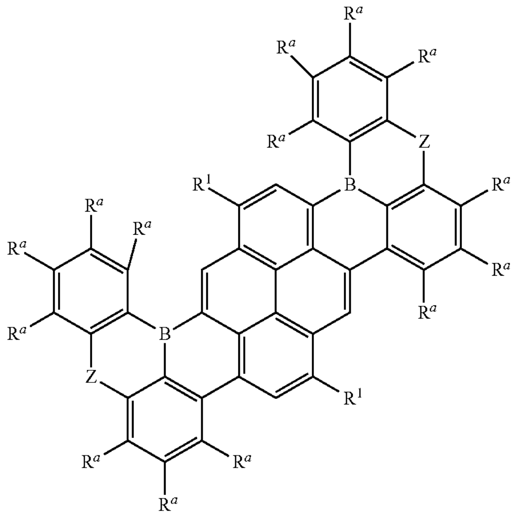

-continued

Formula Ic

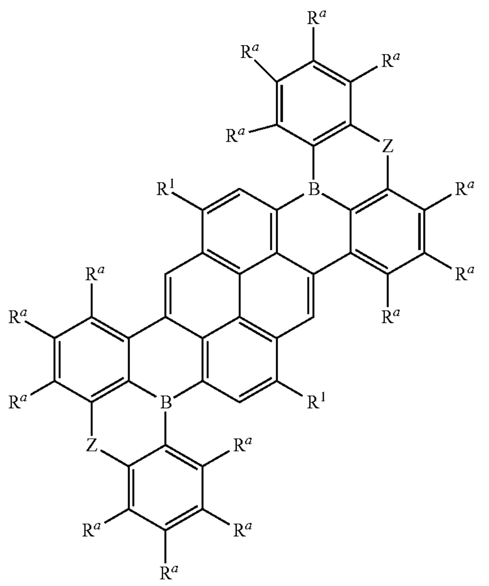

In one embodiment of the invention, the organic molecules include or consist of a structure of Formula Ia, Formula Ib, or Formula Ic, wherein $R^a$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$, wherein adjacent groups $R^a$ optionally are bonded to each other and form an aryl or heteroaryl ring, which is optionally substituted with one or more $C_1$-$C_5$-alkyl substituents, deuterium, halogen, CN or $CF_3$.

In one embodiment of the invention, the organic molecules include or consist of a structure of Formula Ia, Formula Ib, or Formula Ic, wherein $R^a$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecules include or consist of a structure of Formula Ia, Formula Ib, or Formula Ic, wherein $R^a$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph, wherein adjacent groups $R^a$ optionally are bonded to each other and form an aryl or heteroaryl ring, which is optionally substituted with one or more $C_1$-$C_5$-alkyl substituents, deuterium, halogen, CN or $CF_3$.

In a further embodiment of the invention, the organic molecules include or consist of a structure of Formula Ia, Formula Ib, or Formula Ic, wherein $R^a$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph;

and $N(Ph)_2$.

In one embodiment of the invention, the organic molecules include or consist of a structure of Formula Ia, Formula Ib, or Formula Ic, wherein $R^a$ is independently selected from the group consisting of:

hydrogen, Me, $^i$Pr, $^t$Bu,

Ph, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph;

and $N(Ph)_2$;

wherein adjacent groups $R^a$ optionally are bonded to each other and form an aryl or heteroaryl ring, which is optionally substituted with one or more $C_1$-$C_5$-alkyl substituents, deuterium, halogen, CN or $CF_3$.

In a certain embodiment of the invention, the organic molecules include or consist of a structure of Formula Ia, Formula Ib, or Formula Ic, wherein $R^a$ is independently selected from the group consisting of:

hydrogen, Me, $^i$Pr, $^t$Bu,

Ph, which is optionally substituted with one or more substituents independently from each other selected from the group consisting of Me, $^i$Pr, $^t$Bu, CN, $CF_3$, and Ph;

and $N(Ph)_2$;

wherein adjacent groups $R^a$ optionally are bonded to each other and form an aryl ring, which is optionally substituted with one or more $C_1$-$C_5$-alkyl substituents, deuterium, halogen, CN or $CF_3$.

In a certain embodiment of the invention, the organic molecules include or consist of a structure of Formula Ia, Formula Ib, or Formula Ic, wherein $R^a$ is independently selected from the group consisting of:

hydrogen, Me, $^i$Pr, $^t$Bu,

Ph, which is optionally substituted with one or more substituents independently from each other selected from the group consisting of Me, $^i$Pr, $^t$Bu;

wherein adjacent groups $R^a$ optionally are bonded to each other and form an aryl ring, which is optionally substituted with one or more Me, $^i$Pr, or $^t$Bu;

and $N(Ph)_2$.

In a certain embodiment of the invention, the organic molecules include or consist of a structure of Formula Ia, Formula Ib, or Formula Ic, wherein $R^a$ is independently selected from the group consisting of:

hydrogen, Me, $^i$Pr, $^t$Bu,

Ph, which is optionally substituted with one or more substituents independently from each other selected from the group consisting of Me, $^i$Pr, $^t$Bu, CN, $CF_3$, and Ph;

and $N(Ph)_2$.

In a certain embodiment of the invention, the organic molecules include or consist of a structure of Formula Ia, Formula Ib, or Formula Ic, wherein $R^a$ is independently selected from the group consisting of:

hydrogen, Me, $^i$Pr, $^t$Bu,

Ph, which is optionally substituted with one or more substituents independently from each other selected from the group consisting of Me, $^i$Pr, $^t$Bu;

wherein adjacent groups $R^a$ optionally are bonded to each other and form an aryl ring, which is optionally substituted with one or more Me, $^i$Pr, or $^t$Bu.

In a certain embodiment of the invention, the organic molecules include or consist of a structure of Formula Ia, Formula Ib, or Formula Ic, wherein $R^a$ is independently selected from the group consisting of:

hydrogen, Me, Pr, $^t$Bu,

Ph, which is optionally substituted with one or more substituents independently from each other selected from the group consisting of Me, $^i$Pr, $^t$Bu, CN, $CF_3$, and Ph.

In a certain embodiment of the invention, the organic molecules include or consist of a structure of Formula Ia, Formula Ib, or Formula Ic, wherein $R^a$ is independently selected from the group consisting of:

hydrogen, Me, $^i$Pr, $^t$Bu,

Ph, which is optionally substituted with one or more substituents independently from each other selected from the group consisting of Me, $^i$Pr, $^t$Bu;

and $N(Ph)_2$.

In one embodiment, the organic molecules include or consist of a structure of Formula Ia, Formula Ib, or Formula Ic, wherein $R^1$ is at each occurrence independently from one another selected from the group consisting of:

hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In one embodiment, the organic molecules include or consist of a structure of Formula Ia, Formula Ib, or Formula Ic, wherein $R^1$ is selected from the group consisting of:

Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecules include or consist of a structure of Formula Ia, Formula Ib, or Formula Ic, wherein $R^1$ is selected from the group consisting of:

hydrogen, $^i$Pr, and

Ph, which is optionally substituted with one or more substituents Ph.

In another embodiment, the organic molecules include or consist of a structure of Formula Ia, Formula Ib, or Formula Ic, wherein $R^1$ is selected from the group consisting of:

$^i$Pr, and

Ph, which is optionally substituted with one or more substituents Ph.

In one embodiment, the organic molecules include or consist of a structure of Formula Ia, Formula Ib, or Formula Ic, wherein Z is selected from the group consisting of a direct bond, $CR^5R^6$, $NR^5$, and O.

In a preferred embodiment, the organic molecules include or consist of a structure of Formula Ia, Formula Ib, or Formula Ic, wherein Z is selected from the group consisting of a direct bond, $NR^5$, and O.

In a more preferred embodiment, the organic molecules include or consist of a structure of Formula Ia, Formula Ib, or Formula Ic, wherein Z is selected from the group consisting of a direct bond, and $NR^5$.

In a certain embodiment, the organic molecules include or consist of a structure of Formula Ia, Formula Ib, or Formula Ic, wherein Z is $NR^5$.

In one embodiment, the organic molecules include or consist of a structure of Formula Ia, Formula Ib, or Formula Ic, wherein $R^3$, $R^4$, $R^5$ are at each occurrence independently from one another selected from the group consisting of:

hydrogen, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In one embodiment, the organic molecules include or consist of a structure of Formula Ia, Formula Ib, or Formula Ic, wherein $R^3$, $R^4$, $R^5$ are selected from the group consisting of:

hydrogen, Me, $^i$Pr, $^t$Bu, and

Ph, which is optionally substituted with one or more substituents independently from each other selected from the group consisting of Me, $^i$Pr, $^t$Bu, and Ph.

In one embodiment of the invention, the organic molecules include or consist of a structure of Formula Ia or Formula Ic.

In one embodiment of the invention, the organic molecules include or consist of a structure of Formula Ia, or Formula Ic, wherein Z is selected from the group consisting of a direct bond, $CR^5R^6$, $NR^5$, and O.

In one embodiment of the invention, the organic molecules include or consist of a structure of Formula Ia, or Formula Ic, wherein Z is selected from the group consisting of a direct bond, $NR^5$, and O.

In one embodiment of the invention, the organic molecules include or consist of a structure of Formula Ia, or Formula Ic, wherein Z is selected from the group consisting of a direct bond, and $NR^5$.

In one embodiment of the invention, the organic molecules include or consist of a structure of Formula Ia, or Formula Ic, wherein Z is $NR^5$.

In a preferred embodiment of the invention, the organic molecules include or consist of a structure of Formula Ia:

Formula Ia

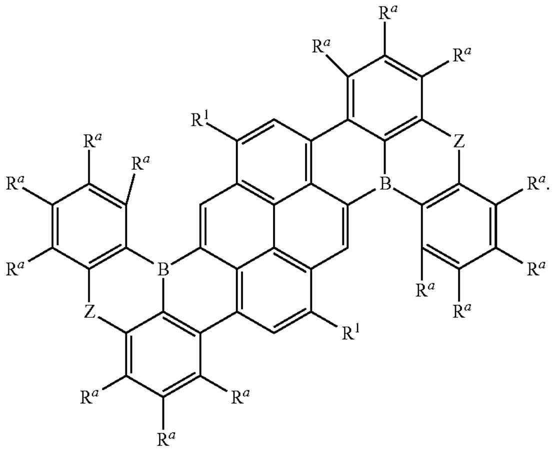

In one embodiment of the invention, the organic molecules include or consist of a structure of Formula Ia, wherein Z is selected from the group consisting of a direct bond, $CR^5R^6$, $NR^5$, and O.

In one embodiment of the invention, the organic molecules include or consist of a structure of Formula Ia, wherein Z is selected from the group consisting of a direct bond, $NR^5$, and O.

In one embodiment of the invention, the organic molecules include or consist of a structure of Formula Ia, wherein Z is selected from the group consisting of a direct bond, and $NR^5$.

In one embodiment of the invention, the organic molecules include or consist of a structure of Formula Ia, wherein Z is $NR^5$.

In another embodiment of the invention, the organic molecules include or consist of a structure of Formula Ic:

Formula Ic

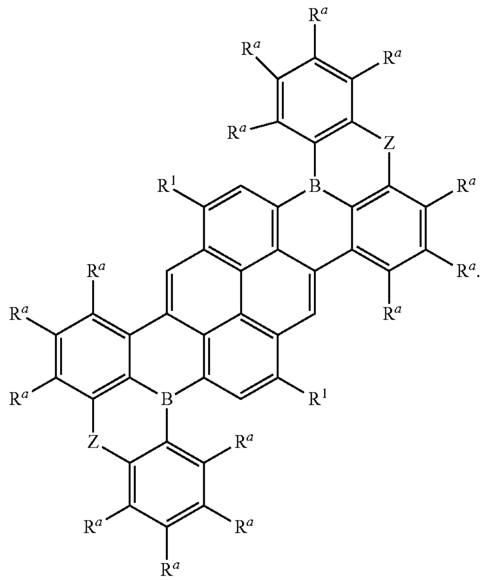

In a preferred embodiment of the invention, the organic molecules include or consist of a structure of Formula Ia-i:

Formula Ia-I

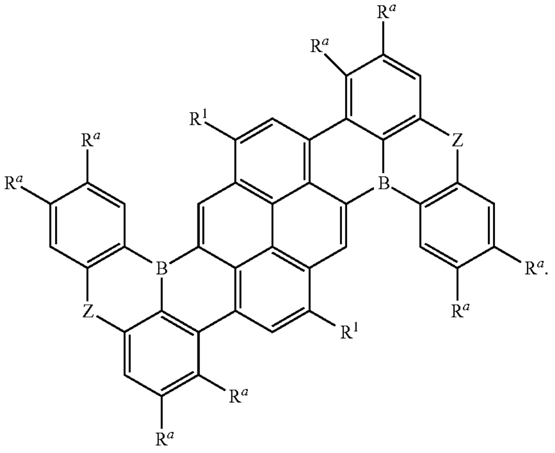

In one embodiment of the invention, the organic molecules include or consist of a structure of Formula Ia-1, wherein Z is selected from the group consisting of a direct bond, $CR^5R^6$, $NR^5$, and O.

In one embodiment of the invention, the organic molecules include or consist of a structure of Formula Ia-1, wherein Z is selected from the group consisting of a direct bond, $NR^5$, and O.

In one embodiment of the invention, the organic molecules include or consist of a structure of Formula Ia-I, wherein Z is selected from the group consisting of a direct bond, and $NR^5$.

In one embodiment of the invention, the organic molecules include or consist of a structure of Formula Ia-I, wherein Z is $NR^5$.

In a further embodiment of the invention, the organic molecules include or consist of a structure of Formula Ia-II:

Formula Ia-II

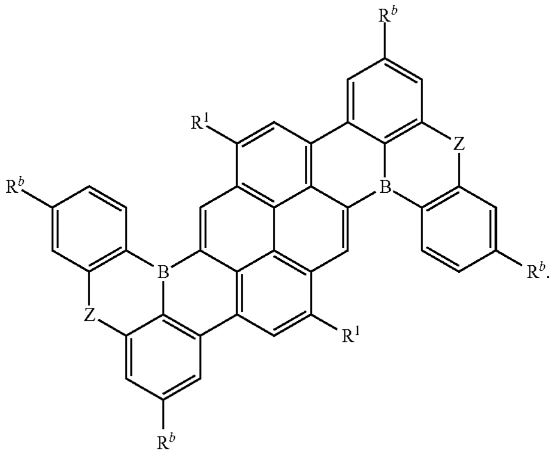

In one embodiment of the invention, the organic molecules include or consist of a structure of Formula Ia-II, wherein Z is selected from the group consisting of a direct bond, $CR^5R^6$, $NR^5$, and O.

In one embodiment of the invention, the organic molecules include or consist of a structure of Formula Ia-II, wherein Z is selected from the group consisting of a direct bond, $NR^5$, and O.

In one embodiment of the invention, the organic molecules include or consist of a structure of Formula Ia-II, wherein Z is selected from the group consisting of a direct bond, and $NR^5$.

In one embodiment of the invention, the organic molecules include or consist of a structure of Formula Ia-II, wherein Z is $NR^5$.

In a further embodiment of the invention, the organic molecules include or consist of a structure of Formula Ia-III:

Formula Ia-III

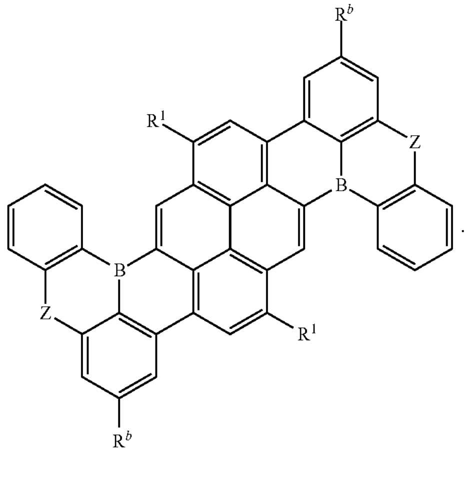

In one embodiment of the invention, the organic molecules include or consist of a structure of Formula Ia-III, wherein Z is selected from the group consisting of a direct bond, $CR^5R^6$, $NR^5$, and O.

In one embodiment of the invention, the organic molecules include or consist of a structure of Formula Ia-III, wherein Z is selected from the group consisting of a direct bond, $NR^5$, and O.

In one embodiment of the invention, the organic molecules include or consist of a structure of Formula Ia-III, wherein Z is selected from the group consisting of a direct bond, and $NR^5$.

In one embodiment of the invention, the organic molecules include or consist of a structure of Formula Ia-III, wherein Z is $NR^5$.

As used throughout the present application, the term "cyclic group" may be understood in the broadest sense as any mono-, bi- or polycyclic moieties.

As used throughout the present application, the terms "ring" and "ring system" may be understood in the broadest sense as any mono-, bi- or polycyclic moieties.

As used throughout the present application, the term "carbocycle" may be understood in the broadest sense as any cyclic group in which the cyclic core structure includes only carbon atoms that may of course be substituted with hydrogen or any other substituents defined in the specific embodiments of the invention. It is understood that the term "carbocyclic" as adjective refers to cyclic groups in which the cyclic core structure includes only carbon atoms that may of course be substituted with hydrogen or any other substituents defined in the specific embodiments of the invention.

As used throughout the present application, the term "heterocycle" may be understood in the broadest sense as any cyclic group in which the cyclic core structure includes not just carbon atoms, but also at least one heteroatom. It is understood that the term "heterocyclic" as adjective refers to cyclic groups in which the cyclic core structure includes not just carbon atoms, but also at least one heteroatom. The heteroatoms may, unless stated otherwise in specific embodiments, at each occurrence be the same or different and be individually selected from the group consisting of N, O, S, and Se. All carbon atoms or heteroatoms included in a heterocycle in the context of the invention may of course be substituted with hydrogen or any other substituents defined in the specific embodiments of the invention.

As used throughout the present application, the term "aromatic ring system" may be understood in the broadest sense as any bi- or polycyclic aromatic moiety.

As used throughout the present application, the term "heteroaromatic ring system" may be understood in the broadest sense as any bi- or polycyclic heteroaromatic moiety.

As used throughout the present application, the term "fused" when referring to aromatic or heteroaromatic ring systems means that the aromatic or heteroaromatic rings that are "fused" share at least one bond that is part of both ring systems. For example, naphthalene (or naphthyl when referred to as substituent) or benzothiophene (or benzothiphenyl when referred to as substituent) are considered fused aromatic ring systems in the context of the present invention, in which two benzene rings (for naphthalene) or a thiophene and a benzene (for benzothiophene) share one bond. It is also understood that sharing a bond in this context includes sharing the two atoms that build up the respective bond and that fused aromatic or heteroaromatic ring systems can be understood as one aromatic or heteroaromatic system. Additionally, it is understood, that more than one bond may be shared by the aromatic or heteroaromatic rings building up a fused aromatic or heteroaromatic ring system (e.g., in pyrene). Furthermore, it will be understood that aliphatic ring systems may also be fused and that this has the same meaning as for aromatic or heteroaromatic ring systems, with the exception of course, that fused aliphatic ring systems are not aromatic.

As used throughout the present application, the terms "aryl" and "aromatic" may be understood in the broadest sense as any mono-, bi- or polycyclic aromatic moieties. Accordingly, an aryl group contains 6 to 60 aromatic ring atoms, and a heteroaryl group contains 5 to 60 aromatic ring atoms, of which at least one is a heteroatom. Notwithstanding, throughout the application the number of aromatic ring atoms may be given as subscripted number in the definition of certain substituents. In particular, the heteroaromatic ring includes one to three heteroatoms. Again, the terms "heteroaryl" and "heteroaromatic" may be understood in the broadest sense as any mono-, bi- or polycyclic heteroaromatic moieties that include at least one heteroatom.

The heteroatoms may, unless stated otherwise in specific embodiments, at each occurrence be the same or different and be individually selected from the group consisting of N, O, S, and Se. Accordingly, the term "arylene" refers to a divalent substituent that bears two binding sites to other molecular structures and thereby serving as a linker structure. In case, a group in the exemplary embodiments is defined differently from the definitions given here, for example, the number of aromatic ring atoms or number of heteroatoms differs from the given definition, the definition in the exemplary embodiments is to be applied. According to the invention, a condensed (annulated) aromatic or heteroaromatic polycycle is built of two or more single aromatic or heteroaromatic cycles, which formed the polycycle via a condensation reaction.

In particular, as used throughout the present application the term "aryl group" or "heteroaryl group" includes groups which can be bound via any position of the aromatic or heteroaromatic group, derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, selenophene, benzoselenophene, isobenzoselenophene, dibenzoselenophene; pyrrole, indole, isoindole, carbazole, indolocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, naphthooxazole, anthroxazole, phenanthroxazole, isoxazole, 1,2-thiazole, 1,3-thiazole, benzothiazole, pyridazine, benzopyridazine, pyrimidine, benzopyrimidine, 1,3,5-triazine, quinoxaline, pyrazine, phenazine, naphthyridine, carboline, benzocarboline, phenanthroline, 1,2,3-triazole, 1,2,4-triazole, benzotriazole, 1,2,3-oxadiazole, 1,2,4-oxadiazole, 1,2,5-oxadiazole, 1,2,3,4-tetrazine, purine, pteridine, indolizine and benzothiadiazole or combinations of the abovementioned groups.

As used throughout the present application, the term "aliphatic" when referring to ring systems may be understood in the broadest sense and means that none of the rings that build up the ring system is an aromatic or heteroaromatic ring. It is understood that such an aliphatic ring system may be fused to one or more aromatic rings so that some (but not all) carbon- or heteroatoms included in the core structure of the aliphatic ring system are part of an attached aromatic ring.

As used above and herein, the term "alkyl group" may be understood in the broadest sense as any linear, branched, or cyclic alkyl substituent. In particular, the term alkyl includes the substituents methyl (Me), ethyl (Et), n-propyl ($^{n}$Pr), i-propyl ($^{i}$Pr), cyclopropyl, n-butyl ($^{n}$Bu), i-butyl ($^{i}$Bu), s-butyl ($^{s}$Bu), t-butyl ($^{t}$Bu), cyclobutyl, 2-methylbutyl, n-pentyl, s-pentyl, t-pentyl, 2-pentyl, neo-pentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl)octyl, 3-(3,7-dimethyl)octyl, adamantyl, 2,2,2-trifluorethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)-cyclohex-1-yl, 1-(n-butyl)-cyclohex-1-yl, 1-(n-hexyl)-cyclohex-1-yl, 1-(n-octyl)-cyclohex-1-yl and 1-(n-decyl)-cyclohex-1-yl.

As used above and herein, the term "alkenyl" includes linear, branched, and cyclic alkenyl substituents. The term alkenyl group exemplarily includes the substituents ethenyl, propenyl, butenyl, pentenyl, cyclopentenyl, hexenyl, cyclohexenyl, heptenyl, cycloheptenyl, octenyl, cyclooctenyl or cyclooctadienyl.

As used above and herein, the term "alkynyl" includes linear, branched, and cyclic alkynyl substituents. The term alkynyl group exemplarily includes ethynyl, propynyl, butynyl, pentynyl, hexynyl, heptynyl or octynyl.

As used above and herein, the term "alkoxy" includes linear, branched, and cyclic alkoxy substituents. The term alkoxy group exemplarily includes methoxy, ethoxy, n-propoxy, i-propoxy, n-butoxy, i-butoxy, s-butoxy, t-butoxy and 2-methylbutoxy.

As used above and herein, the term "thioalkoxy" includes linear, branched, and cyclic thioalkoxy substituents, in which the O of the exemplarily alkoxy groups is replaced by S.

As used above and herein, the terms "halogen" and "halo" may be understood in the broadest sense as being preferably fluorine, chlorine, bromine, or iodine.

It is understood that when a molecular fragment is described as being a substituent or otherwise attached to another moiety, its name may be written as if it were a fragment (e.g., naphthyl, dibenzofuryl) or as if it were the whole molecule (e.g., naphthalene, dibenzofuran). As used herein, these different ways of designating a substituent or attached fragment are considered to be equivalent.

All hydrogen atoms (H) included in any structure referred to herein may at each occurrence independently of each other, and without this being indicated specifically, be replaced by deuterium (D). The replacement of hydrogen by deuterium is common practice and obvious for the person skilled in the art. Thus, there are numerous known methods by which this can be achieved and several review articles describing them (see for example: A. Michelotti, M. Roche, *Synthesis* 2019, 51(06), 1319-1328, DOI: 10.1055/s-0037-1610405; J. Atzrodt, V. Derdau, T. Fey, J. Zimmermann, *Angew. Chem. Int. Ed.* 2007, 46(15), 7744-7765, DOI: 10.1002/anie.200700039; Y. Sawama, Y. Monguchi, H. Sajiki, *Synlett* 2012, 23(7), 959-972, DOI: 10.1055/s-0031-1289696.).

It is understood that when a molecular fragment is described as being a substituent or otherwise attached to another moiety, its name may be written as if it were a fragment (e.g., naphthyl, dibenzofuryl) or as if it were the whole molecule (e.g., naphthalene, dibenzofuran). As used herein, these different ways of designating a substituent or attached fragment are considered to be equivalent.

In one embodiment of the invention, the organic molecules according to the invention have an emission peak in the visible or nearest ultraviolet range, i.e., in the range of a wavelength of from 380 nm to 800 nm, with a full width at half maximum of less than 0.35 eV, preferably less than 0.30 eV, more preferably less than 0.26 eV, even more preferably less than 0.22 eV or even less than 0.18 eV in a solution of organic solvent, in particular in dichloromethane (DCM) or chloroform, of organic molecule or in a film of poly(methyl methacrylate) (PMMA) with 1-5% by weight, in particular with 2% by weight of organic molecule at room temperature.

The energy of the first excited triplet state T1 is determined from the onset of the emission spectrum at low temperature, typically at 77 K. The phosphorescence is usually visible in a steady-state spectrum in a film of 2% emitter and 98% PMMA or in organic solvent, in particular in DCM or chloroform. The triplet energy can thus be determined as the onset of the phosphorescence spectrum. For Fluorescent emitter molecules, the energy of the first excited triplet state T1 is determined from the onset of the delayed emission spectrum at 77 K.

The photoluminescence quantum yields of the organic molecules according to the invention are, in particular, 50% or more, preferably more than 70%, more preferably more than 80%, even more preferably more than 90% or even more than 95% in a solution of organic solvent, in particular in dichloromethane (DCM) or chloroform, of 0.001 mg/mL of organic molecule according to the invention at room temperature.

The onset of an emission spectrum is determined by computing the intersection of the tangent to the emission spectrum with the x-axis. The tangent to the emission spectrum is set at the high-energy side of the emission band and at the point at half maximum of the maximum intensity of the emission spectrum.

In one embodiment, the organic molecules according to the invention have an onset of the emission spectrum, which is energetically close to the emission maximum, i.e., the energy difference between the onset of the emission spectrum and the energy of the emission maximum is below 0.14 eV, preferably below 0.13 eV, or even below 0.12 eV, while the full width at half maximum (FWHM) of the organic molecules is less than 0.35 eV, preferably less than 0.30 eV, more preferably less than 0.26 eV, even more preferably less than 0.22 eV or even less than 0.18 eV with 0.001 mg/mL of organic molecule according to the invention in DCM at room temperature, resulting in a CIEy coordinate below 0.20, preferably below 0.18, more preferably below 0.16 or even more preferred below 0.14.

A further aspect of the invention relates to the use of an organic molecule of the invention as a luminescent emitter or as an absorber, and/or as a host material and/or as an electron transport material, and/or as a hole injection material, and/or as a hole blocking material in an optoelectronic device.

A preferred embodiment relates to the use of an organic molecule according to the invention as a luminescent emitter in an optoelectronic device.

The optoelectronic device may be understood in the broadest sense as any device based on organic materials that is suitable for emitting light in the visible or nearest ultraviolet (UV) range, i.e., in the range of a wavelength of from 380 to 800 nm. More preferably, the optoelectronic device may be able to emit light in the visible range, i.e., light of from 400 nm to 800 nm.

In the context of such use, the optoelectronic device is more particularly selected from the group consisting of:

- organic light-emitting diodes (OLEDs),
- light-emitting electrochemical cells,
- OLED sensors, especially in gas and vapor sensors that are not hermetically shielded to the surroundings,
- organic diodes,
- organic solar cells,
- organic transistors,
- organic field-effect transistors,
- organic lasers, and
- down-conversion elements.

In a preferred embodiment in the context of such use, the optoelectronic device is a device selected from the group consisting of an organic light emitting diode (OLED), a light emitting electrochemical cell (LEC), and a light-emitting transistor.

In the case of the use, the fraction of the organic molecule according to the invention in the emission layer in an optoelectronic device, more particularly in an OLED, is 0.1% to 99% by weight, more particularly 1% to 80% by weight. In an alternative embodiment, the proportion of the organic molecule in the emission layer is 100% by weight.

In one embodiment, the light-emitting layer includes not only the organic molecules according to the invention, but also a host material whose triplet (T1) and singlet (S1) energy levels are energetically higher than the triplet (T1) and singlet (S1) energy levels of the organic molecule.

Host Material(s) $H^B$

According to the invention, any of the one or more host materials $H^B$ included in any of the at least one light-emitting layers B may be a p-host $H^P$ exhibiting high hole mobility, an n-host $H^N$ exhibiting high electron mobility, or a bipolar host material $H^{BP}$ exhibiting both, high hole mobility and high electron mobility.

According to the invention, a p-host $H^P$ optionally included in any of the at least one light-emitting layers B of an optoelectronic device according to the invention has a highest occupied molecular orbital HOMO($H^P$) having an energy $E^{HOMO}(H^P)$, wherein preferably: $-6.1\ eV \leq E^{HOMO}(H^P) \leq -5.6$ eV.

According to the invention, a p-host $H^P$ optionally included in any of the at least one light-emitting layers B of an optoelectronic device according to the invention has a lowest unoccupied molecular orbital LUMO($H^P$) having an energy $E^{LUMO}(H^P)$, wherein preferably: $-2.6\ eV \leq E^{LUMO}(H^P)$.

According to the invention, a p-host $H^P$ optionally included in any of the at least one light-emitting layers B of an optoelectronic device according to the invention has a lowermost excited singlet state energy level $E(S1^{p-H})$, wherein preferably: $E(S1^{p-H}) \leq 3.0$ eV.

According to the invention, a p-host $H^P$ optionally included in any of the at least one light-emitting layers B of an optoelectronic device according to the invention has a lowermost excited triplet state energy level $E(T1^{p-H})$, wherein preferably: $E(T1^{p-H})$ 2.7 eV.

It is understood that any requirements or preferred features previously defined for a host material $H^B$ included in any of the at least one light-emitting layers B of an optoelectronic device according to the invention are preferably also valid for a p-host $H^P$ according to the invention. Thus, in a preferred embodiment, the relations expressed by the following formulas (6) to (9) apply:

$$E(S1^{p-H}) > E(S1^E) \quad (6)$$

$$E(S1^{p-H}) > E(S1^S) \quad (7)$$

$$E(T1^{p\text{-}H})>E(T1^{S}) \quad (8)$$

$$E(T1^{p\text{-}H})>E(T1^{E}) \quad (9)$$

Accordingly, the lowermost excited singlet state $S1^{p\text{-}H}$ of a p-host $H^P$ is preferably higher in energy than the lowermost excited singlet state $S1^E$ of a TADF material $E^B$. The lowermost excited singlet state $S1^{p\text{-}H}$ of a p-host $H^P$ is preferably higher in energy than the lowermost excited singlet state $S1^S$ of any small FWHM emitter $S^B$. The lowermost excited triplet state $T1^{p\text{-}H}$ of a p-host $H^P$ is preferably higher in energy than the lowermost excited triplet state $T1^S$ of any small FWHM emitter $S^B$. The lowermost excited triplet state $T1^{p\text{-}H}$ of a p-host $H^P$ is preferably higher in energy than the lowermost excited triplet state $T1^E$ of a TADF material $E^B$.

According to the invention, an n-host $H^N$ optionally included in any of the at least one light-emitting layers B of an optoelectronic device according to the invention has a highest occupied molecular orbital HOMO($H^N$) having an energy $E^{HOMO}(H^N)$ wherein preferably: $E^{HOMO}(H^N) \leq -5.9$ eV.

According to the invention, an n-host $H^N$ optionally included in any of the at least one light-emitting layers B of an optoelectronic device according to the invention has a lowest unoccupied molecular orbital LUMO($H^N$) having an energy $E^{LUMO}(H^N)$ wherein preferably: $-3.5$ eV$\leq E^{LU}$MO $(H^N) \leq -2.9$ eV.

According to the invention, an n-host $H^N$ optionally included in any of the at least one light-emitting layers B of an optoelectronic device according to the invention has a lowermost excited singlet state energy level $E(S1^{n\text{-}H})$, wherein preferably: $E(S1^{n\text{-}H}) \geq 3.0$ eV.

According to the invention, an n-host $H^N$ optionally included in any of the at least one light-emitting layers B of an optoelectronic device according to the invention has a lowermost excited triplet state energy level $E(T1^{n\text{-}H})$, wherein preferably: $E(T1^{n\text{-}H}) \geq 2.7$ eV.

It is understood that any requirements or preferred properties previously defined for a host material $H^B$ included in any of the at least one light-emitting layers B of an optoelectronic device according to the invention are preferably also valid for an n-host $H^N$ according to the invention. Thus, in a preferred embodiment, the relations expressed by the following formulas (10) to (13) apply:

$$E(S1^{n\text{-}H})>E(S1^{E}) \quad (10)$$

$$E(S1^{n\text{-}H})>E(S1^{S}) \quad (11)$$

$$E(T1^{n\text{-}H})>E(T1^{S}) \quad (12)$$

$$E(T1^{n\text{-}H})>E(T1^{E}) \quad (13).$$

Accordingly, the lowermost excited singlet state $S1^{n\text{-}H}$ of an n-host $H^N$ is preferably higher in energy than the lowermost excited singlet state $S1^E$ of a TADF material $E^B$. The lowermost excited singlet state $S1^{n\text{-}H}$ of an n-host $H^N$ is preferably higher in energy than the lowermost excited singlet state $S1^S$ of any small FWHM emitter $S^B$. The lowermost excited triplet state $T1^{n\text{-}H}$ of an n-host $H^N$ is preferably higher in energy than the lowermost excited triplet state $T1^S$ of any small FWHM emitter $S^B$. Preferably, the lowermost excited triplet state $T1^{n\text{-}H}$ of any n-host $H^N$ is higher in energy than the lowermost excited triplet state $T1^E$ of any TADF material $E^B$.

According to the invention, a bipolar host $H^{BP}$ optionally included in any of the at least one light-emitting layers B of an optoelectronic device according to the invention has a lowest unoccupied molecular orbital LUMO($H^{BP}$) having an energy $E^{LUMO}(H^{BP})$, wherein preferably: $-3.5$ eV$\leq E^{LUMO}$ $(H^{BP}) \leq -2.9$ eV.

According to the invention, a bipolar host $H^{BP}$ optionally included in any of the at least one light-emitting layers B of an optoelectronic device according to the invention has a lowermost excited singlet state energy level $E(S1^{bp\text{-}H})$, wherein preferably: $E(S1^{bp\text{-}H}) \geq 3.0$ eV.

According to the invention, a bipolar host $H^{BP}$ optionally included in any of the at least one light-emitting layers B of an optoelectronic device according to the invention has a lowermost excited triplet state energy level $E(T1^{bp\text{-}H})$, wherein preferably: $E(T1^{bp\text{-}H}) \geq 2.7$ eV.

It is understood that any requirements or preferred properties previously defined for a host material $H^B$ included in any of the at least one light-emitting layers B of an optoelectronic device according to the invention are preferably also valid for a bipolar host $H^{BP}$ according to the invention. Thus, in a preferred embodiment, the relations expressed by the following formulas (14) to (17) apply:

$$E(S1^{bp\text{-}H})>E(S1^{E}) \quad (14)$$

$$E(S1^{bp\text{-}H})>E(S1^{S}) \quad (15)$$

$$E(T1^{bp\text{-}H})>E(T1^{S}) \quad (16)$$

$$E(T1^{bp\text{-}H})>E(T1^{E}) \quad (17).$$

Accordingly, the lowermost excited singlet state $S1^{bp\text{-}H}$ of a bipolar host $H^{BP}$ is preferably higher in energy than the lowermost excited singlet state $S1^E$ of a TADF material $E^B$. The lowermost excited singlet state $S1^{bp\text{-}H}$ of a bipolar host $H^{BP}$ is preferably higher in energy than the lowermost excited singlet state $S1^S$ of any small FWHM emitter $S^B$. The lowermost excited triplet state $T1^{bp\text{-}H}$ of a bipolar host $H^{BP}$ is preferably higher in energy than the lowermost excited triplet state $T1^S$ of any small FWHM emitter $S^B$. Preferably, the lowermost excited triplet state $T1^{bp\text{-}H}$ of any bipolar host $H^{BP}$ is higher in energy than the lowermost excited triplet state $T1^E$ of any TADF material $E^B$.

TADF Material(s) $E^B$

According to the invention, any of the one or more thermally activated delayed fluorescence (TADF) materials $E^B$ is preferably characterized by exhibiting a $\Delta E_{ST}$ value, which corresponds to the energy difference between the lowermost excited singlet state $S1^E$ and the lowermost excited triplet state $T1^E$, of less than 0.4 eV, preferably of less than 0.3 eV, more preferably of less than 0.2 eV, even more preferably of less than 0.1 eV, or even of less than 0.05 eV. Thus, $\Delta E_{ST}$ of a TADF material $E^B$ according to the invention is preferably sufficiently small to allow for thermal repopulation of the lowermost excited singlet state $S1^E$ to the lowermost excited triplet state $T1^E$ (also referred to as up-intersystem crossing or reverse intersystem crossing) at room temperature (RT).

It is understood that a small FWHM emitter $S^B$ included in the at least one light-emitting layer B of an optoelectronic device according to the invention may optionally also have a $\Delta E_{ST}$ value of less than 0.4 eV and exhibit thermally activated delayed fluorescence (TADF). However, for any small FWHM emitter $S^B$ in the context of the invention, this is only an optional feature. Additionally, a TADF material $E^B$ in the context of the invention preferably differs from a small FWHM emitter $S^B$ in the context of the invention in that a TADF material $E^B$ mainly functions as energy pump transferring energy to at least one small FWHM emitter $S^B$ while the main contribution to the emission band of the optoelectronic device according to the invention can preferably be attributed to the emission of at least one small FWHM emitter $S^B$.

According to the invention, a TADF material $E^B$ included in any of the at least one light-emitting layers B of an optoelectronic device according to the invention has a highest occupied molecular orbital HOMO($E^B$) having an energy $E^{HOMO}(E^B)$, wherein preferably: $-6.0\ eV \leq E^{HOMO}(E^B) \leq -5.8\ eV$.

According to the invention, a TADF material $E^B$ included in any of the at least one light-emitting layers B of an optoelectronic device according to the invention has a lowest unoccupied molecular orbital LUMO($E^B$) having an energy $E^{LU}MO(E^B)$, wherein preferably: $-3.4\ eV \leq E^{LU}MO(E^B) \leq -3.0\ eV$.

According to the invention, a TADF material $E^B$ included in any of the at least one light-emitting layers B of an optoelectronic device according to the invention has a lowermost excited singlet state energy level $E(S1^E)$, wherein preferably: $2.5\ eV \leq E(S1^E) \leq 2.8\ eV$.

According to the invention, a TADF material $E^B$ included in any of the at least one light-emitting layers B of an optoelectronic device according to the invention has a lowermost excited triplet state energy level $E(T1^E)$, whose preferred range may be defined by the above-mentioned preferred range for the singlet state energy level $E(S1^E)$ in combination with the above-mentioned preferred range for $\Delta E_{ST}$.

A further aspect of the invention relates to a composition including or consisting of:

(a) at least one organic molecule according to the invention, in particular in the form of an emitter, and
(b) one or more triplet-triplet annihilation (TTA) host materials, which differ from the organic molecule according to the invention and
(c) optionally one or more TADF materials
(d) optionally one or more dyes and/or one or more solvents.

A further aspect of the invention relates to a composition including or consisting of:

(a) at least one organic molecule according to the invention, in particular in the form of an emitter, and
(b) one or more host materials, which differ from the organic molecule according to the invention and
(c) one or more TADF materials.

A further aspect of the invention relates to a composition including or consisting of:

(a) at least one organic molecule according to the invention, in particular in the form of an emitter, and
(b) one or more host materials, which differ from the organic molecule according to the invention and
(c) one or more phosphorescent materials.

In a particular embodiment, the light-emitting layer EML includes (or essentially consists of) a composition including or consisting of:

(i) 0.1-10% by weight, preferably 0.5-5% by weight, in particular 1-3% by weight, of one or more organic molecules according to the invention;
(ii) 5-99% by weight, preferably 15-85% by weight, in particular 20-75% by weight, of at least one host compound H; and
(iii) 0.9-94.9% by weight, preferably 14.5-80% by weight, in particular 24-77% by weight, of at least one further host compound D with a structure differing from the structure of the molecules according to the invention; and
(iv) optionally 0-94% by weight, preferably 0-65% by weight, in particular 0-50% by weight, of a solvent; and
(v) optionally 0-30% by weight, in particular 0-20% by weight, preferably 0-5% by weight, of at least one further emitter molecule F with a structure differing from the structure of the molecules according to the invention.

Compositions with One or More TTA Host Material

In a preferred embodiment, in the optoelectronic device of the present invention, the light-emitting layer B includes (or consists of):

(i) 10-84% by weight of the TTA material;
(ii) 0-30% by weight of the TADF material $E^B$; and
(iii) 0.1-10% by weight of the emitter according to the invention; and optionally
(iv) 0-89.9% by weight of one or more solvents.

In a preferred embodiment, the percentage numbers of (i)-(iv) sum up to 100% by weight.

In another preferred embodiment, in the optoelectronic device of the present invention, the light-emitting layer B includes (or consists of):

(i) 56-90% by weight of the TTA material;
(ii) 0-5% by weight of the TADF material $E^B$; and
(iii) 0.5-5% by weight of the emitter according to the invention; and optionally
(iv) 0-43.5% by weight of one or more solvents.

In a preferred embodiment, the percentage numbers of (i)-(iv) sum up to 100% by weight.

Compositions with One or More TADF Material

In one embodiment, the light-emitting layer B includes:

(i) 10-89.9% by weight of one or more p-host compound $H^P$;
(ii) 0-79.9% by weight of one or more n-host compound $H^N$;
(iii) 10-50% by weight of one or more TADF material $E^B$; and
(iv) 0.1-10% by weight of one or more emitter according to the invention; and
(v) 0-89.9% by weight of one or more solvents.

In one embodiment, the light-emitting layer B includes:

(i) 22-87.5% by weight of one or more p-host compound $H^P$;
(ii) optionally 0-65.5% by weight of one or more n-host compound $H^N$;
(iii) 12-40% by weight of one or more TADF material $E^B$; and
(iv) 0.5-5% by weight of one or more emitter according to the invention; and
(v) 0-65.5% by weight of one or more solvents.

Compositions with One or More Phosphorescent Material

In a preferred embodiment where $H^N$ is optional, in the optoelectronic device of the present invention, the light-emitting layer B includes (or consists of):

(i) 10-84.9% by weight of the host compound $H^P$;
(ii) 0-84.9% by weight of the host compound $H^N$;
(iii) 5-15% by weight of the Phosphorescence material $E^B$; and
(iv) 0.1-10% by weight of the emitter according to the invention; and optionally
(v) 0-84.9% by weight of one or more solvents.

In a preferred embodiment where $H^N$ is optional, in the optoelectronic device of the present invention, the light-emitting layer B includes (or consists of):

(i) 22-70.5% by weight of the host compound $H^P$;
(ii) 0-70.5% by weight of the host compound $H^N$;
(iii) 5-10% by weight of the phosphorescence material $E^B$; and (iv) 0.5-5% by weight of the emitter according to the invention; and optionally (v) 0-72.5% by weight of one or more solvents.

Preferably, energy can be transferred from the host compound H to the one or more organic molecules according to the invention, in particular transferred from the first excited triplet state T1 (H) of the host compound H to the first excited triplet state T1 (E) of the one or more organic molecules according to the invention E and/or from the first excited singlet state S1 (H) of the host compound H to the first excited singlet state S1 (E) of the one or more organic molecules according to the invention E.

In one embodiment, the host compound H has a highest occupied molecular orbital HOMO(H) having an energy $E^{HOMO}$(H) in the range of from −5 to −6.5 eV and the at least one further host compound D has a highest occupied molecular orbital HOMO(D) having an energy $E^{HOMO}$(D), wherein $E^{HOMO}(H)>E^{HOMO}(D)$.

In a further embodiment, the host compound H has a lowest unoccupied molecular orbital LUMO(H) having an energy $E^{LUMO}$(H) and the at least one further host compound D has a lowest unoccupied molecular orbital LUMO(D) having an energy $E^{LUMO}$(D), wherein $E^{LUMO}(H)>E^{LUMO}(D)$.

In one embodiment, the host compound H has a highest occupied molecular orbital HOMO(H) having an energy $E^{HOMO}$(H) and a lowest unoccupied molecular orbital LUMO(H) having an energy $E^{LUMO}$(H), and the at least one further host compound D has a highest occupied molecular orbital HOMO(D) having an energy $E^{HOMO}$(D) and a lowest unoccupied molecular orbital LUMO(D) having an energy $E^{LUMO}$(D)

the organic molecule according to the invention E has a highest occupied molecular orbital HOMO(E) having an energy $E^{HOMO}$(E) and a lowest unoccupied molecular orbital LUMO(E) having an energy $E^{LUMO}$(E), wherein $E^{HOMO}(H)>E^{HOMO}(D)$ and the difference between the energy level of the highest occupied molecular orbital HOMO(E) of the organic molecule according to the invention E ($E^{HOMO}$(E)) and the energy level of the highest occupied molecular orbital HOMO(H) of the host compound H ($E^{HOMO}$(H)) is between −0.5 eV and 0.5 eV, more preferably between −0.3 eV and 0.3 eV, even more preferably between −0.2 eV and 0.2 eV or even between −0.1 eV and 0.1 eV; and $E^{LUMO}(H)>E^{LUMO}(D)$ and the difference between the energy level of the lowest unoccupied molecular orbital LUMO(E) of the organic molecule according to the invention E ($E^{LU}$MO(E)) and the lowest unoccupied molecular orbital LUMO(D) of the at least one further host compound D ($E^{LU}$MO(D)) is between −0.5 eV and 0.5 eV, more preferably between −0.3 eV and 0.3 eV, even more preferably between −0.2 eV and 0.2 eV or even between −0.1 eV and 0.1 eV.

In one embodiment of the invention the host compound D and/or the host compound H is a thermally-activated delayed fluorescence (TADF)-material. TADF materials exhibit a $\Delta E_{ST}$ value, which corresponds to the energy difference between the first excited singlet state (S1) and the first excited triplet state (T1), of less than 2500 $cm^{-1}$. Preferably the TADF material exhibits a $\Delta E_{ST}$ value of less than 3000 cm-1, more preferably less than 1500 $cm^{-1}$, even more preferably less than 1000 $cm^{-1}$ or even less than 500 $cm^{-1}$.

In one embodiment, the host compound D is a TADF material and the host compound H exhibits a $\Delta E_{ST}$ value of more than 2500 $cm^{-1}$. In a particular embodiment, the host compound D is a TADF material and the host compound H is selected from group consisting of CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole.

In one embodiment, the host compound H is a TADF material and the host compound D exhibits a $\Delta E_{ST}$ value of more than 2500 $cm^{-1}$. In a particular embodiment, the host compound H is a TADF material and the host compound D is selected from group consisting of T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine).

In a further aspect, the invention relates to an optoelectronic device including an organic molecule or a composition of the type described here, more particularly in the form of a device selected from the group consisting of organic light-emitting diode (OLED), light-emitting electrochemical cell, OLED sensor (particularly gas and vapor sensors not hermetically externally shielded), organic diode, organic solar cell, organic transistor, organic field-effect transistor, organic laser and down-conversion element.

In a preferred embodiment, the optoelectronic device is a device selected from the group consisting of an organic light emitting diode (OLED), a light emitting electrochemical cell (LEC), and a light-emitting transistor.

In one embodiment of the optoelectronic device of the invention, the organic molecule according to the invention E is used as emission material in a light-emitting layer EML.

In one embodiment of the optoelectronic device of the invention, the light-emitting layer EML consists of the composition according to the invention described here.

When the optoelectronic device is an OLED, it may, for example, have the following layer structure:

1. substrate
2. anode layer A
3. hole injection layer, HIL
4. hole transport layer, HTL
5. electron blocking layer, EBL
6. emitting layer, EML
7. hole blocking layer, HBL
8. electron transport layer, ETL
9. electron injection layer, EIL
10. cathode layer, wherein the OLED includes each layer selected from the group of HIL, HTL, EBL, HBL, ETL, and EIL only optionally, different layers may be merged and the OLED may include more than one layer of each layer type defined above.

Furthermore, the optoelectronic device may, in one embodiment, include one or more protective layers protecting the device from damaging exposure to harmful species in the environment including, for example, moisture, vapor and/or gases.

In one embodiment of the invention, the optoelectronic device is an OLED, with the following inverted layer structure:

1. substrate
2. cathode layer
3. electron injection layer, EIL
4. electron transport layer, ETL
5. hole blocking layer, HBL
6. emitting layer, B
7. electron blocking layer, EBL
8. hole transport layer, HTL 9. hole injection layer, HIL
10. anode layer A wherein the OLED includes each layer selected from the group of HIL, HTL, EBL, HBL, ETL, and EIL only optionally, different layers may be merged and the OLED may include more than one layer of each layer types defined above.

In one embodiment of the invention, the optoelectronic device is an OLED, which may have a stacked architecture. In this architecture, contrary to the typical arrangement in which the OLEDs are placed side by side, the individual units are stacked on top of each other. Blended light may be generated with OLEDs exhibiting a stacked architecture, in particular white light may be generated by stacking blue, green and red OLEDs. Furthermore, the OLED exhibiting a stacked architecture may include a charge generation layer (CGL), which is typically located between two OLED subunits and typically consists of an n-doped layer and a p-doped layer with the n-doped layer of one CGL being typically located closer to the anode layer.

In one embodiment of the invention, the optoelectronic device is an OLED, which includes two or more emission layers between anode and cathode. In particular, this so-called tandem OLED includes three emission layers, wherein one emission layer emits red light, one emission layer emits green light and one emission layer emits blue light, and optionally may include further layers such as charge generation layers, blocking or transporting layers between the individual emission layers. In a further embodiment, the emission layers are adjacently stacked. In a further embodiment, the tandem OLED includes a charge generation layer between each two emission layers.

In addition, adjacent emission layers or emission layers separated by a charge generation layer may be merged.

The substrate may be formed by any material or composition of materials. Most frequently, glass slides are used as substrates. Alternatively, thin metal layers (e.g., copper, gold, silver, or aluminum films) or plastic films or slides may be used. This may allow for a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is transparent. Preferably, the anode layer A includes a large content or even consists of transparent conductive oxides (TCOs). Such anode layer A may, for example, include indium tin oxide, aluminum zinc oxide, fluorine doped tin oxide, indium zinc oxide, PbO, SnO, zirconium oxide, molybdenum oxide, vanadium oxide, tungsten oxide, graphite, doped Si, doped Ge, doped GaAs, doped polyaniline, doped polypyrrole and/or doped polythiophene.

The anode layer A (essentially) may consist of indium tin oxide (ITO) (e.g., $(In_2O_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may include poly-3,4-ethylenedioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may, for example, include PEDOT:PSS(poly-3,4-ethylenedioxy thiophene: polystyrene sulfonate), PEDOT (poly-3,4-ethylenedioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB(N,N'-bis-(1-naphthalenyl)-N,N'-bis-phenyl-(1,1'-biphenyl)-4,4'-diamine), NPNPB(N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN(1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL), a hole transport layer (HTL) is typically located. Herein, any hole transport compound may be used. For example, electron-rich heteroaromatic compounds such as triarylamines and/or carbazoles may be used as hole transport compound. The HTL may decrease the energy barrier between the anode layer A and the light-emitting layer EML. The hole transport layer (HTL) may also be an electron blocking layer (EBL). Preferably, hole transport compounds bear comparably high energy levels of their triplet states T1. For example, the hole transport layer (HTL) may include a star-shaped heterocycle such as tris(4-carbazol-9-ylphenyl) amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may include a p-doped layer, which may be composed of an inorganic or organic dopant in an organic hole-transporting matrix. Transition metal oxides such as vanadium oxide, molybdenum oxide or tungsten oxide may, for example, be used as inorganic dopant. Tetrafluorotetracyanoquinodimethane ($F_4$-TCNQ), copper-pentafluorobenzoate (Cu(I)pFBz) or transition metal complexes may, for example, be used as organic dopant.

The EBL may, for example, include mCP (1,3-bis(carbazol-9-yl)benzene), TCTA, 2-TNATA, mCBP (3,3-di(9H-carbazol-9-yl)biphenyl), tris-Pcz, CzSi(9-(4-tert-Butylphenyl)-3,6-bis(triphenylsilyl)-9H-carbazole), and/or DCB(N,N'-dicarbazolyl-1,4-dimethylbenzene).

Adjacent to the hole transport layer (HTL), the light-emitting layer EML is typically located. The light-emitting layer EML includes at least one light emitting molecule. Particularly, the EML includes at least one light emitting molecule according to the invention E. In one embodiment, the light-emitting layer includes only the organic molecules according to the invention. Typically, the EML additionally includes one or more host materials H. For example, the host material H is selected from CBP (4,4'-Bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl] ether oxide), 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). The host material H typically should be selected to exhibit first triplet (T1) and first singlet (S1) energy levels, which are energetically higher than the first triplet (T1) and first singlet (S1) energy levels of the organic molecule.

In one embodiment of the invention, the EML includes a so-called mixed-host system with at least one hole-dominant host and one electron-dominant host. In a particular embodiment, the EML includes exactly one light emitting organic molecule according to the invention and a mixed-host system including T2T as electron-dominant host and a host selected from CBP, mCP, mCBP, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host. In a further embodiment the EML includes 50-80% by weight, preferably 60-75% by weight of a host selected from CBP, mCP, mCBP, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole; 10-45% by weight, preferably 15-30% by weight of T2T and 5-40% by weight, preferably 10-30% by weight of light emitting molecule according to the invention.

Adjacent to the light-emitting layer EML, an electron transport layer (ETL) may be located. Herein, any electron transporter may be used. Exemplarily, electron-poor compounds such as, e.g., benzimidazoles, pyridines, triazoles, oxadiazoles (e.g., 1,3,4-oxadiazole), phosphine oxides and sulfone, may be used. An electron transporter may also be a star-shaped heterocycle such as 1,3,5-tri(1-phenyl-1H-benzo[d]imidazol-2-yl)phenyl (TPBi). The ETL may include NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphine oxide), BPyTP2 (2,7-di(2,2'-bipyridin-5-yl)triphenylene), Sif87 (dibenzo[b,d]thiophen-2-yltriphenylsilane), Sif88 (dibenzo[b,d]thiophen-2-yl)diphenylsilane), BmPyPhB(1,3-bis[3,5-di(pyridin-3-yl)phenyl]benzene) and/or BTB(4,4'-bis-[2-(4,6-diphenyl-1,3,5-triazinyl)]-1,1'-biphenyl). Optionally, the ETL may be doped with materials such as Liq. The electron transport layer (ETL) may also block holes or a holeblocking layer (HBL) is introduced.

The HBL may, for example, include BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphine oxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), and/or TCB/TCP (1,3,5-tris(N-carbazolyl)benzene/1,3,5-tris(carbazol)-9-yl) benzene).

Adjacent to the electron transport layer (ETL), a cathode layer C may be located. The cathode layer C may, for example, include or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may also consist of (essentially) intransparent metals such as Mg, Ca or Al. Alternatively or additionally, the cathode layer C may also include graphite and or carbon nanotubes (CNTs). Alternatively, the cathode layer C may also consist of nanoscale silver wires.

An OLED may further, optionally, include a protection layer between the electron transport layer (ETL) and the cathode layer C (which may be designated as electron injection layer (EIL)). This layer may include lithium fluoride, cesium fluoride, silver, Liq (8-hydroxyquinolinolatolithium), $Li_2O$, $BaF_2$, MgO and/or NaF.

Optionally, the electron transport layer (ETL) and/or a hole blocking layer (HBL) may also include one or more host compounds H.

In order to modify the emission spectrum and/or the absorption spectrum of the light-emitting layer EML further, the light-emitting layer EML may further include one or more further emitter molecules F. Such an emitter molecule F may be any emitter molecule known in the art. Preferably such an emitter molecule F is a molecule with a structure differing from the structure of the molecules according to the invention E. The emitter molecule F may optionally be a TADF emitter. Alternatively, the emitter molecule F may optionally be a fluorescent and/or phosphorescent emitter molecule which is able to shift the emission spectrum and/or the absorption spectrum of the light-emitting layer EML. Exemplarily, the triplet and/or singlet excitons may be transferred from the organic emitter molecule according to the invention to the emitter molecule F before relaxing to the ground state S0 by emitting light typically red-shifted in comparison to the light emitted by an organic molecule. Optionally, the emitter molecule F may also provoke two-photon effects (i.e., the absorption of two photons of half the energy of the absorption maximum).

Optionally, an optoelectronic device (e.g., an OLED) may, for example, be an essentially white optoelectronic device. For example, such a white optoelectronic device may include at least one (deep) blue emitter molecule and one or more emitter molecules emitting green and/or red light. Then, there may also optionally be energy transmittance between two or more molecules as described above.

As used herein, if not defined more specifically in the particular context, the designation of the colors of emitted and/or absorbed light is as follows:

violet: wavelength range of >380-420 nm;
deep blue: wavelength range of >420-480 nm;
sky blue: wavelength range of >480-500 nm;
green: wavelength range of >500-560 nm;
yellow: wavelength range of >560-580 nm;
orange: wavelength range of >580-620 nm;
red: wavelength range of >620-800 nm.

With respect to emitter molecules, such colors refer to the emission maximum. Therefore, for example, a deep blue emitter has an emission maximum in the range of from >420 to 480 nm, a sky blue emitter has an emission maximum in the range of from >480 to 500 nm, a green emitter has an emission maximum in a range of from >500 to 560 nm, a red emitter has an emission maximum in a range of from >620 to 800 nm.

A red emitter may preferably have an emission maximum of below 800 nm, more preferably below 700 nm, even more preferably below 665 nm or even below 640 nm. It will typically be above 570 nm, preferably above 590 nm, more preferably above 610 nm or even above 620 nm.

Accordingly, a further aspect of the present invention relates to an OLED, which exhibits an external quantum efficiency at 1000 cd/$m^2$ of more than 8%, more preferably of more than 10%, more preferably of more than 13%, even more preferably of more than 15% or even more than 20% and/or exhibits an emission maximum between 590 nm and 690 nm, preferably between 610 nm and 665 nm, even more preferably between 620 nm and 640 nm, and/or exhibits a LT80 value at 500 cd/$m^2$ of more than 100 h, preferably more than 200 h, more preferably more than 400 h, even more preferably more than 750 h or even more than 1000 h. Accordingly, a further aspect of the present invention relates to an OLED, whose emission exhibits a CIEy color coordinate of more than 0.25, preferably more than 0.27, more preferably more than 0.29 or even more preferably more than 0.30.

A further embodiment of the present invention relates to an OLED, which emits light with CIEx and CIEy color coordinates close to the CIEx (=0.708) and CIEy (=0.292) color coordinates of the primary color red (CIEx=0.708 and CIEy=0.292) as defined by ITU-R Recommendation BT.2020 (Rec. 2020) and thus is suited for the use in Ultra High Definition (UHD) displays, e.g., UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). Accordingly, a further aspect of the present invention relates to an OLED, whose emission exhibits a CIEx color coordinate of between 0.60 and 0.88, preferably between 0.61 and 0.83, more preferably between 0.63 and 0.78 or even more preferably between 0.66 and 0.76 or even between 0.68 and 0.73 and/or a CIEy color coordinate of between 0.25 and 0.70, preferably between 0.26 and 0.55, more preferably between 0.27 and 0.45 or even more preferably between 0.28 and 0.40 or even between 0.29 and 0.35.

Accordingly, a further aspect of the present invention relates to an OLED, which exhibits an external quantum efficiency at 14500 cd/$m^2$ of more than 10%, more preferably of more than 13%, more preferably of more than 15%, even more preferably of more than 17% or even more than 20% and/or exhibits an emission maximum between 590 nm and 690 nm, preferably between 610 nm and 665 nm, even more preferably between 620 nm and 640 nm.

A further aspect of the present invention relates to an OLED, which emits light at a distinct color point. According to the present invention, the OLED emits light with a narrow emission band (small full width at half maximum (FWHM)). In one aspect, the OLED according to the invention emits light with an FWHM of the main emission peak of less than 0.30 eV, preferably less than 0.25 eV, more preferably less than 0.20 eV, even more preferably less than 0.19 eV or even less than 0.17 eV.

In a further aspect, the invention relates to a method for producing an optoelectronic component. In this case an organic molecule of the invention is used.

The optoelectronic device, in particular the OLED according to the present invention can be fabricated by any means of vapor deposition and/or liquid processing. Accordingly, at least one layer is

- prepared by means of a sublimation process,
- prepared by means of an organic vapor phase deposition process,
- prepared by means of a carrier gas sublimation process, and/or
- solution processed or printed.

The methods used to fabricate the optoelectronic device, in particular the OLED according to the present invention are known in the art. The different layers are individually and successively deposited on a suitable substrate by means of subsequent deposition processes. The individual layers may be deposited using the same or differing deposition methods.

Vapor deposition processes, for example, include thermal (co)evaporation, chemical vapor deposition and physical vapor deposition. For active matrix OLED display, an AMOLED backplane is used as substrate. The individual layer may be processed from solutions or dispersions employing adequate solvents. Solution deposition process, for example, include spin coating, dip coating and jet printing. Liquid processing may optionally be carried out in an inert atmosphere (e.g., in a nitrogen atmosphere) and the solvent may be completely or partially removed by means known in the state of the art.

EXAMPLES

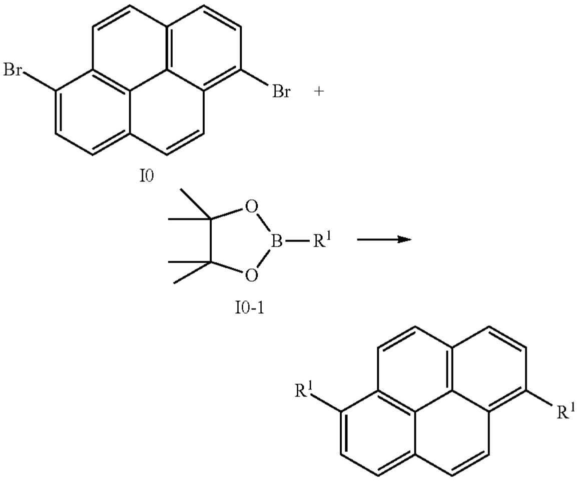

I0

I0-1

I1

I0 (1.00 equivalents), I0-1 (2.20 equivalents), tetrakis (triphenylphosphine)palladium(0) $Pd(PPh_3)_4$ (0.04 equivalents; CAS: 14221-01-3), and potassium carbonate ($K_2CO_3$; 4.00 equivalents) are stirred under nitrogen atmosphere in dioxane:water (4:1 volume ratio) at 110° C. overnight. After cooling down to room temperature (RT) the reaction mixture is extracted between DCM and brine and the phases are separated. The combined organic layers are dried over $MgSO_4$ and then the solvent is removed under reduced pressure. The crude product obtained is purified by recrystallization or column chromatography and I1 is obtained as solid. Instead of a boronic acid ester, a corresponding boronic acid may be used.

General Procedure for Synthesis AAV2:

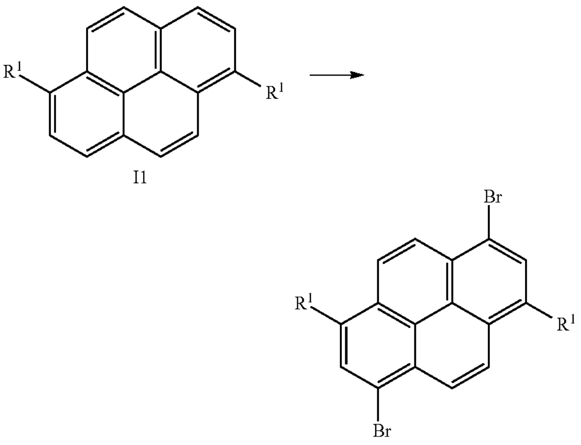

I1

I2

I1 (1.00 equivalents) and liquid bromine (4.0 equivalents; CAS 7726-95-6) are stirred under nitrogen atmosphere in anhydrous dimethylformamide (DMF) at room temperature overnight. The reaction mixture is poured into water. The precipitates are filtered off, washed with water and ethanol. The crude product obtained is purified by recrystallization or column chromatography and I2 is obtained as solid.

General Procedure for Synthesis AAV3:

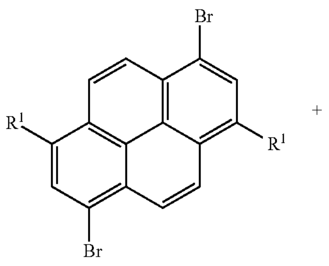

I2

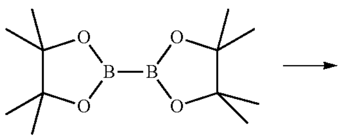

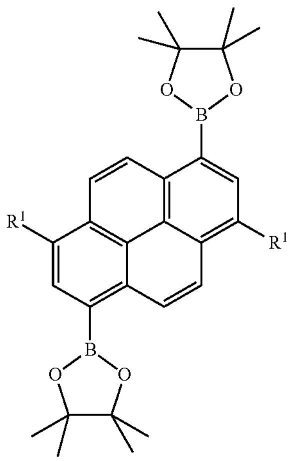

I3

I2 (1.00 equivalents), bis(pinacolato)diboron (2.50 equivalents, CAS 73183-34-3), tris(dibenzylideneacetone) dipalladium(0) (0.03 equivalents; CAS: 51364-51-3), X-PHOS(0.12 equivalents; CAS: 564483-18-7) and potassium acetate (KOAc; 6.00 equivalents, CAS 127-08-2) are stirred under nitrogen atmosphere in dioxane at 100° C. overnight. After cooling down to room temperature (RT) the reaction mixture is extracted between DCM and brine and the phases are separated. The combined organic layers are dried over $MgSO_4$ and then the solvent is removed under reduced pressure. The crude product obtained is purified by recrystallization or column chromatography and I3 is obtained as solid.

General Procedure for Synthesis AAV4:

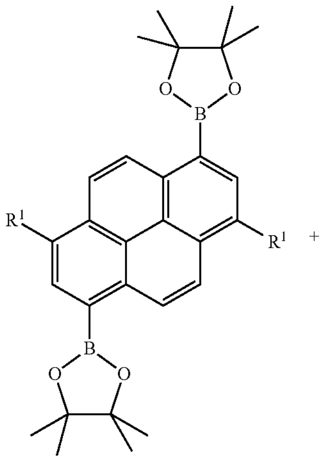

I3

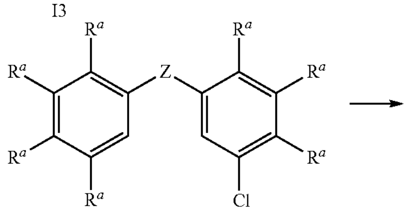

I3-I

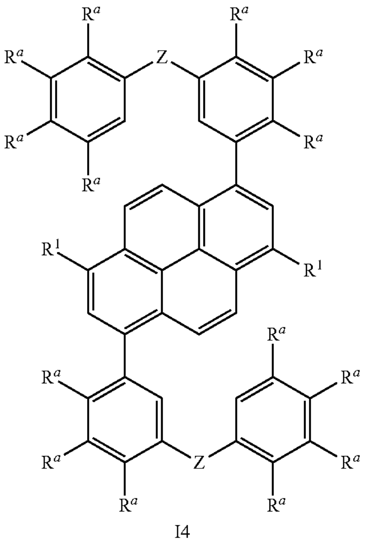

I4

I3 (1.00 equivalents), I3-I (2.10 equivalents), tris(dibenzylideneacetone)dipalladium(0) (0.02 equivalents; CAS: 51364-51-3), X-PHOS (0.08 equivalents; CAS: 564483-18-7) and potassium phosphate tribasic ($K_3O_4P$; 3.00 equivalents, CAS 7778-53-2) are stirred under nitrogen atmosphere in toluene/water (10:1) at 120° C. for 48 hours. After cooling down to room temperature (RT) the reaction mixture is poured in water and the precipitate is filtered and washed with water and cold ethanol. The crude product obtained is purified by recrystallization or column chromatography and I4 is obtained as solid.

General Procedure for Synthesis AAV5:

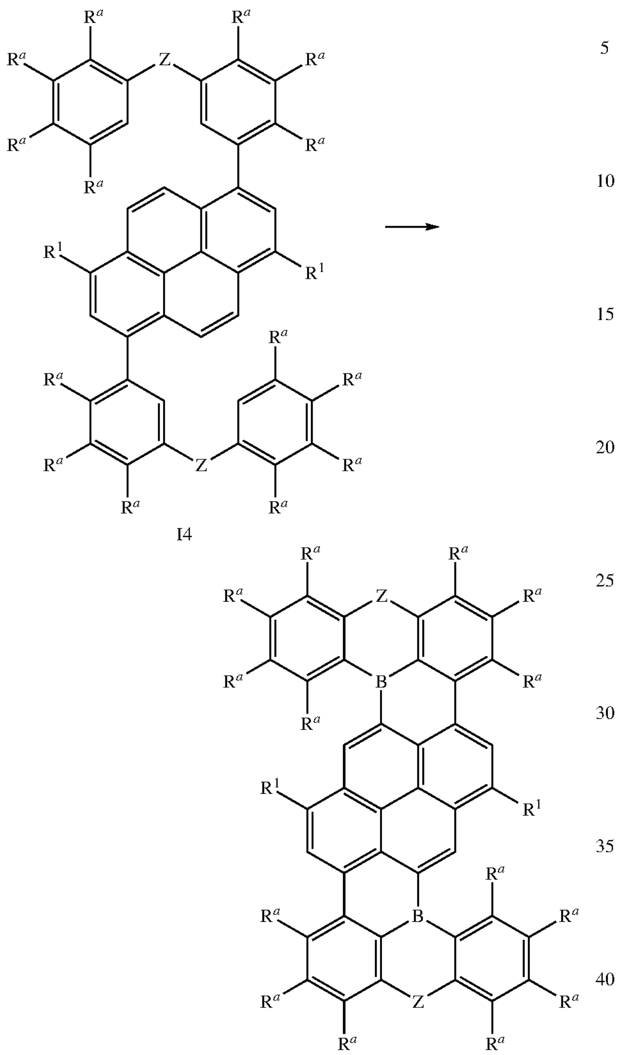

I4

I5

I4 (1.00 equivalents) is dissolved under nitrogen atmosphere in Chlorobenzene. Boron tribromide (4.00 equivalents, CAS 10294-33-4) is added and the mixture is stirred at 180° C. over night. After cooling down to room temperature (RT) the mixture was cold down to 0° C. and N,N-diisopropylethylamine (16 equivalents, CAS 7087-68-5) were added. After the reaction mixture is basic (pH>8), the mixture is extracted between DCM and brine and the phases are separated. The combined organic layers are dried over $MgSO_4$ and then the solvent is removed under reduced pressure. The crude product obtained is purified by recrystallization or column chromatography and I5 is obtained as solid.

Cyclic Voltammetry

Cyclic voltammograms are measured from solutions having concentration of $10^{-3}$ mol/L of the organic molecules in dichloromethane or a suitable solvent and a suitable supporting electrolyte (e.g., 0.1 mol/L of tetrabutylammonium hexafluorophosphate). The measurements are conducted at room temperature under nitrogen atmosphere with a three-electrode assembly (Working and counter electrodes: Pt wire, reference electrode: Pt wire) and calibrated using $FeCp_2/FeCp_2^+$ as internal standard. The HOMO data was corrected using ferrocene as internal standard against a saturated calomel electrode (SCE).

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration are used. The Turbomole program package is used for all calculations.

Photophysical measurements

Sample pretreatment: Spin-coating

Apparatus: Spin150, SPS euro.

The sample concentration is 0.2 mg/ml, dissolved in Toluene/DCM.

Program: 7) 30 sec. at 2000 U/min. After coating, the films are dried at 70° C. for 1 min.

Fluorescence Spectroscopy and Phosphorescence Spectroscopy

For the analysis of Phosphorescence and Photoluminescence spectroscopy a fluorescence spectrometer "Fluoromax 4P" from Horiba is used.

Time-Resolved PL Spectroscopy in the μs-Range and Ns-Range (FS5)

Time-resolved PL measurements were performed on an FS5 fluorescence spectrometer from Edinburgh Instruments. Compared to measurements on the HORIBA setup, better light gathering allows for an optimized signal to noise ratio, which favors the FS5 system especially for transient PL measurements of delayed fluorescence characteristics. The FS5 consists of a xenon lamp providing a broad spectrum. The continuous light source is a 150 W xenon arc lamp, selected wavelengths are chosen by a Czerny-Turner monochromator, which is also used to set specific emission wavelengths. The sample emission is directed towards a sensitive $R^{928}P$ photomultiplier tube (PMT), allowing the detection of single photons with a peak quantum efficiency of up to 25% in the spectral range between 200 nm to 870 nm. The detector is a temperature stabilized PMT, providing dark counts below 300 cps (counts per second). Finally, to determine the transient decay lifetime of the delayed fluorescence, a tail fit using three exponential functions is applied. By weighting the specific lifetimes $\tau_i$ with their corresponding amplitudes $A_i$, $$\tau_{DF} = \sum_{i=1}^{3} \frac{A_i \tau_i}{A_i}$$

the delayed fluorescence lifetime $\tau_{DF}$ is determined.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates are determined using the software U6039-05 version 3.6.0.

Emission maxima are given in nm, quantum yields ϕ in % and CIE coordinates as x,y values.

PLQY is Determined Using the Following Protocol:

Quality assurance: Anthracene in ethanol (known concentration) is used as reference Excitation wavelength: the absorption maximum of the organic molecule is determined and the molecule is excited using this wavelength Measurement Quantum yields are measured, for sample, of solutions or films under nitrogen atmosphere. The yield is calculated using the equation:

$$\Phi_{PL} = \frac{n_{photon}, \text{ emitted}}{n_{photon}, \text{ absorbed}} = \frac{\int \frac{\lambda}{hc}\left[\text{Int}_{emitted}^{sample}(\lambda) - \text{Int}_{absorbed}^{sample}(\lambda)\right]d\lambda}{\int \frac{\lambda}{hc}\left[\text{Int}_{emitted}^{reference}(\lambda) - \text{Int}_{absorbed}^{reference}(\lambda)\right]d\lambda}$$

wherein $n_{photon}$ denotes the photon count an Int. the intensity.

Measurement of the Emission Spectrum

The material was dissolved in chloroform and the solution filtered through a syringe filter. Remaining solution was used to spin coat a 2% film in PMMA. Sample was excited at 291 nm and a 495 nm filter was used for the measurement.

Production and Characterization of Optoelectronic Devices

Optoelectronic devices, such as OLED devices, including organic molecules according to the invention can be produced via vacuum-deposition methods. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT 95 to the time point, at which the measured luminance decreased to 95% of the initial luminance etc.

Accelerated lifetime measurements are performed (e.g., applying increased current densities). For example, LT80 values at 500 cd/m$^2$ are determined using the following equation:

$$LT80\left(500\ \frac{\text{cd}^2}{\text{m}^2}\right) = LT80(L_0)\left(\frac{L_0}{500\ \frac{\text{cd}^2}{\text{m}^2}}\right)^{1.6}$$

wherein $L_0$ denotes the initial luminance at the applied current density.

The values correspond to the average of several pixels (typically two to eight), the standard deviation between these pixels is given.

HPLC-MS

HPLC-MS analysis is performed on an HPLC by Agilent (1260 series) with MS-detector (Thermo LTQ XL).

For example, a typical HPLC method is as follows: a reverse phase column 3.0 mm×100 mm, particle size 2.7 µm from Agilent (Poroshell 120EC-C18, 3.0×100 mm, 2.7 µm HPLC column) is used in the HPLC. The HPLC-MS measurements are performed at room temperature (rt) following gradients

| Flow rate [ml/min] | Time [min] | A [%] | B [%] | C [%] |
|---|---|---|---|---|
| 1.5 | 30 | 40 | 40 | 30 |
| 1.5 | 45 | 10 | 10 | 80 |
| 1.5 | 50 | 40 | 10 | 80 |
| 1.5 | 51 | 30 | 40 | 30 |
| 1.5 | 55 | 30 | 10 | 30 |

using the following solvent mixtures containing 0.1% formic acid:

| | | |
|---|---|---|
| Solvent A: | H2O (10%) | MeCN (90%) |
| Solvent B: | H2O (90%) | MeCN (10%) |
| Solvent C: | THF (50%) | MeCN (50%) |

An injection volume of 2 µL from a solution with a concentration of 0.5 mg/mL of the analyte is taken for the measurements.

Ionization of the probe is performed using an atmospheric pressure chemical ionization (APCI) source either in positive (APCI+) or negative (APCI−) ionization mode or an atmospheric pressure photoionization (APPI) source.

Example 1

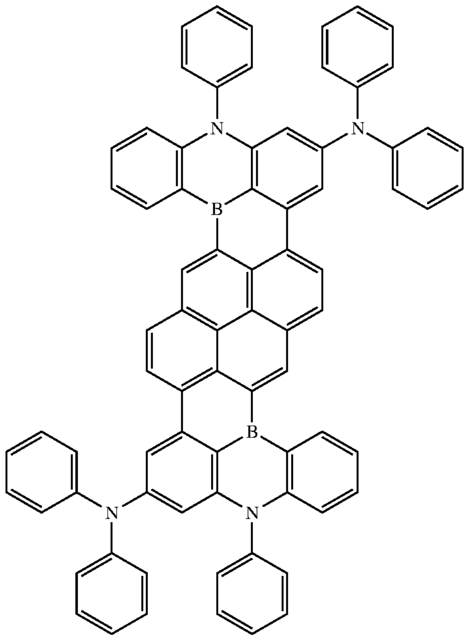 [SMILES: c1ccc(N(c2ccccc2)c2cc3c4c(c2)N(c2ccccc2)c2ccccc2B4c2cc4ccc5c6c(cc7ccc-3c2c7c46)B2c3ccccc3N(c3ccccc3)c3cc(N(c4ccccc4)c4ccccc4)cc-5c32)cc1]

Example 1 was synthesized according to General synthesis scheme II and according to AAV3 (64% yield), wherein

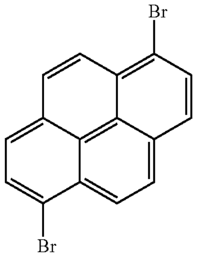 [SMILES: Brc1ccc2ccc3c(Br)ccc4ccc1c2c43]

(CAS 27973-29-1) was used as reactant I2;

AAV4 (36% yield), wherein 5-chloro-N1,N1,N3,N3-tetraphenyl-1,3-benzenediamine (CAS 1630850-28-0) was used as reactant I3-1;

AAV5 (34% yield).

MS(HPLC-MS), m/z (retention time): 1039 (7.996 min).

The drawing depicts the emission spectrum of example 1 (2% by weight in PMMA). The emission maximum ($\lambda_{max}$) is at 625 nm. The full width at half maximum (FWHM) is 99 nm (0.3 eV). The photoluminescence quantum yield (PLQY) (measured in chloroform solution) is 99%.

Additional Examples of Organic Molecules of the Invention

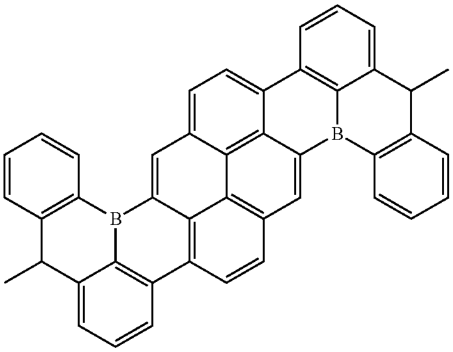

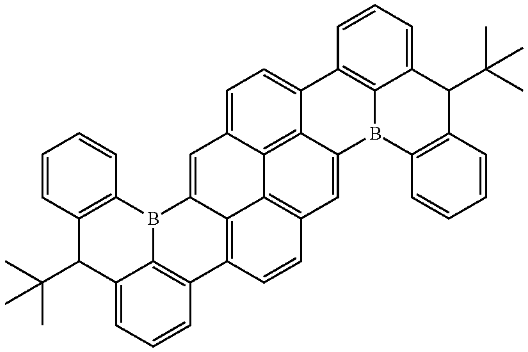

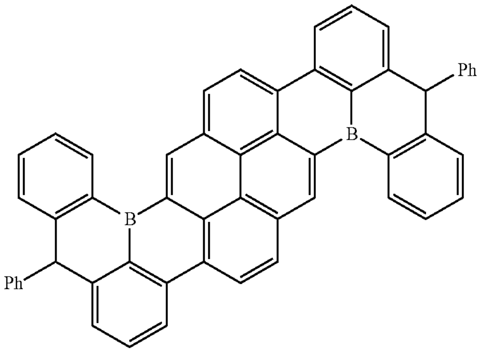

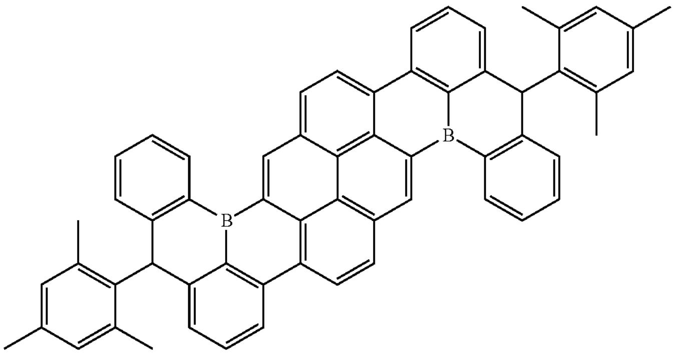

-continued
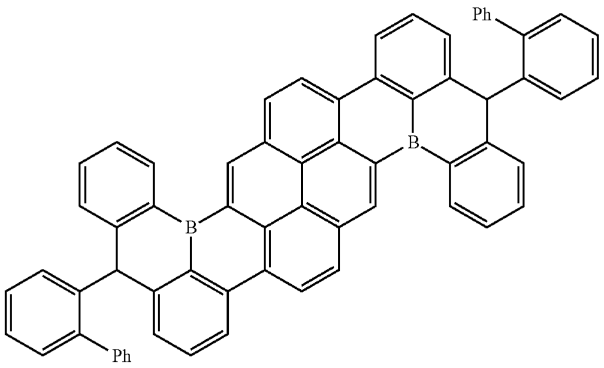
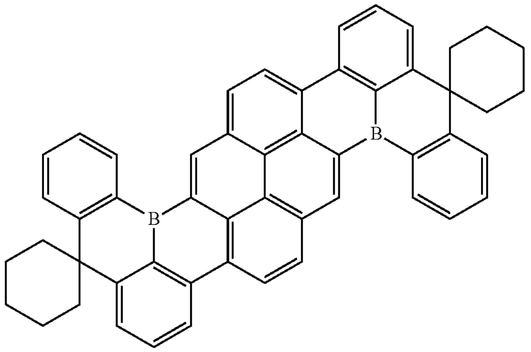
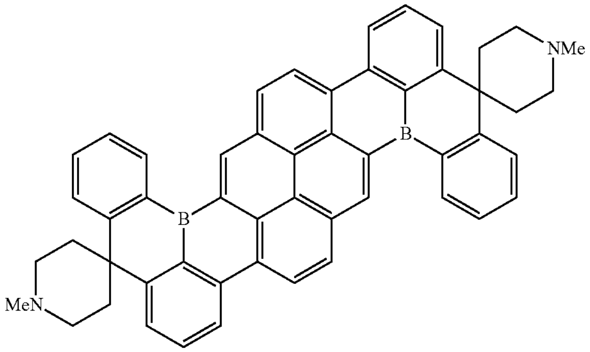
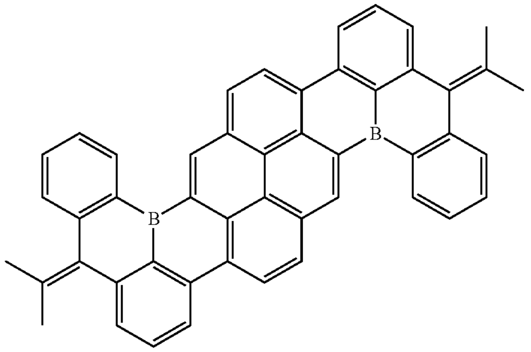
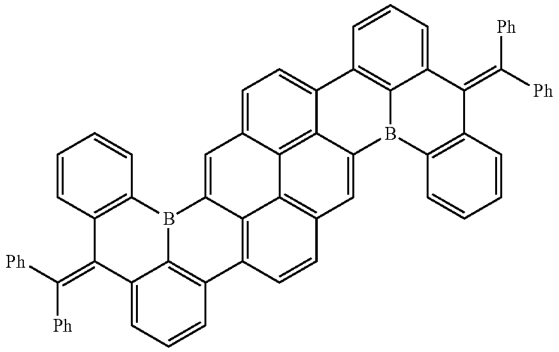
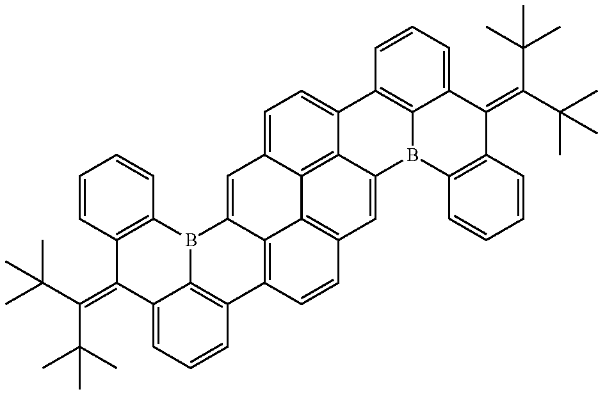

-continued
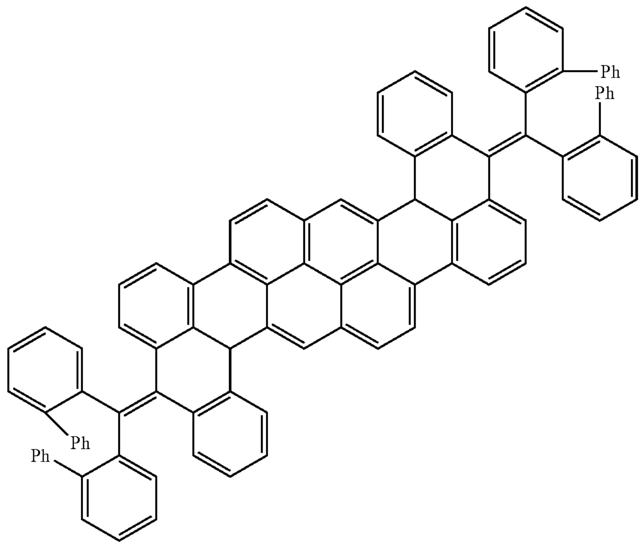
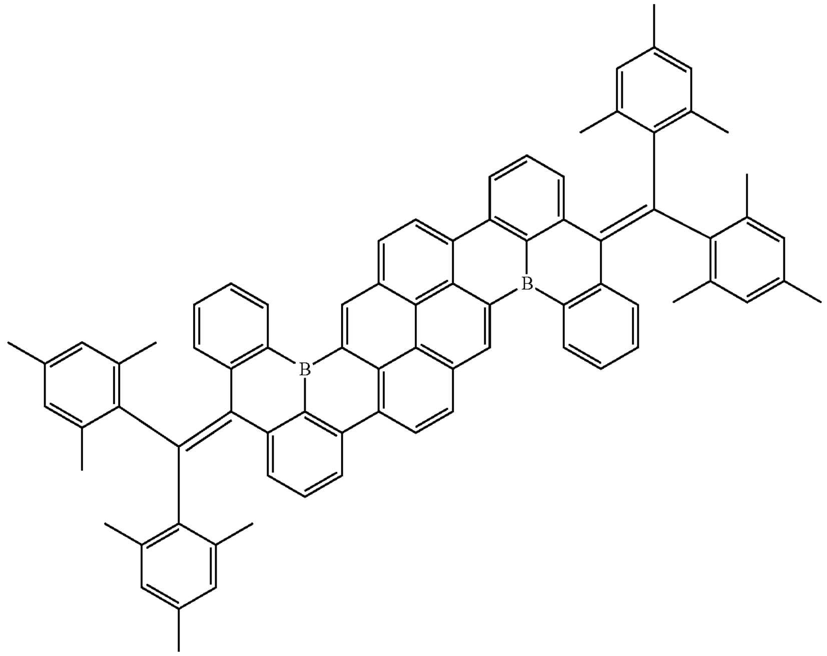
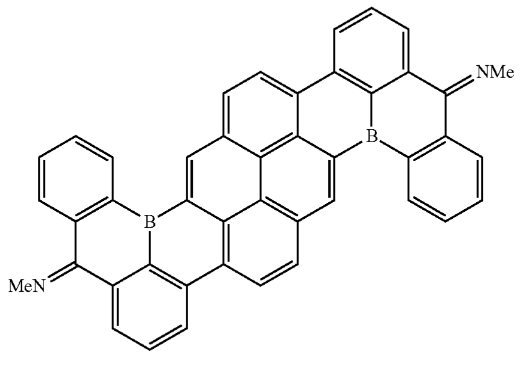
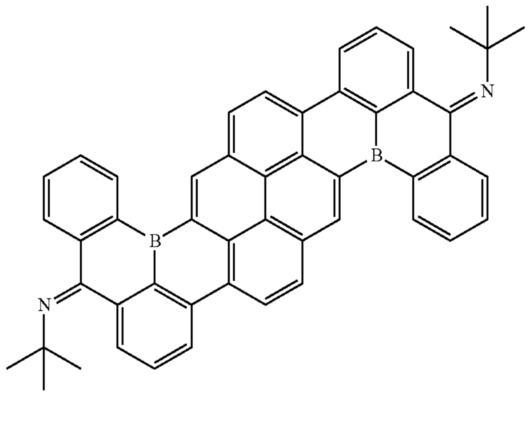

-continued
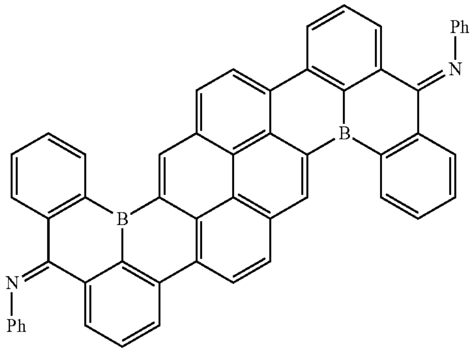
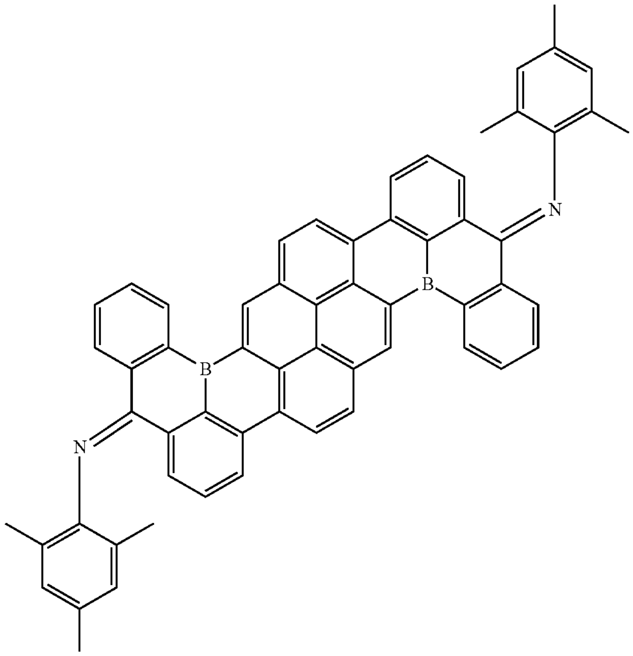
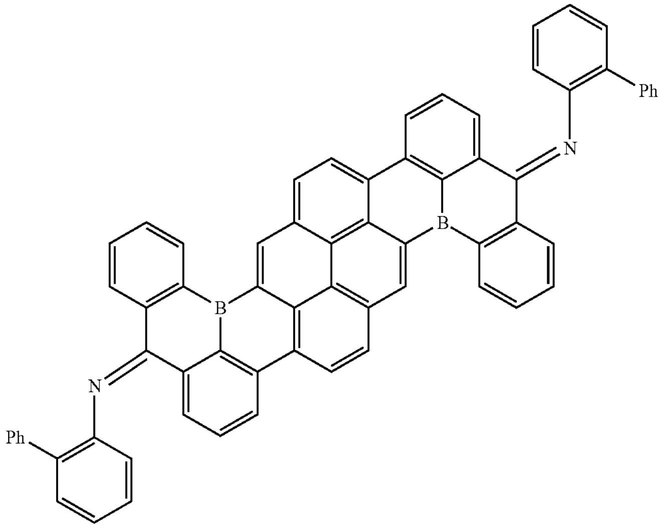

-continued
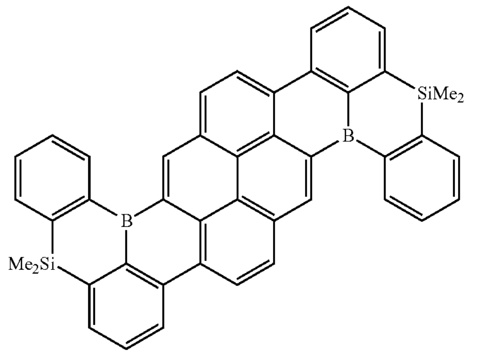
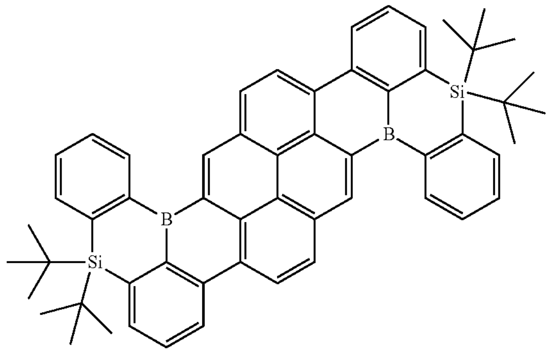
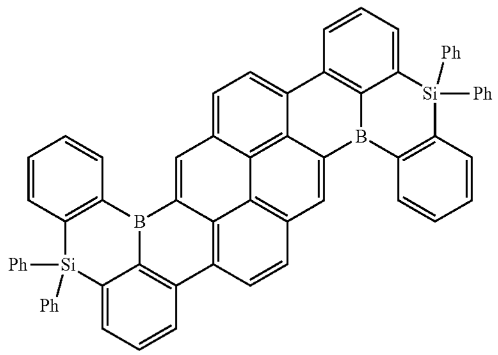
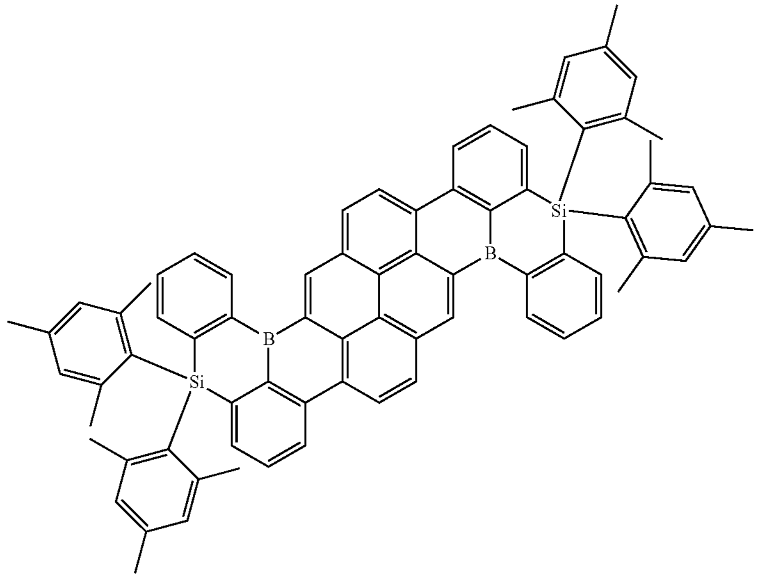

-continued
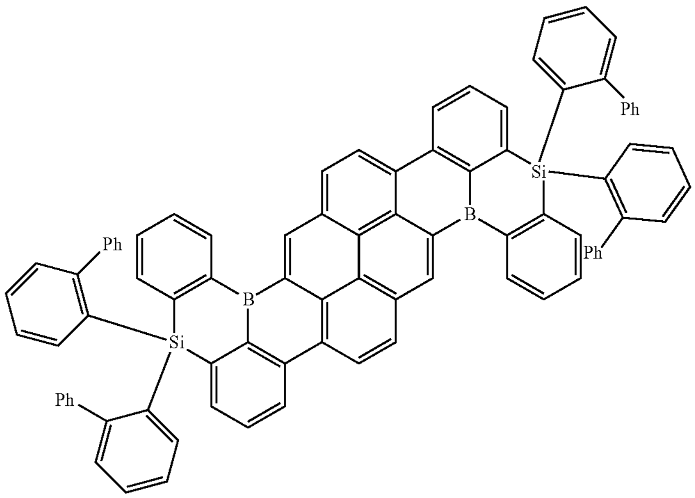
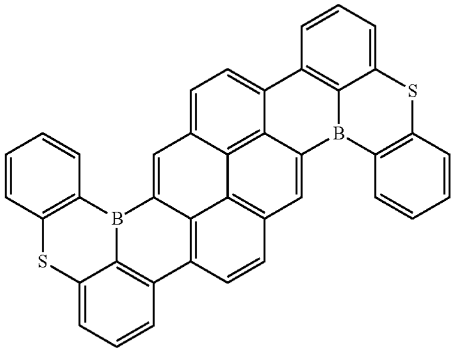
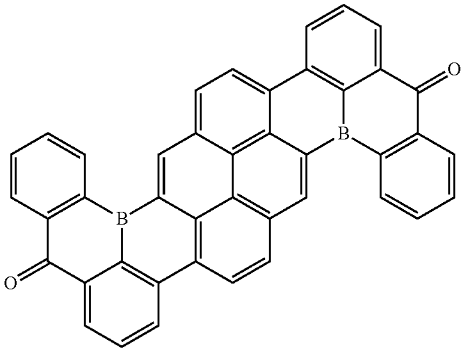
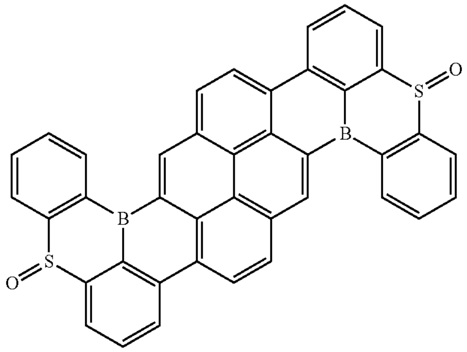
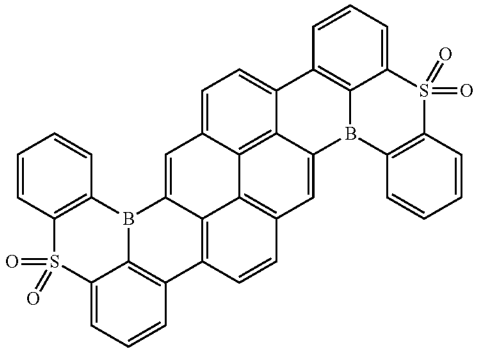
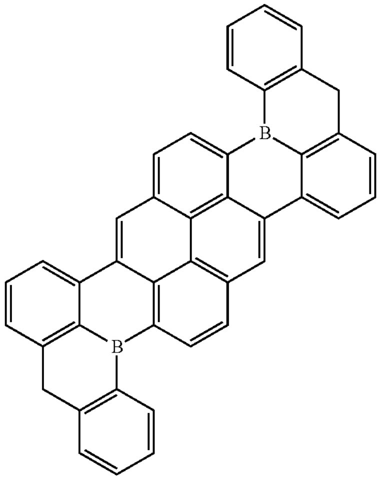
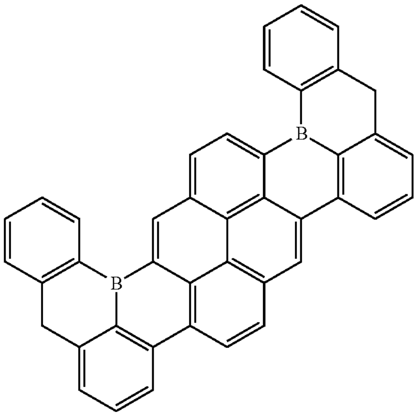

-continued
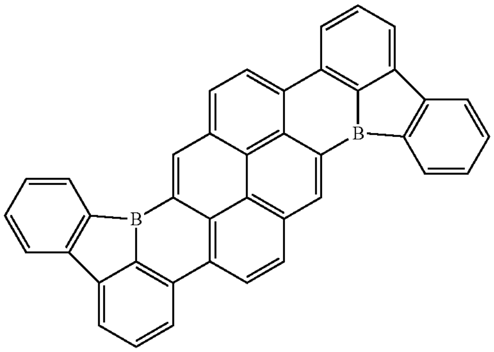
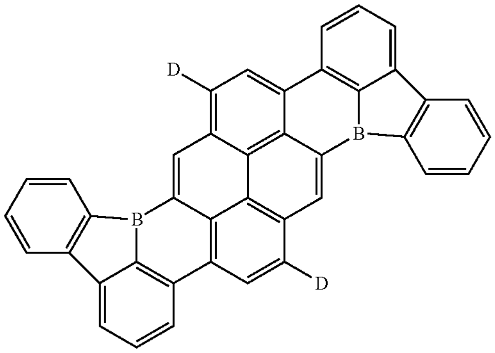
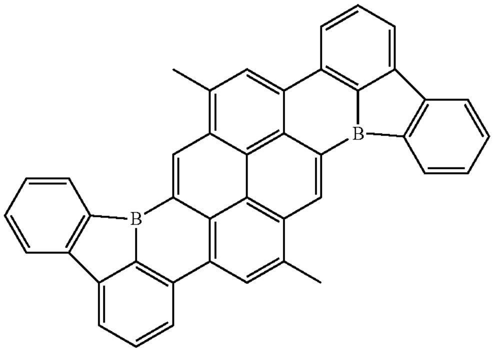
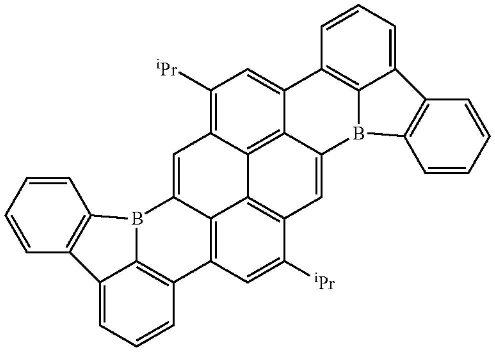
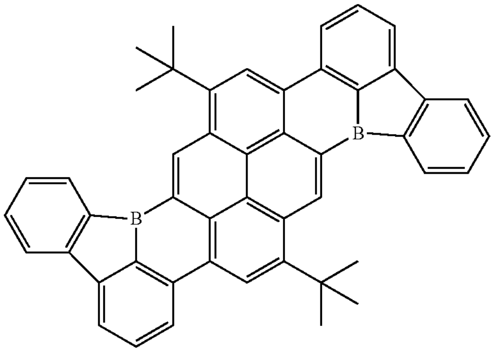
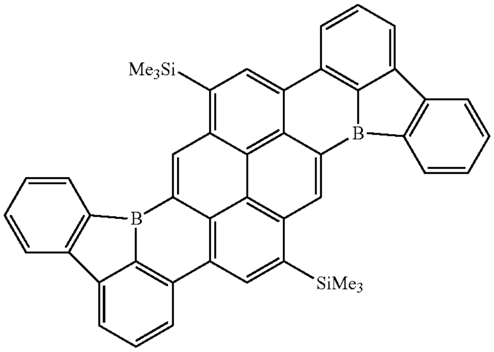
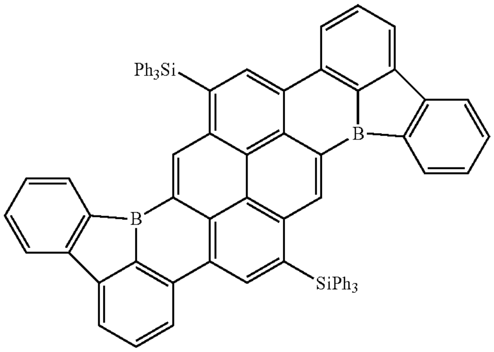
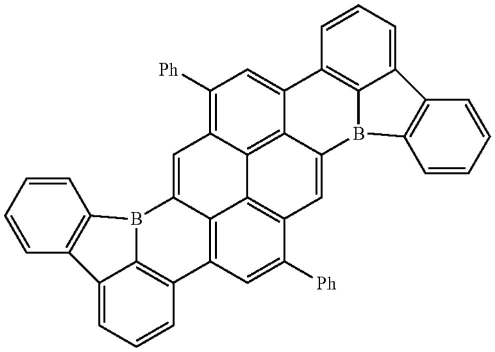

-continued
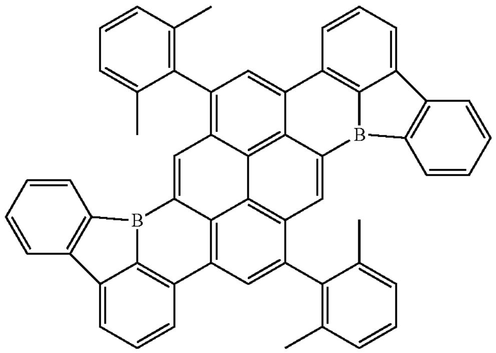
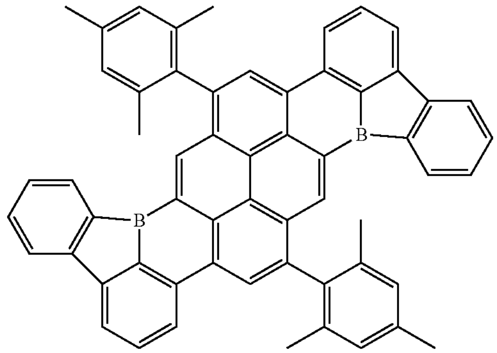
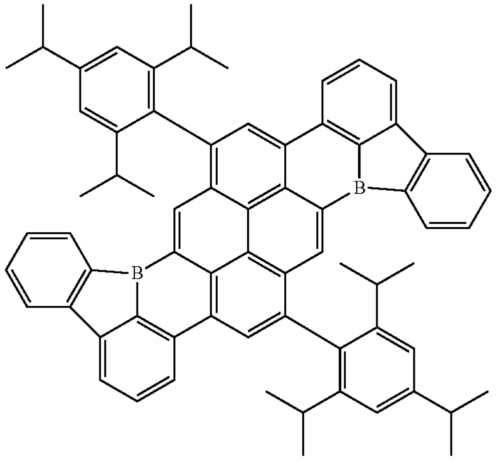
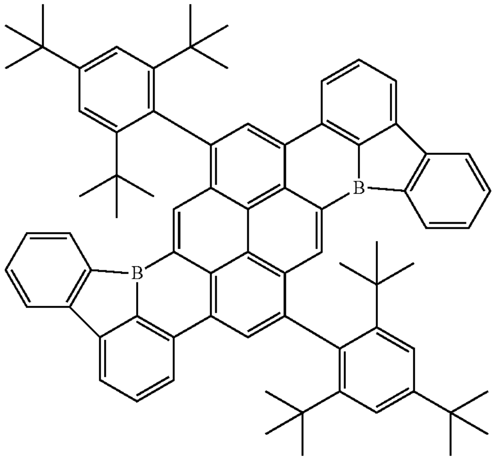
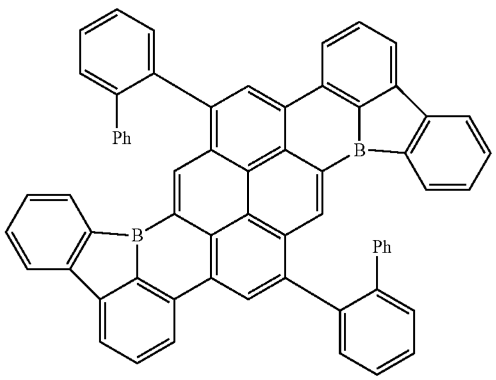
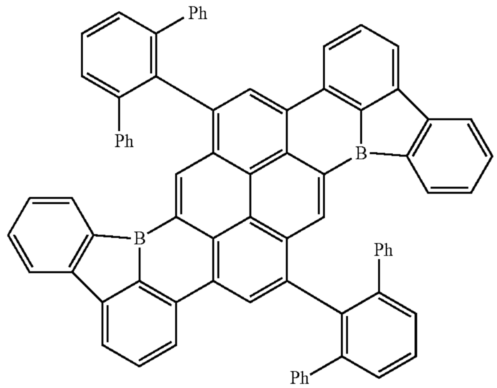
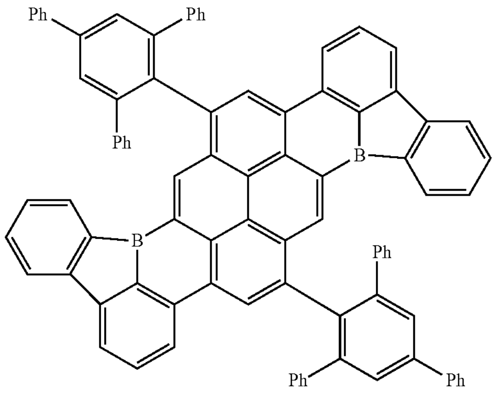
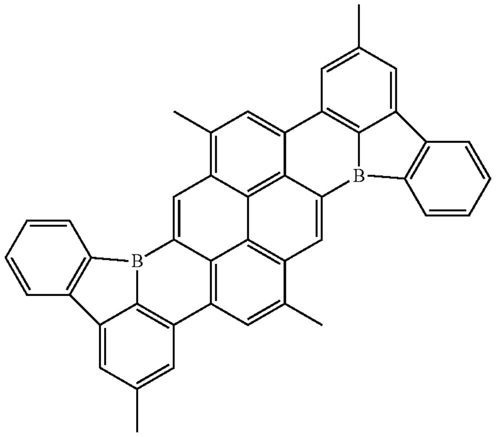

-continued
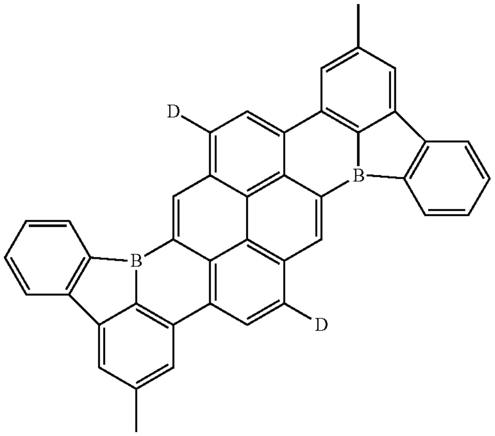
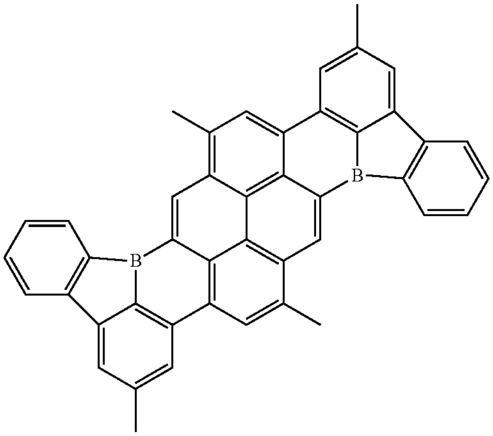
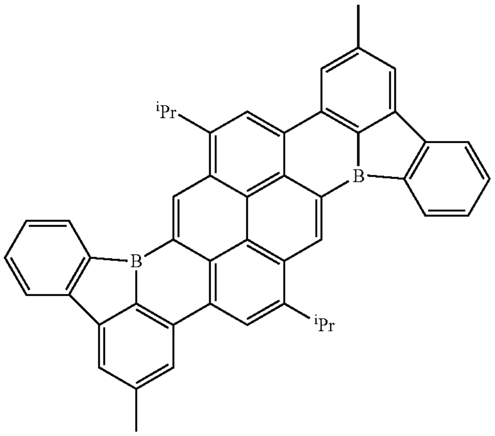
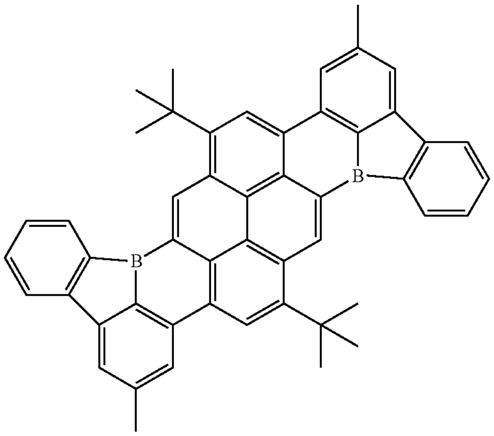
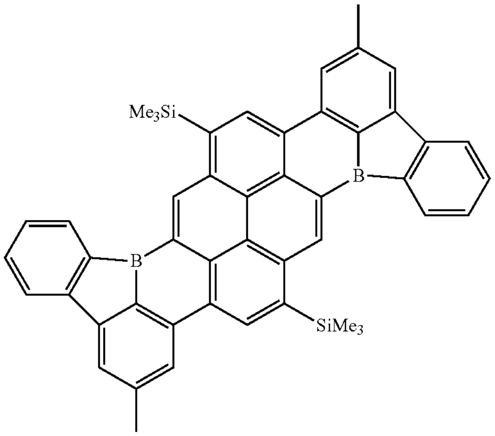
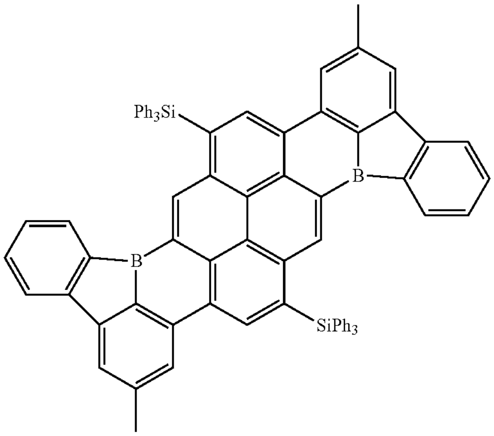

-continued
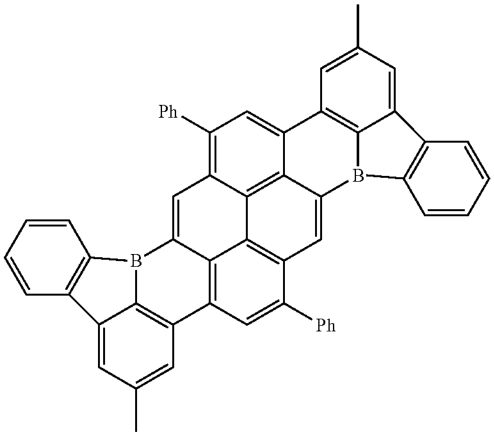
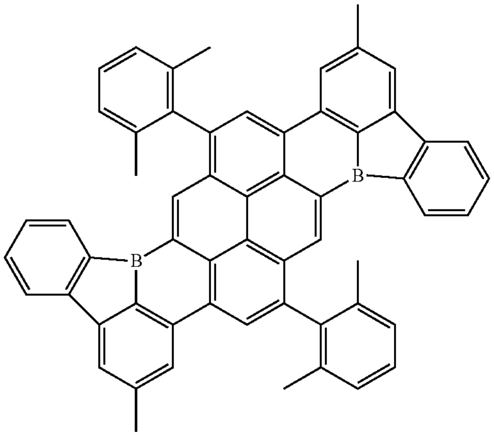
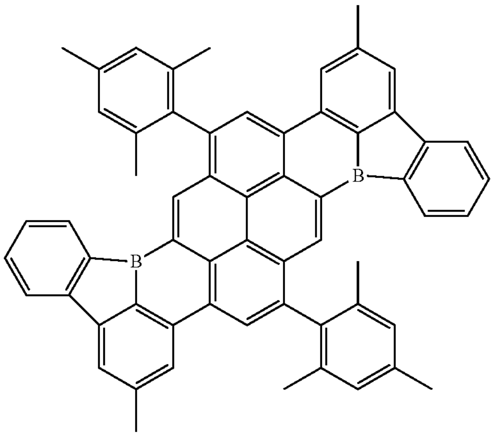
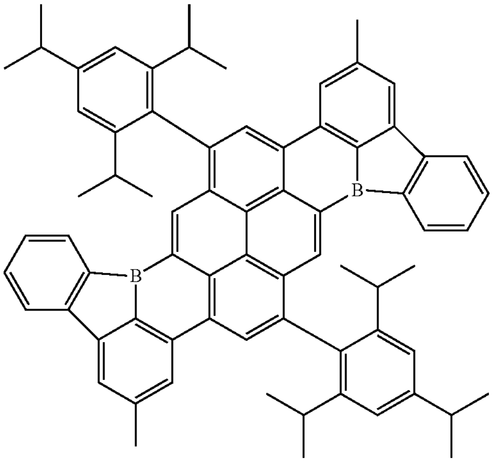
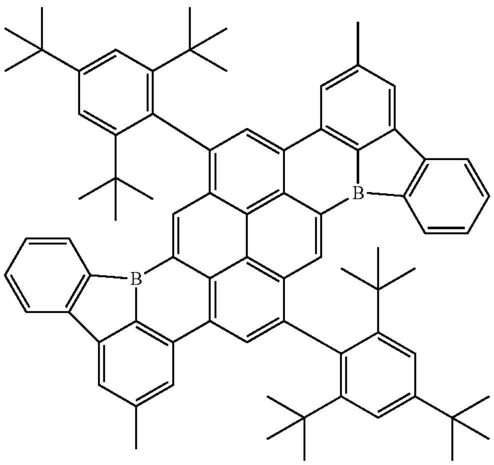
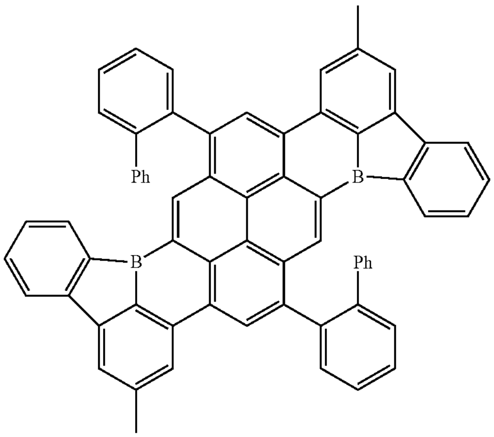

-continued
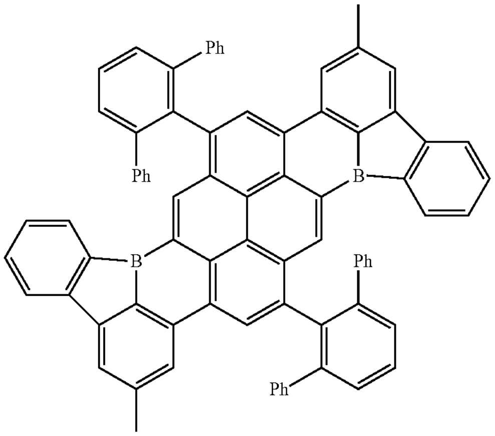
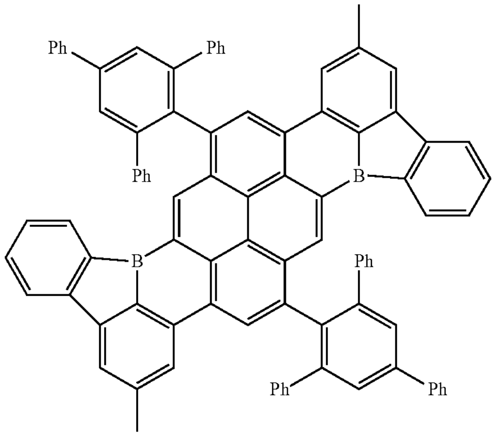
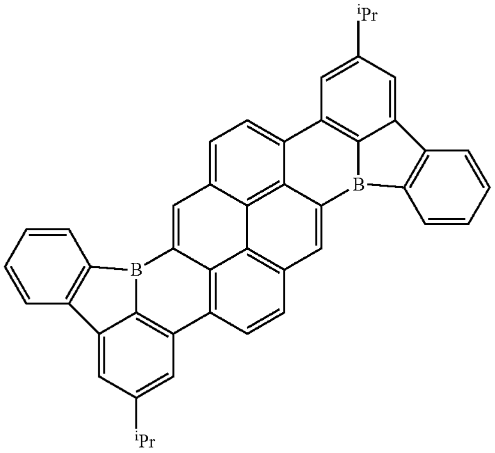
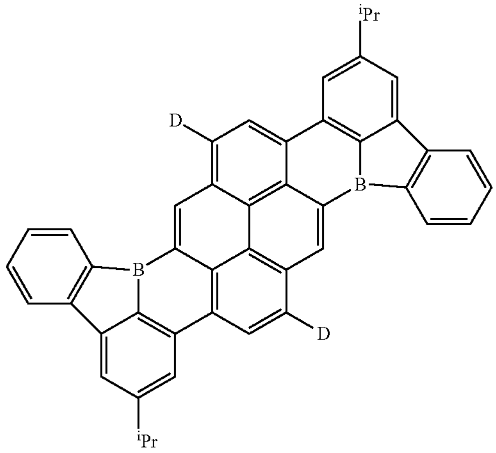
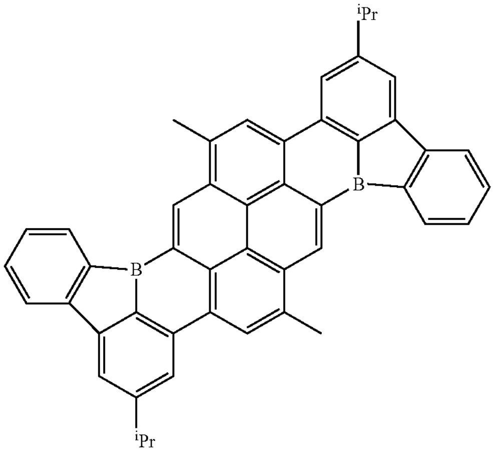
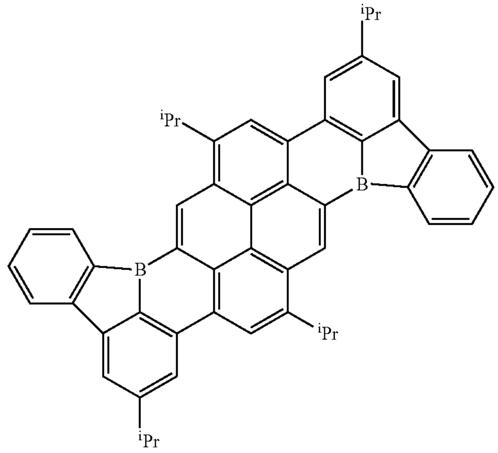

-continued
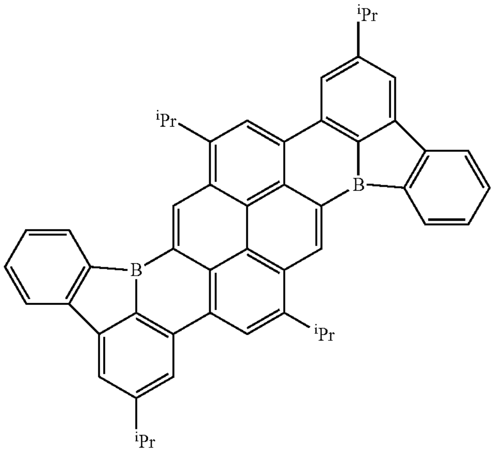
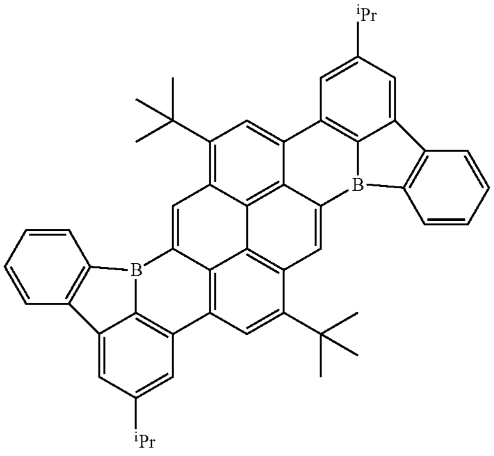
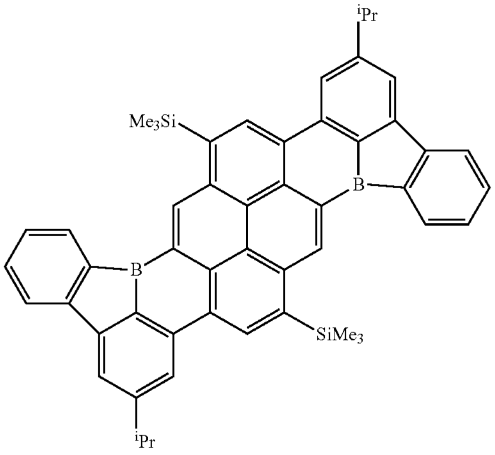
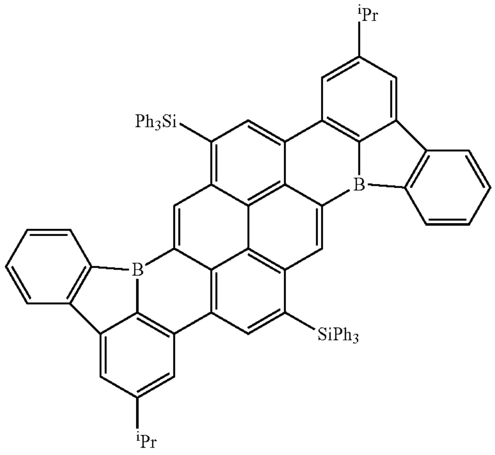
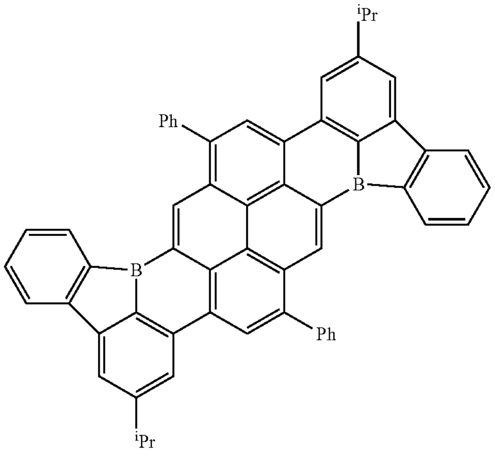
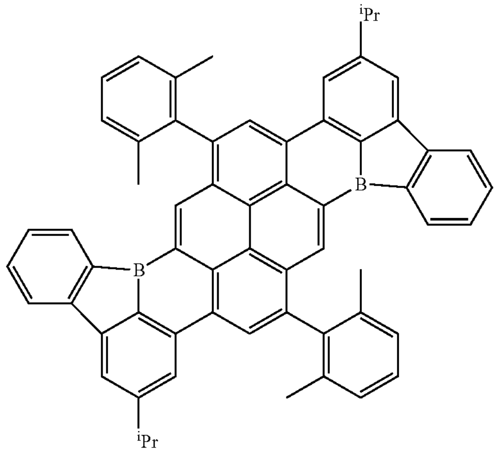

-continued
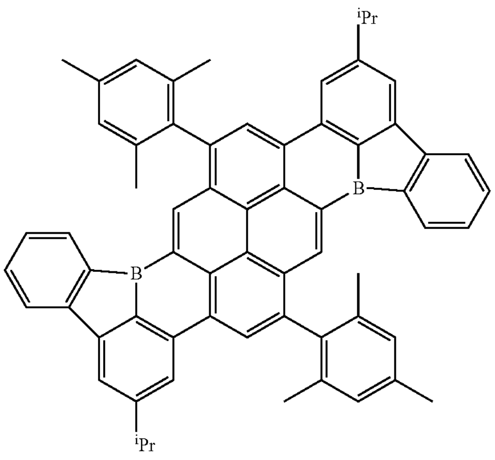
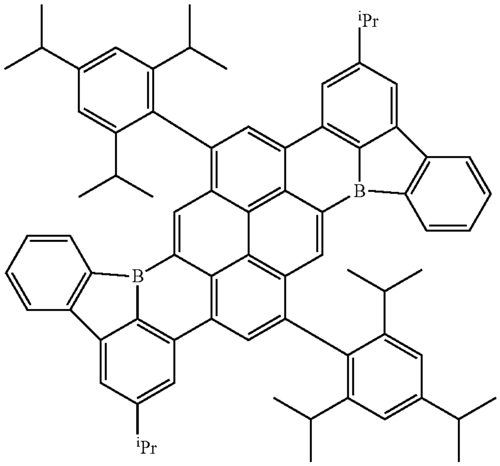
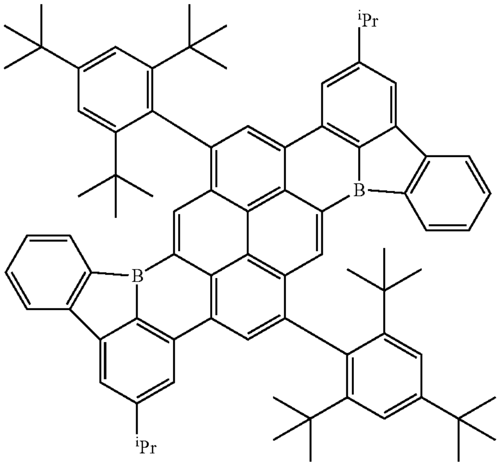
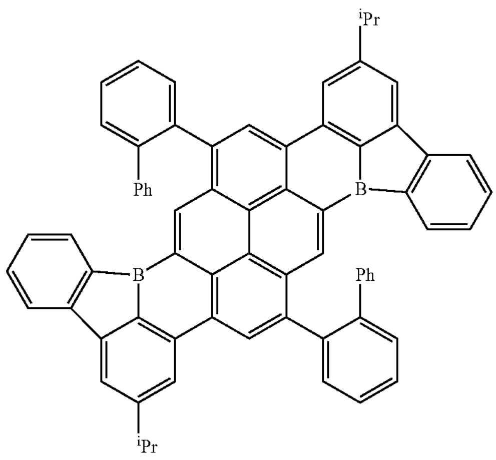
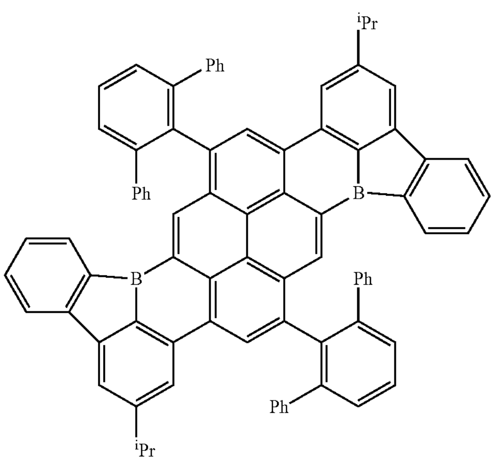
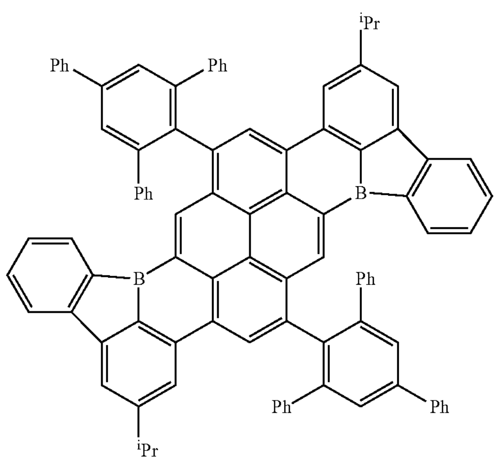

-continued
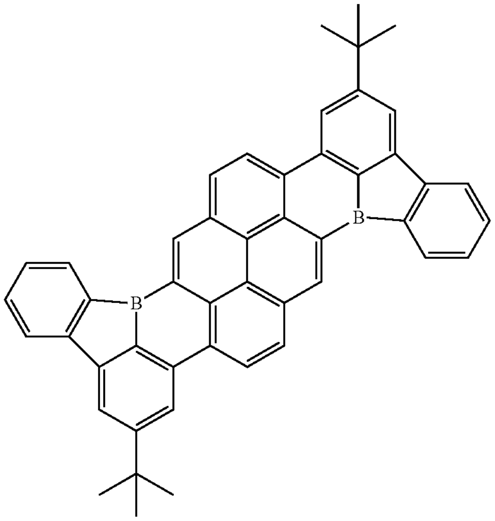
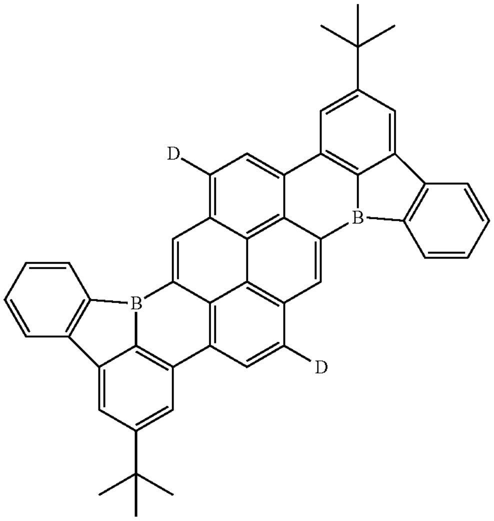
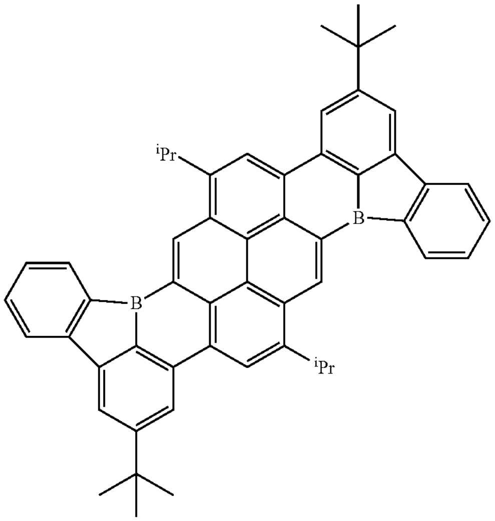
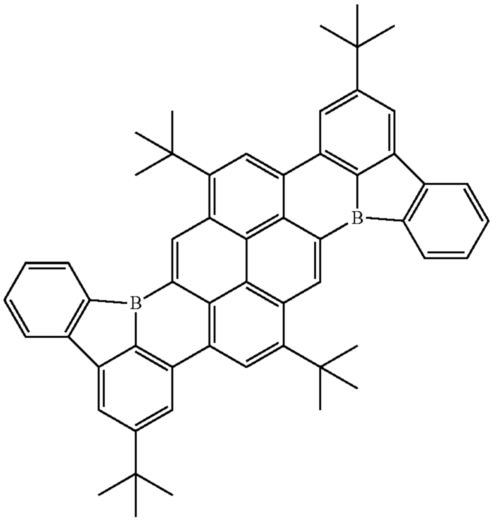
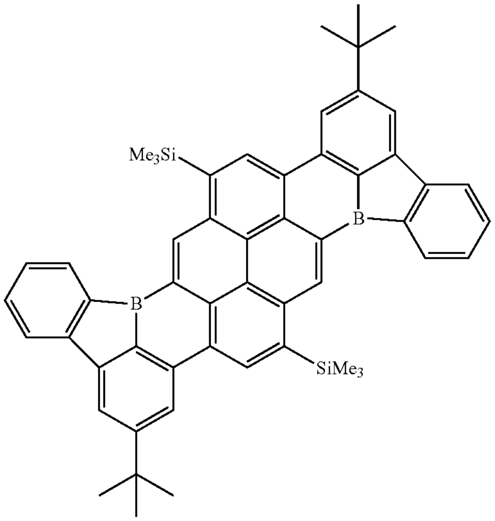
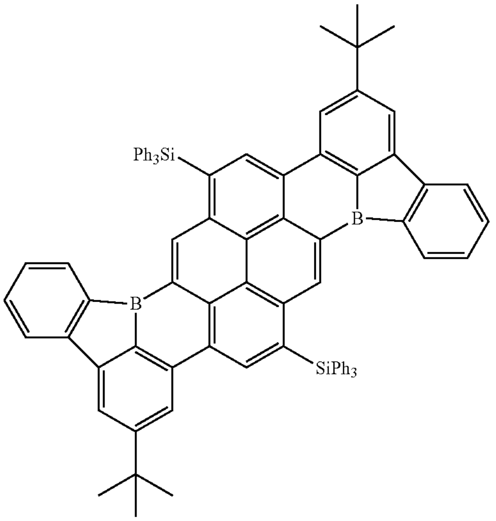

-continued
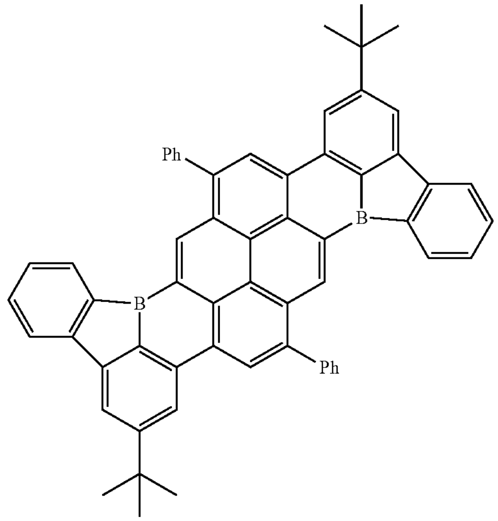
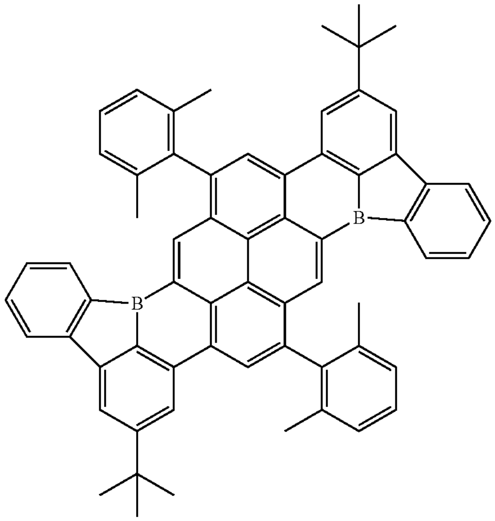
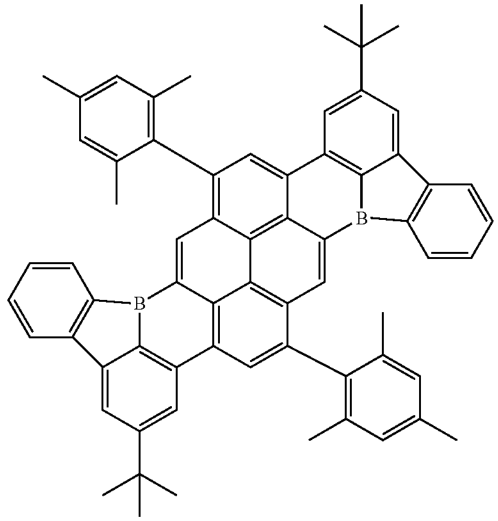
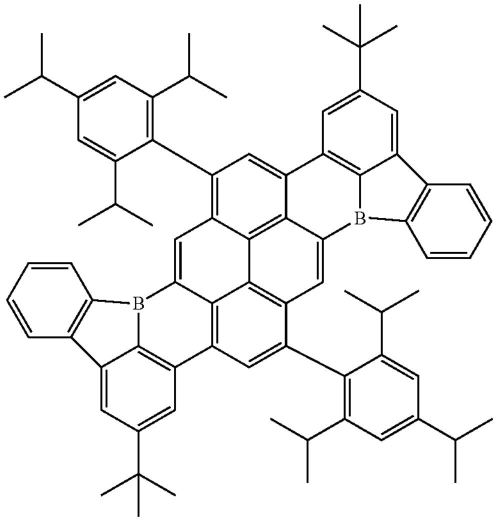
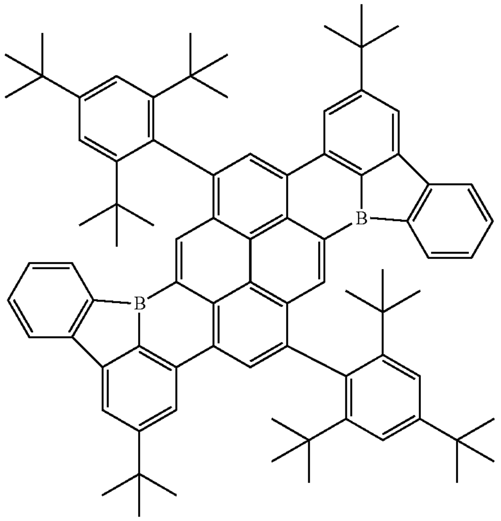
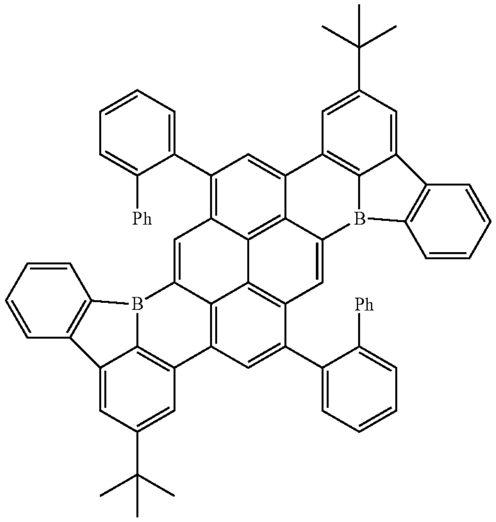

-continued
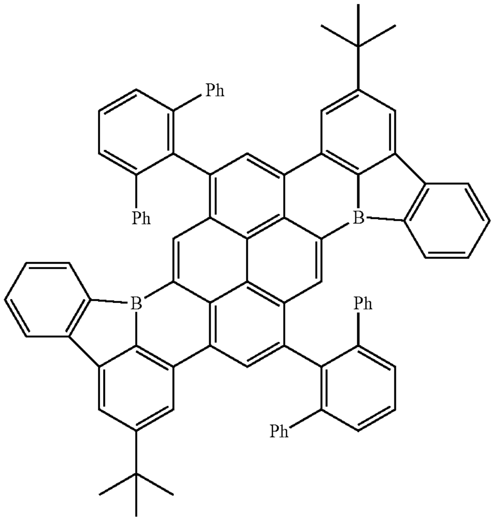
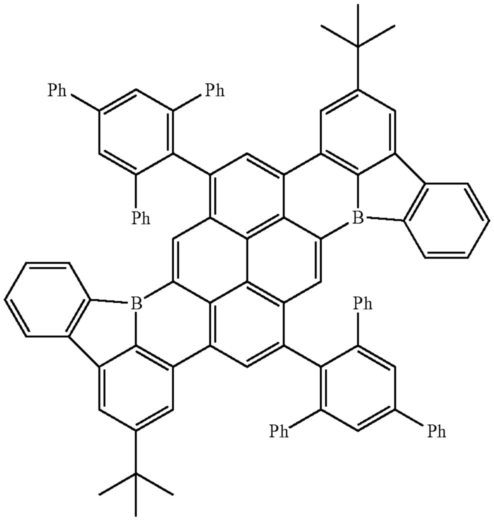
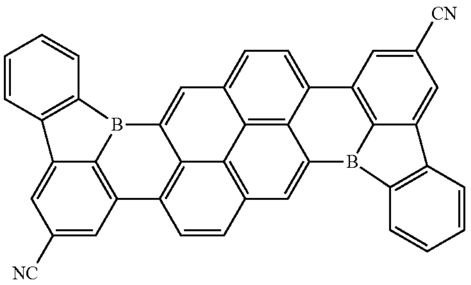
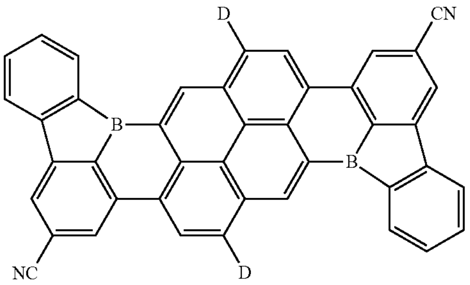
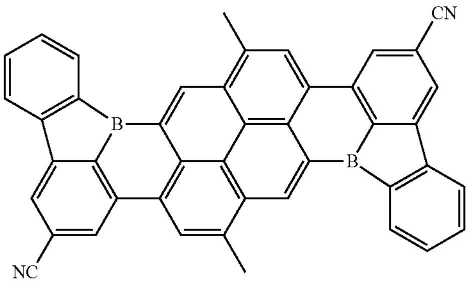
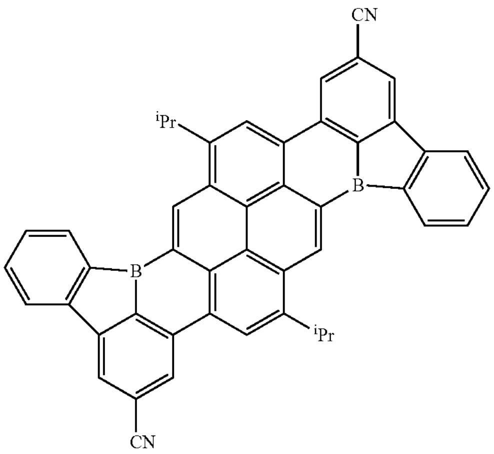
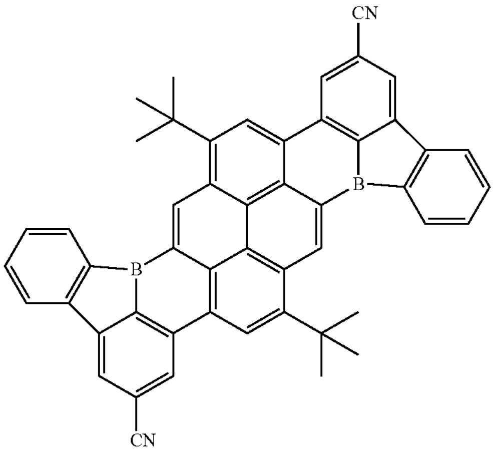
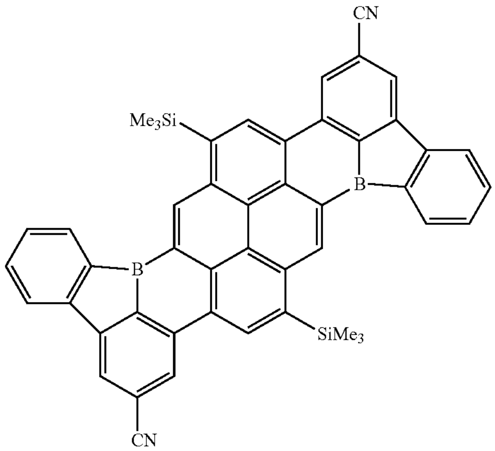

-continued
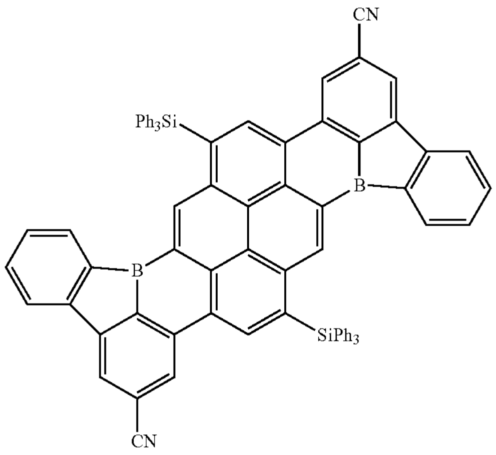
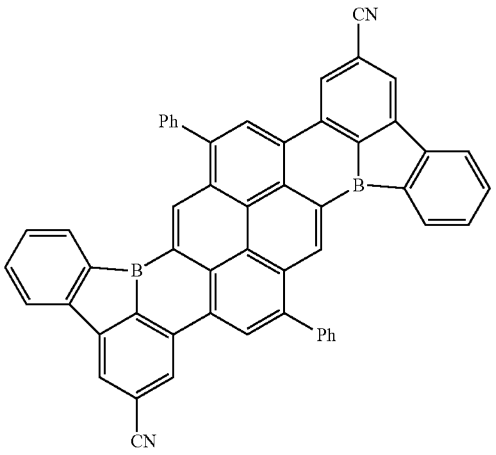
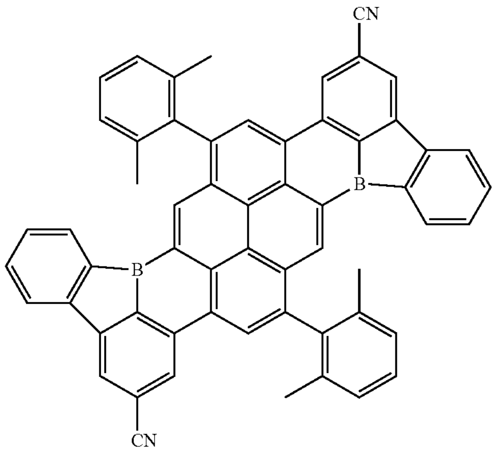
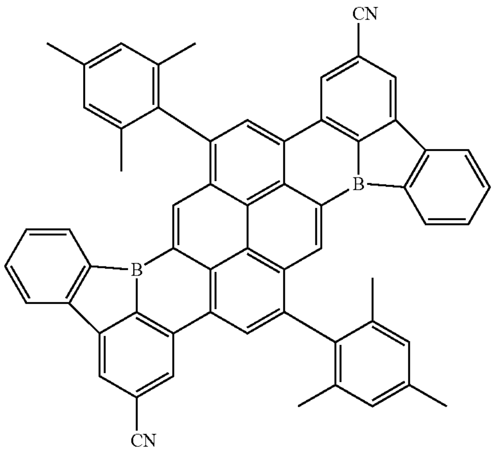
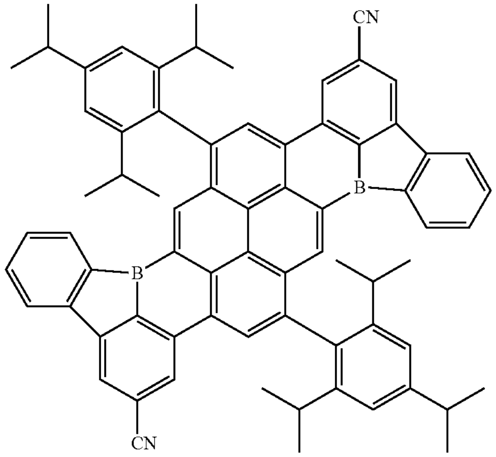
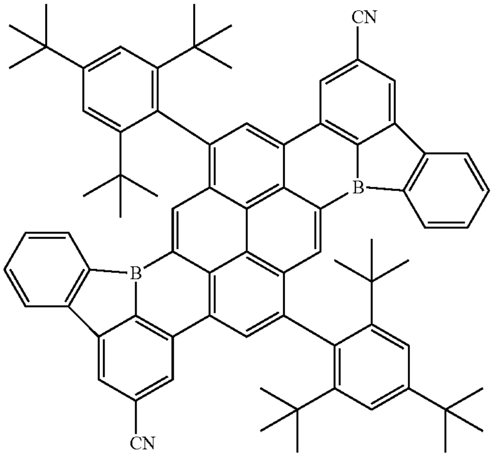

-continued
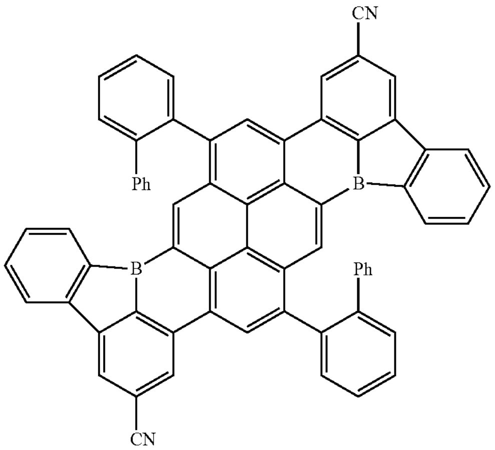
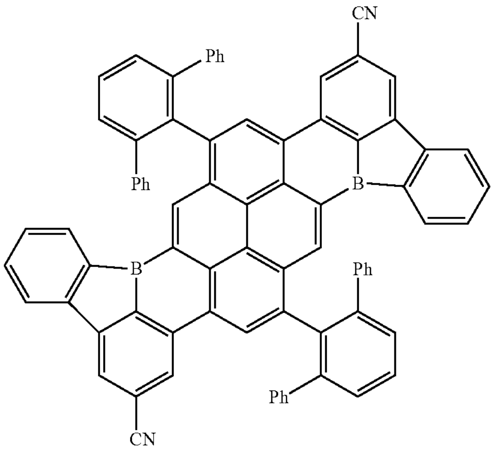
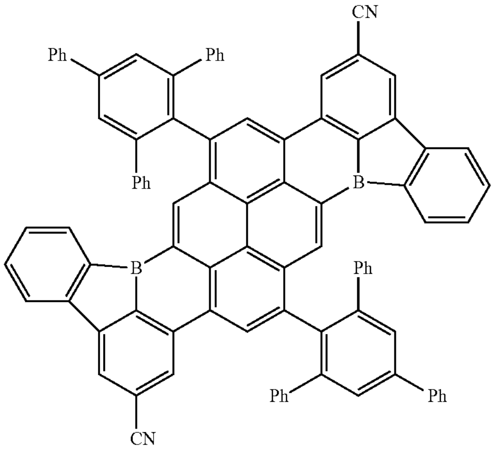
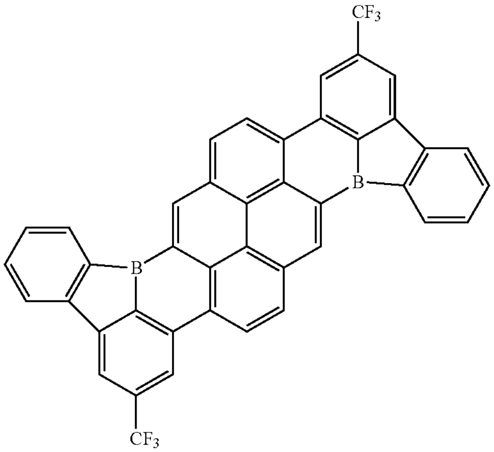
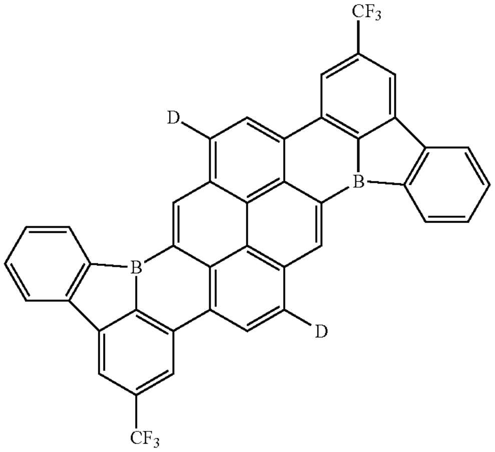
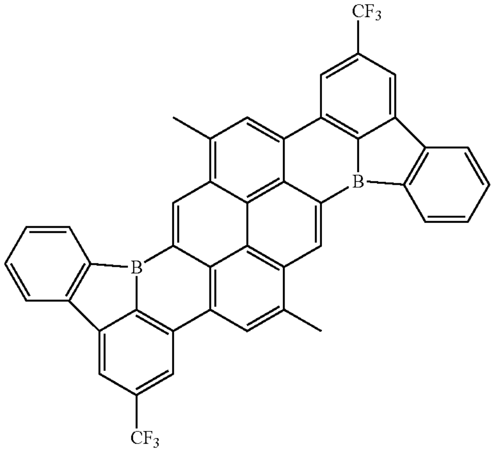

-continued
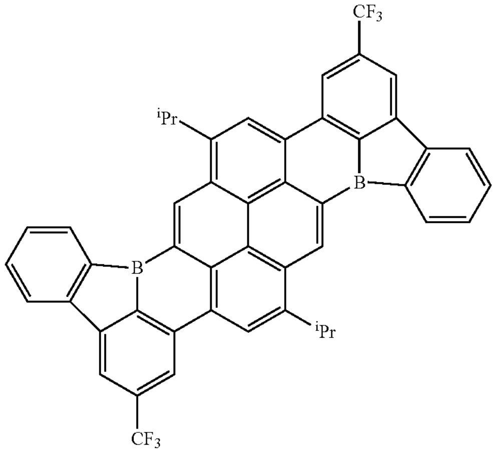
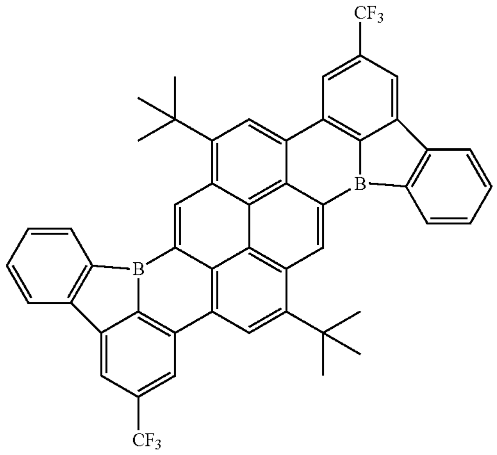
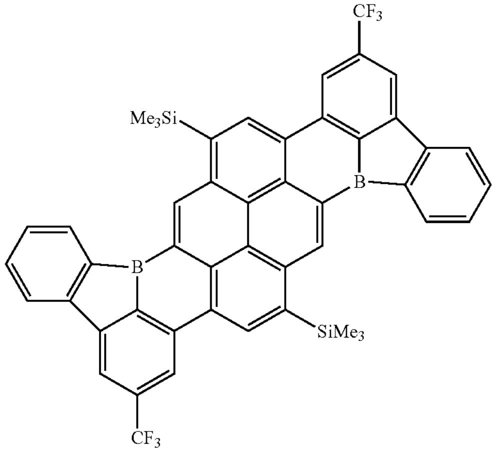
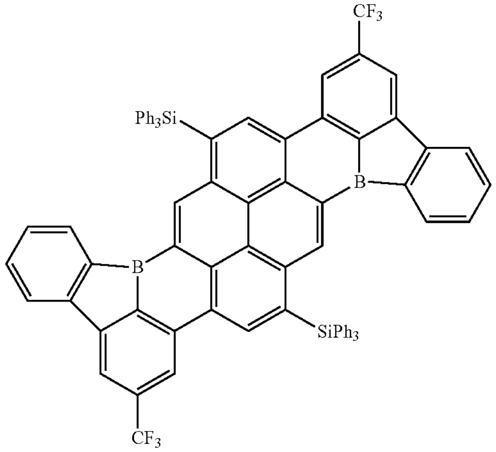
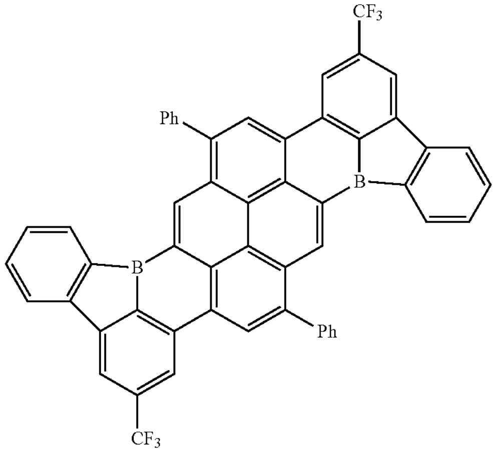
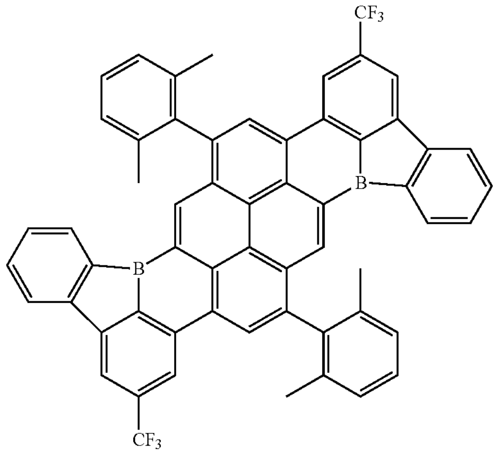

-continued
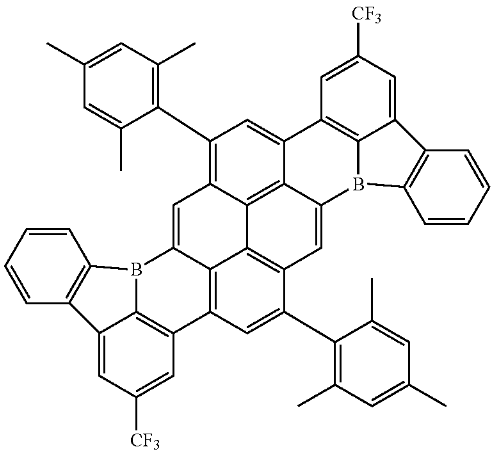
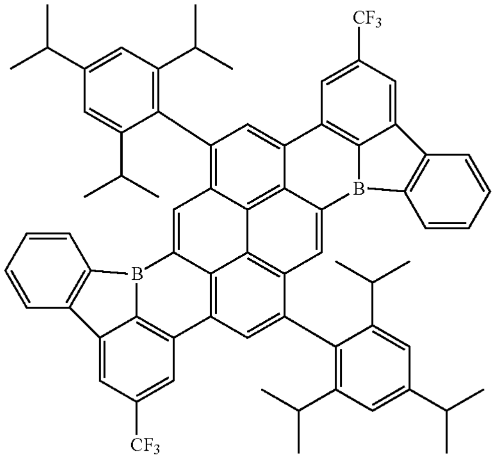
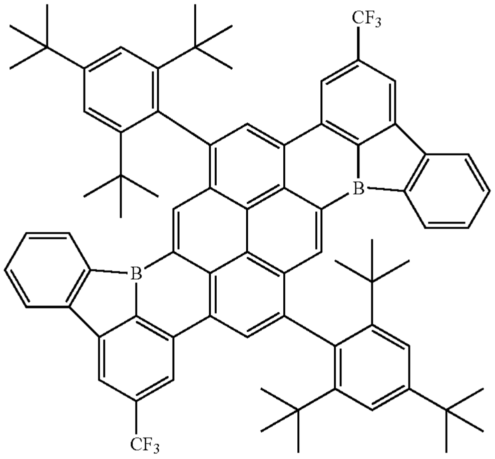
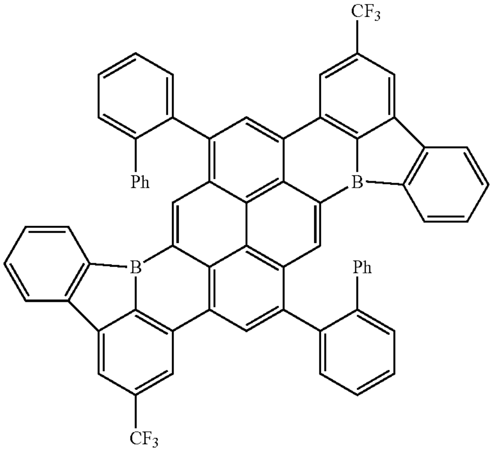
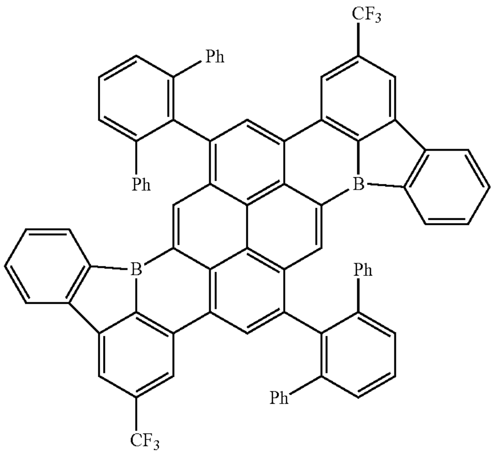
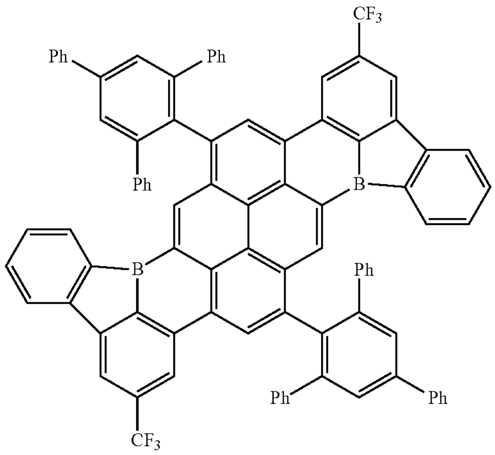

-continued
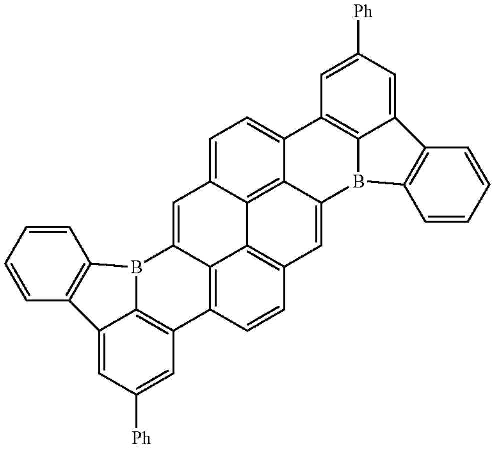
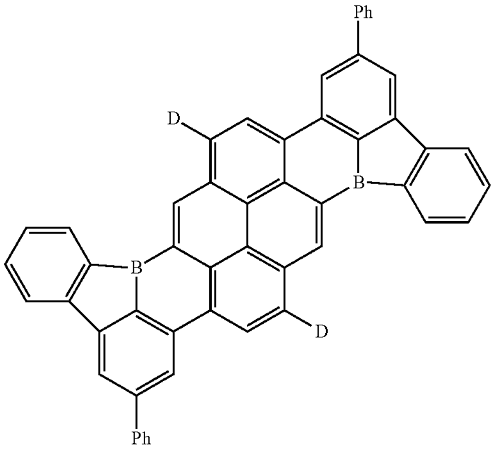
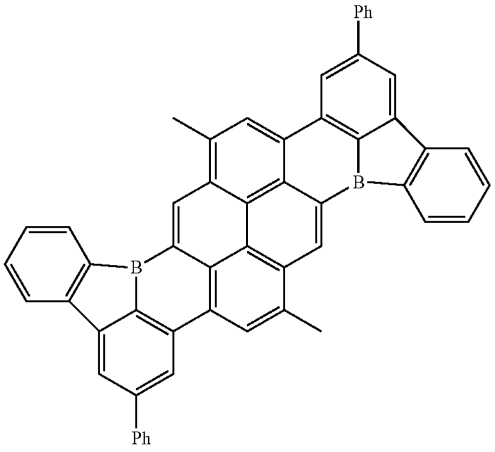
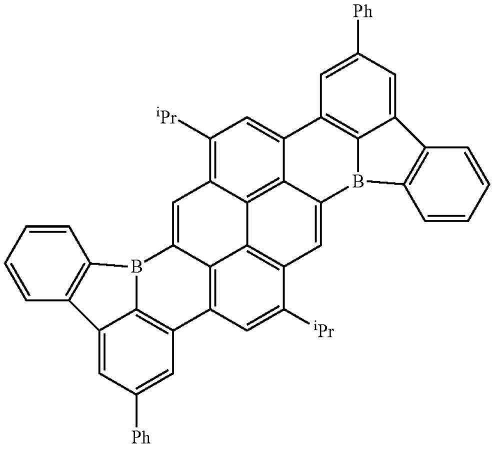
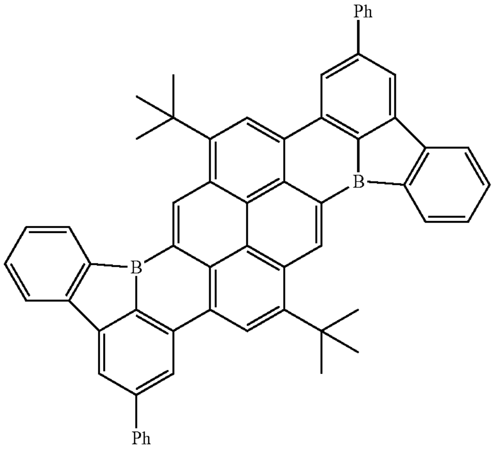
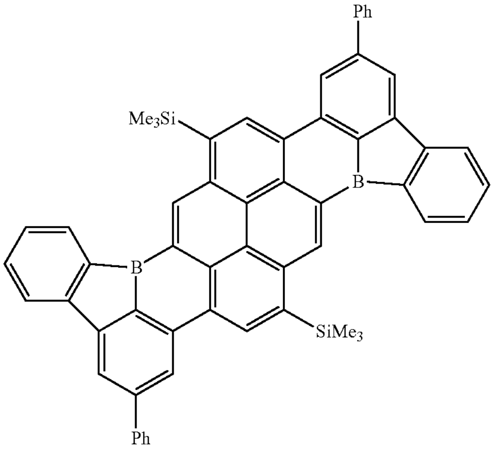

-continued
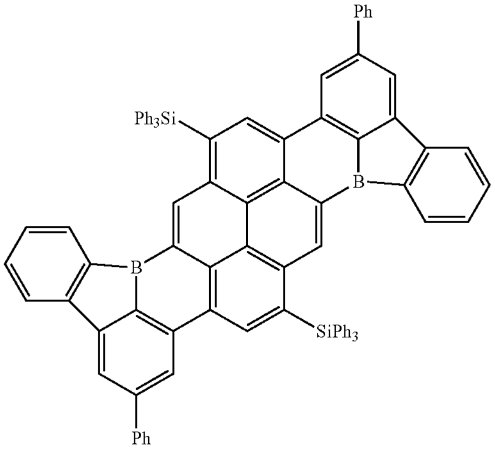
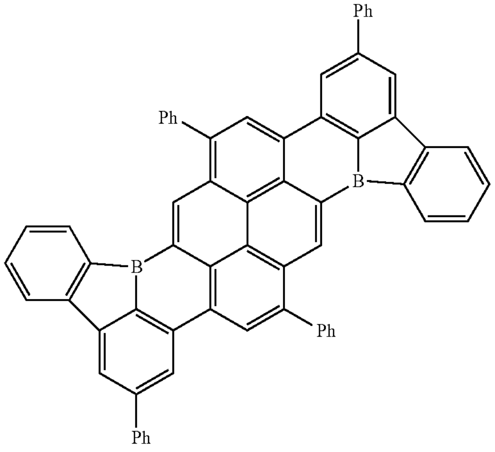
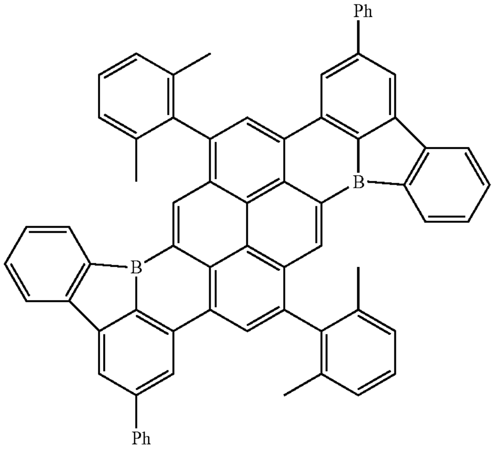
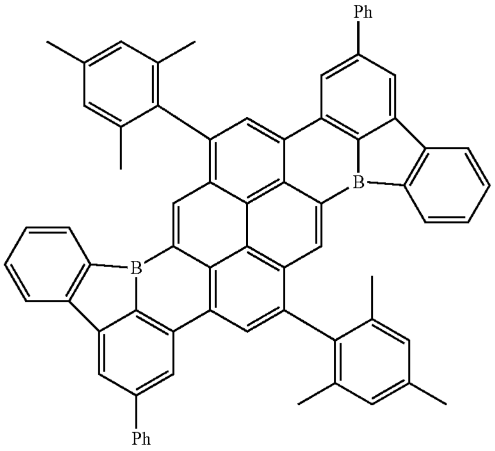
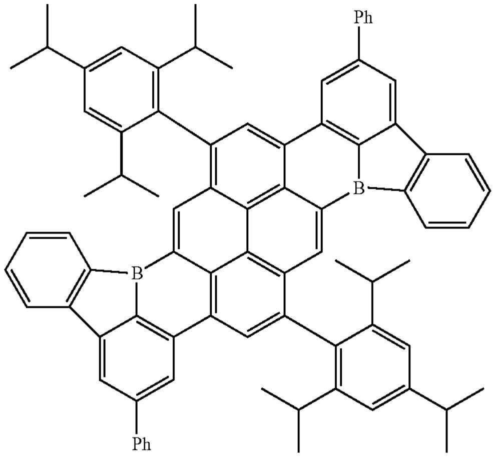

-continued
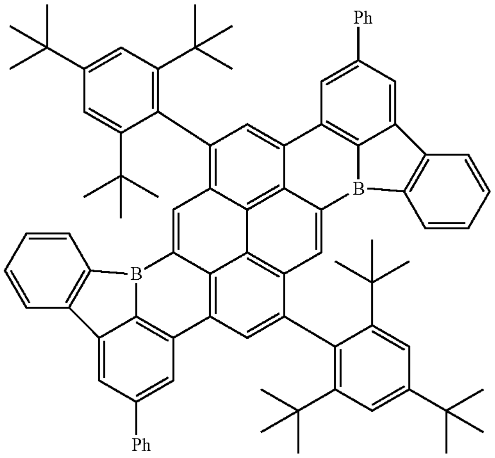
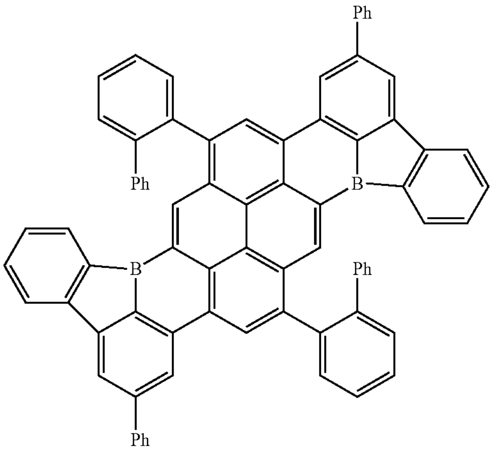
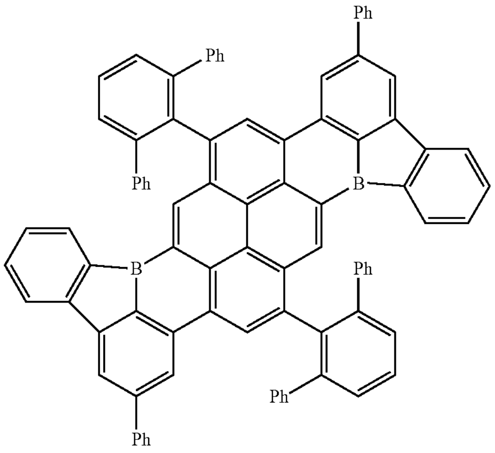
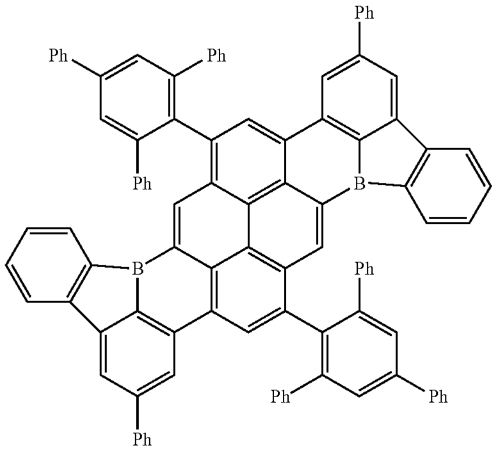
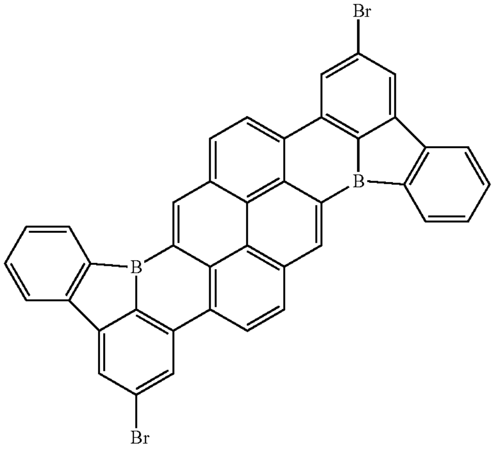
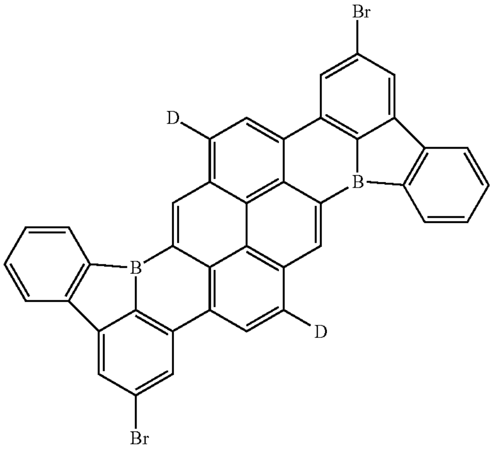

-continued
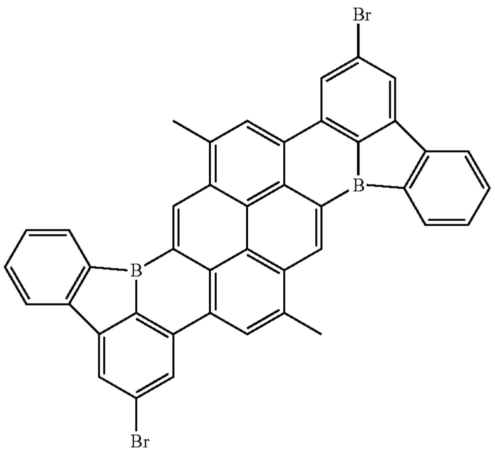
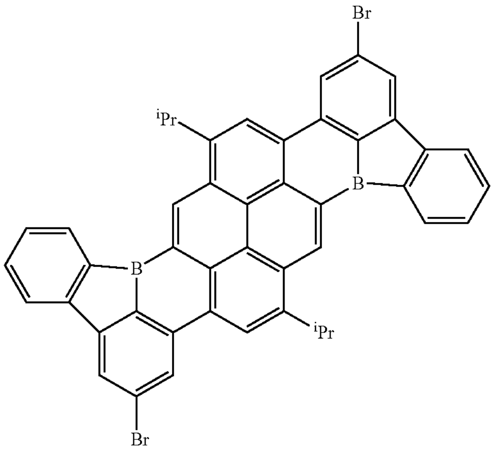
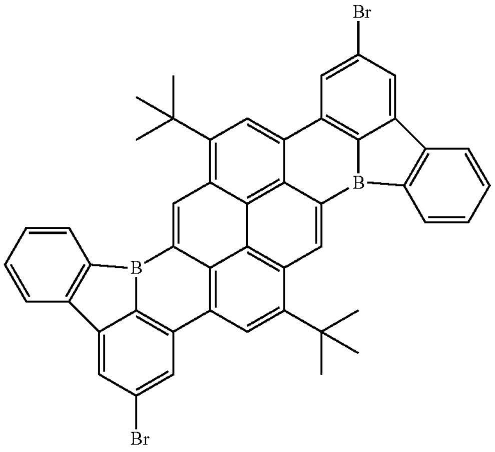
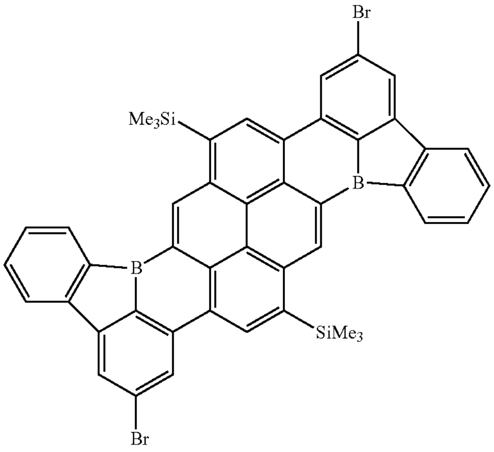
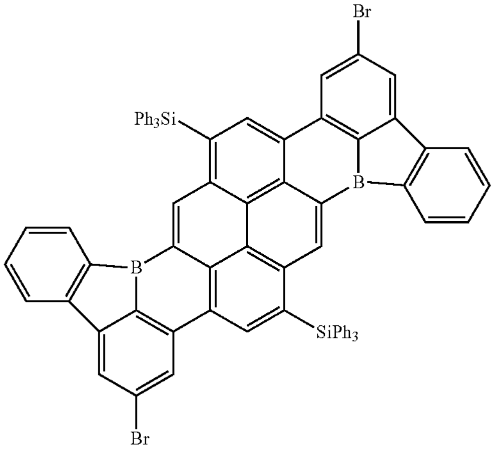
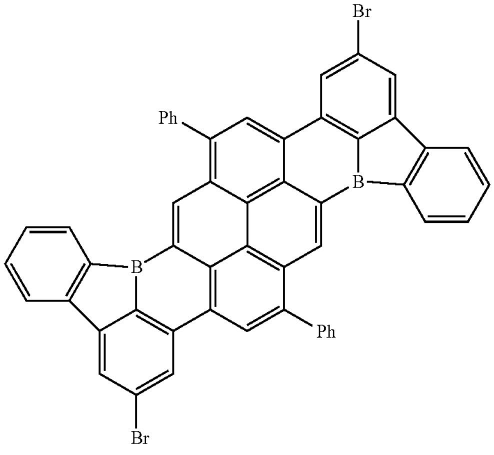

-continued
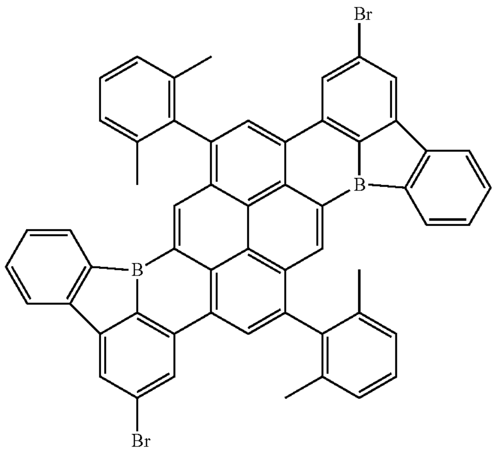
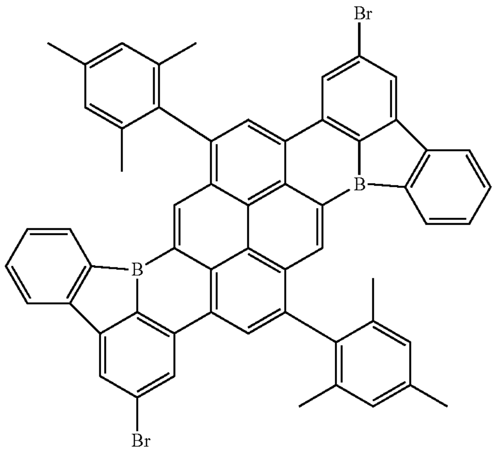
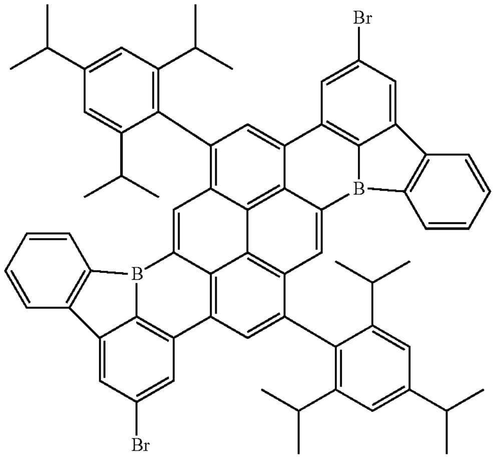
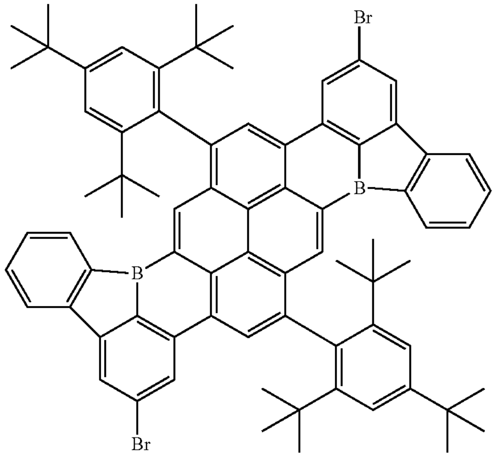
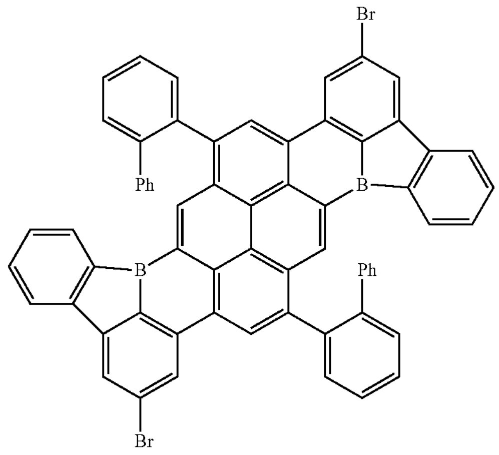

-continued
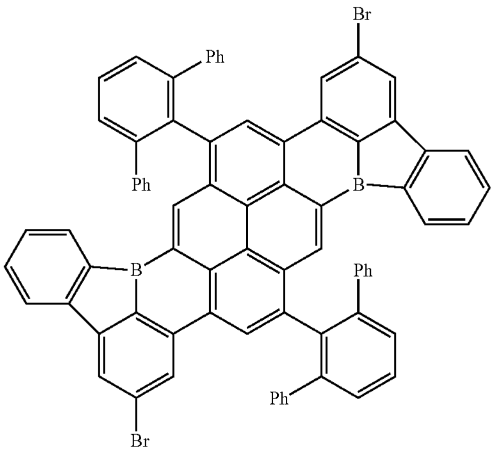
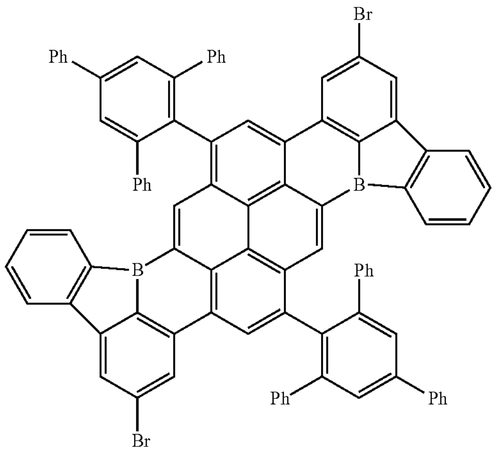
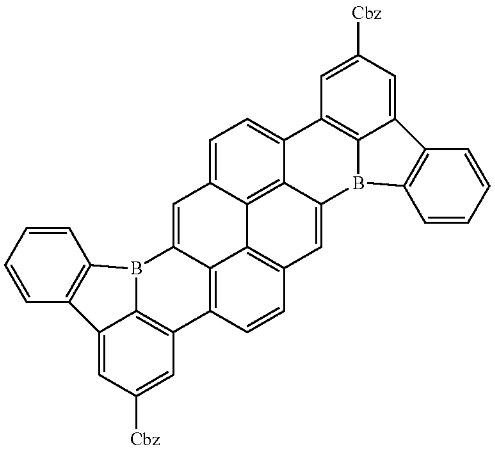
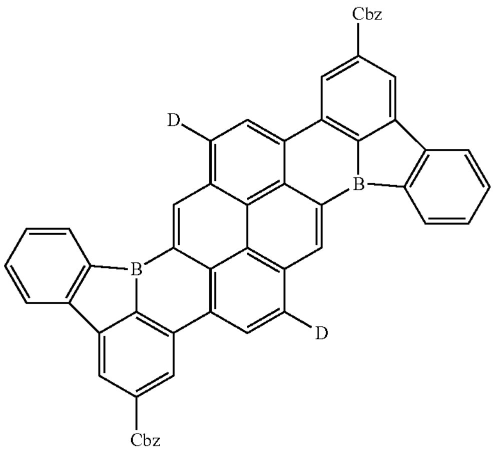
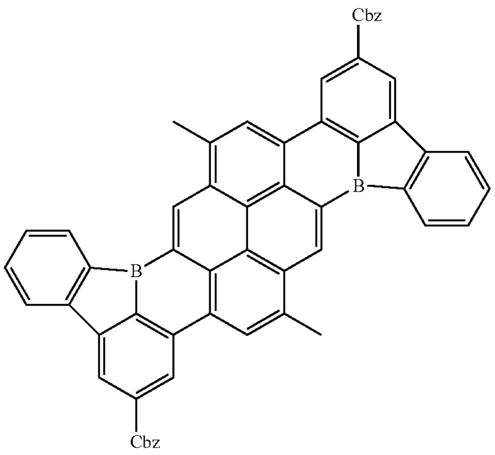
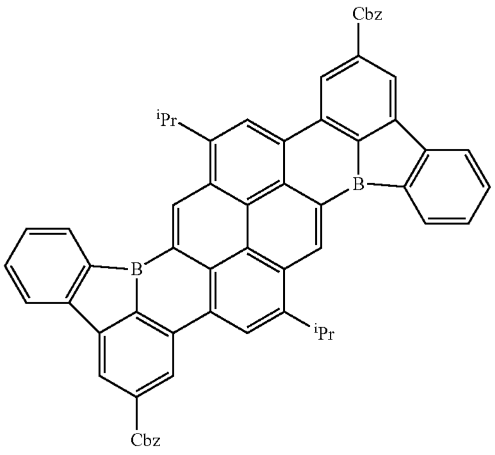

-continued
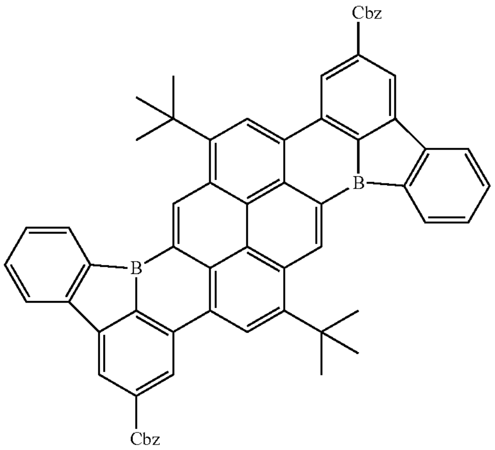
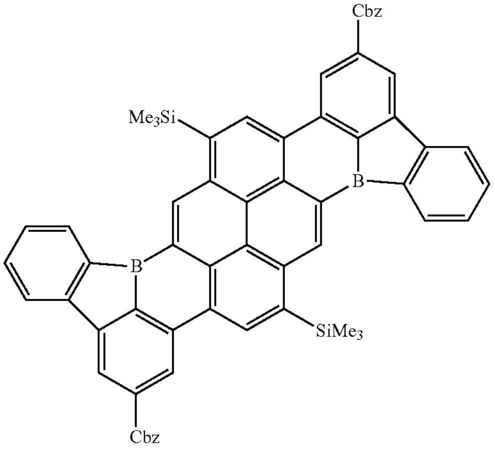
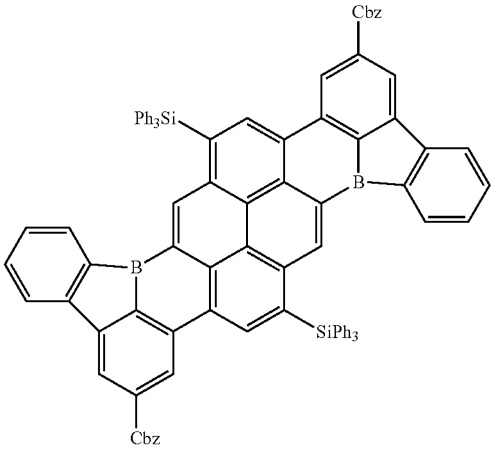
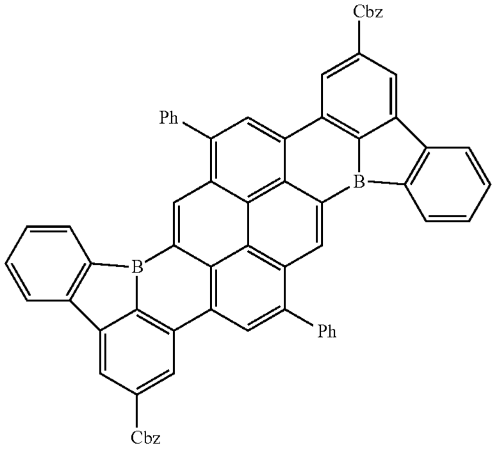
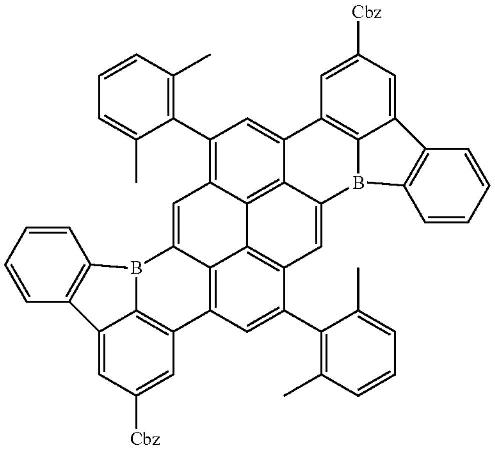

-continued
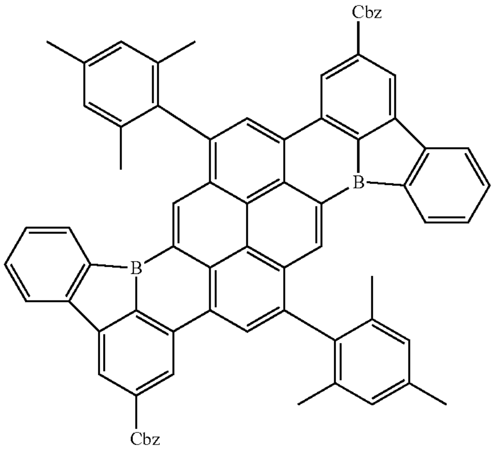
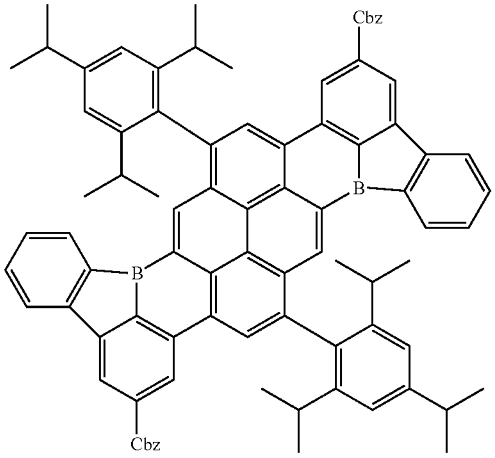
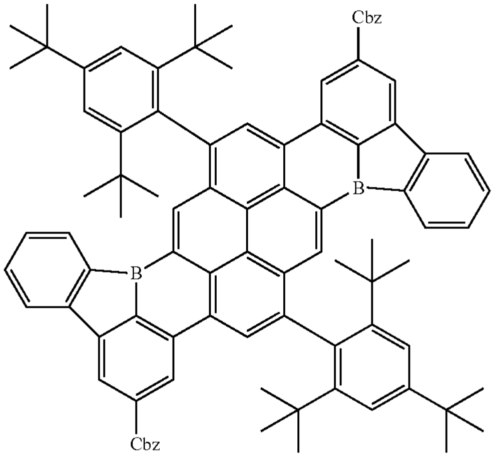
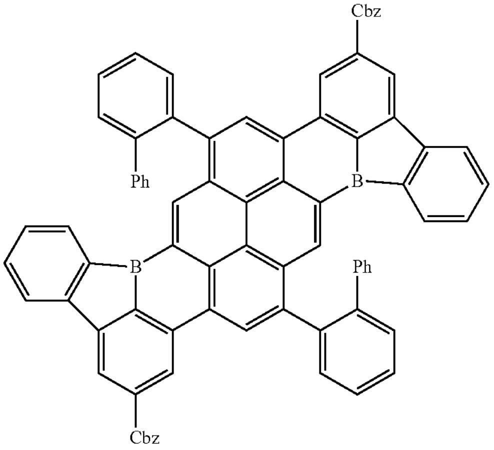
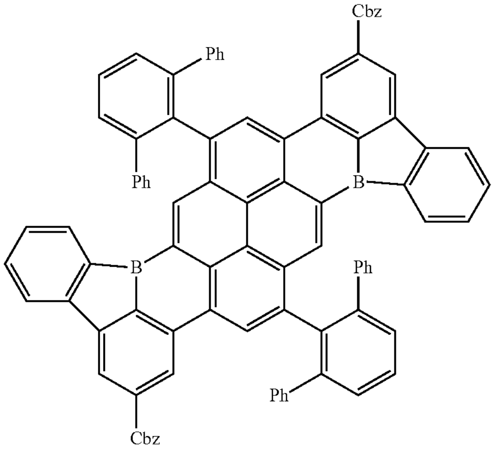
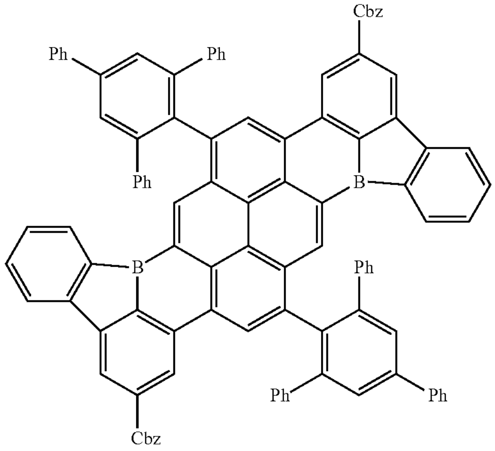

-continued
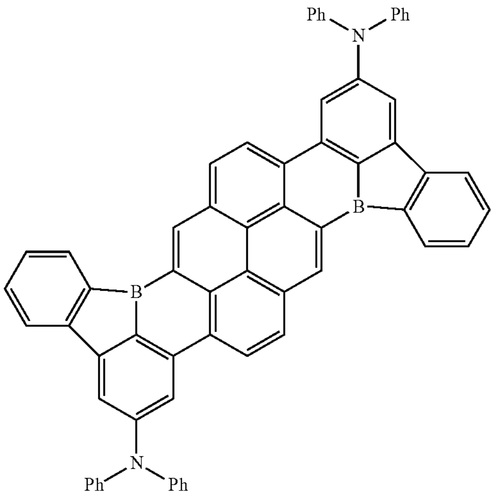
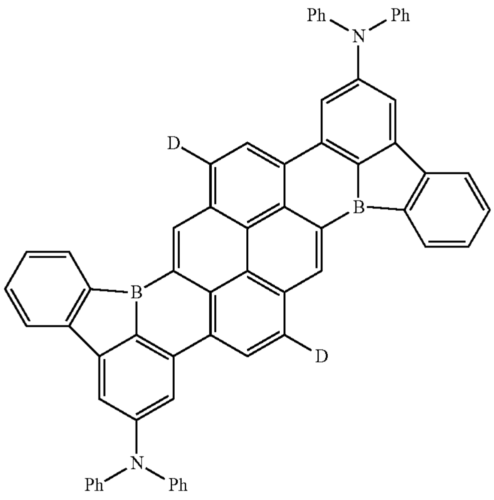
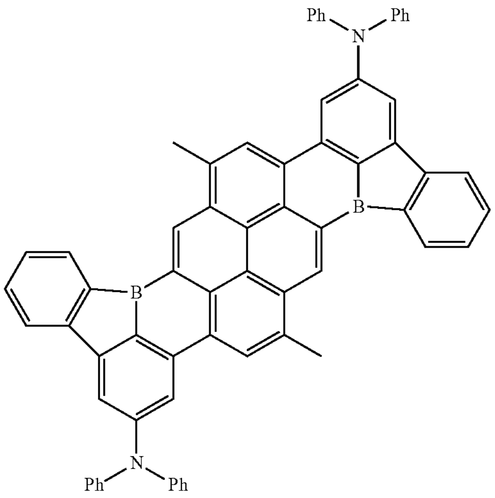
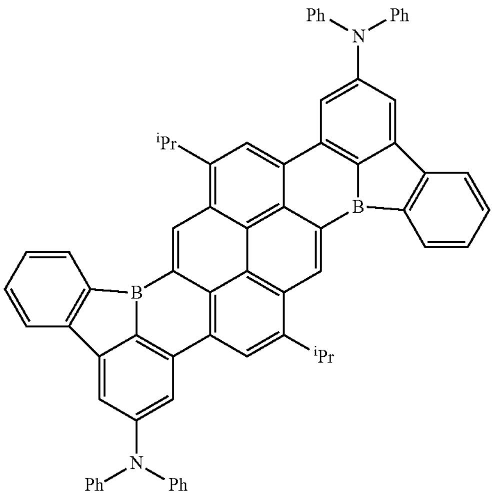
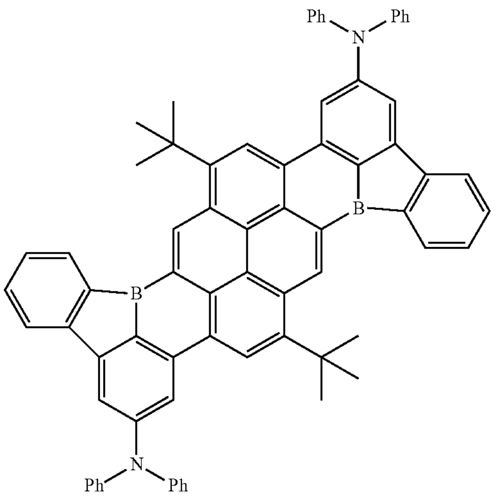
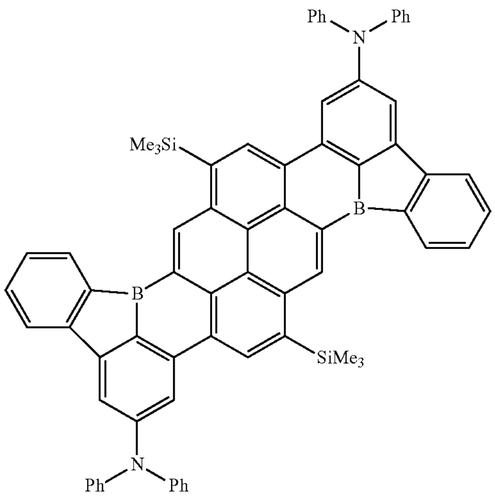

-continued
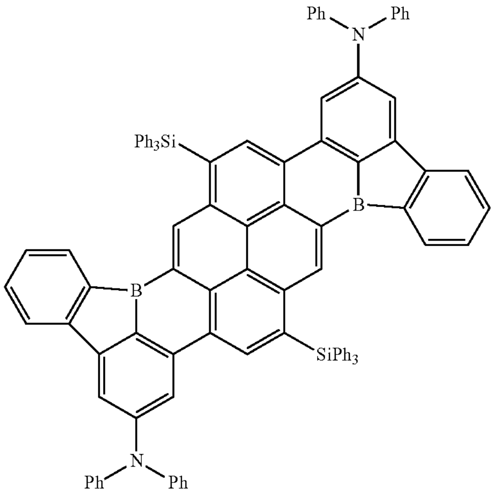
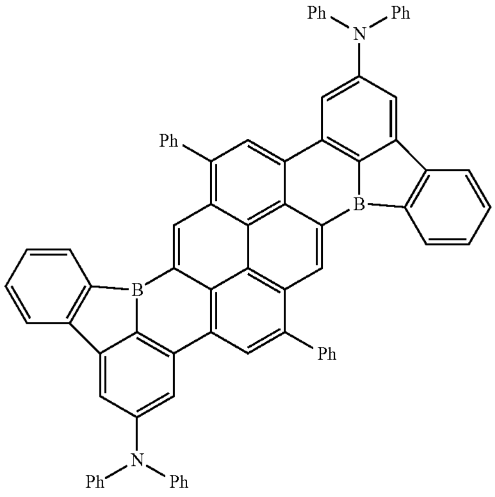
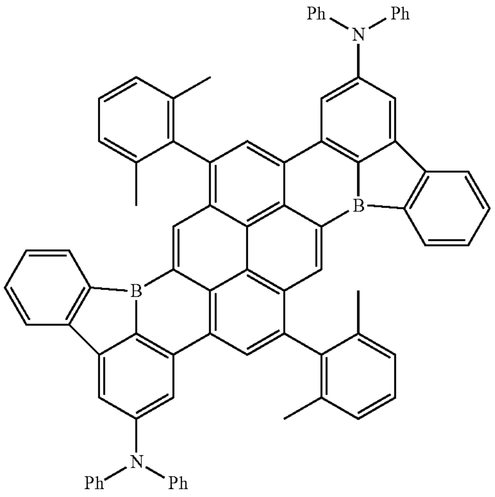
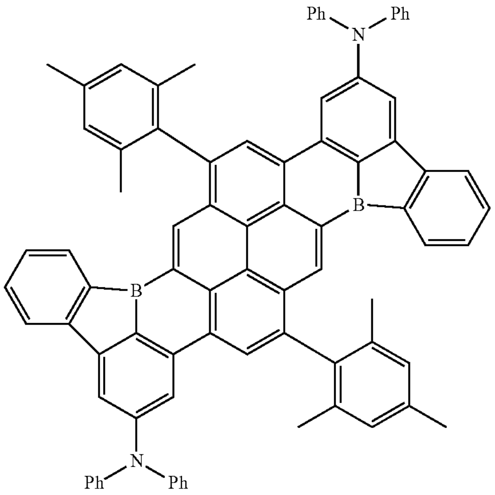
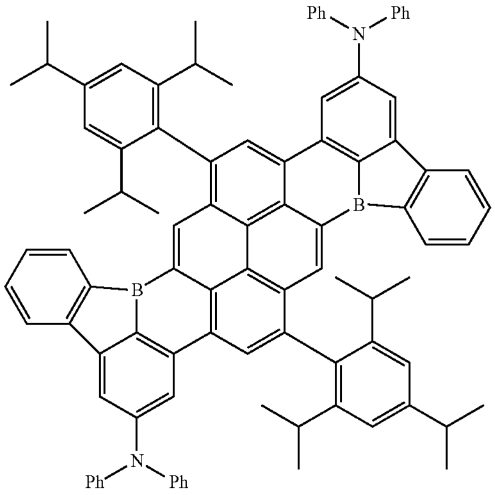

-continued
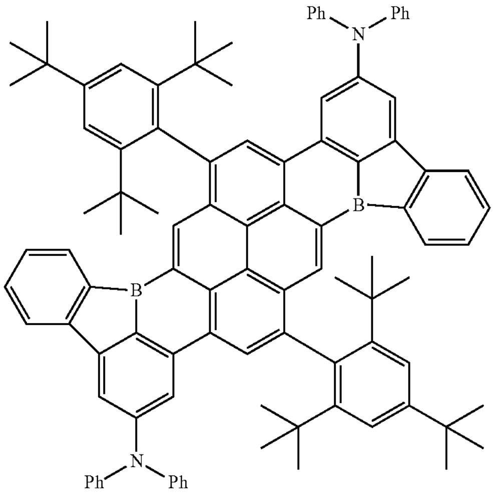
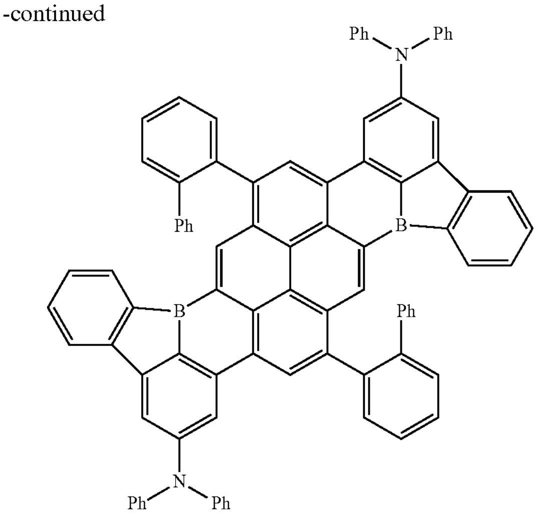
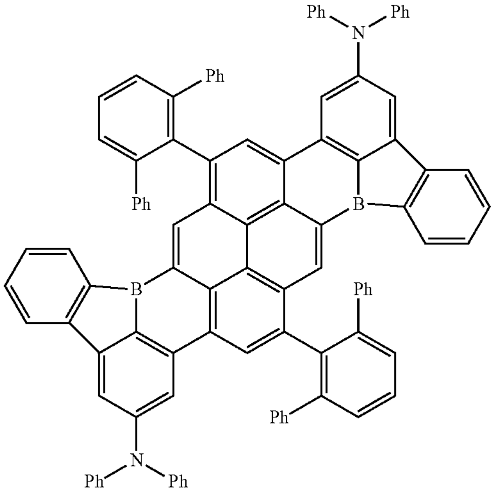
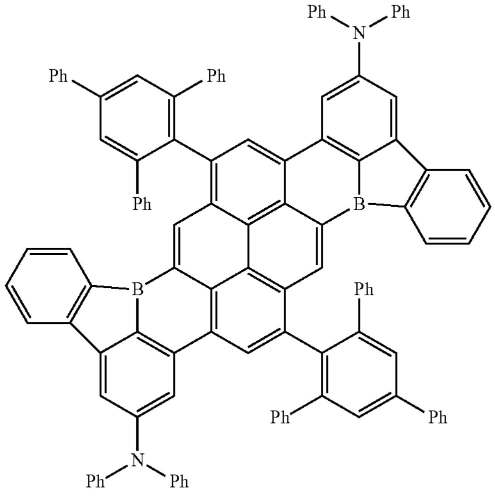
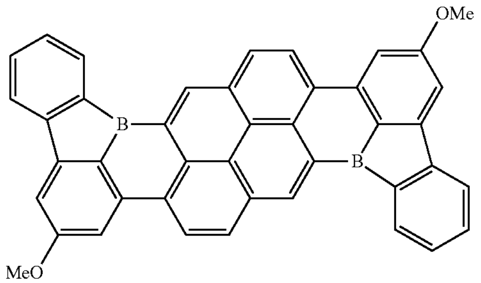
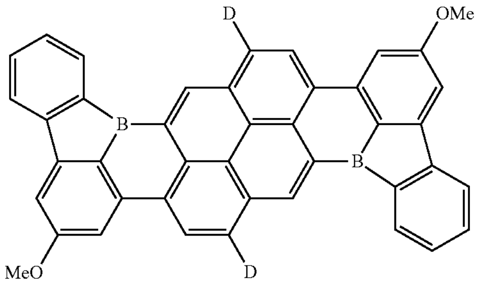
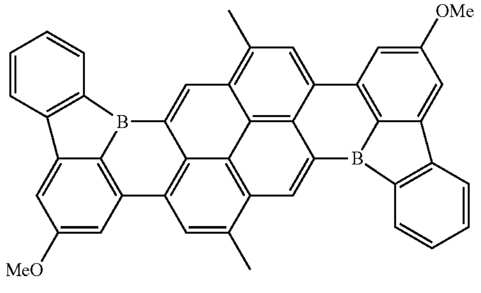

-continued
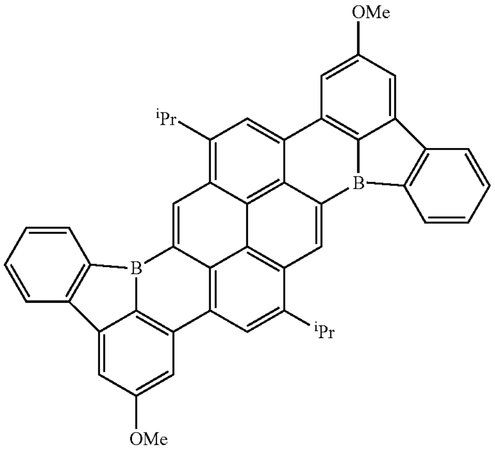
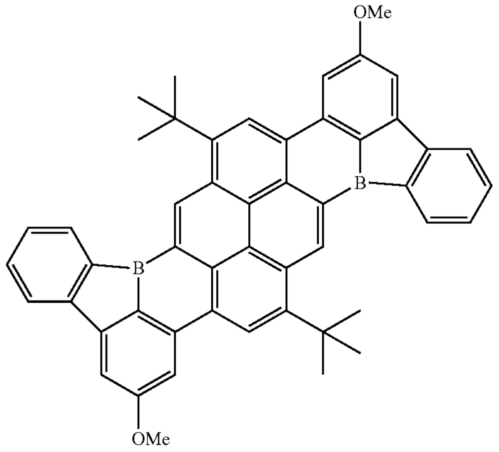
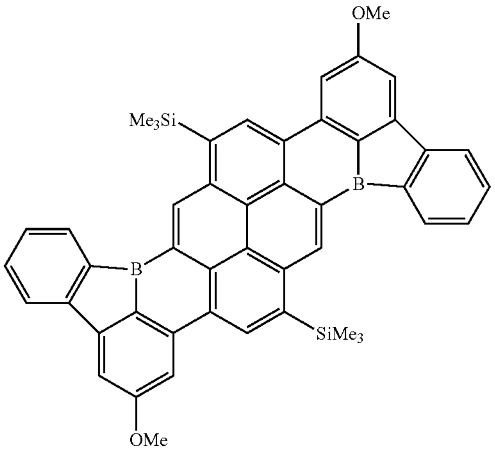
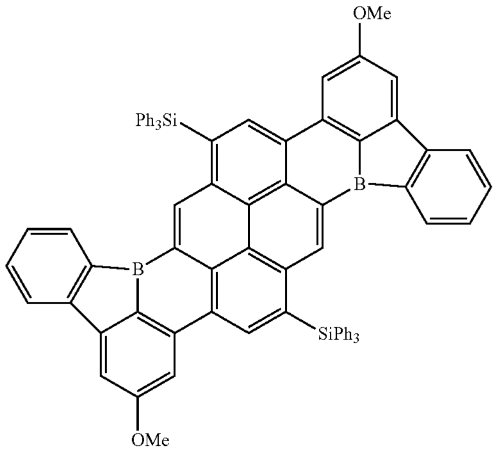
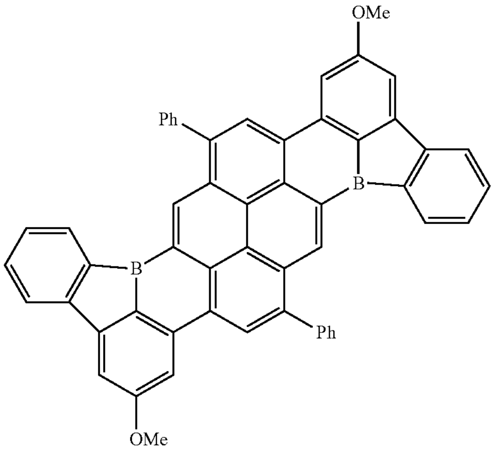
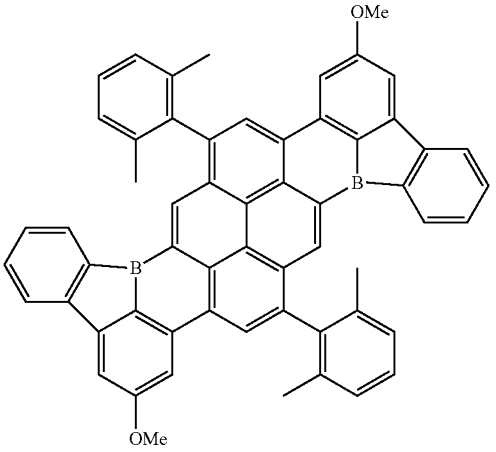

-continued
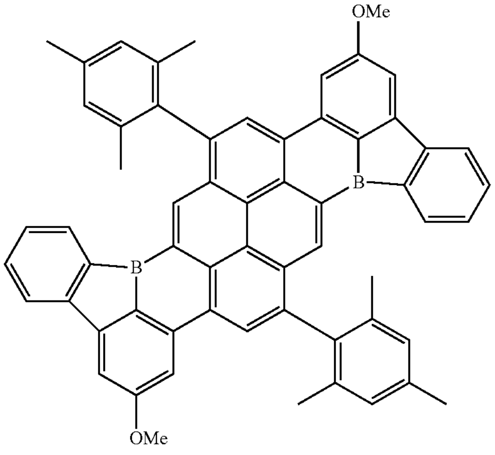
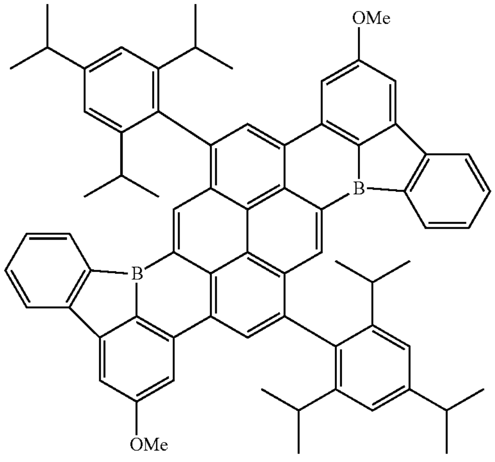
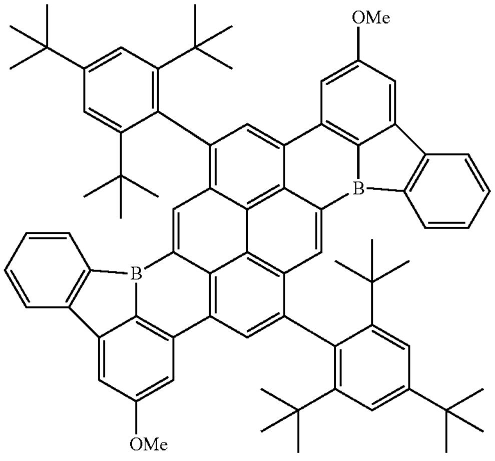
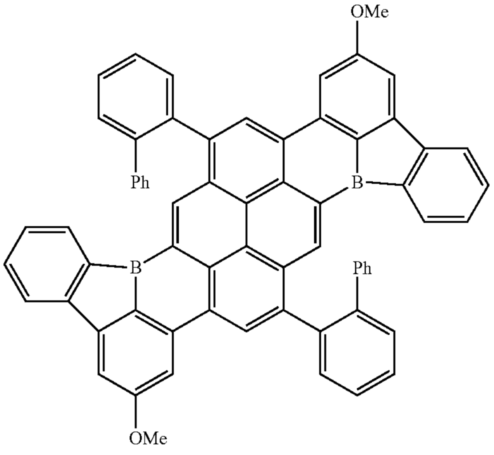
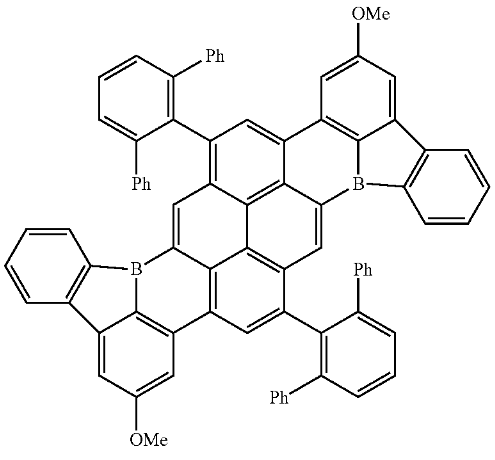
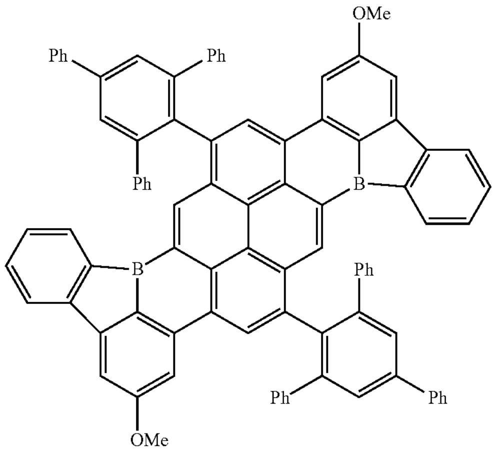

-continued
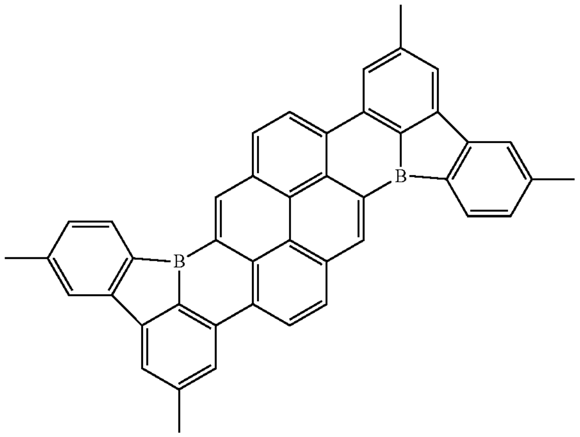
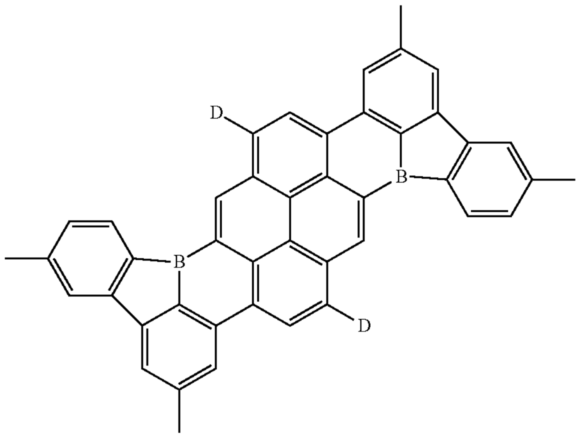
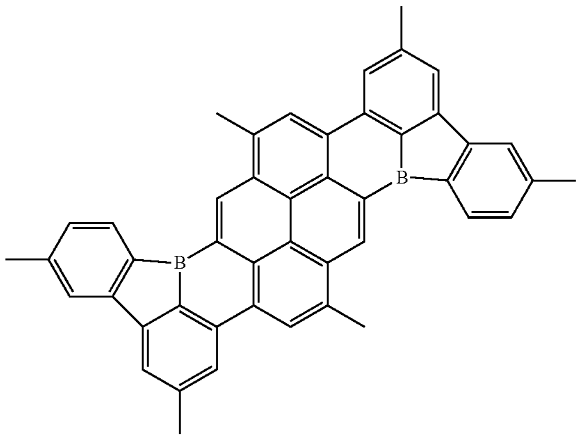
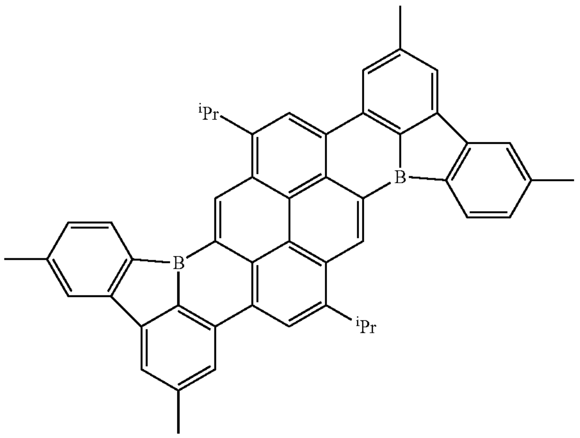
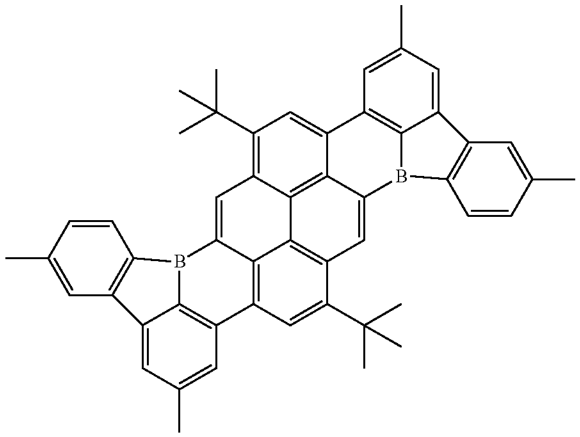
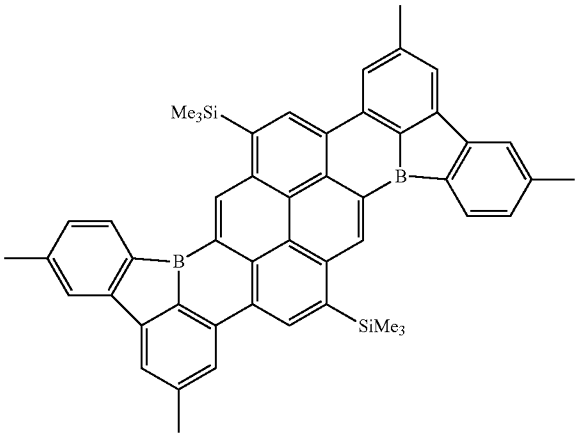

-continued
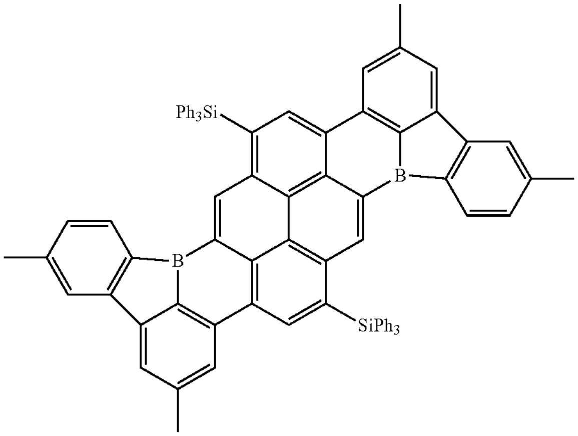
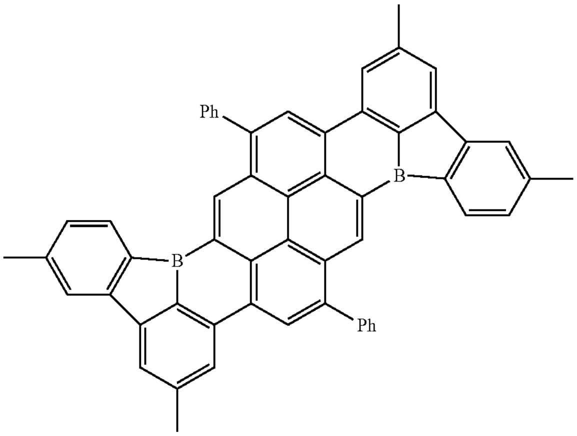
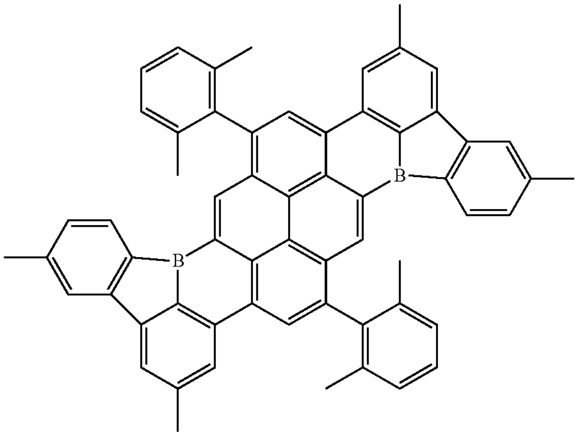
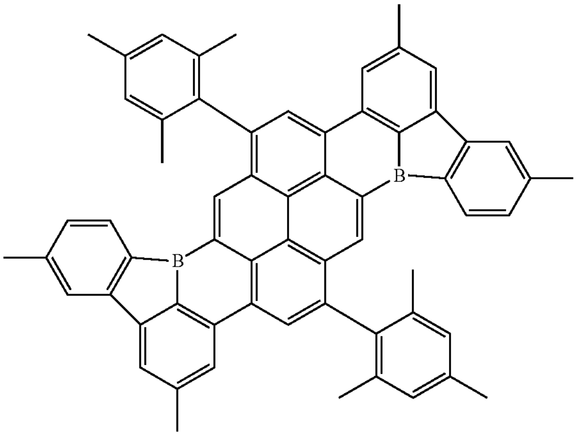
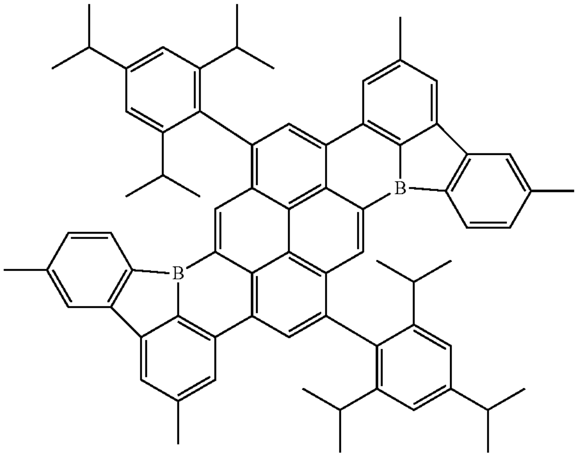

-continued
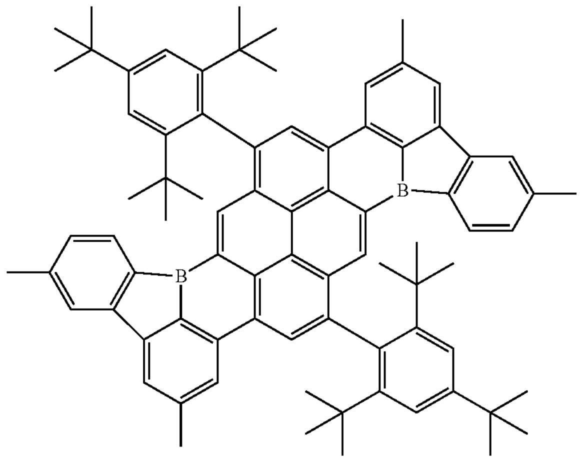
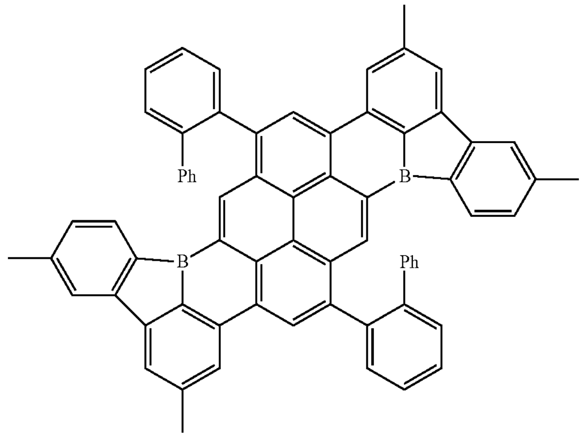
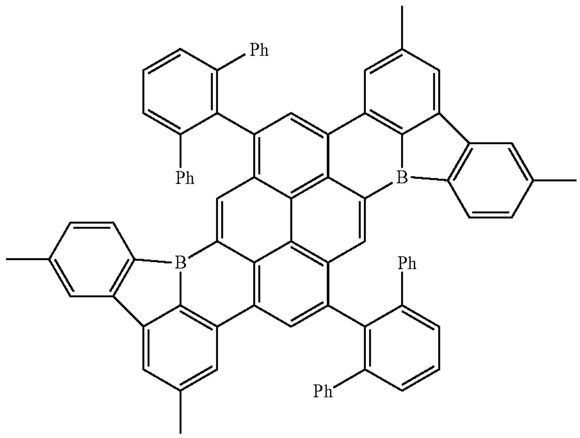
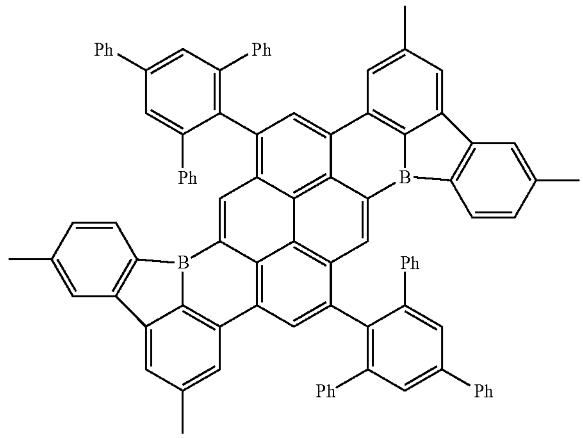
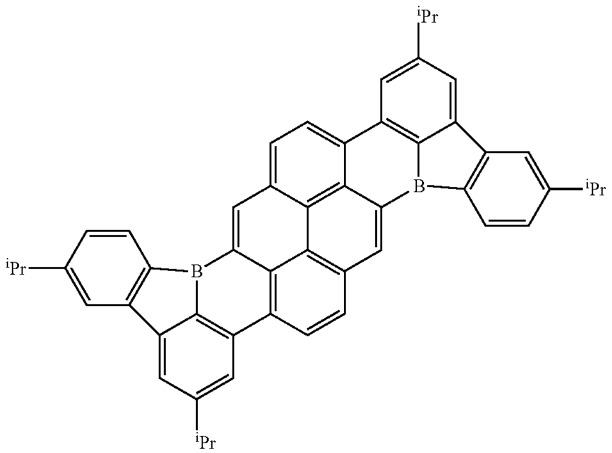

-continued
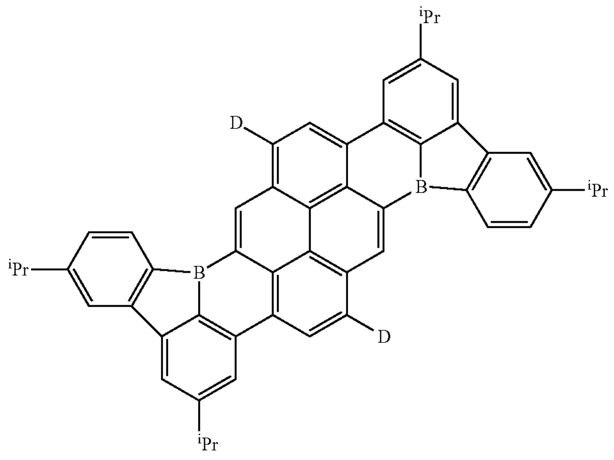
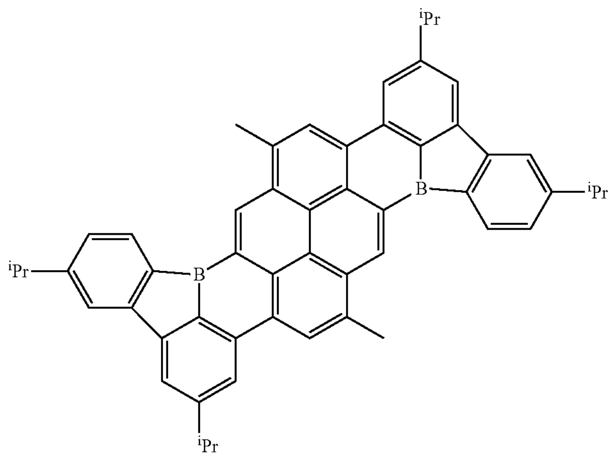
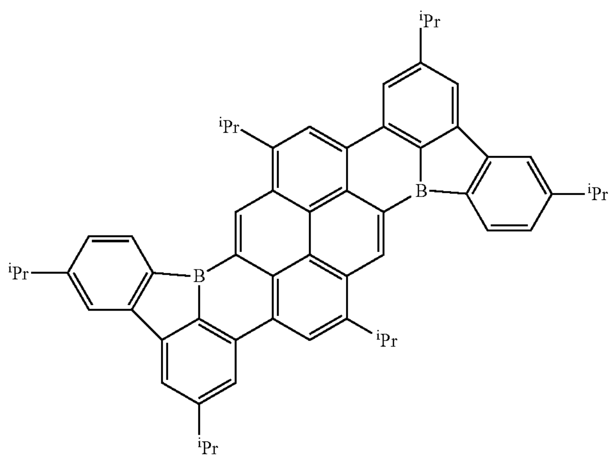

-continued
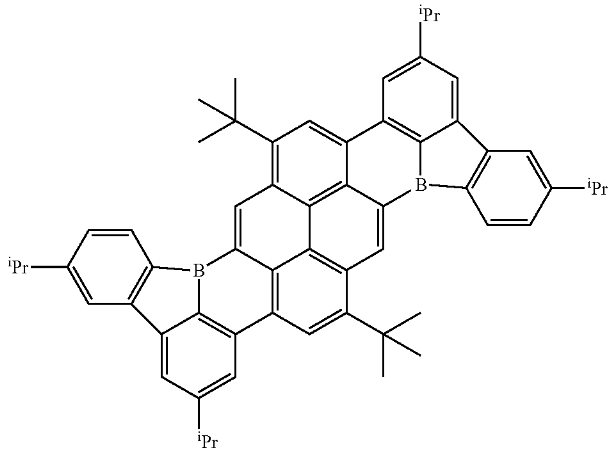
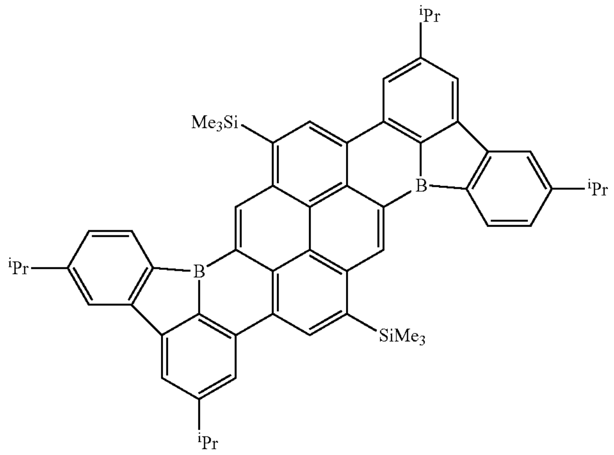
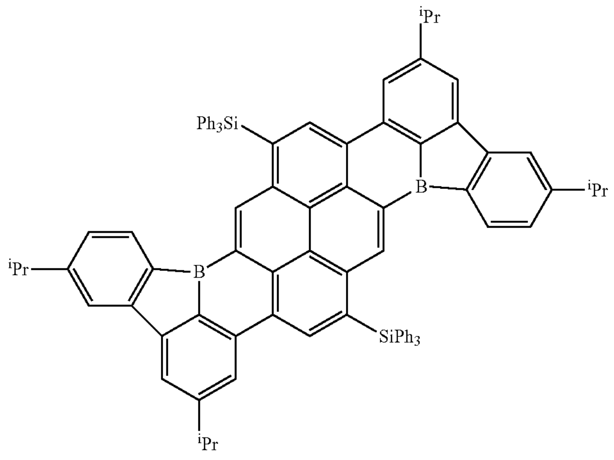

-continued
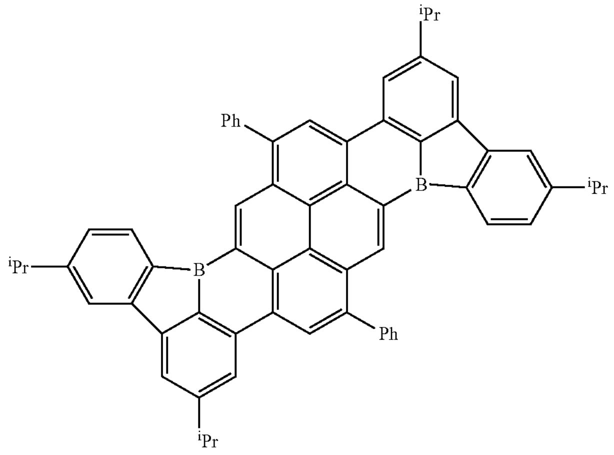
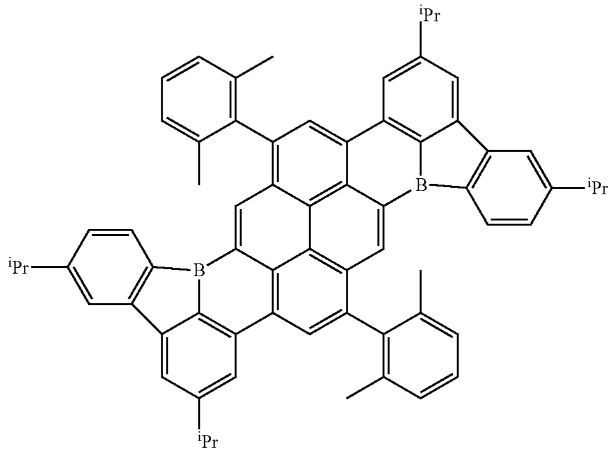
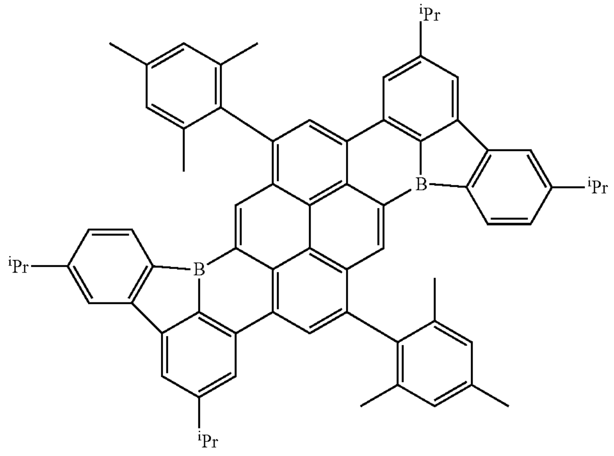

-continued
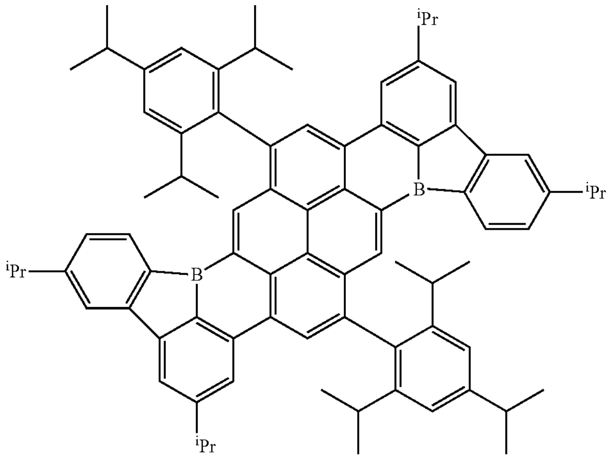
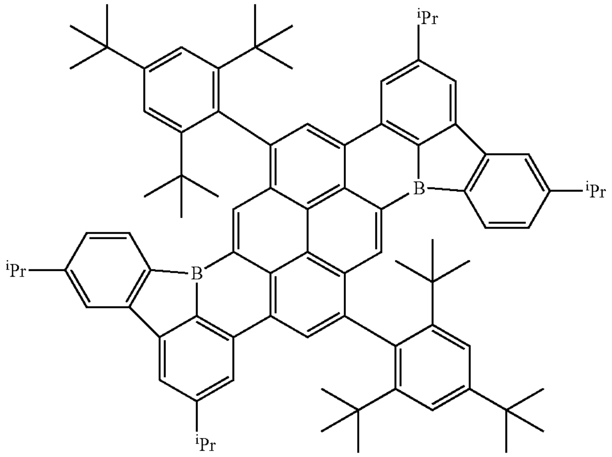
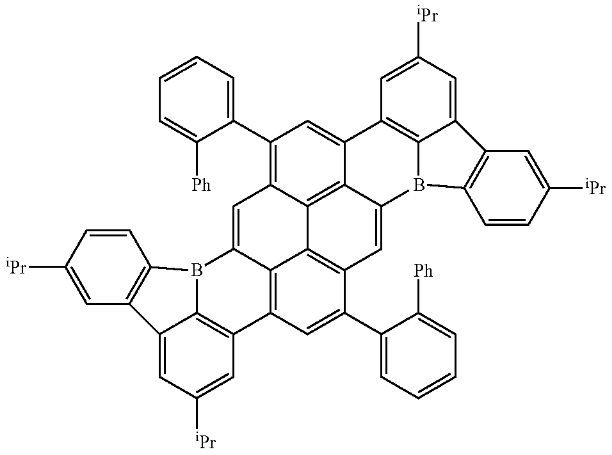

-continued
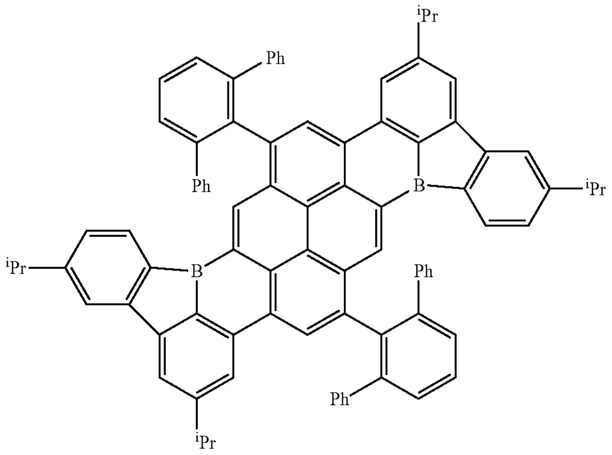
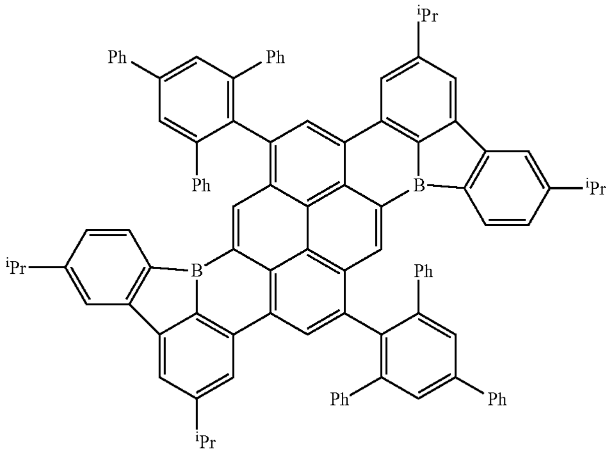
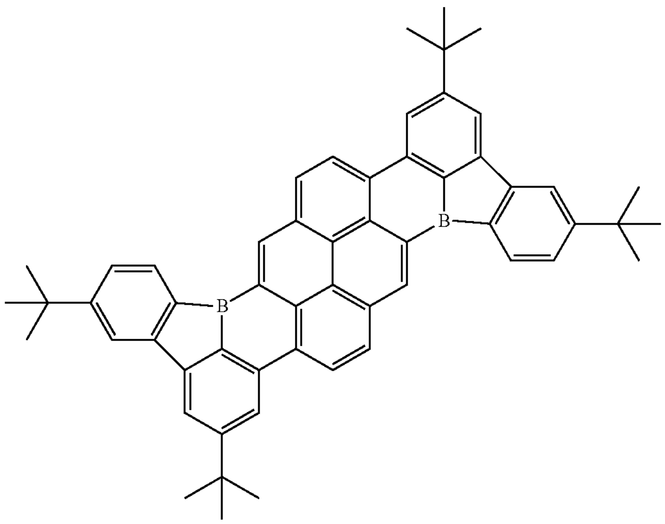

-continued
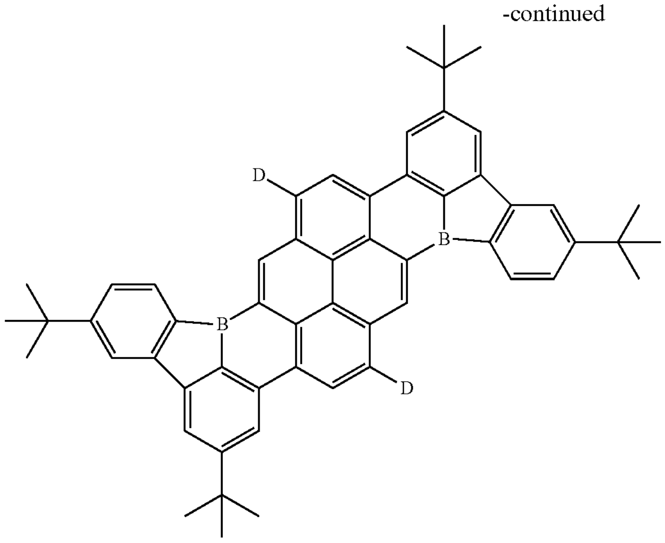
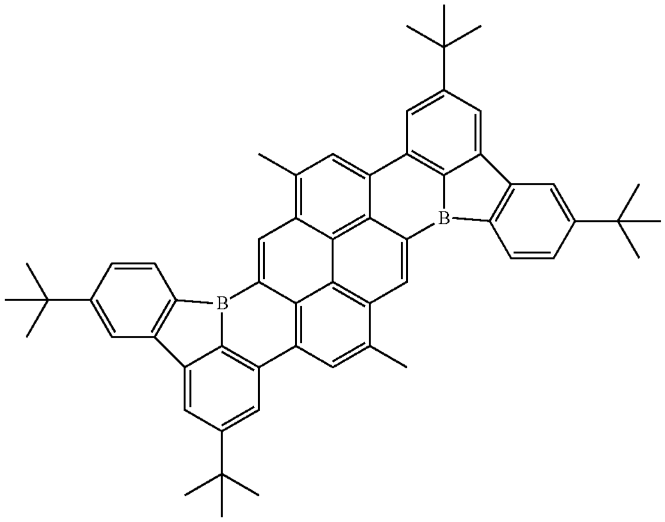 [SMILES: Cc1cc2c3c(cc4c(C)cc5c6c(cc1c3c46)B1c3ccc(C(C)(C)C)cc3-c3cc(C(C)(C)C)cc-5c31)B1c3ccc(C(C)(C)C)cc3-c3cc(C(C)(C)C)cc-2c31]
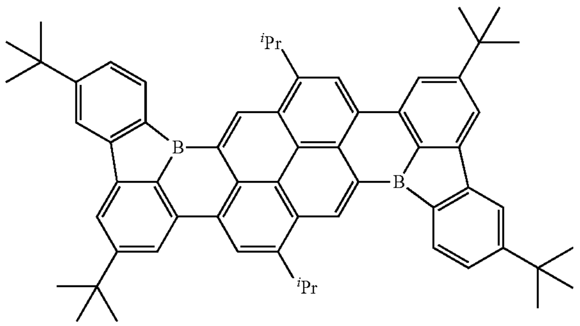
-continued
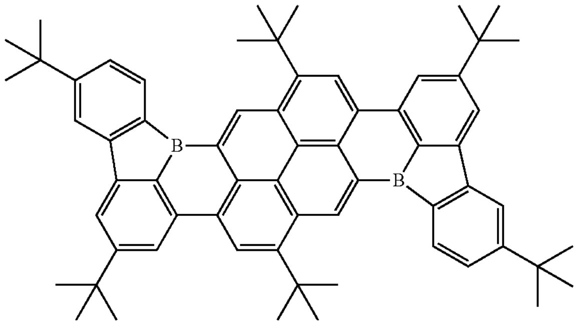

-continued
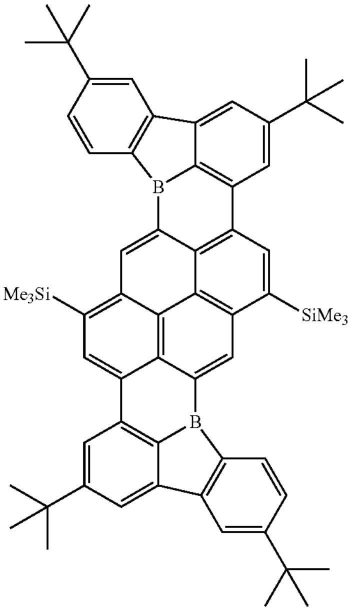
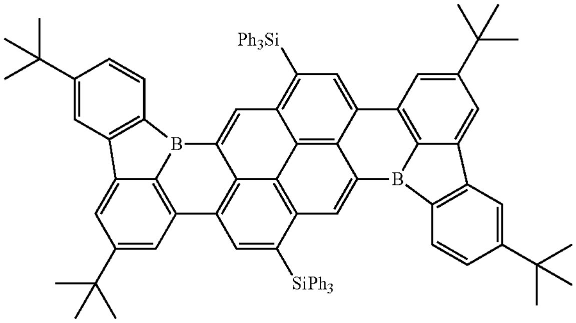
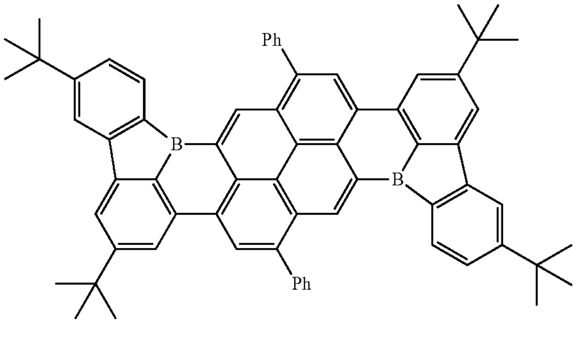
-continued
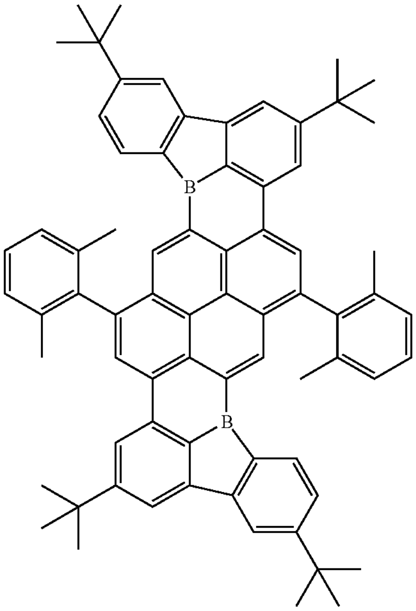
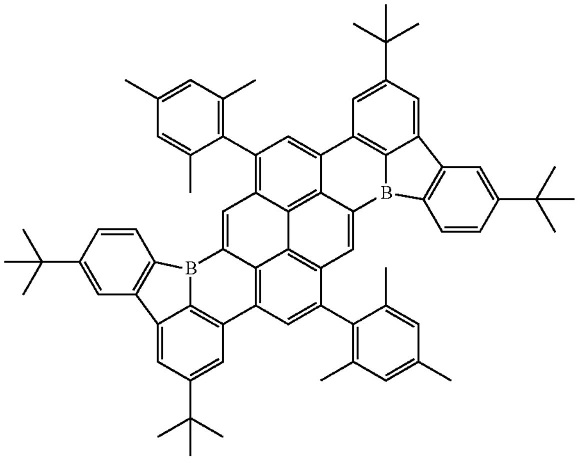
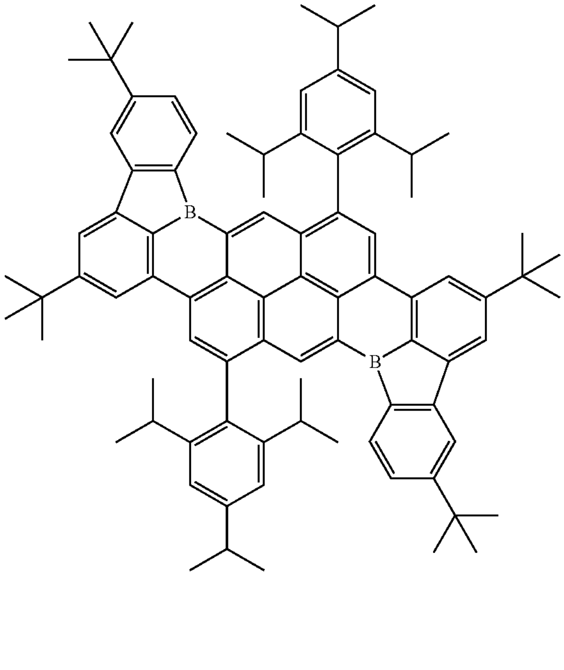

-continued
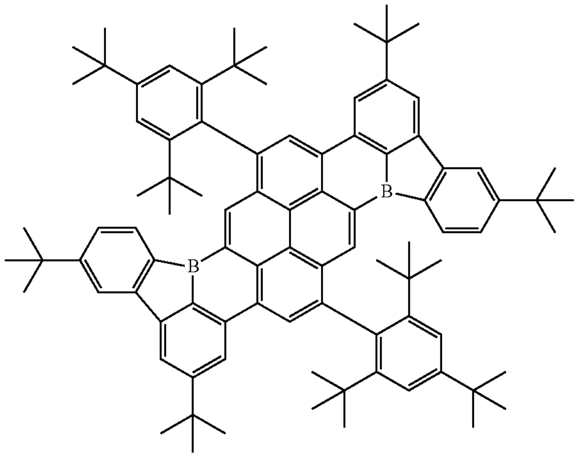
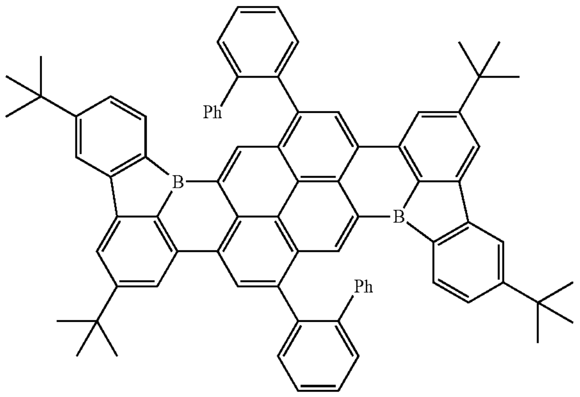
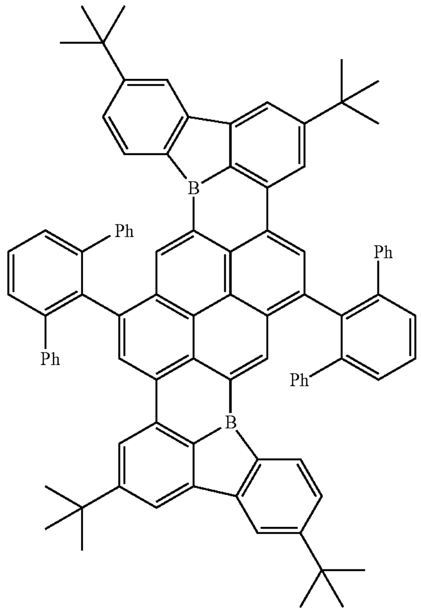
-continued
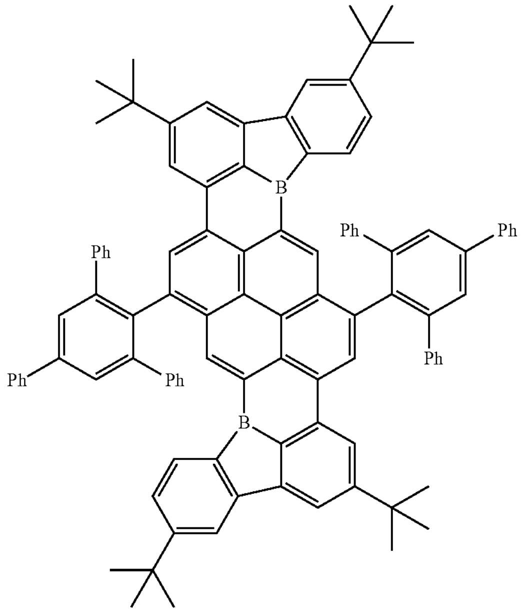
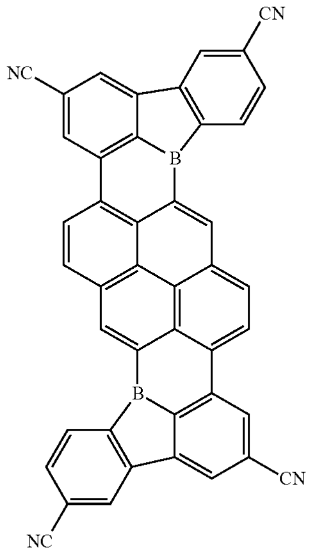
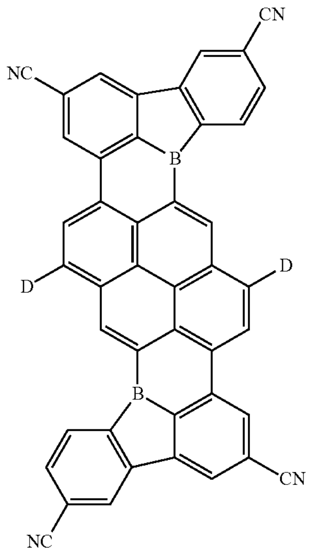

-continued
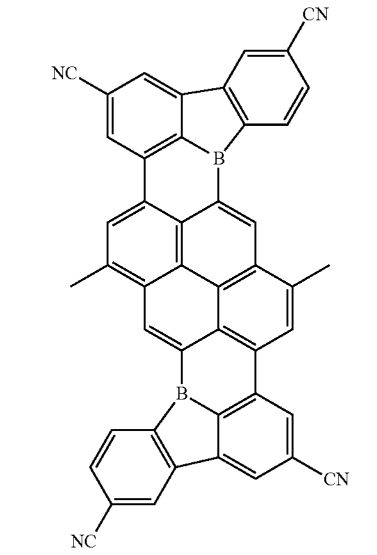
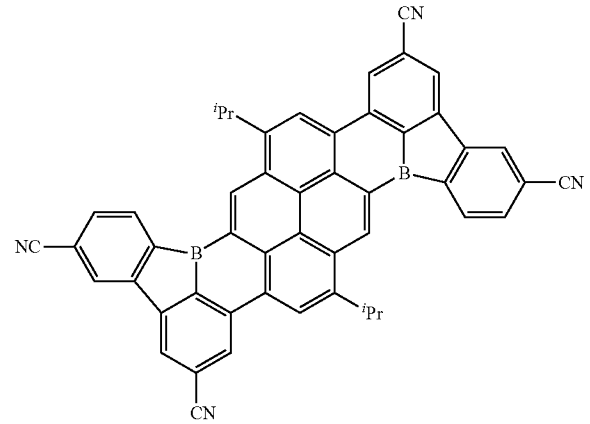
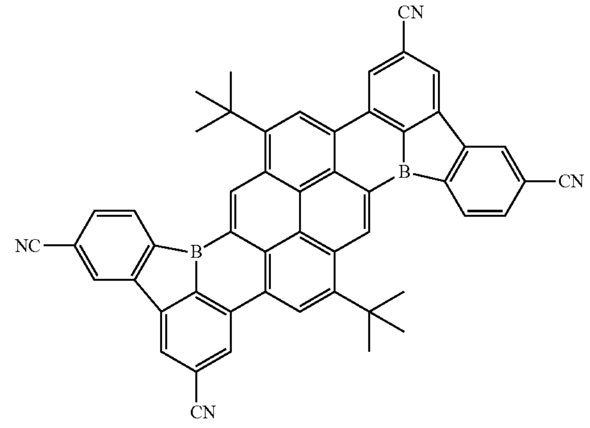
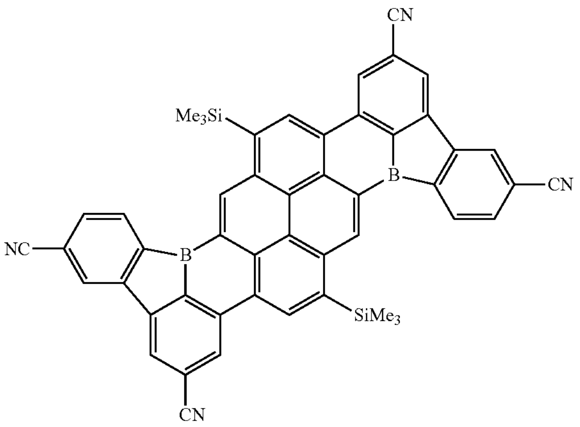
-continued
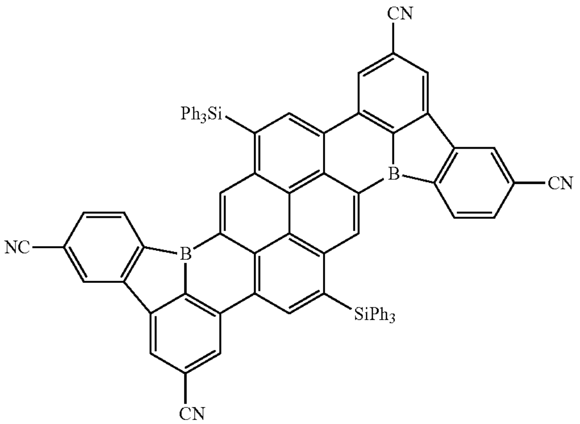
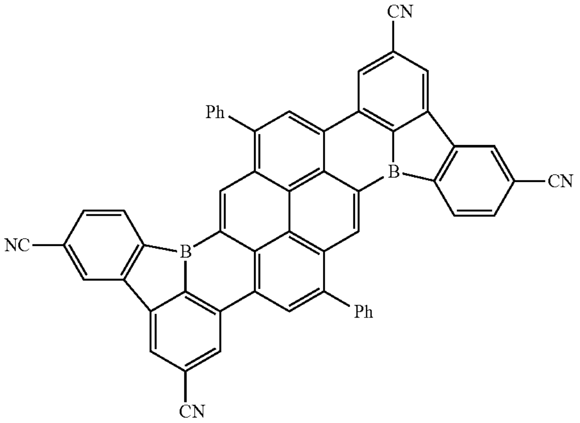
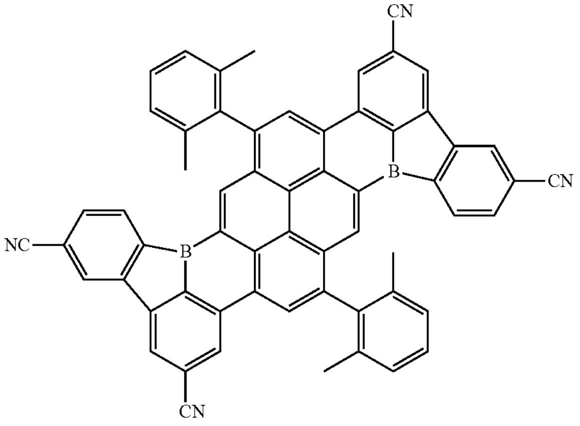

-continued
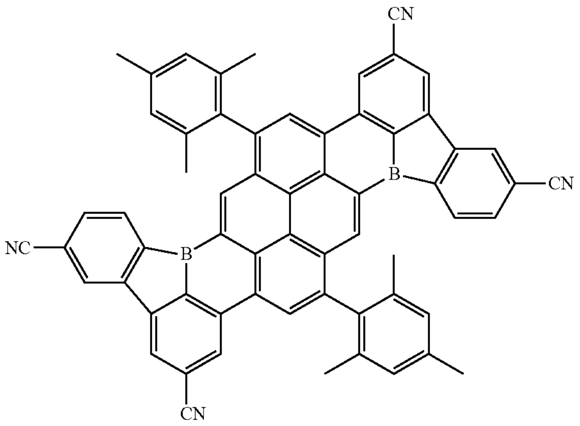
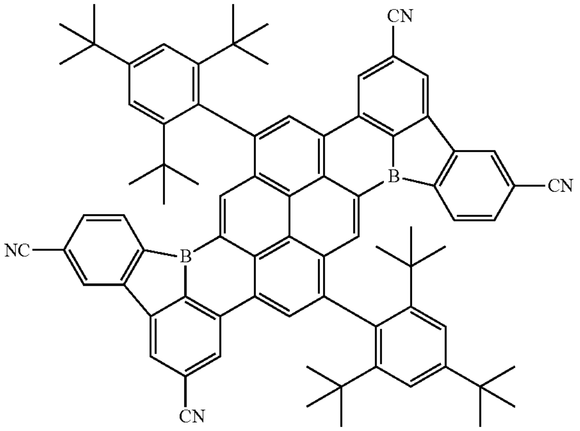
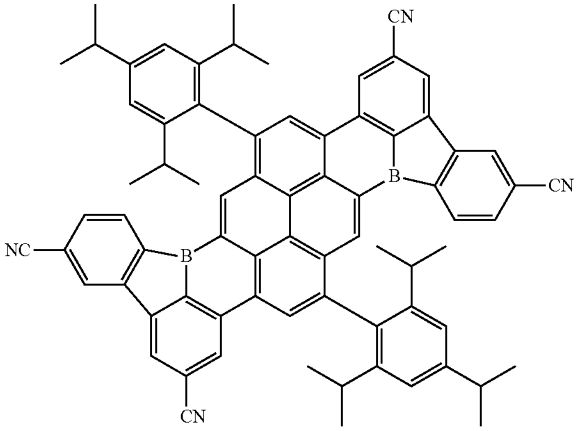
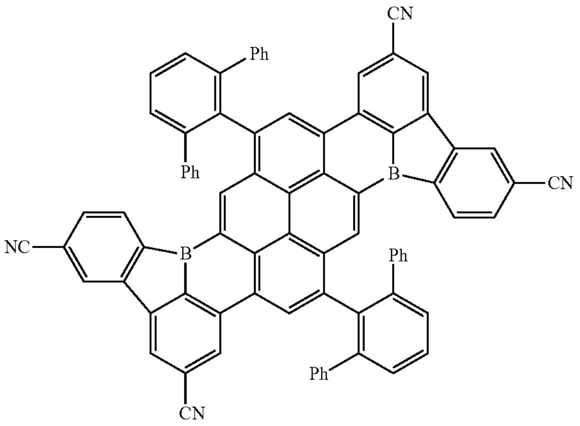
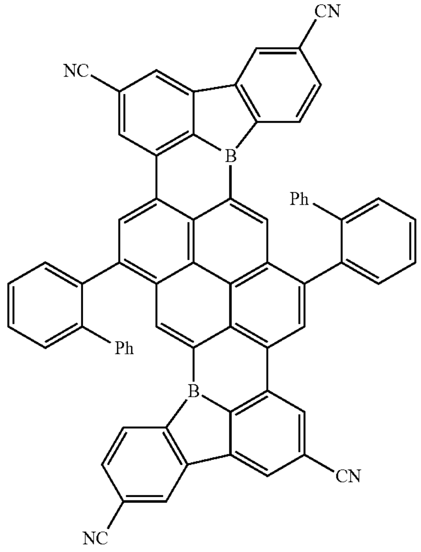
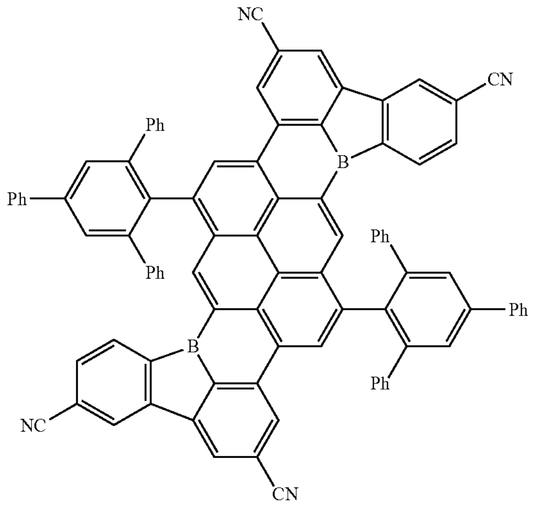
-continued -continued
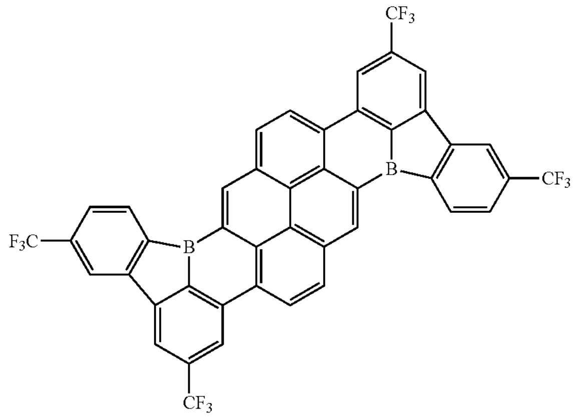
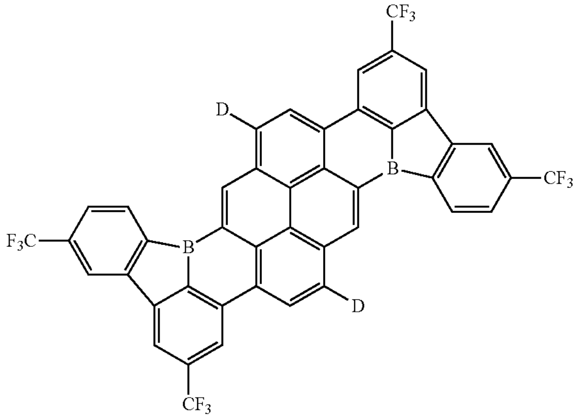
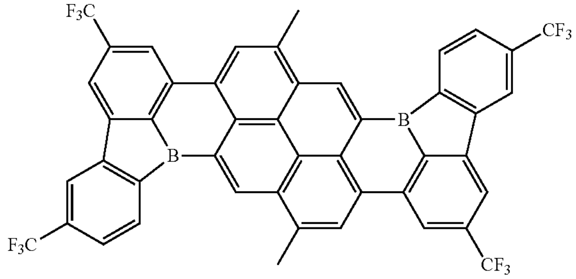
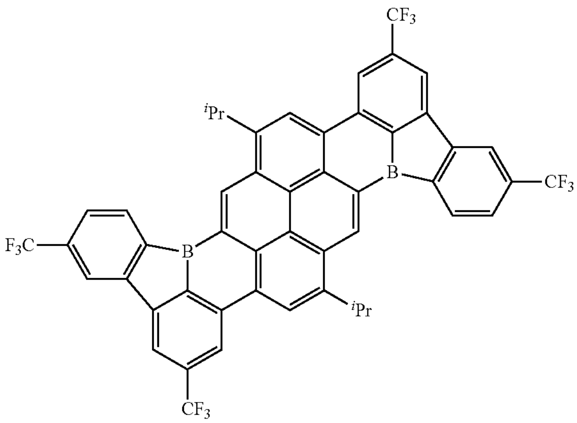
-continued
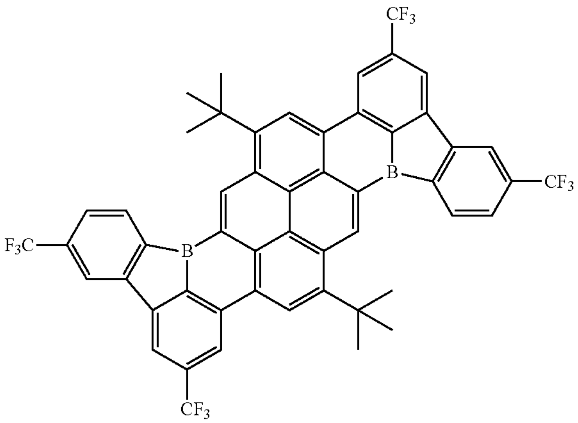
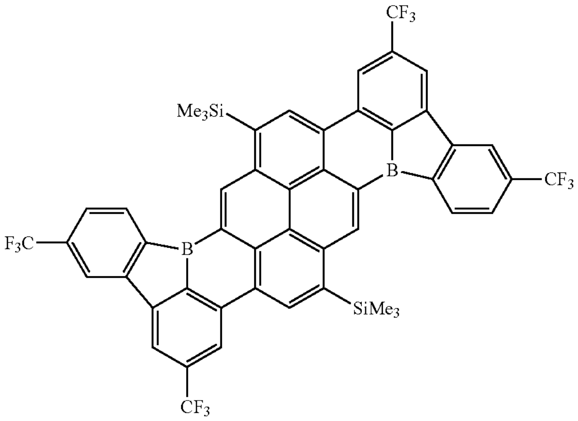
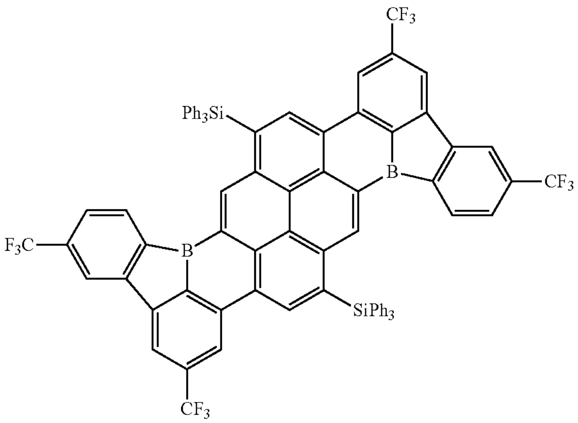
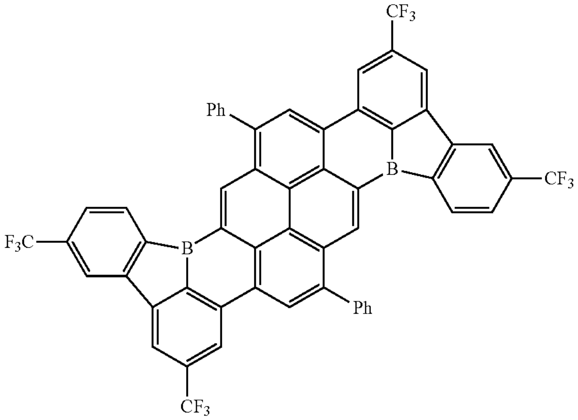

-continued
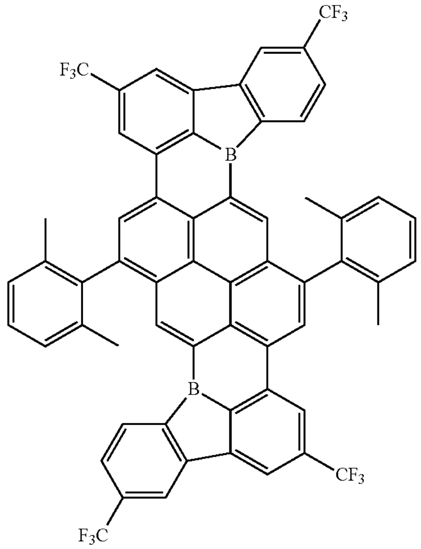
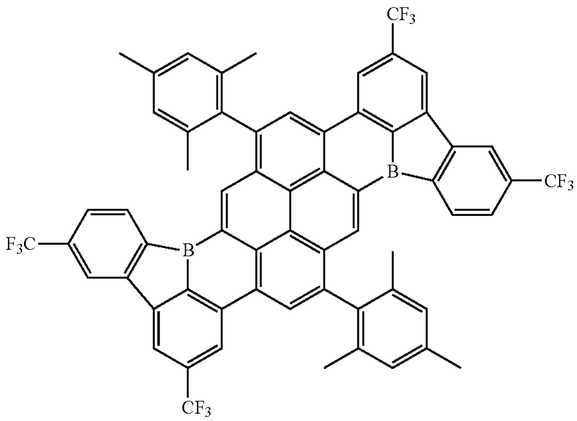
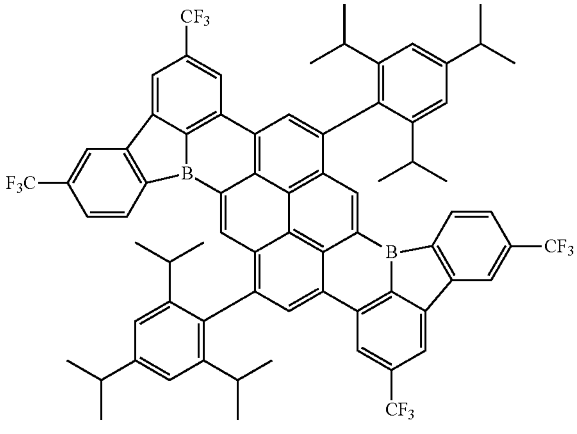
-continued
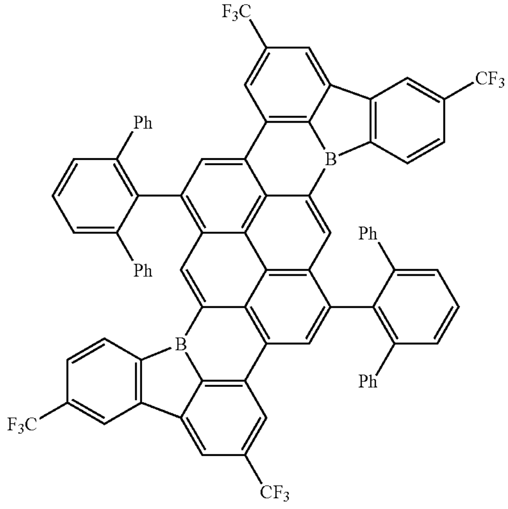
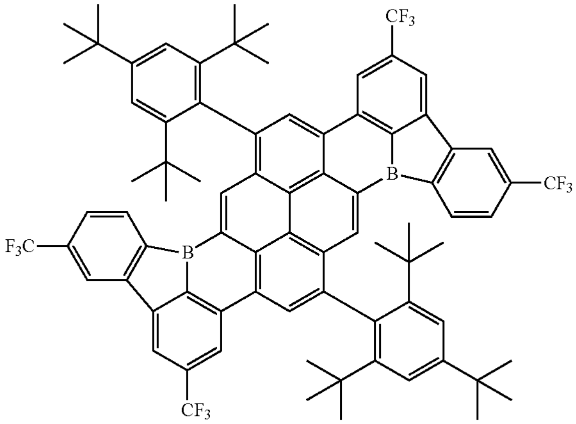
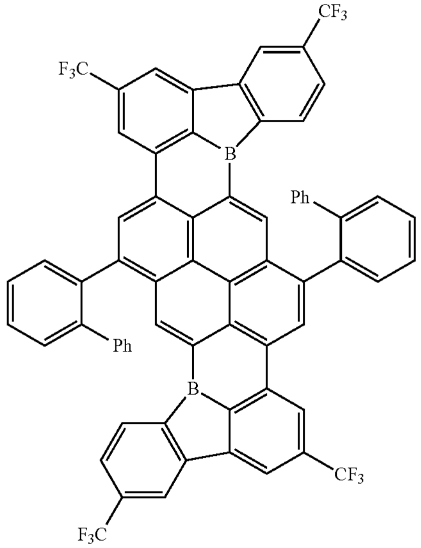

-continued
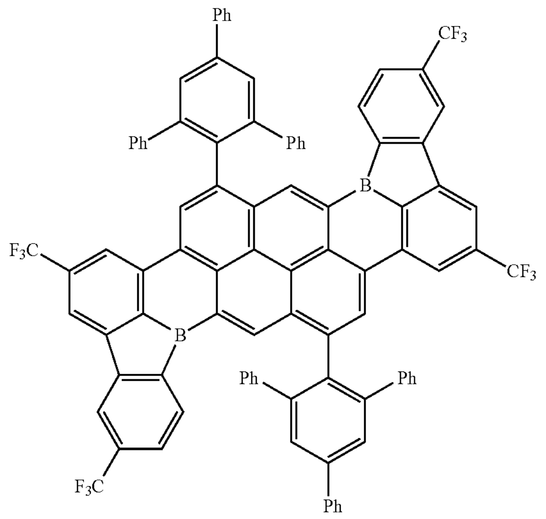
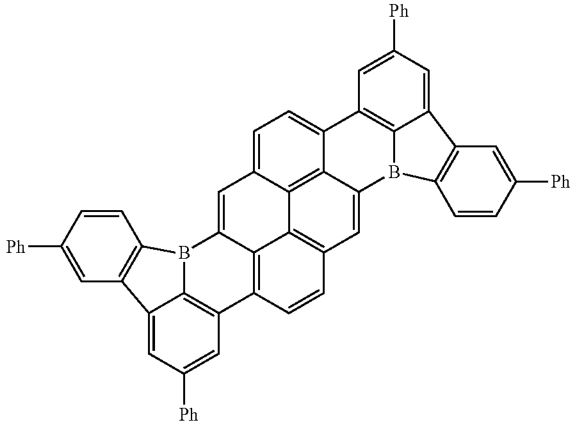
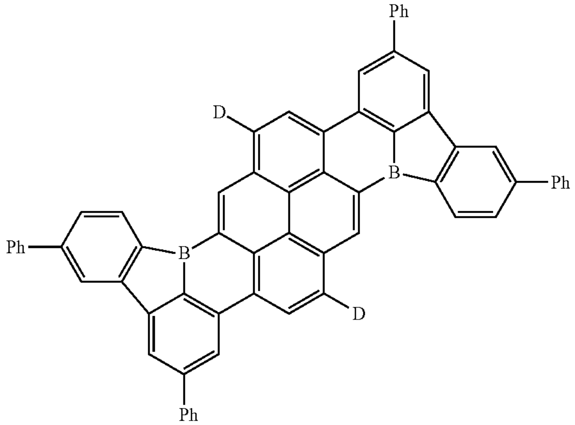
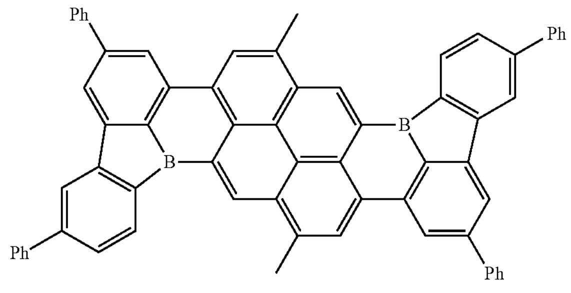
-continued
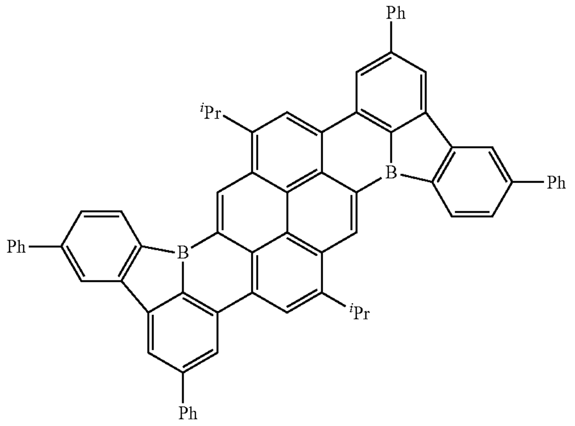
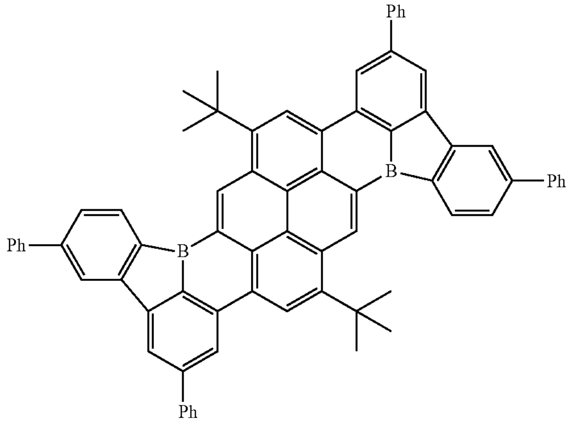
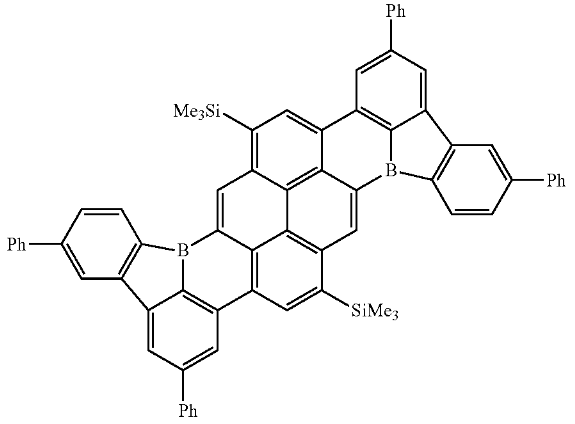
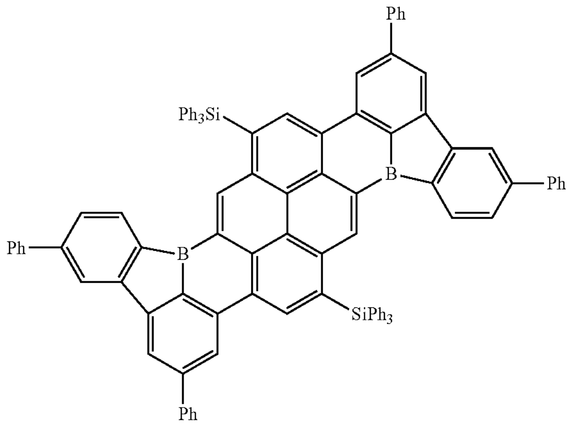

-continued
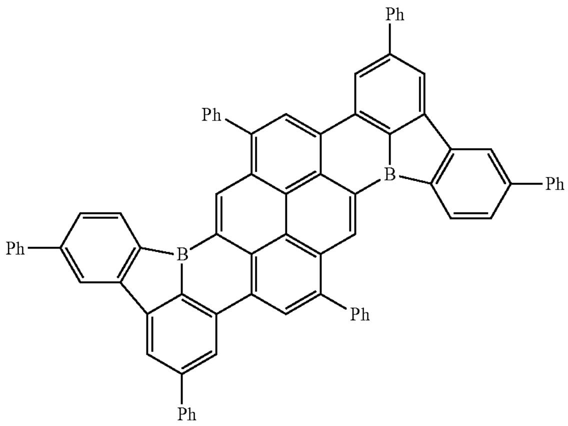
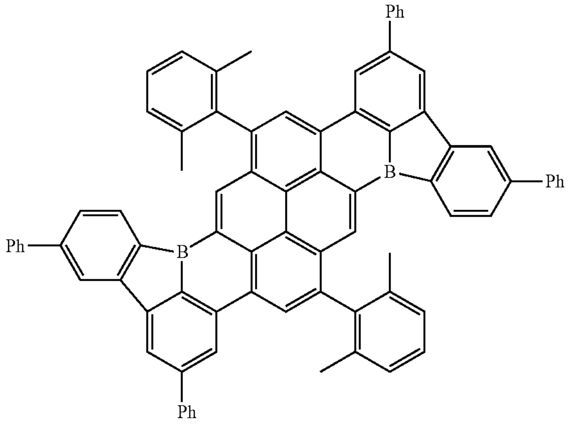
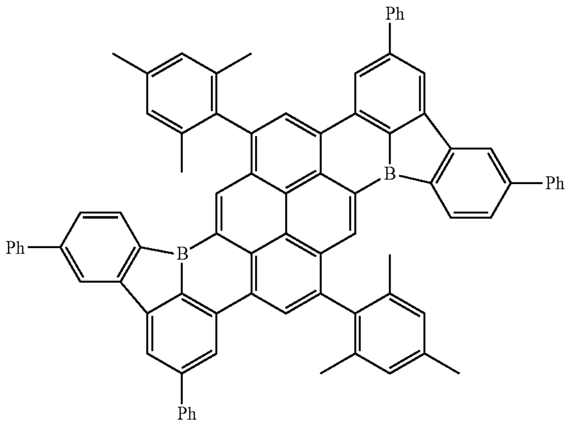
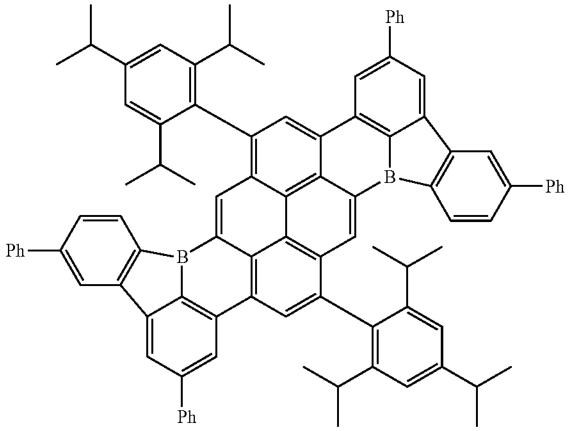
-continued
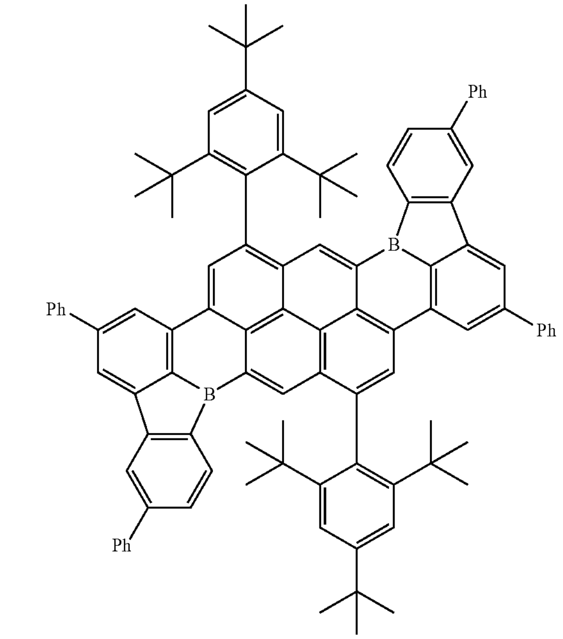
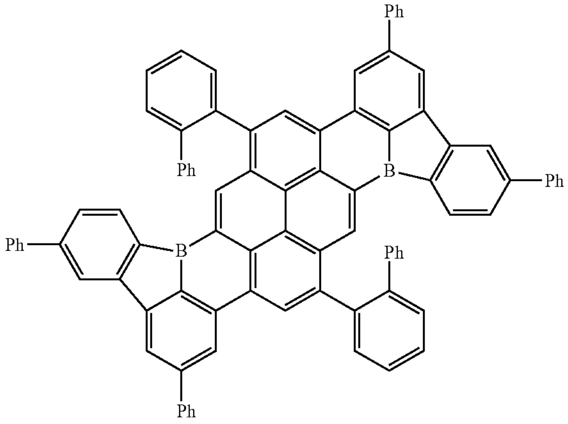
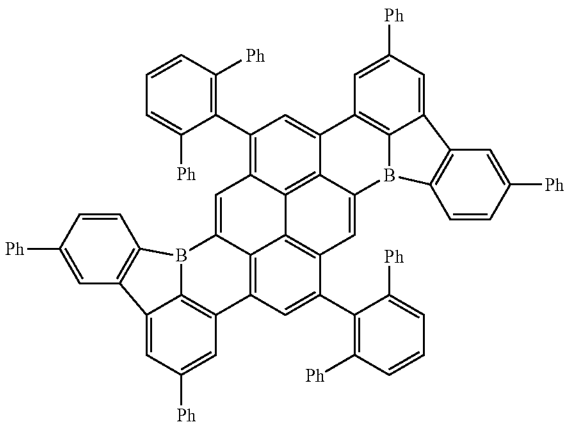

-continued
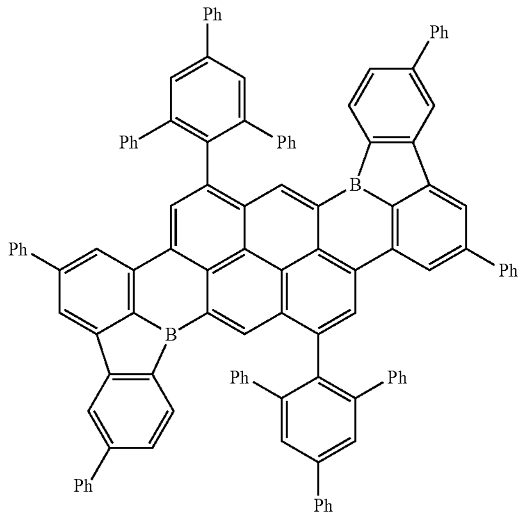
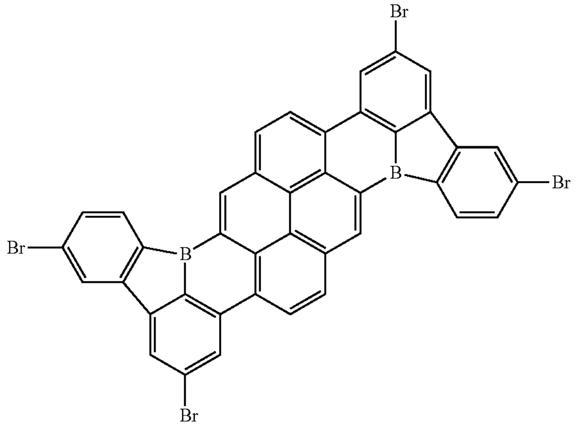
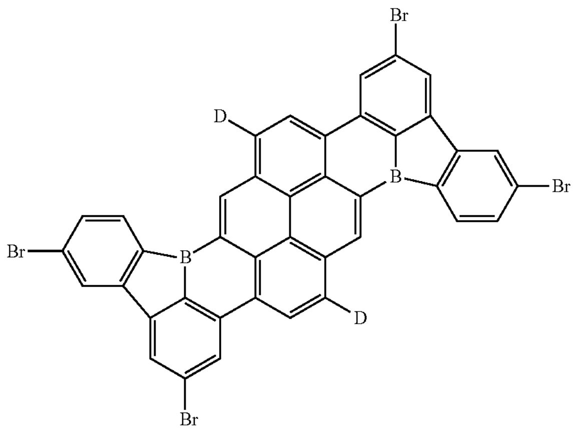
-continued
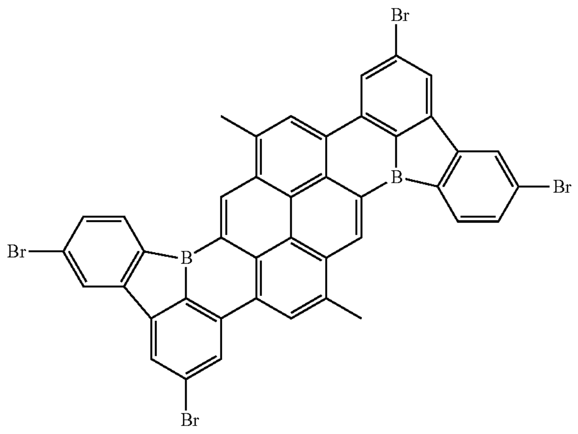
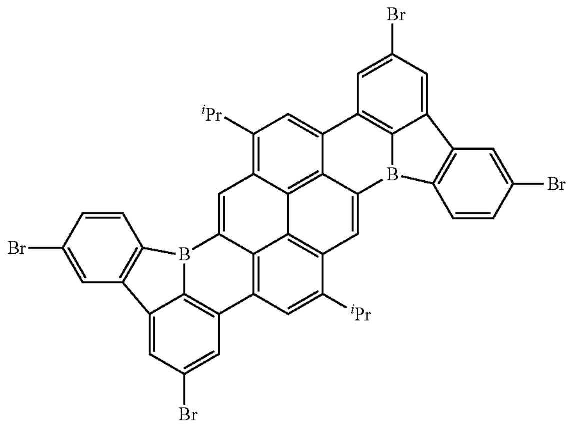
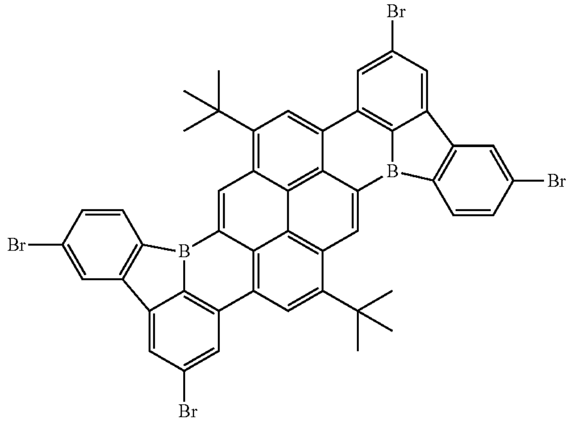
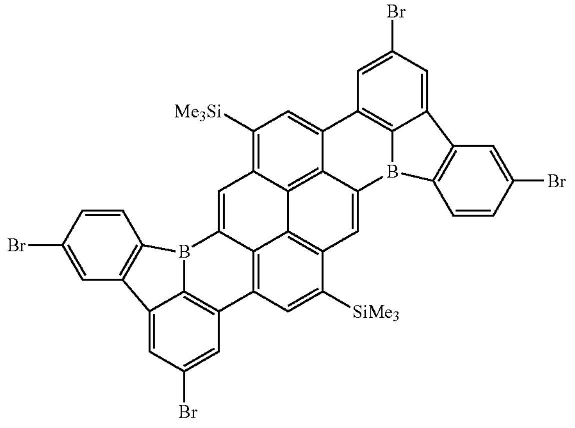

-continued
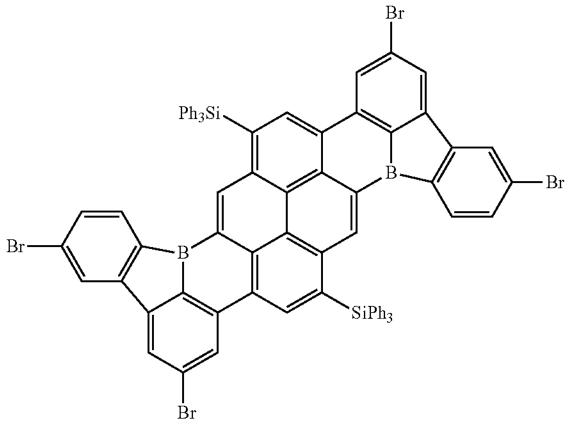
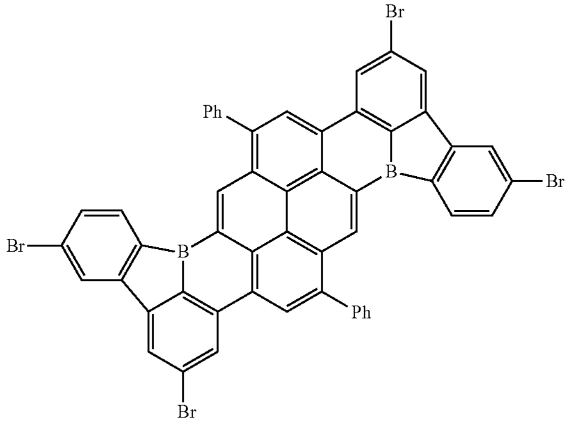
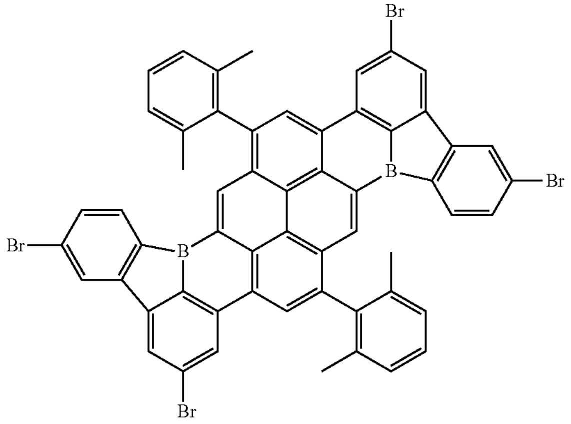
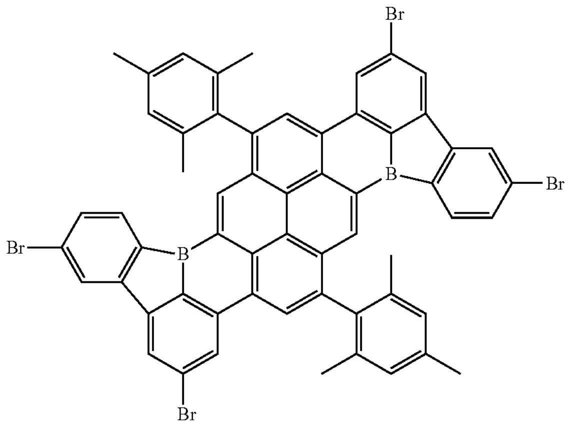
-continued
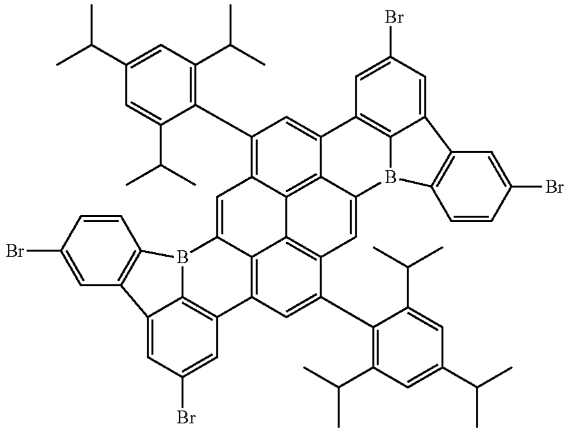
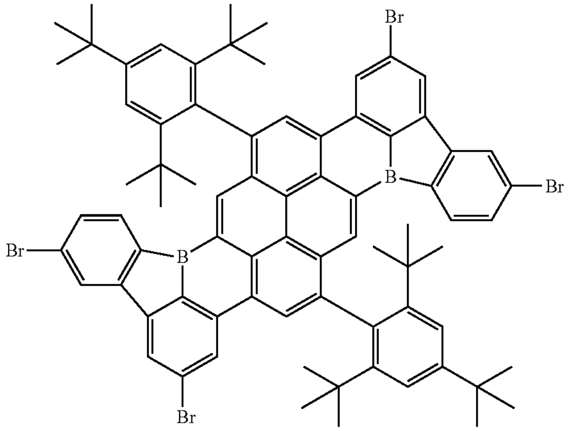
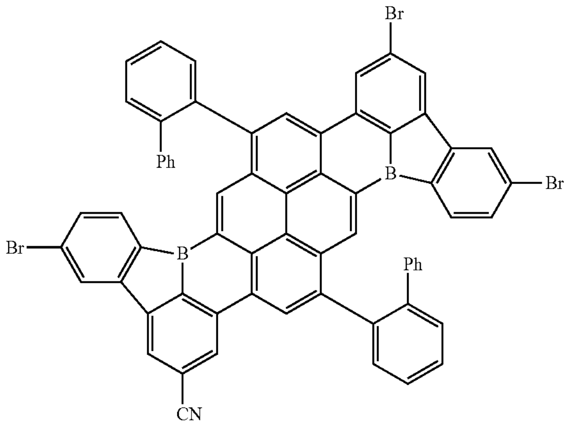
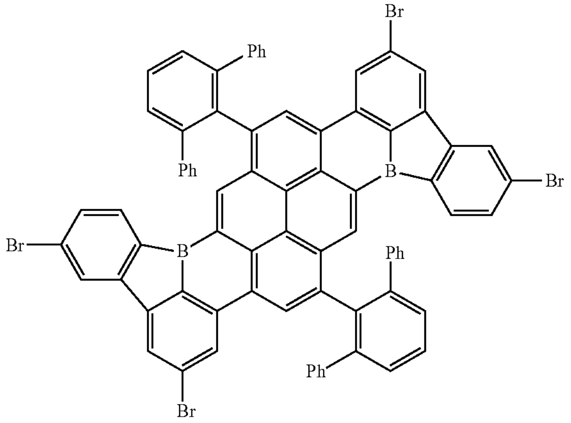

-continued
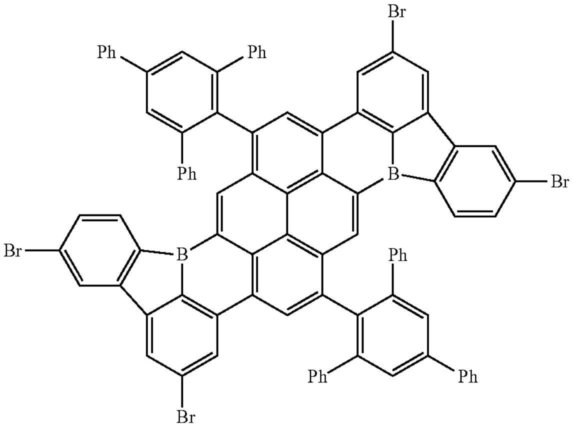
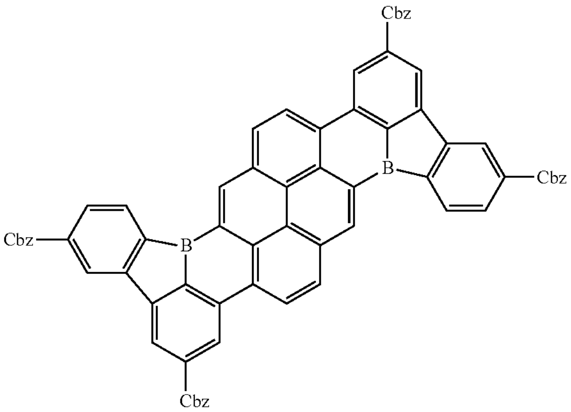
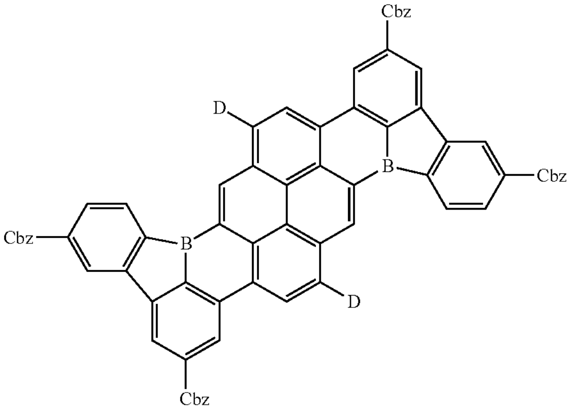
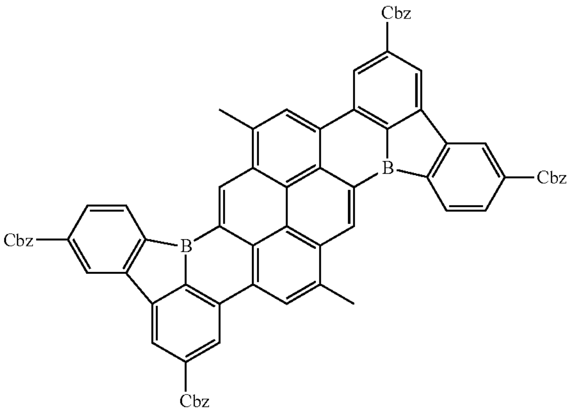
-continued
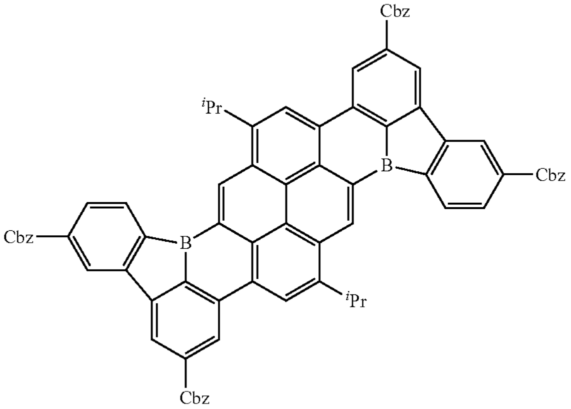
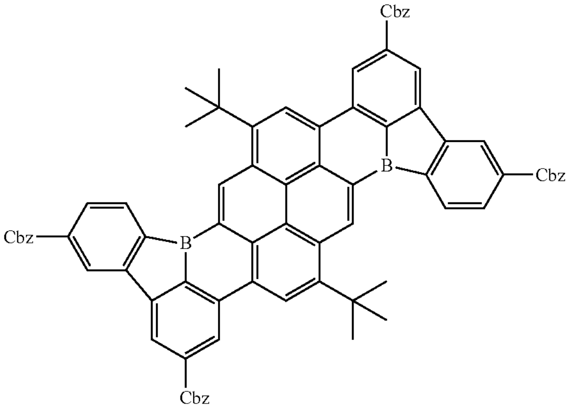
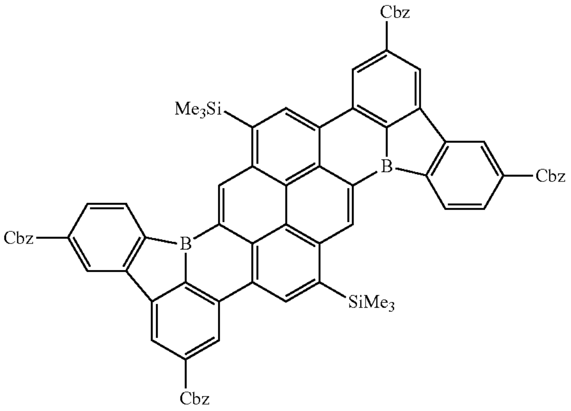
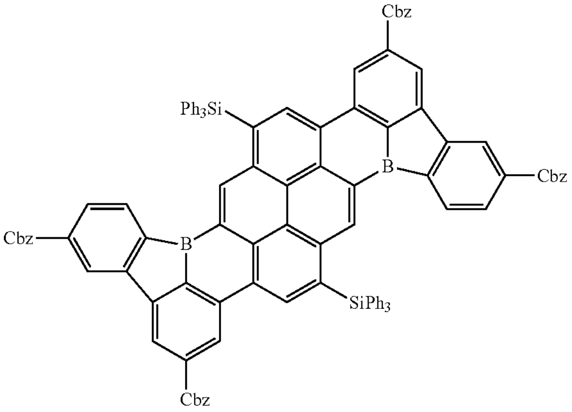

-continued
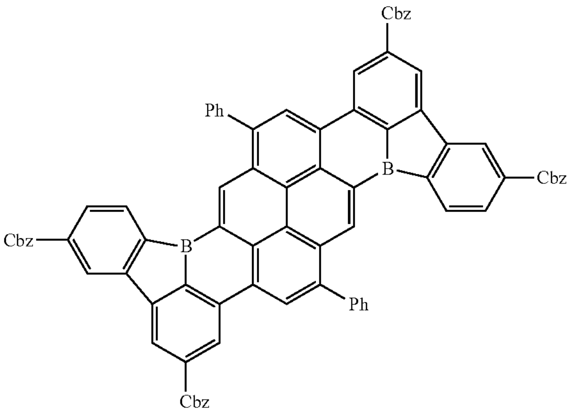
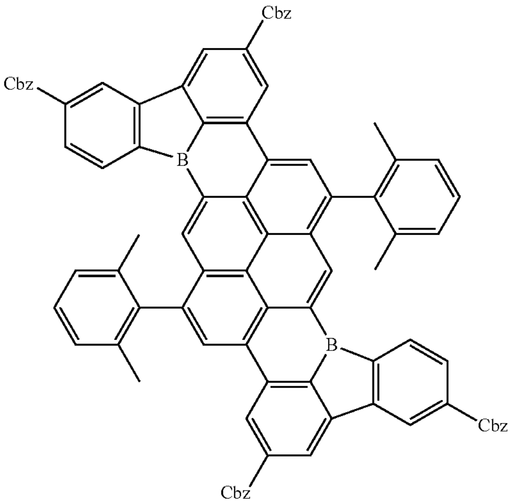
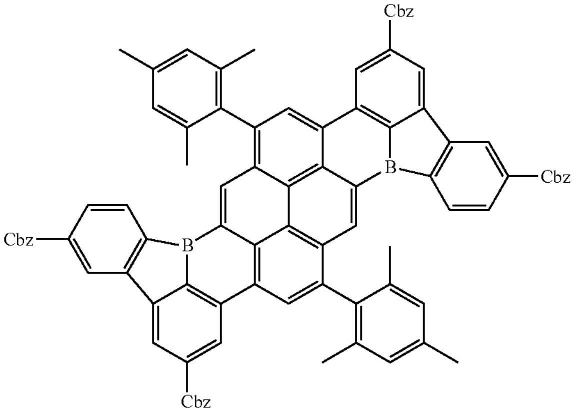
-continued
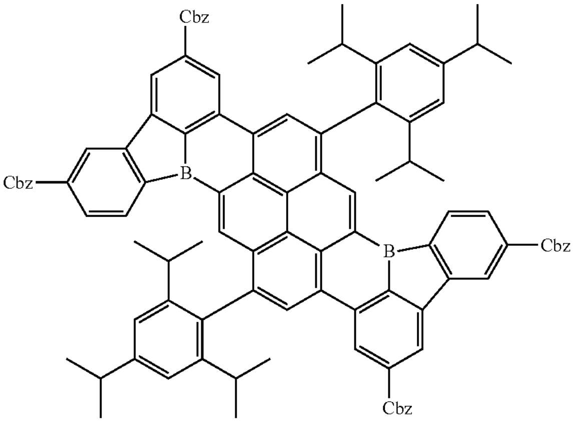
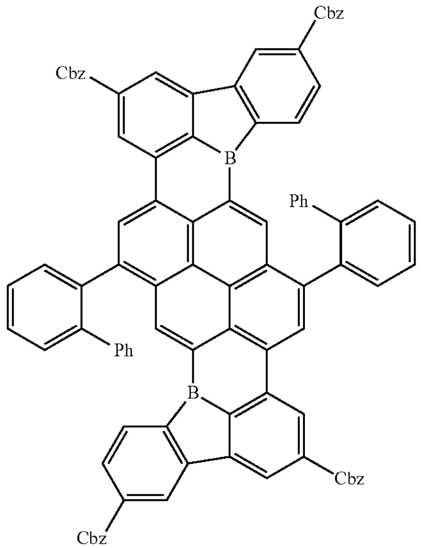
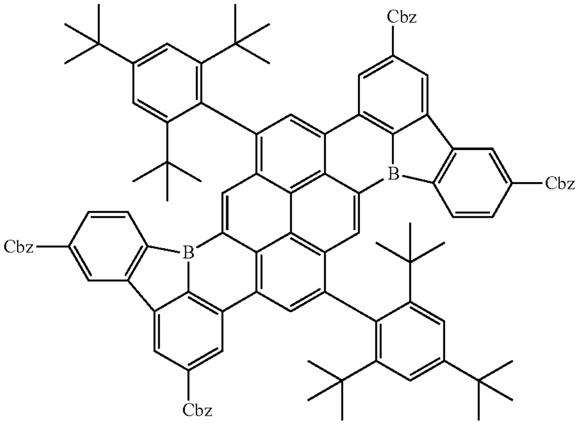

-continued
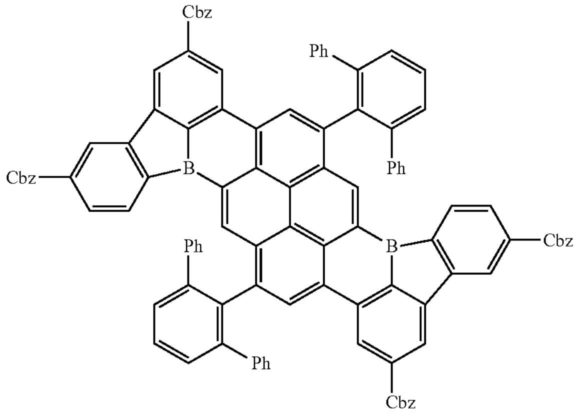
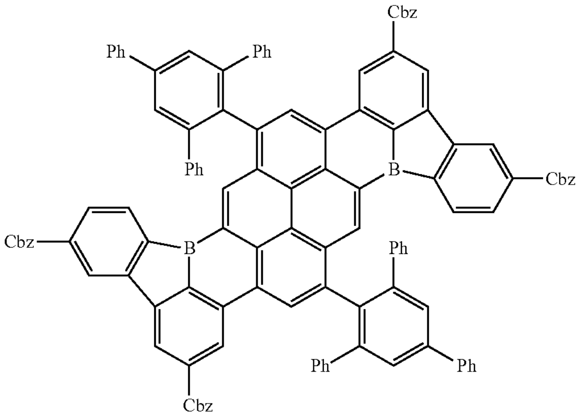
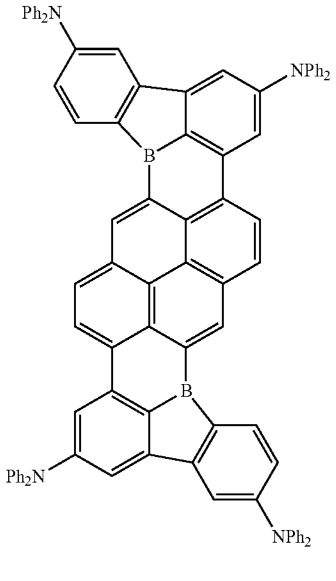
-continued
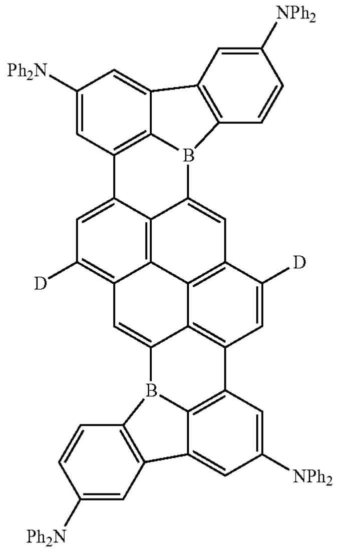
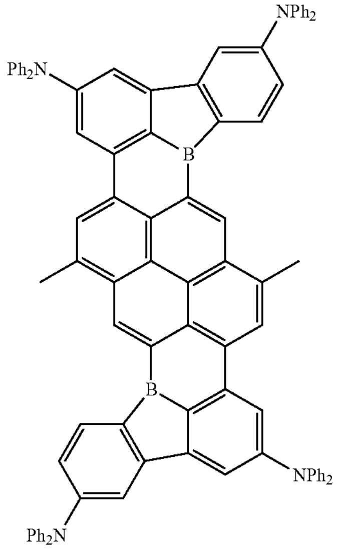
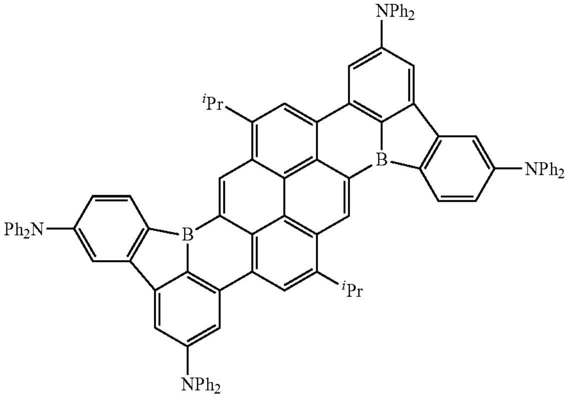

-continued
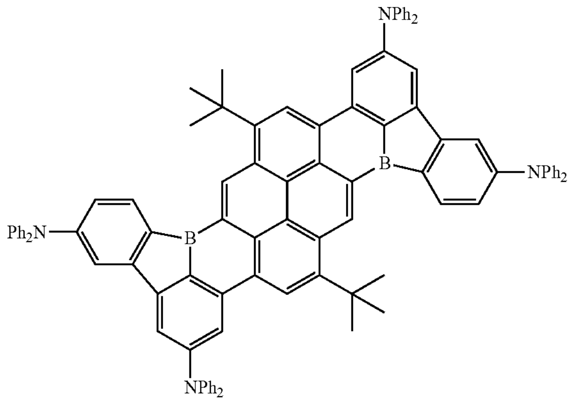
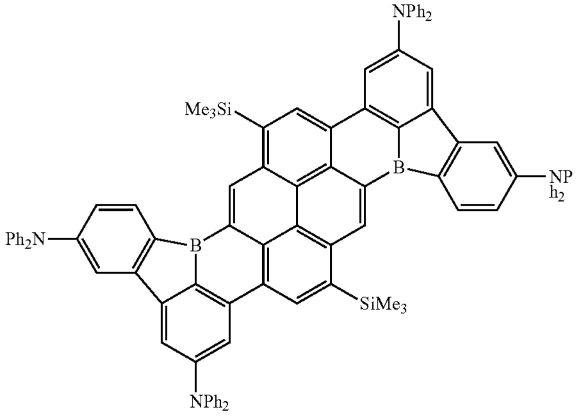
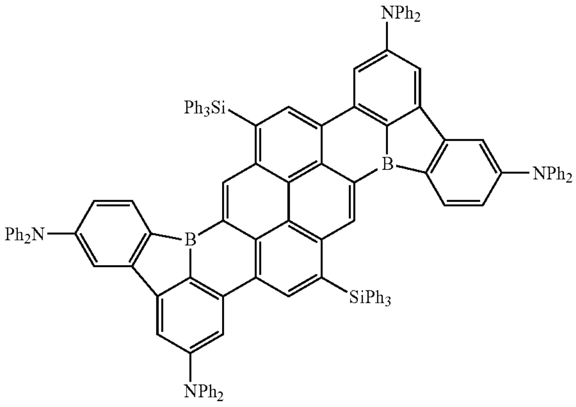
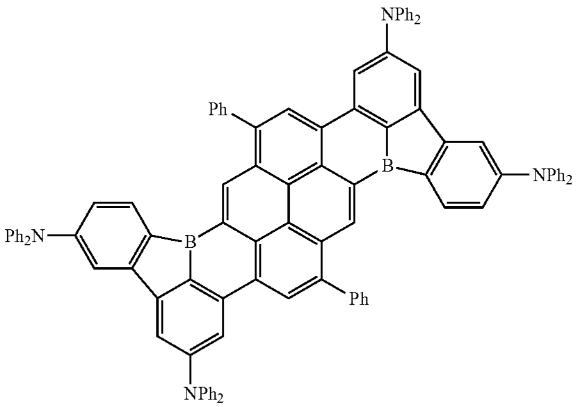
-continued
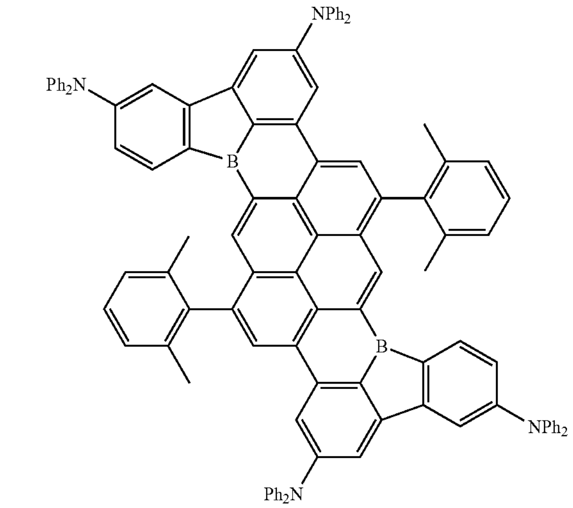
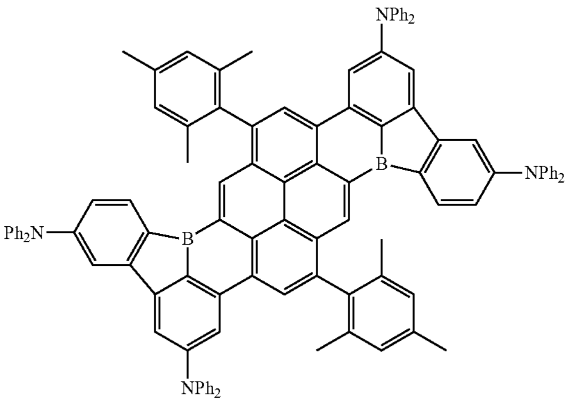
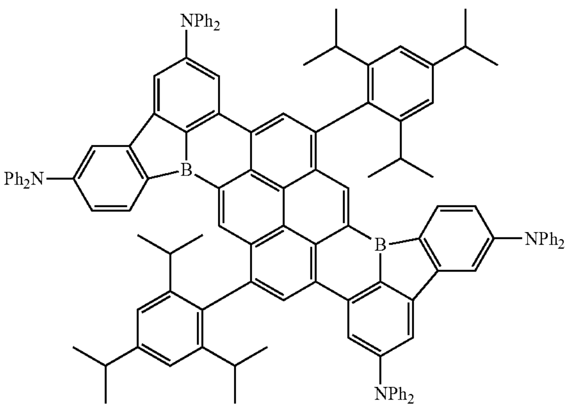

-continued
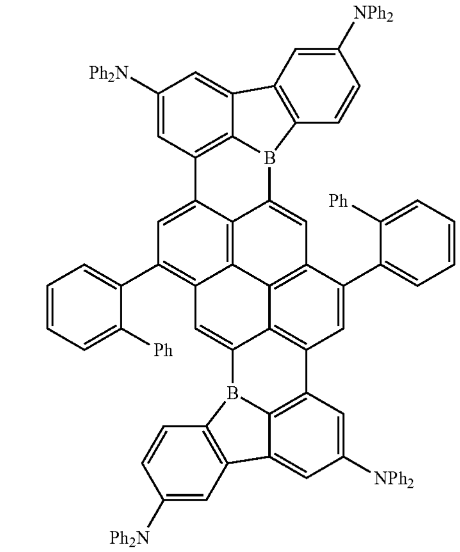
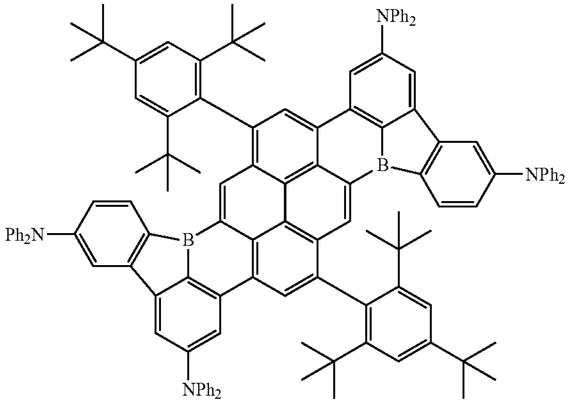
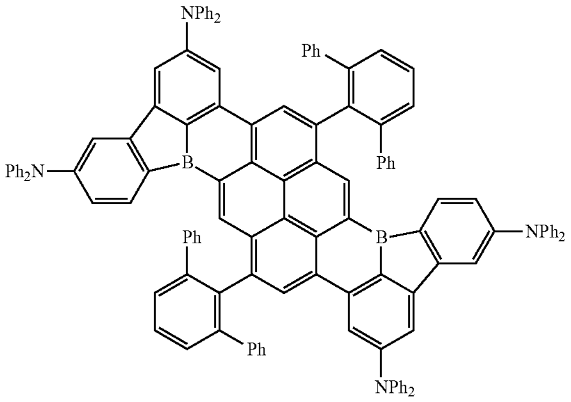
-continued
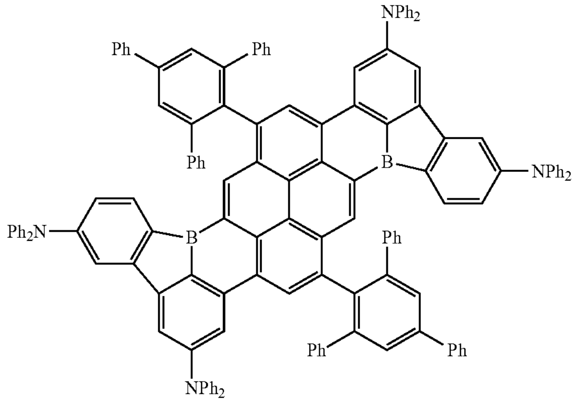
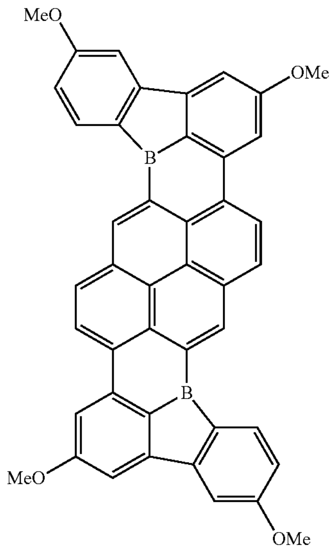
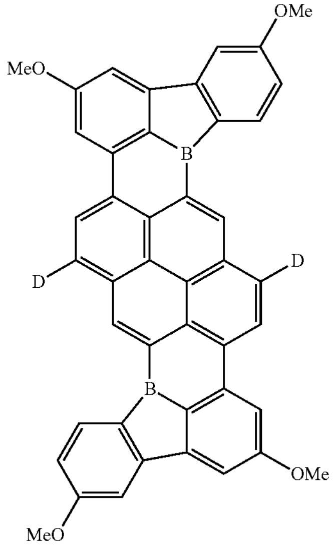

-continued
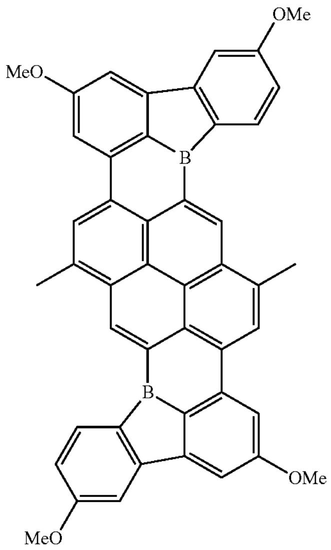
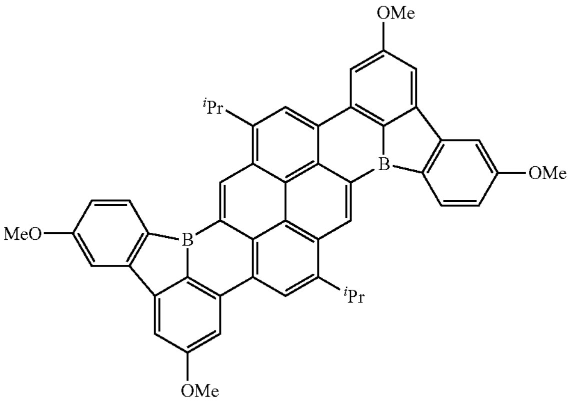
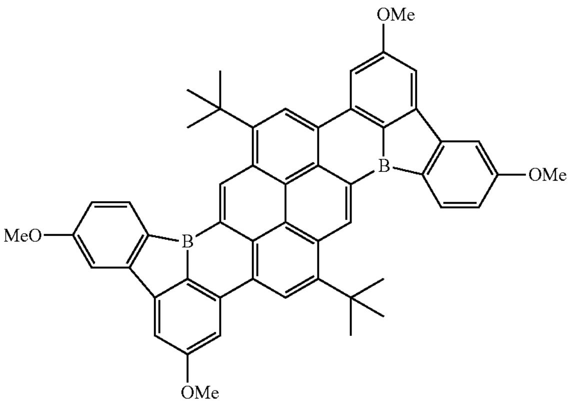
-continued
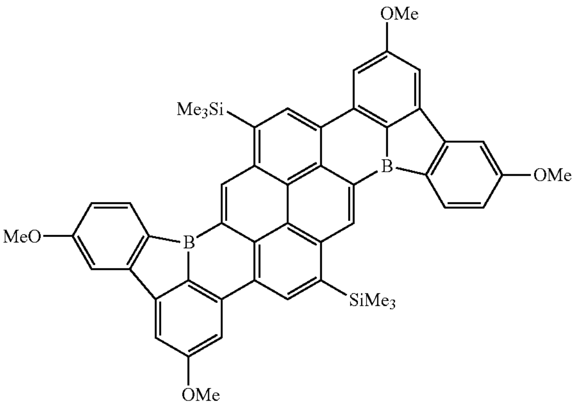
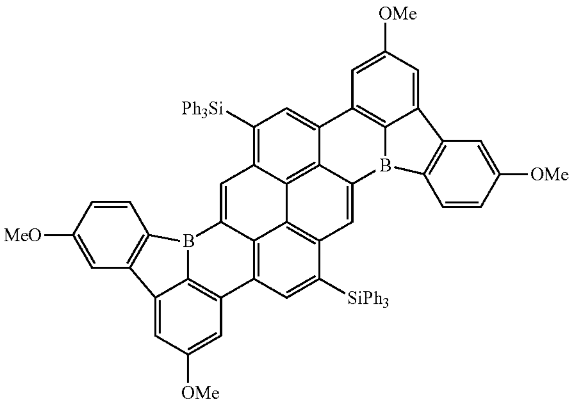
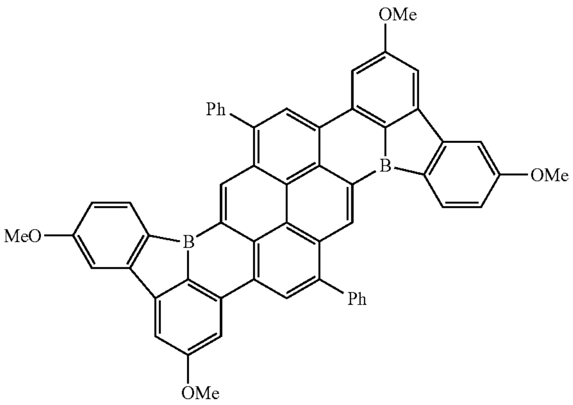

-continued
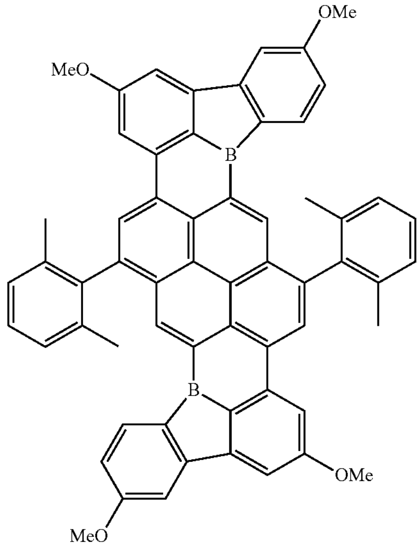
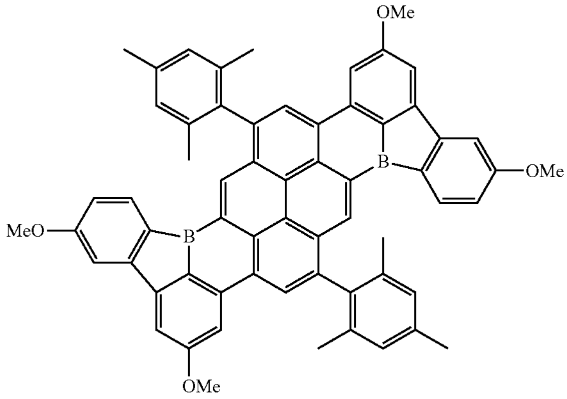
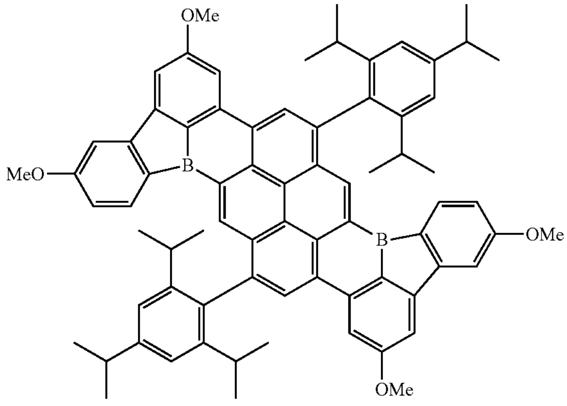
-continued
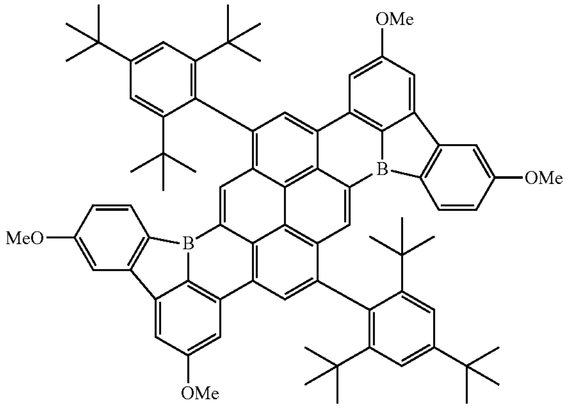
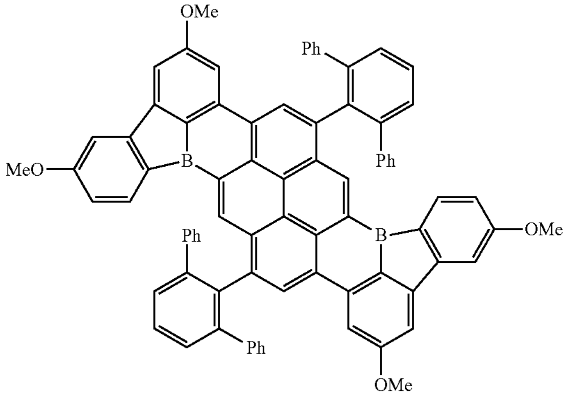
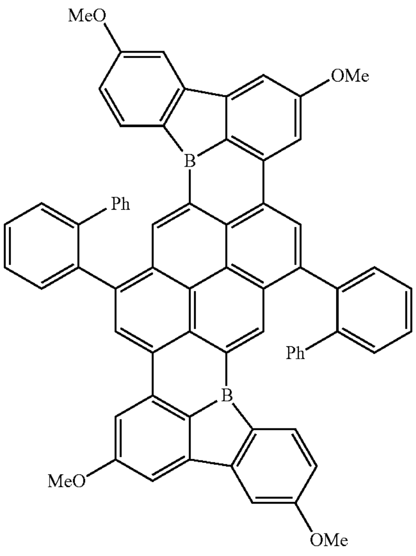

-continued
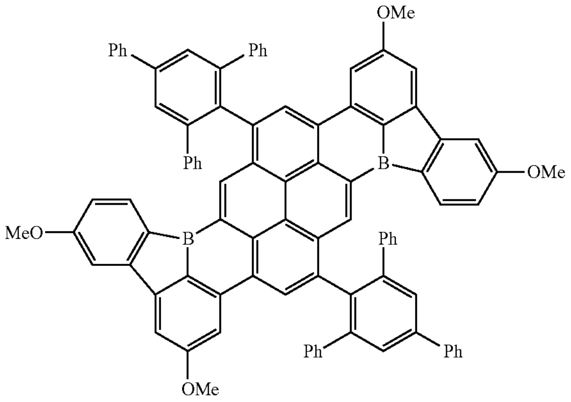
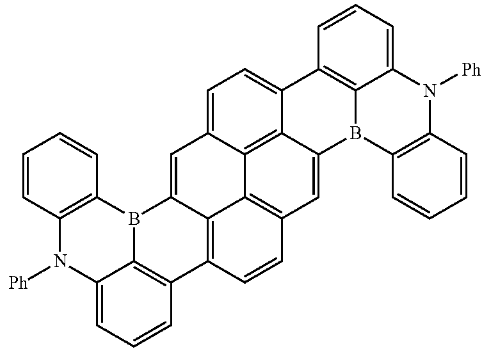
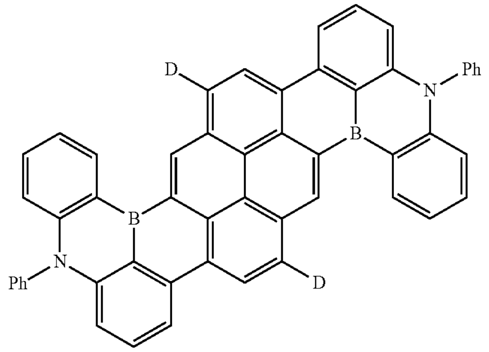
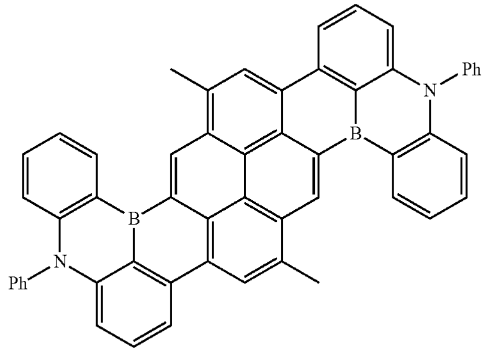
-continued
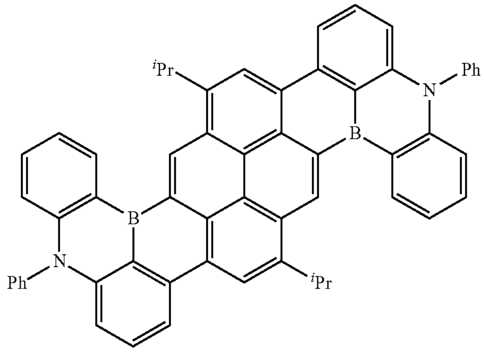
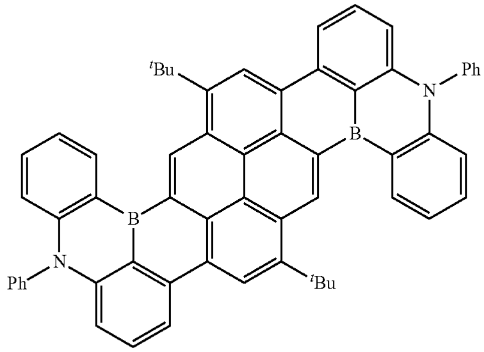
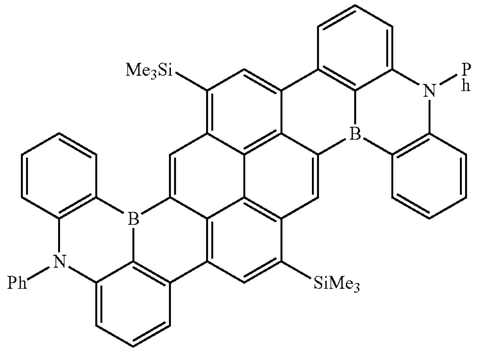
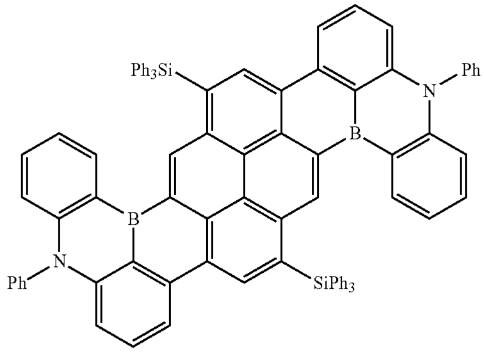

-continued
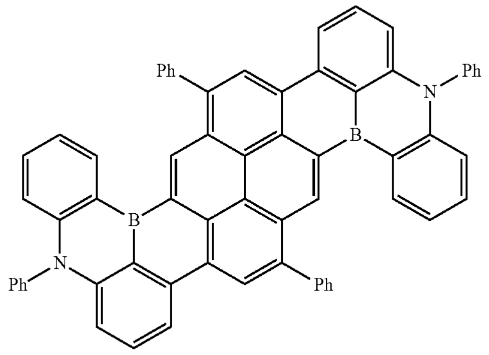
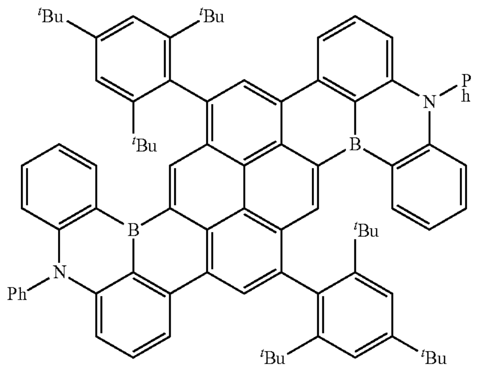
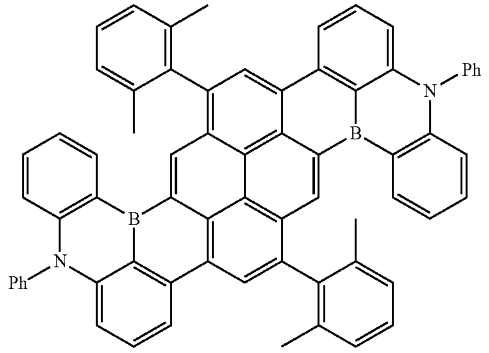
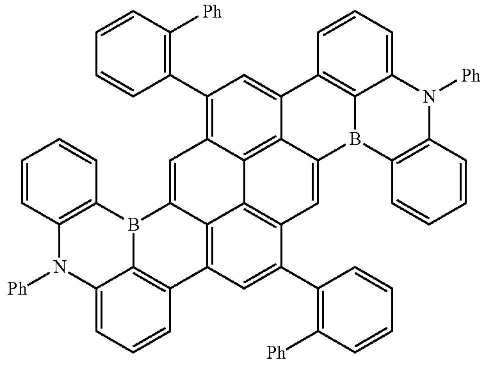
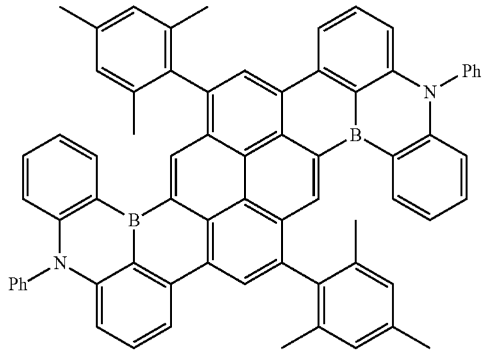
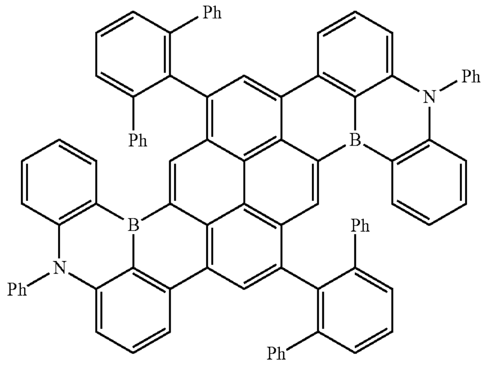
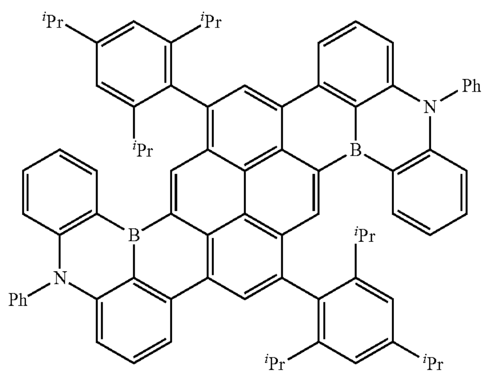
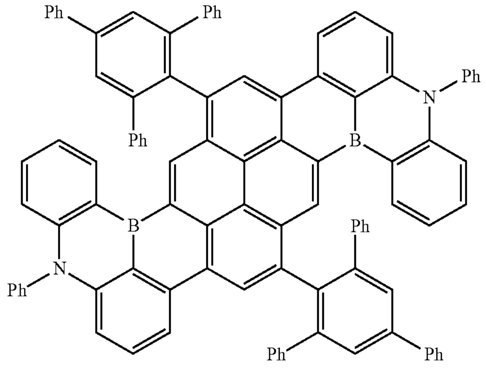

-continued
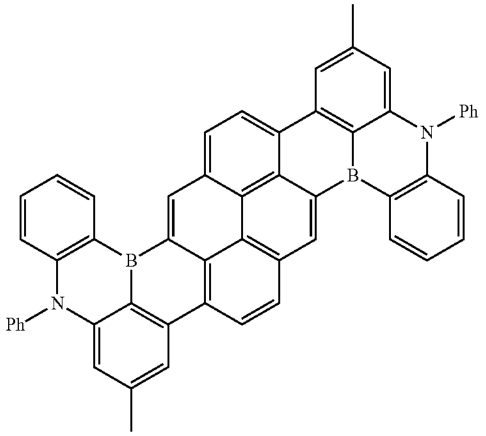
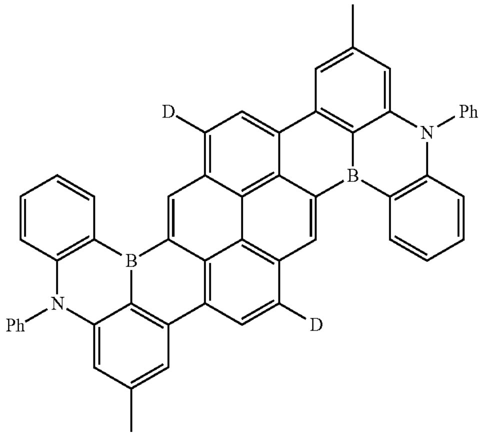
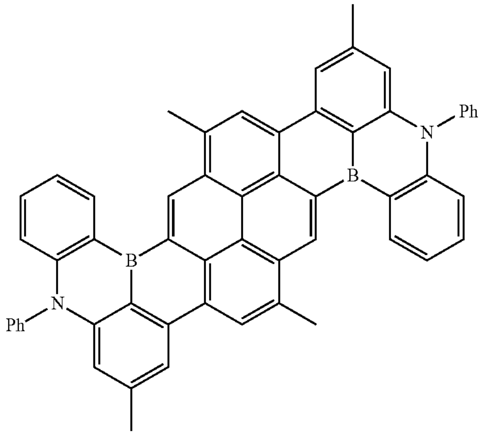
-continued
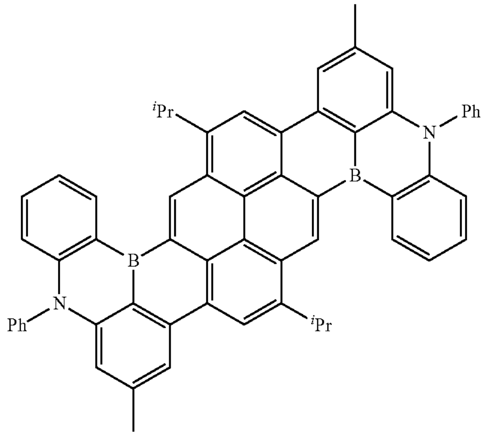
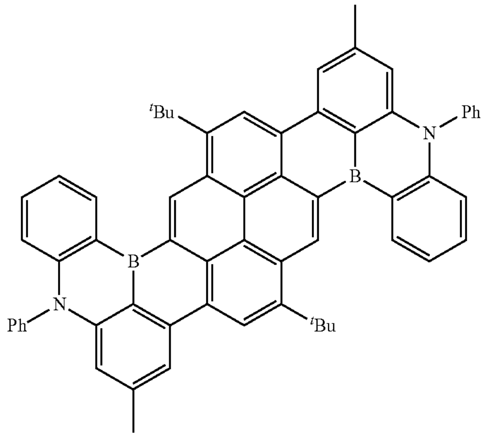
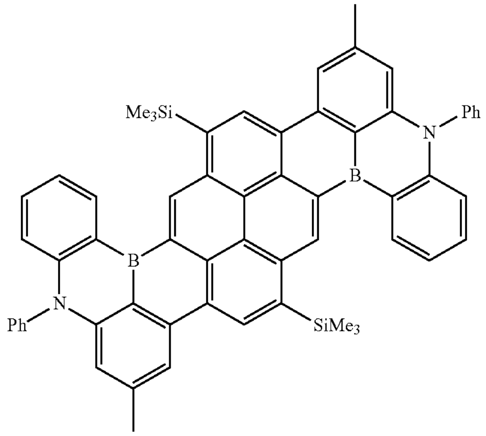

-continued
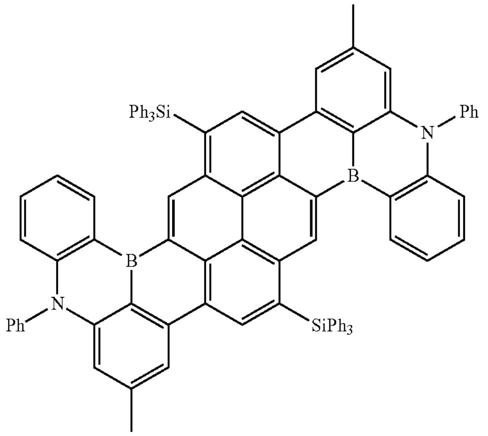
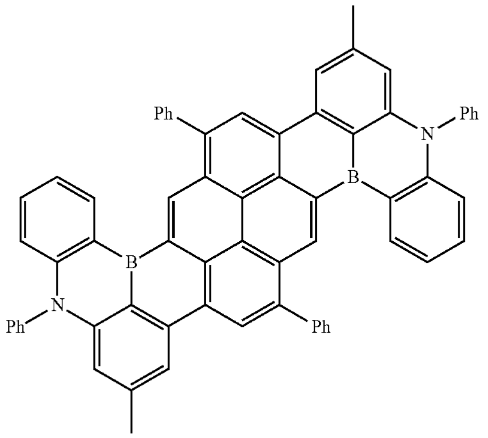
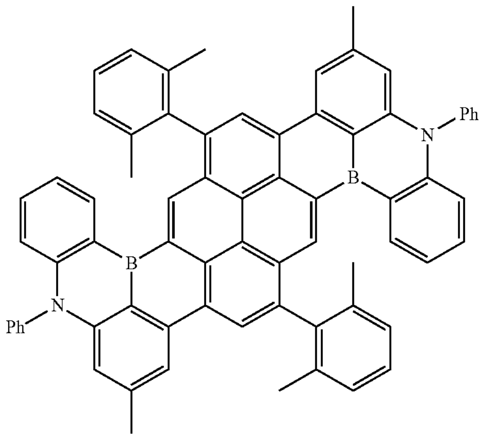
-continued
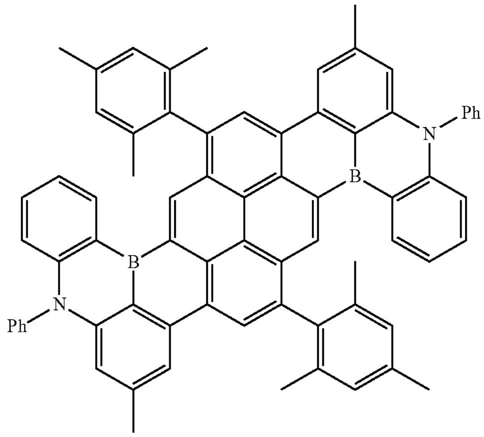
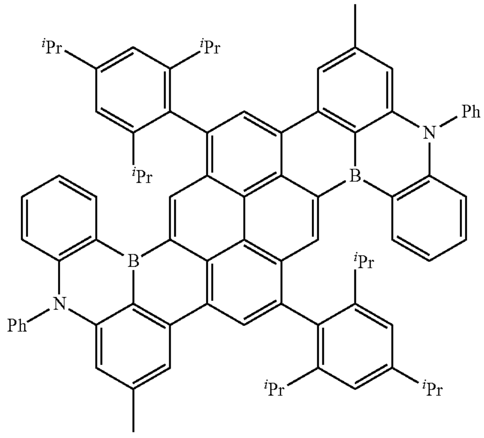
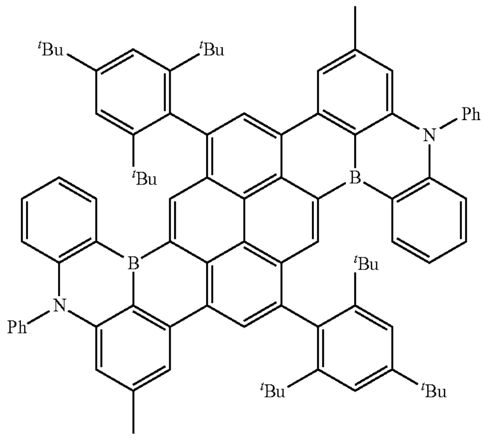

-continued
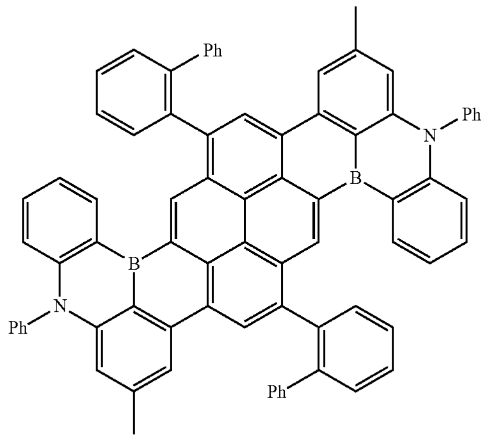
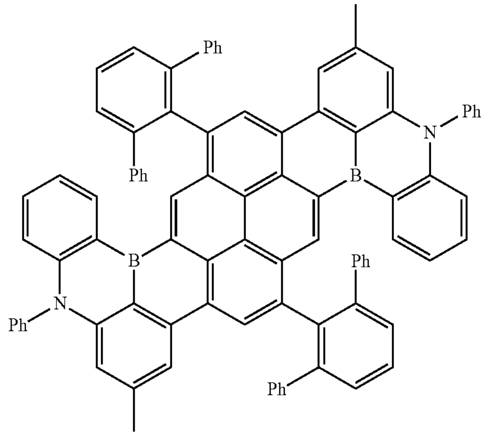
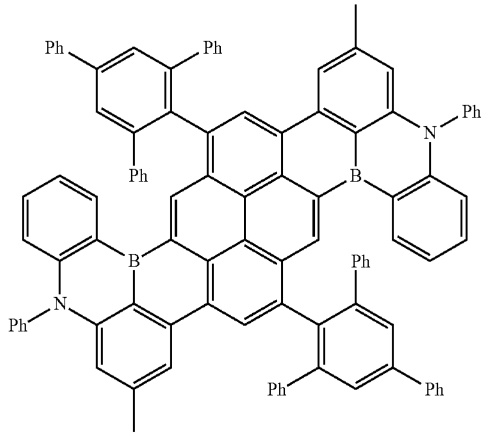
-continued
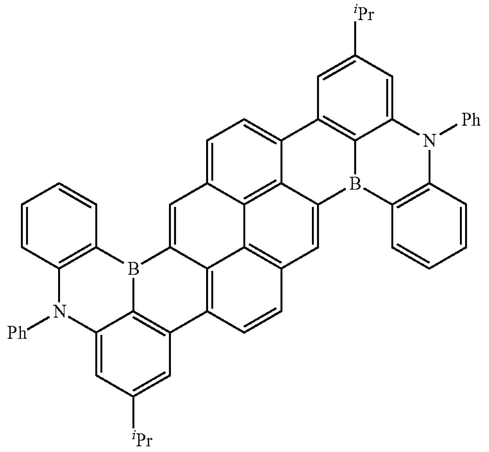
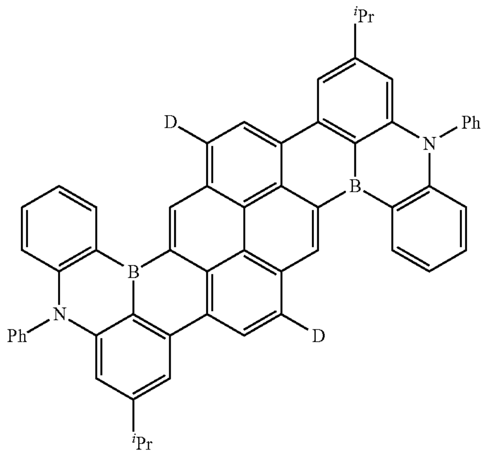
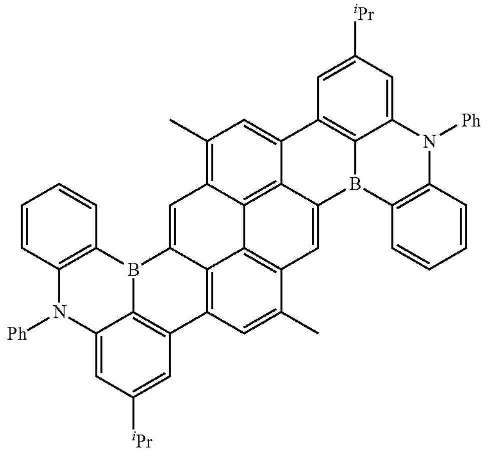

-continued
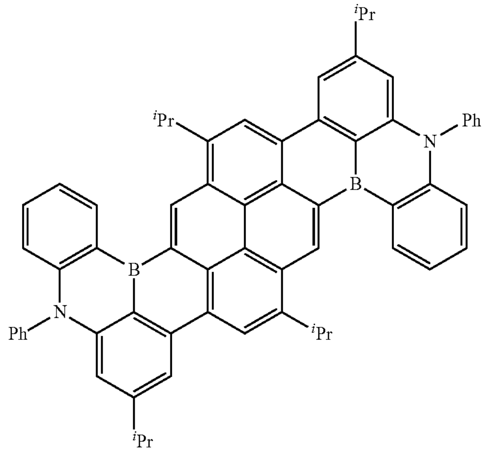
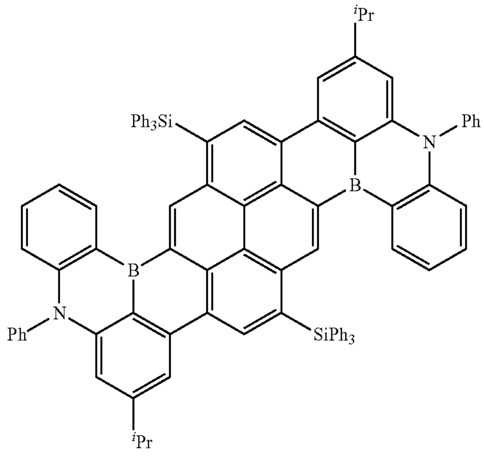
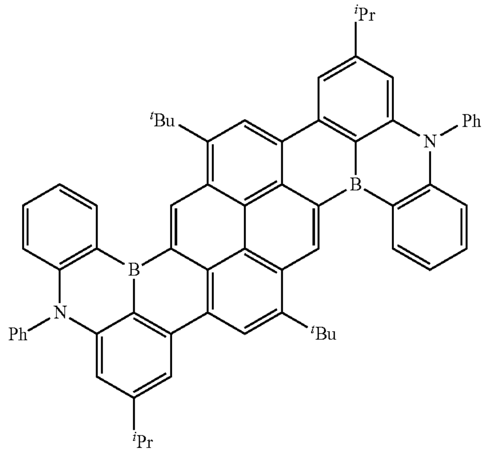
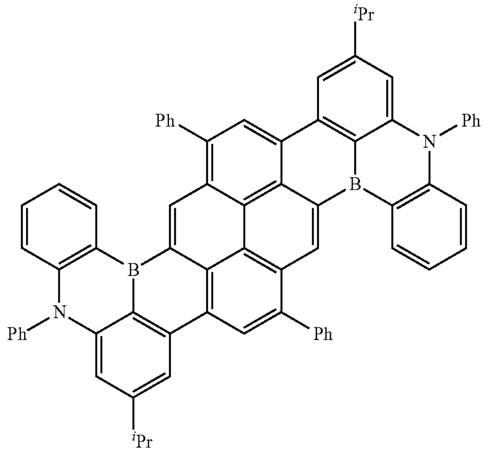
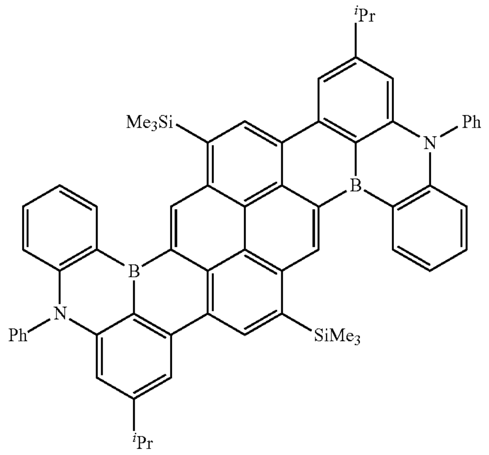
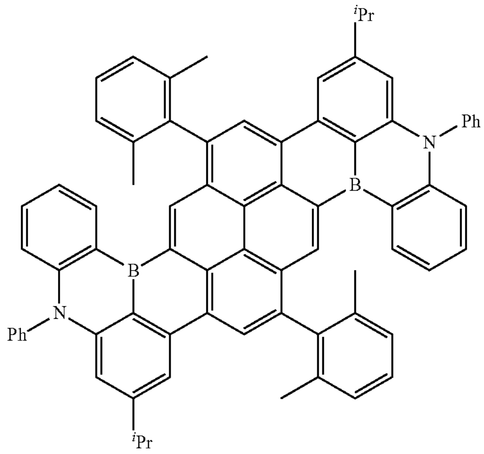
-continued -continued
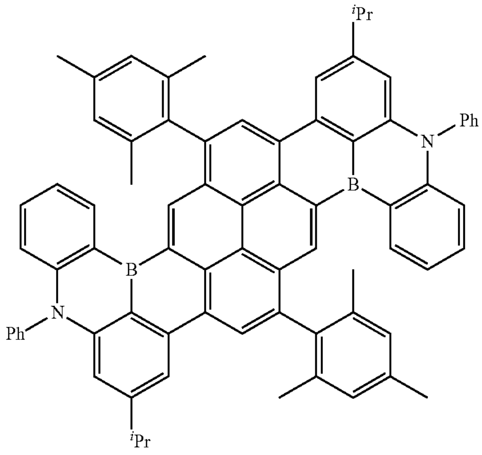
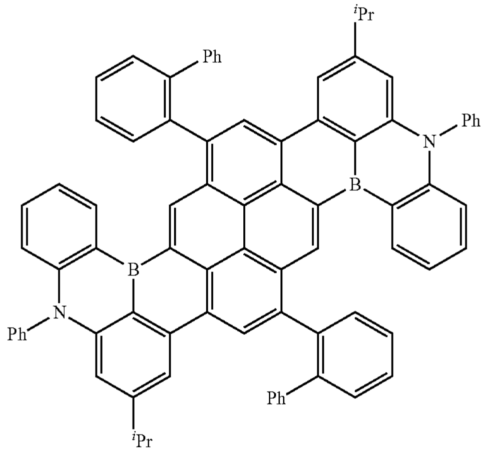
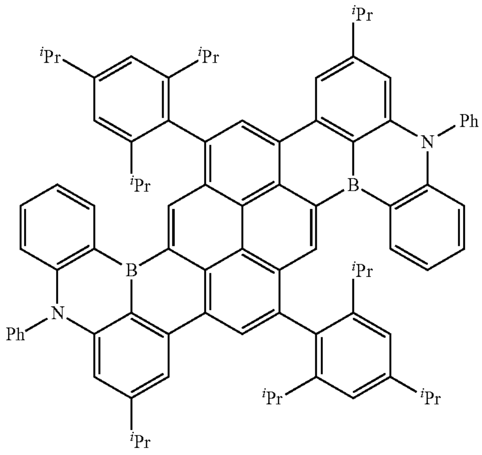
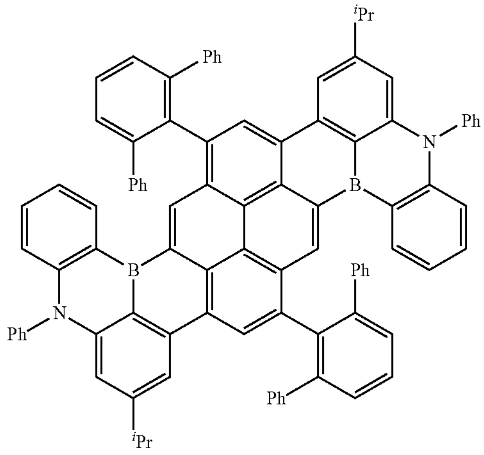
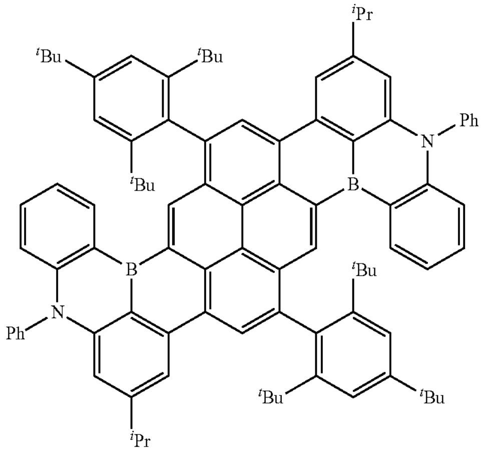
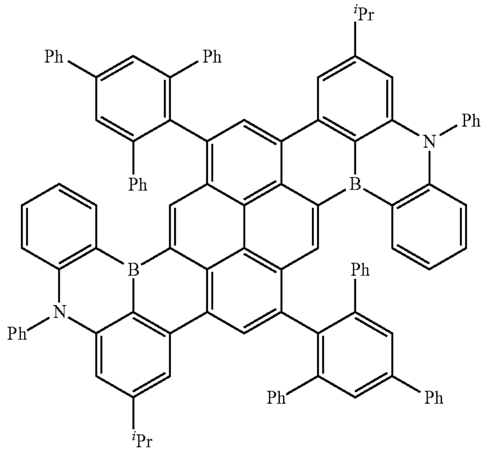
-continued -continued
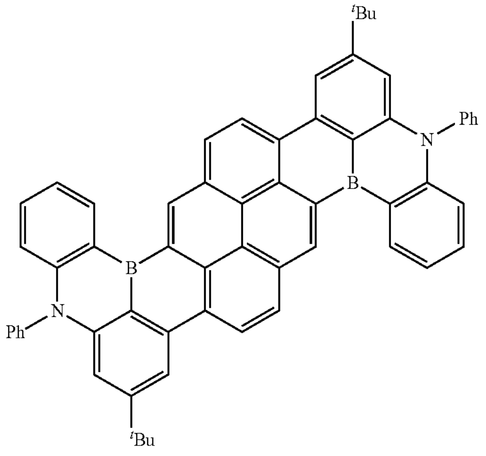
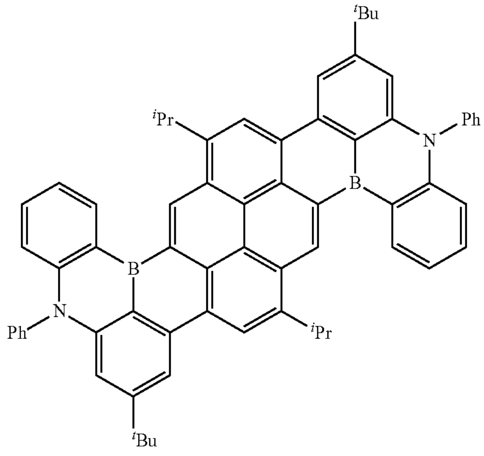
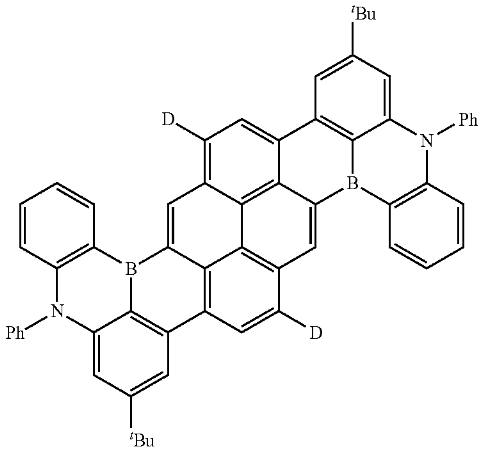
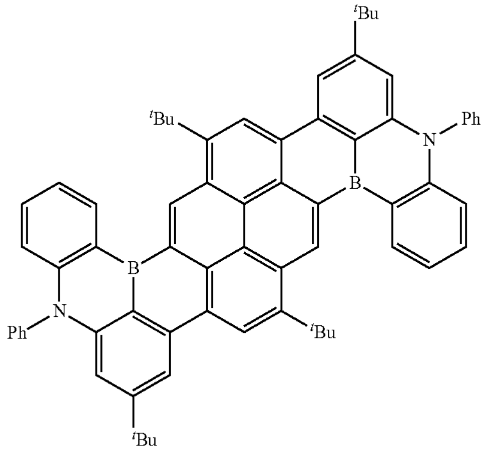
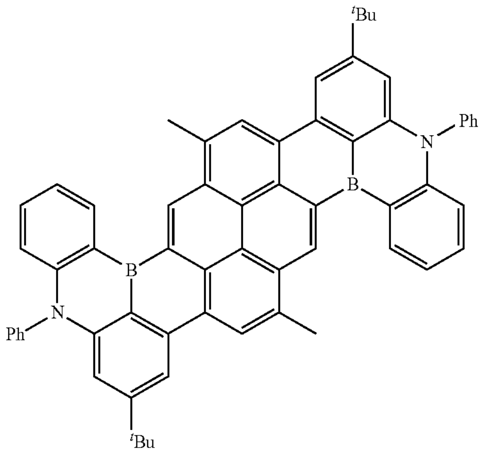
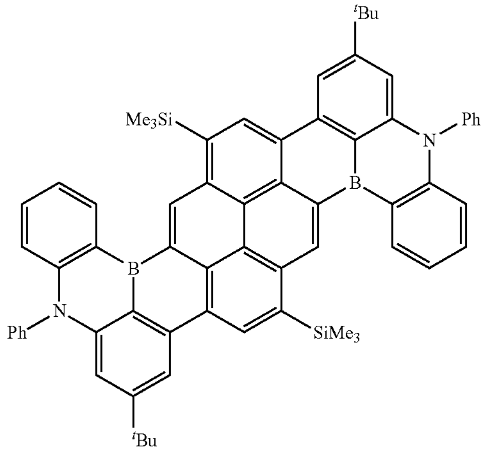
-continued -continued
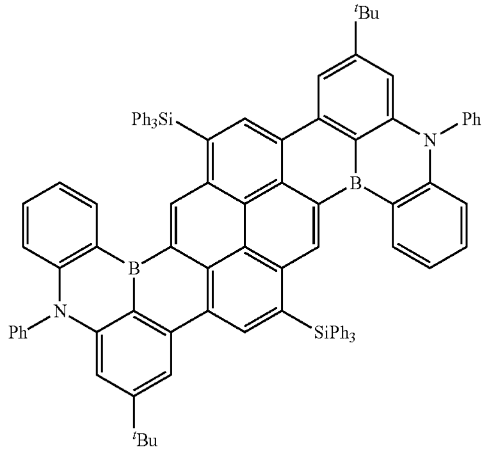
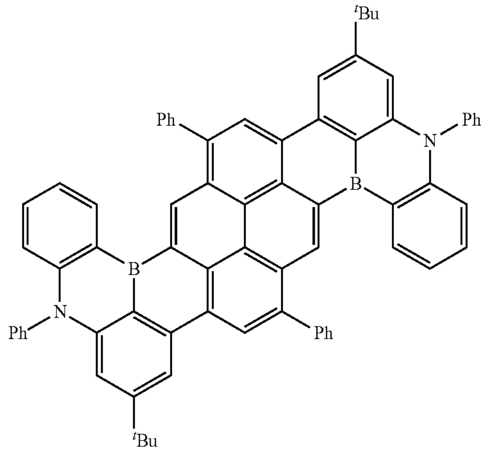
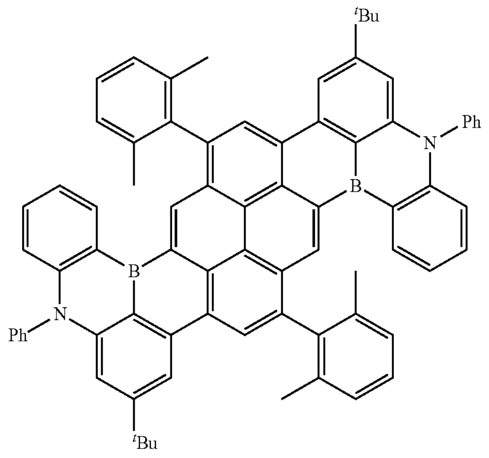
-continued
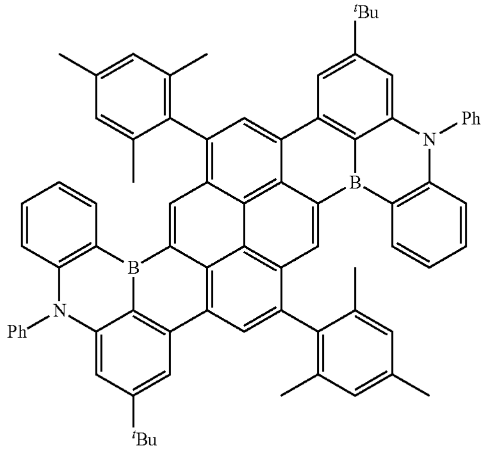
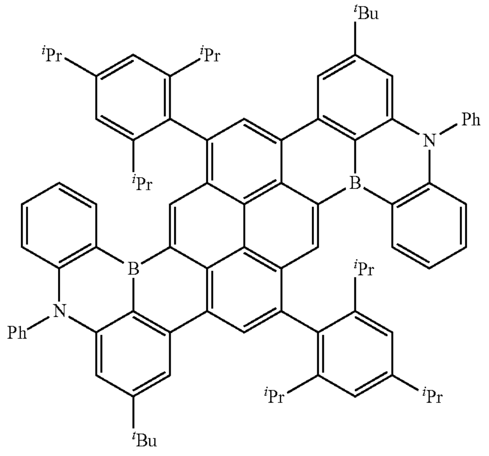
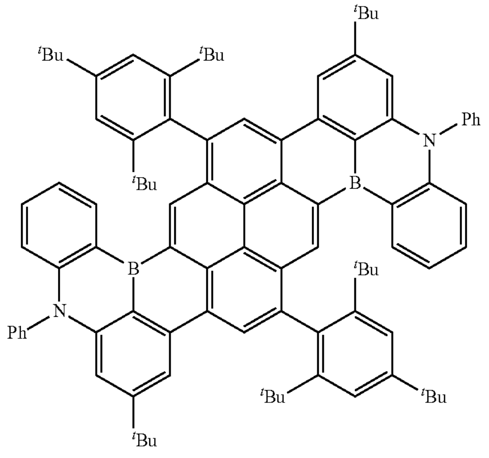

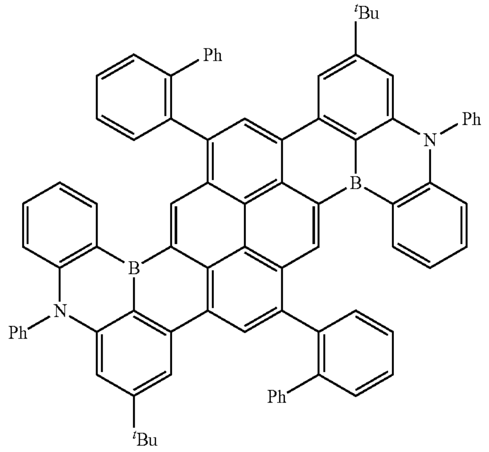
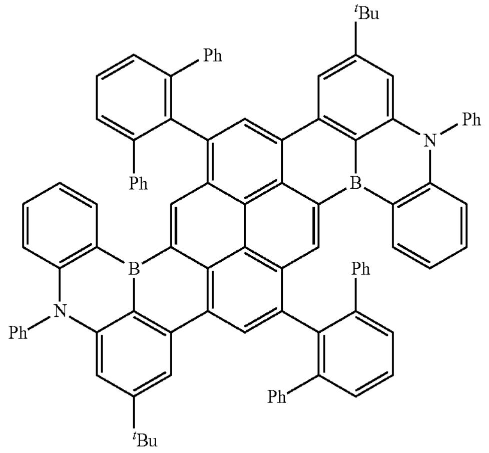
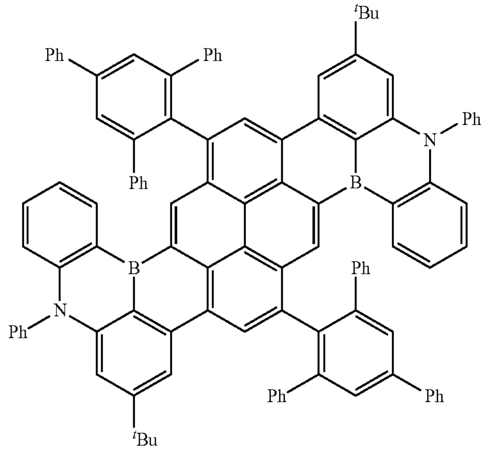
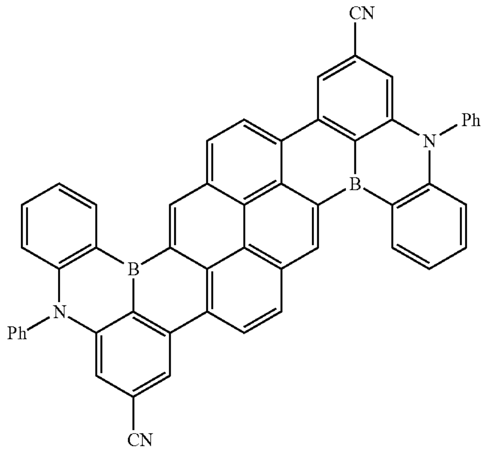
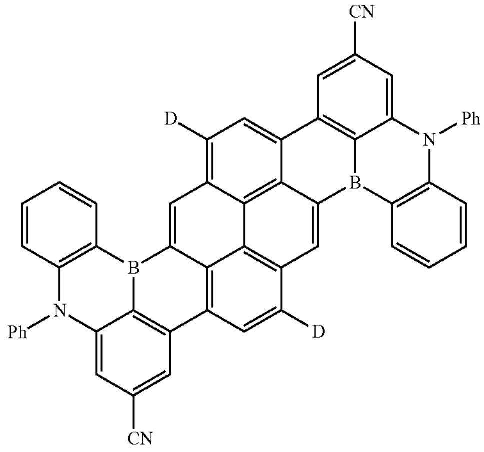
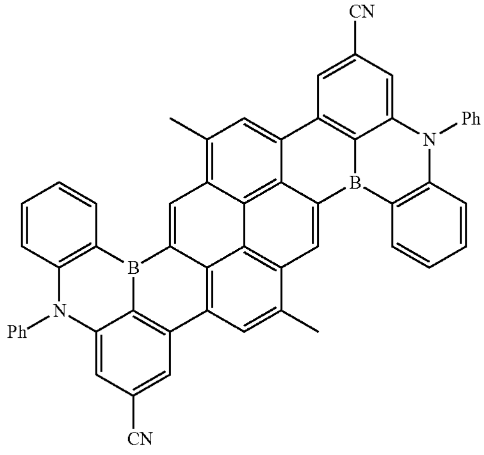

-continued
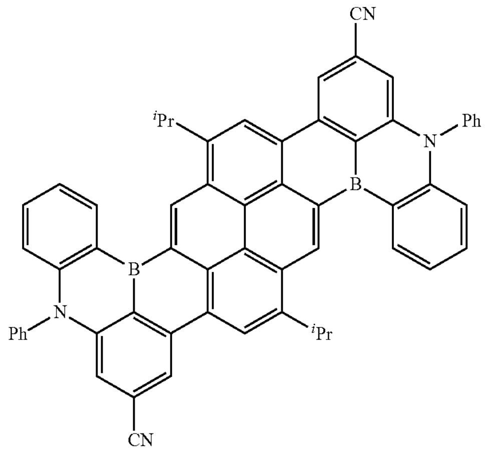
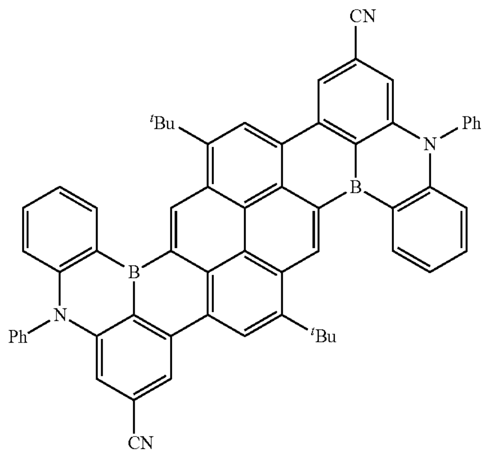
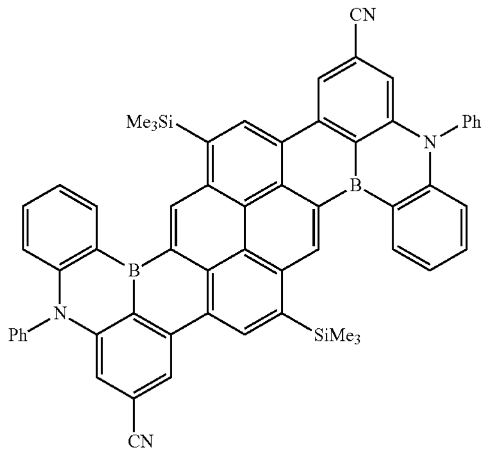
-continued
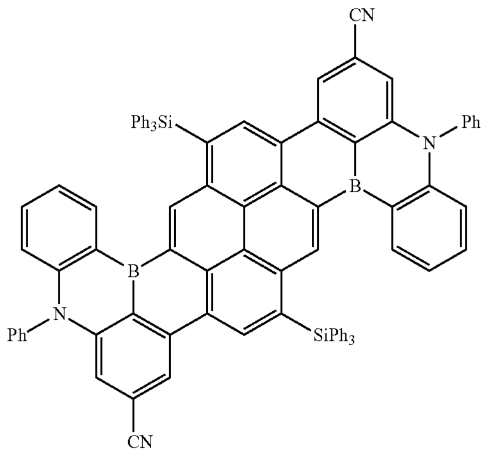
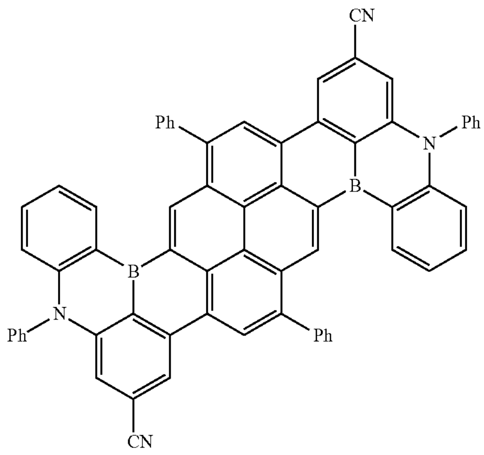
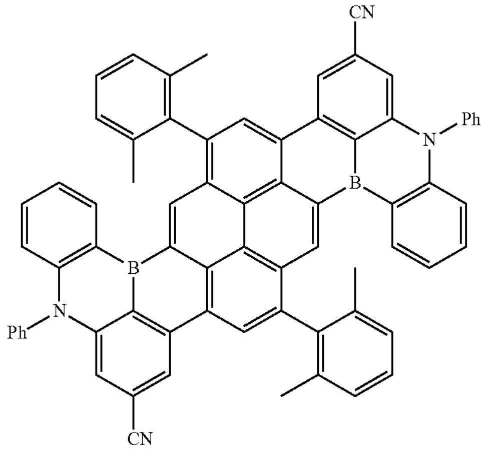

-continued
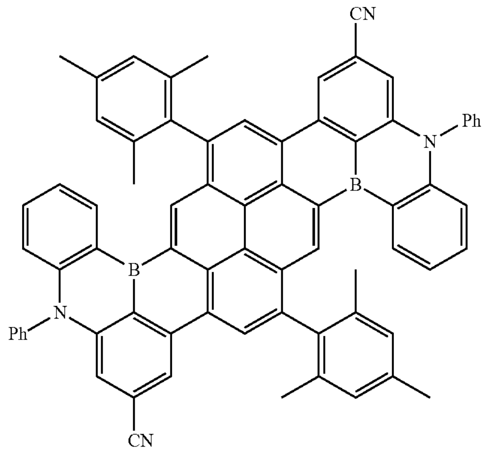
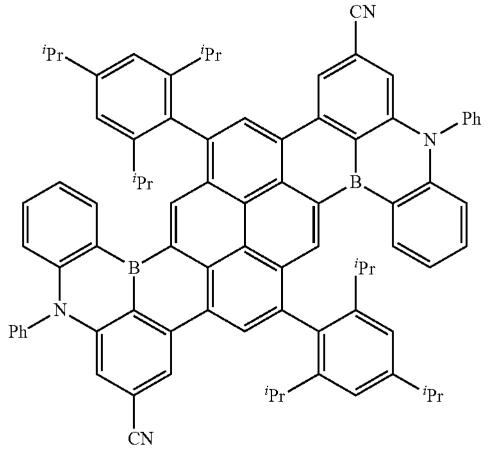
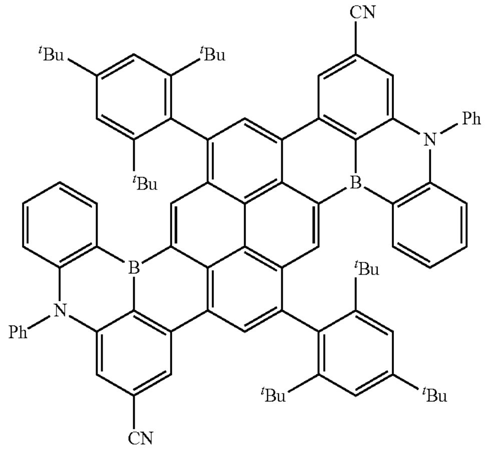
-continued
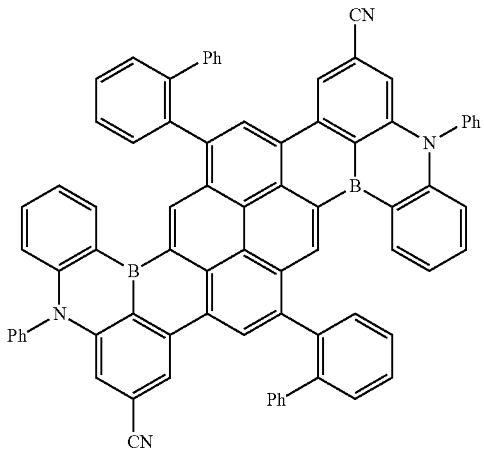
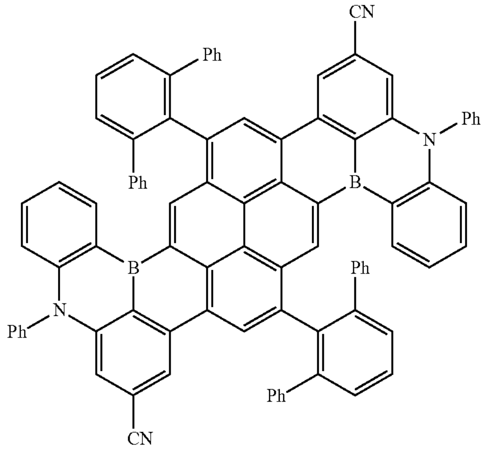
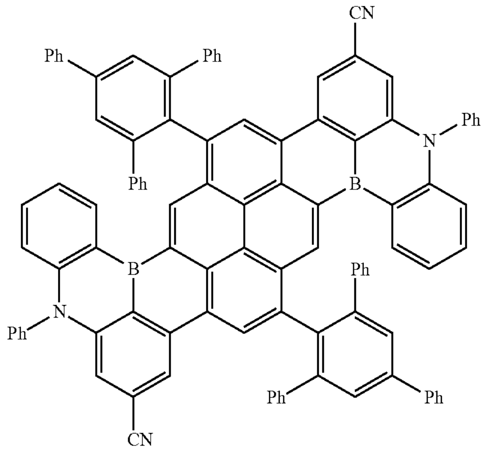

-continued
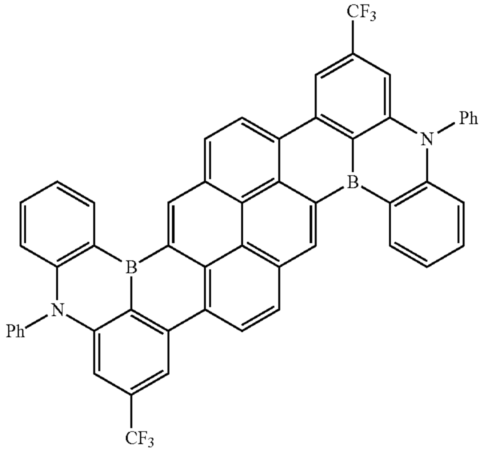
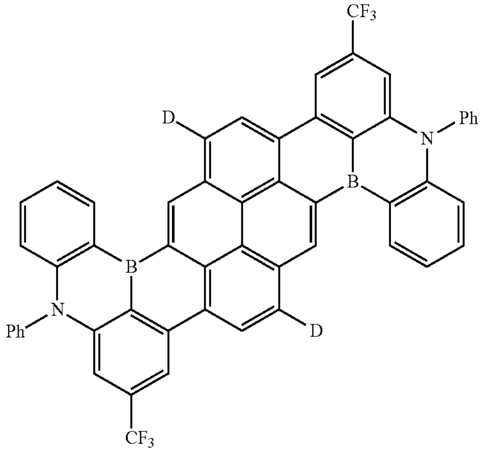
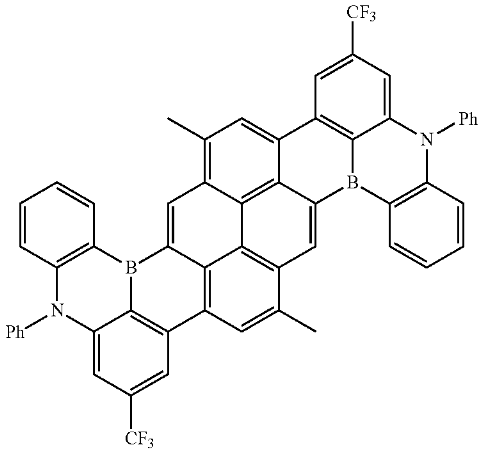
-continued
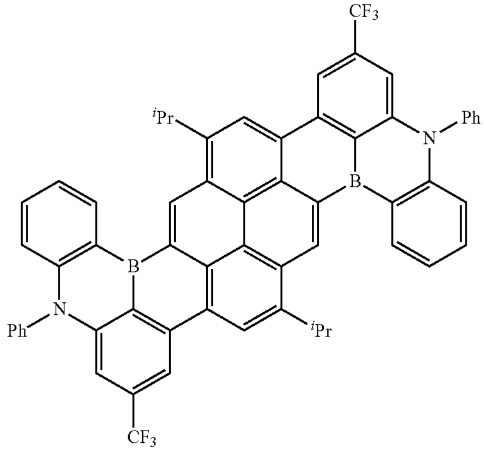
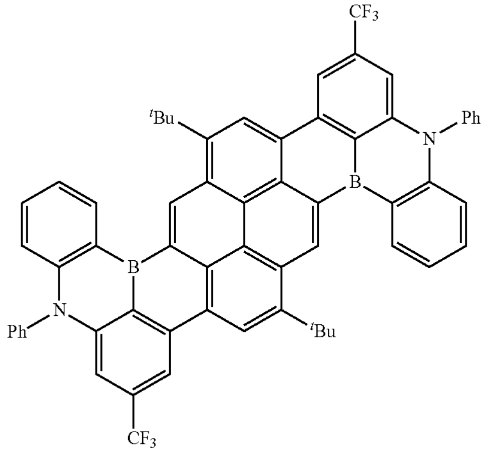
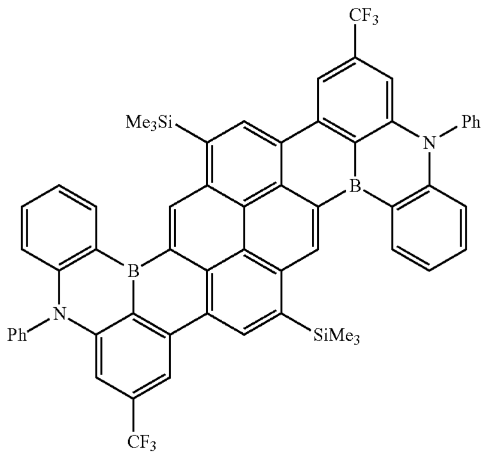

-continued
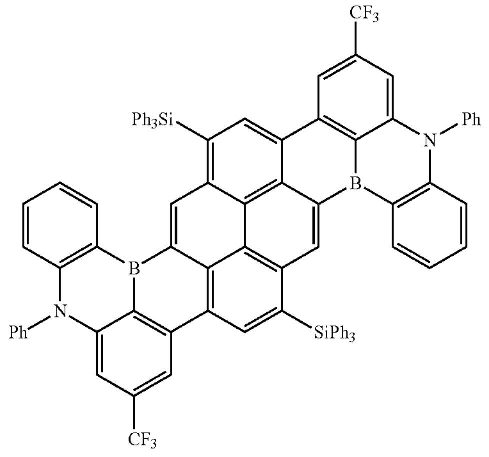
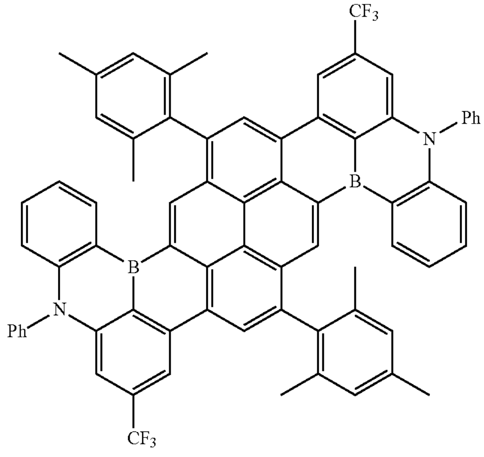
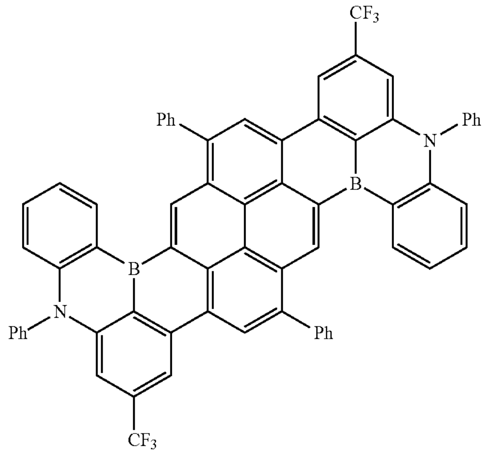
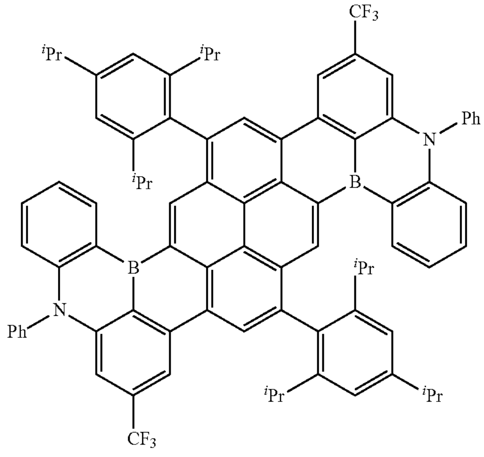
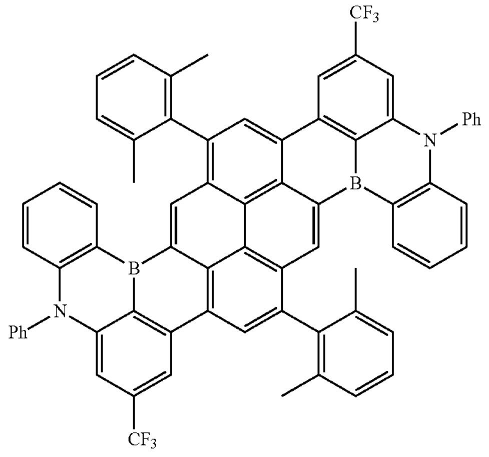
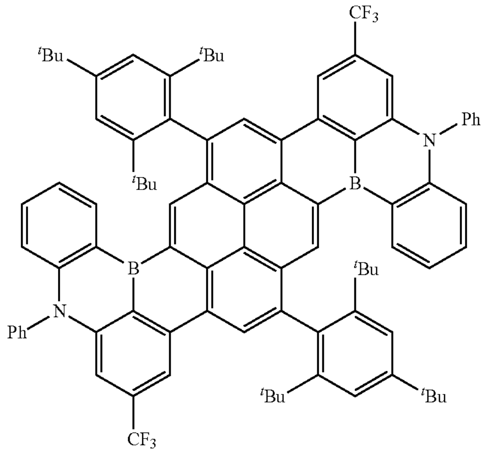

-continued
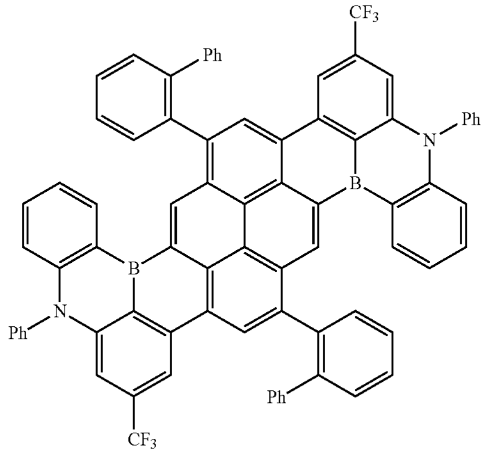
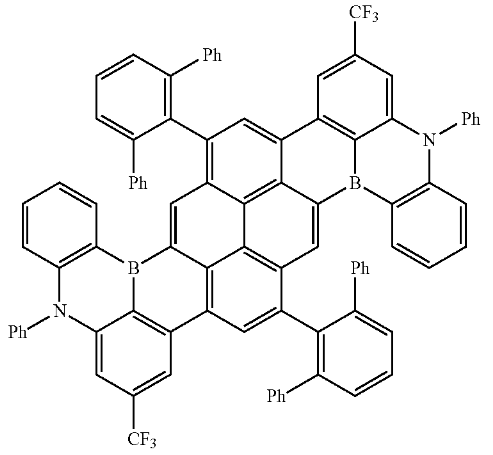
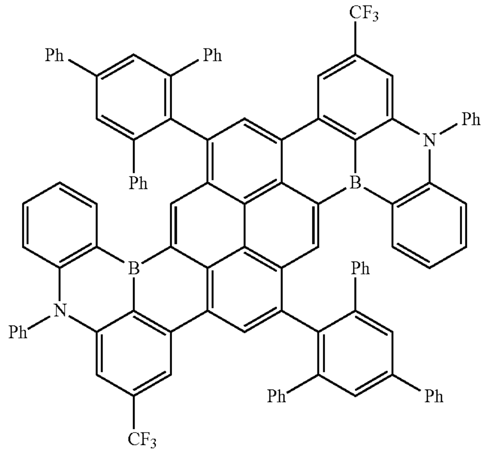
-continued
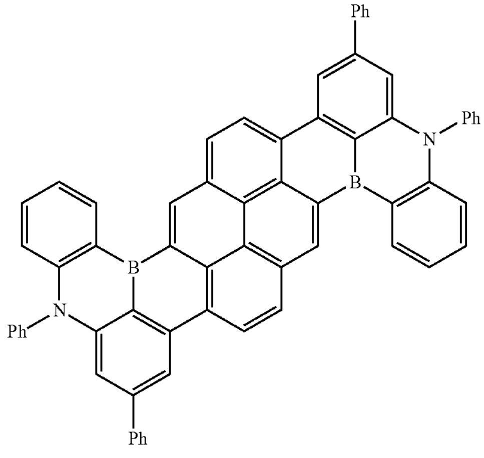
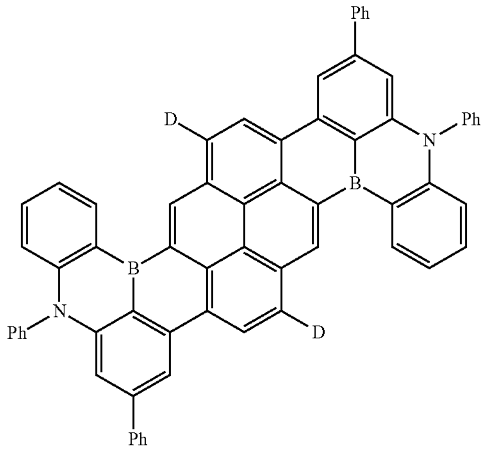
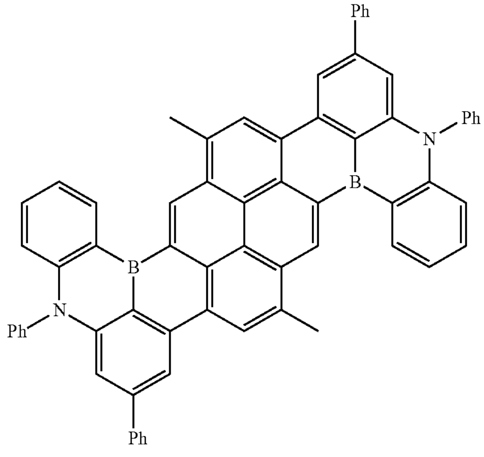

-continued
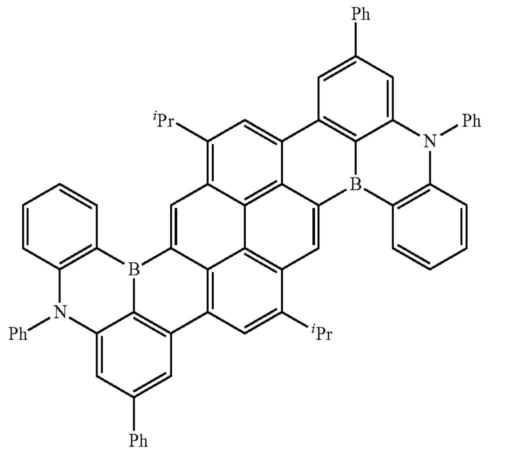
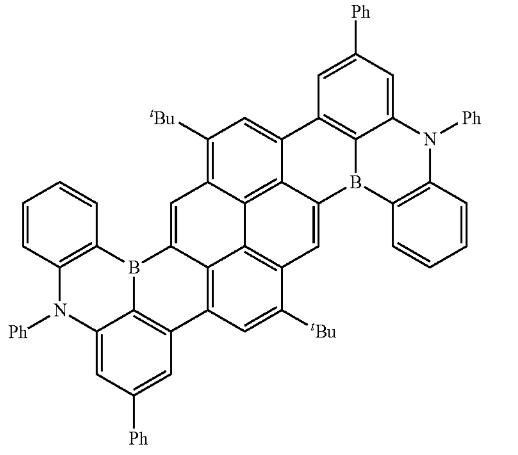
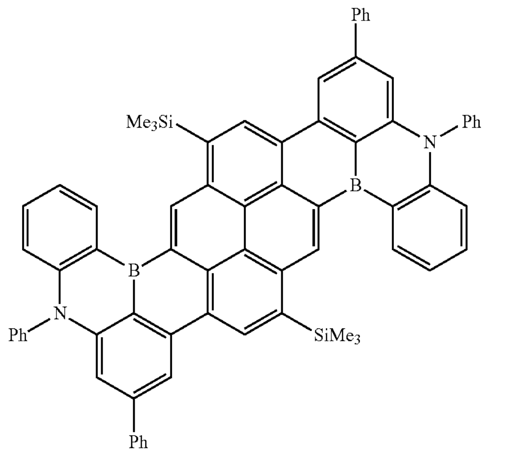
-continued
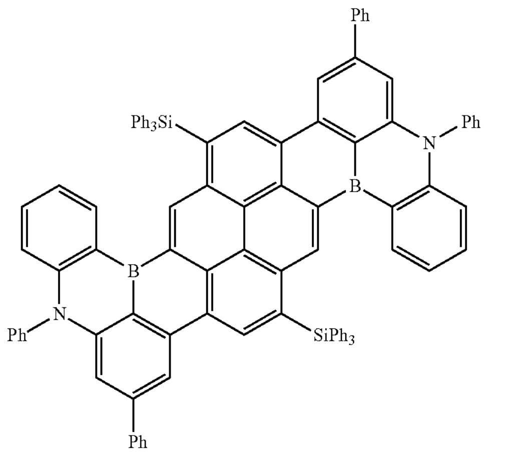
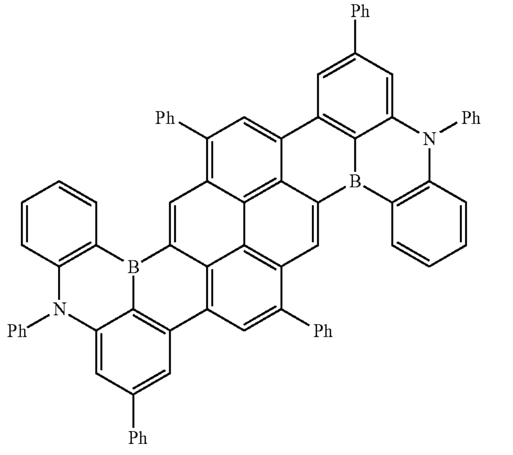
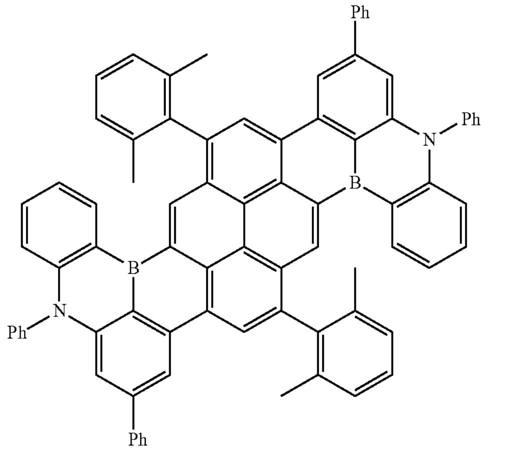

-continued
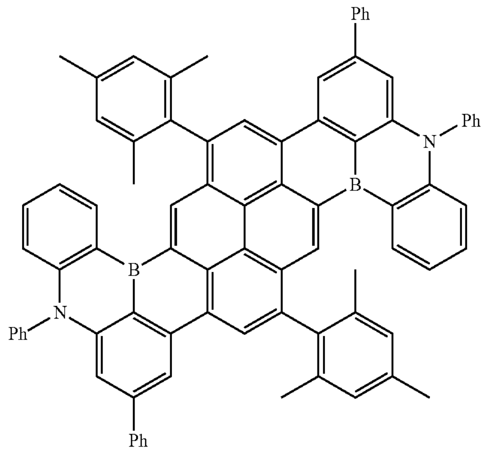
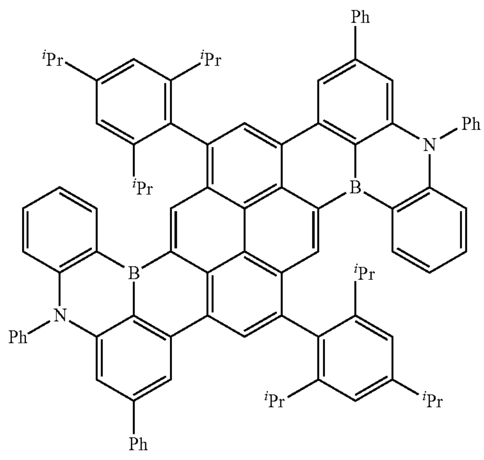
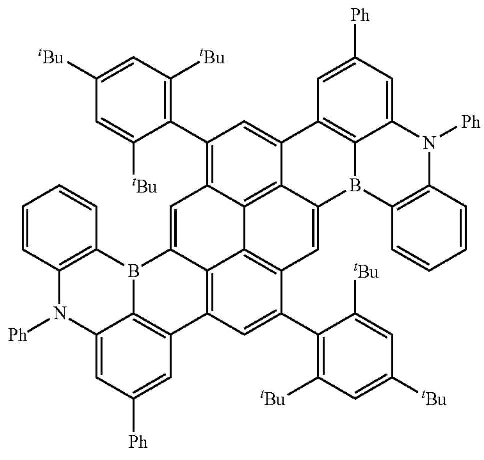
-continued
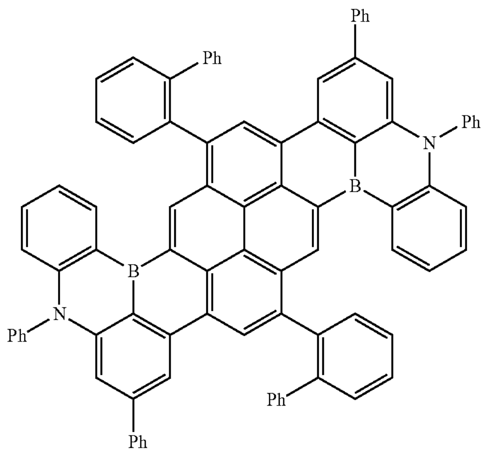
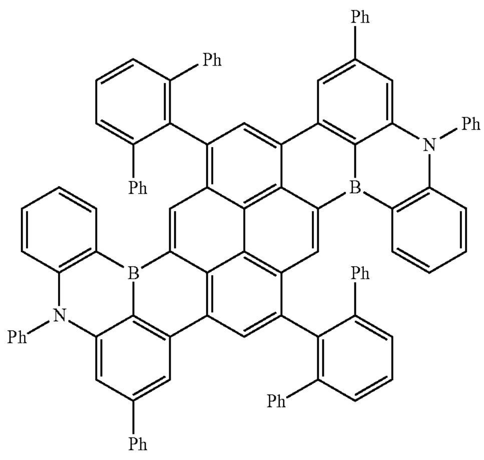
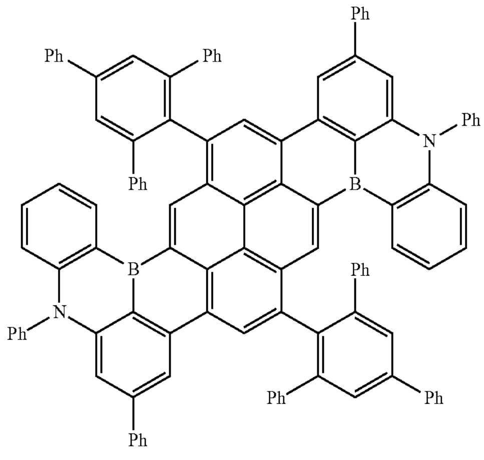

-continued
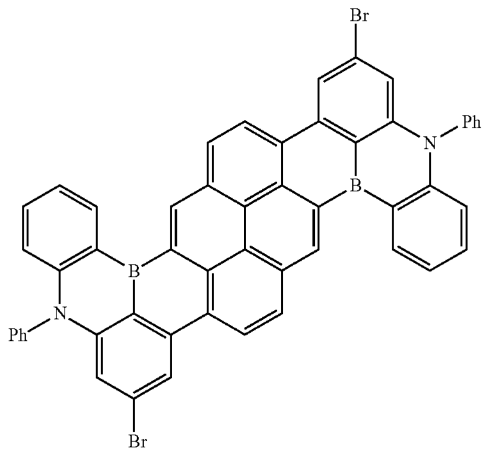
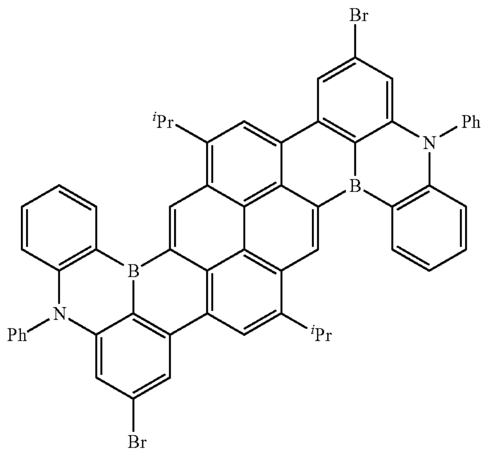
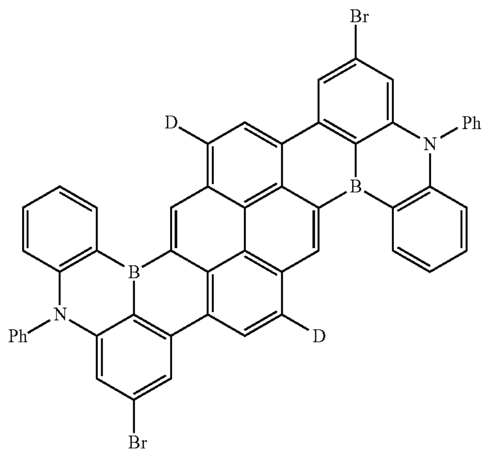
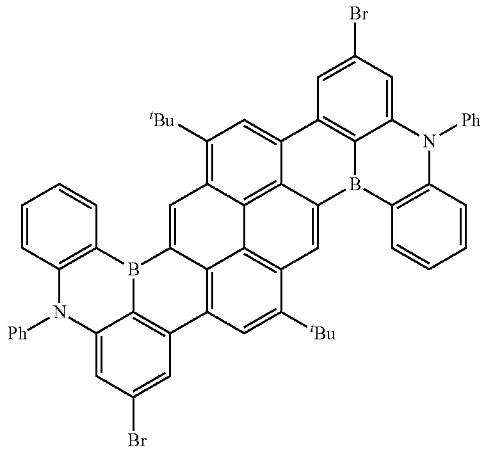
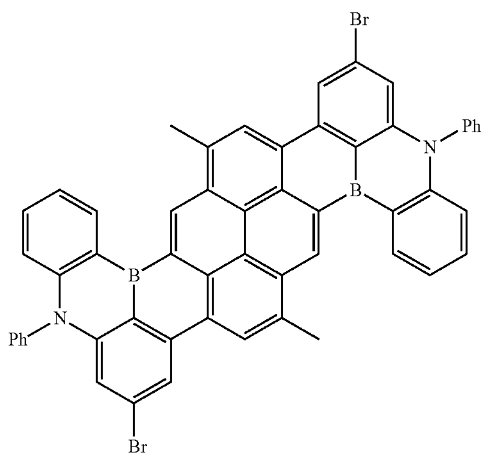
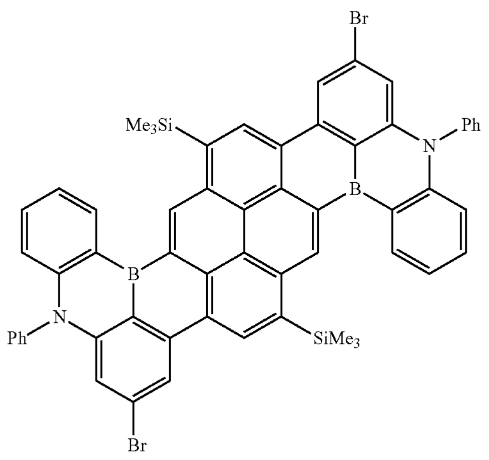

-continued
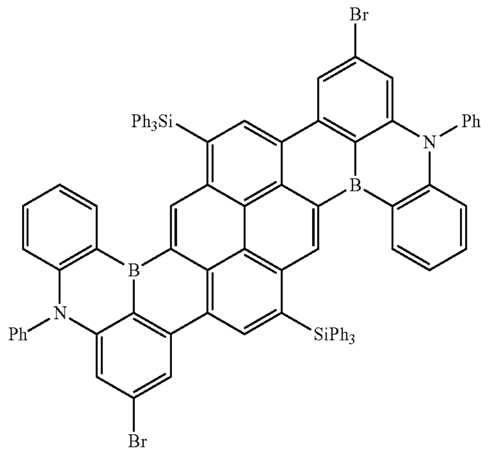
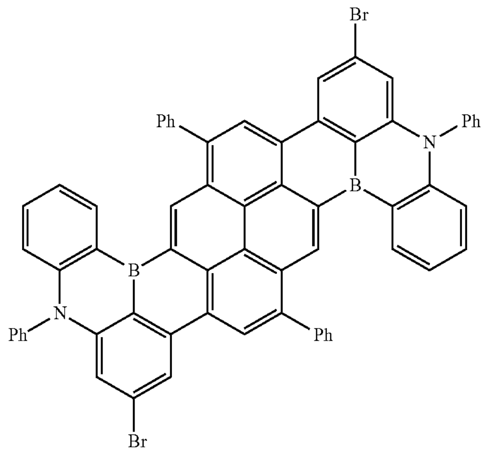
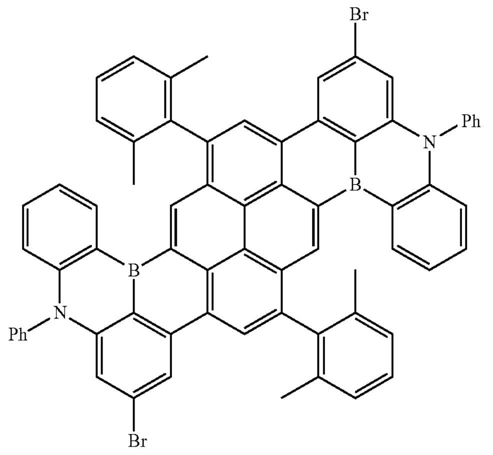
-continued
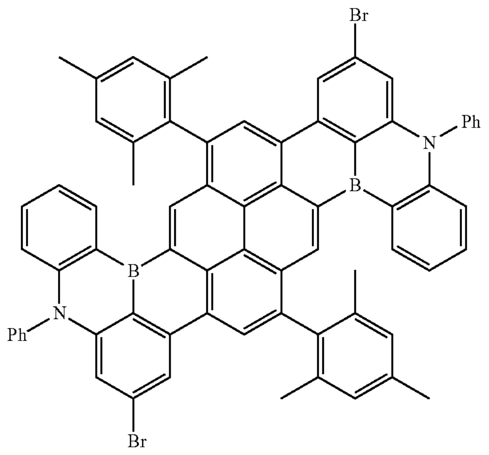
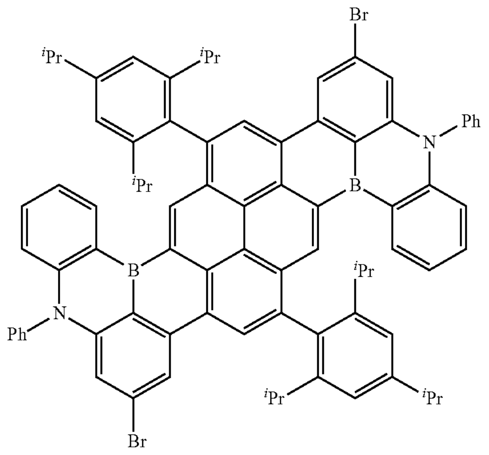
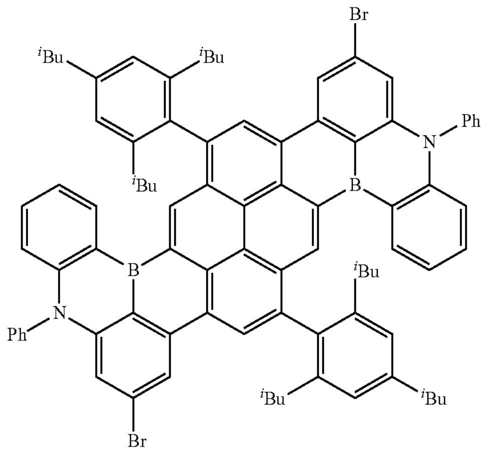

-continued
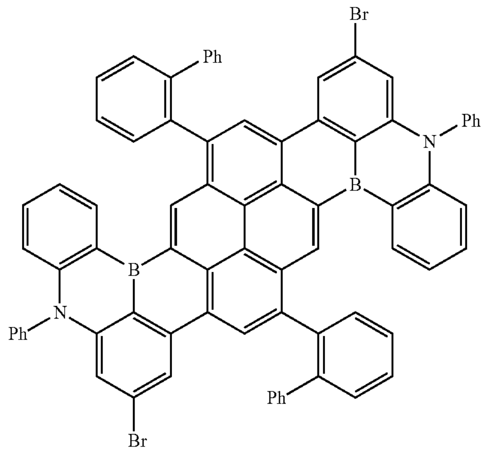
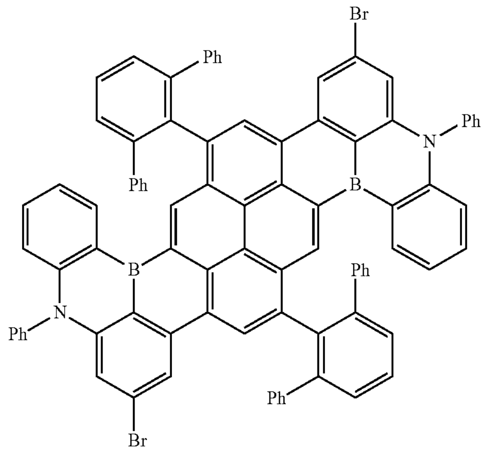
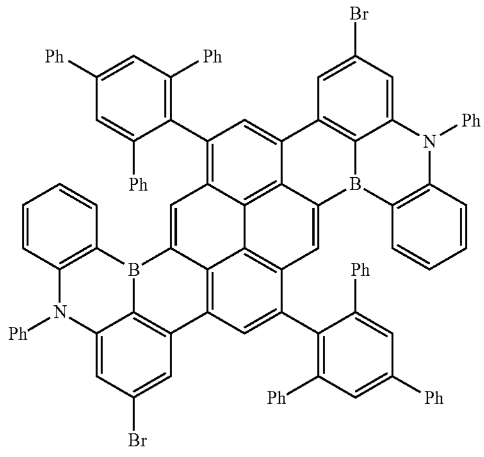
-continued
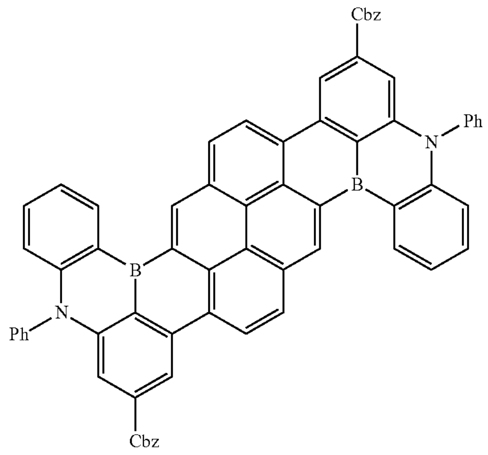
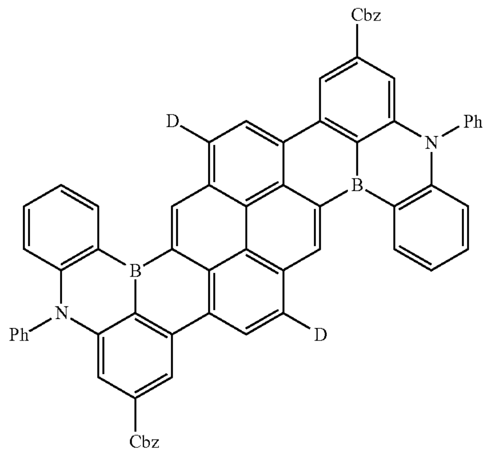
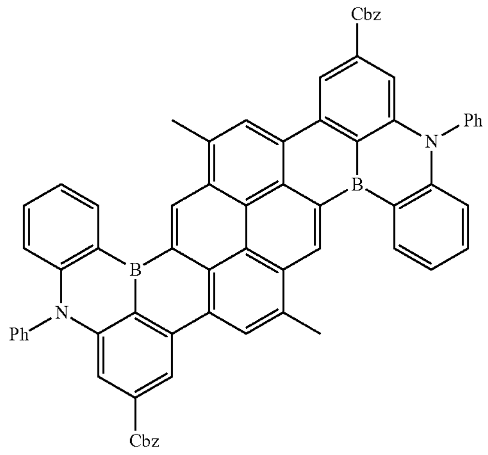

-continued
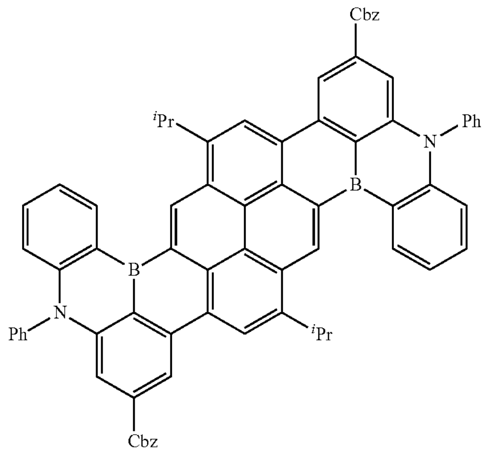
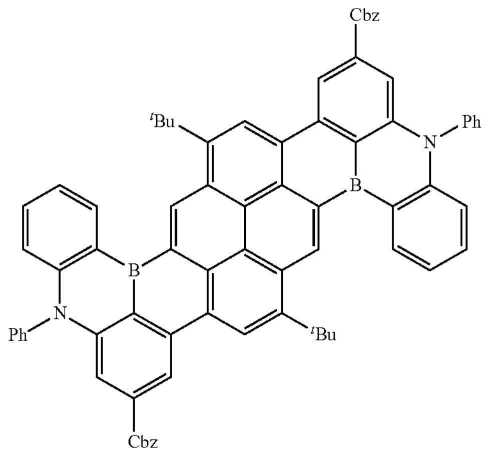
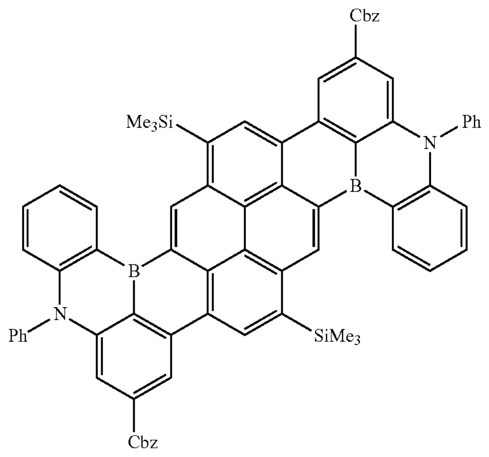
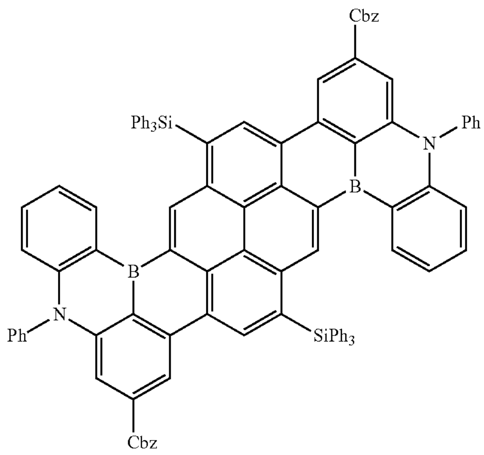
-continued
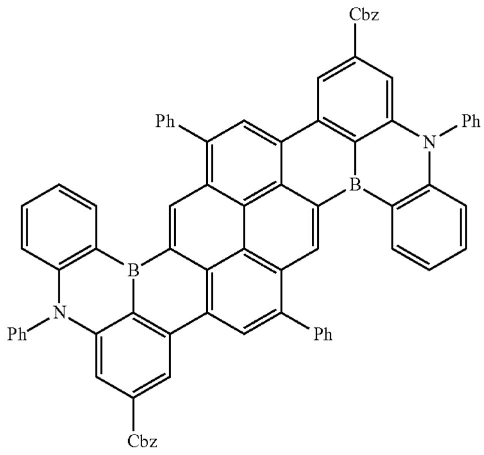
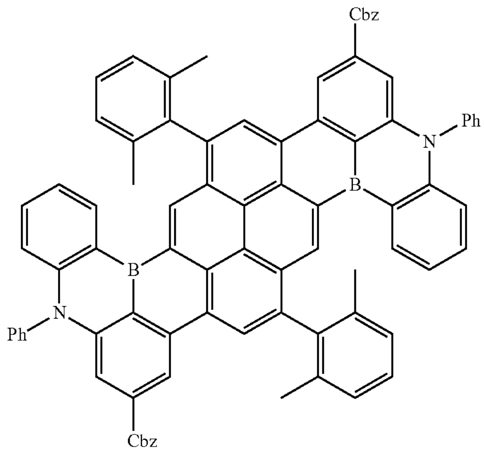

-continued
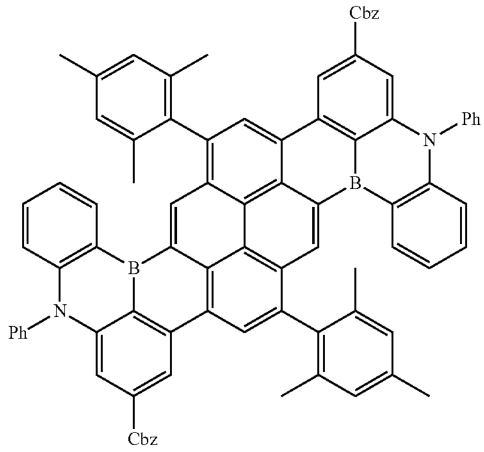
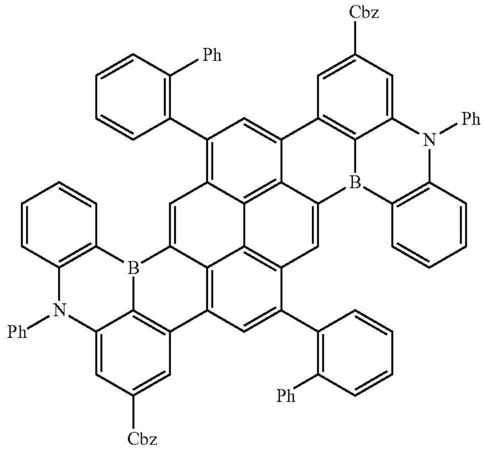
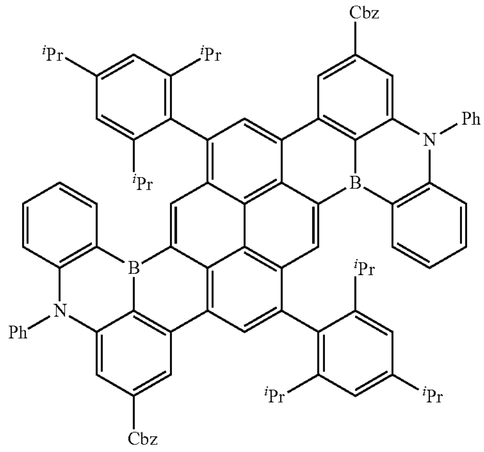
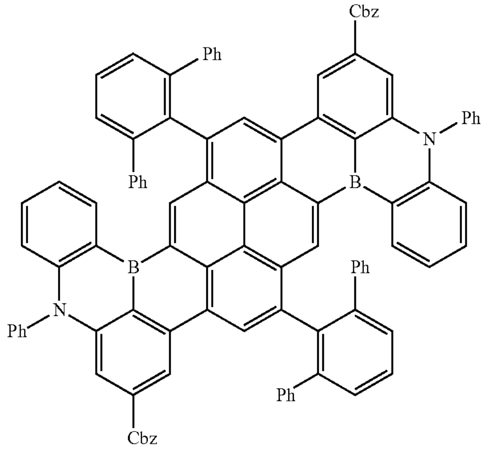
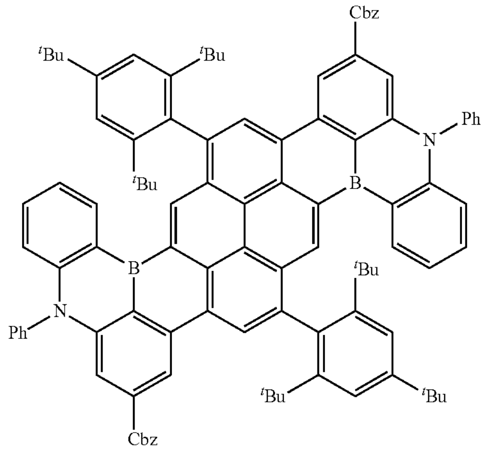
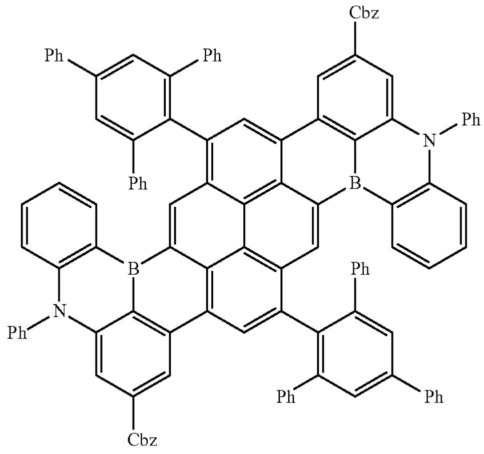
-continued -continued
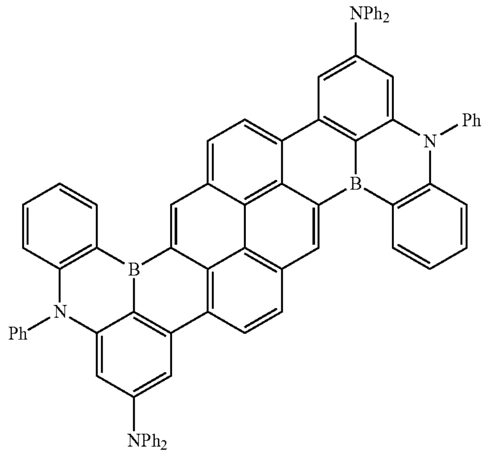
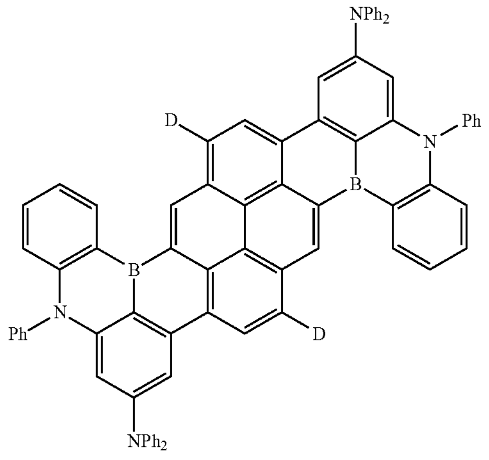
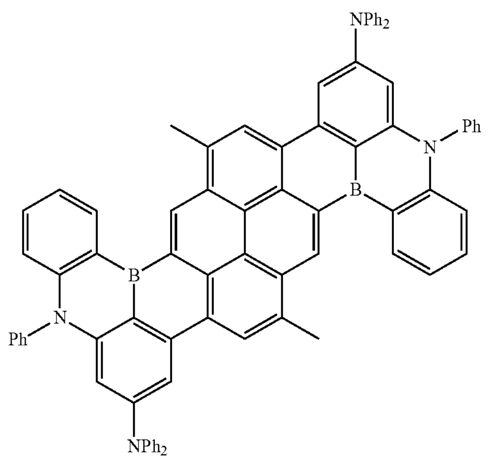
-continued
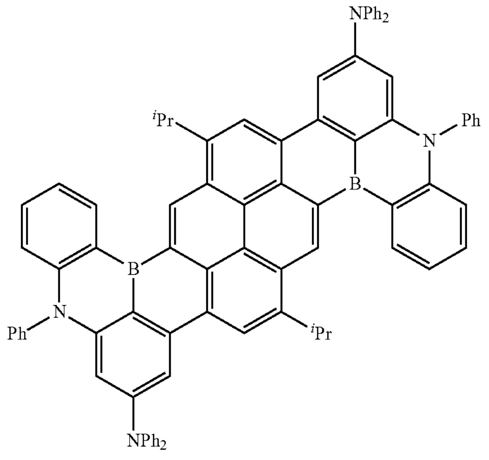
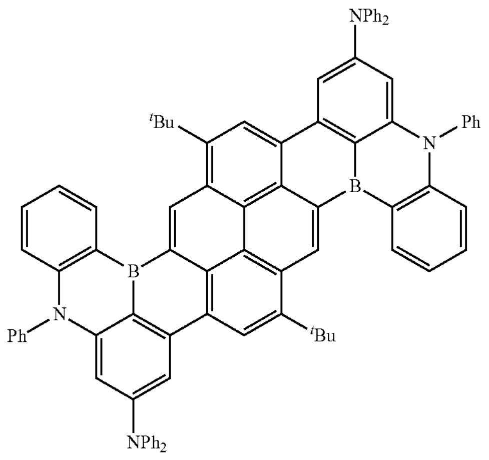
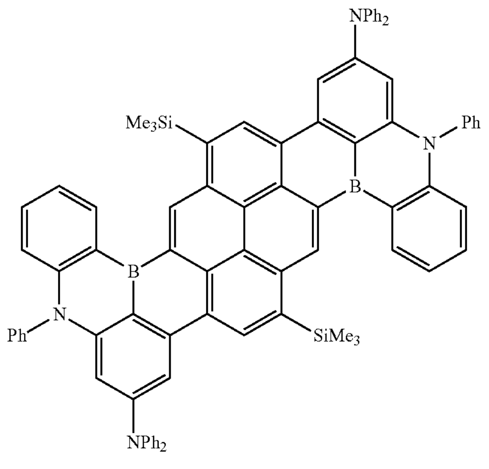

-continued
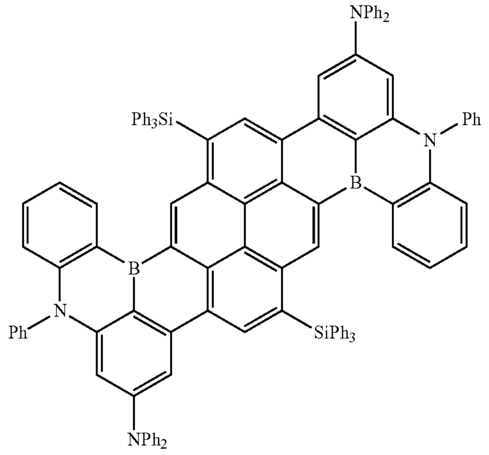
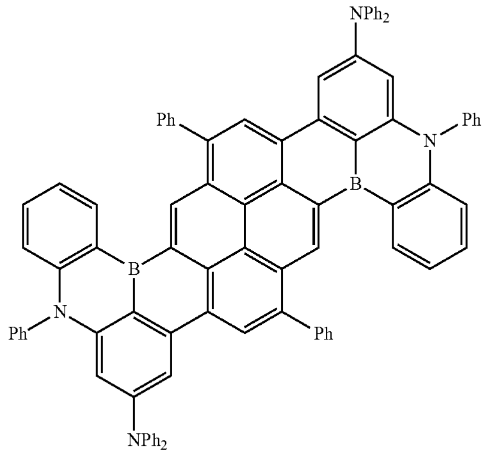
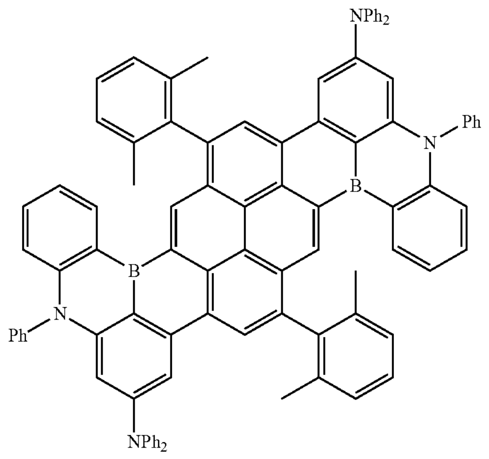
-continued
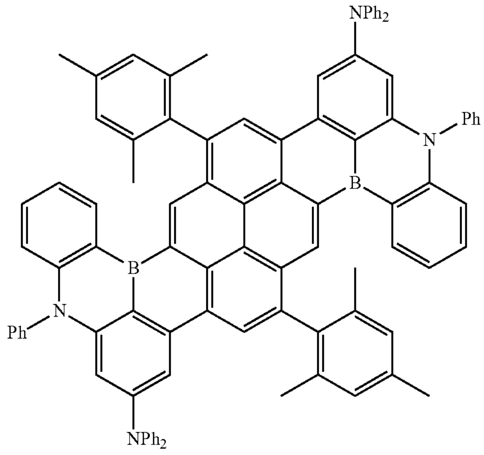
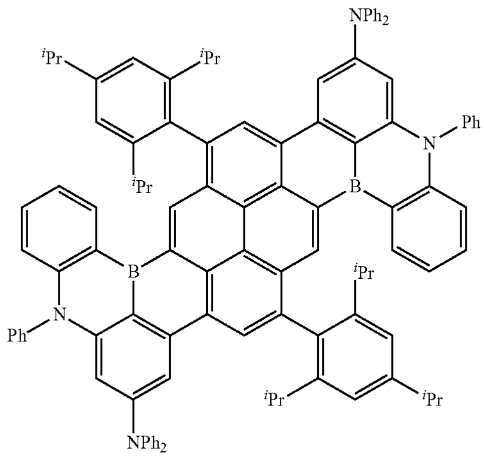
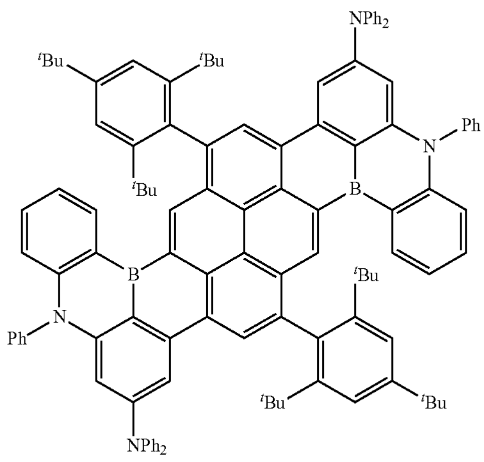

-continued
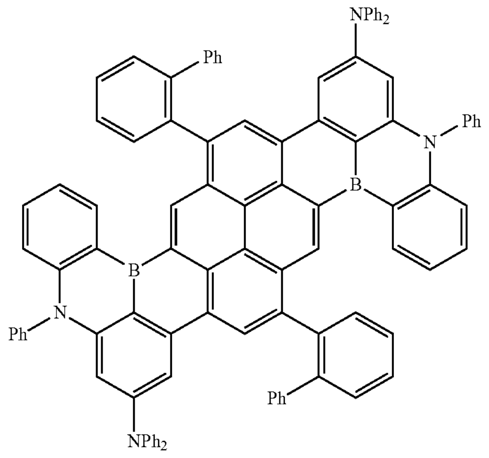
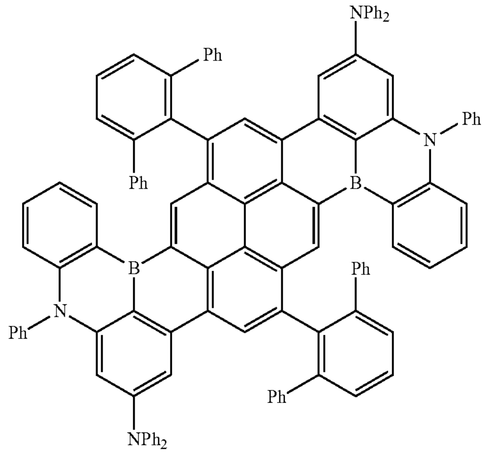
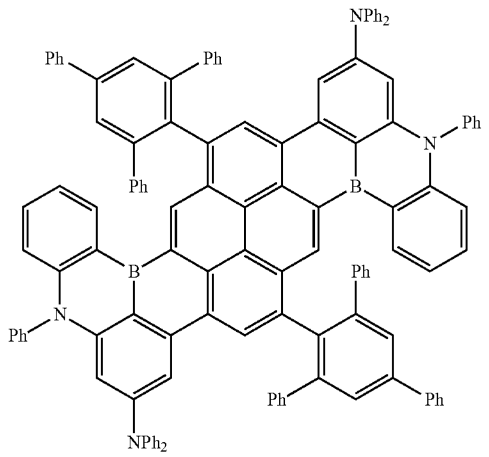
-continued
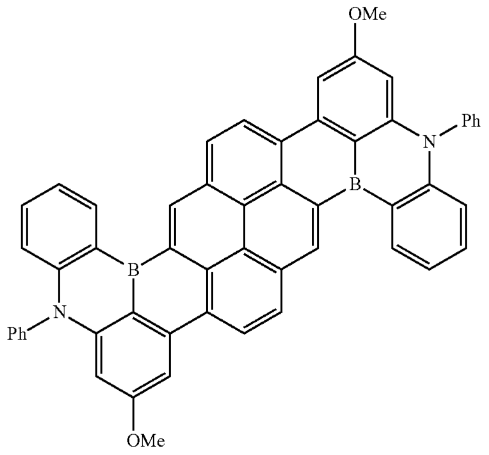
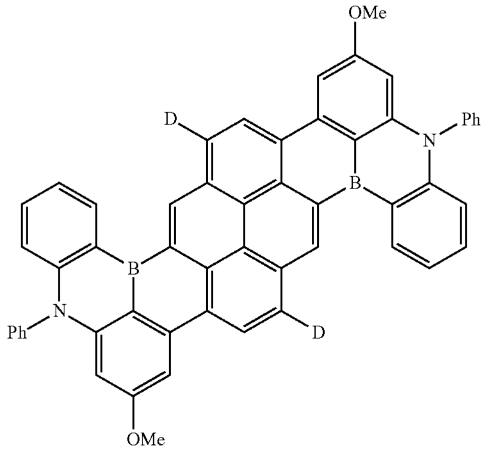
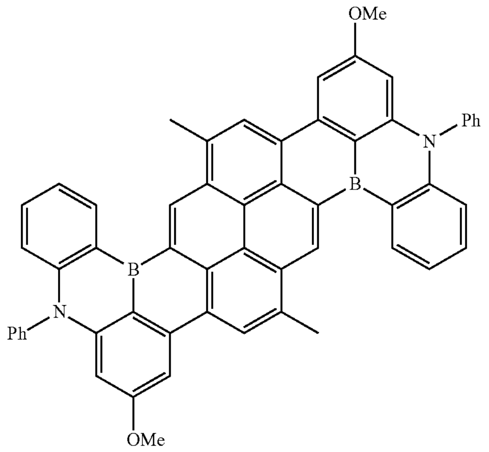

-continued
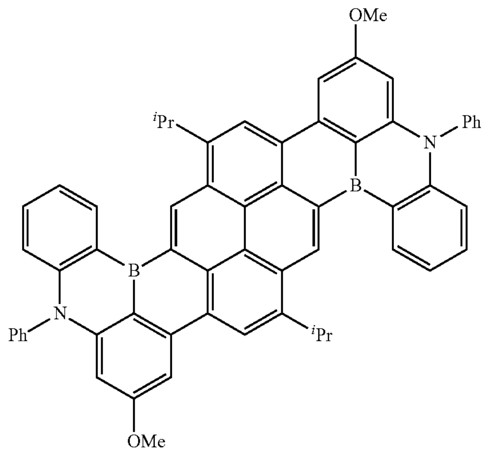
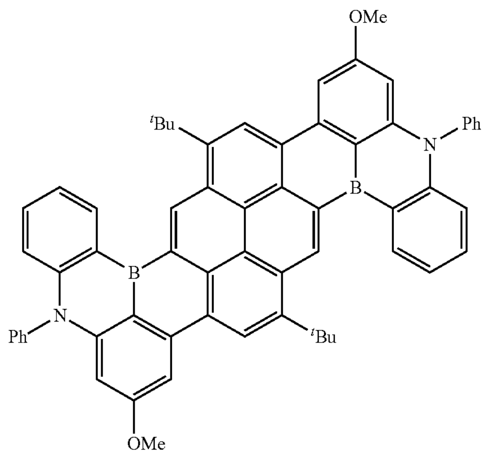
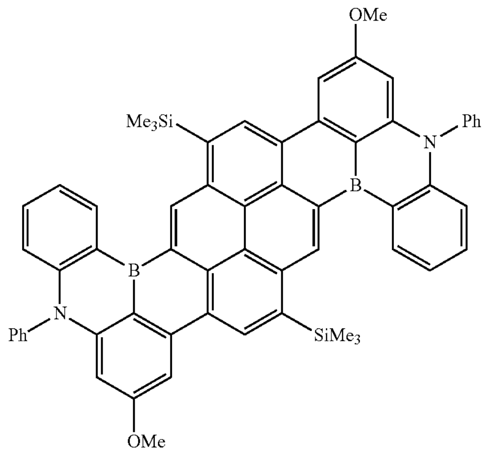
-continued
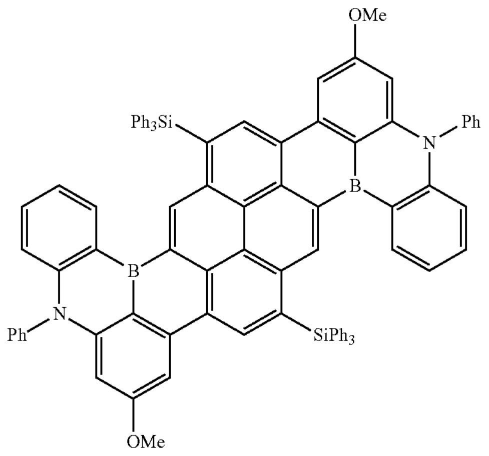
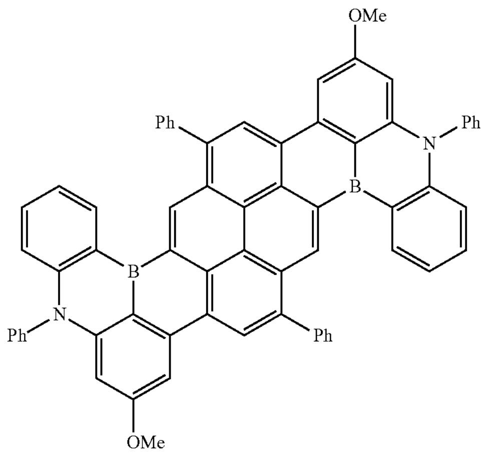
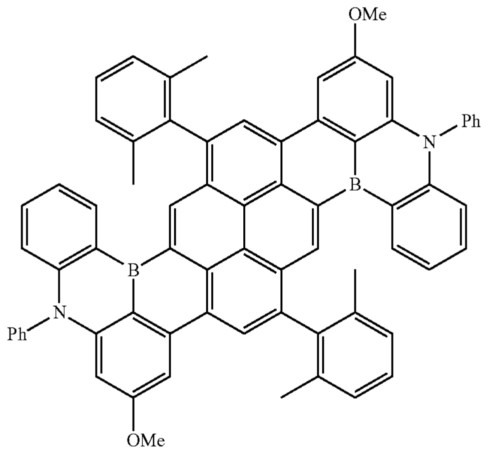

-continued
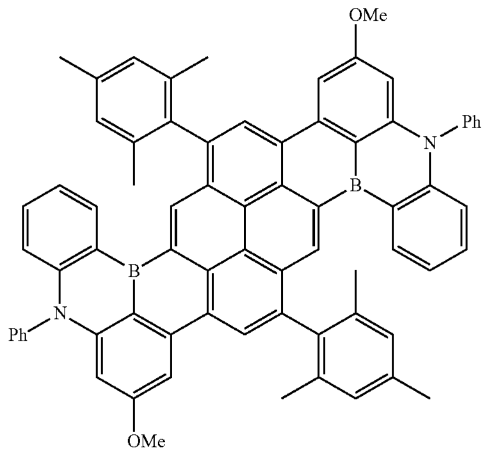
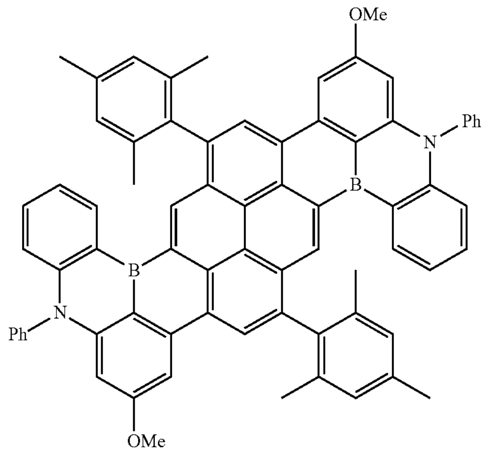
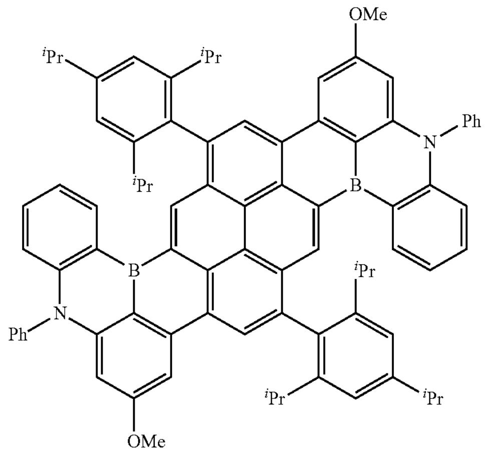
-continued
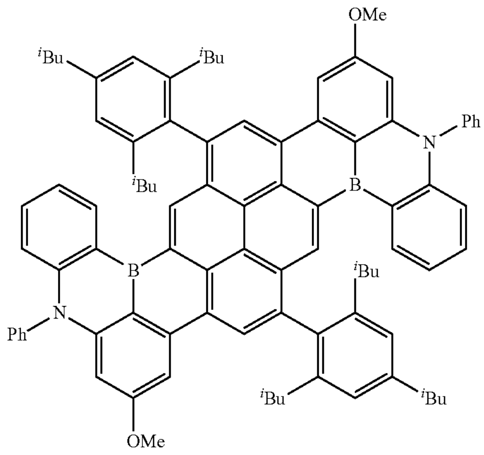
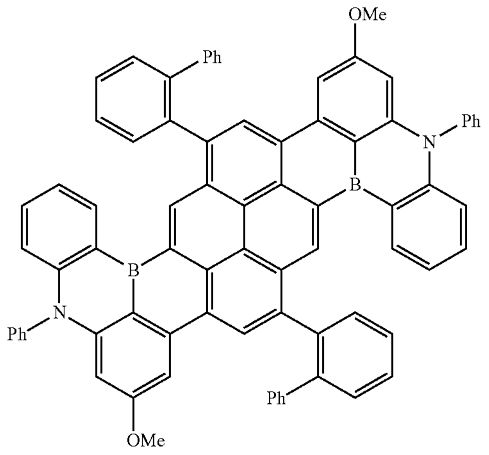
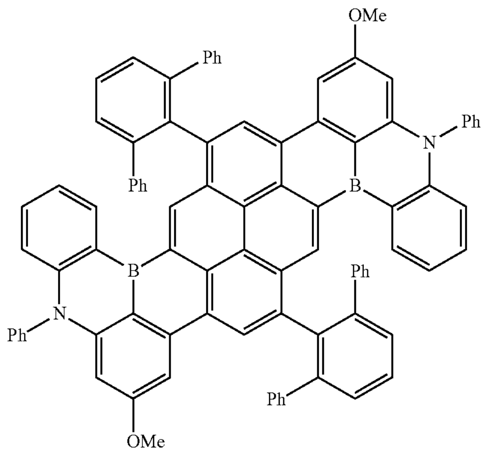

-continued
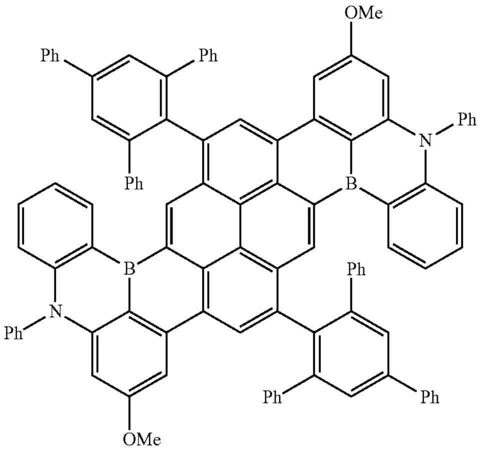
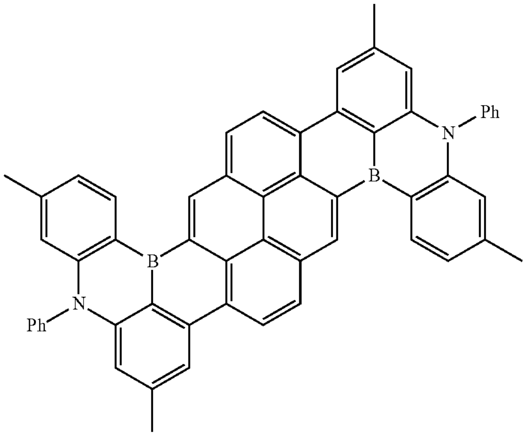
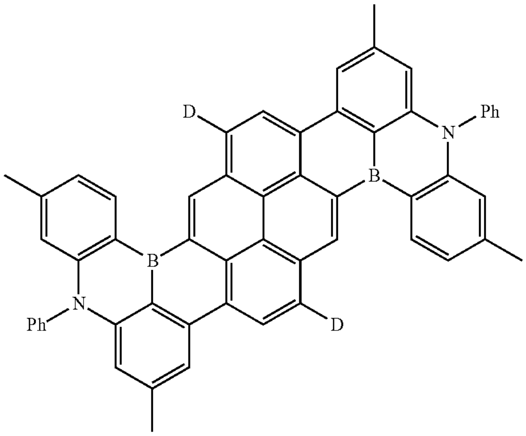
-continued
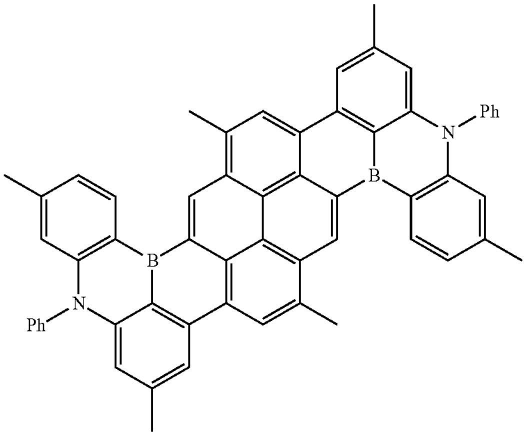
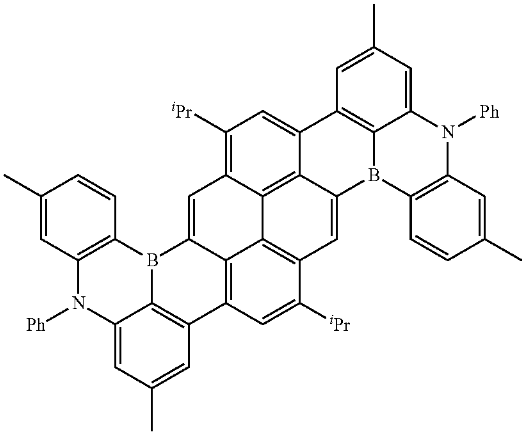
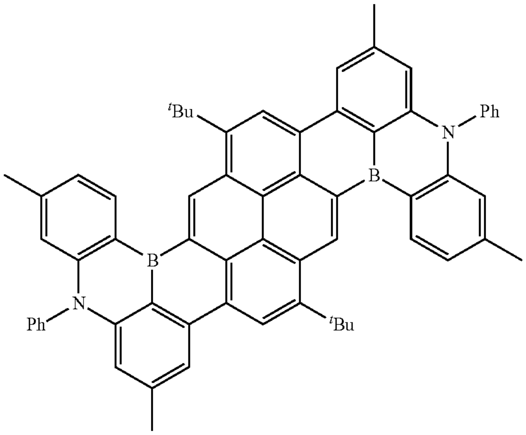

-continued
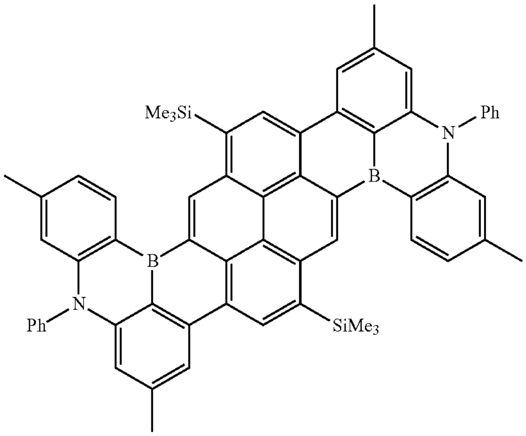
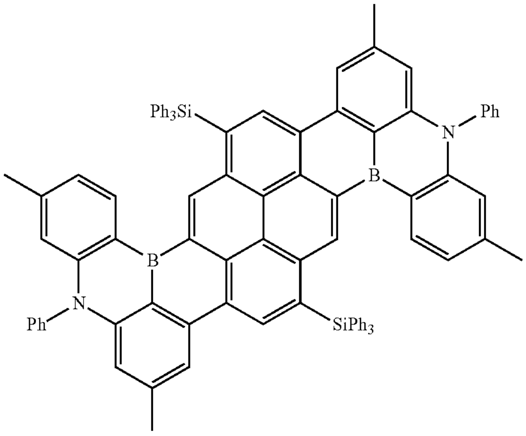
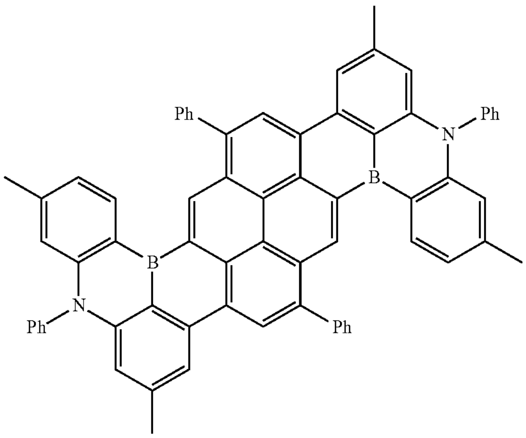
-continued
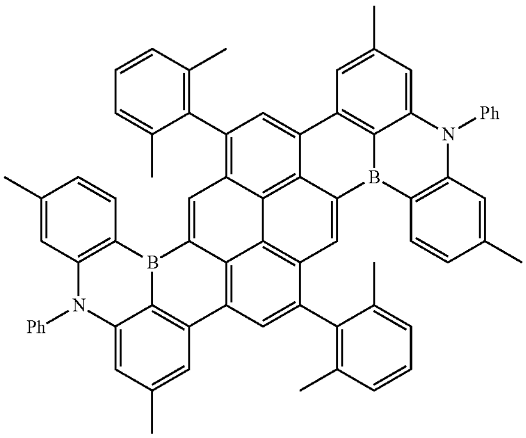
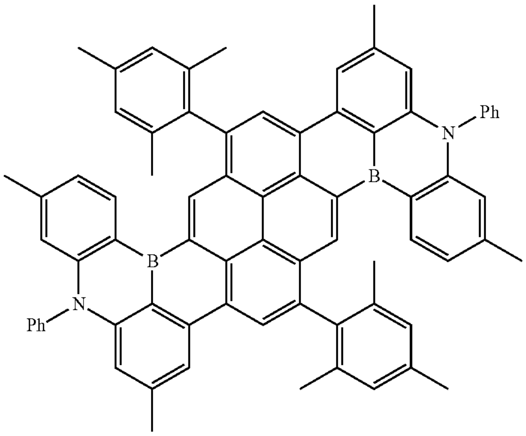
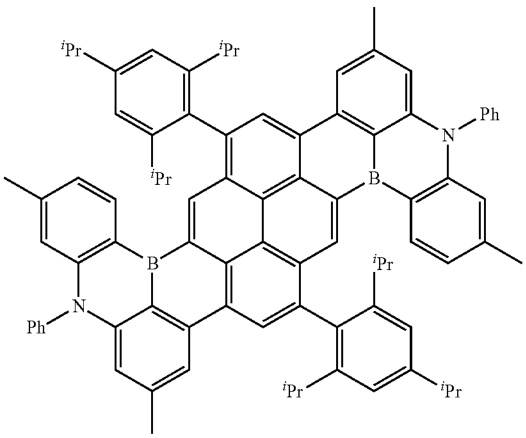

-continued
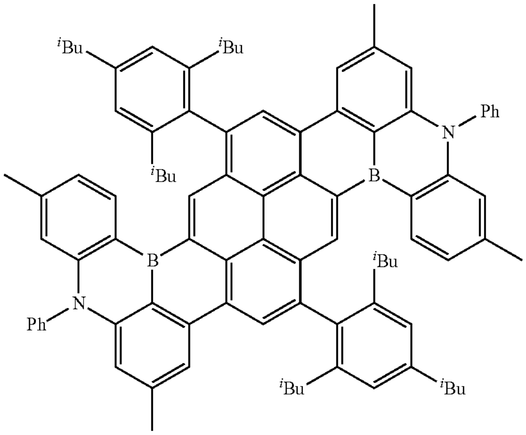
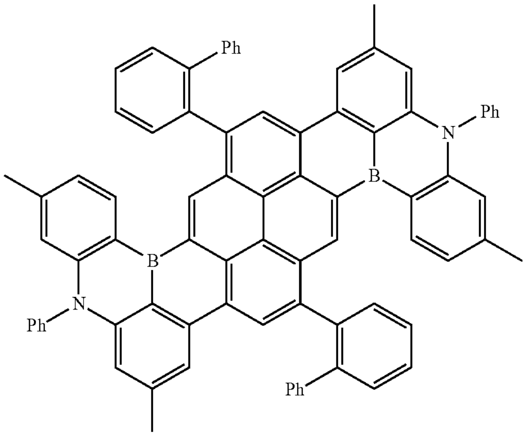
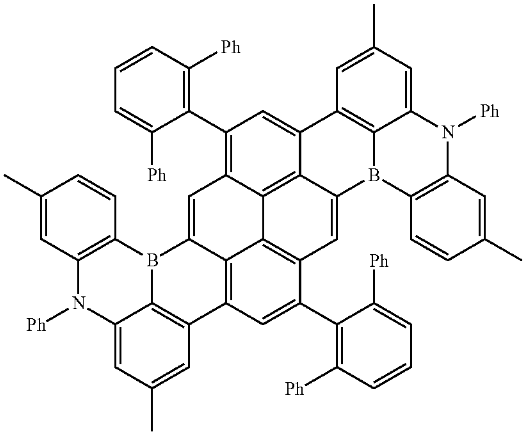
-continued
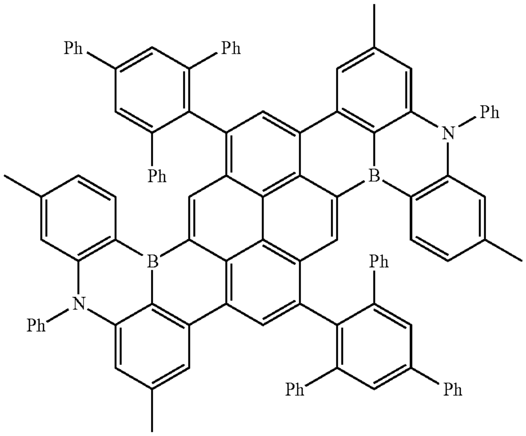
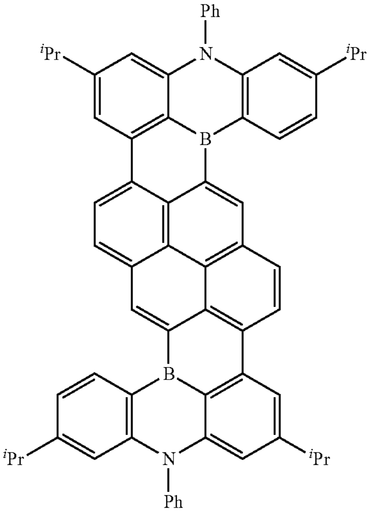
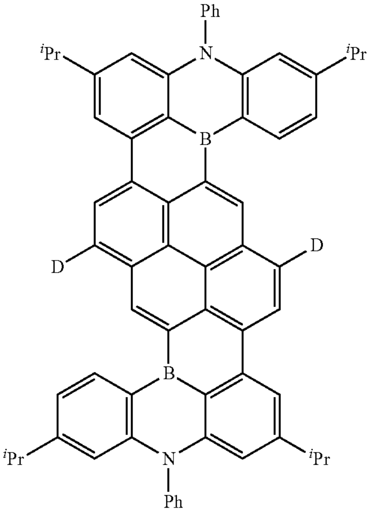

-continued
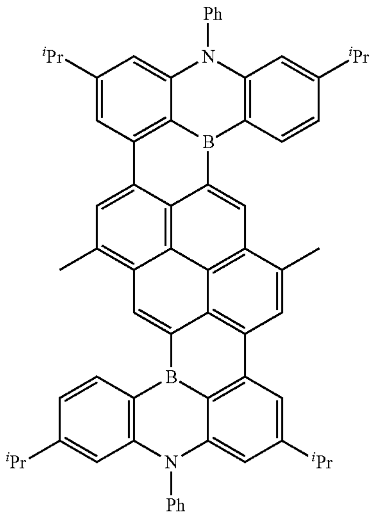
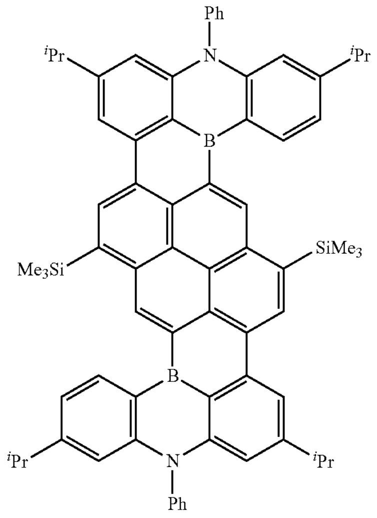
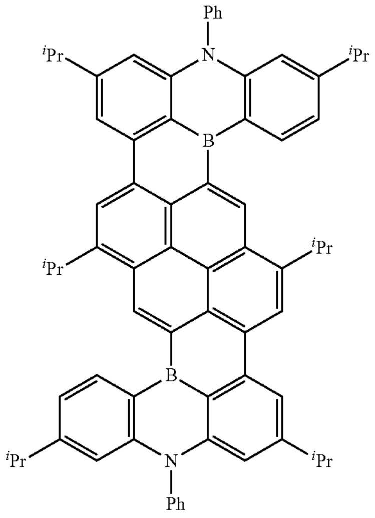
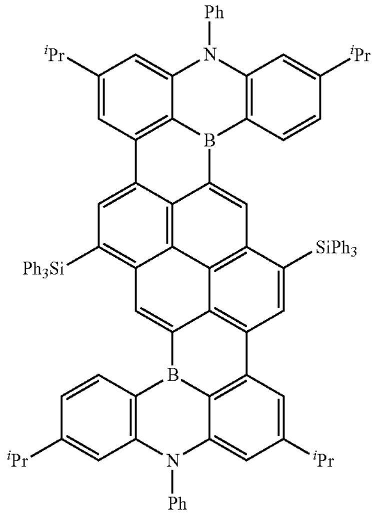
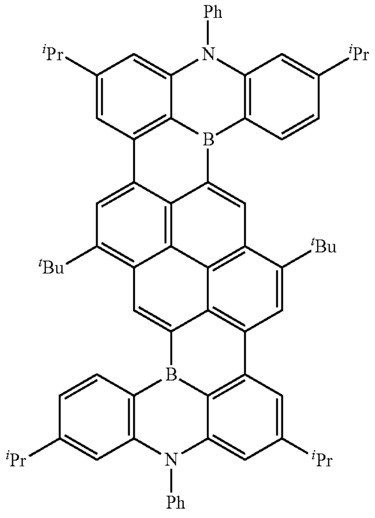
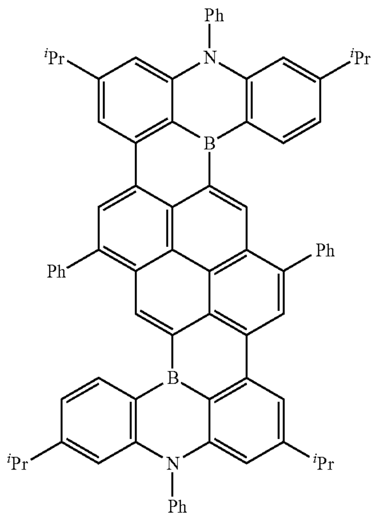
-continued -continued
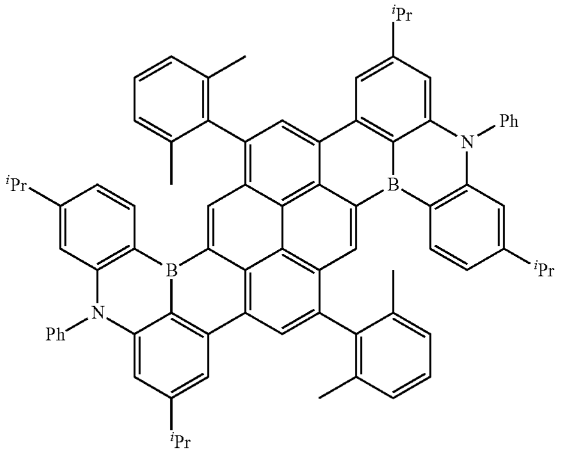
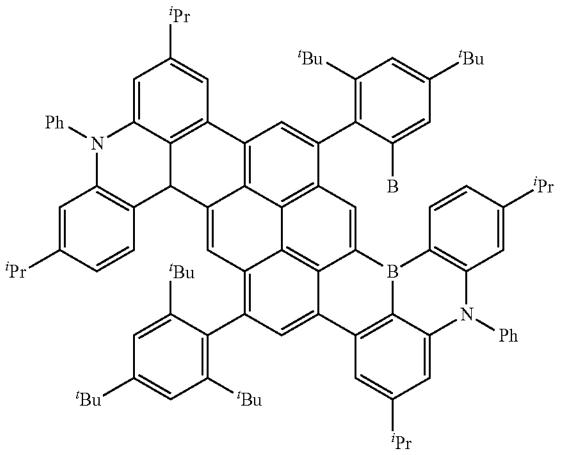
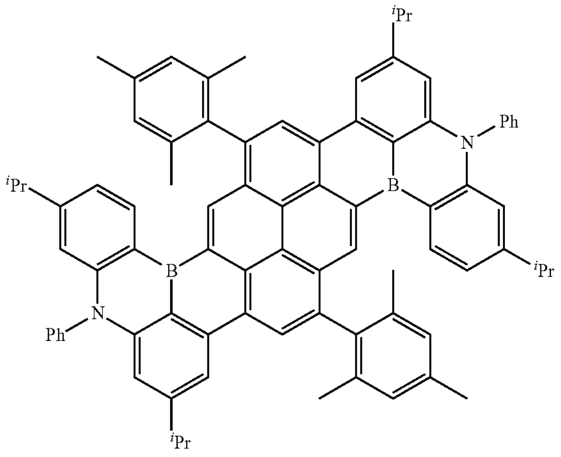
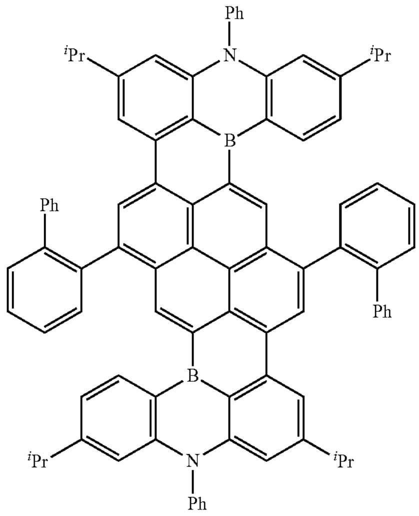
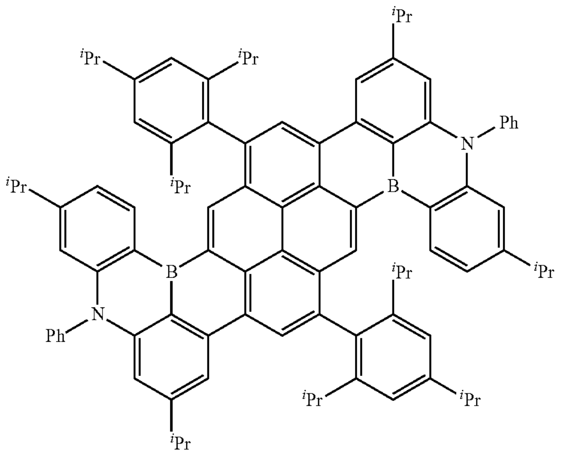
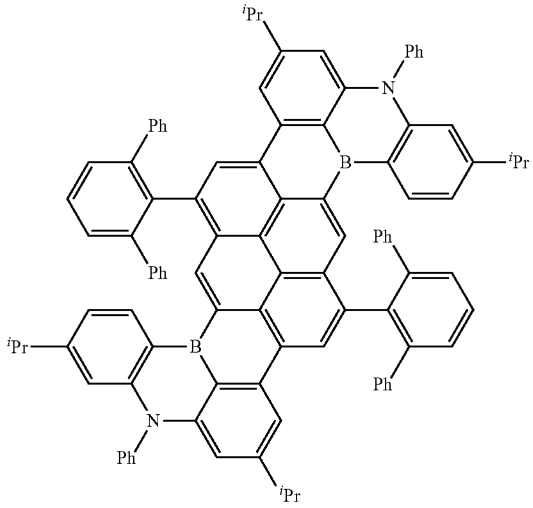
-continued -continued
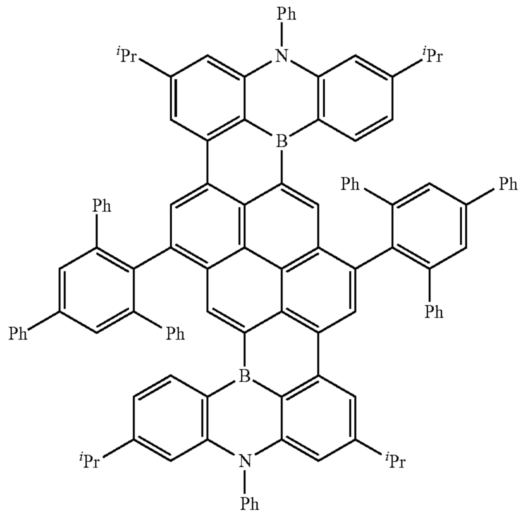
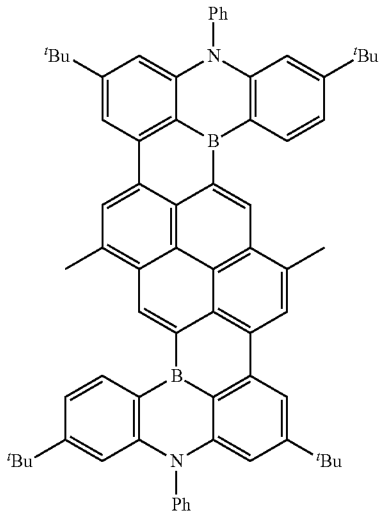
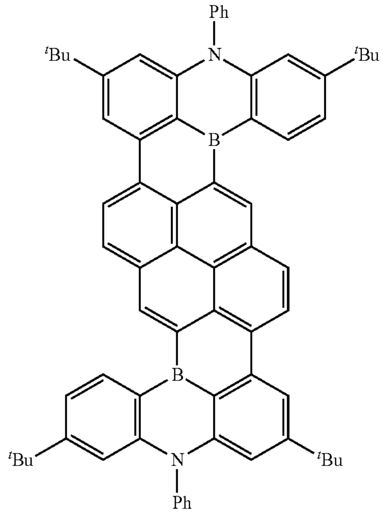
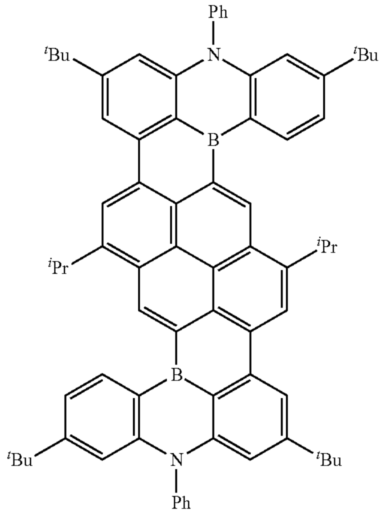
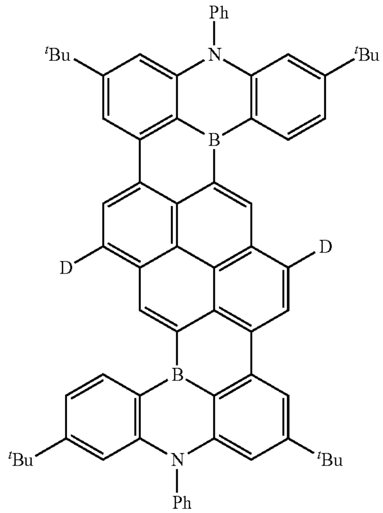
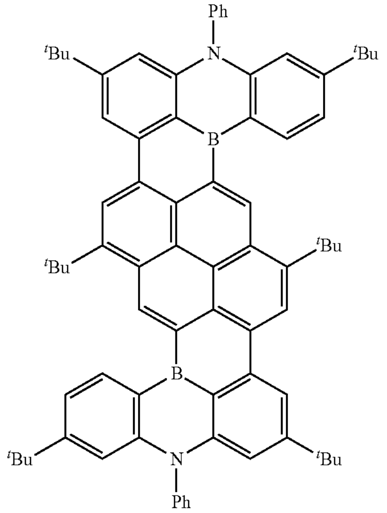
-continued -continued
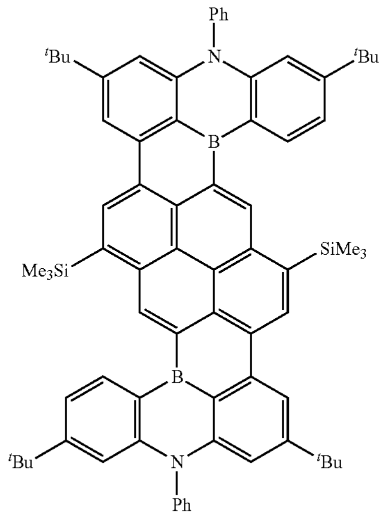
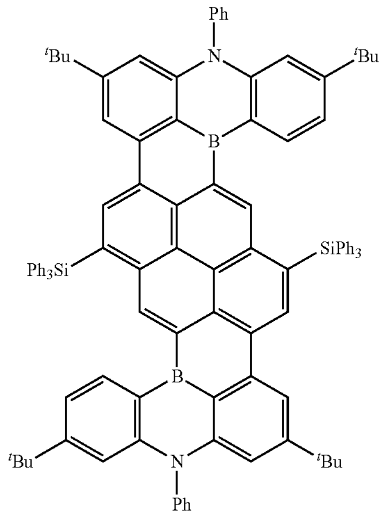
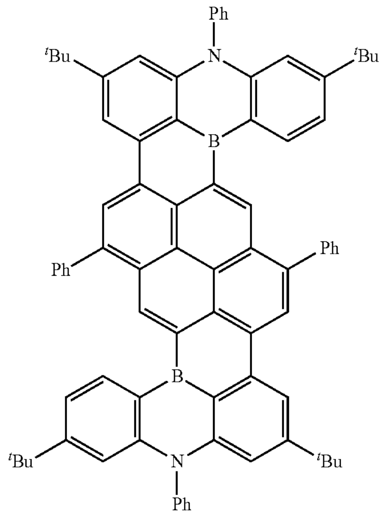
-continued
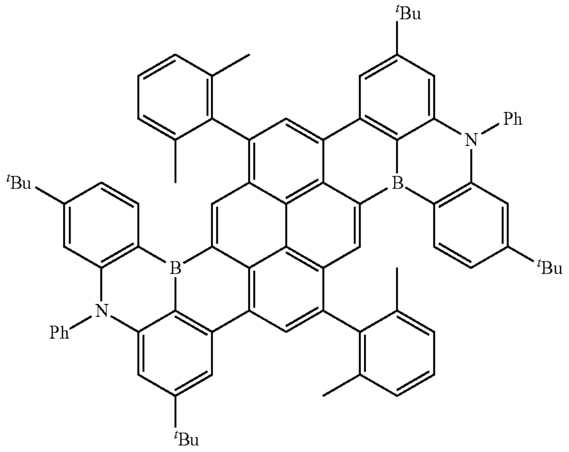
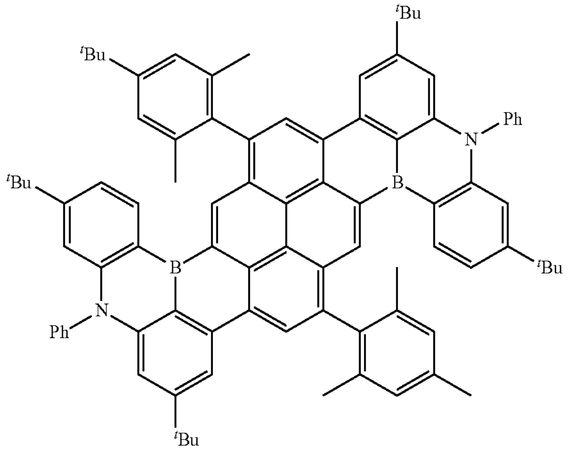
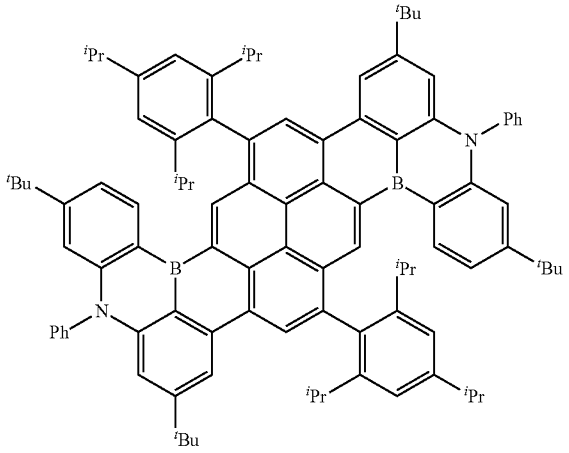

-continued
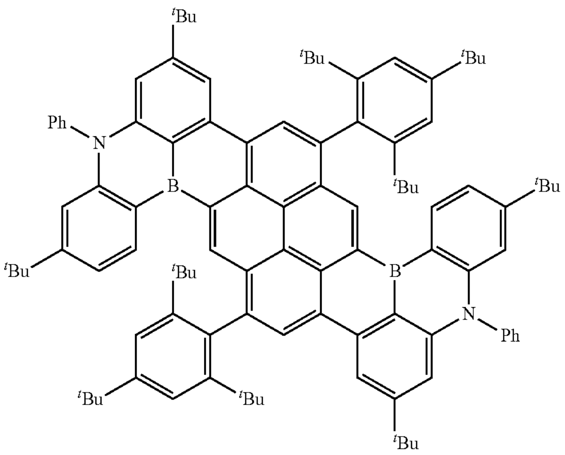
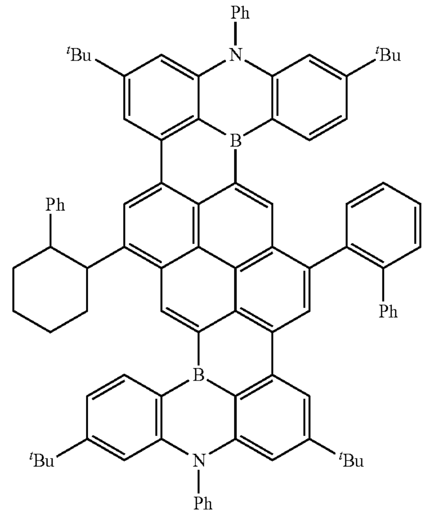
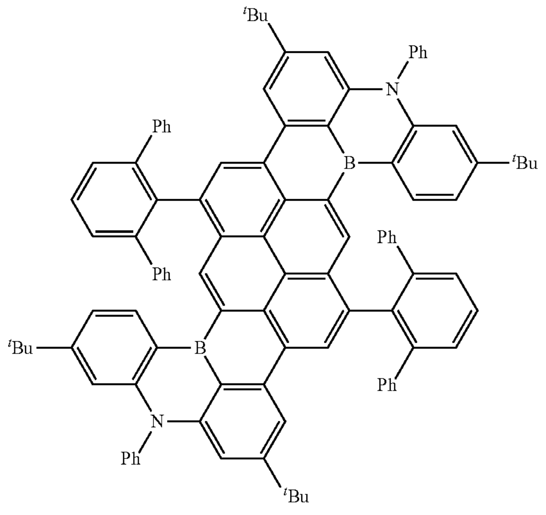
-continued
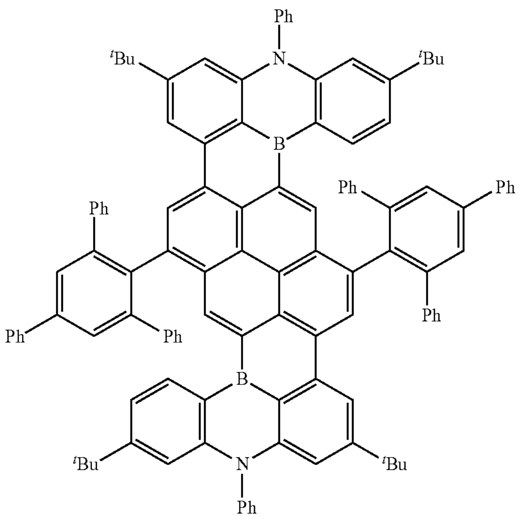
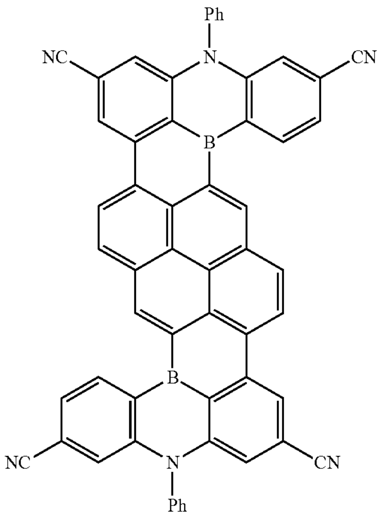
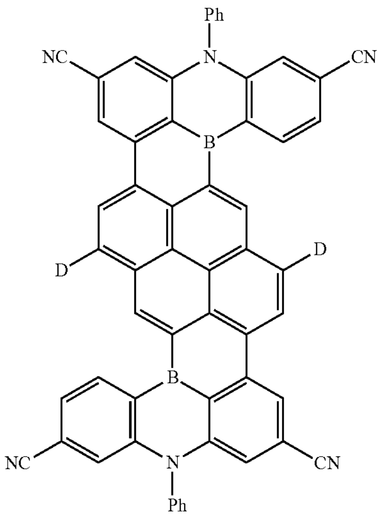

-continued
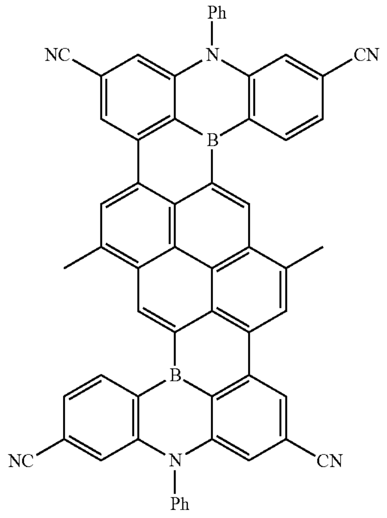
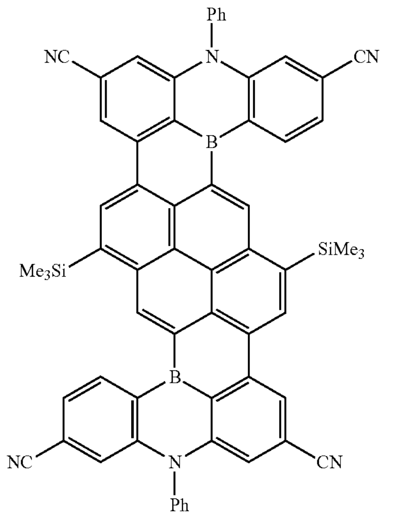
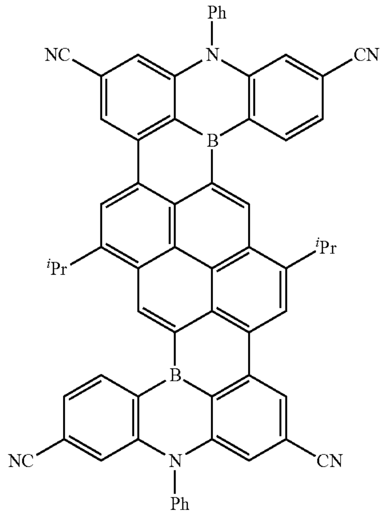
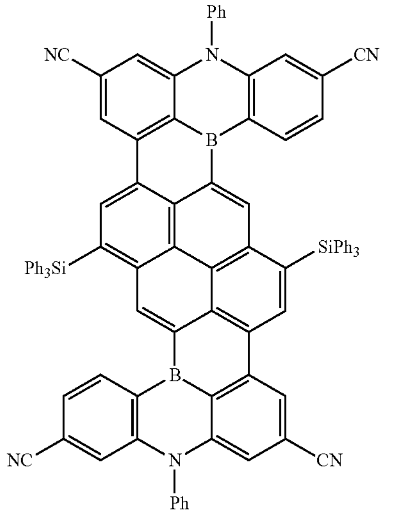
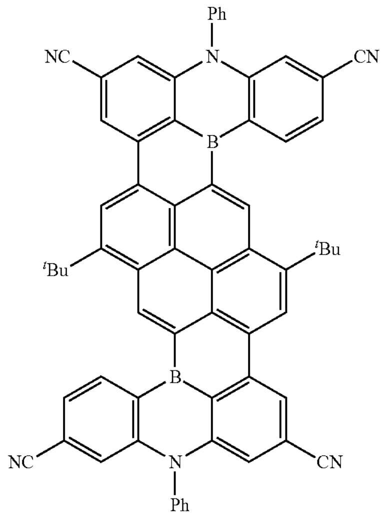
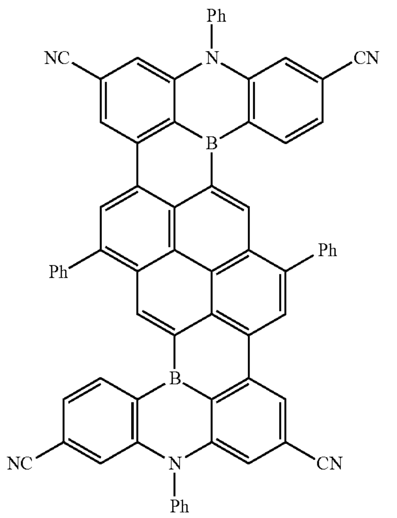
-continued -continued
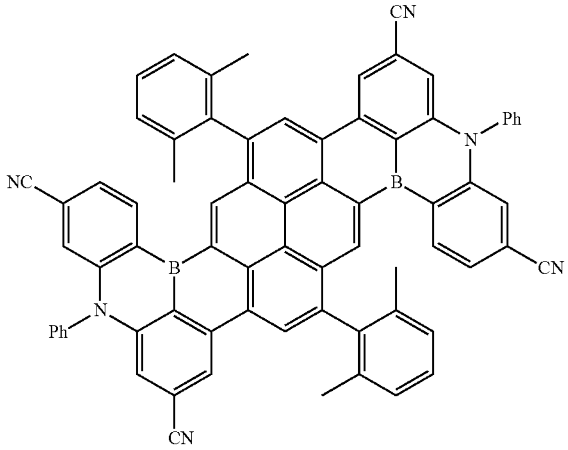
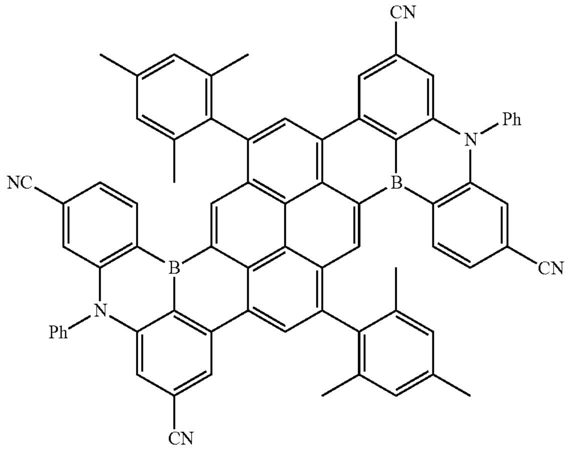
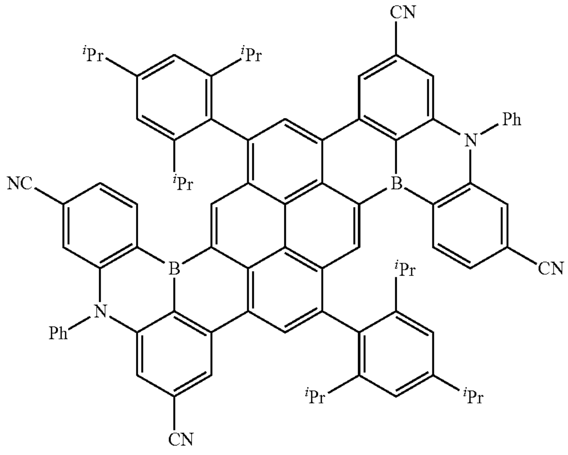
-continued
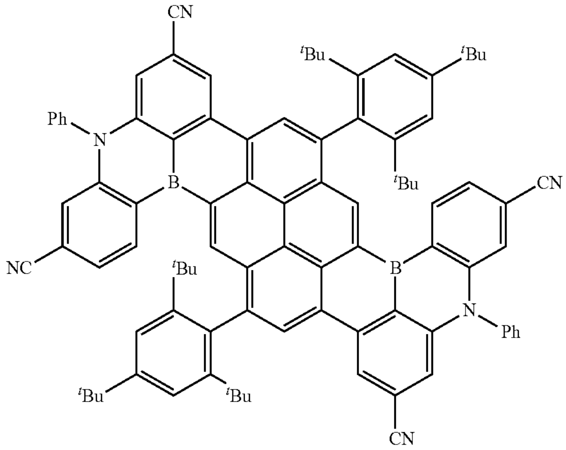
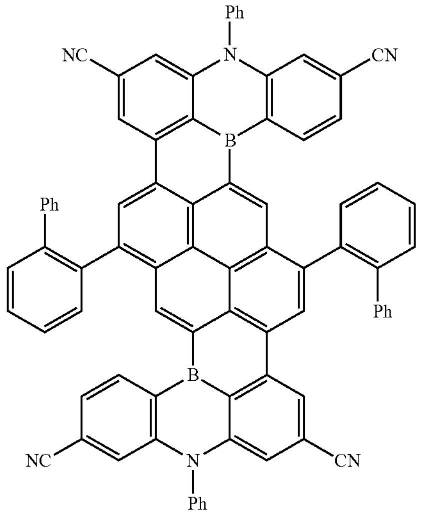
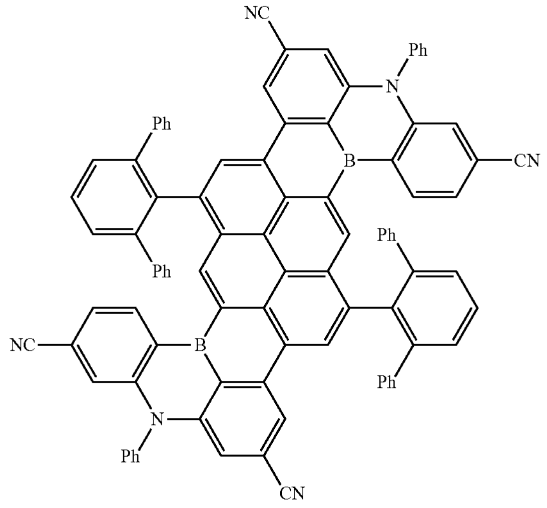

-continued
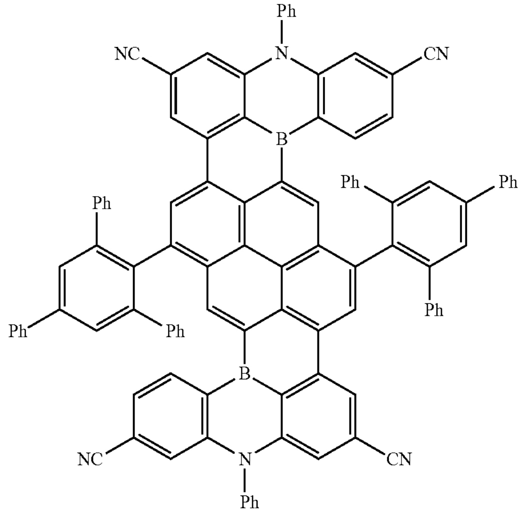
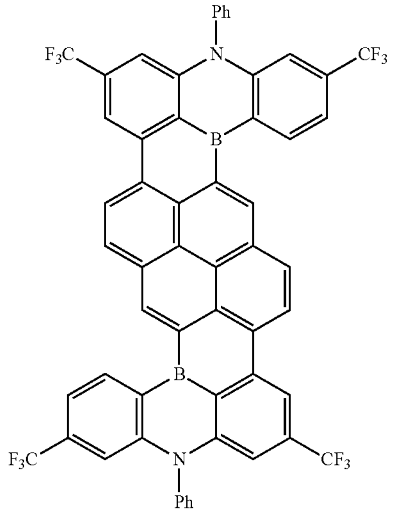
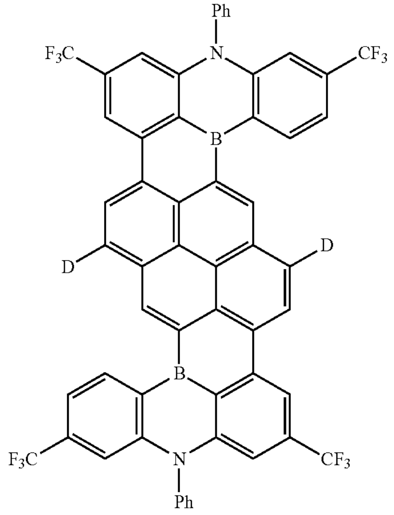
-continued
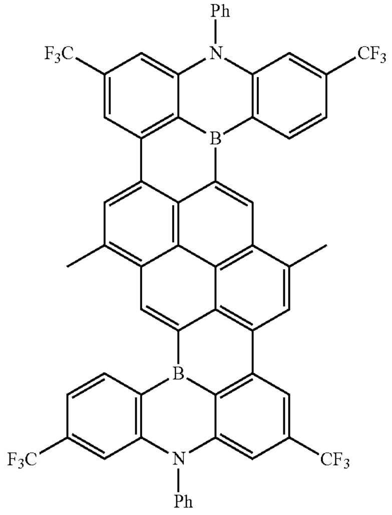
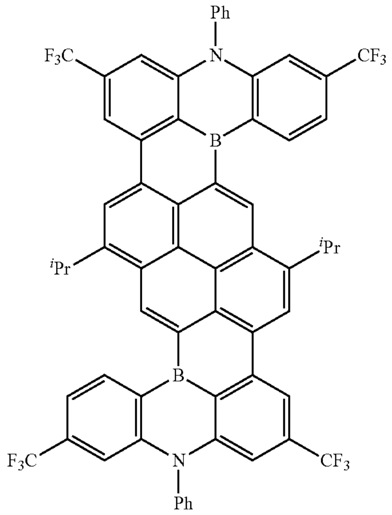
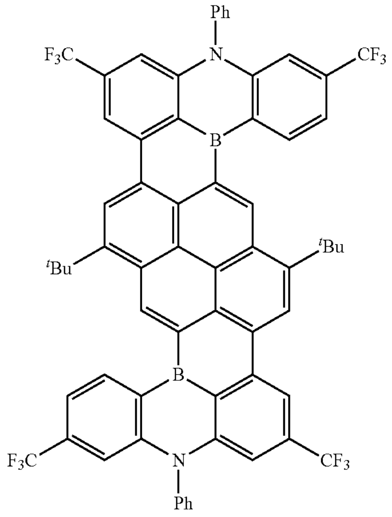

-continued
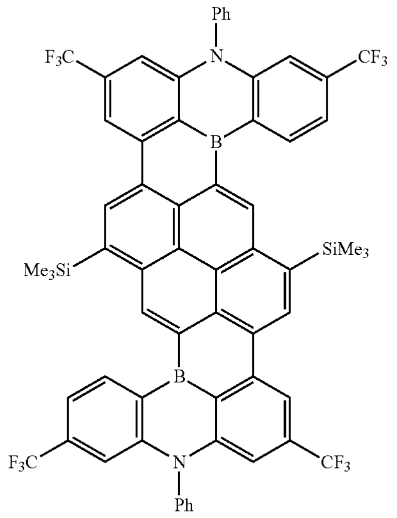
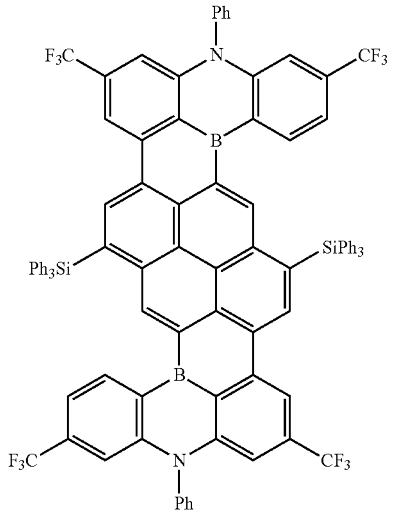
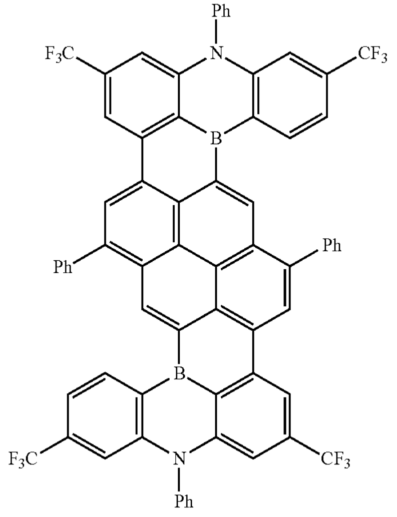
-continued
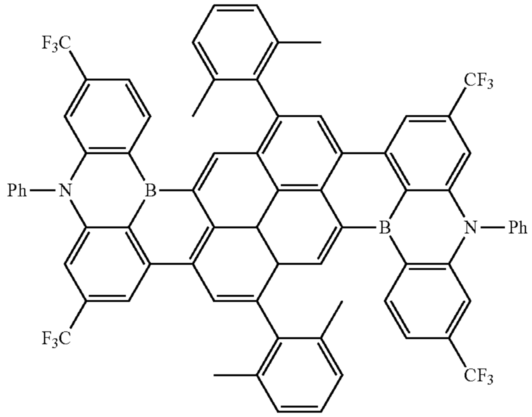
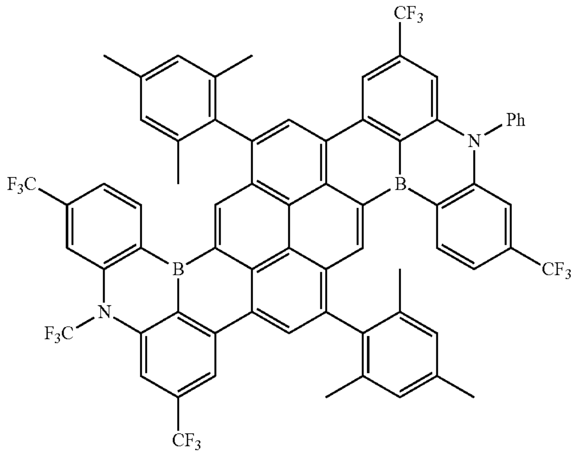
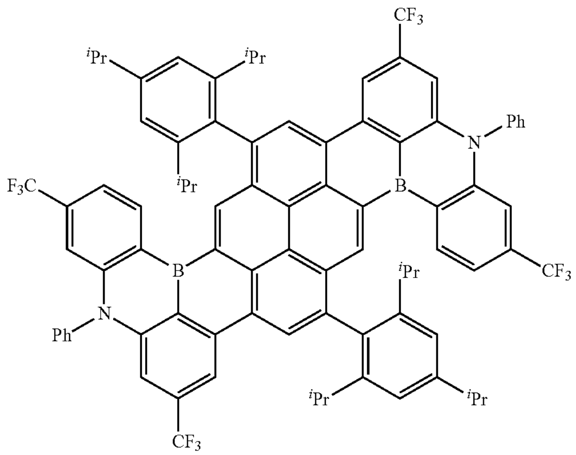

-continued
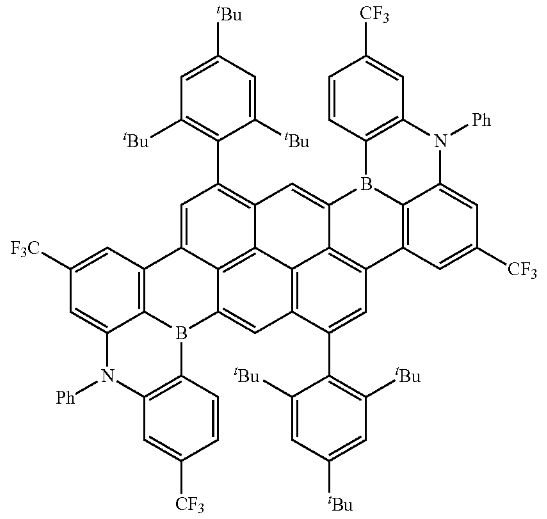
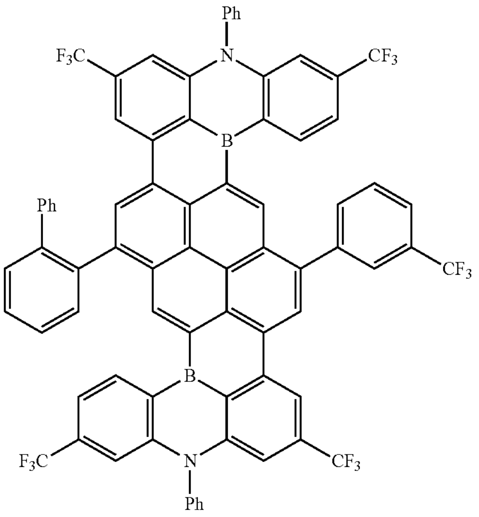
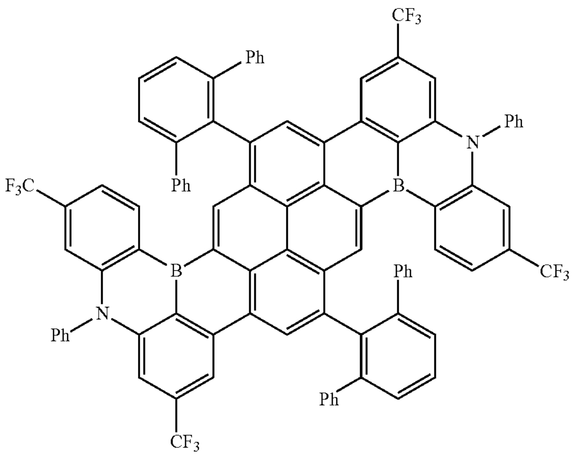
-continued
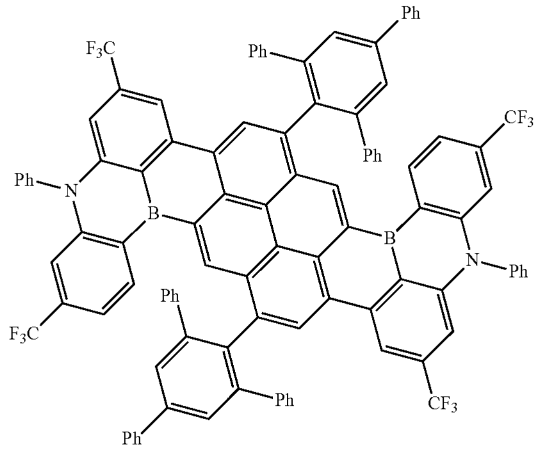
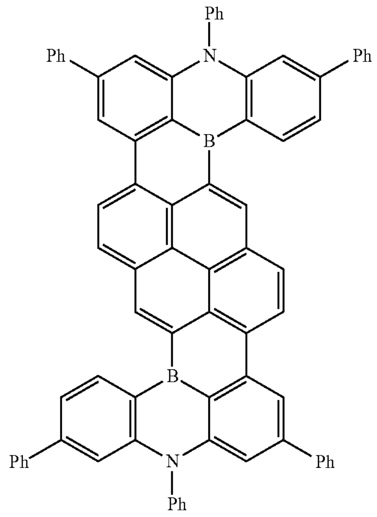
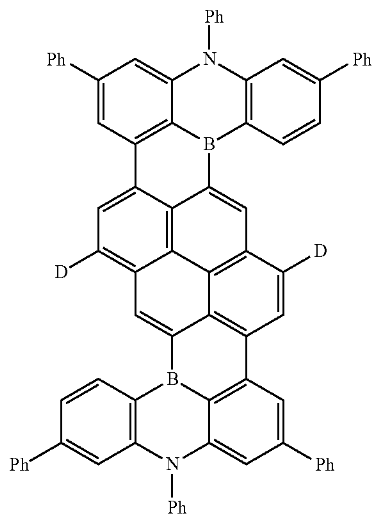

-continued
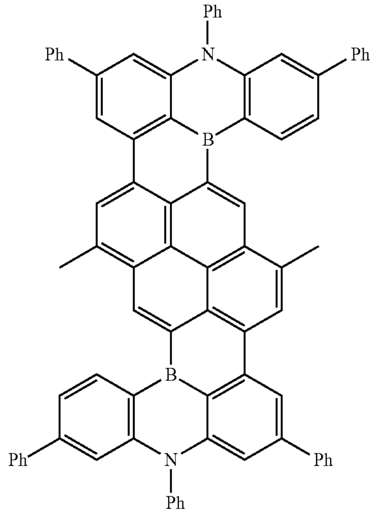
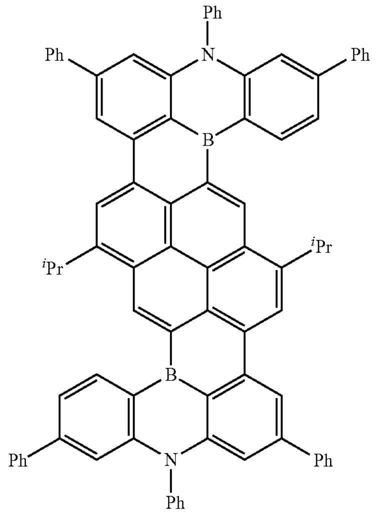
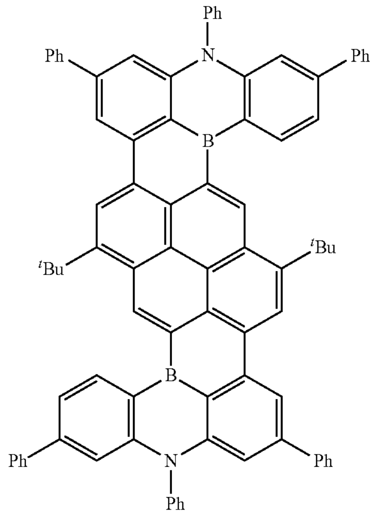
-continued
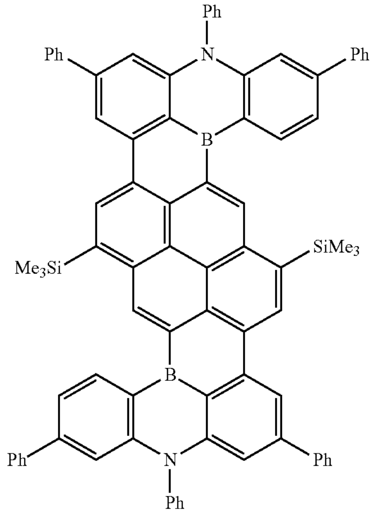
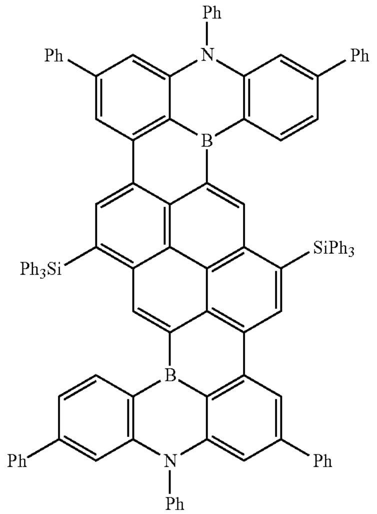
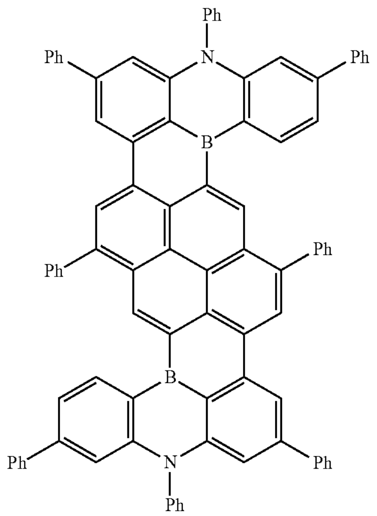

-continued
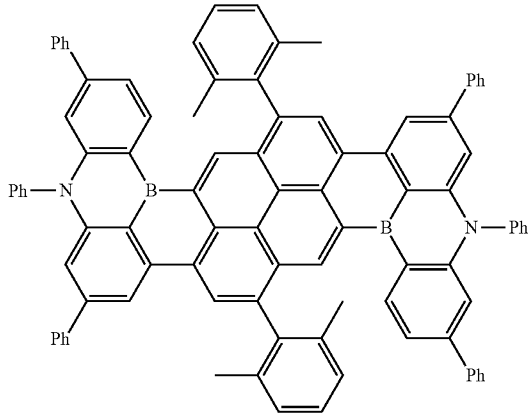
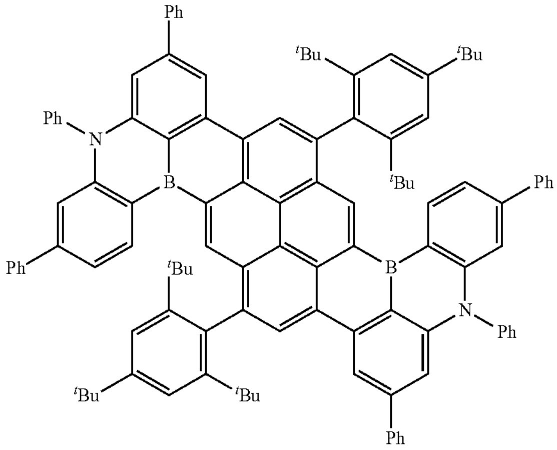
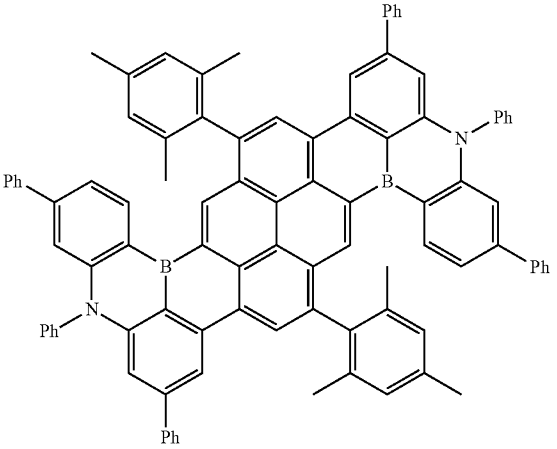
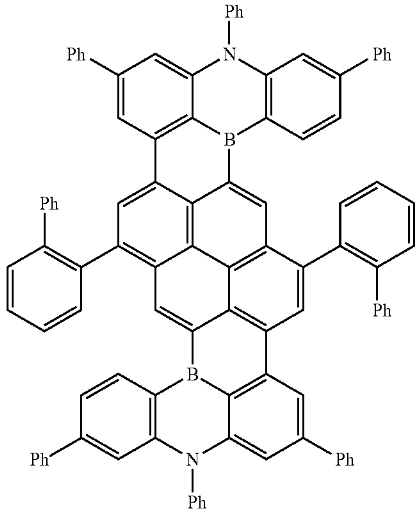
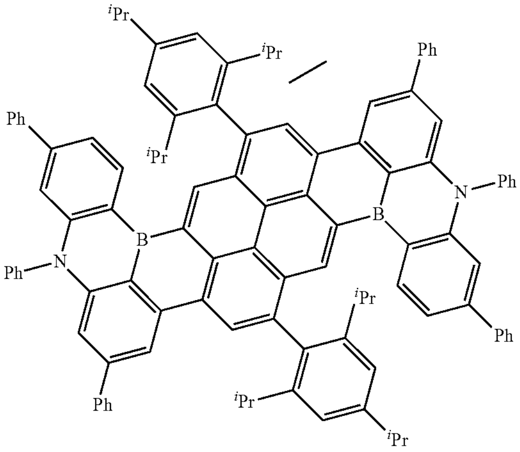
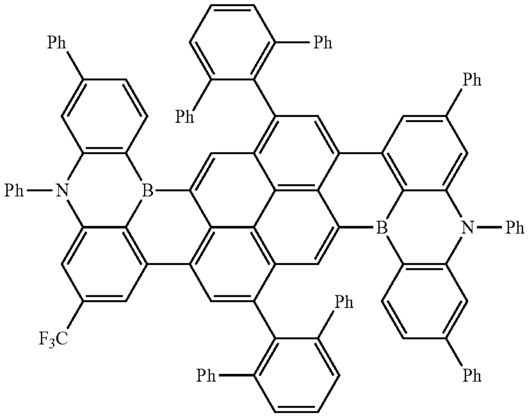

-continued
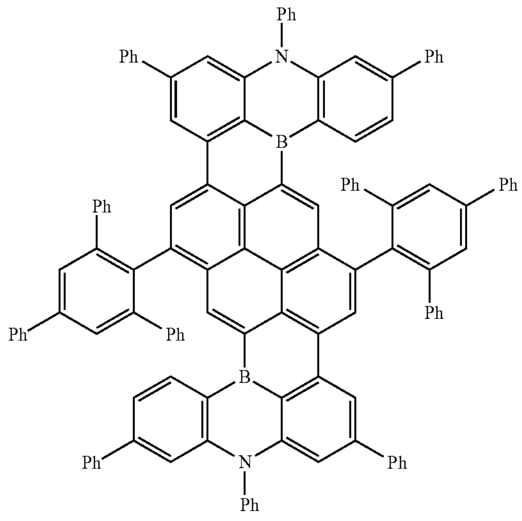
-continued
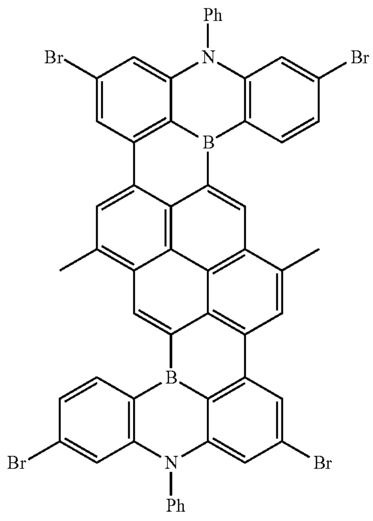
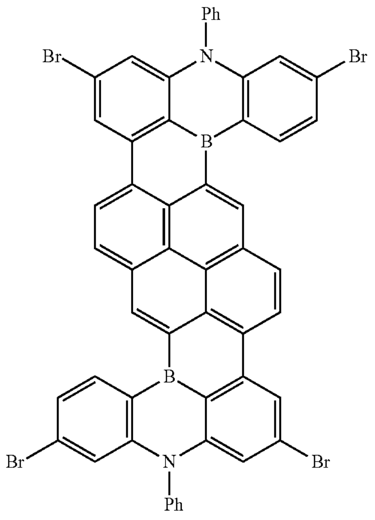
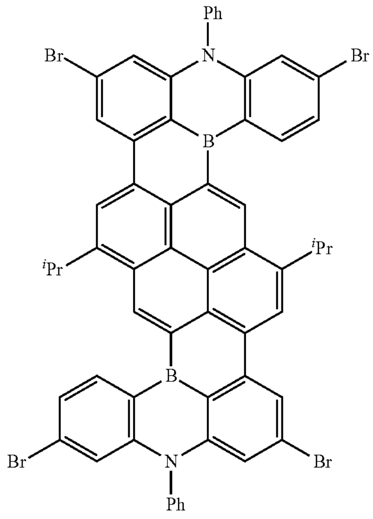
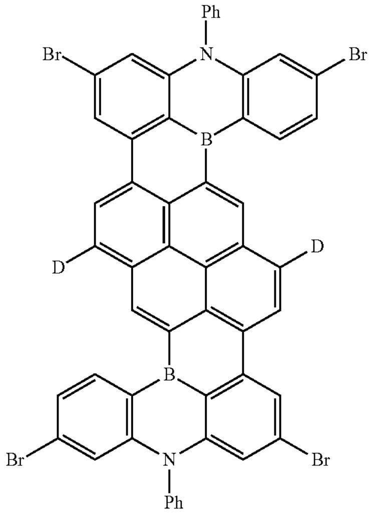
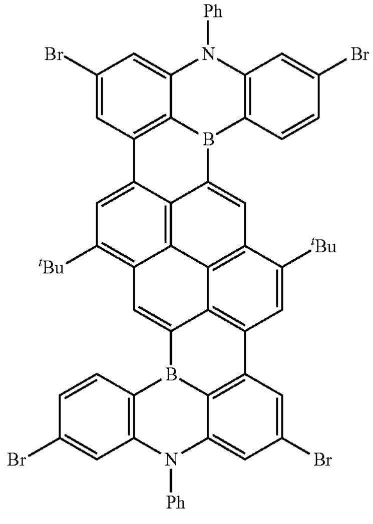

-continued
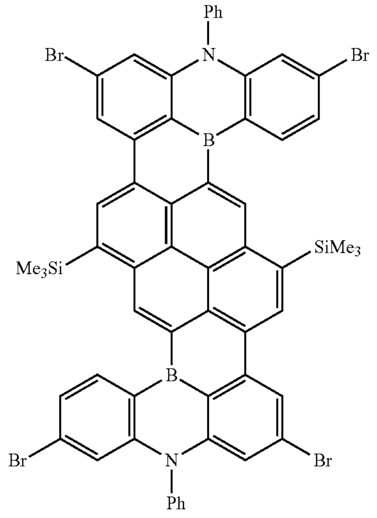
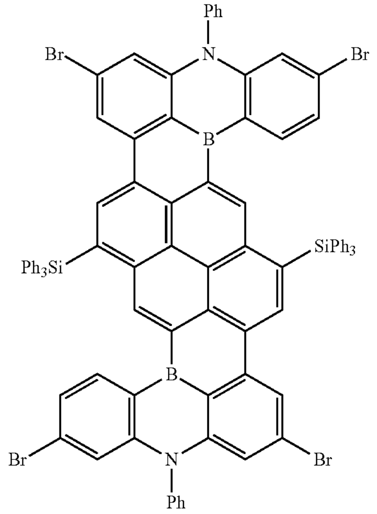
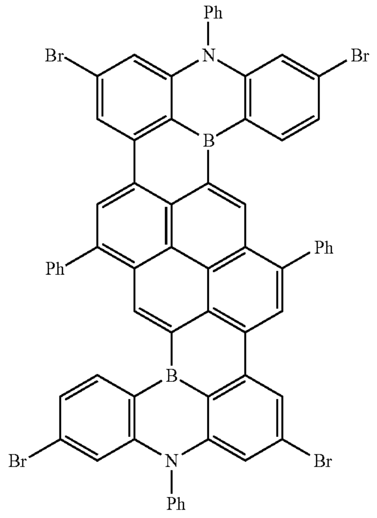
-continued
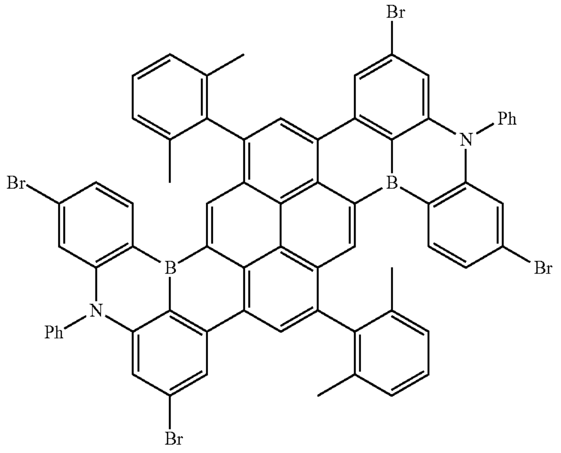
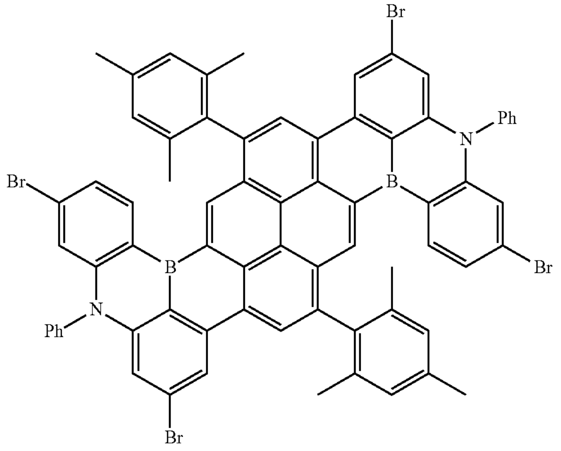
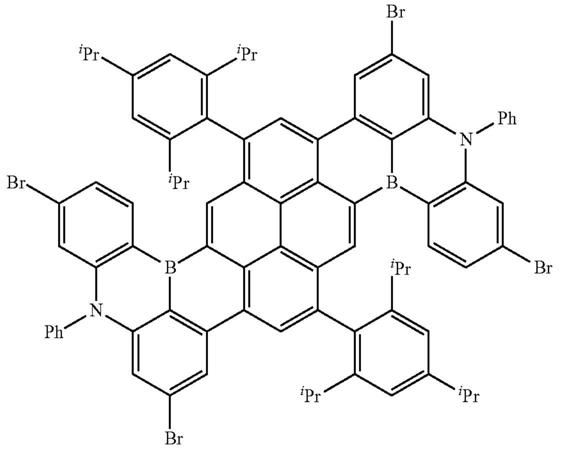

-continued
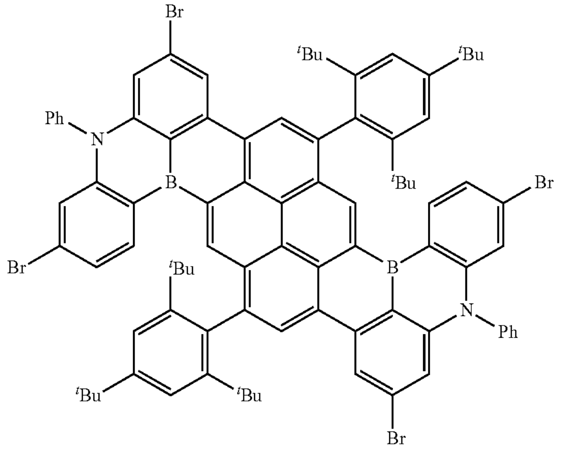
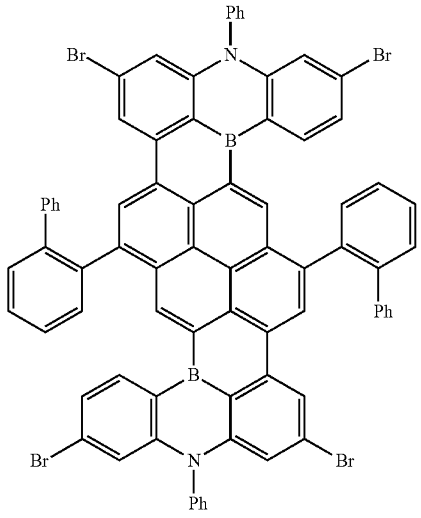
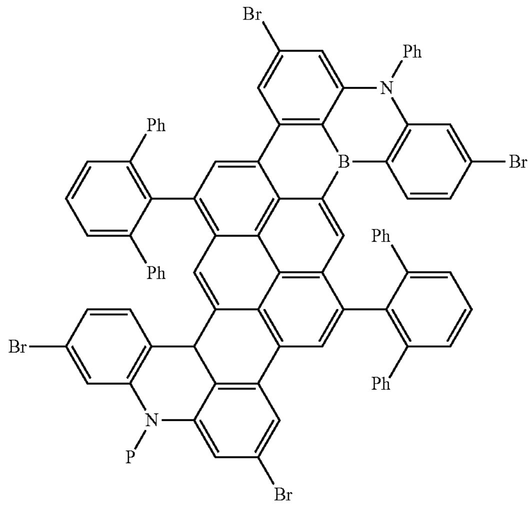
-continued
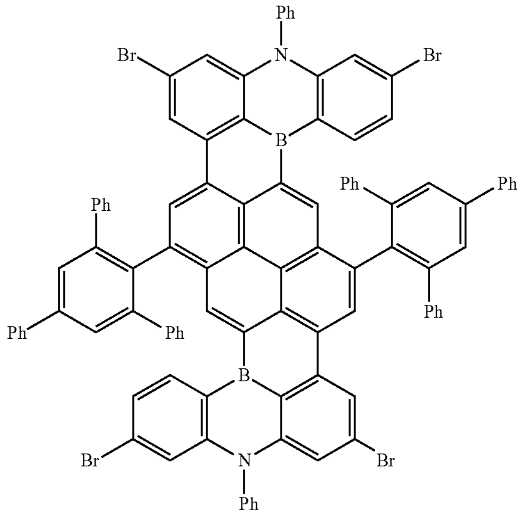
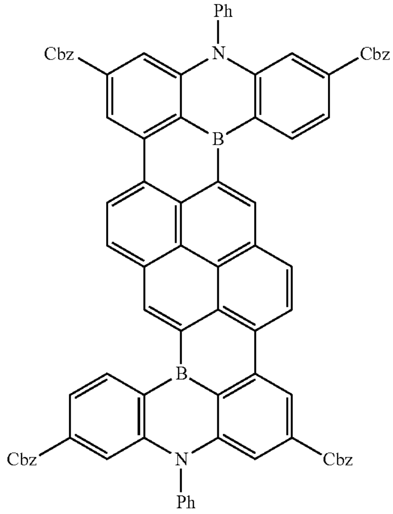
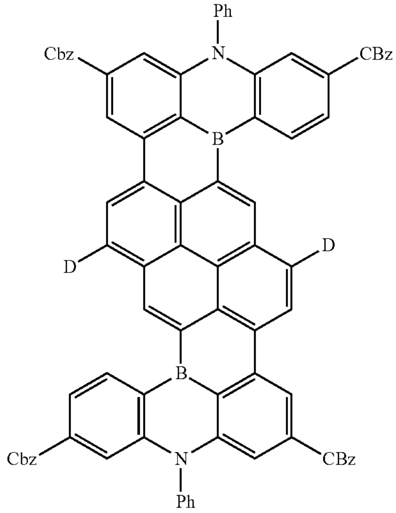

-continued
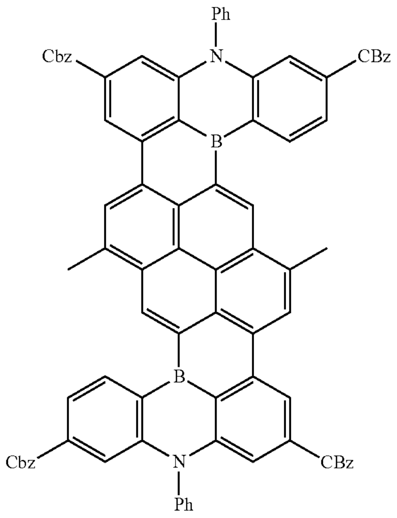
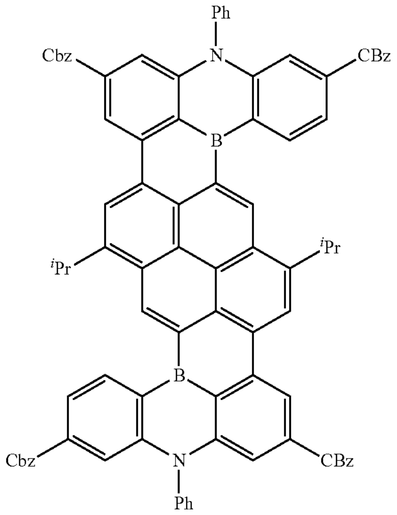
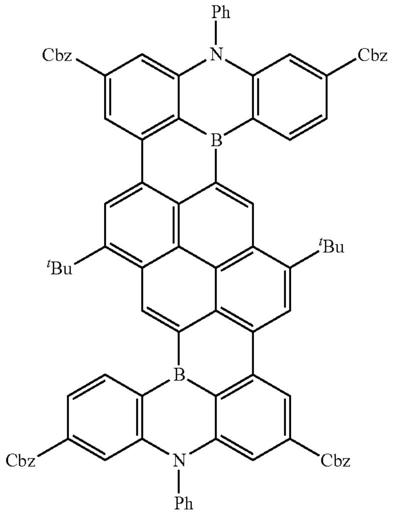
-continued
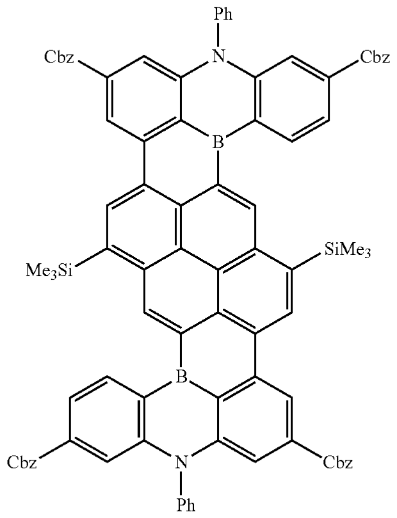
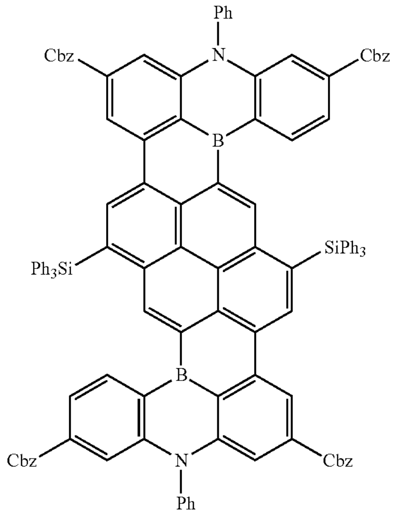
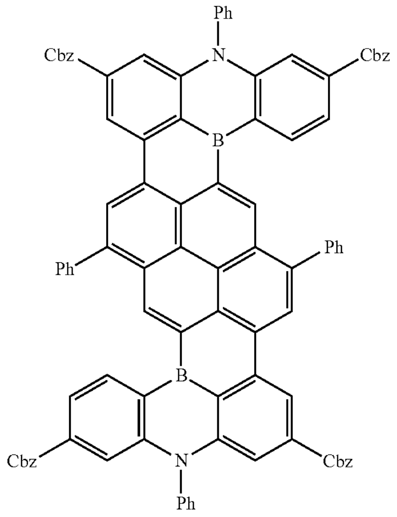

-continued
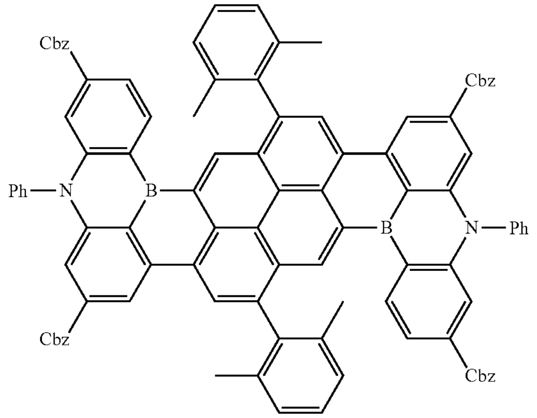
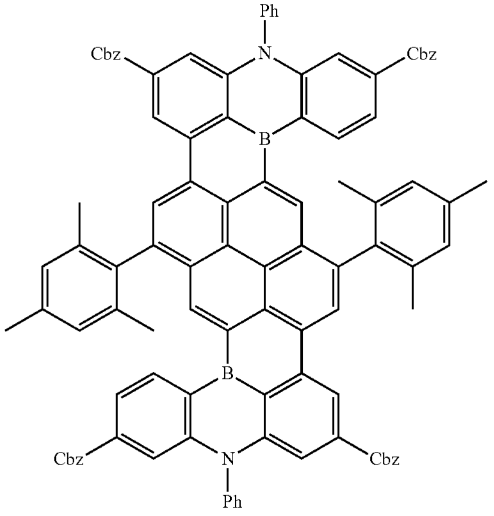
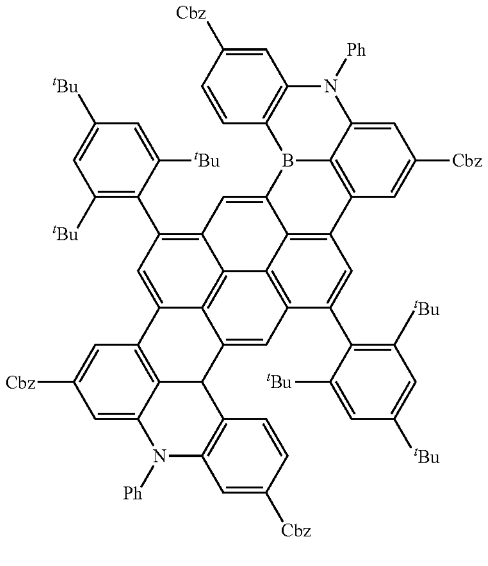
-continued
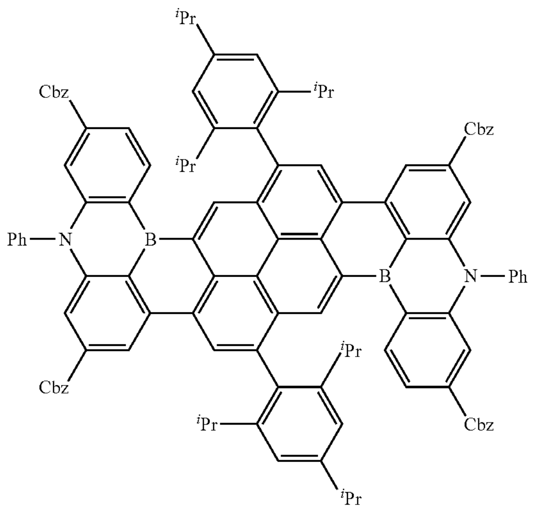
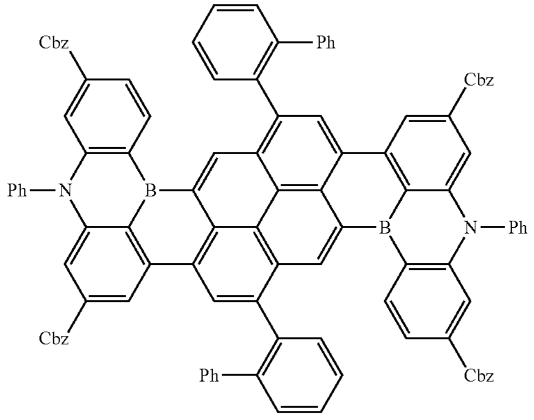
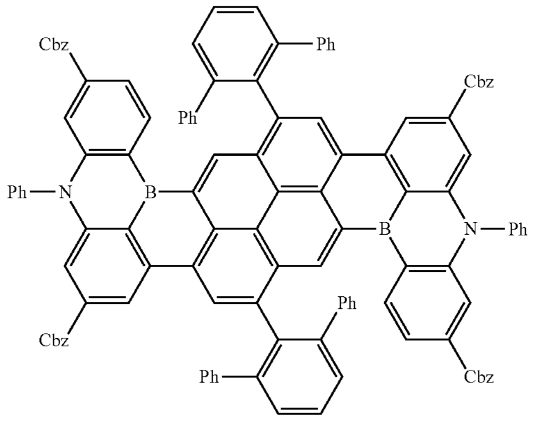

-continued
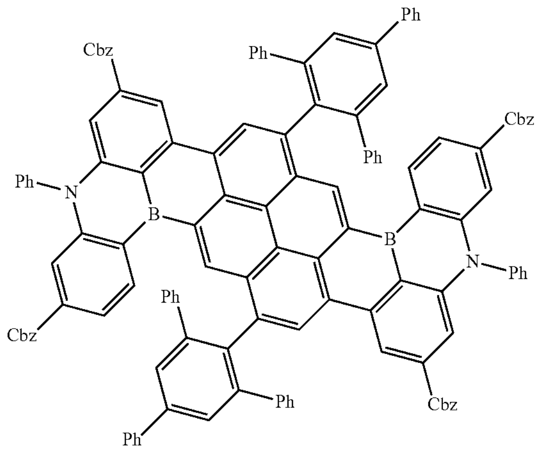
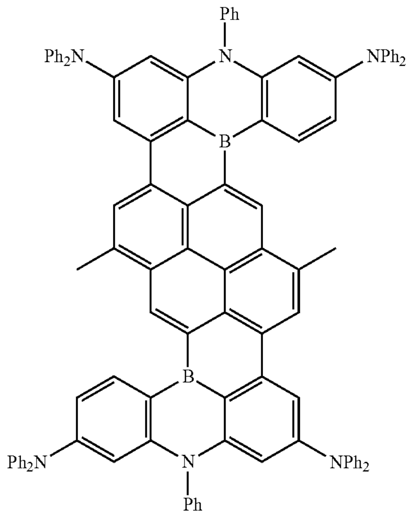
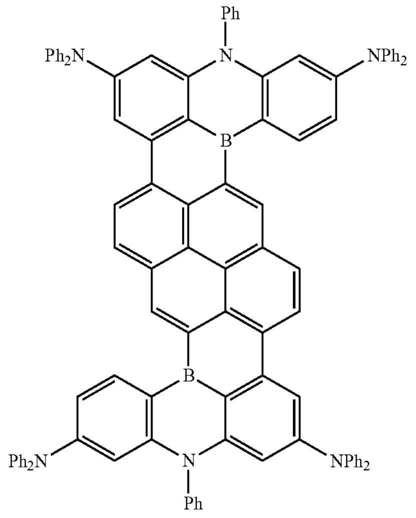
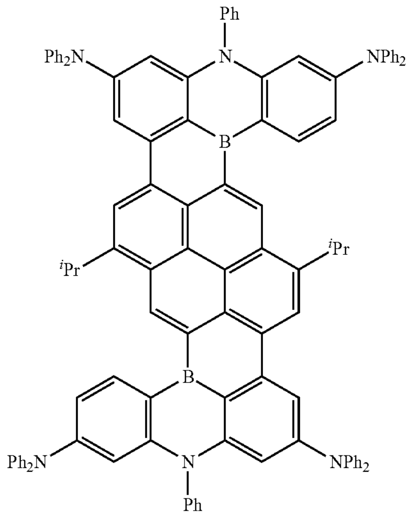
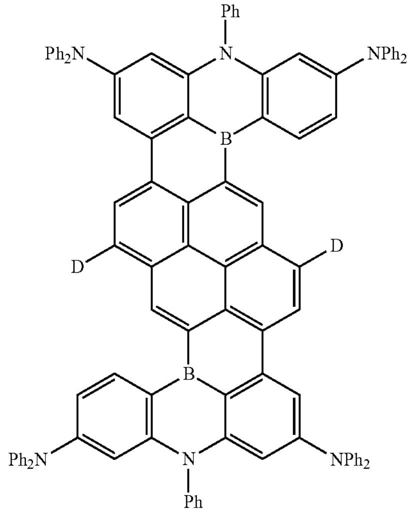
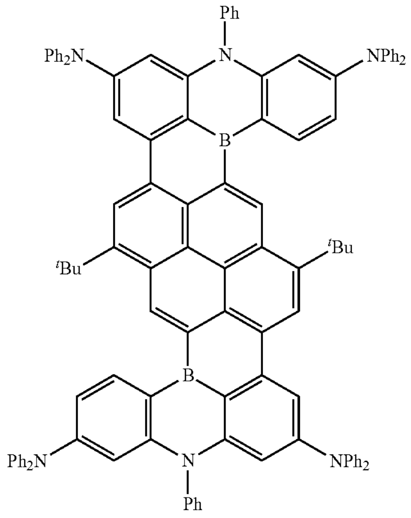

-continued
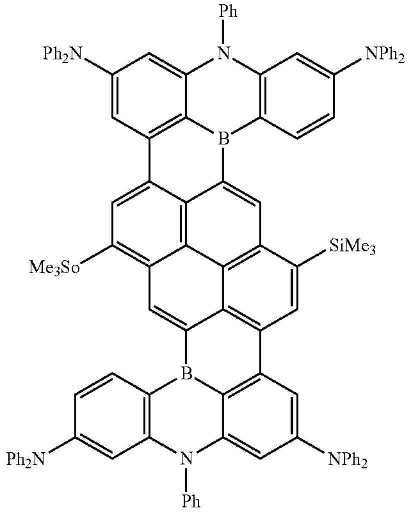
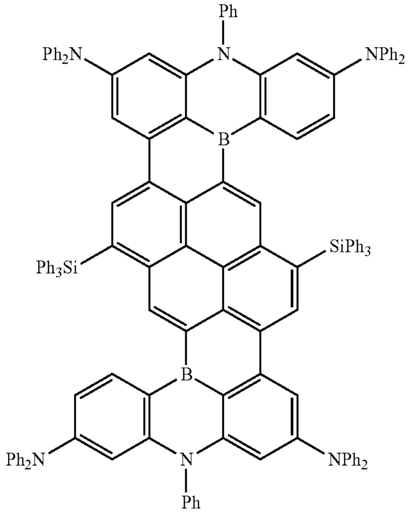
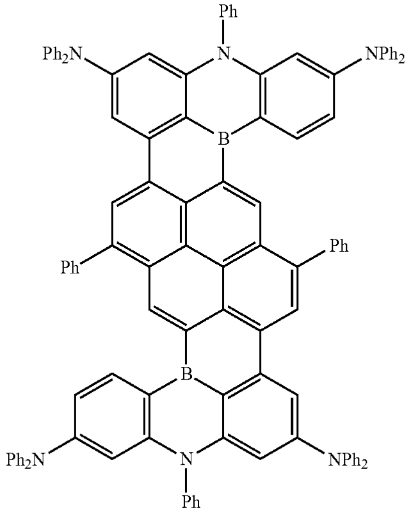
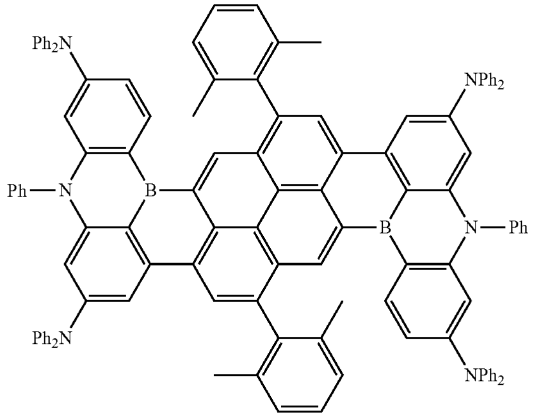
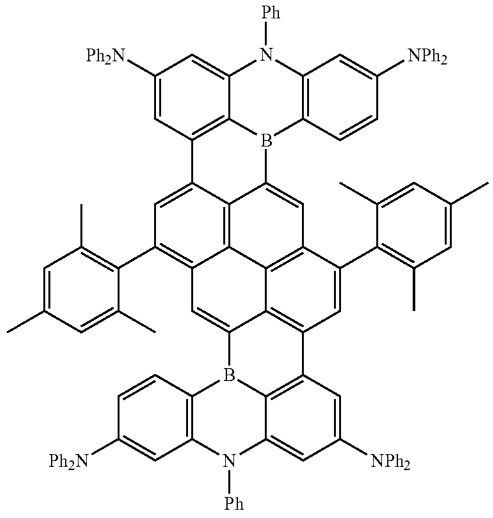
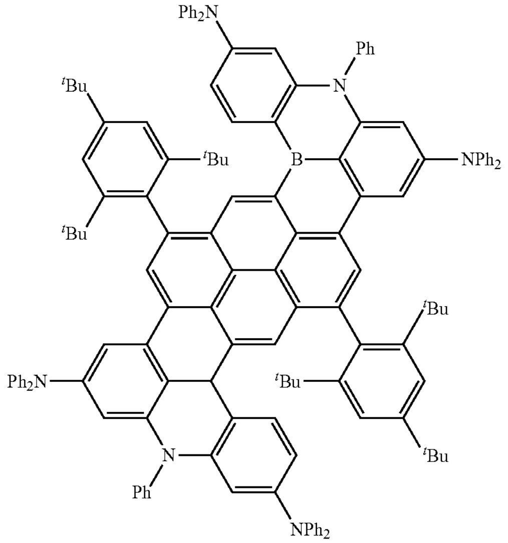

-continued
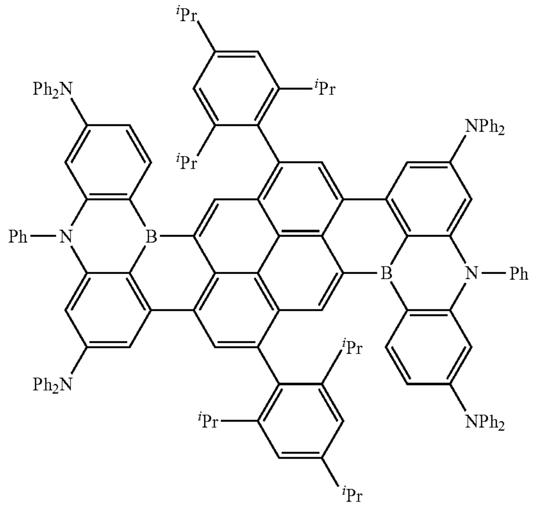
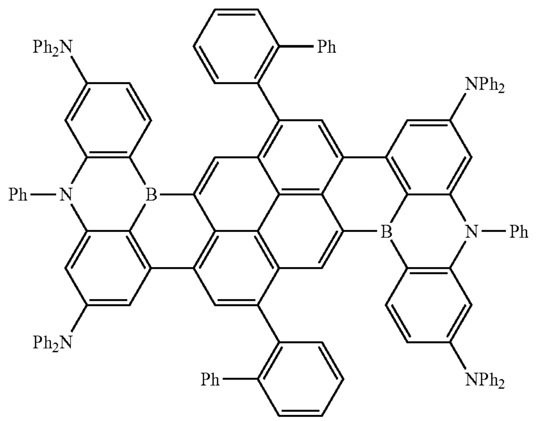
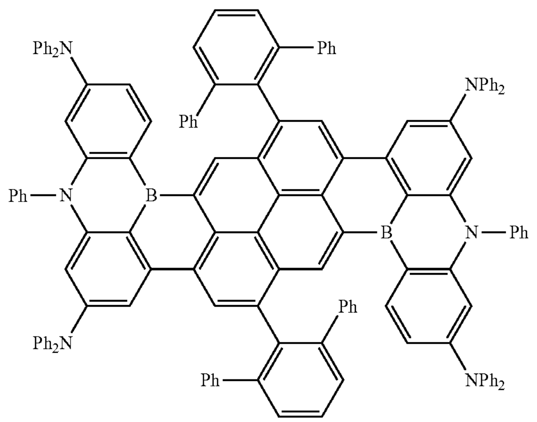
-continued
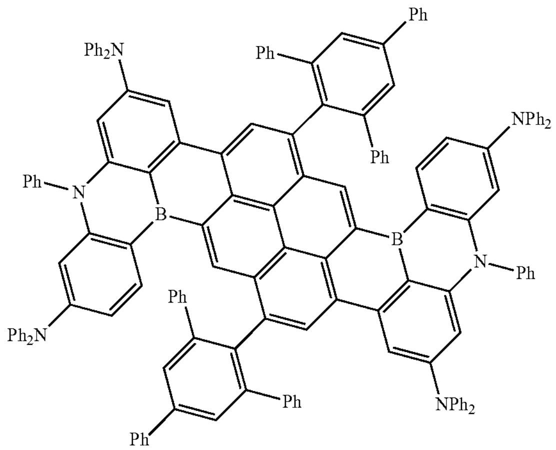
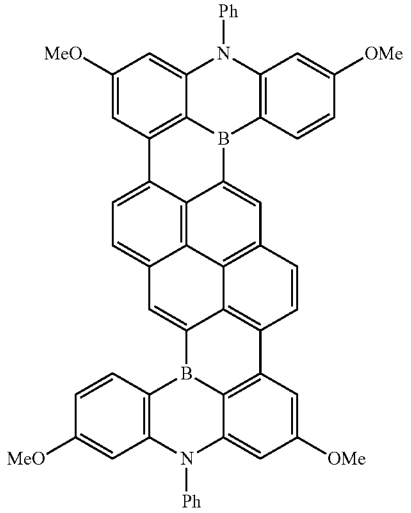
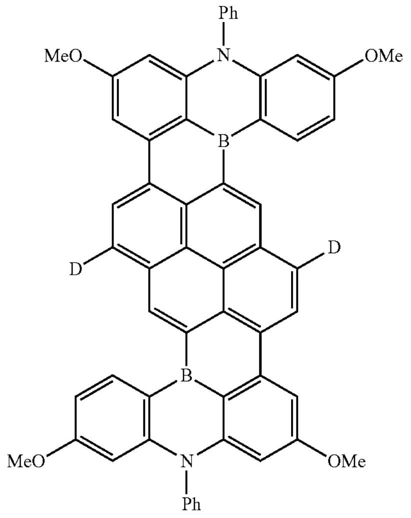

-continued
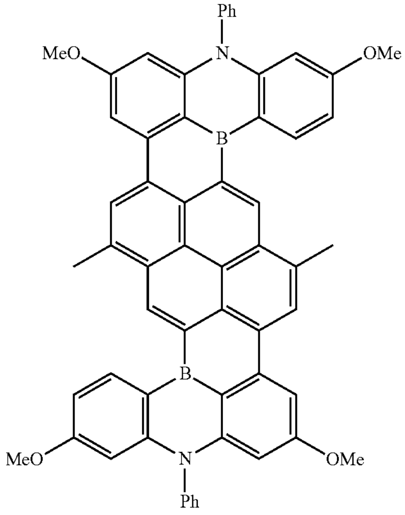
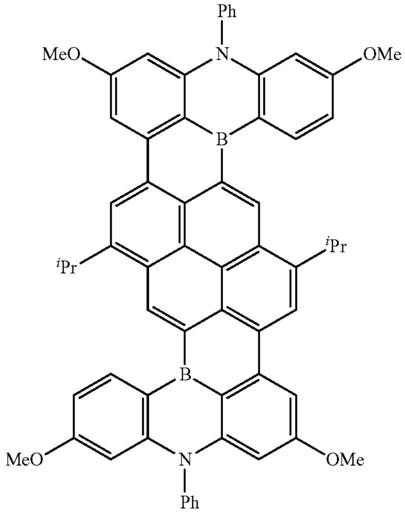
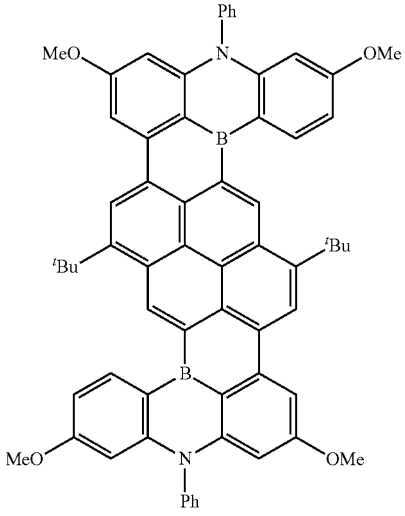
-continued
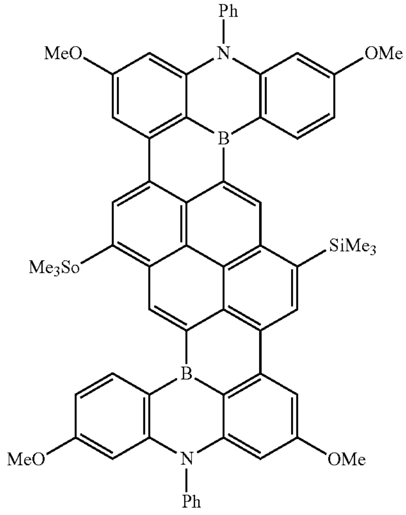
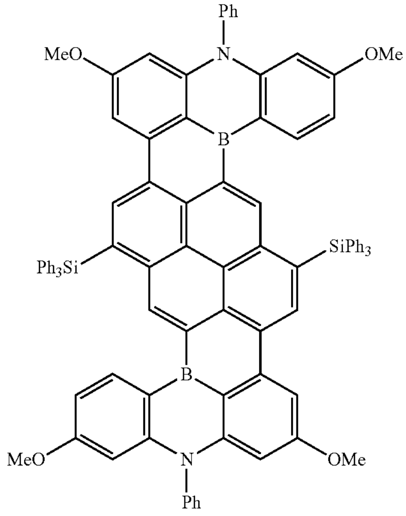
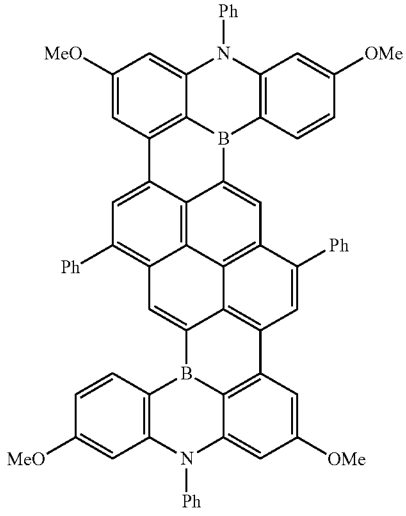

-continued
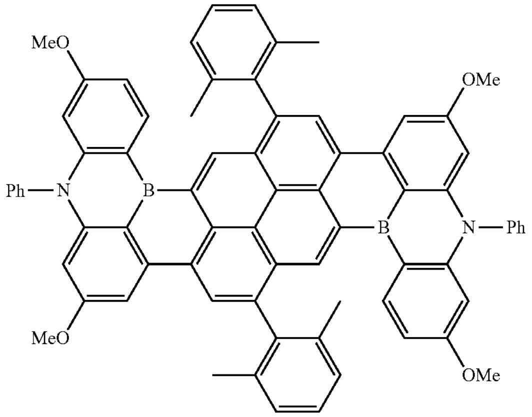
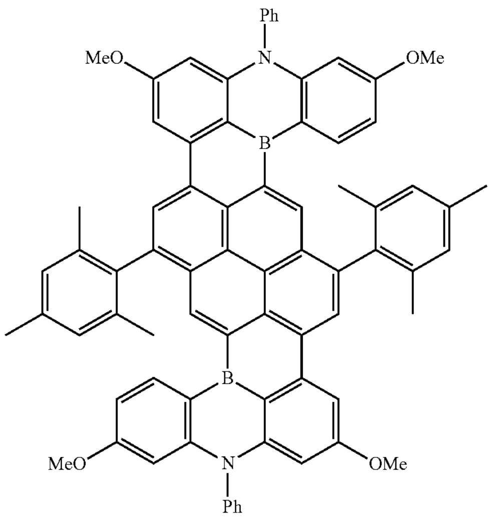
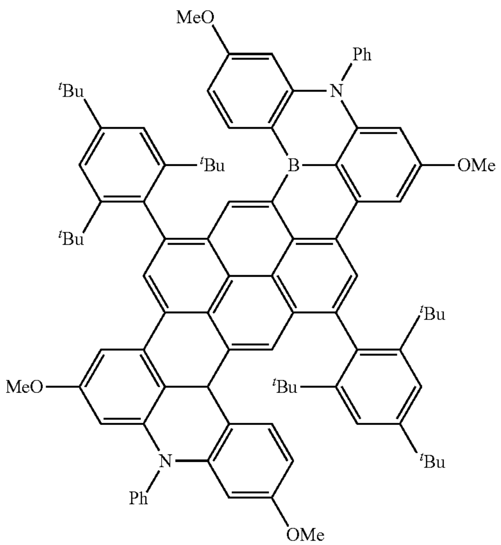
-continued
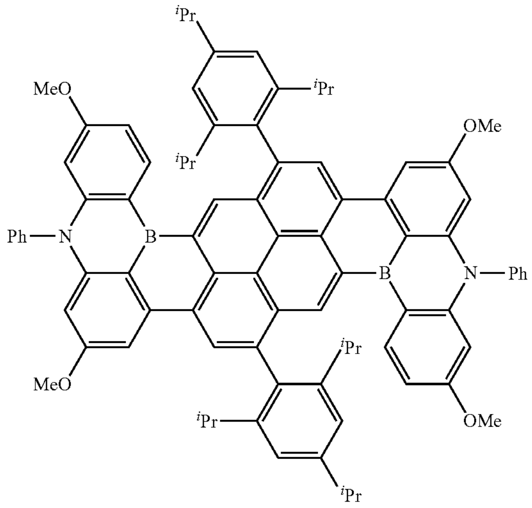
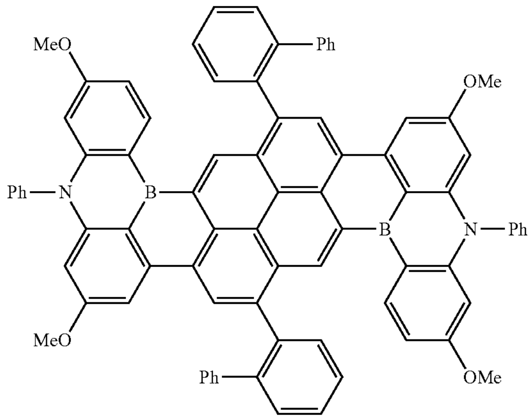
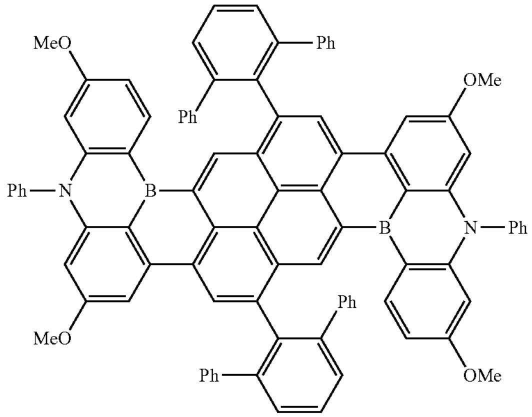

-continued
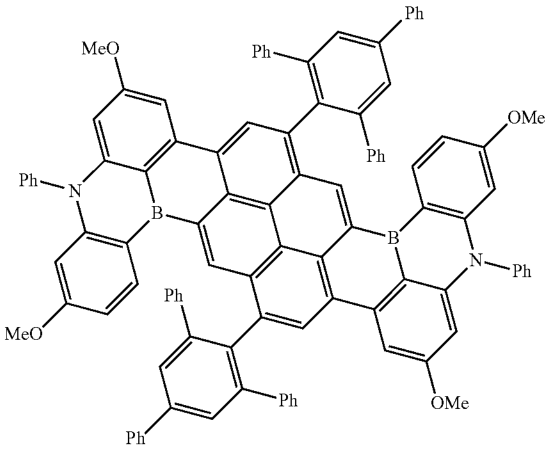
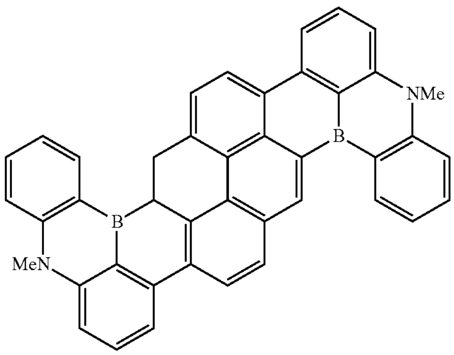
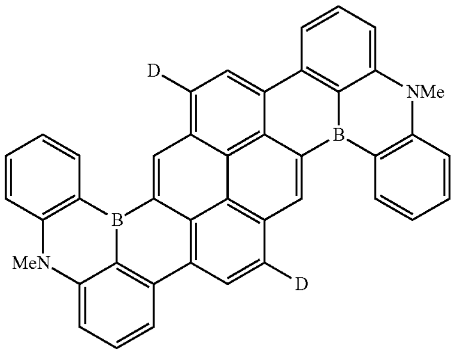
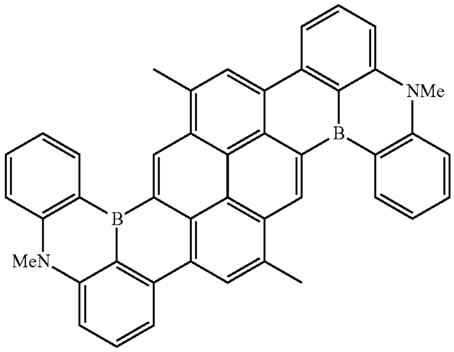
-continued
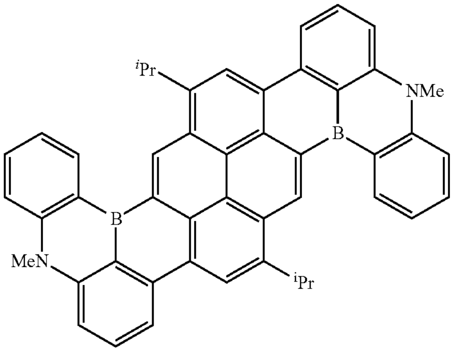
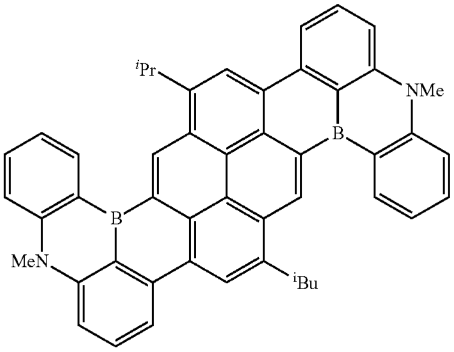
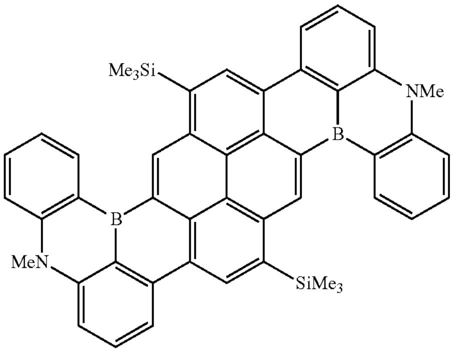
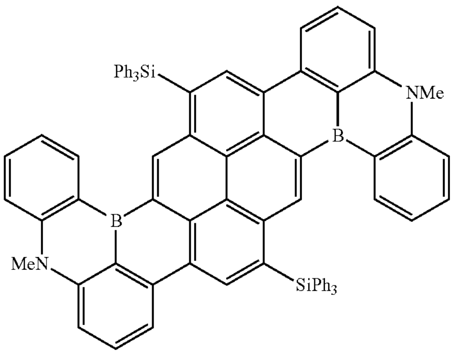

-continued
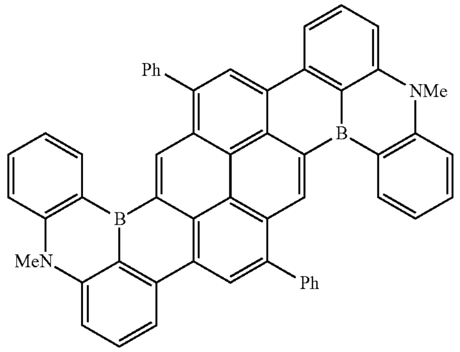
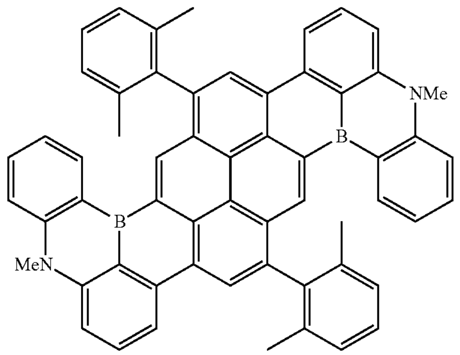
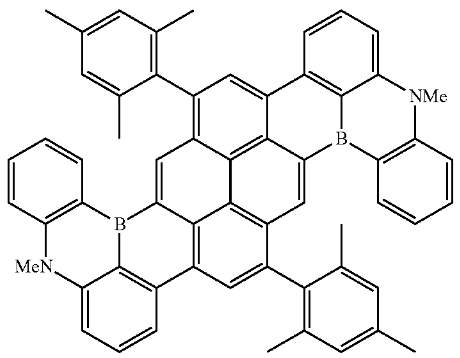
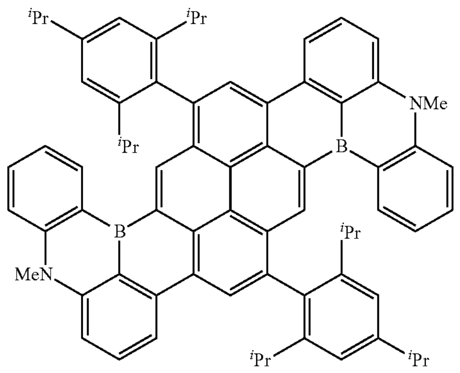
-continued
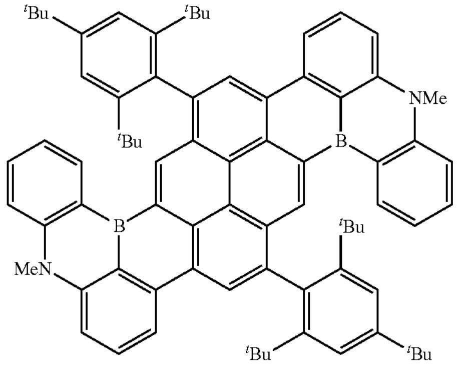
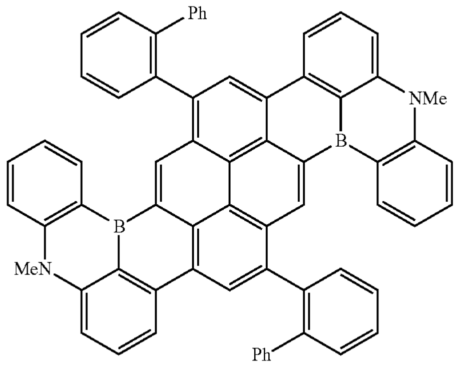
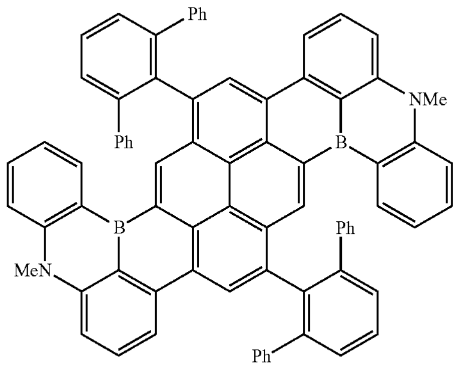

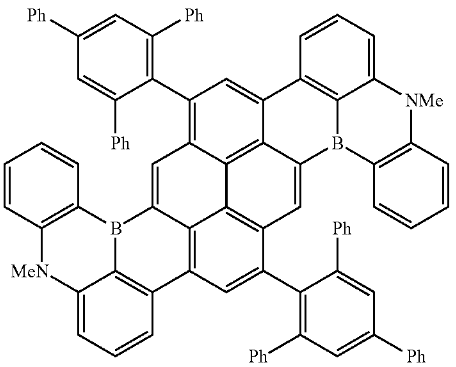
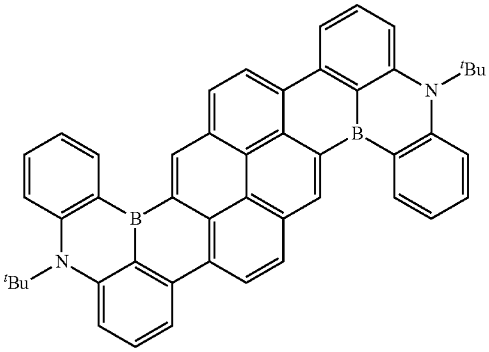
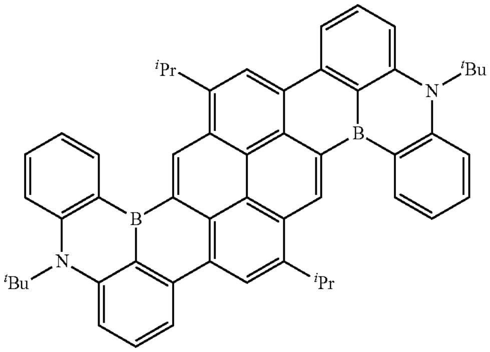
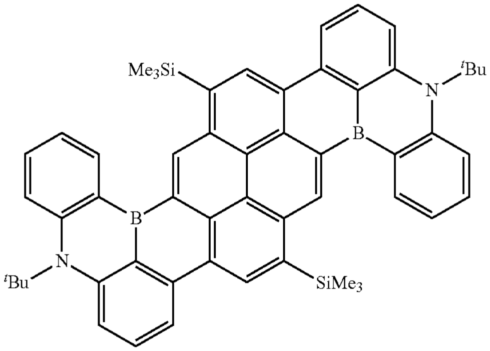
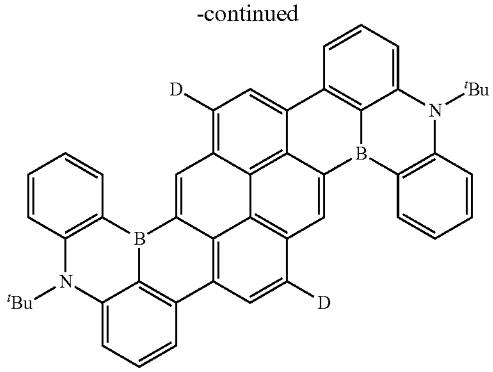
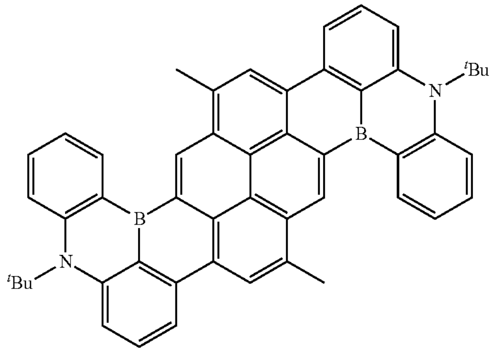
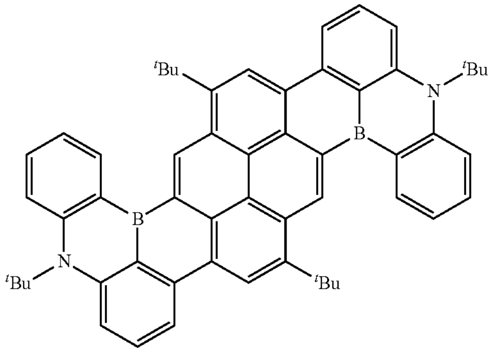
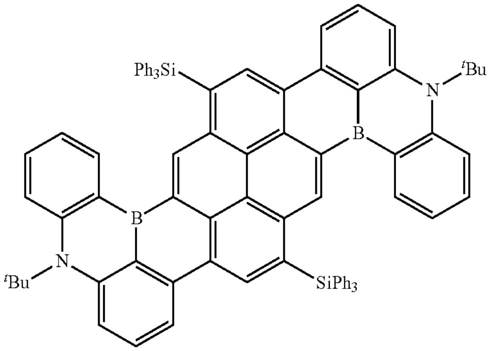

-continued
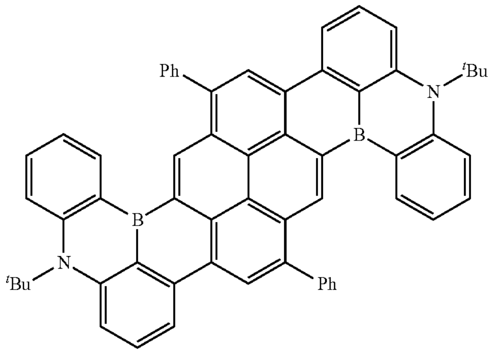
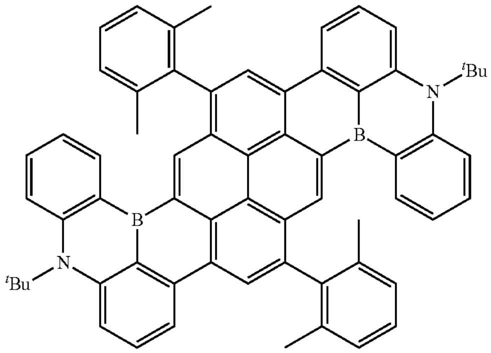
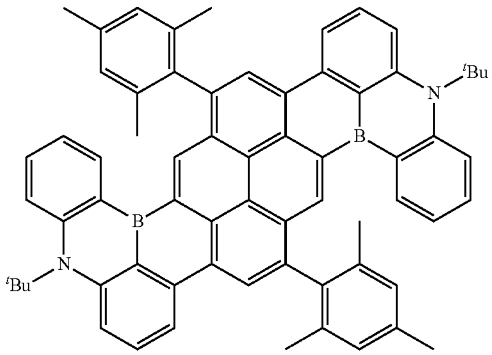
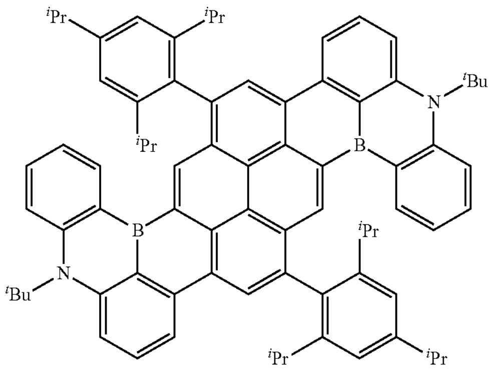
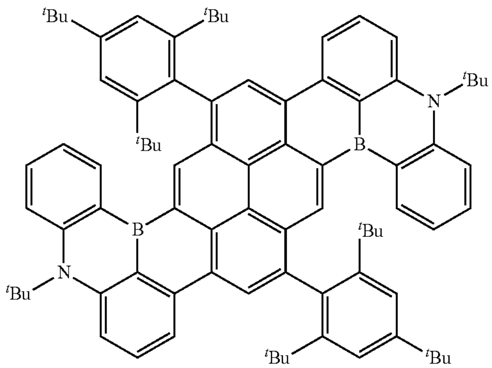
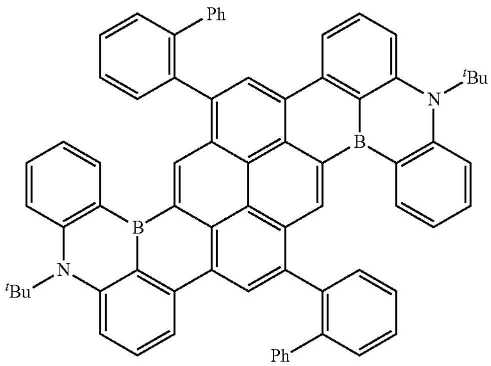
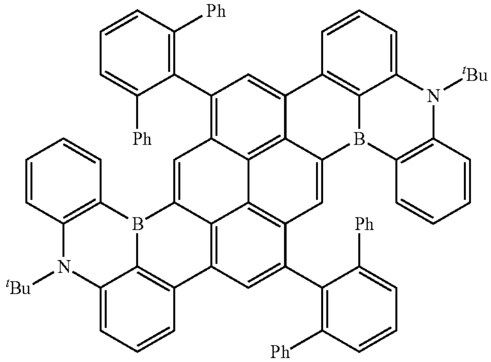
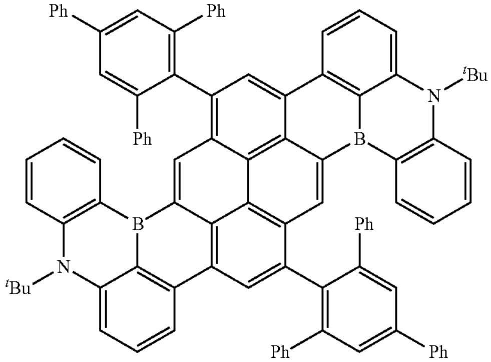

-continued
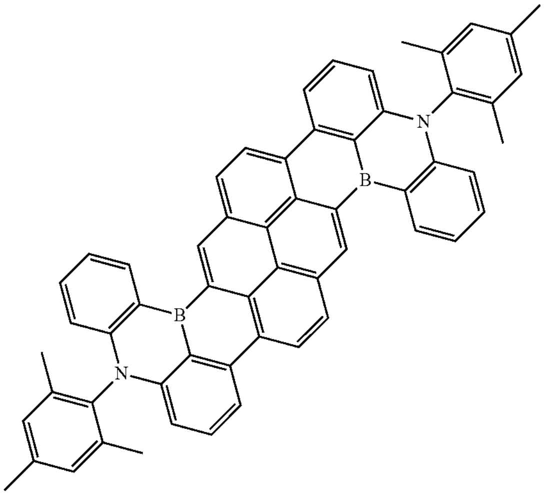
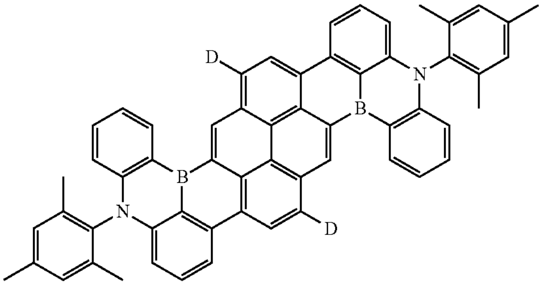
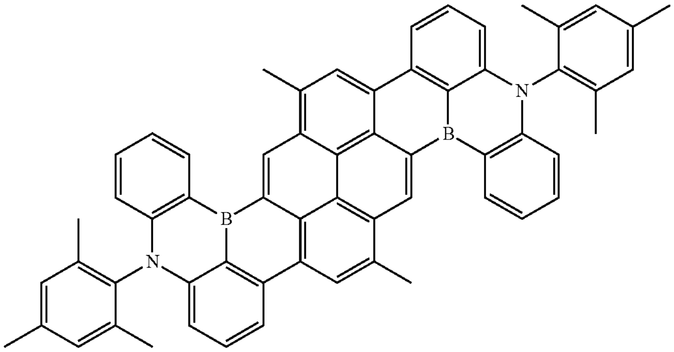
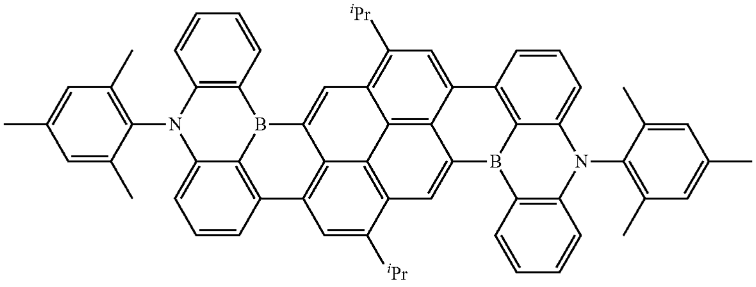
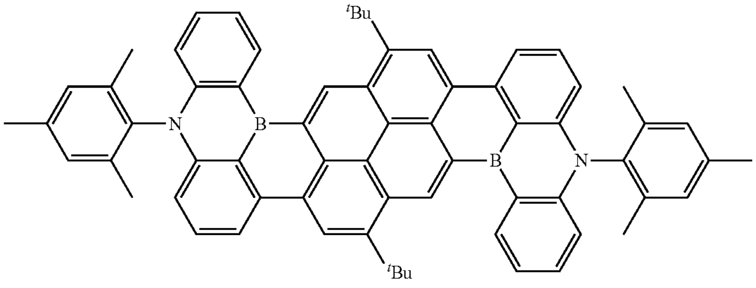

-continued
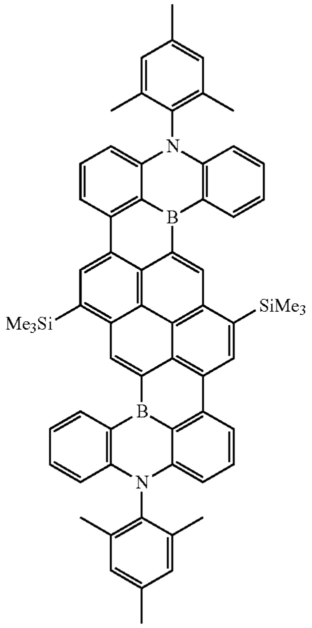
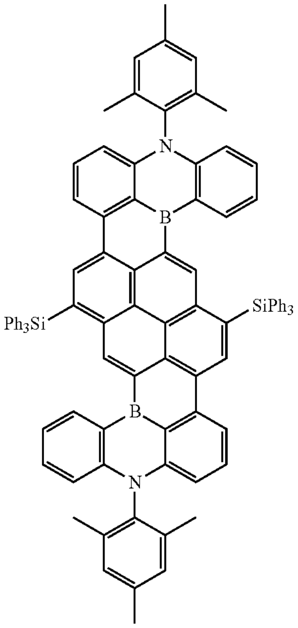
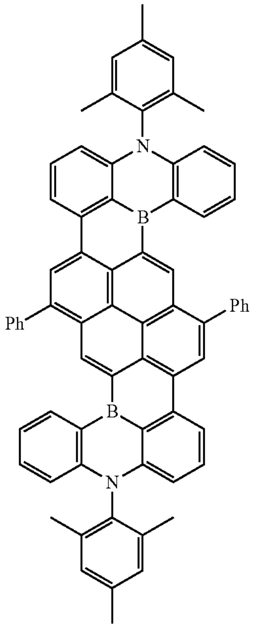
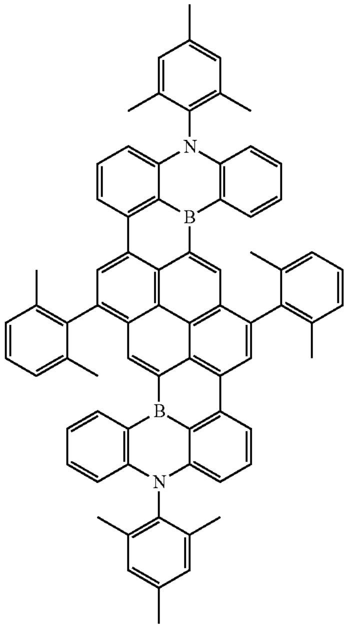
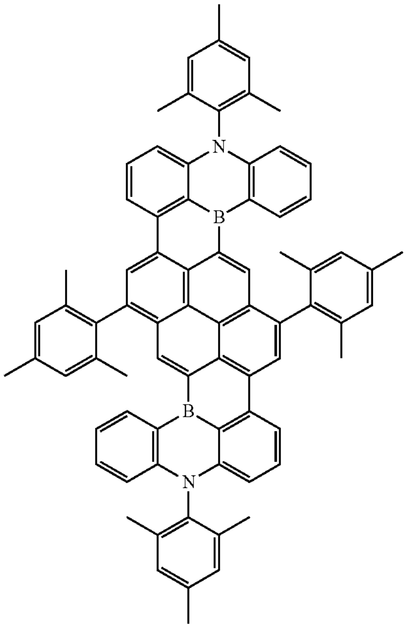

-continued
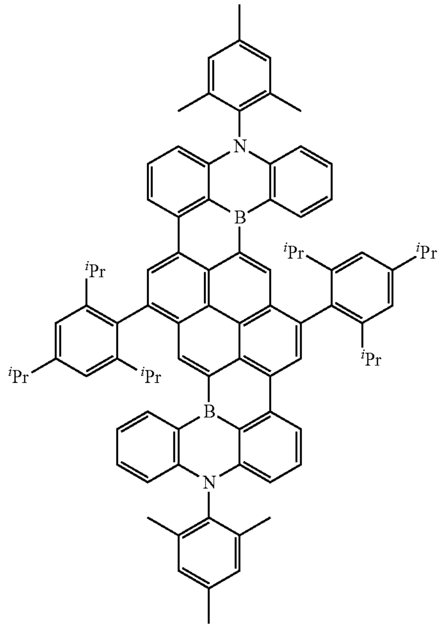
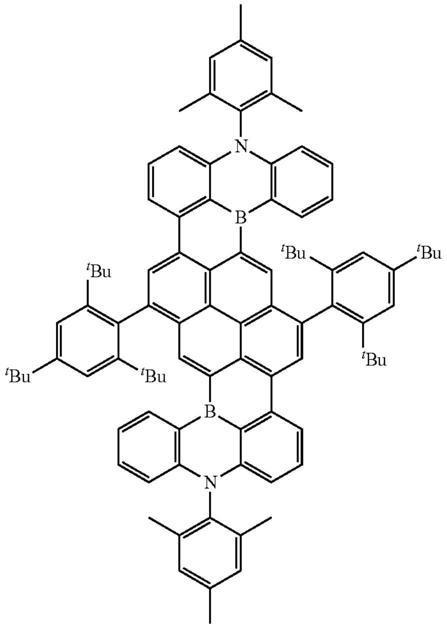
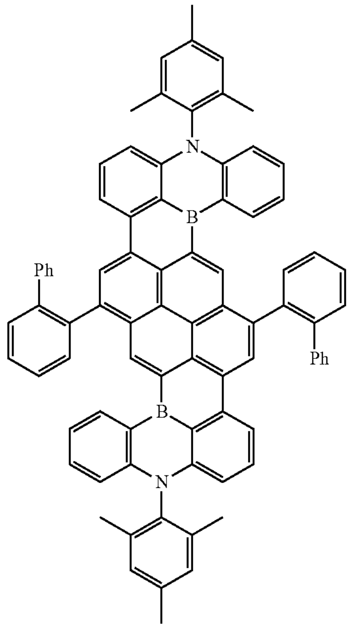
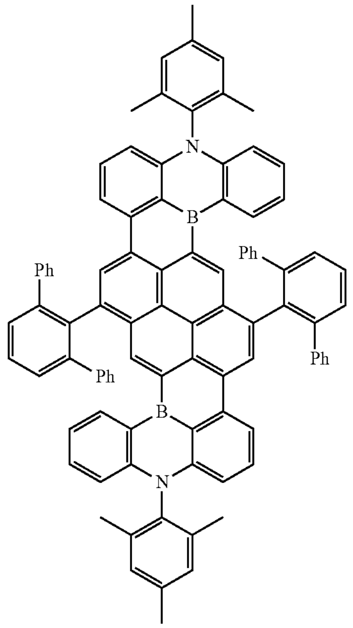
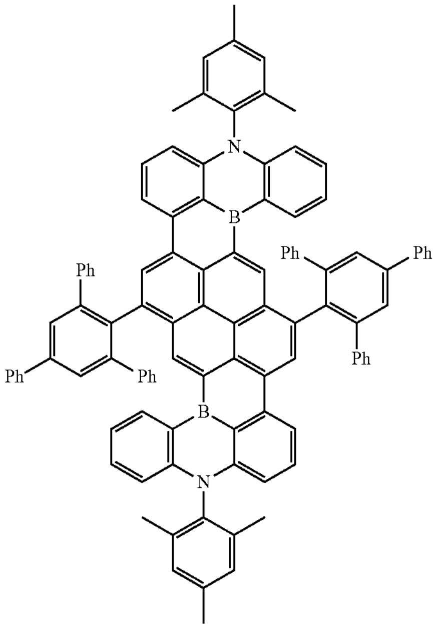
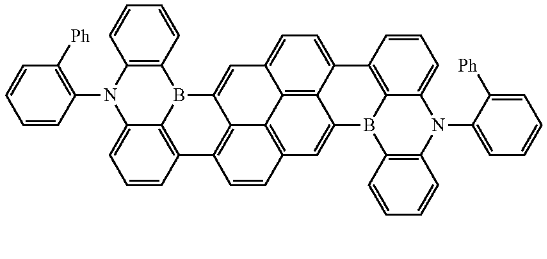
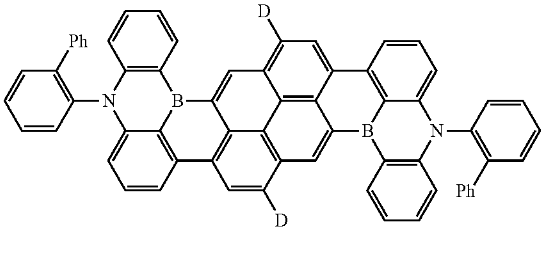

-continued
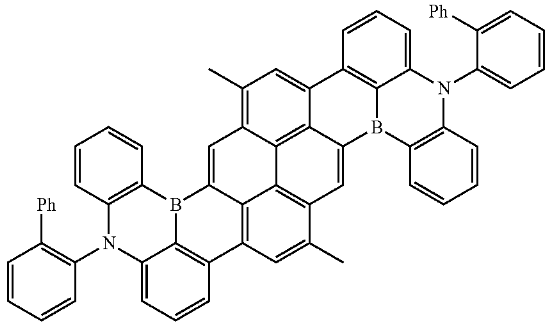
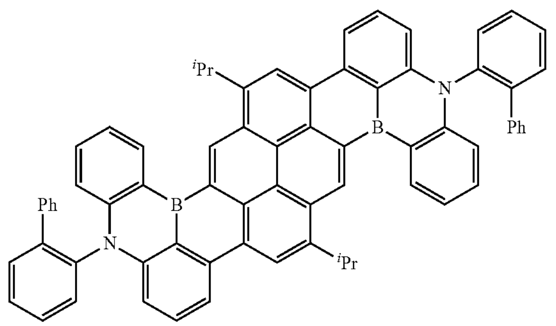
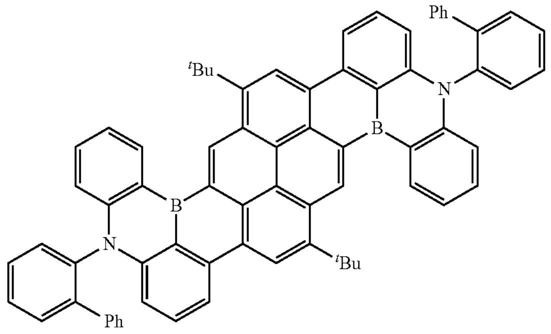
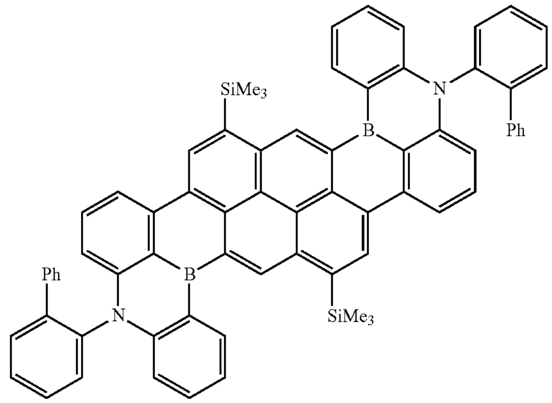
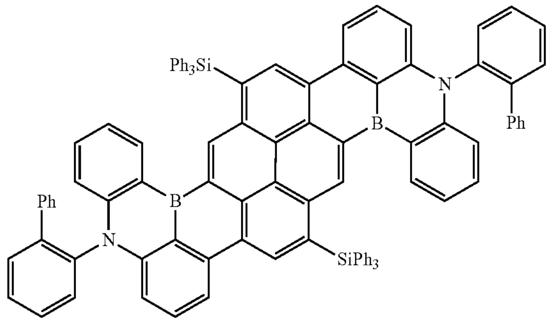
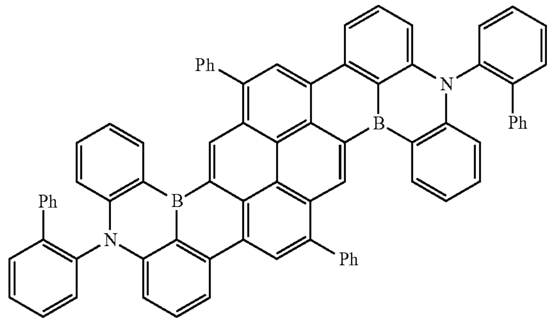
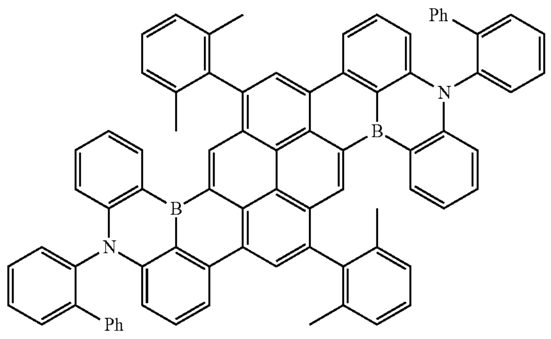
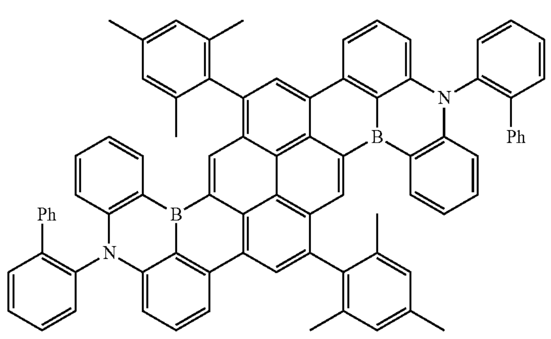

-continued
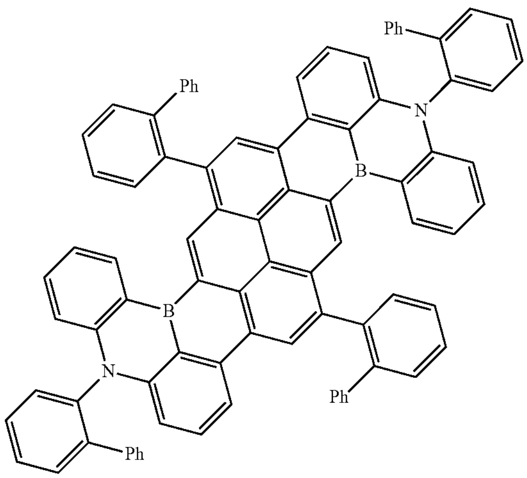
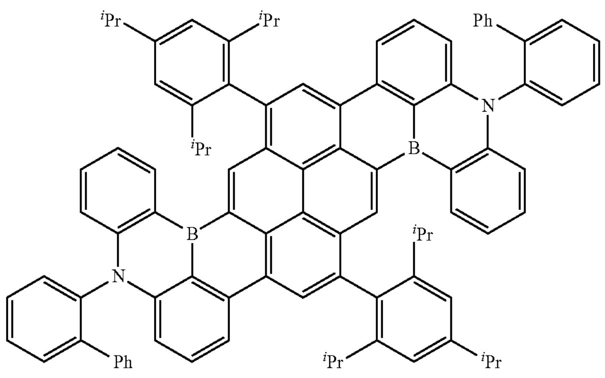
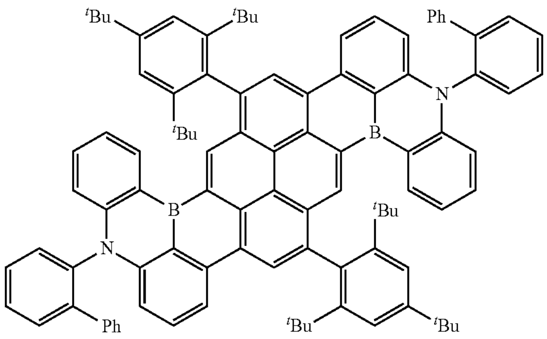
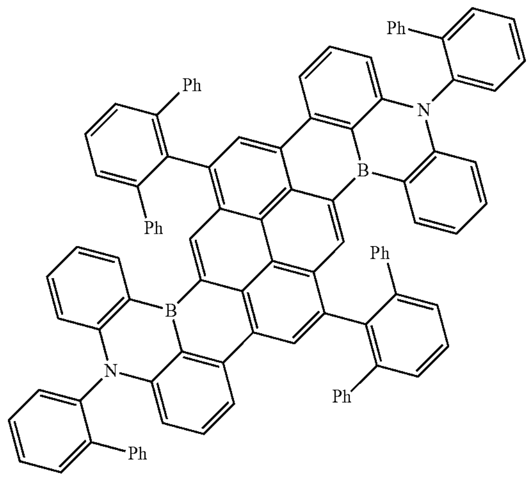
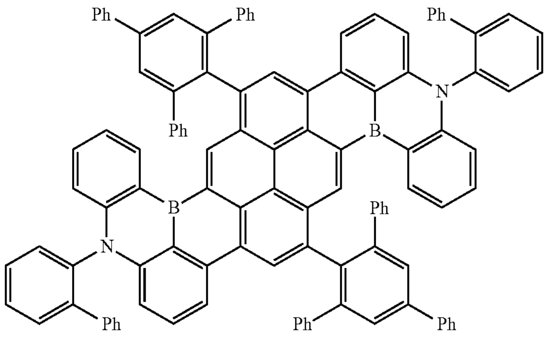
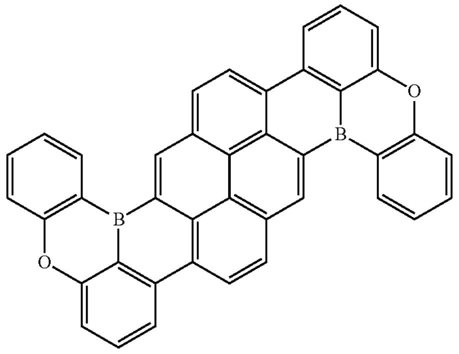
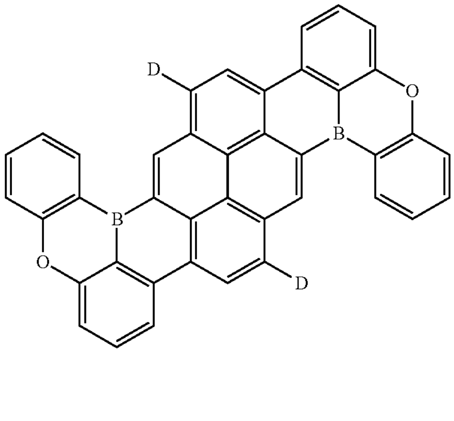
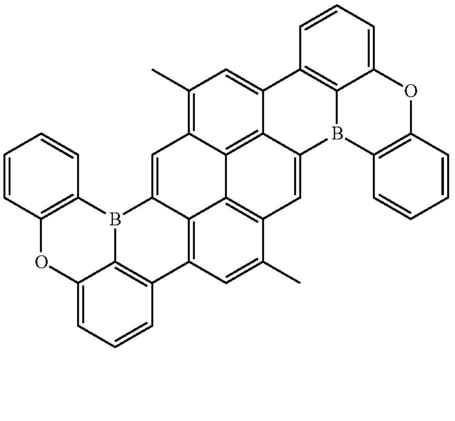

-continued
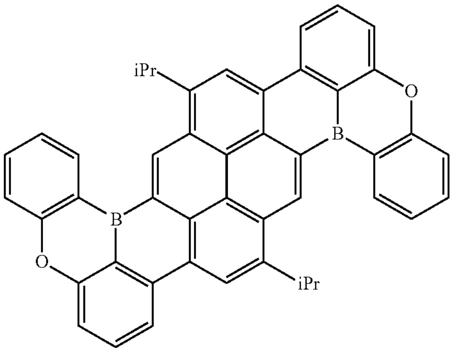
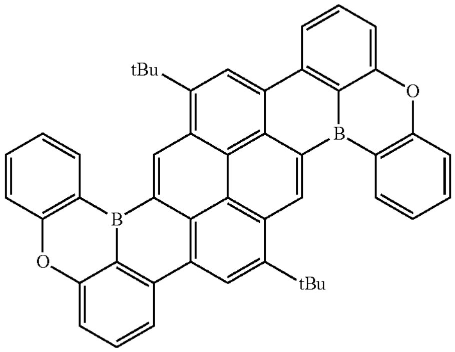
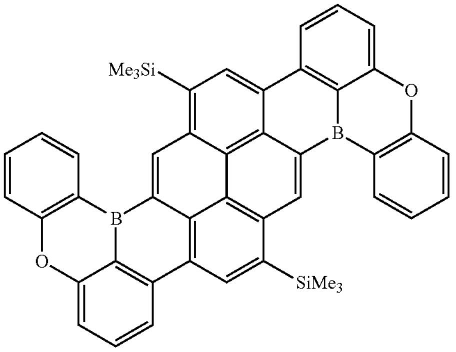
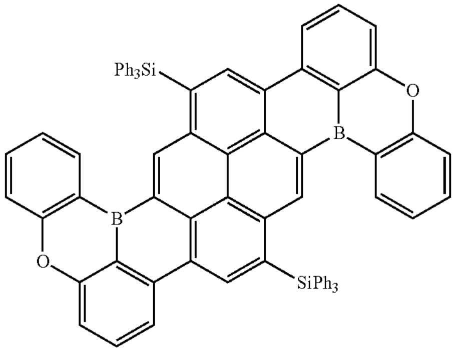
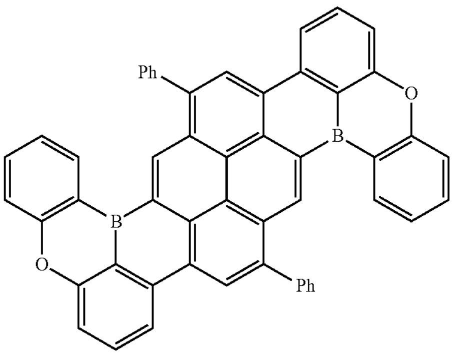
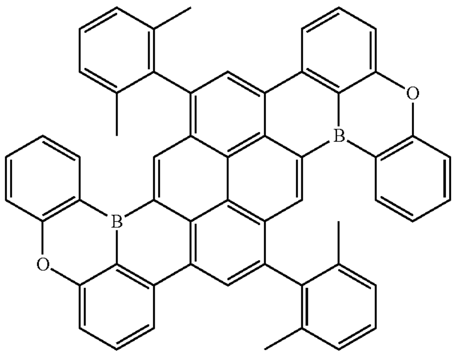
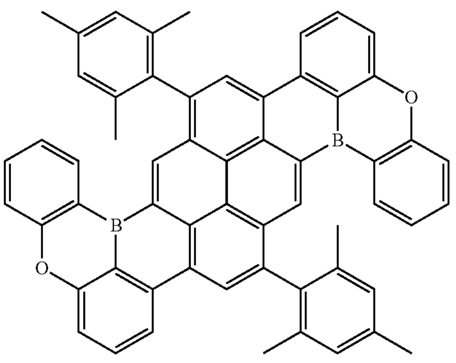
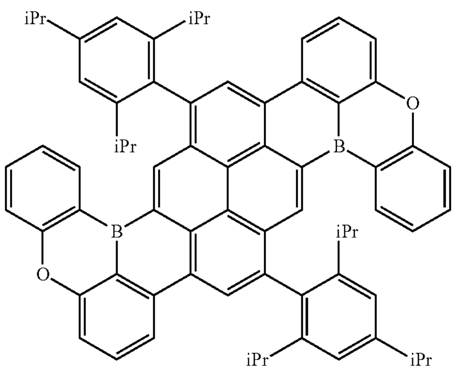

-continued
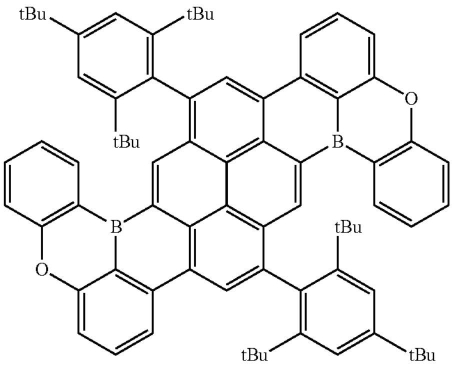
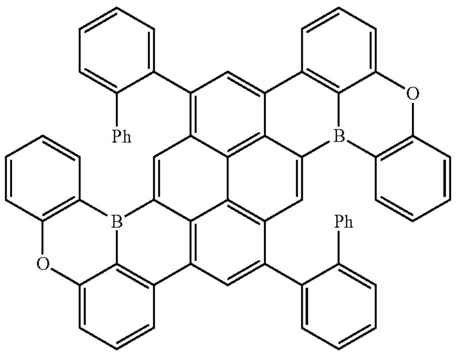
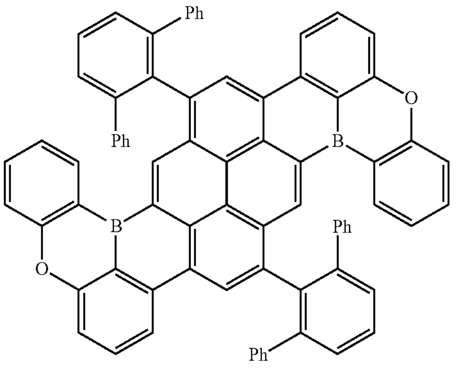
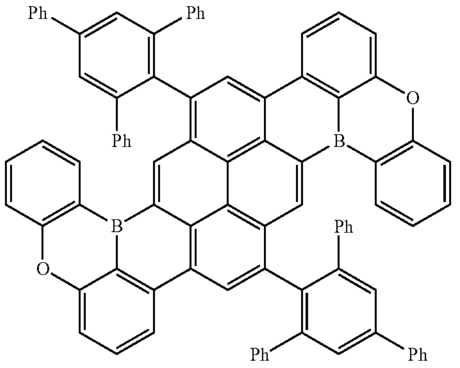
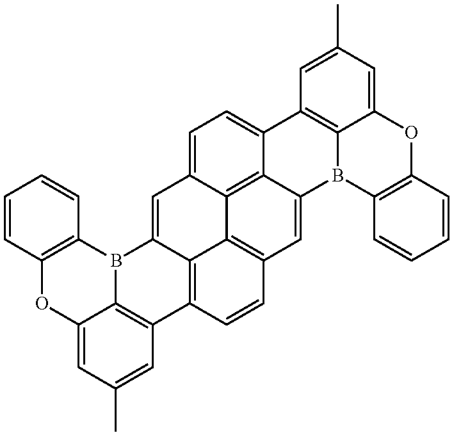
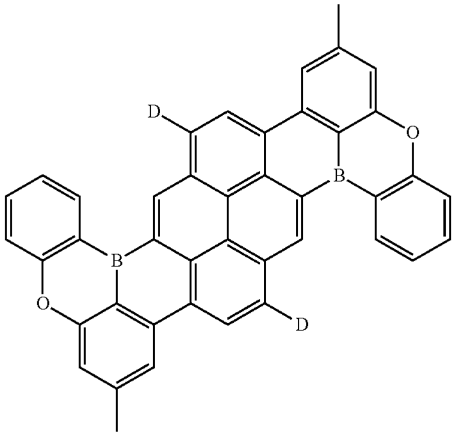
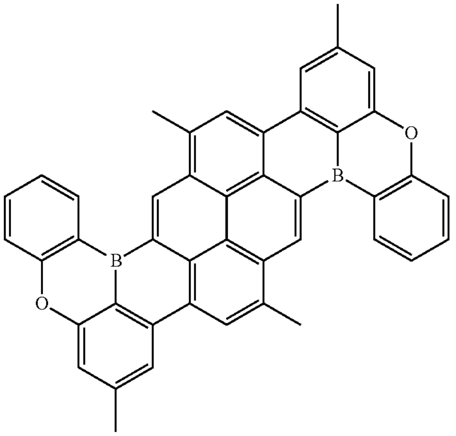
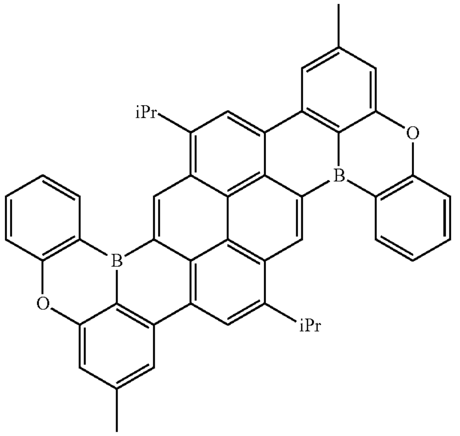

-continued
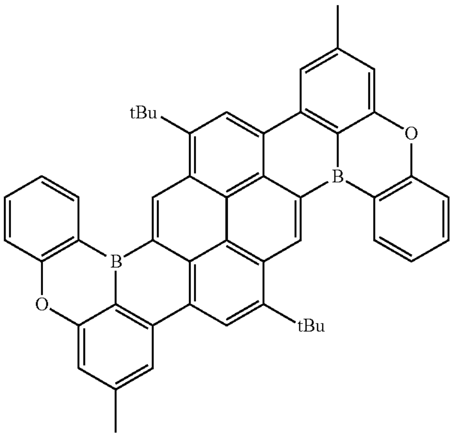
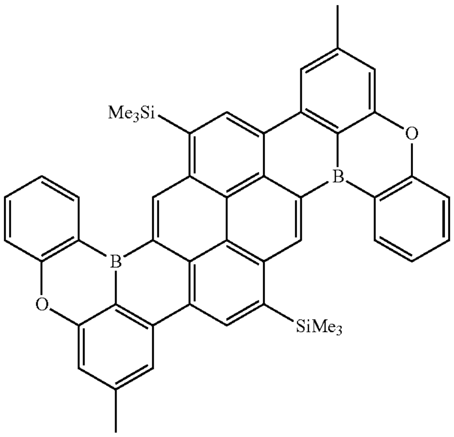
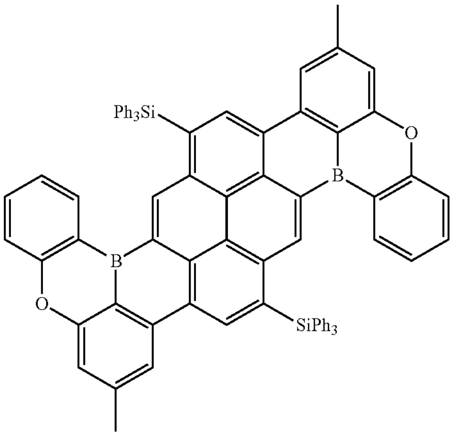
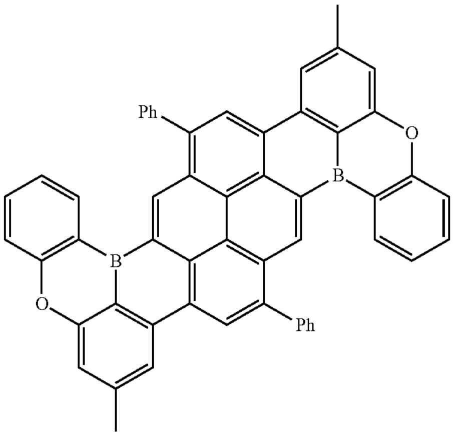
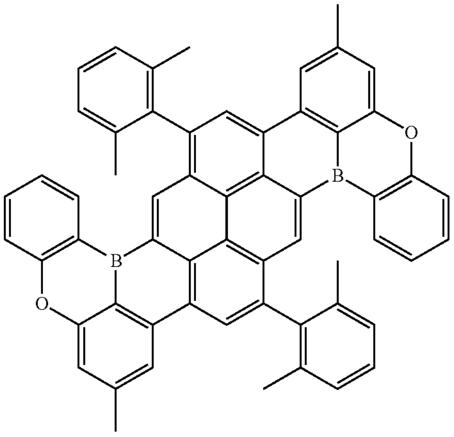
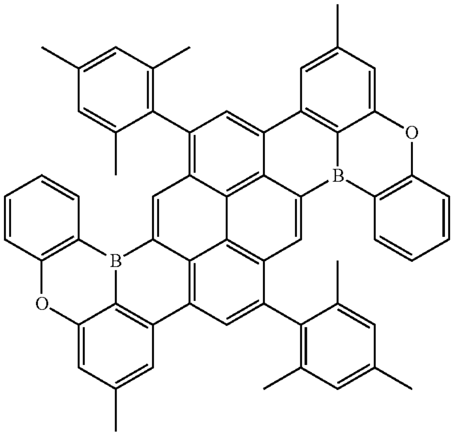

-continued
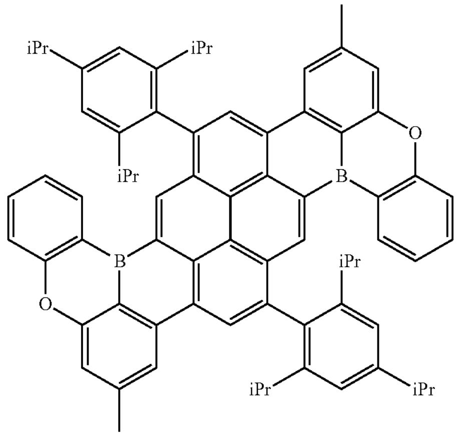
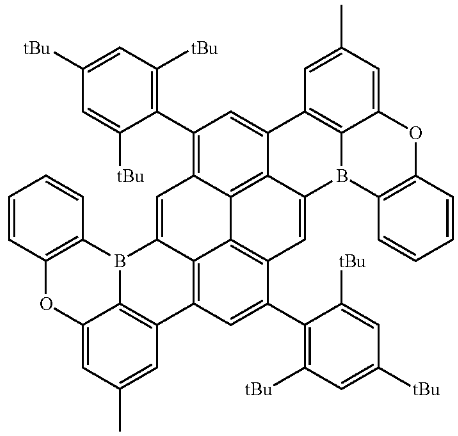
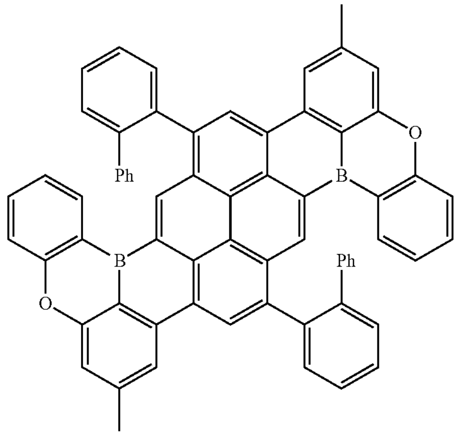
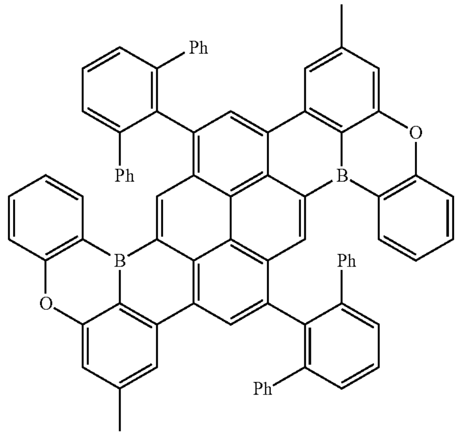
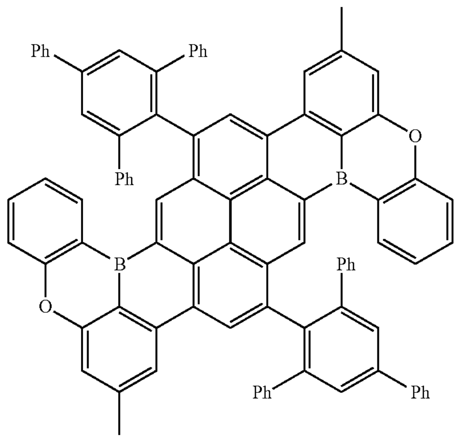
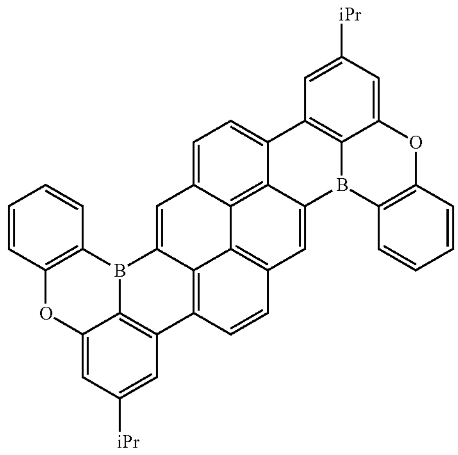

-continued
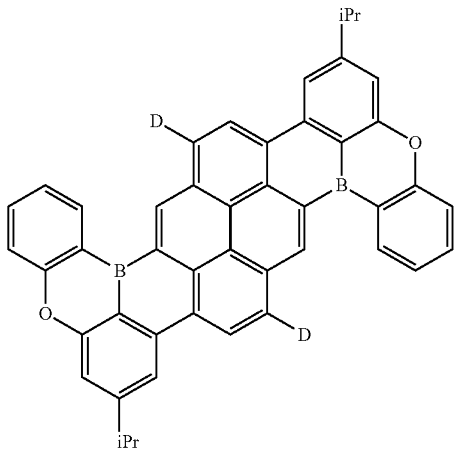
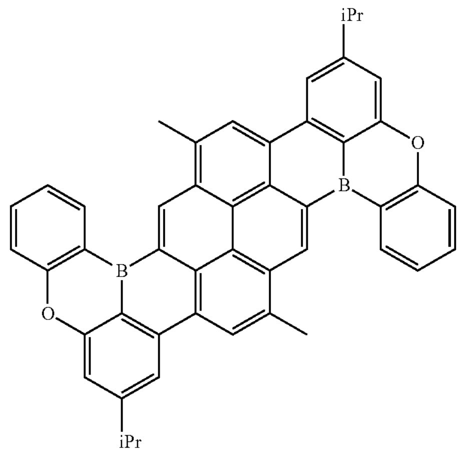
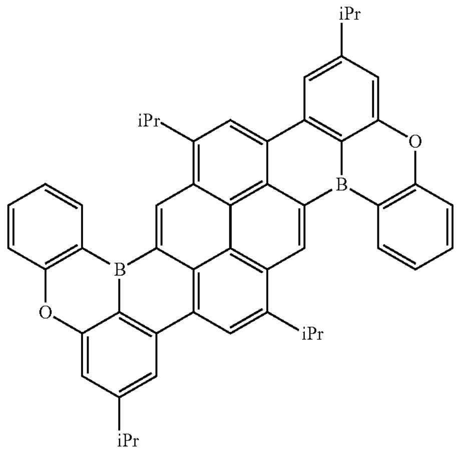
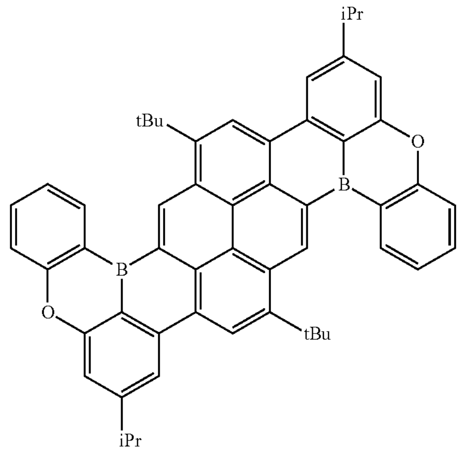
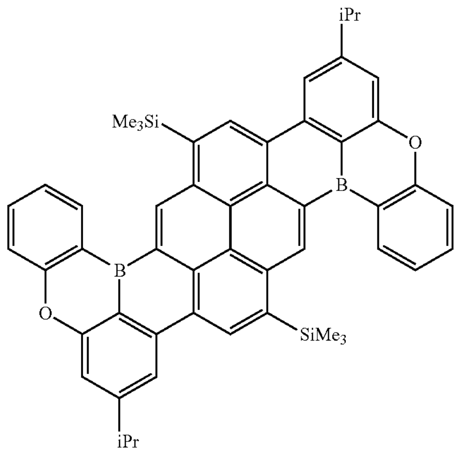
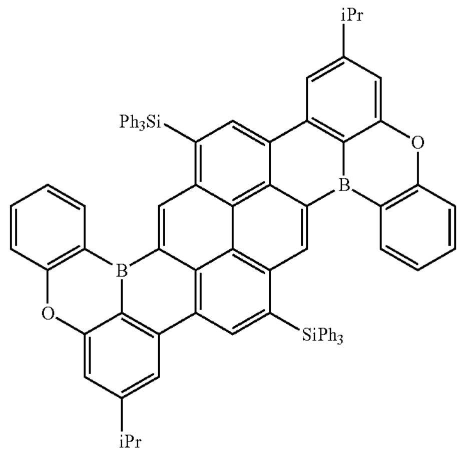

-continued
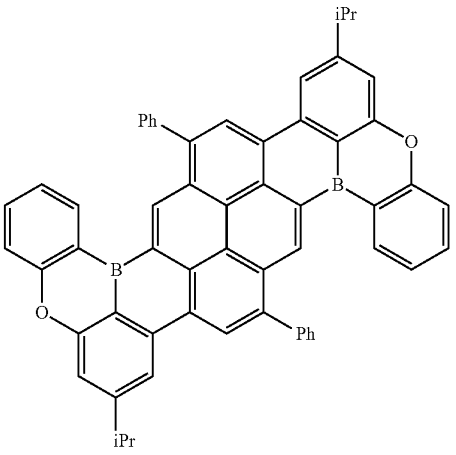
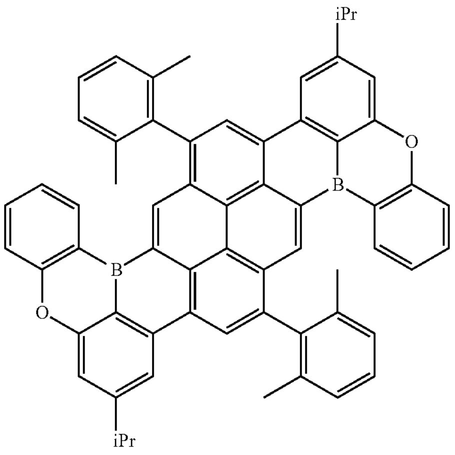
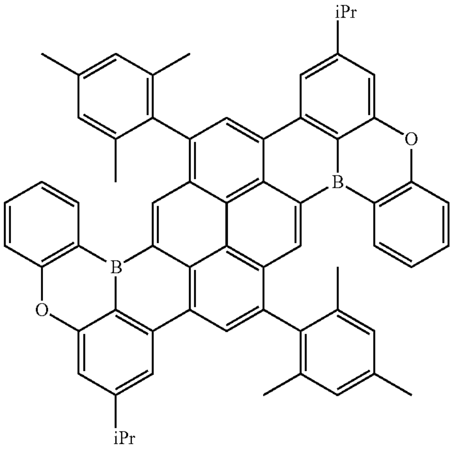
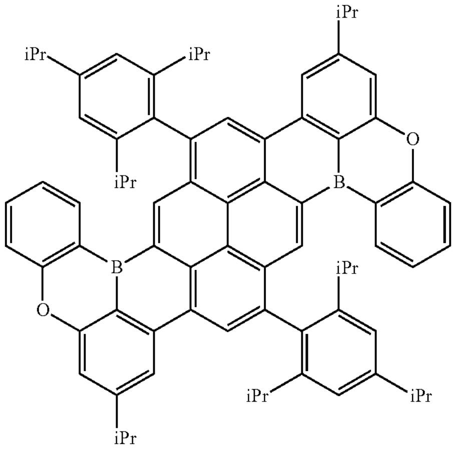
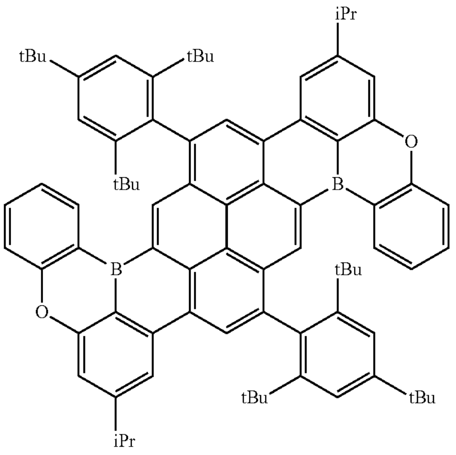
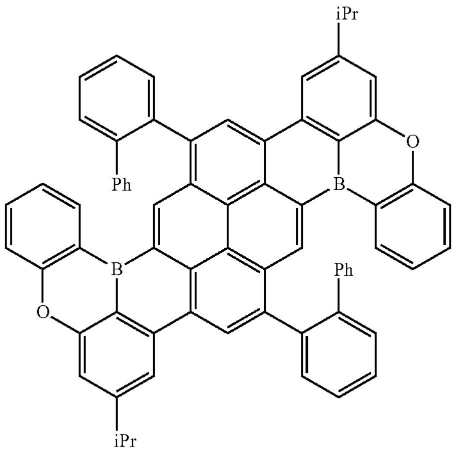

-continued
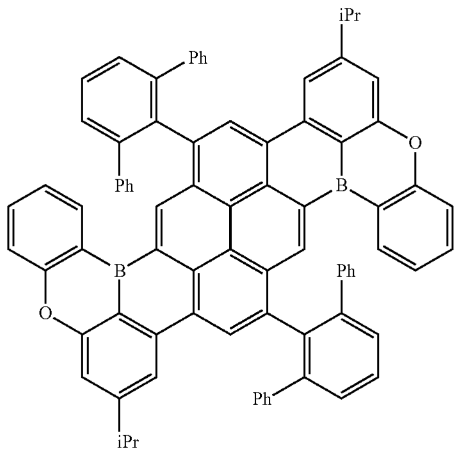
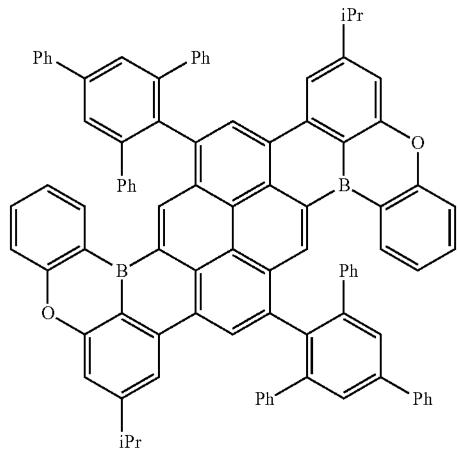
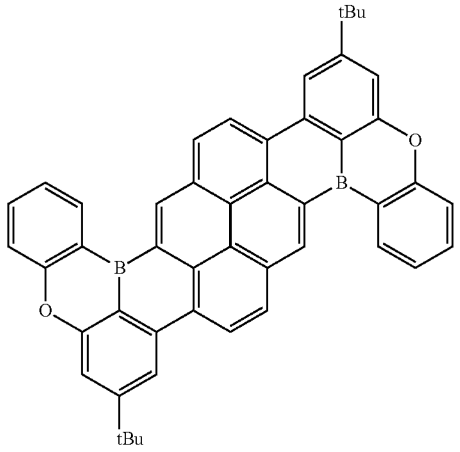
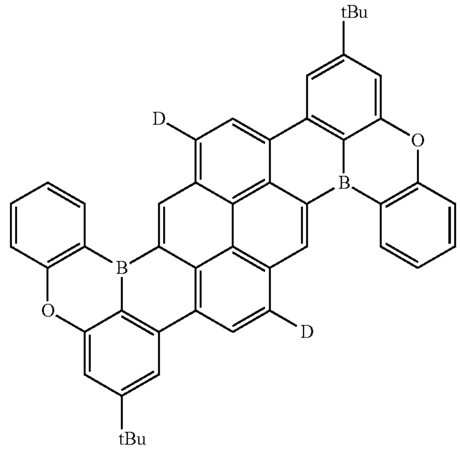
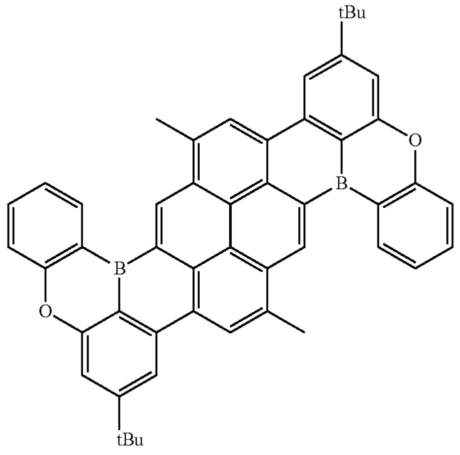
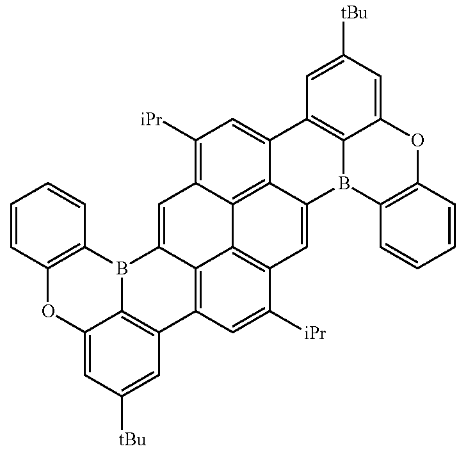

-continued
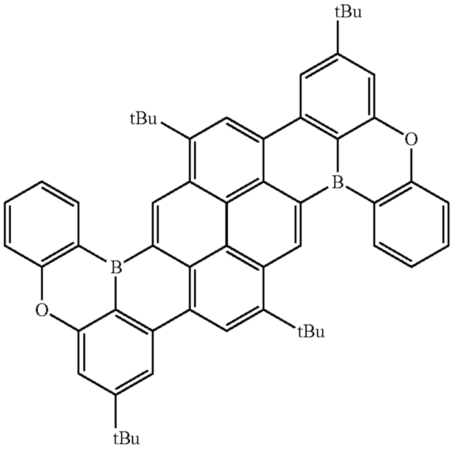
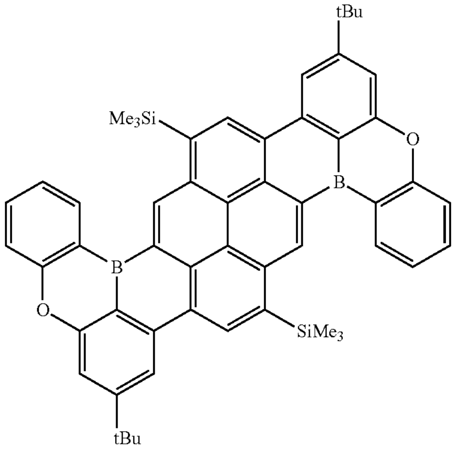
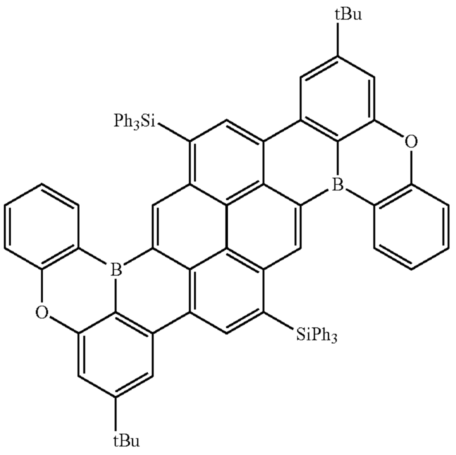
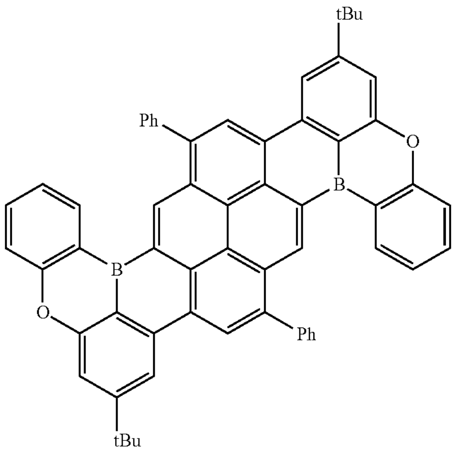
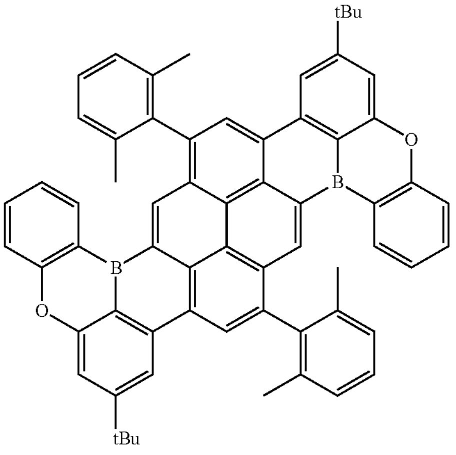
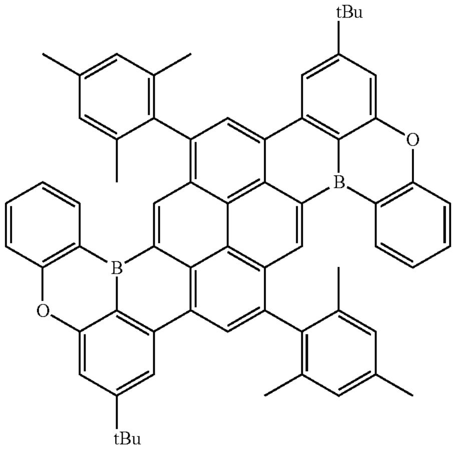

-continued
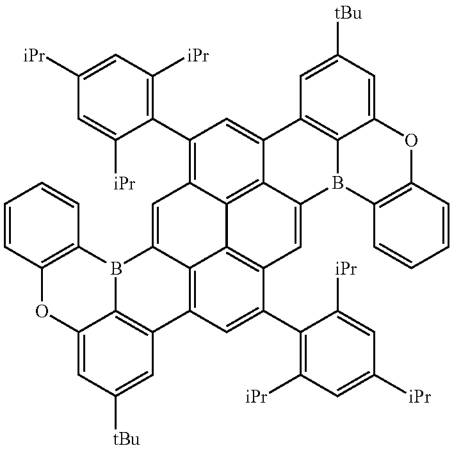
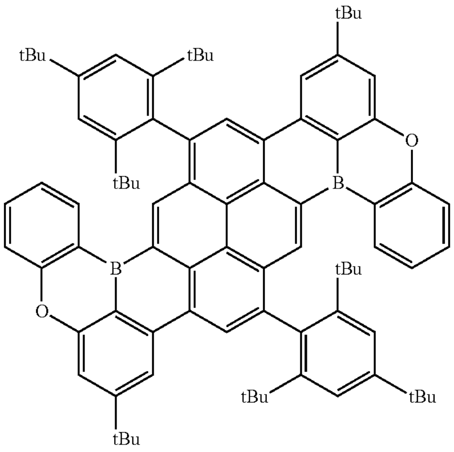
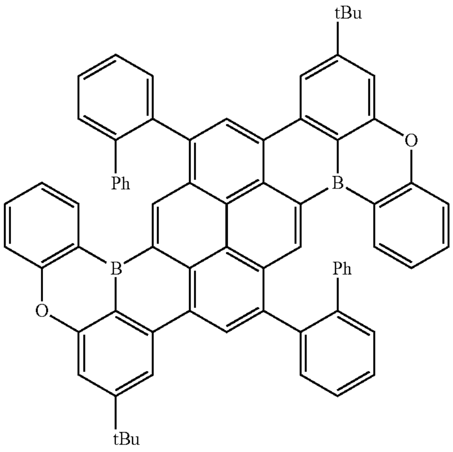
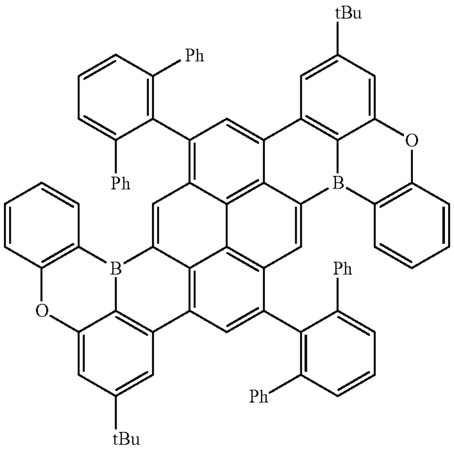
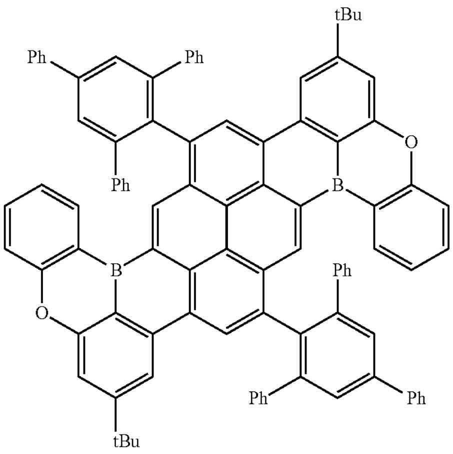
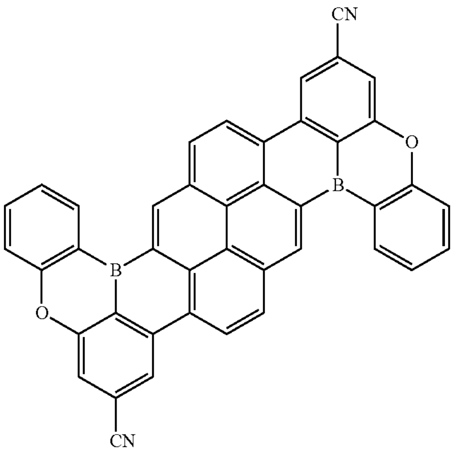

-continued
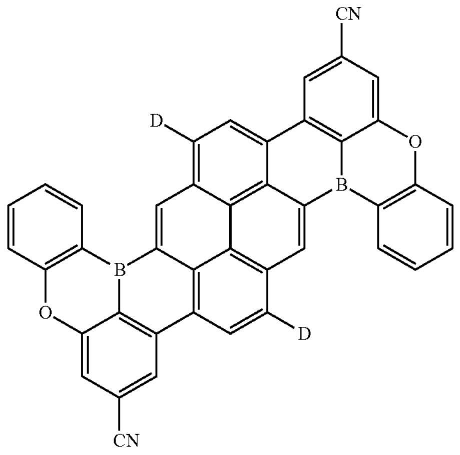
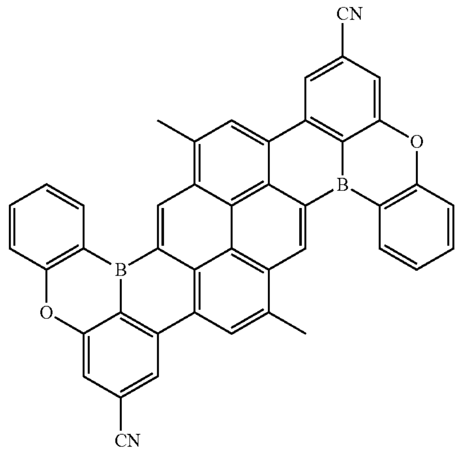
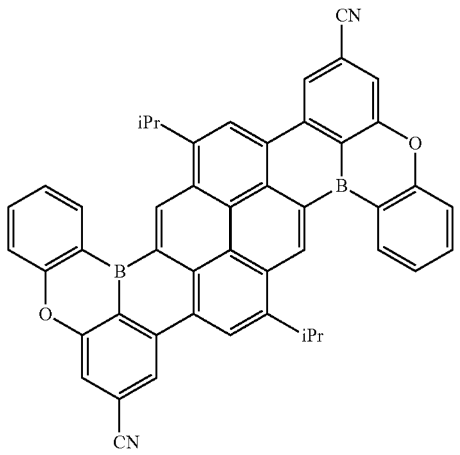
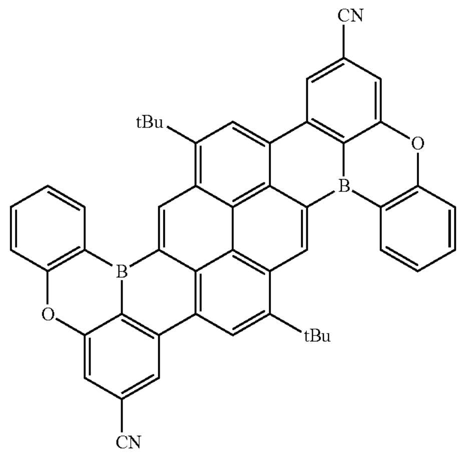
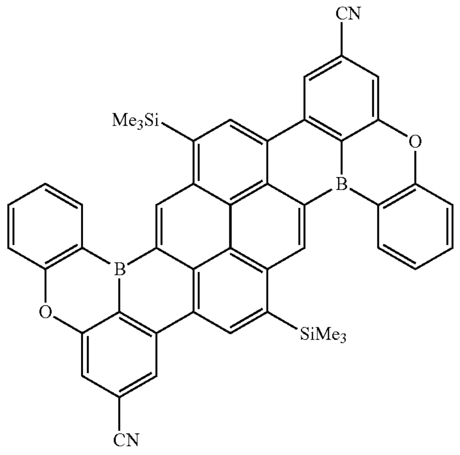
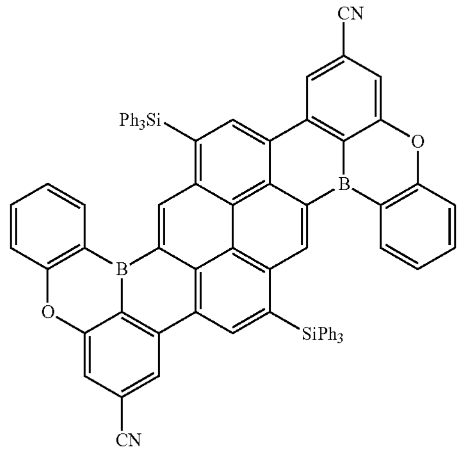

-continued
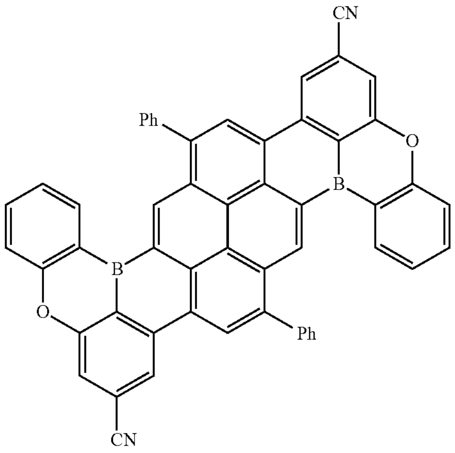
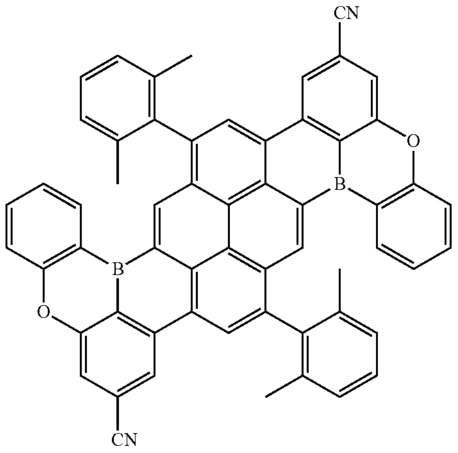
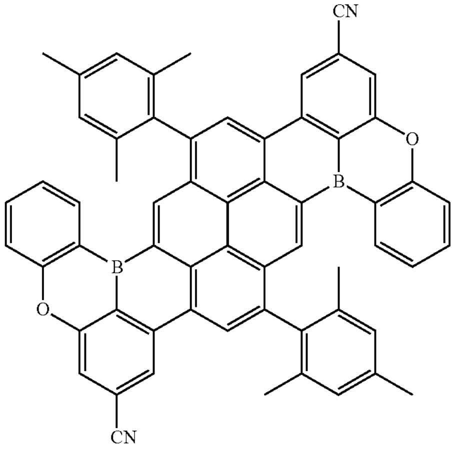
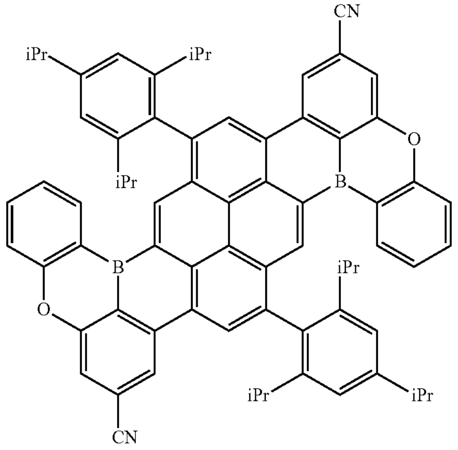
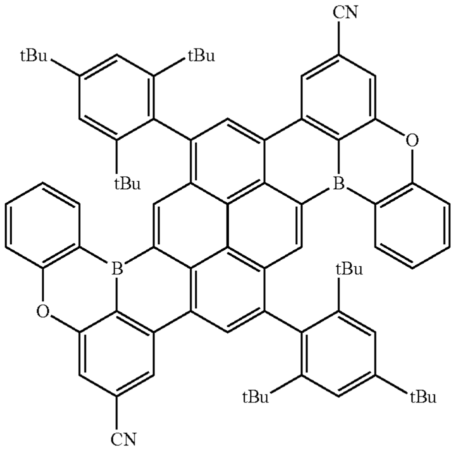
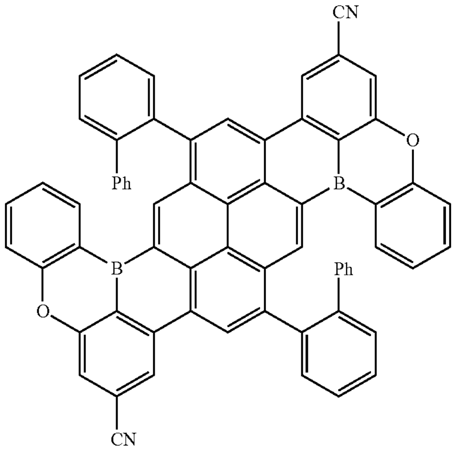

-continued
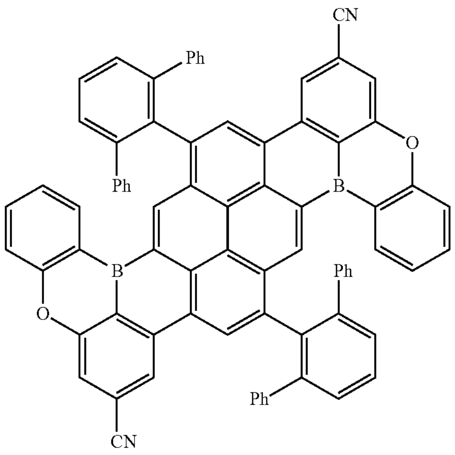
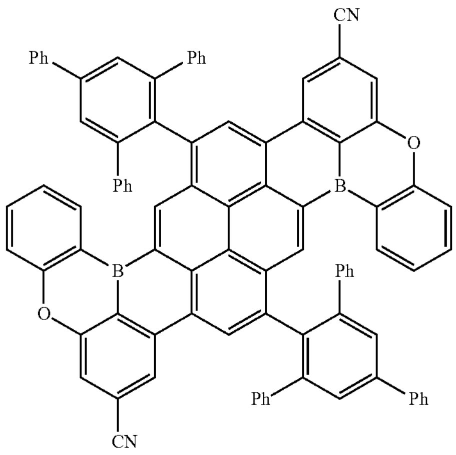
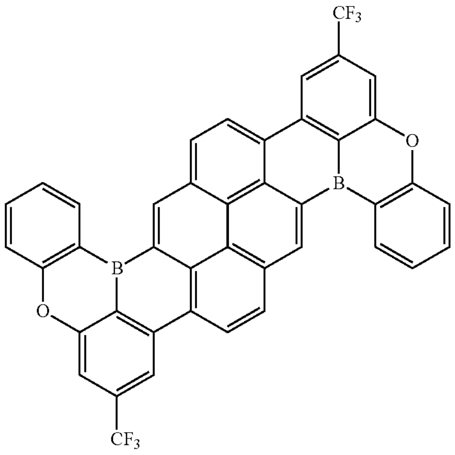
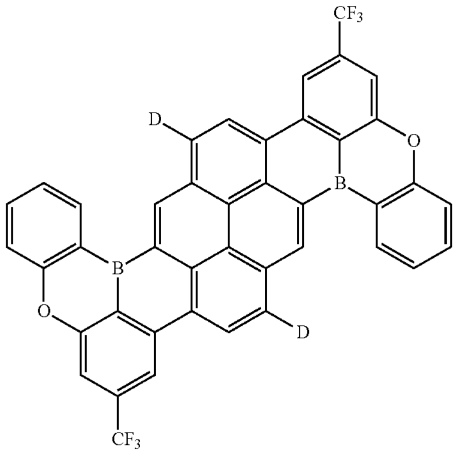
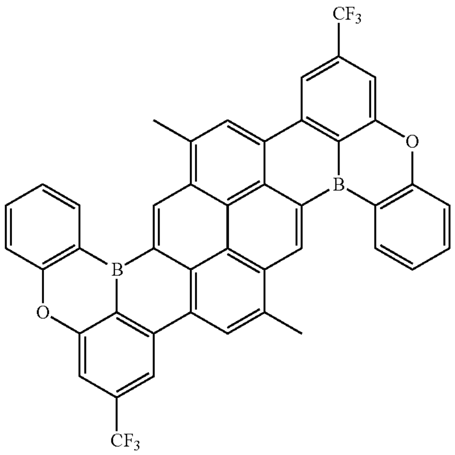
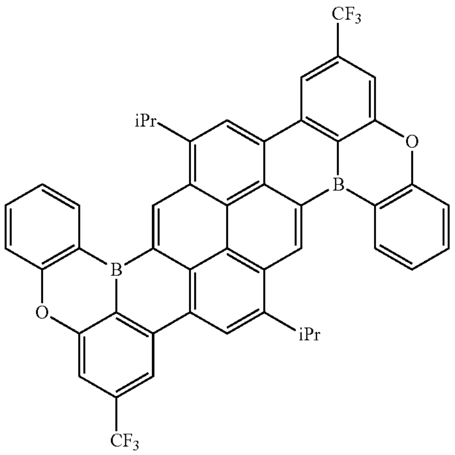

-continued
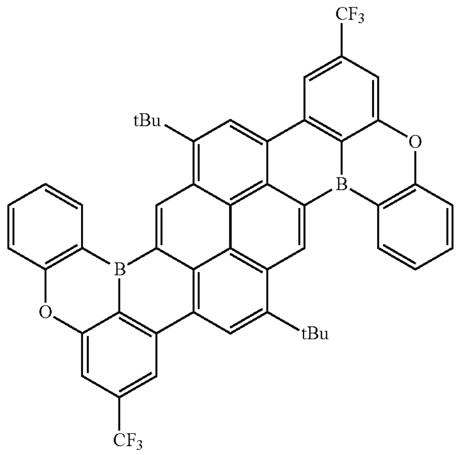
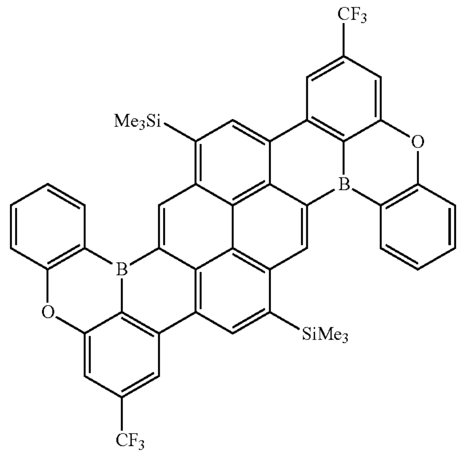
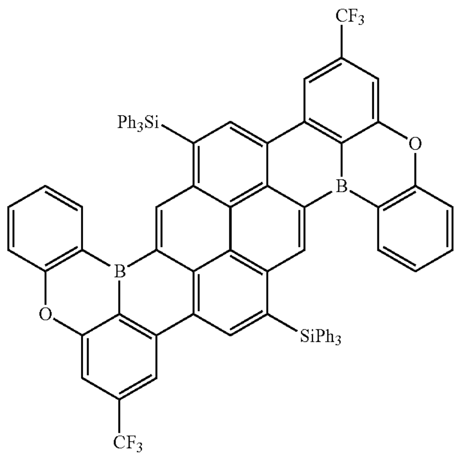
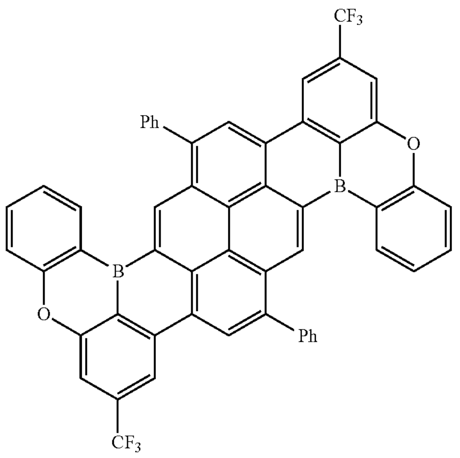
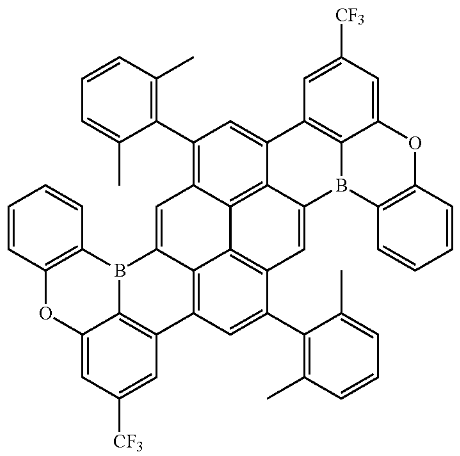
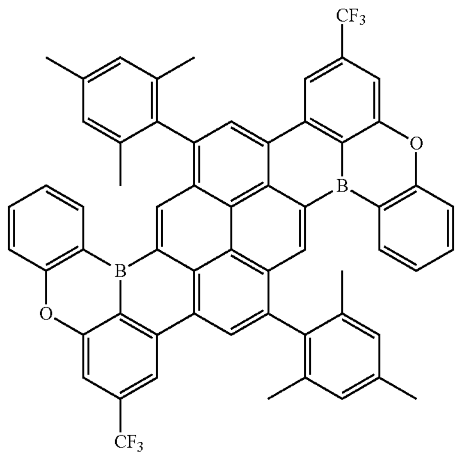

-continued
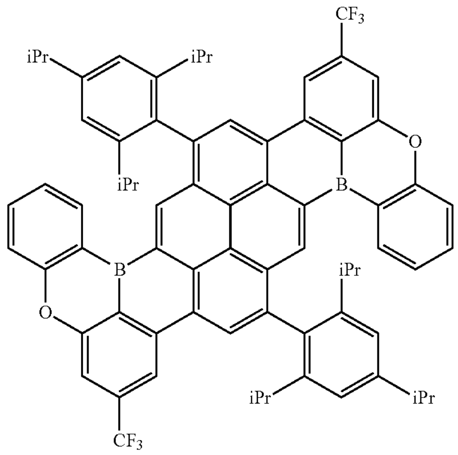
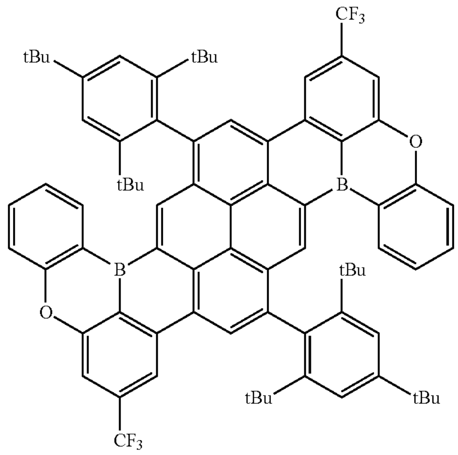
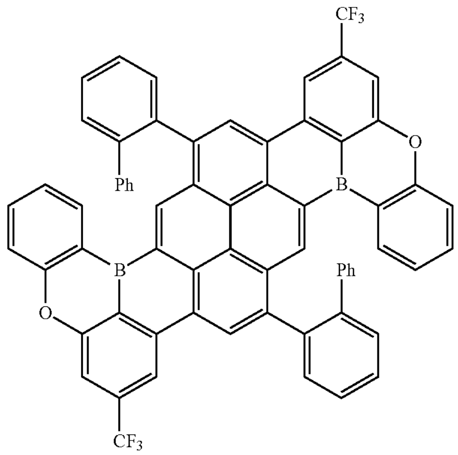
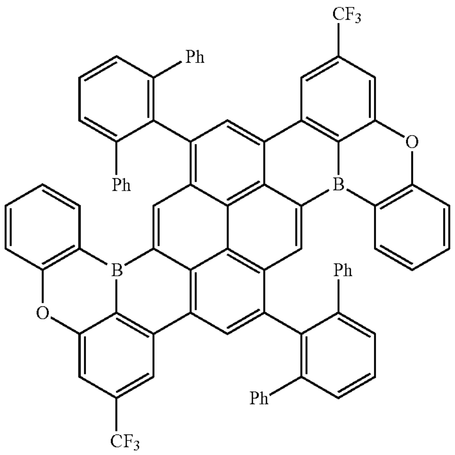
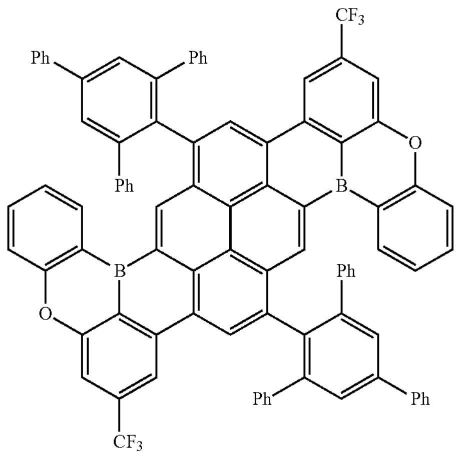
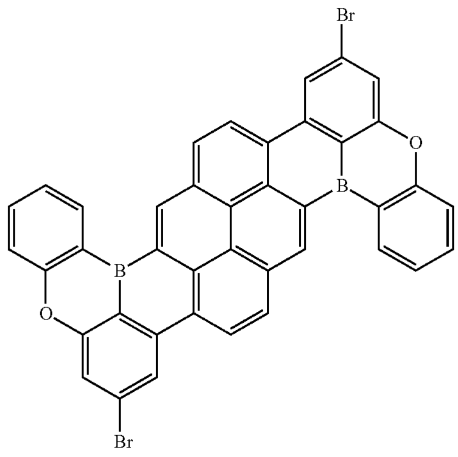

-continued
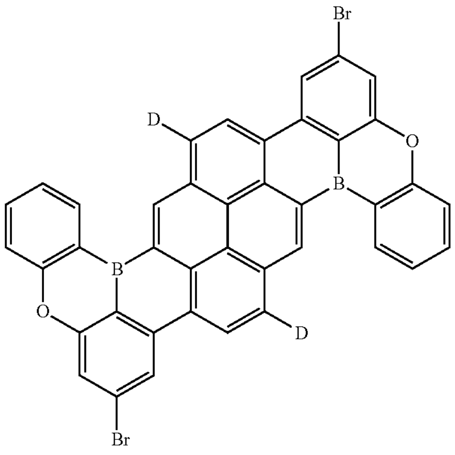
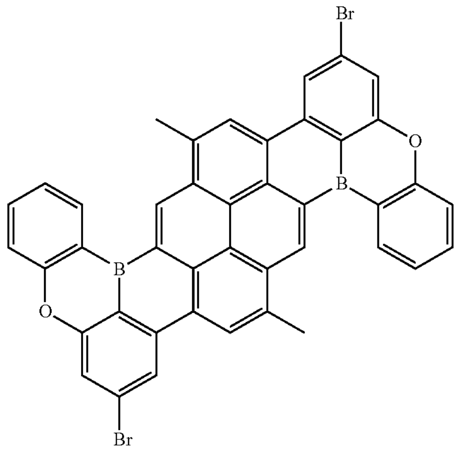
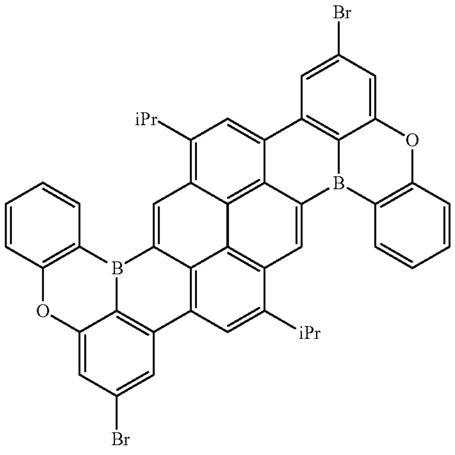
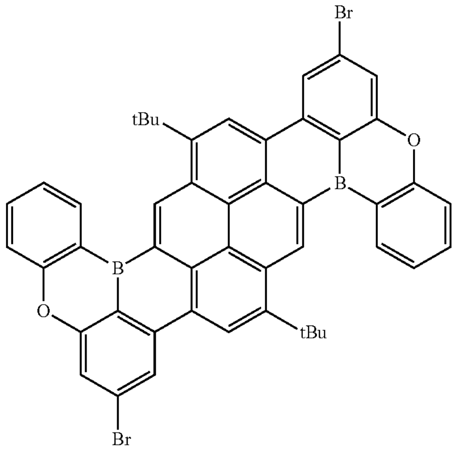
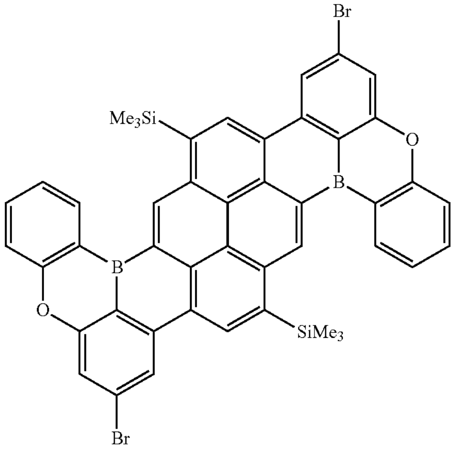
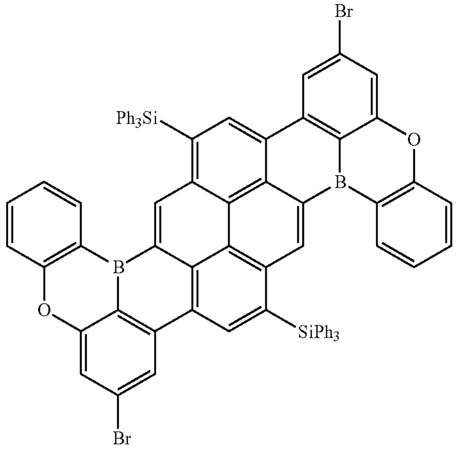

-continued
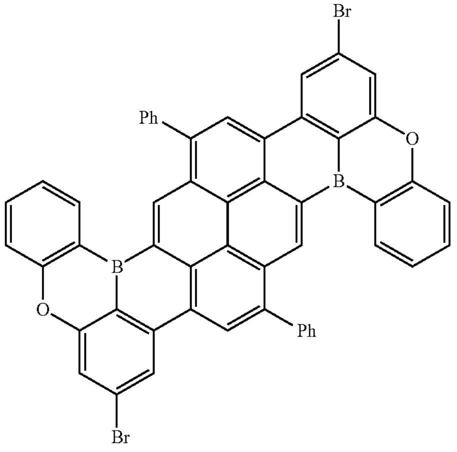
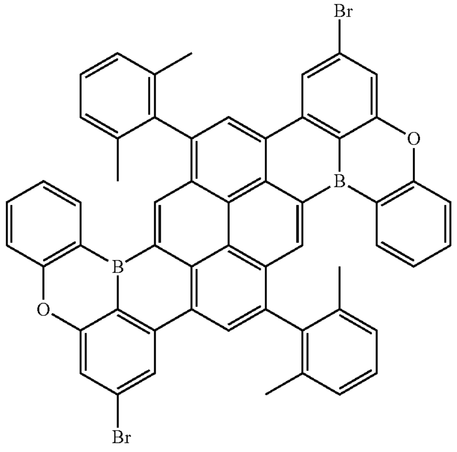
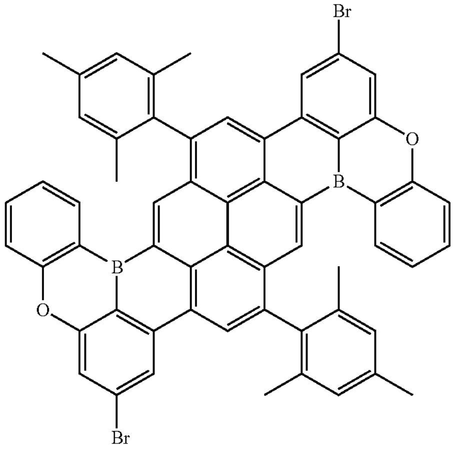
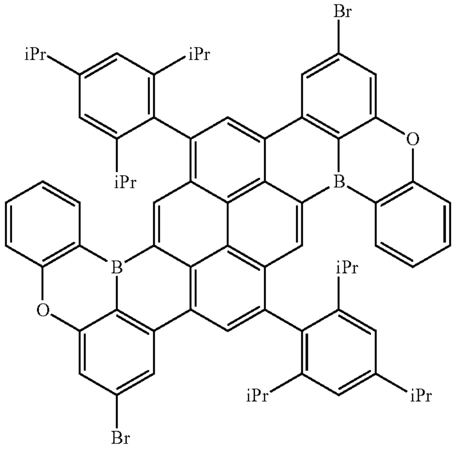
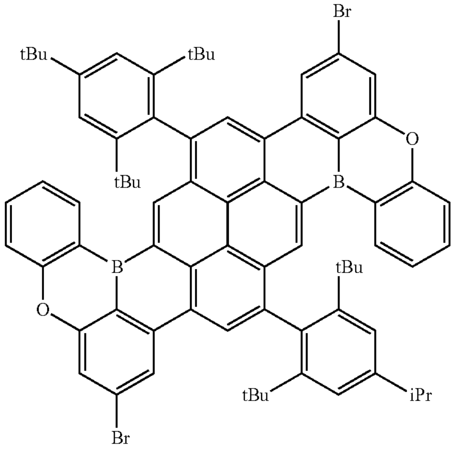
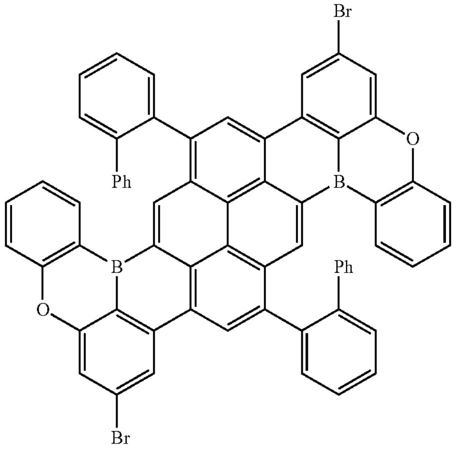

-continued
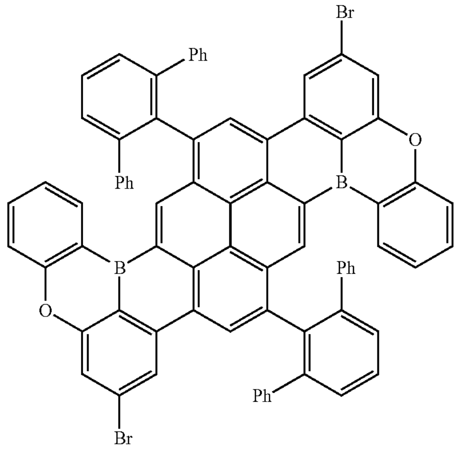
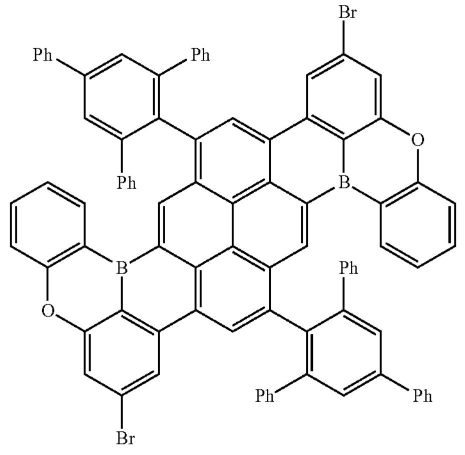
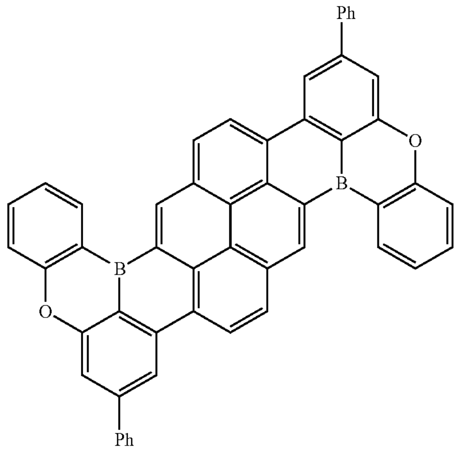
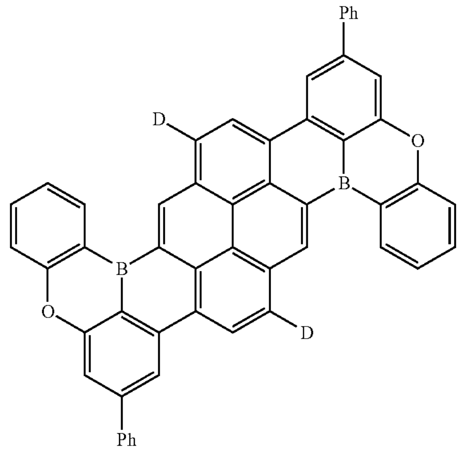
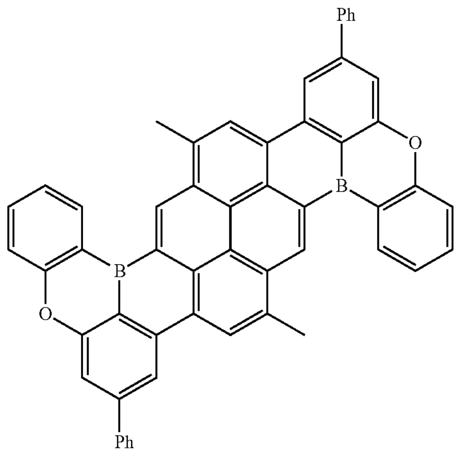
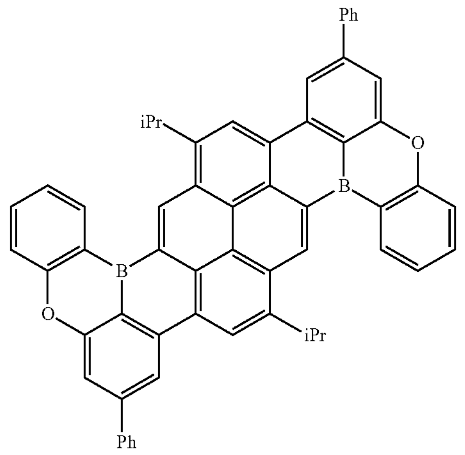

-continued
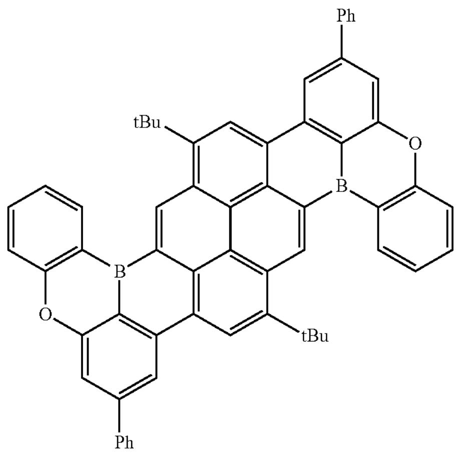
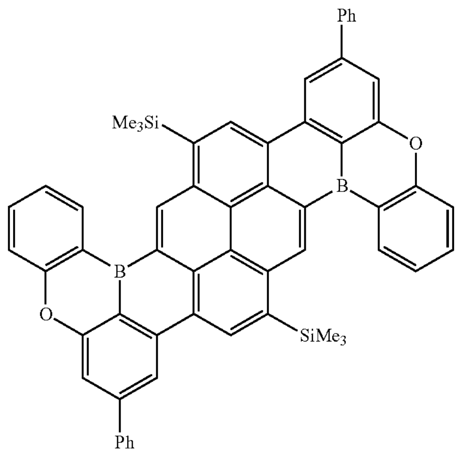
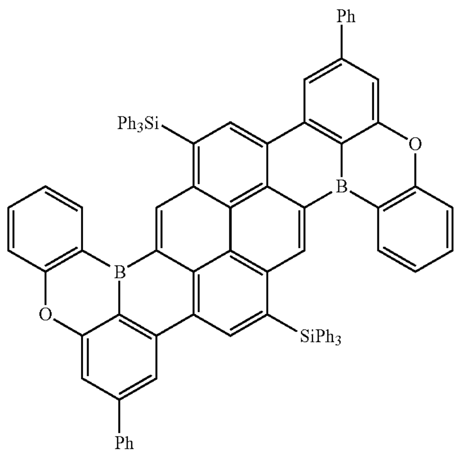
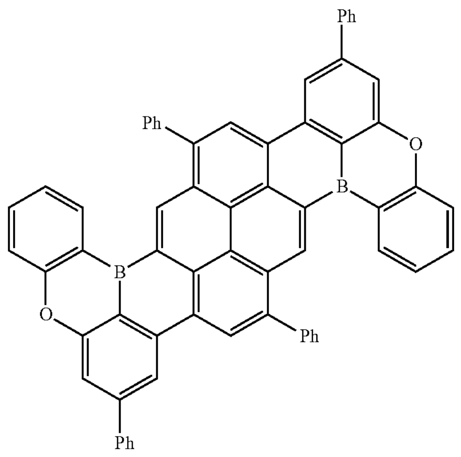
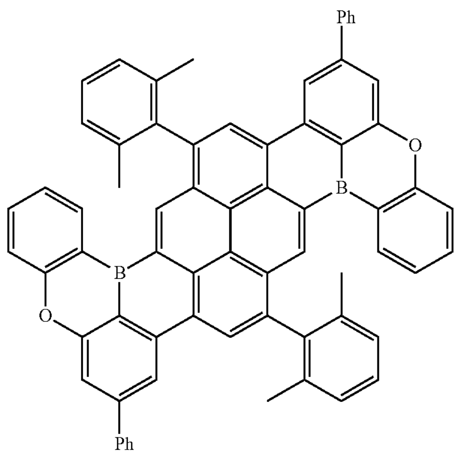
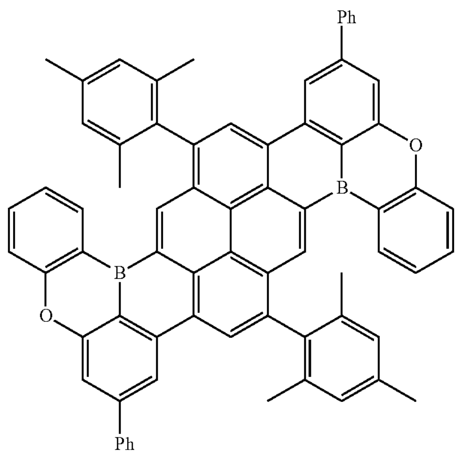

-continued
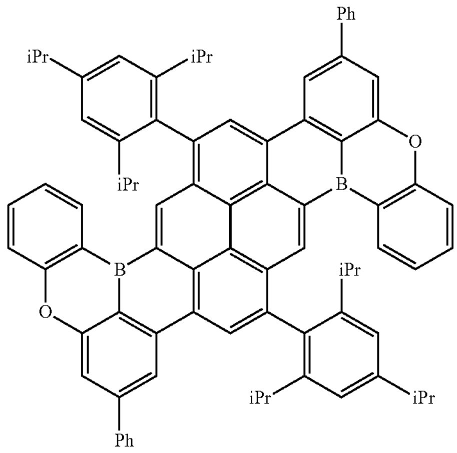
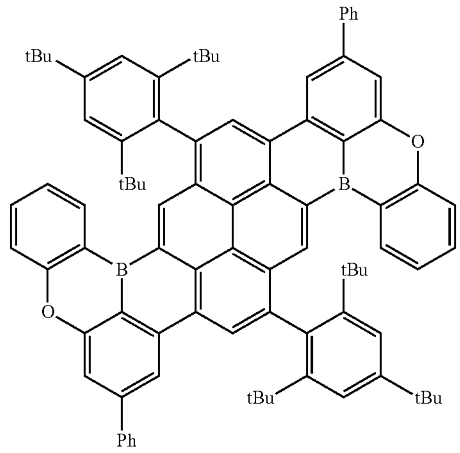
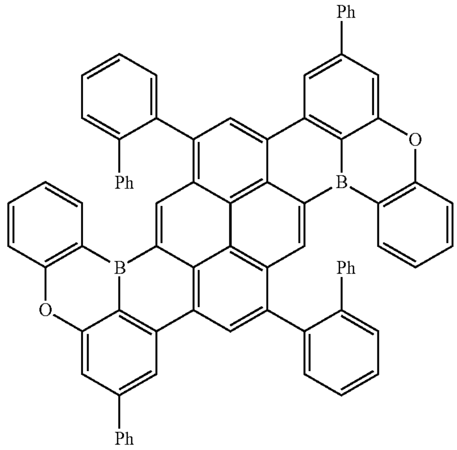
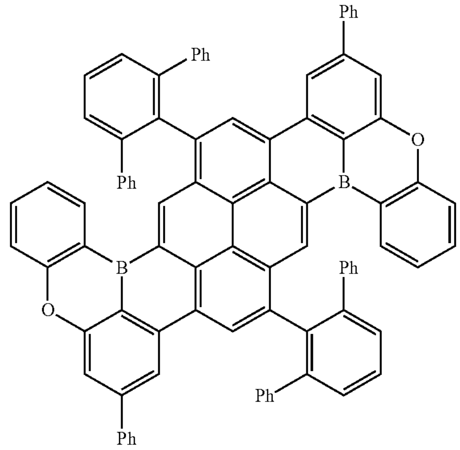
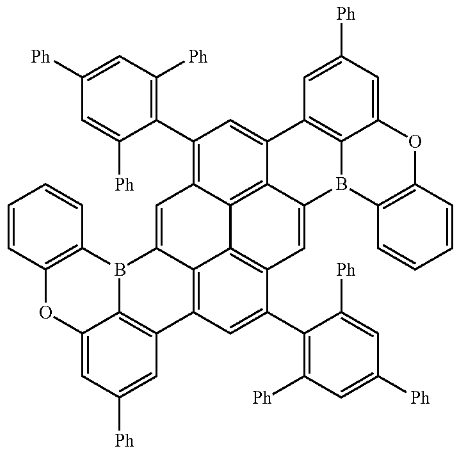
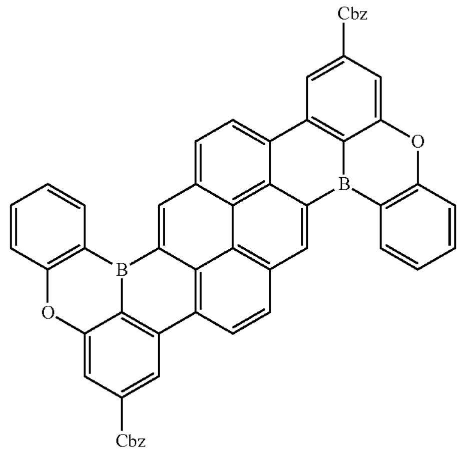

-continued
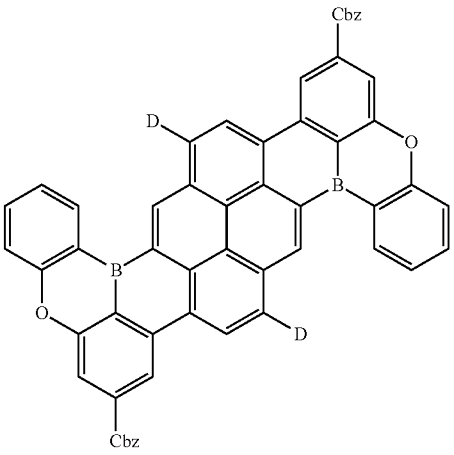
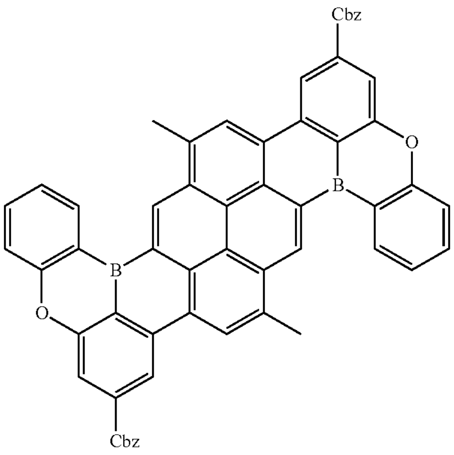
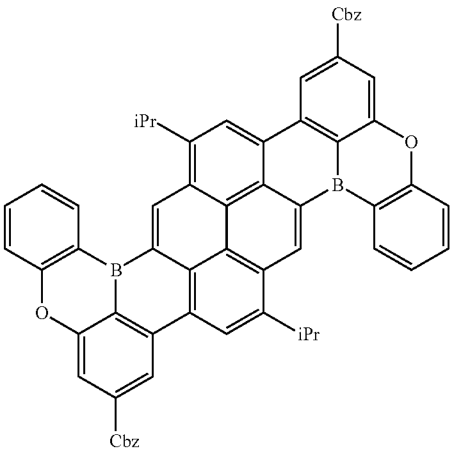
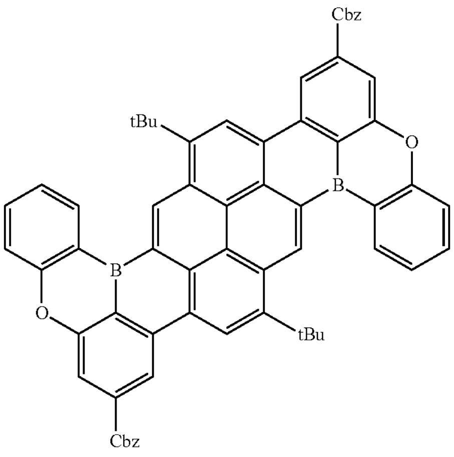
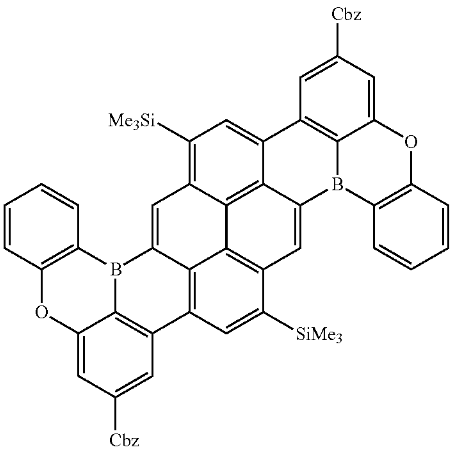
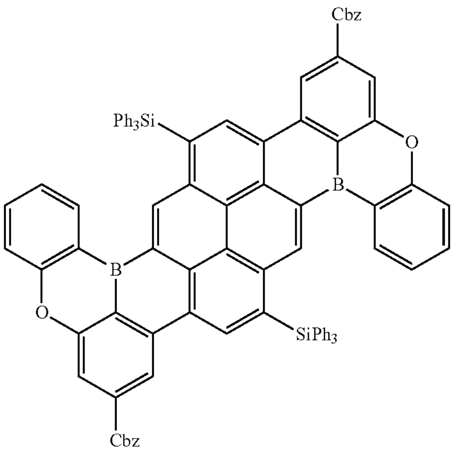

-continued
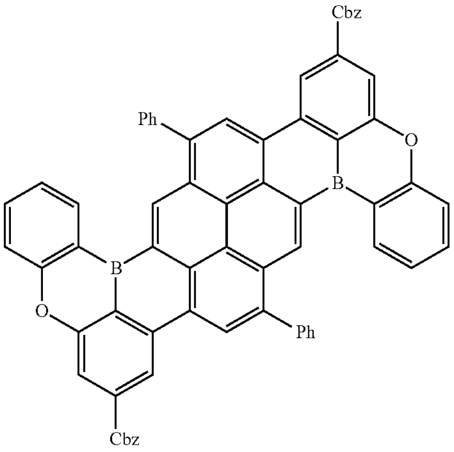
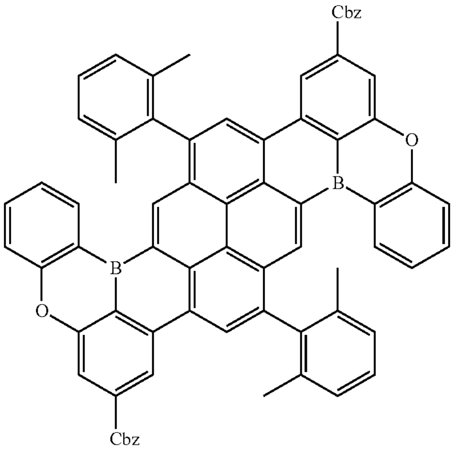
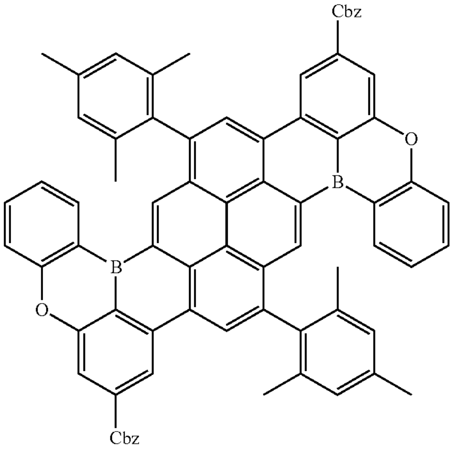
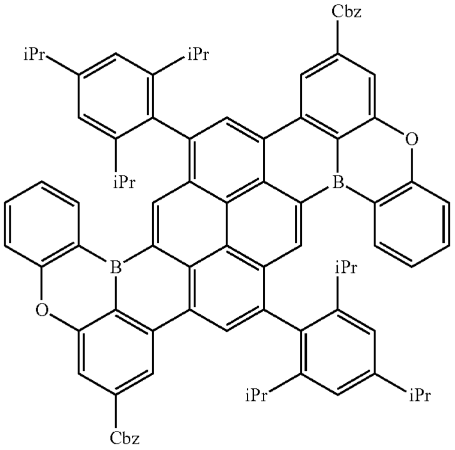
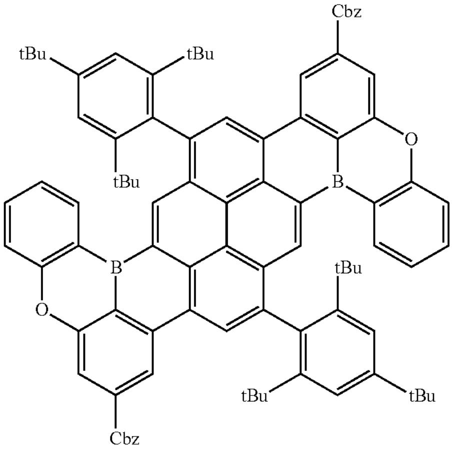
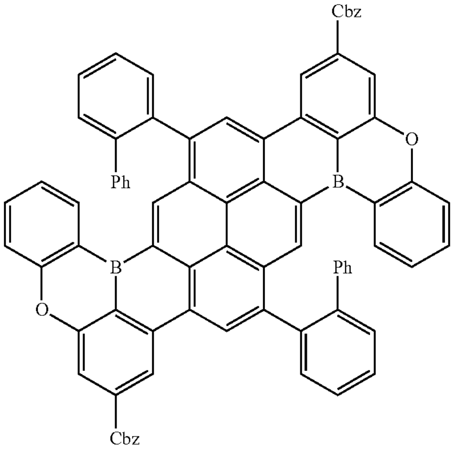

-continued
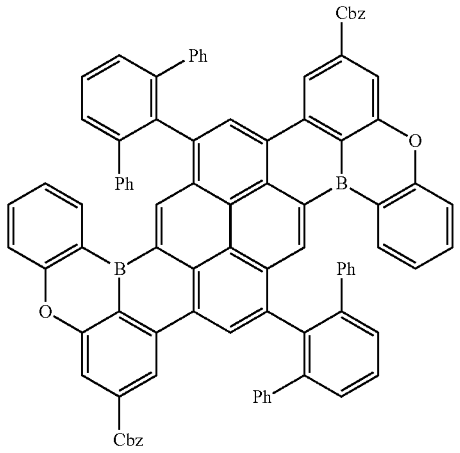
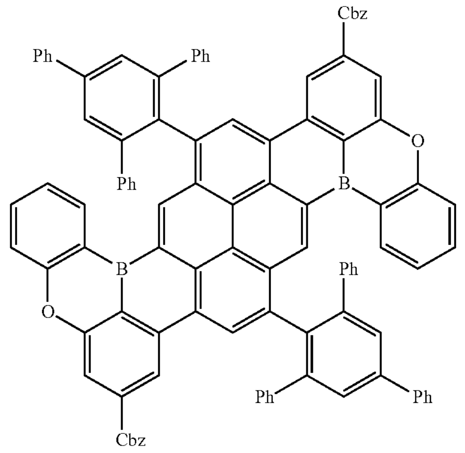
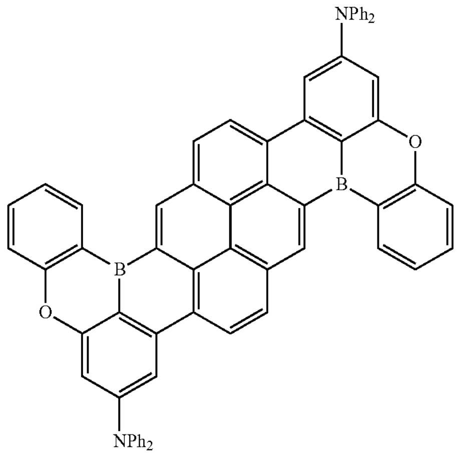
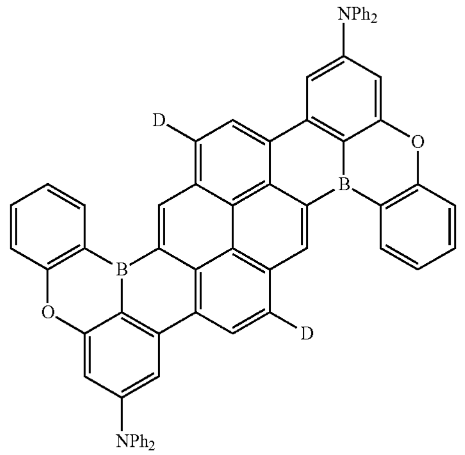
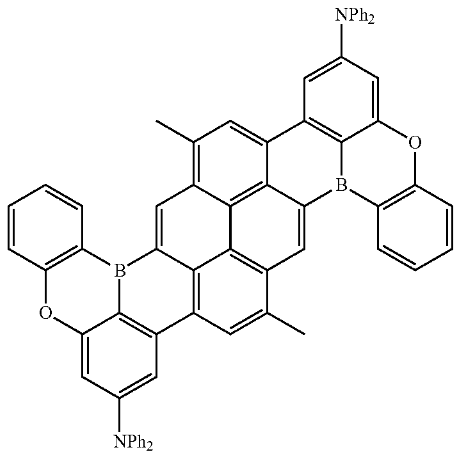
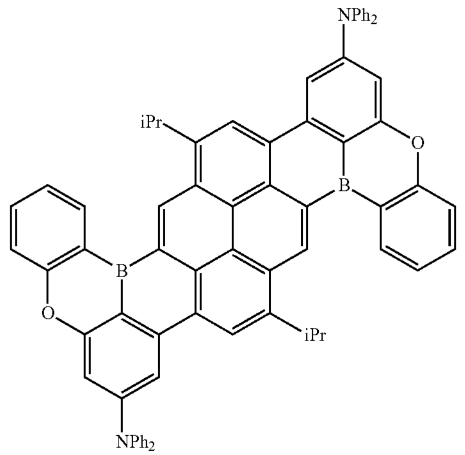

-continued
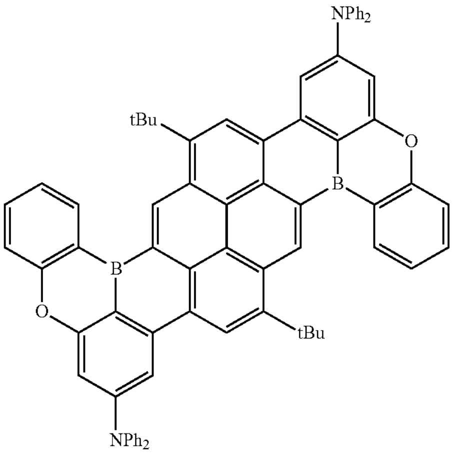
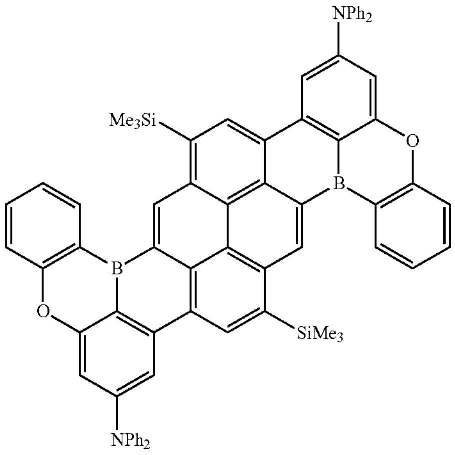
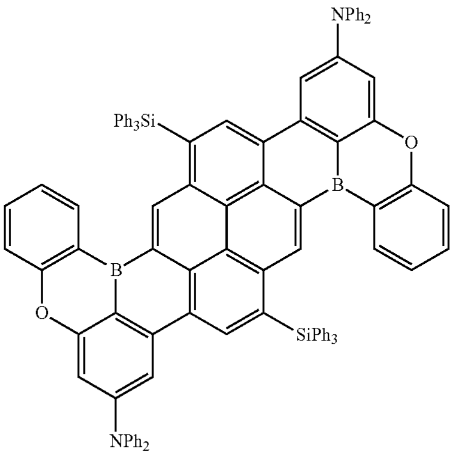
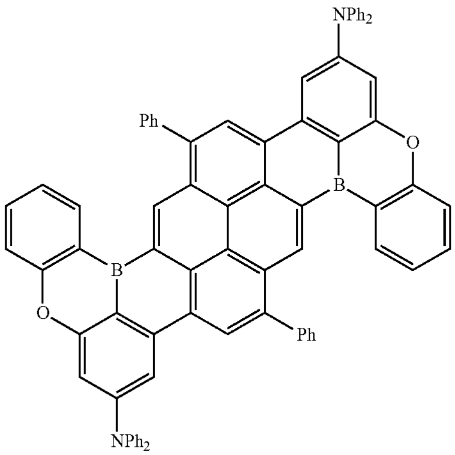
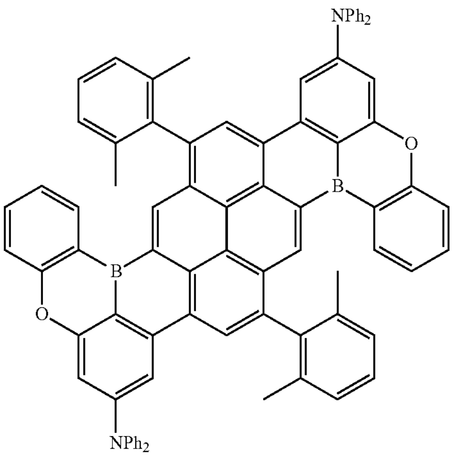
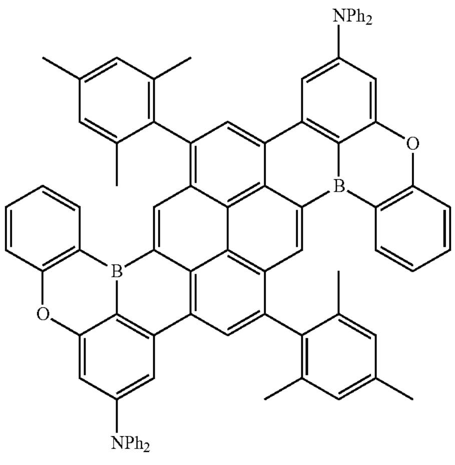

-continued
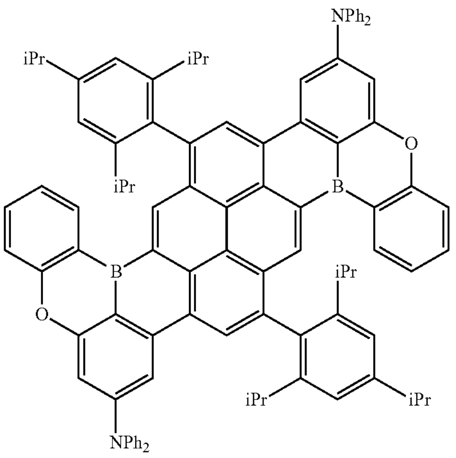
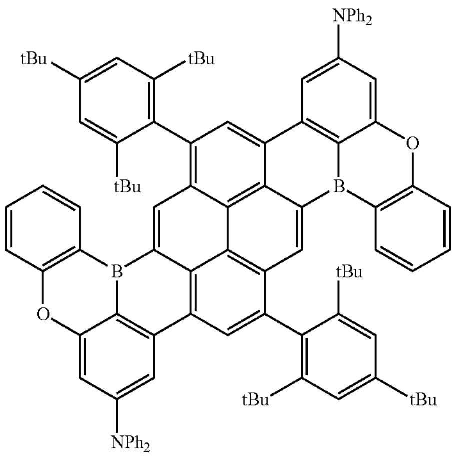
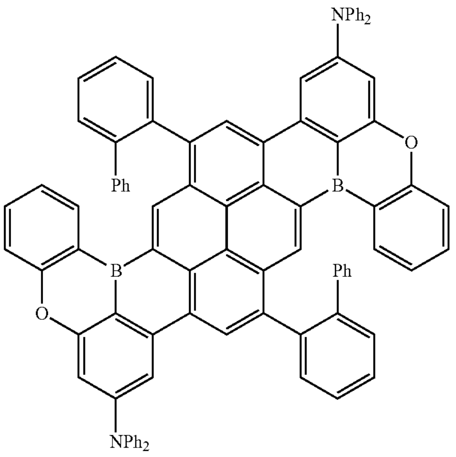
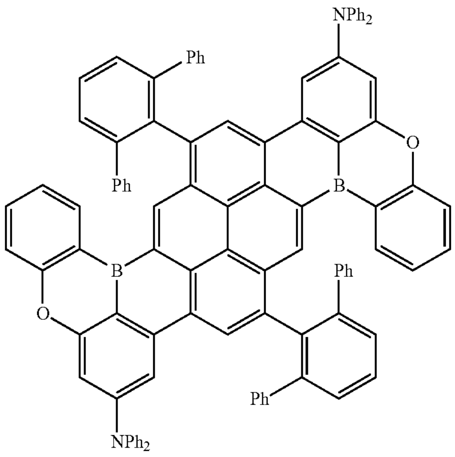
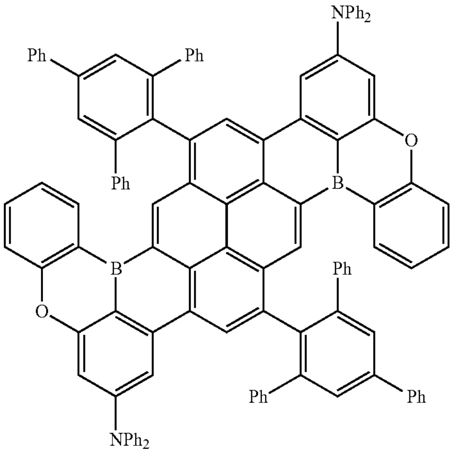
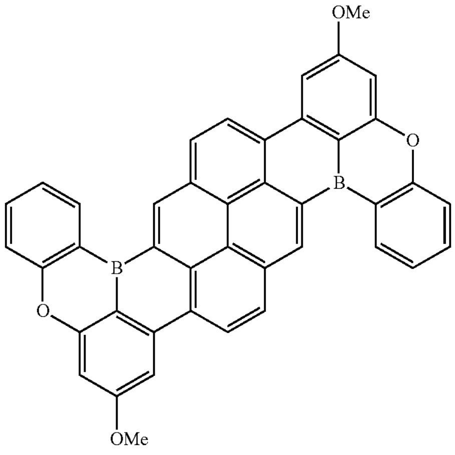

-continued
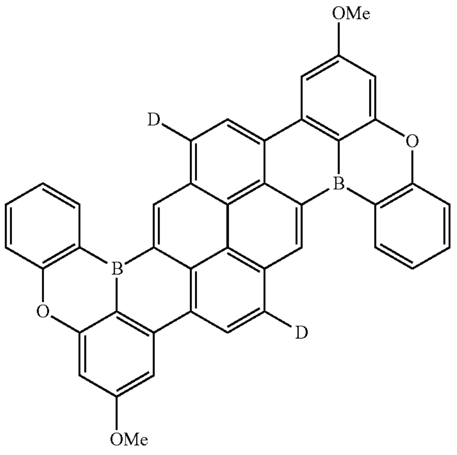
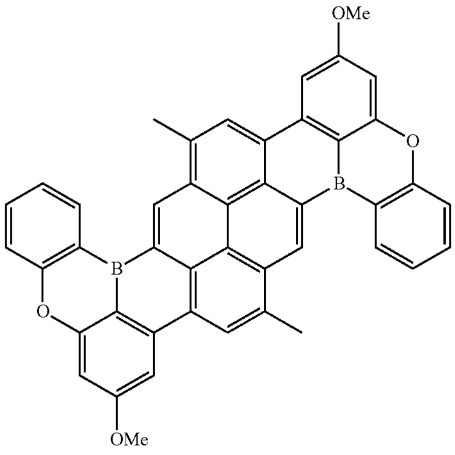
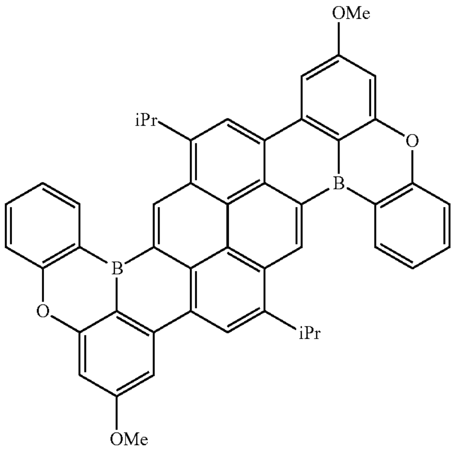
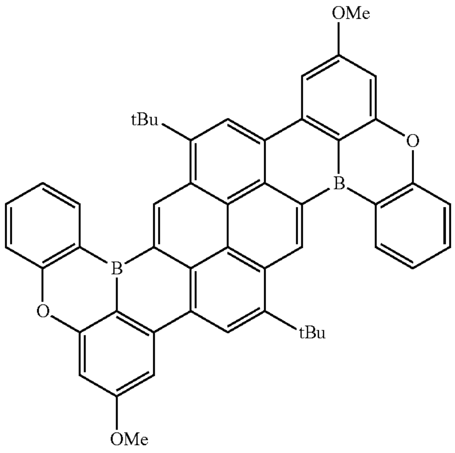
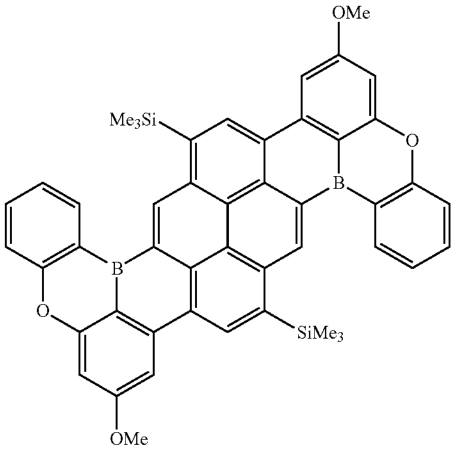
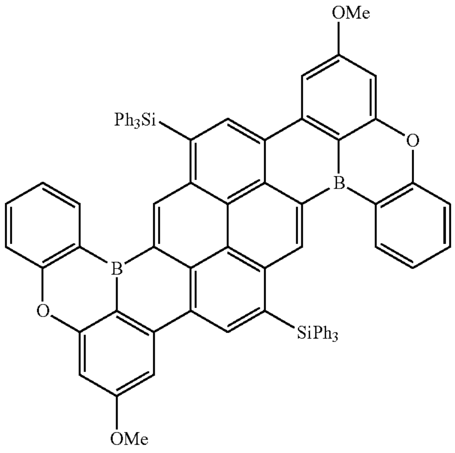

-continued
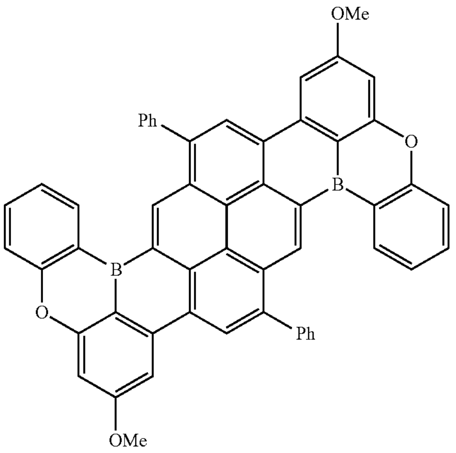
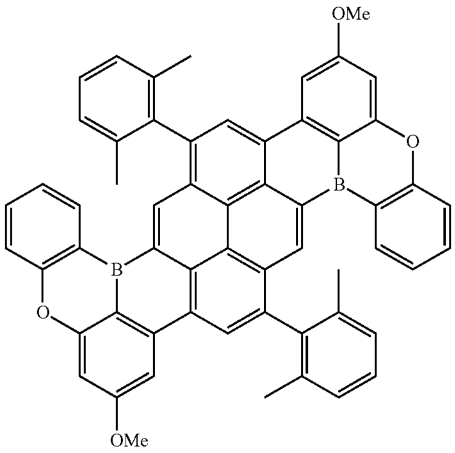
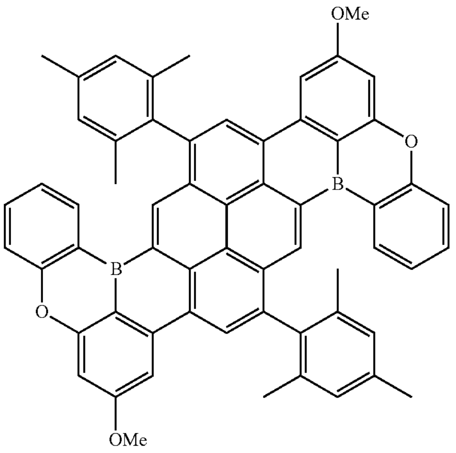
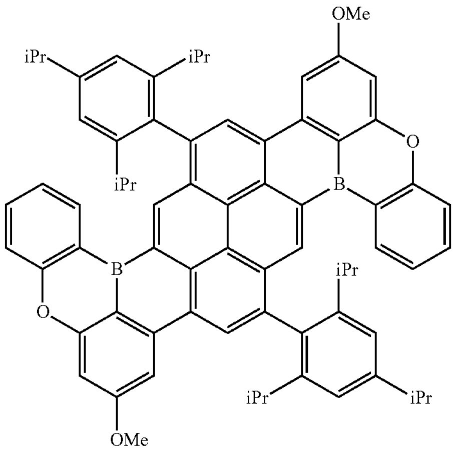
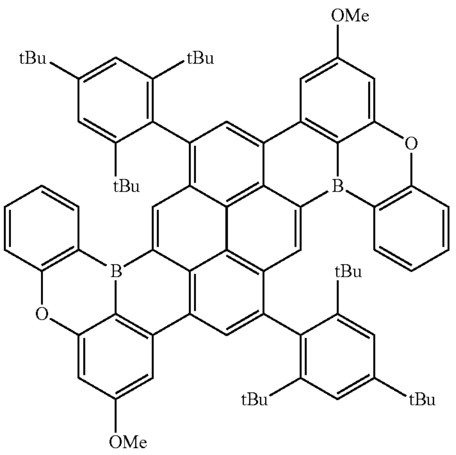
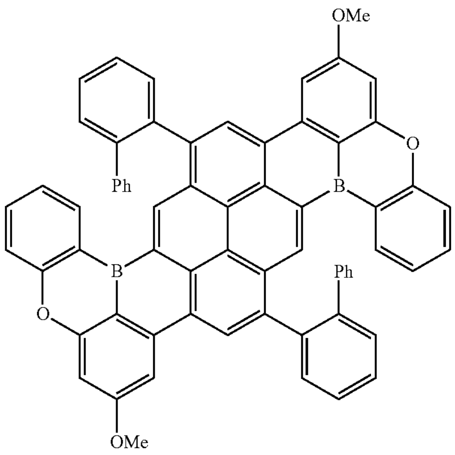

-continued
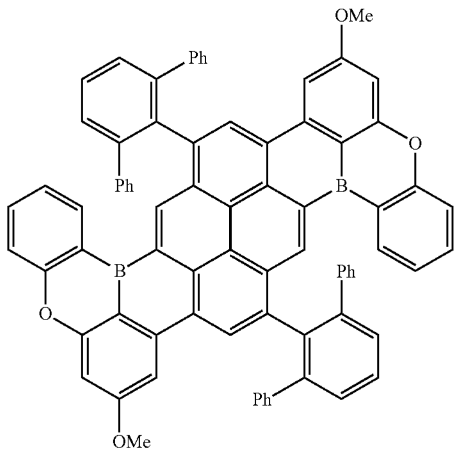
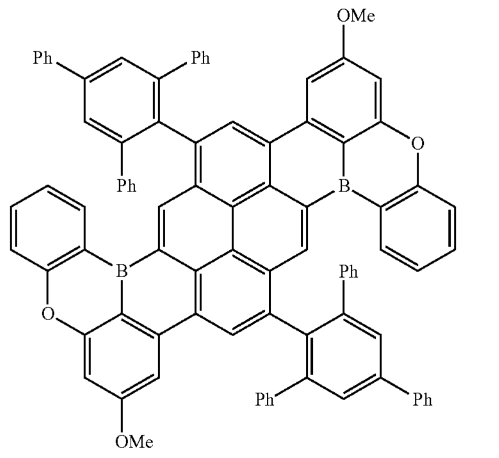
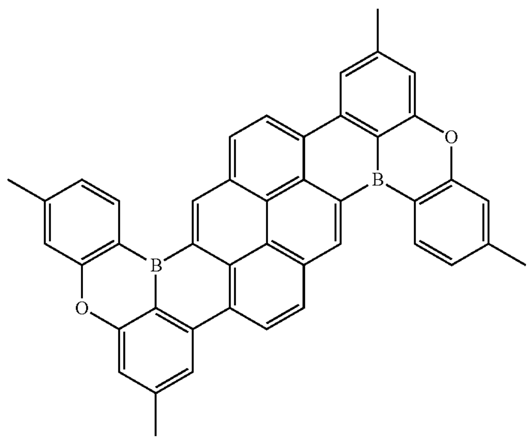
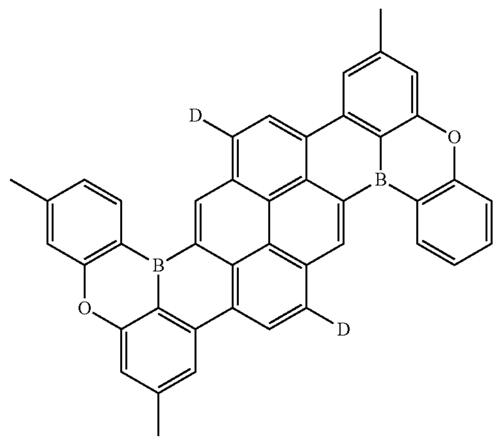
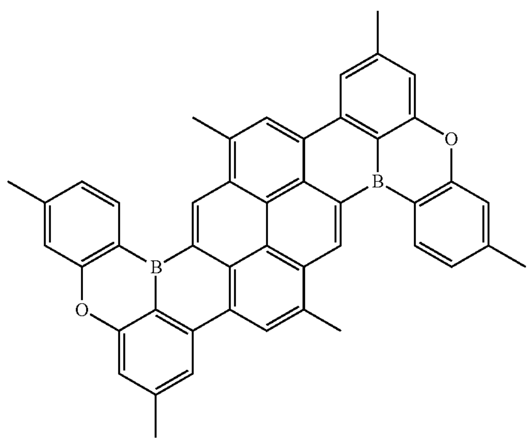
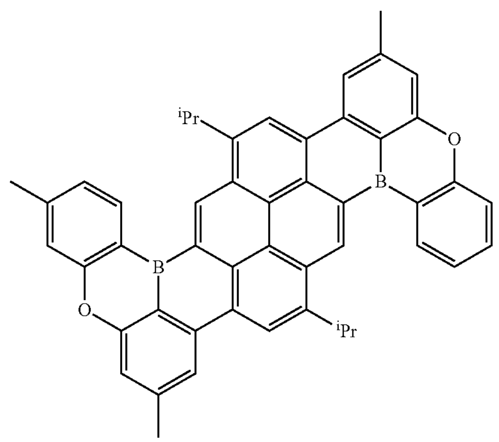

-continued
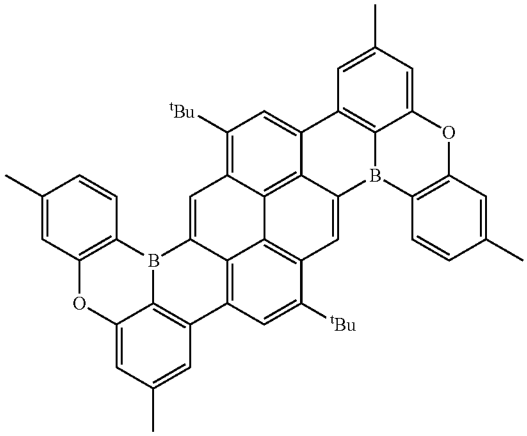
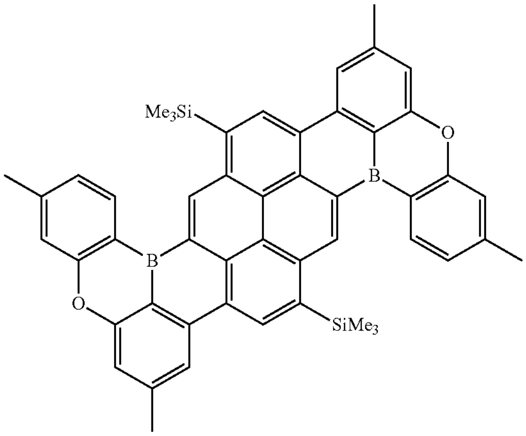
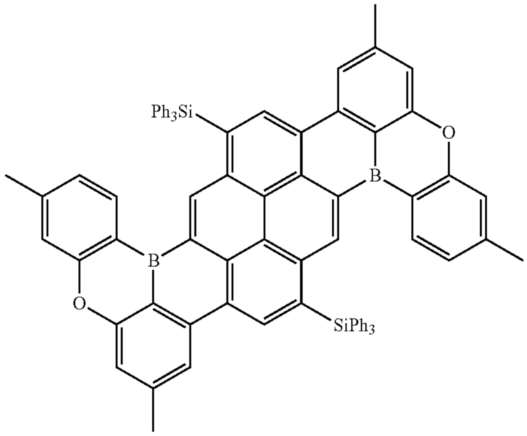
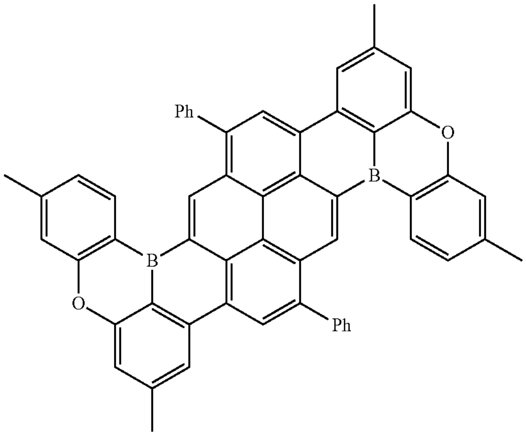
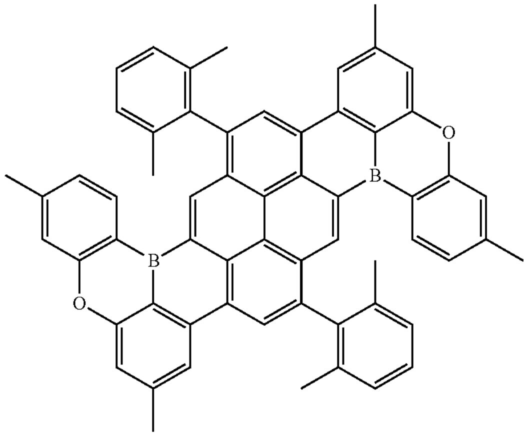
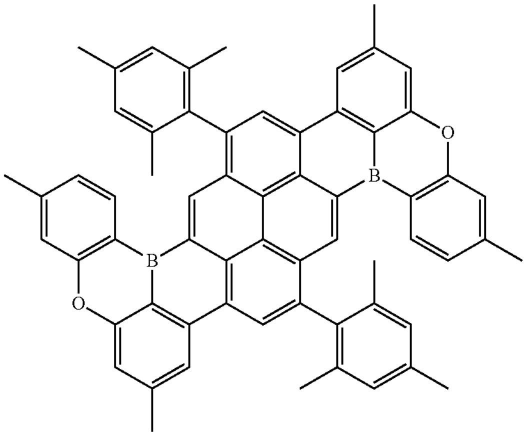

-continued
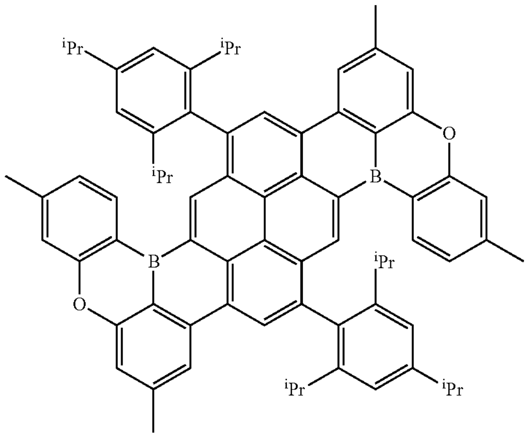
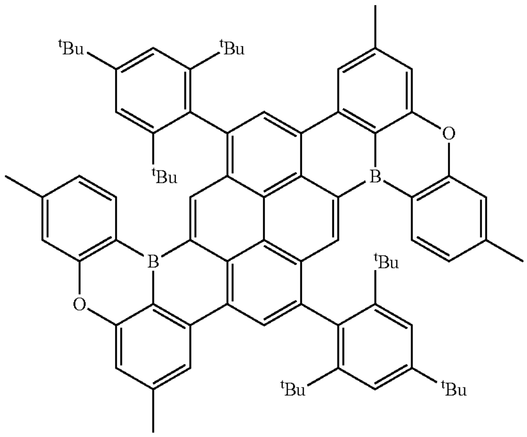
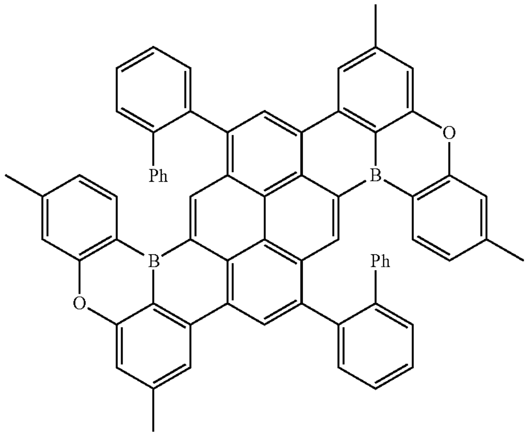
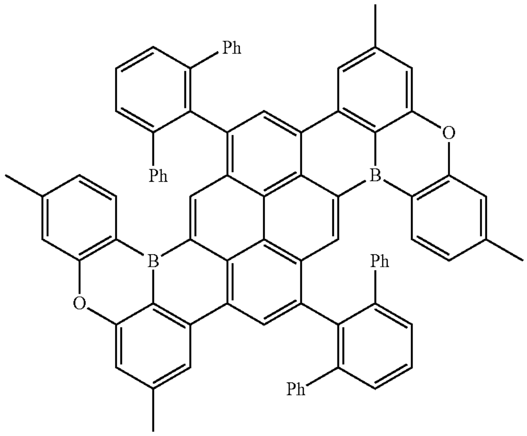
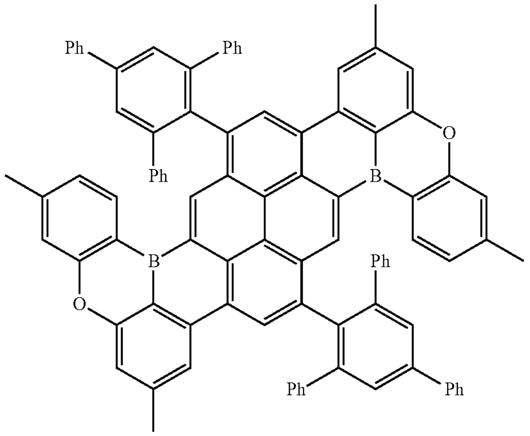
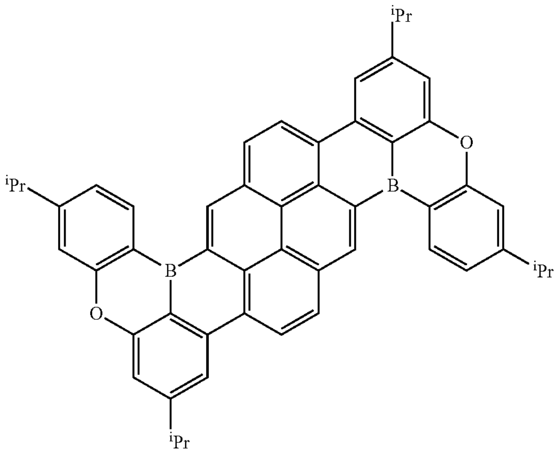

-continued
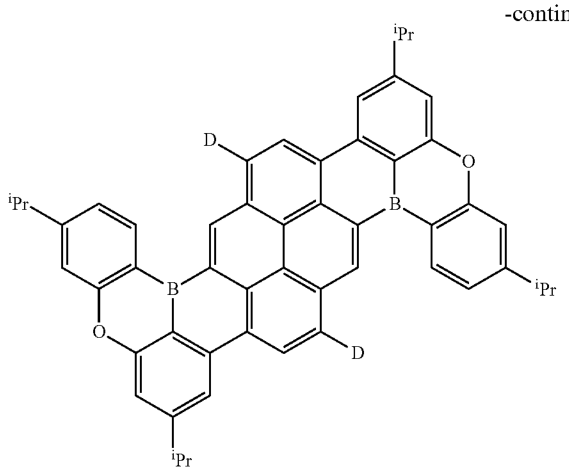
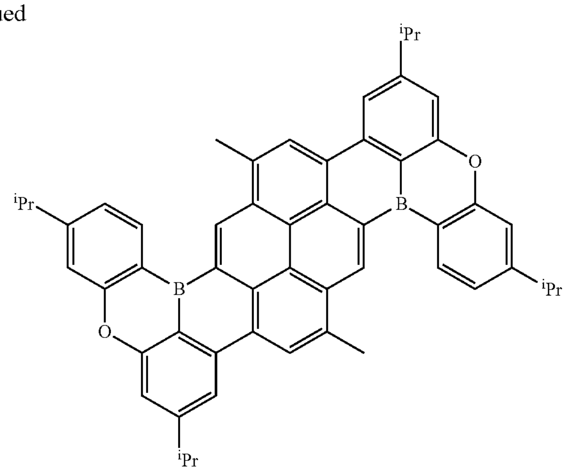
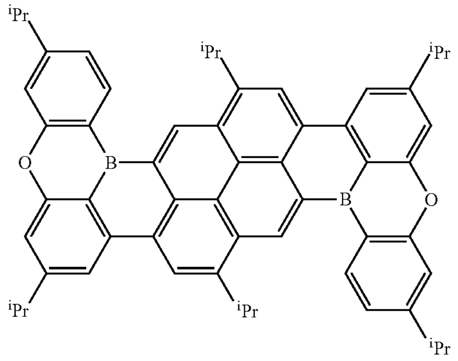
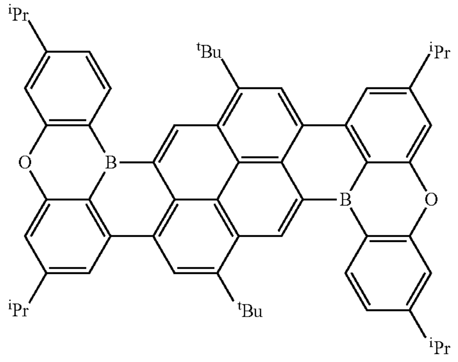
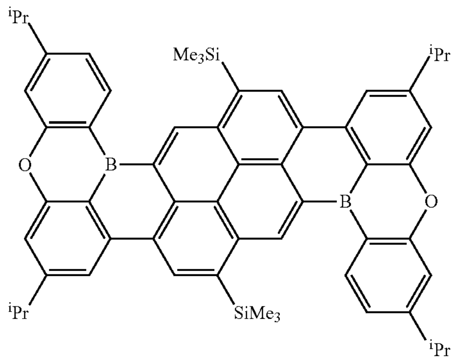
-continued
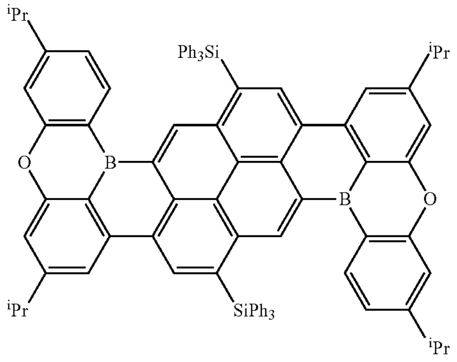
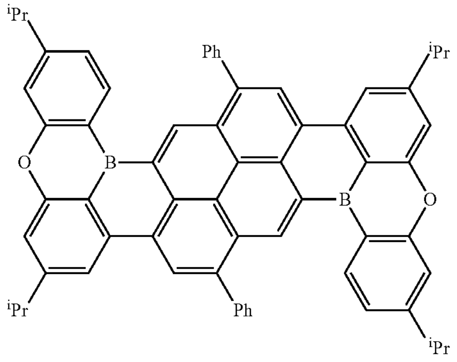
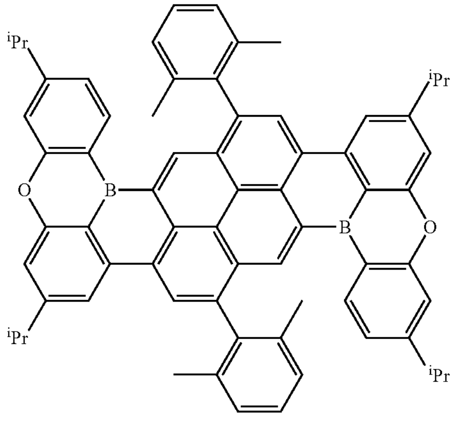

-continued
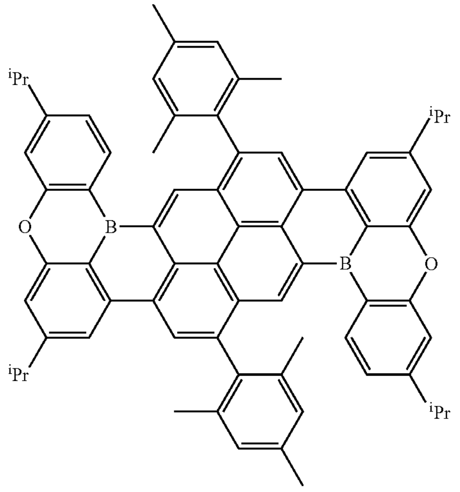
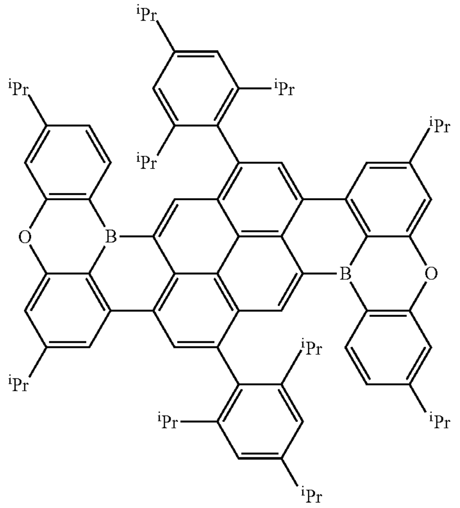
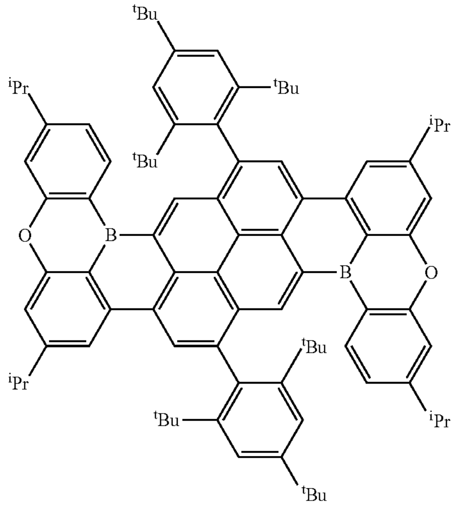
-continued
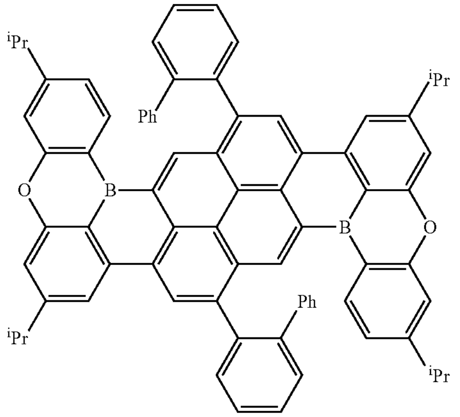
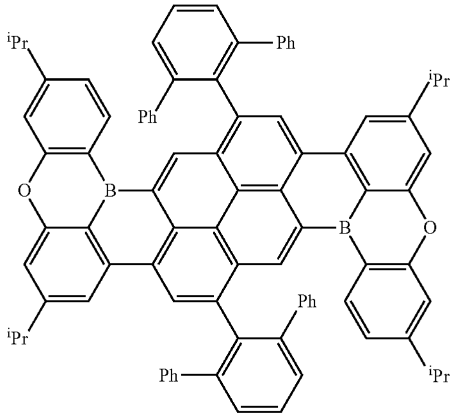
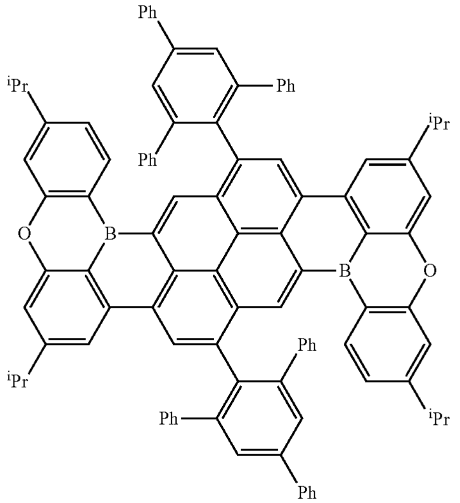
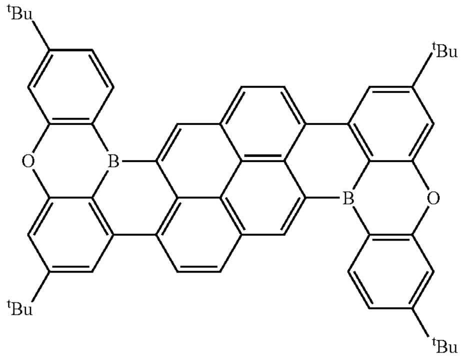

-continued
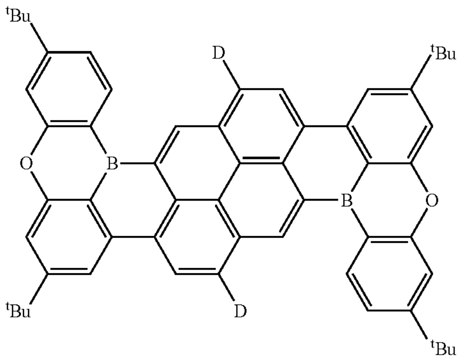
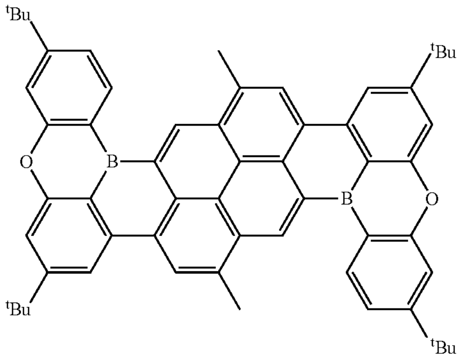
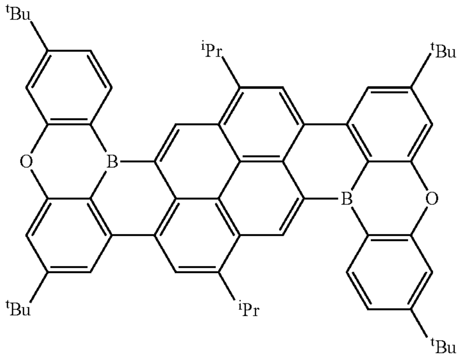
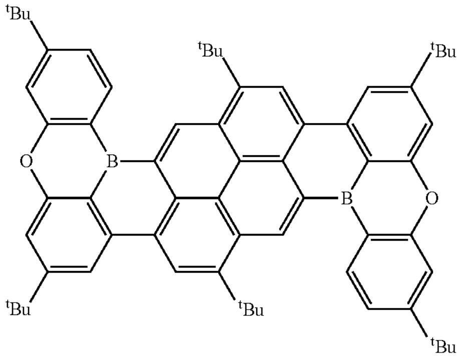
-continued
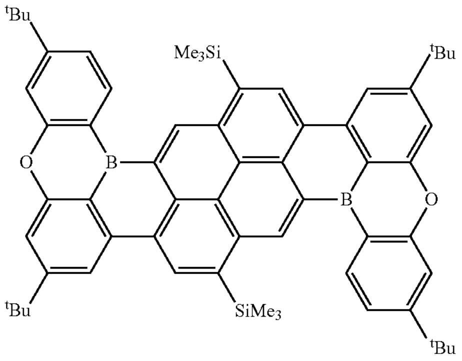
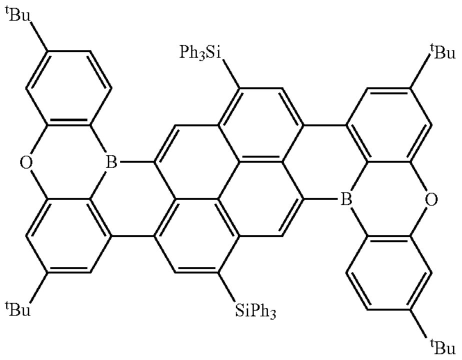
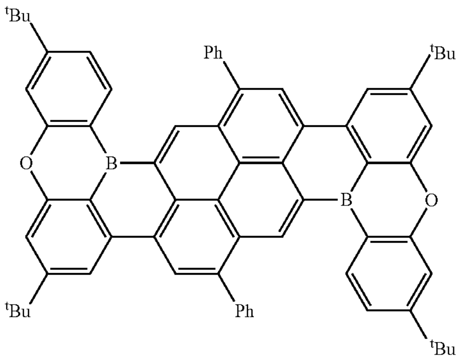
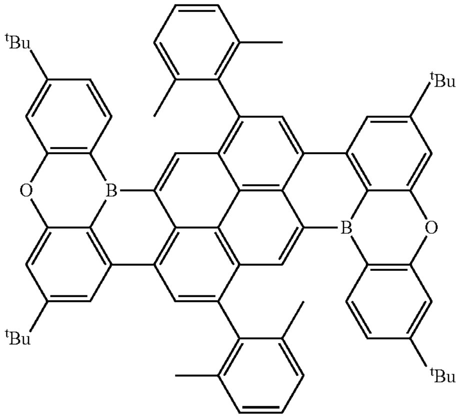

-continued
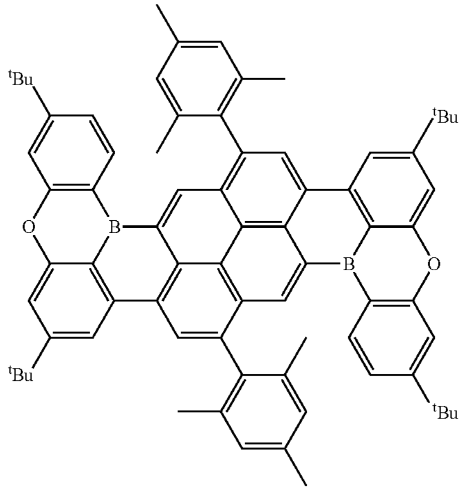
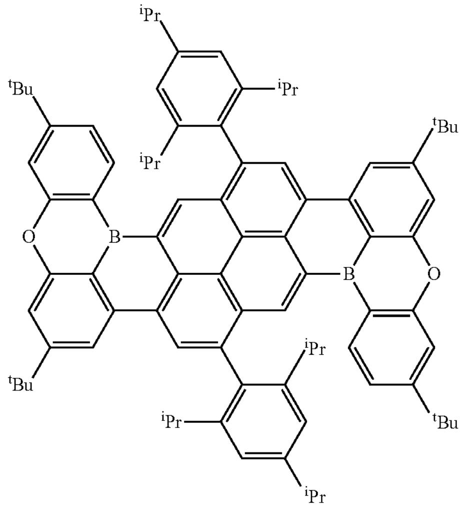
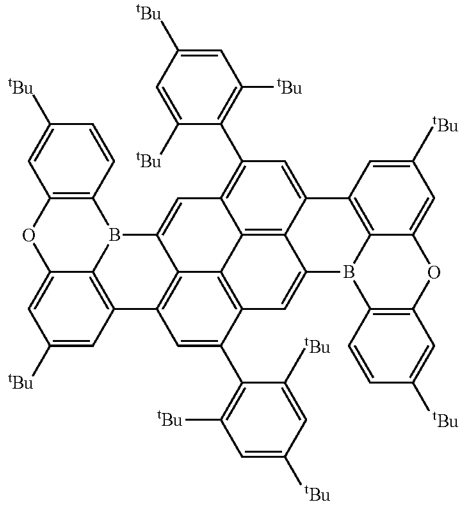
-continued
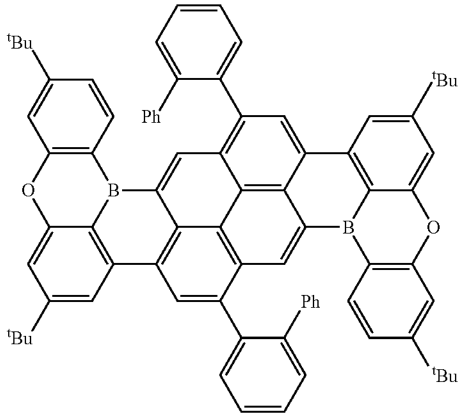
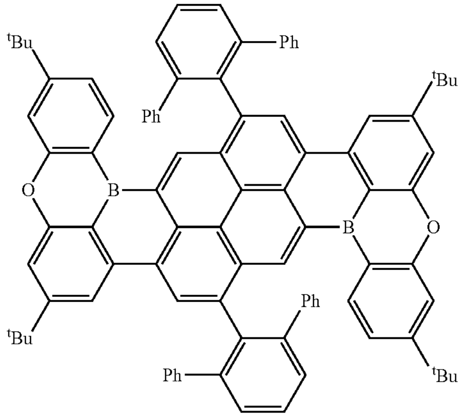
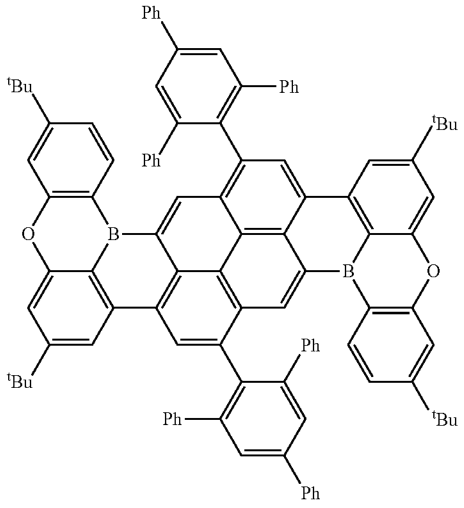
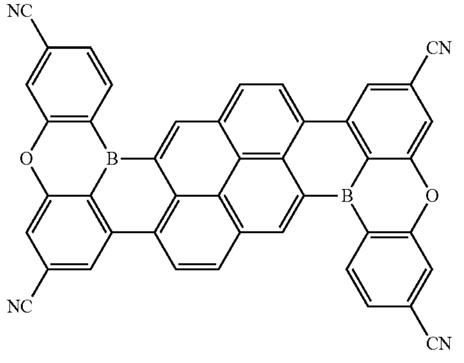

-continued
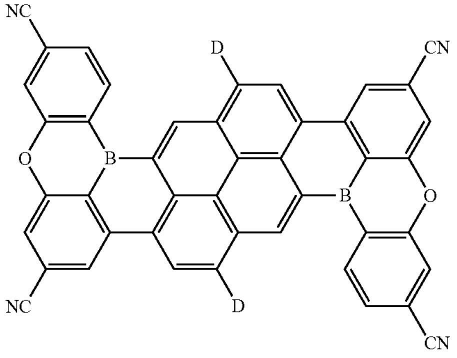
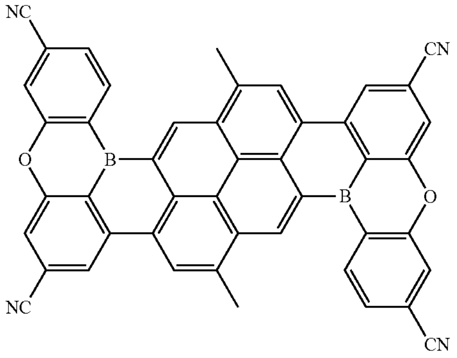
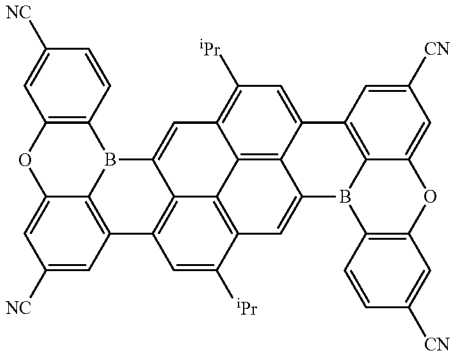
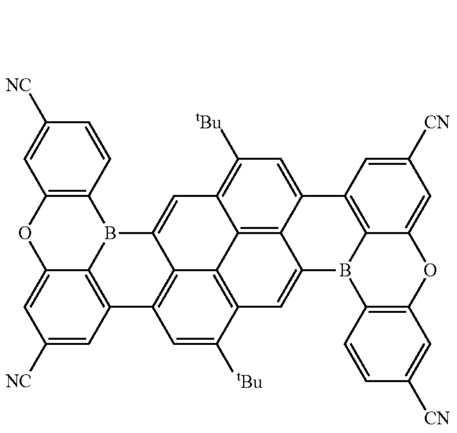
-continued
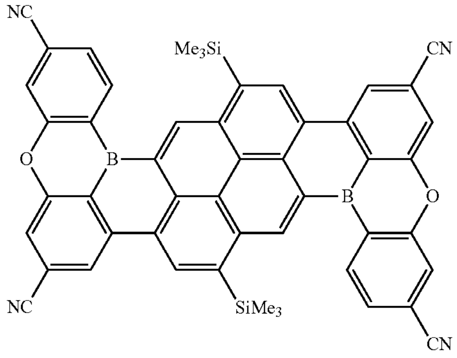
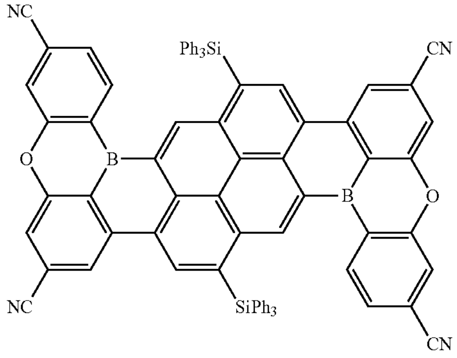
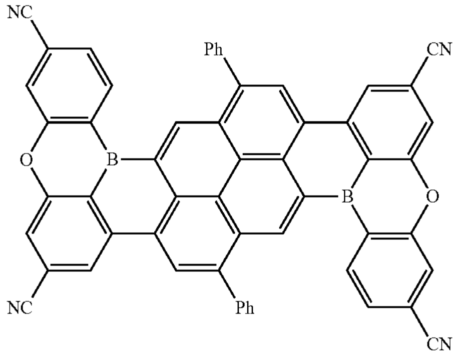
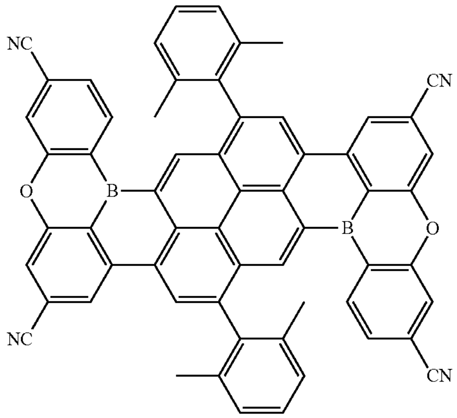

-continued
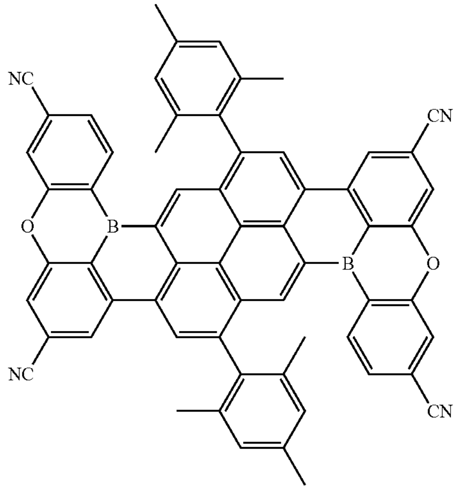
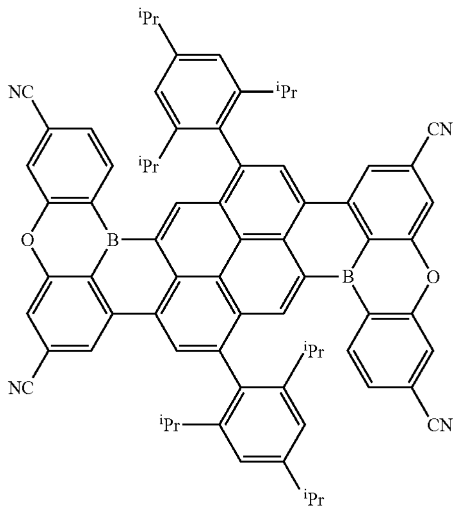
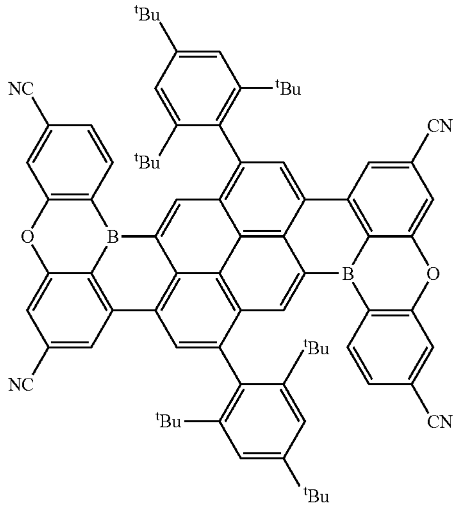
-continued
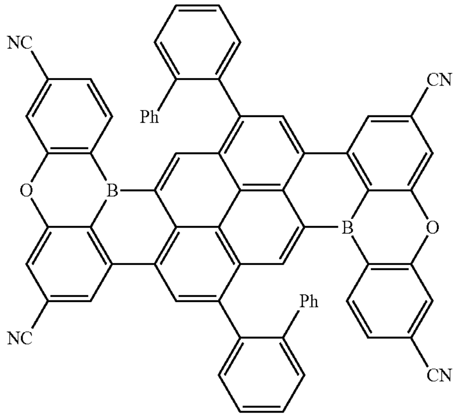
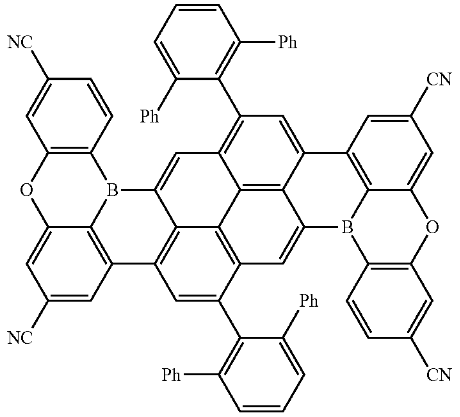
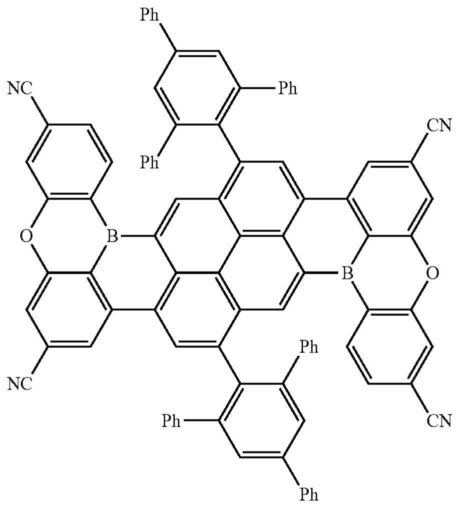
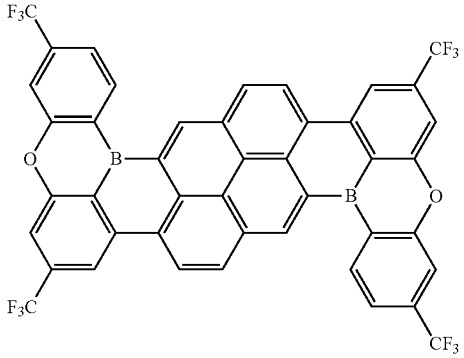

-continued
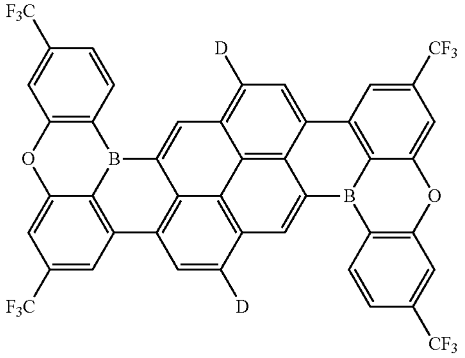
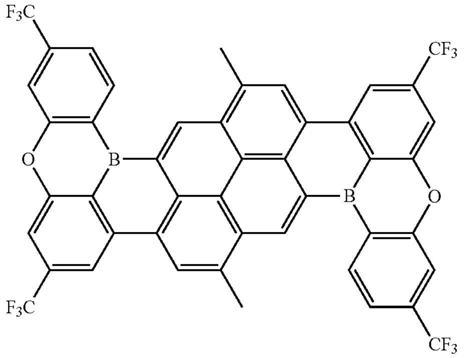
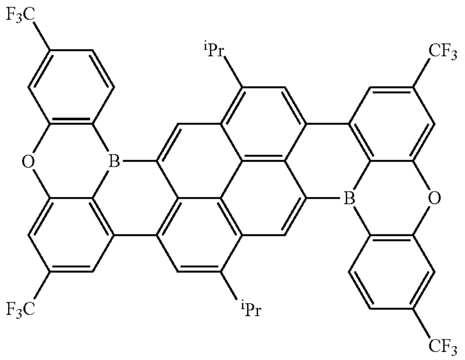
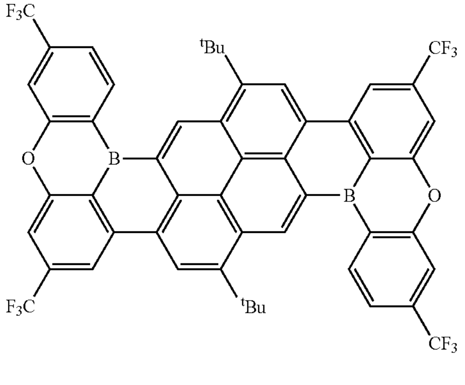
-continued
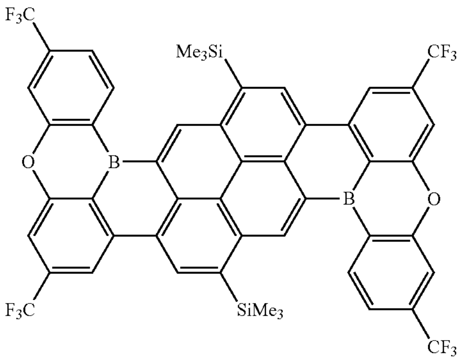
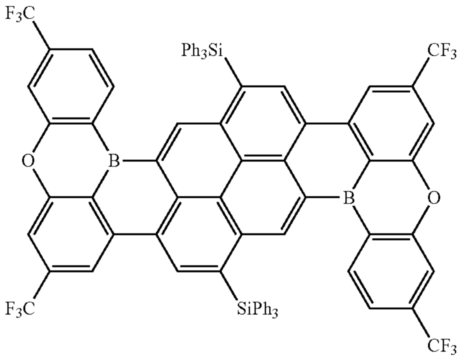
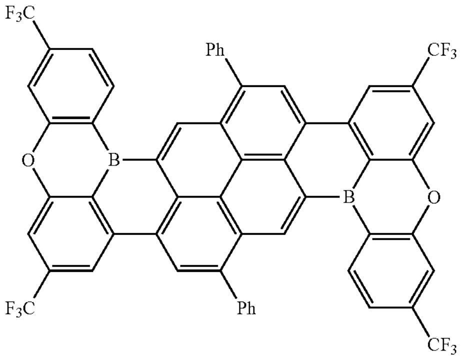
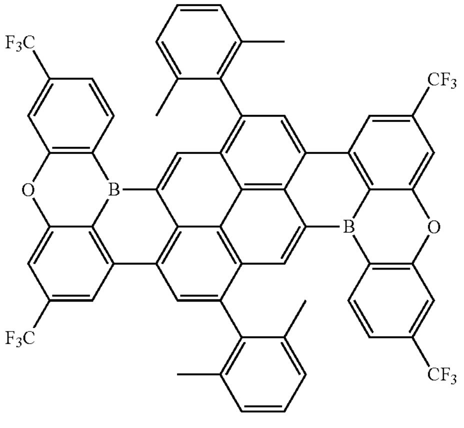

-continued
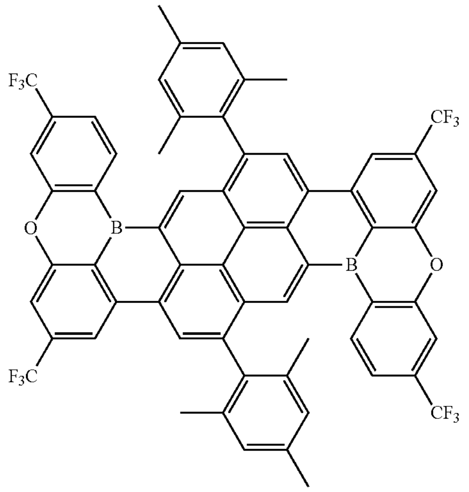
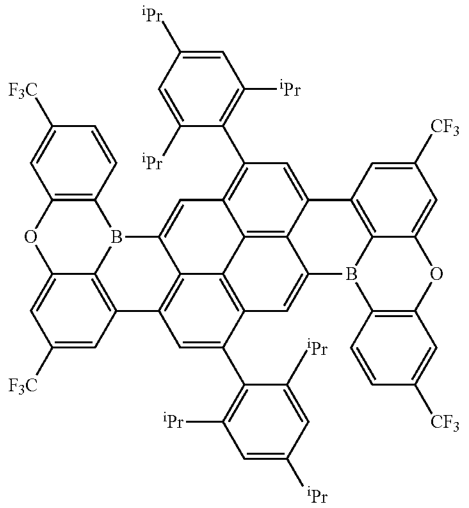
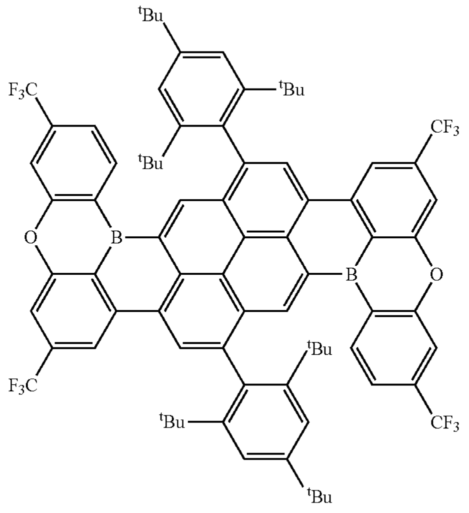
-continued
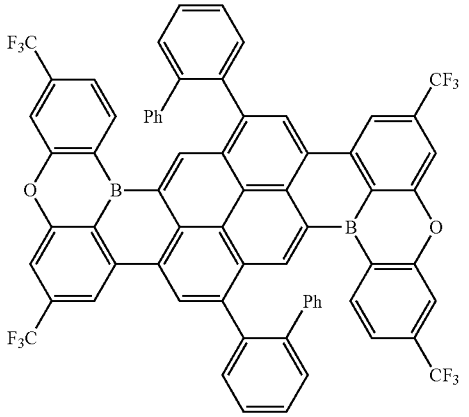
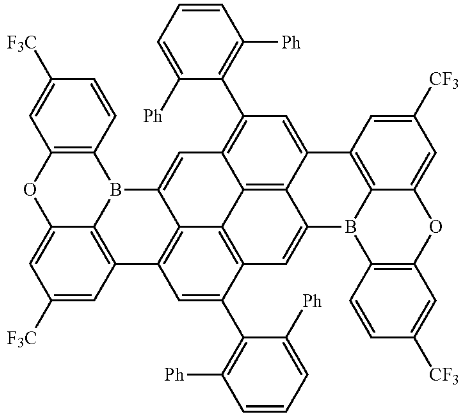
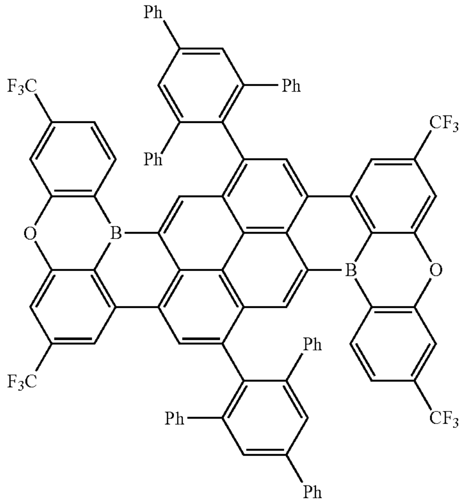
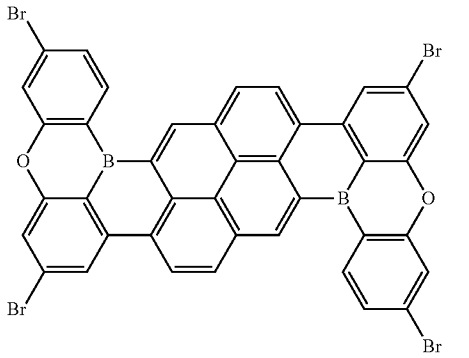

-continued
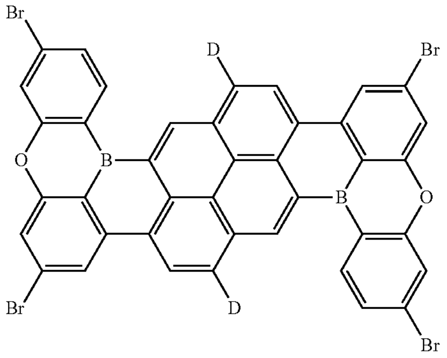
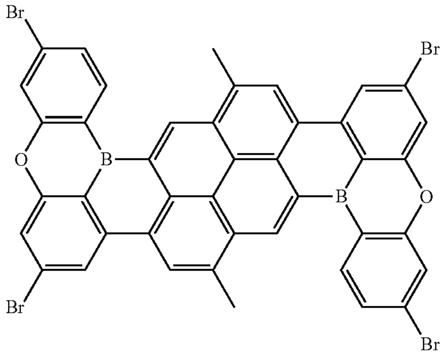
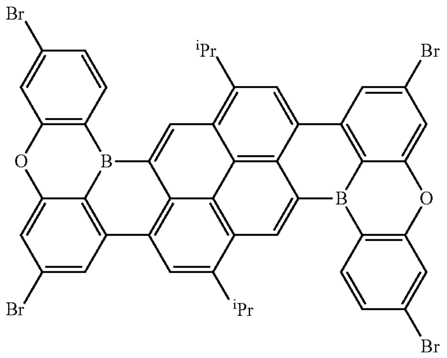
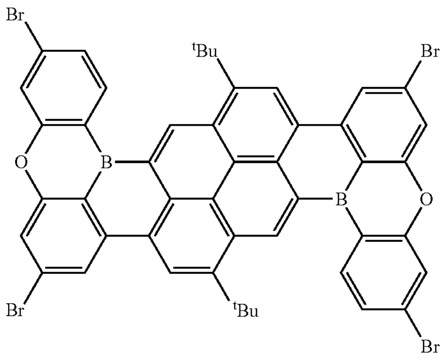
-continued
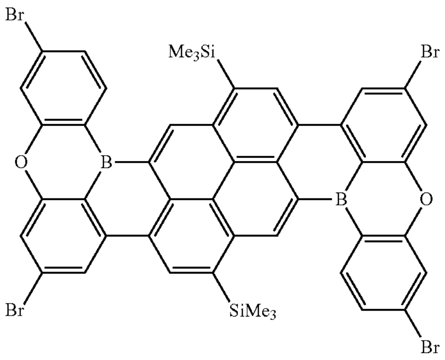
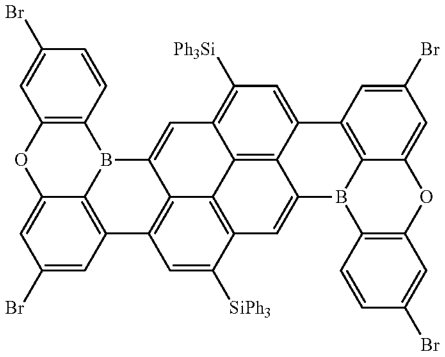
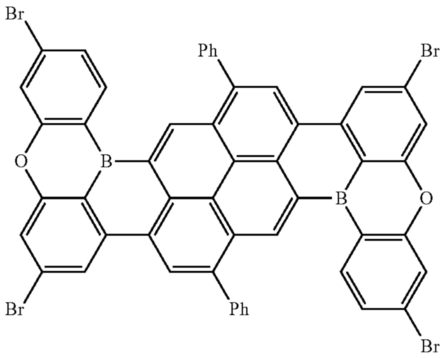
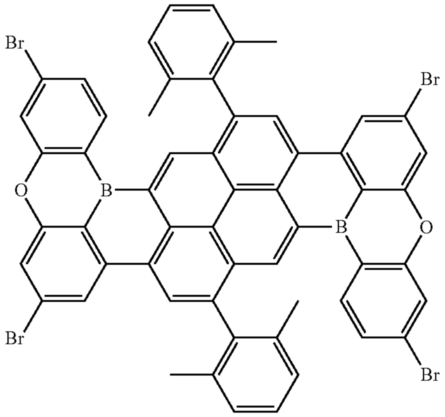

-continued
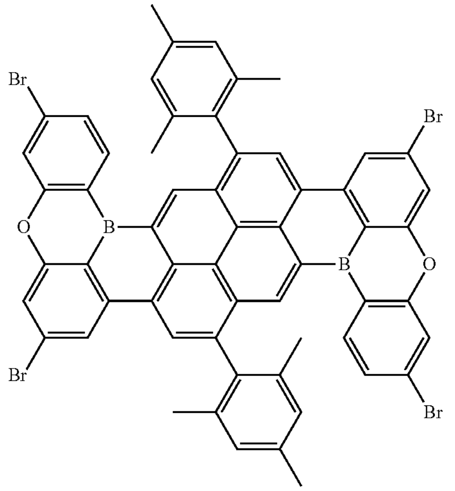
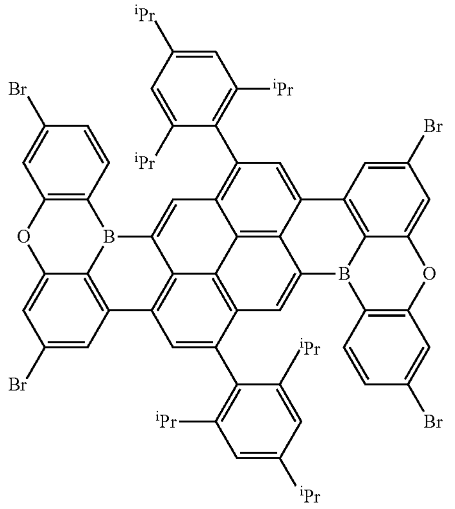
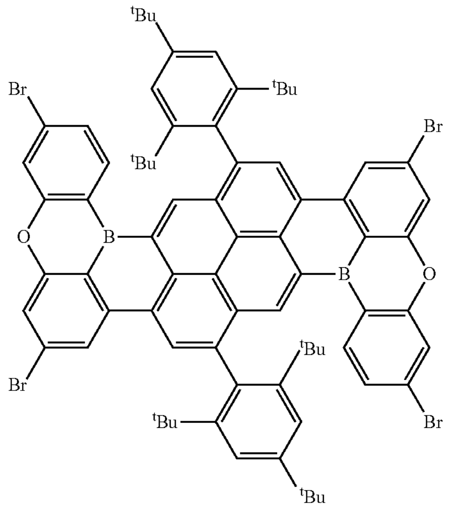
-continued
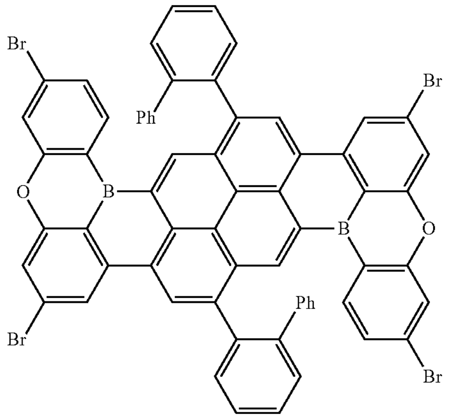
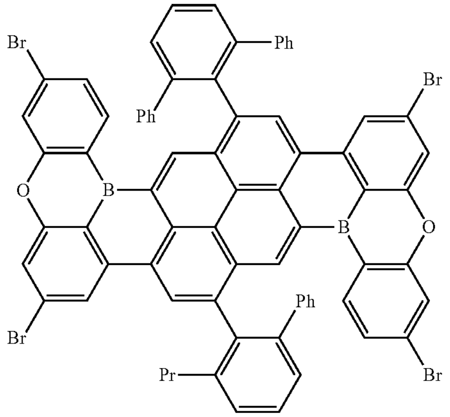
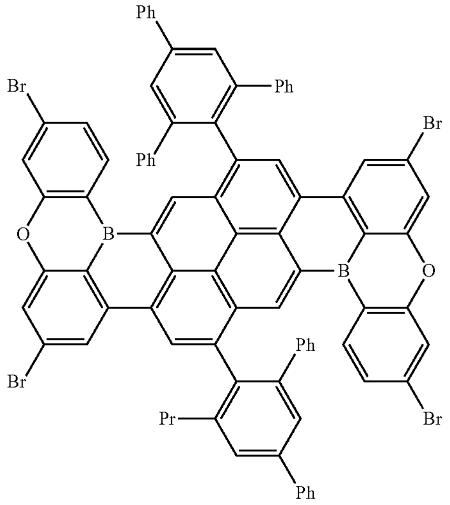
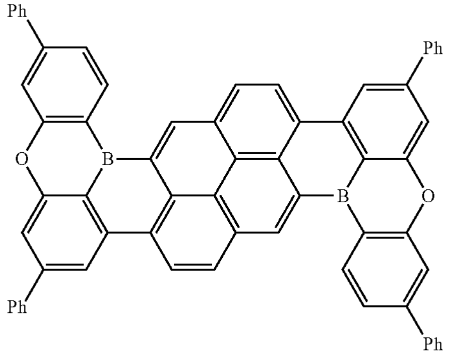

-continued
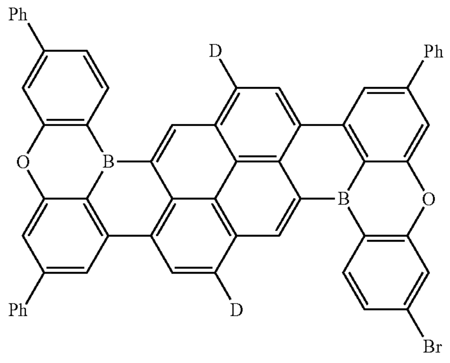
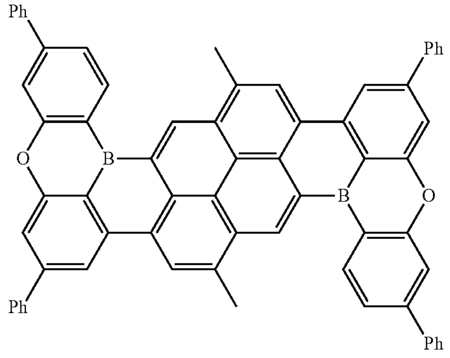
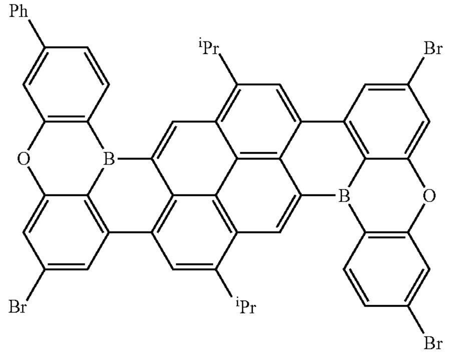
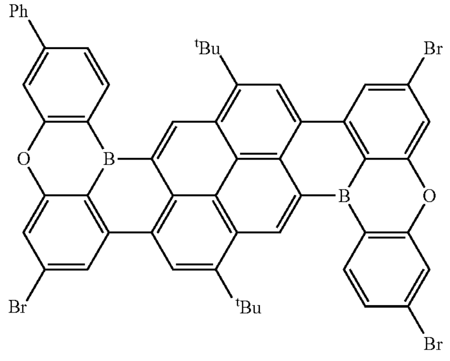
-continued
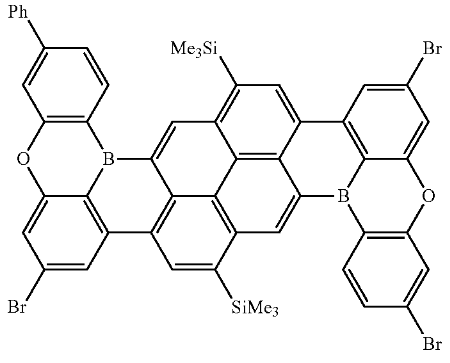
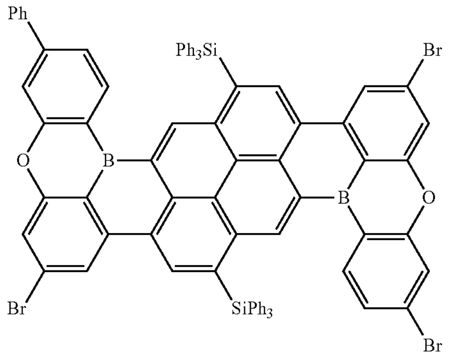
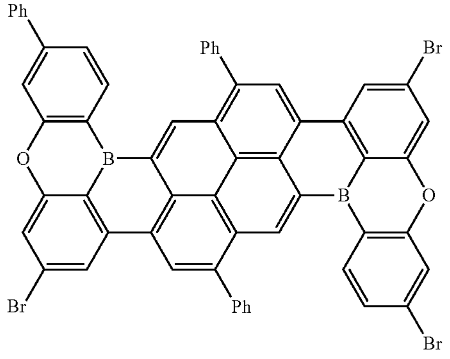
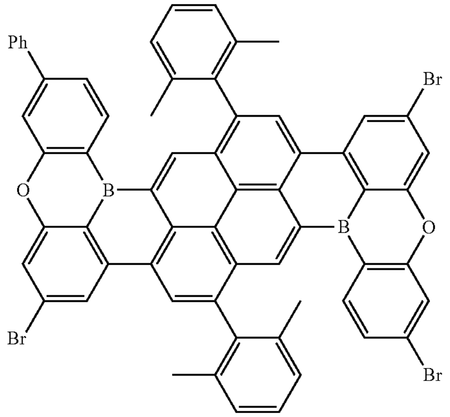

-continued
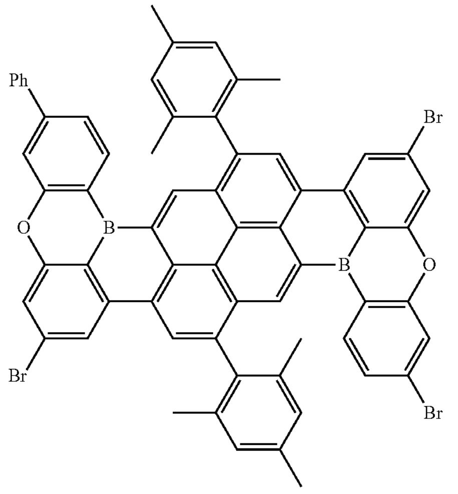
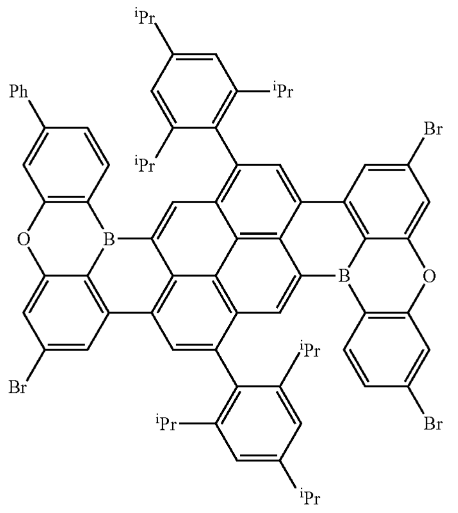
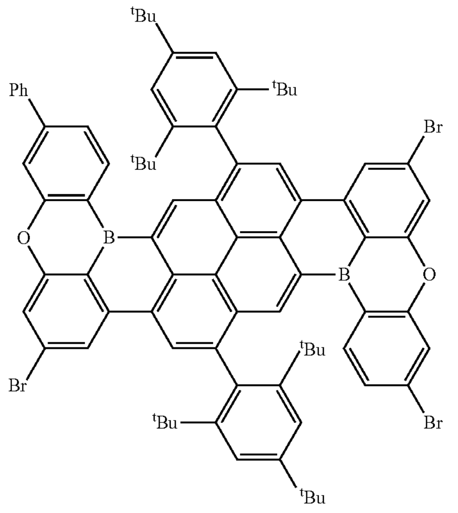
-continued
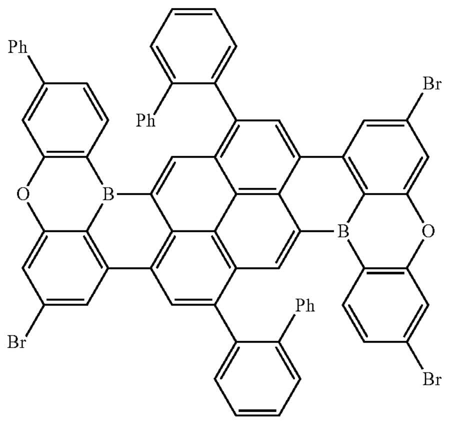
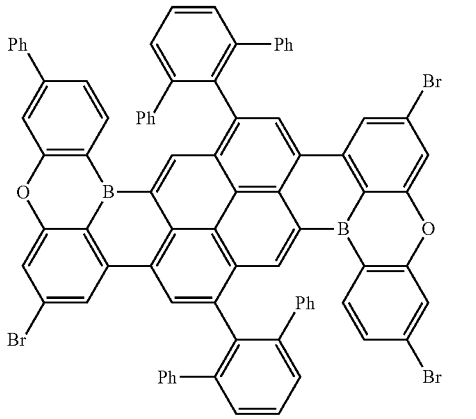
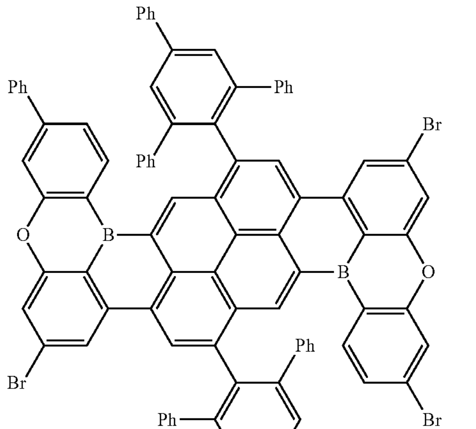
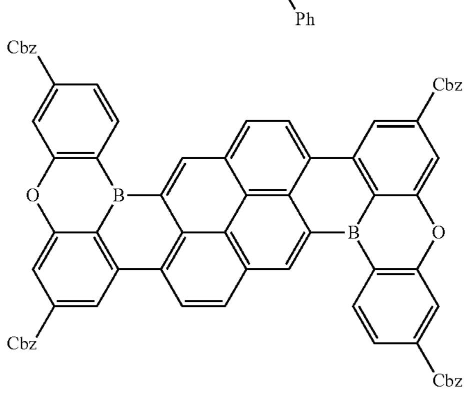

-continued
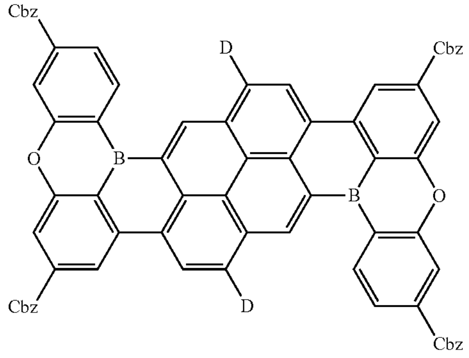
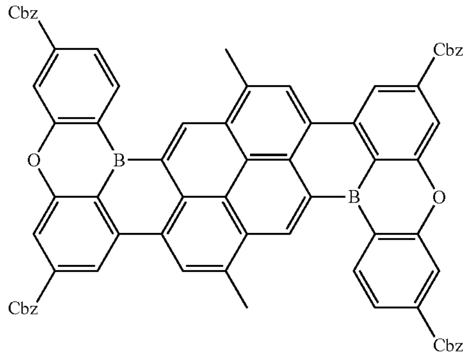
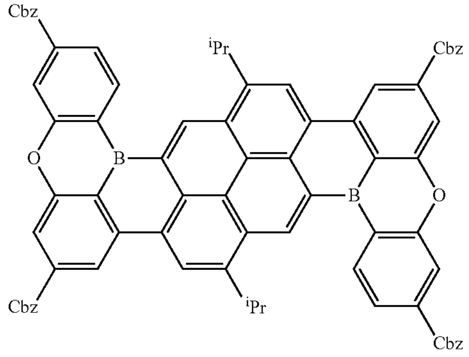
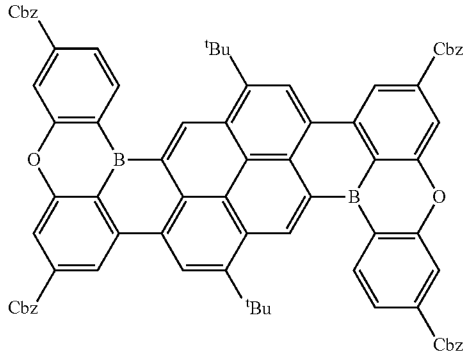
-continued
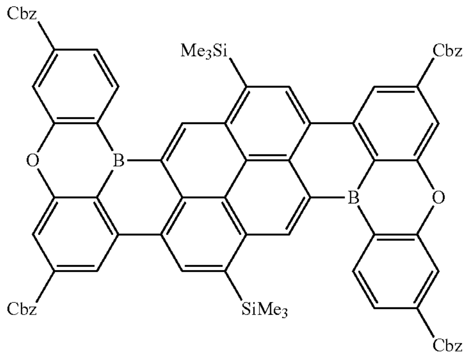
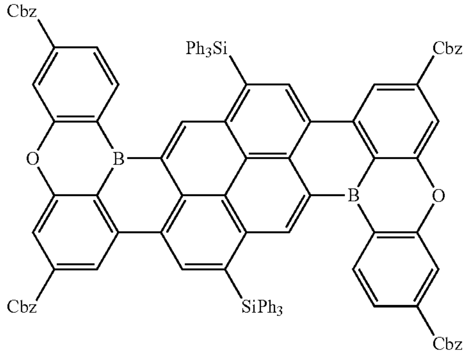
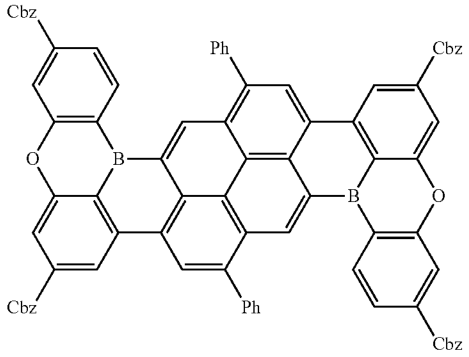
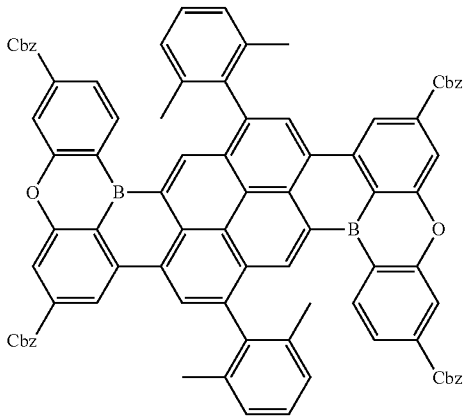

-continued
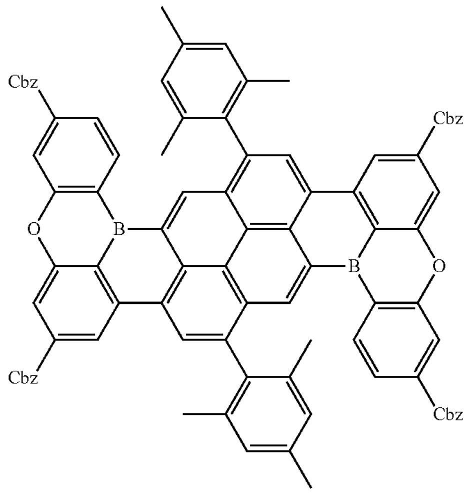
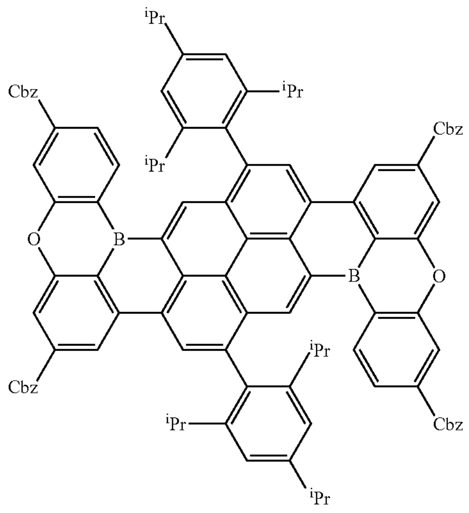
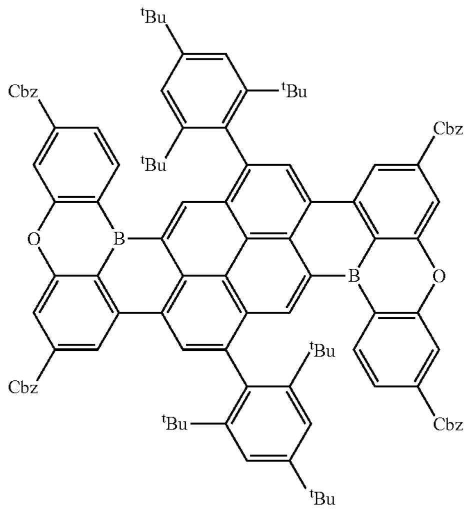
-continued
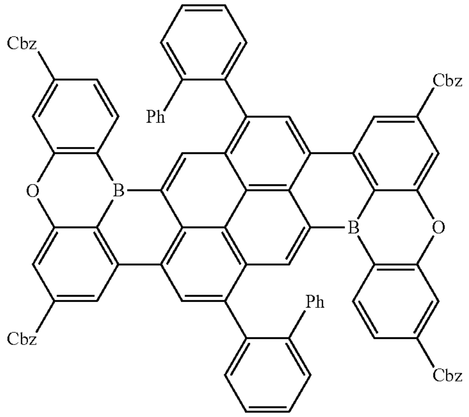
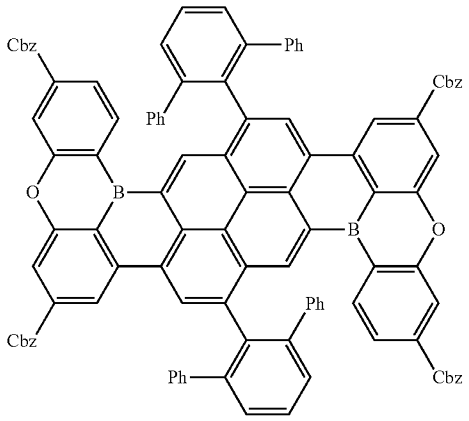
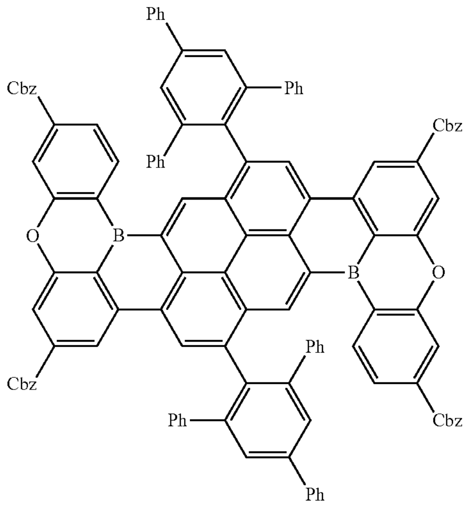
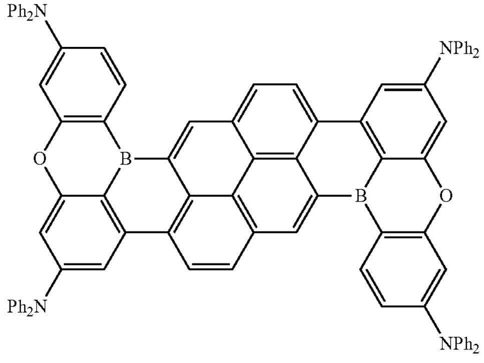

-continued
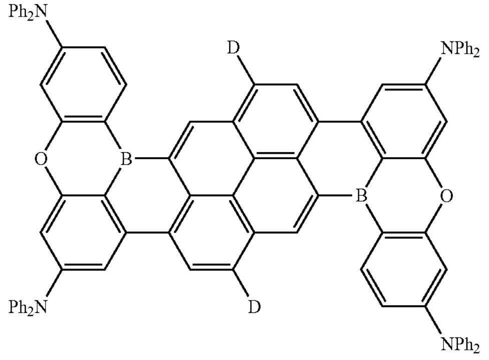
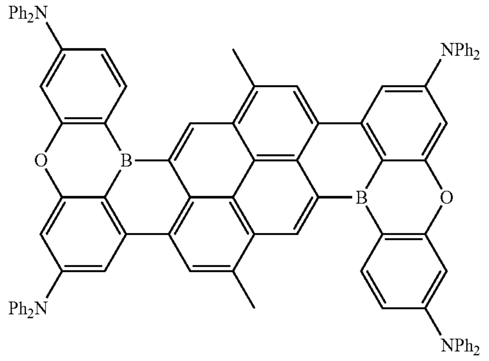
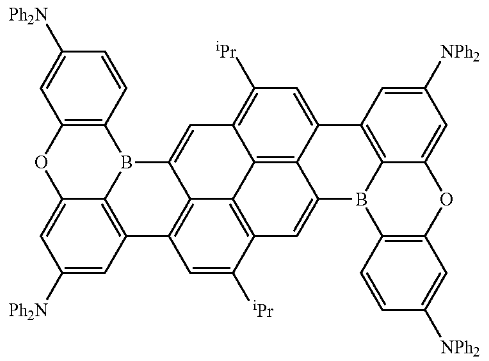
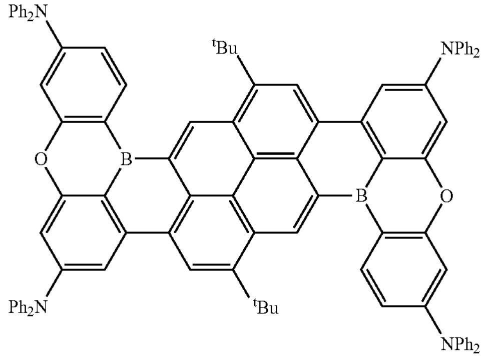
-continued
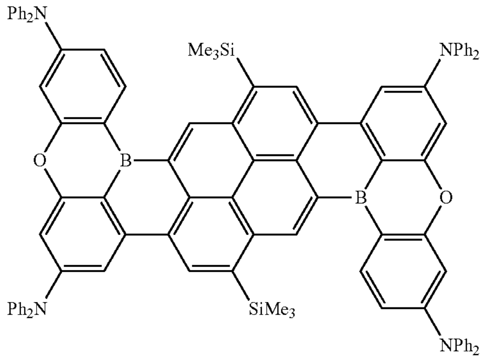
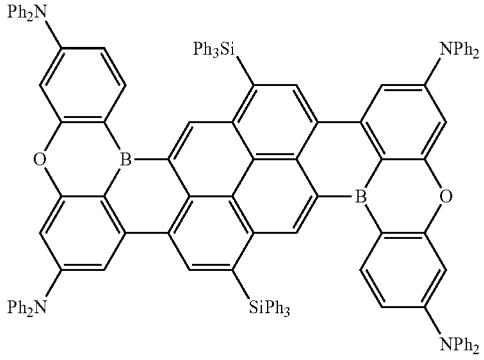
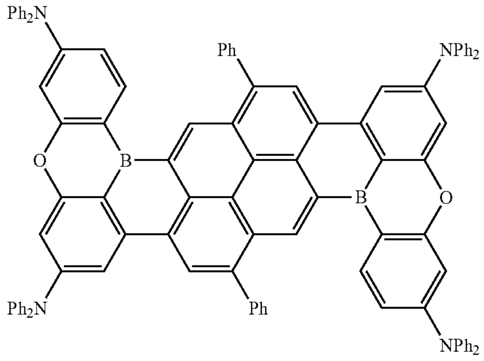
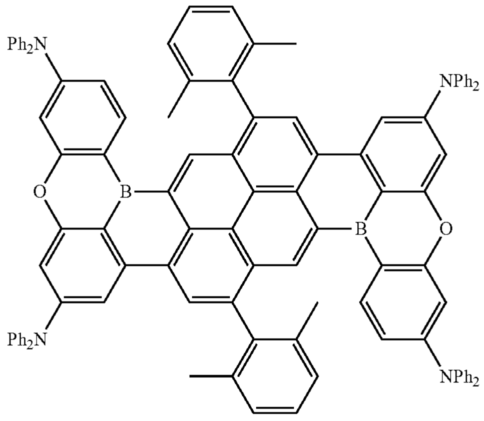

-continued
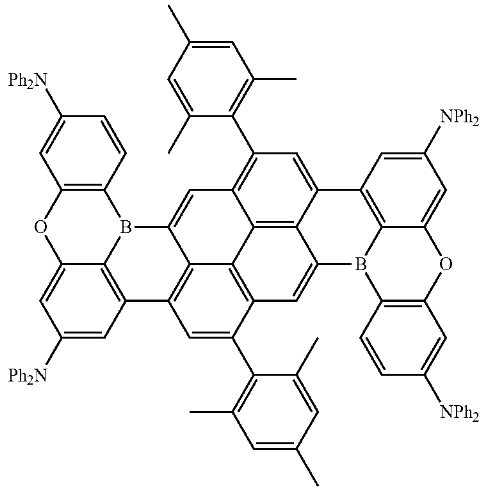
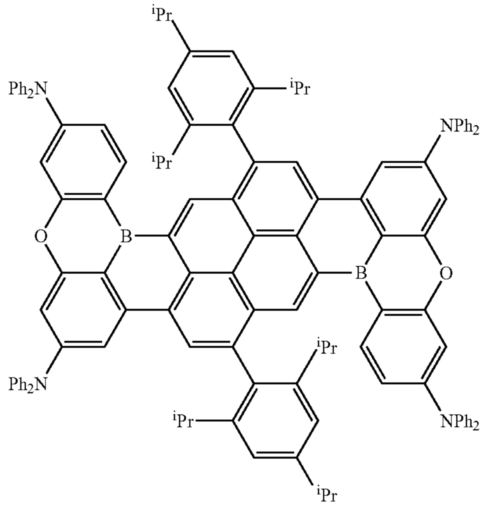
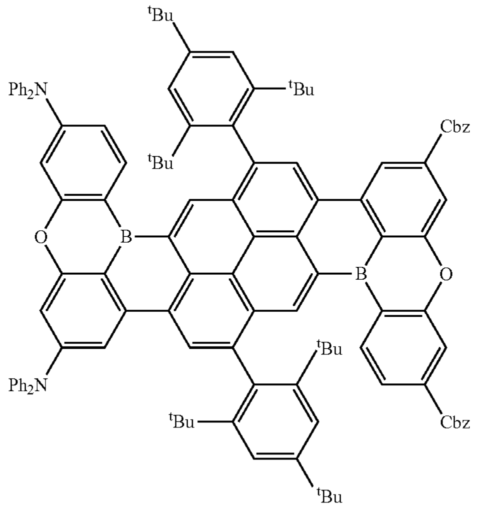
-continued
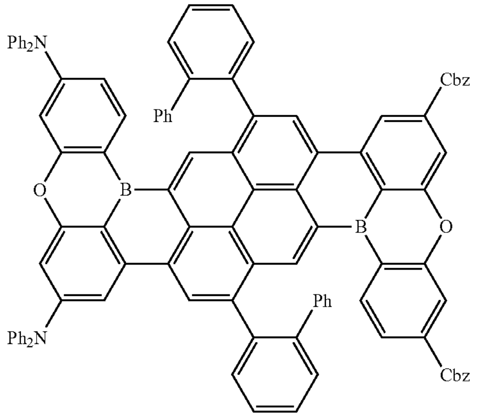
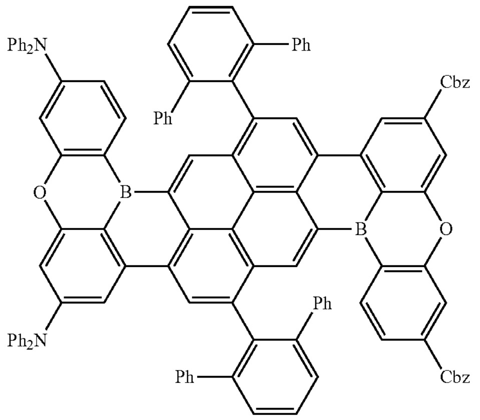
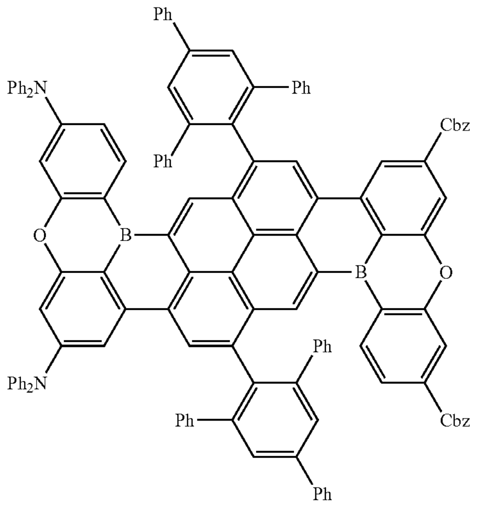
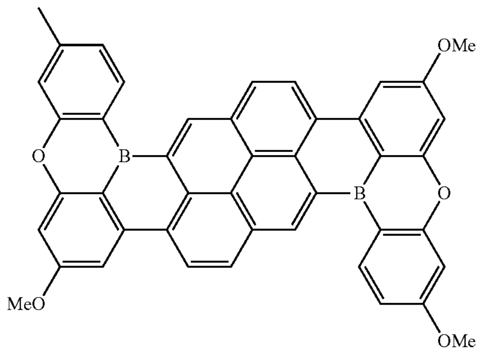

-continued
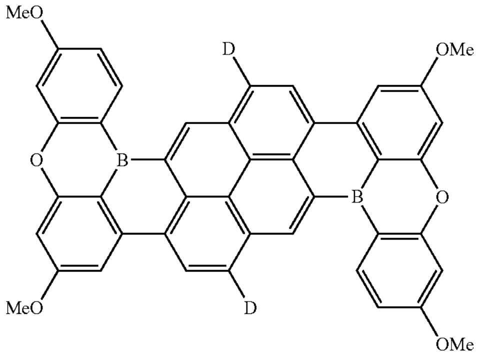
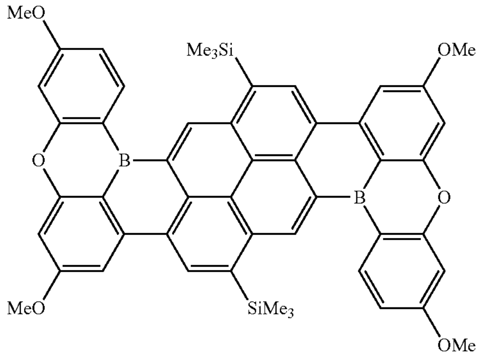
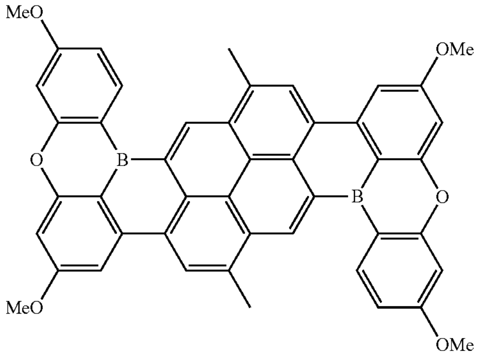
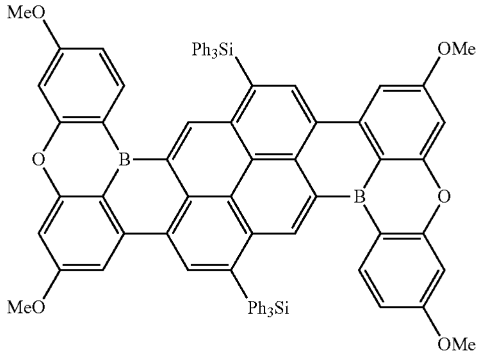
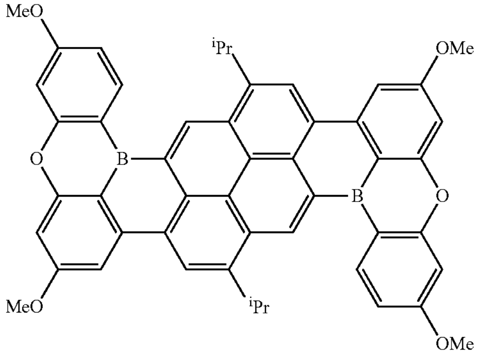
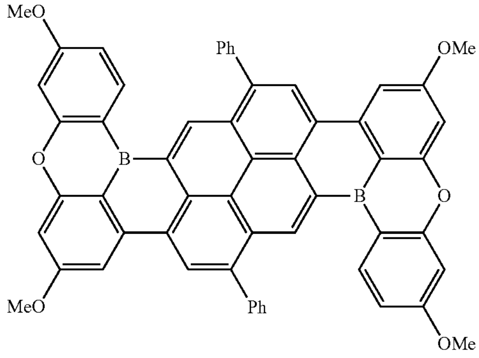
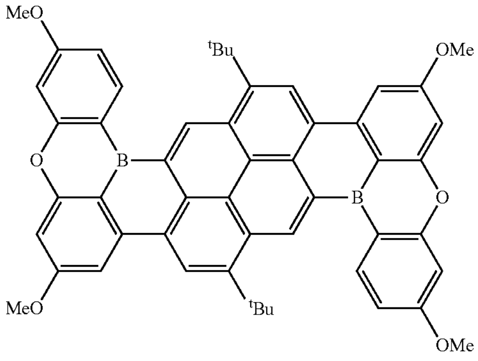
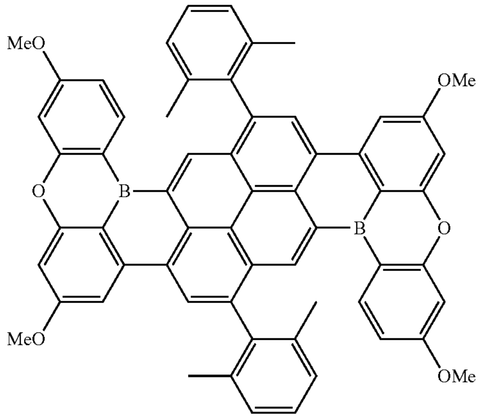

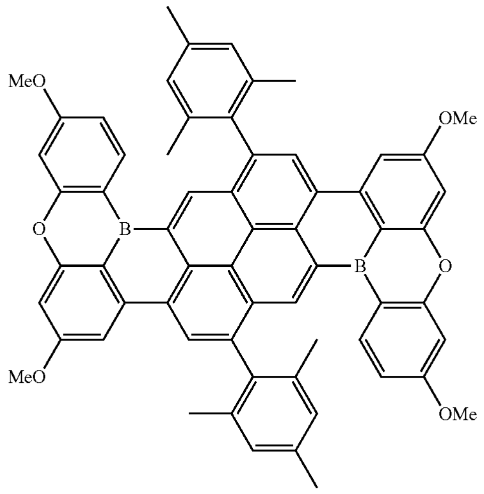
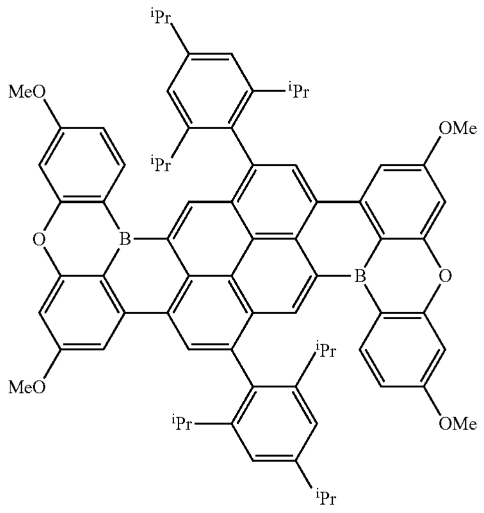
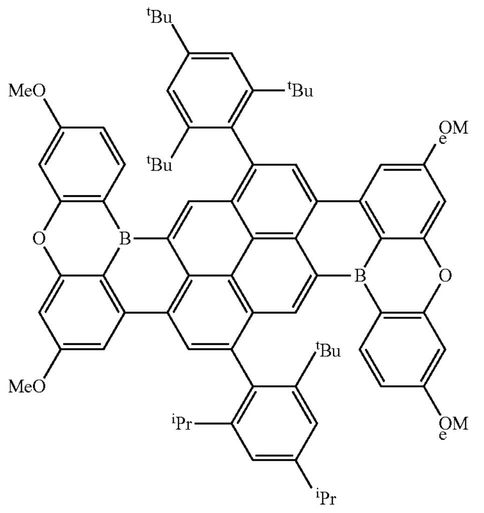
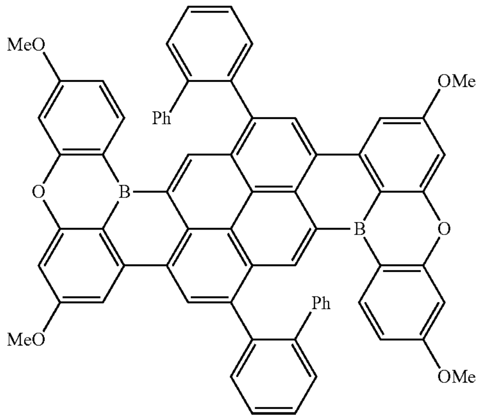
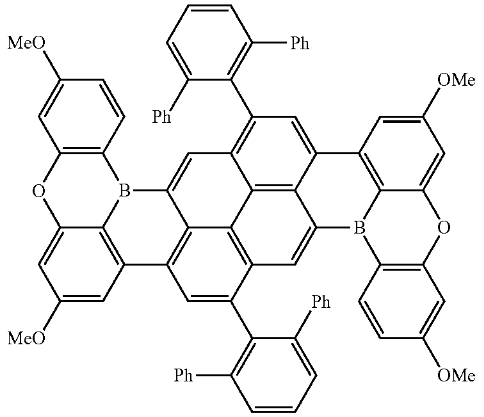
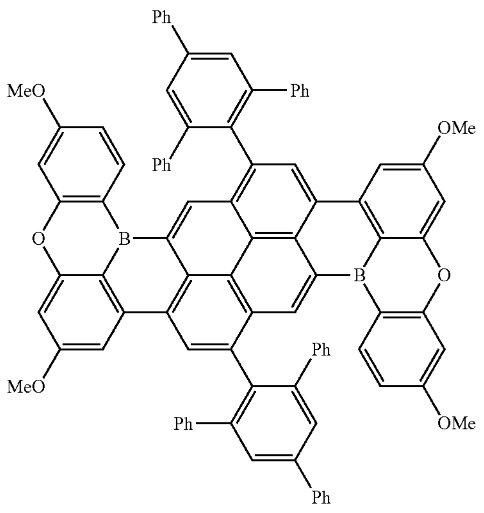

-continued
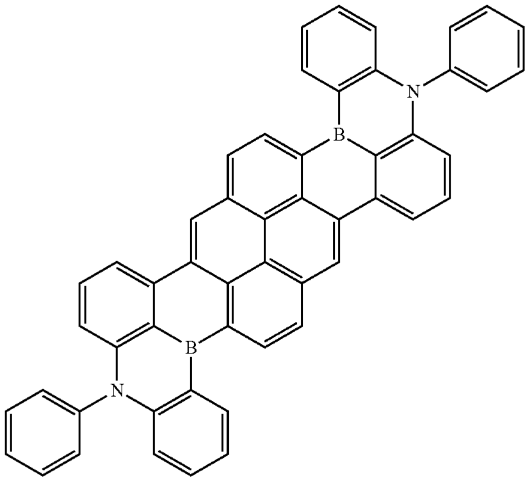
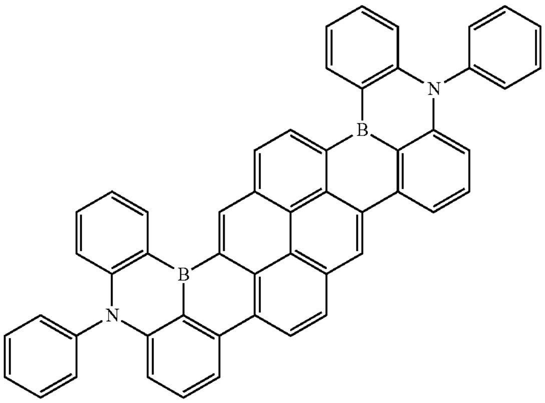
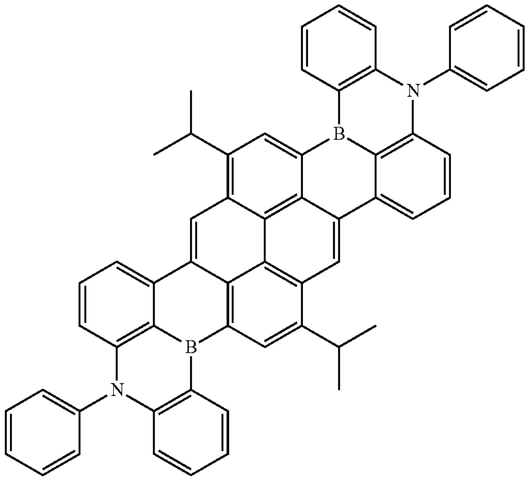
-continued
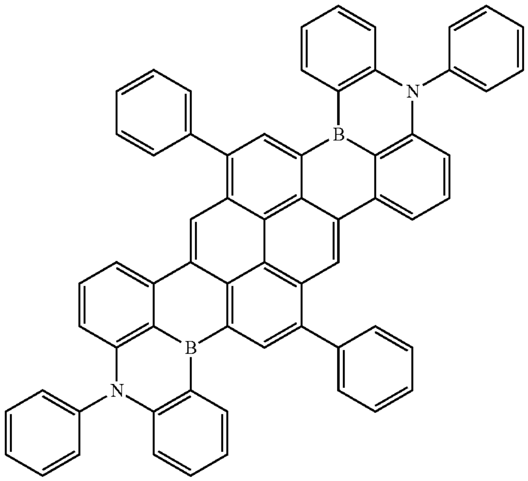
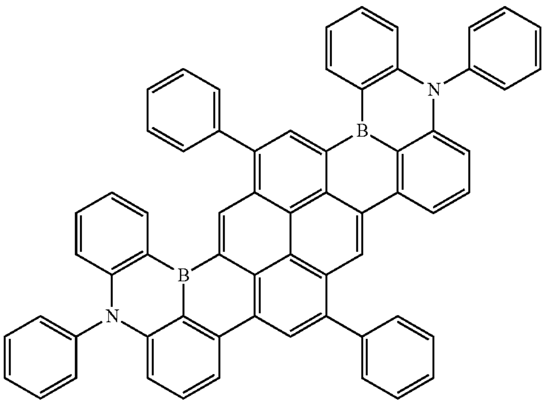
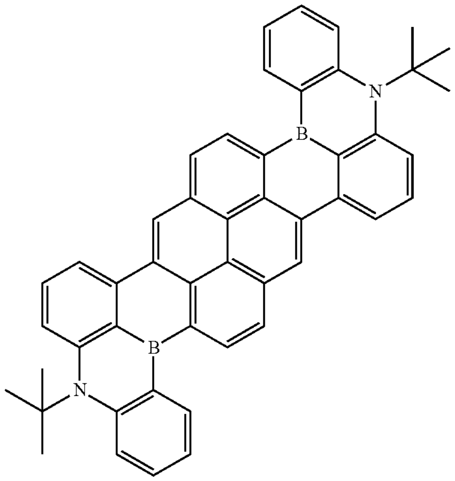

-continued
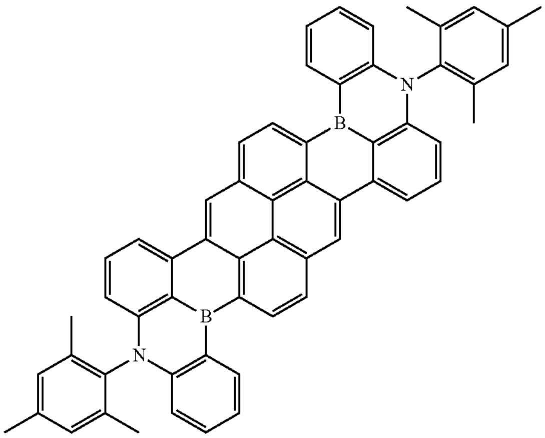
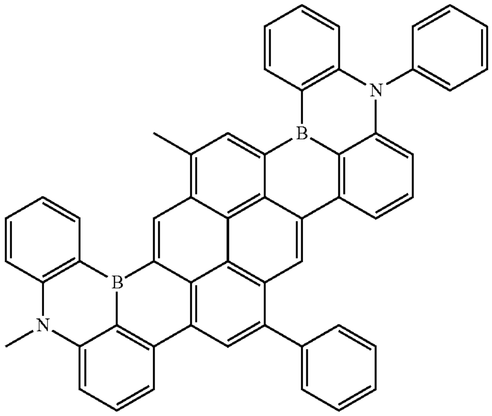
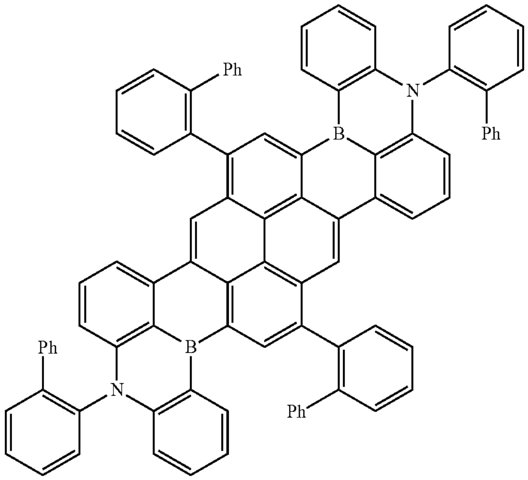
-continued
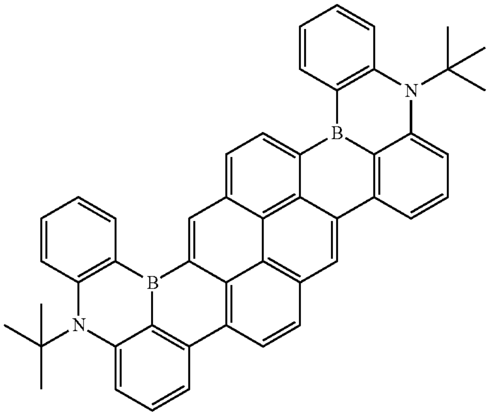
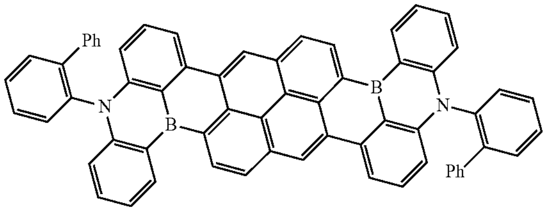
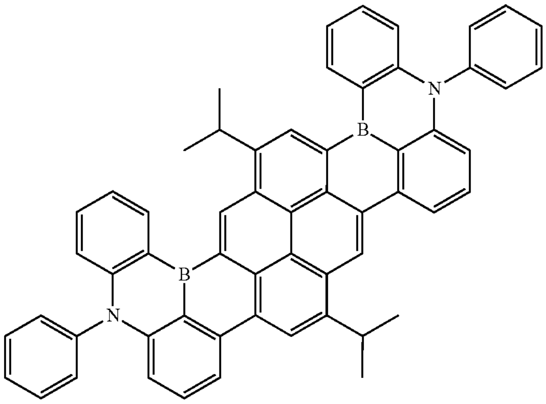
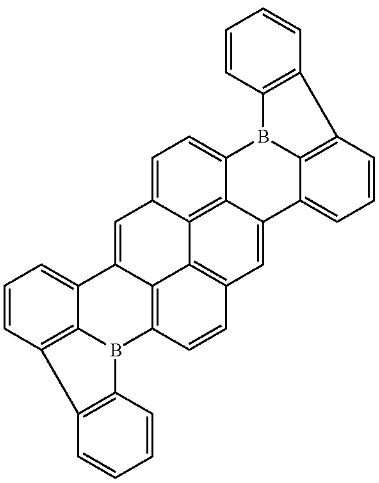

-continued
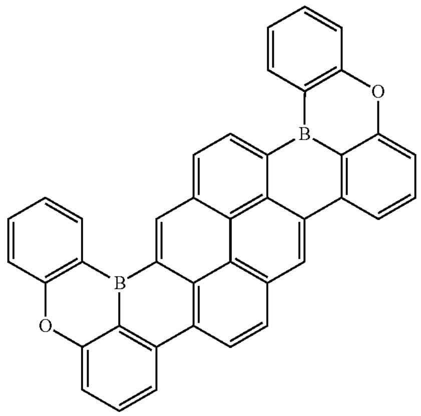
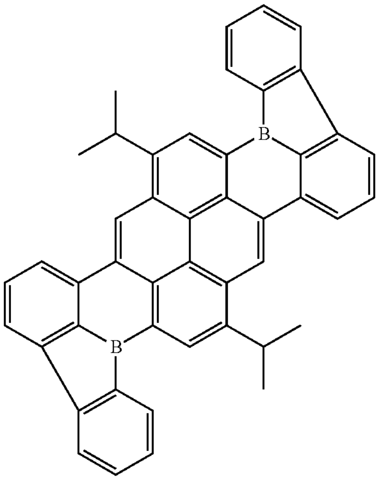
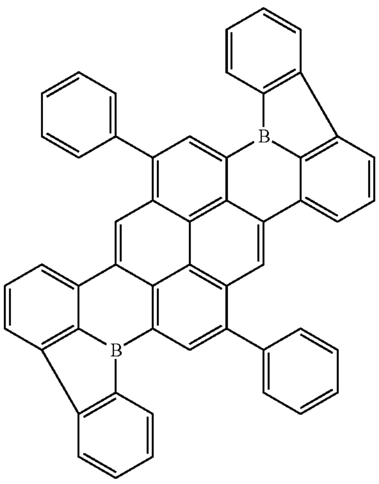
-continued
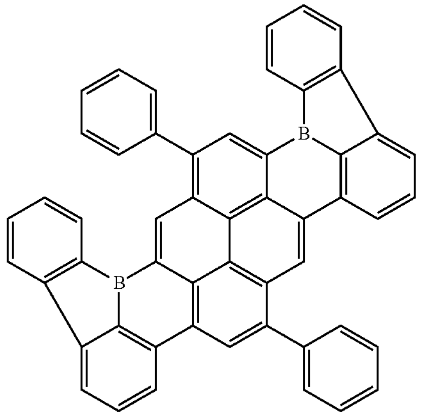
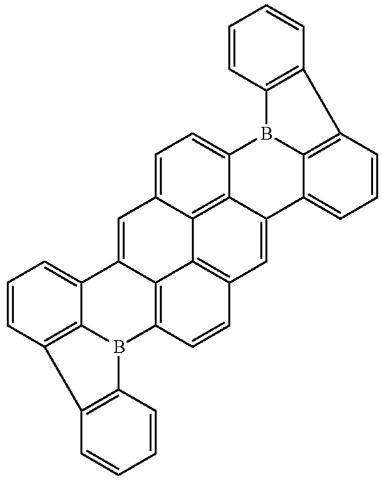
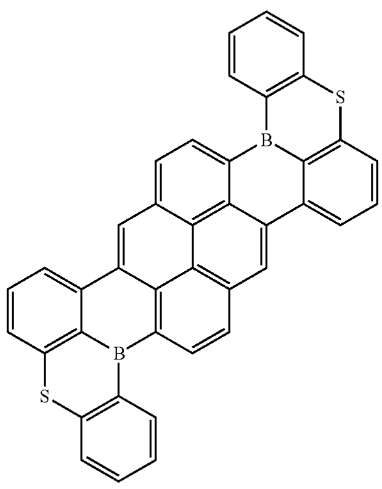

-continued
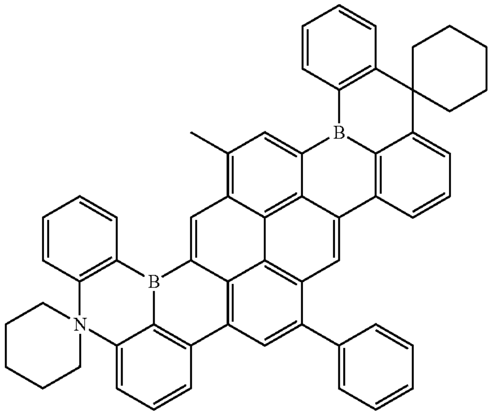
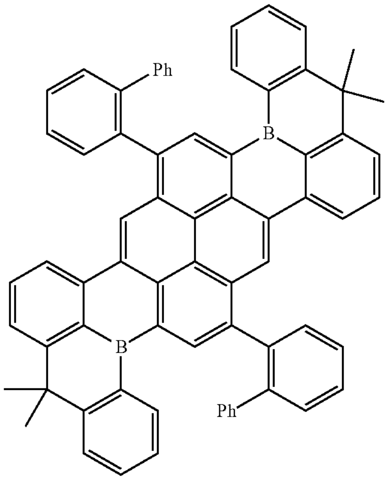
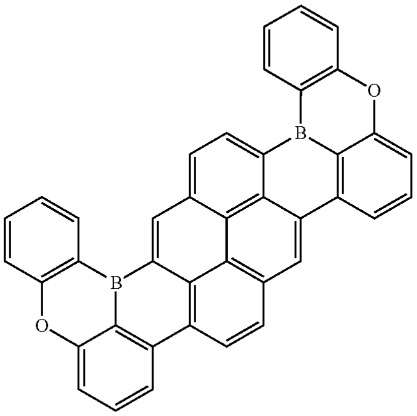
-continued
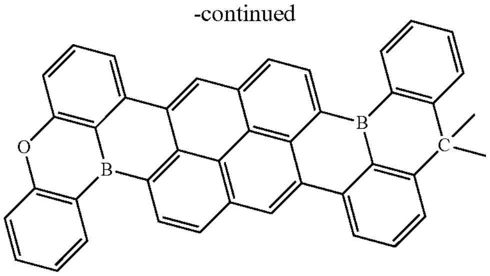
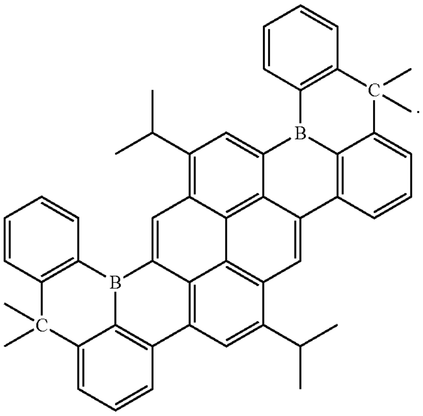
BRIEF DESCRIPTION OF THE DRAWINGS
The drawing illustrates an emission spectrum of example 1 (2% by weight) in PMMA.
The invention claimed is:
1. An organic molecule, comprising:
a first chemical moiety comprising a structure of Formula I:
Formula I
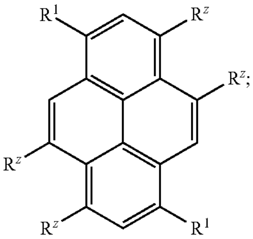
and
two second chemical moieties independently comprising a structure of Formula II:

Formula II

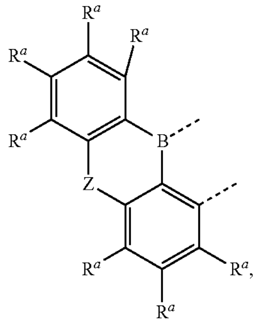

wherein, $R^z$ is a binding site of a single bond linking the first chemical moiety to the second chemical moiety;

$R^1$ is at each occurrence independently from one another selected from the group consisting of:

hydrogen; deuterium; OPh; SPh; $CF_3$; CN; F; $Si(C_1$-$C_5$-alkyl$)_3$; $Si(Ph)_3$;

$C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6$-$C_{18}$-aryl$)_2$;

$N(C_3$-$C_{17}$-heteroaryl$)_2$; and $N(C_3$-$C_{17}$-heteroaryl) ($C_6$-$C_{18}$-aryl);

the dashed lines " " represent binding sites of the first chemical moiety to the second chemical moiety;

Z is selected from the group consisting of a direct bond, $CR^5R^6$, $C{=}CR^5R^6$, C=O, $C{=}NR^5$, $NR^5$, O, $SiR^5R^6$, S, S(O) and $S(O)_2$;

$R^a$ is at each occurrence independently selected from the group consisting of:

hydrogen; deuterium; $N(R^3)_2$; $OR^3$; $SR^3$; $Si(R^3)_3$; $B(OR^3)_2$; $OSOR^3$; $CF_3$; CN; halogen;

$C_1$-$C_{40}$-alkyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, P(=O) ($R^3$), SO, $SO_2$, $NR^3$, O, S or $CONR^3$;

$C_1$-$C_{40}$-alkoxy, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, P(=O) ($R^3$), SO, $SO_2$, $NR^3$, O, S or $CONR^3$;

$C_1$-$C_{40}$-thioalkoxy, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, P(=O) ($R^3$), SO, $SO_2$, $NR^3$, O, S or $CONR^3$;

$C_2$-$C_{40}$-alkenyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, P(=O) ($R^3$), SO, $SO_2$, $NR^3$, O, S or $CONR^3$;

$C_2$-$C_{40}$-alkynyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, P(=O) ($R^3$), SO, $SO_2$, $NR^3$, O, S or $CONR^3$;

$C_6$-$C_{60}$-aryl, which is optionally substituted with one or more substituents $R^3$; and $C_3$-$C_{57}$-heteroaryl, which is optionally substituted with one or more substituents $R^3$;

$R^3$, $R^5$, $R^6$ are at each occurrence independently selected from the group consisting of:

hydrogen; deuterium; $N(R^4)_2$; $OR^4$; $SR^4$; $Si(R^4)_3$; $B(OR^4)_2$; $OSOR^4$; $CF_3$; CN; halogen;

$C_1$-$C_{40}$-alkyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, P(=O) ($R^4$), SO, $SO_2$, $NR^4$, O, S or $CONR^4$;

$C_1$-$C_{40}$-alkoxy, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, P(=O) ($R^4$), SO, $SO_2$, $NR^4$, O, S or $CONR^4$;

$C_1$-$C_{40}$-thioalkoxy, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, P(=O) ($R^4$), SO, $SO_2$, $NR^4$, O, S or $CONR^4$;

$C_2$-$C_{40}$-alkenyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_2$-$C_{40}$-alkynyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_6$-$C_{60}$-aryl, which is optionally substituted with one or more substituents $R^4$; and $C_3$-$C_{57}$-heteroaryl, which is optionally substituted with one or more substituents $R^4$;

$R^4$ is at each occurrence independently from one another selected from the group consisting of:

hydrogen, deuterium, halogen, OPh, SPh, $CF_3$, CN, $Si(C_1$-$C_5$-alkyl$)_3$, $Si(Ph)_3$;

$C_1$-$C_5$-alkyl, wherein optionally one or more hydrogen atoms are independently substituted by deuterium, halogen, CN, or $CF_3$;

$C_1$-$C_5$-alkoxy, wherein optionally one or more hydrogen atoms are independently substituted by deuterium, halogen, CN, or $CF_3$;

$C_1$-$C_5$-thioalkoxy, wherein optionally one or more hydrogen atoms are independently substituted by deuterium, halogen, CN, or $CF_3$;

$C_2$-$C_5$-alkenyl, wherein optionally one or more hydrogen atoms are independently substituted by deuterium, halogen, CN, or $CF_3$;

$C_2$-$C_5$-alkynyl, wherein optionally one or more hydrogen atoms are independently substituted by deuterium, halogen, CN, or $CF_3$;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$;

$N(C_3$-$C_{17}$-heteroaryl$)_2$; and $N(C_3$-$C_{17}$-heteroaryl$)(C_6$-$C_{18}$-aryl$)$;

wherein any of the groups $R^a$ positioned adjacent to each other are optionally bonded to each other and form an aryl ring, a heteroaryl ring, an aryl ring or a heteroaryl ring, which is optionally substituted with one or more $C_6$-$C_{18}$-aryl substituents, $C_1$-$C_5$-alkyl substituents, deuterium, halogen, CN and/or $CF_3$; and wherein a substituent $R^5$ independently optionally forms a mono- or polycyclic, aliphatic, aromatic and/or benzo-fused ring system with one or more other substituents from the group consisting of $R^6$ and $R^a$.

2. The organic molecule according to claim 1, comprising a structure of Formula Ia:

Formula Ia

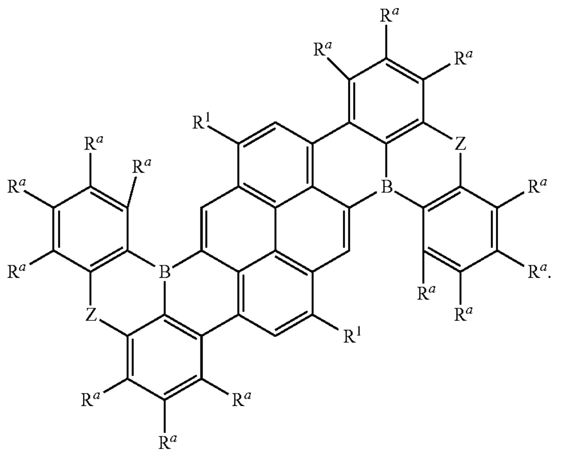

3. The organic molecule according to claim 1, wherein the second chemical moiety comprises a structure of Formula IIa:

Formula IIa

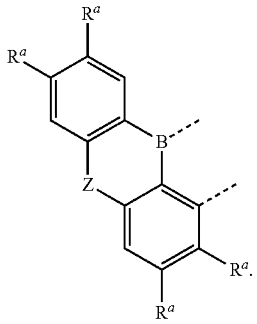

4. The organic molecule according to claim 1, wherein $R^a$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$, and wherein adjacent groups $R^a$ optionally are bonded to each other and form an aryl or heteroaryl ring, which is optionally substituted with one or more $C_1$-$C_5$-alkyl substituents, deuterium, halogen, CN or $CF_3$.

5. The organic molecule according to claim 1, wherein $R^1$ is at each occurrence independently selected from the group consisting of:

a binding site of a single bond linking the first chemical moiety to a corresponding second chemical moiety of the two second chemical moieties, hydrogen, deuterium, Me, $^{i}$Pr, $^{t}$Bu, $SiMe_3$, $SiPh_3$, and Ph, which is optionally substituted with one or more substituents independently from each other selected from the group consisting of Me, $^{i}$Pr, $^{t}$Bu, and Ph.

6. The organic molecule according to claim 1, wherein $R^a$ is independently selected from the group consisting of:

hydrogen, Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, Bu, CN, $CF_3$, and Ph, pyrimidinyl, which is optionally substituted with one or more substituents independently from each other selected from the group consisting of Me, $^{i}$Pr, Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

7. The organic molecule according to claim 1, wherein Z is at each occurrence independently from one another selected from the group consisting of a direct bond, $CR^5R^6$, $NR^5$, and O.

8. The organic molecule according to claim 1, wherein Z is $NR^5$.

9. An optoelectronic device comprising the organic molecule according to claim 1 as a luminescent emitter.

10. The optoelectronic device according to claim 9, wherein the optoelectronic device is at least one selected from the group consisting of:

organic light-emitting diodes (OLEDs),
light-emitting electrochemical cells,
OLED-sensors,
organic diodes,
organic solar cells,
organic transistors,
organic field-effect transistors,
organic lasers, and
down-conversion elements.

11. A composition, comprising:

(a) the organic molecule according to claim 1 as a luminescent emitter and/or a host, (b) an emitter and/or a host material, which differs from the organic molecule, and (c) optionally, a dye and/or a solvent.

12. An optoelectronic device, comprising a composition according to claim 11, wherein the optoelectronic device is at least one selected from the group consisting of organic light-emitting diodes (OLEDs), light-emitting electrochemical cells, OLED-sensors, organic diodes, organic solar cells, organic transistors, organic field-effect transistors, organic lasers, and down-conversion elements.

13. The optoelectronic device according to claim 9, comprising:

a substrate,
an anode, and
a cathode, wherein the anode or the cathode is on the substrate, and
a light-emitting layer between the anode and the cathode and comprising the organic molecule.

14. A method for producing an optoelectronic device, the method comprising depositing the organic molecule according to claim 1 by a vacuum evaporation method and/or a solution deposition method.

15. A method for producing an optoelectronic device, the method comprising depositing the composition according to claim 11 by a vacuum evaporation method and/or a solution deposition method.

16. The optoelectronic device according to claim 12, comprising:

a substrate,
an anode, and
a cathode, wherein the anode or the cathode is on the substrate, and
a light-emitting layer between the anode and the cathode and comprising the composition.

17. An optoelectronic device, comprising a layer formed from the composition according to claim 11, wherein the optoelectronic device is at least one selected from the group consisting of organic light-emitting diodes (OLEDs), light-emitting electrochemical cells, OLED-sensors, organic diodes, organic solar cells, organic transistors, organic field-effect transistors, organic lasers, and down-conversion elements.

18. The optoelectronic device according to claim 17, comprising:

a substrate,
an anode, and
a cathode, wherein the anode or the cathode is on the substrate, and
a light-emitting layer between the anode and the cathode and comprising the layer formed from the composition.

* * * * *